US012727376B2

(12) United States Patent
Miyazaki

(10) Patent No.: US 12,727,376 B2
(45) Date of Patent: Sep. 1, 2026

(54) LIGHT EMITTING DIODE AND POLYCYCLIC COMPOUND FOR THE SAME

(71) Applicant: Samsung Display Co., Ltd., Yongin-si (KR)

(72) Inventor: Yuuki Miyazaki, Yokohama (JP)

(73) Assignee: Samsung Display Co., Ltd., Yongin-si (KR)

( * ) Notice: Subject to any disclaimer, the term of this patent is extended or adjusted under 35 U.S.C. 154(b) by 1031 days.

(21) Appl. No.: 17/834,273

(22) Filed: Jun. 7, 2022

(65) Prior Publication Data

US 2023/0063633 A1 Mar. 2, 2023

(30) Foreign Application Priority Data

Jun. 28, 2021 (KR) ........................ 10-2021-0084310

(51) Int. Cl.

| | |
|---|---|
| ***H01L 51/50*** | (2006.01) |
| ***C07F 5/02*** | (2006.01) |
| ***C09K 11/06*** | (2006.01) |
| ***H10K 85/30*** | (2023.01) |
| *H10K 50/11* | (2023.01) |
| *H10K 101/10* | (2023.01) |

(52) U.S. Cl.

CPC ........... *H10K 85/322* (2023.02); *C07F 5/027* (2013.01); *C09K 11/06* (2013.01); *C09K 2211/1018* (2013.01); *H10K 50/11* (2023.02); *H10K 2101/10* (2023.02)

(58) Field of Classification Search

None

See application file for complete search history.

(56) References Cited

U.S. PATENT DOCUMENTS

2018/0138436 A1* 5/2018 Takagi ................. H10K 50/157
2020/0395553 A1 12/2020 Park et al.

(Continued)

FOREIGN PATENT DOCUMENTS

CN 110790782 2/2020
CN 111153919 5/2020

(Continued)

*Primary Examiner* — Gregory D Clark

(74) *Attorney, Agent, or Firm* — Womble Bond Dickinson (US) LLP

(57) ABSTRACT

A light emitting diode includes a first electrode, a second electrode disposed on the first electrode, and at least one functional layer disposed between the first electrode and the second electrode. The at least one functional layer includes a compound represented by Formula 1, thereby exhibiting high efficiency and long lifespan.

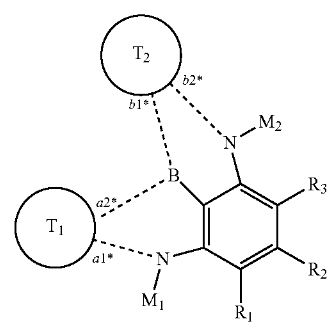

19 Claims, 6 Drawing Sheets

(56) References Cited

U.S. PATENT DOCUMENTS

| | | | | |
|---|---|---|---|---|
| 2023/0075211 | A1* | 3/2023 | Sotoyama ............ | H10K 85/636 |
| 2023/0413669 | A1* | 12/2023 | Moon .................. | H10K 85/654 |

FOREIGN PATENT DOCUMENTS

| | | |
|---|---|---|
| CN | 111848620 | 10/2020 |
| JP | 2020-202377 | 12/2020 |
| KR | 10-2020-0092634 | 8/2020 |
| KR | 10-2225901 | 3/2021 |
| KR | 10-2249719 | 5/2021 |
| WO | 2015/102118 | 3/2017 |
| WO | 2020/080872 | 4/2020 |
| WO | 2020/145725 | 7/2020 |

* cited by examiner

LIGHT EMITTING DIODE AND POLYCYCLIC COMPOUND FOR THE SAME

CROSS-REFERENCE TO RELATED APPLICATION(S)

This application claims priority to and benefits of Korean Patent Application No. 10-2021-0084310 under 35 U.S.C. § 119, filed on Jun. 28, 2021 in the Korean Intellectual Property Office, the entire contents of which are incorporated herein by reference.

BACKGROUND

1. Technical Field

The disclosure relates to a light emitting diode including a novel polycyclic compound in an emission layer.

2. Description of the Related Art

Active development continues for an organic electroluminescence display device as an image display device. The organic electroluminescence display device is a so-called self-luminescent display device in which holes and electrons respectively injected from a first electrode and a second electrode recombine in an emission layer, so that a luminescent material in the emission layer emits light to achieve display.

In the application of light emitting diodes to image display devices, there is a demand for light emitting diodes having a low driving voltage, high luminous efficiency, and long lifespan, and continuous development is required on materials for light emitting diodes which stably achieves such characteristics.

Recently, in order to implement highly efficient light emitting diodes, technologies pertaining to phosphorescence emission using triplet state energy or delayed fluorescence using triplet-triplet annihilation (TTA) in which singlet excitons are generated by collision of triplet excitons are being developed, and development on thermally activated delayed fluorescence (TADF) materials using a delayed fluorescence phenomenon is being conducted.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

The disclosure provides a light emitting diode exhibiting excellent luminous efficiency and improved lifespan characteristics.

An embodiment provides a polycyclic compound represented by Formula 1.

[Formula 1]

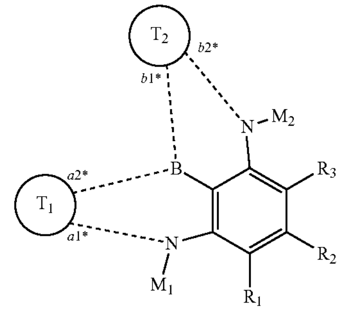

In Formula 1, $R_1$ to $R_3$, $M_1$, and $M_2$ may each independently be a hydrogen atom, a deuterium atom, a halogen atom, a cyano group, a substituted or unsubstituted oxy group, a substituted or unsubstituted thio group, a substituted or unsubstituted boryl group, a substituted or unsubstituted amine group, a substituted or unsubstituted silyl group, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms, or may be bonded to an adjacent group to form a ring. In Formula 1, $T_1$ and $T_2$ may each independently be a substituted or unsubstituted hydrocarbon ring having 6 to 30 ring-forming carbon atoms, or a substituted or unsubstituted heterocycle having 5 to 30 ring-forming carbon atoms. At least one of $T_1$ or $T_2$ may be a group represented by Formula 2. In Formula 1, a1* and a2* are sites where $T_1$ is bonded, and b1* and b2* are sites where $T_2$ is bonded.

[Formula 2]

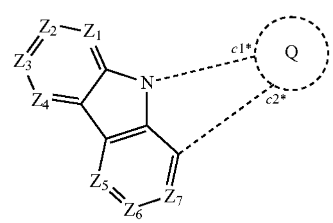

In Formula 2, Q may be 0 or 1. When Q is 0, the group represented by Formula 2 may be bonded to Formula 1 at sites c1* and c2*. When Q is 1, the group represented by Formula 2 may be bonded to Formula 1 through Q, or the group represented by Formula 2 may be bonded to Formula 1 at two neighboring sites selected from $Z_1$ to $Z_7$. In Formula 2, Q may be a substituted or unsubstituted hydrocarbon ring having 6 to 30 ring-forming carbon atoms, or a substituted or unsubstituted heterocycle having 5 to 30 ring-forming carbon atoms. In Formula 2, $Z_1$ to $Z_7$ may each independently be N or $C(R_a)$, and $R_a$ may be a hydrogen atom, a deuterium atom, a halogen atom, a cyano group, a substituted or unsubstituted oxy group, a substituted or unsubstituted thio group, a substituted or unsubstituted boryl group, a substituted or unsubstituted amine group, a substituted or unsubstituted silyl group, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms, or may be bonded to an adjacent group to form a ring.

In an embodiment, the group represented by Formula 2 may be represented by any one of Formulas 2-1 to 2-3.

[Formula 2-1]

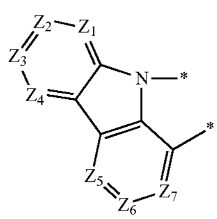

[Formula 2-2]

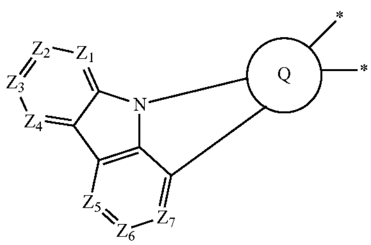

[Formula 2-3]

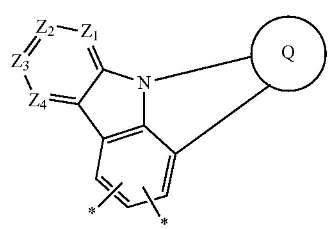

In Formulas 2-1 to 2-3, —* is a site bonded to a1* and a2* of Formula 1 or bonded to b1* and b2* of Formula 1, and Q, and $Z_1$ to $Z_7$ may be the same as defined in Formula 2.

In an embodiment, in Formula 1, any one of $T_1$ or $T_2$ may be a substituted or unsubstituted benzene ring, and the other one of $T_1$ or $T_2$ may be a group represented by any one of Formulas 2-1 to 2-3.

In an embodiment, the polycyclic compound represented by Formula 1 may be represented by any one of Formulas 4-1 to 4-8.

4-1

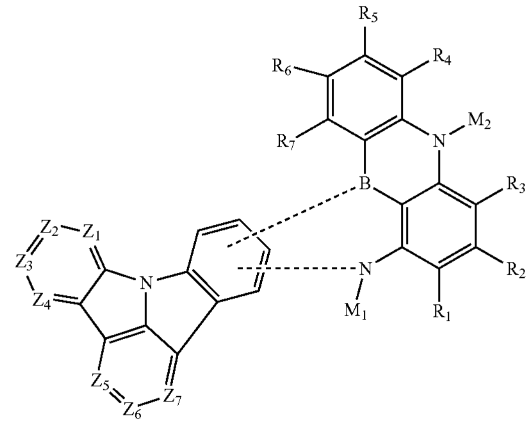

4-2

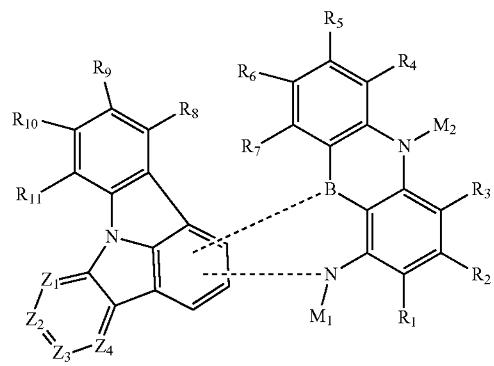

4-3

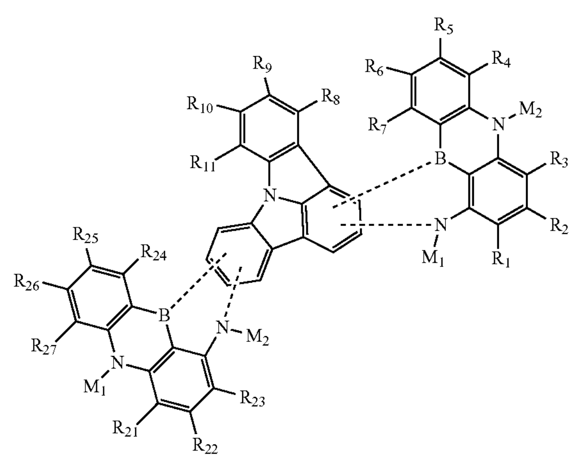

4-4
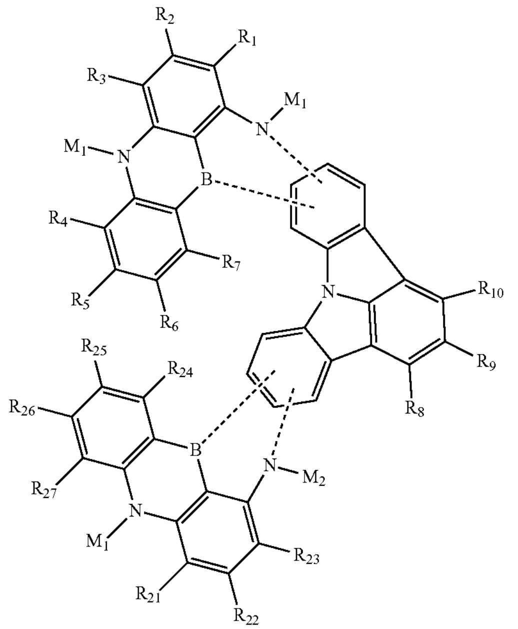
4-6
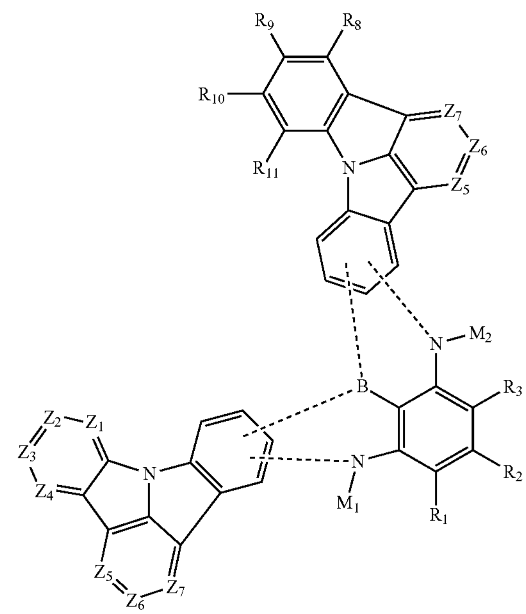
4-5
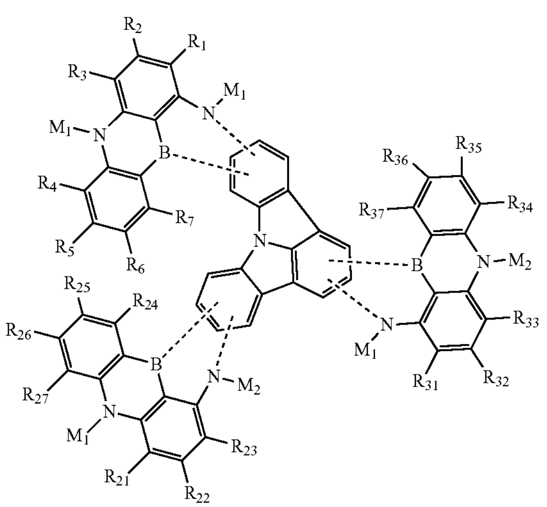
4-7
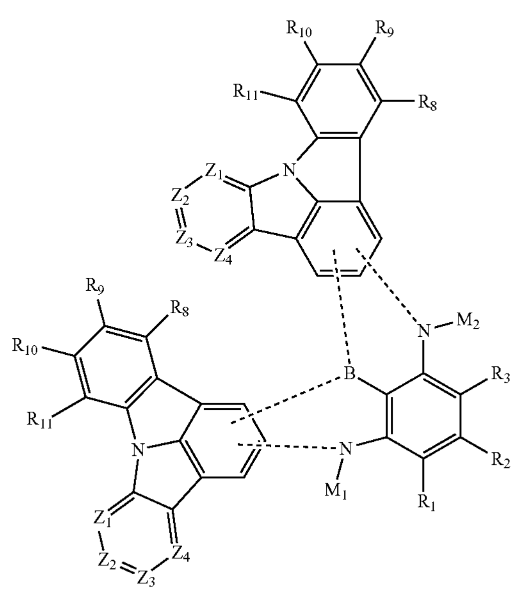

-continued 4-8

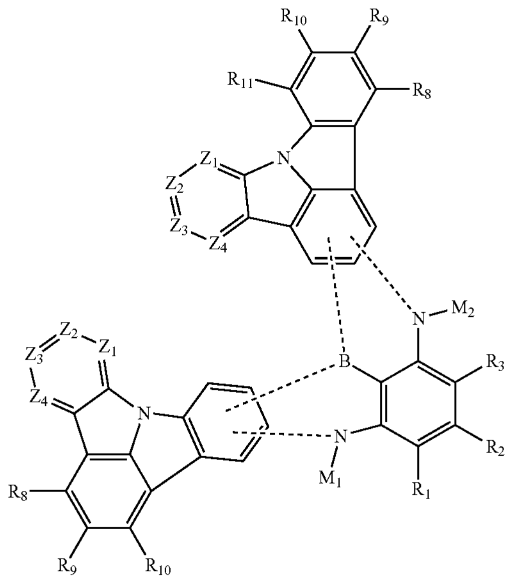

In Formulas 4-1 to 4-8, $R_4$ to $R_{11}$, $R_{21}$ to $R_{27}$, and $R_{31}$ to $R_{37}$ may each independently be a hydrogen atom, a deuterium atom, a halogen atom, a cyano group, a substituted or unsubstituted oxy group, a substituted or unsubstituted thio group, a substituted or unsubstituted boryl group, a substituted or unsubstituted amine group, a substituted or unsubstituted silyl group, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms, or may be bonded to an adjacent group to form a ring, and $R_1$ to $R_3$, $M_1$, $M_2$, and $Z_1$ to $Z_7$ may be the same as defined in Formulas 1 and 2.

In an embodiment, in Formula 1, any one of $T_1$ or $T_2$ may be a group represented by Formula 2, and the other one of $T_1$ or $T_2$ may be a group represented by any one of T-a to T-e.

T-a

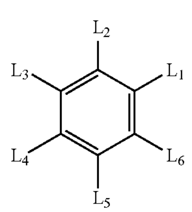

T-b

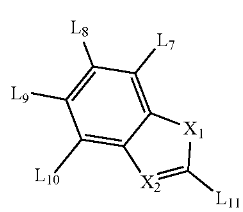

-continued

T-c

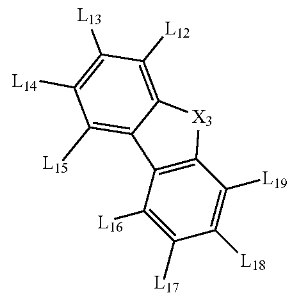

T-d

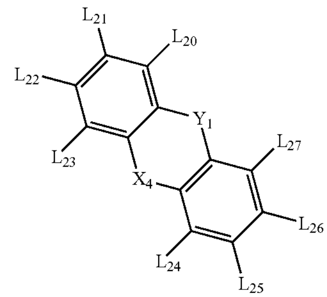

T-e

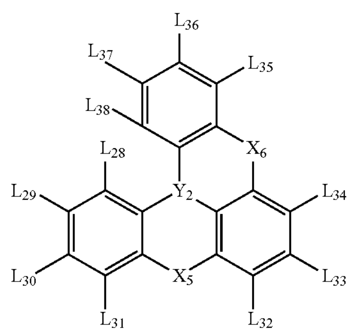

In T-a to T-e, $X_1$ to $X_6$ may each independently be N, O, S, $N(R_b)$, or $C(R_c)(R_d)$, and $Y_1$ and $Y_2$ may each independently be O, S, $B(R_e)$, or $P(=O)(R_f)$. In T-a to T-e, $L_1$ to $L_{38}$, and $R_b$ to $R_f$ may each independently be a hydrogen atom, a deuterium atom, a halogen atom, a cyano group, a substituted or unsubstituted oxy group, a substituted or unsubstituted thio group, a substituted or unsubstituted boryl group, a substituted or unsubstituted amine group, a substituted or unsubstituted silyl group, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms, or may be bonded to an adjacent group to form a ring, except that two neighboring sites selected from $L_1$ to $L_{38}$, and $X_1$ to $X_6$ correspond to a1* and a2* or correspond to b1* and b2*.

In an embodiment, the polycyclic compound represented by Formula 1 may be represented by any one of Formulas 5-1 to 5-9.

-continued
5-1
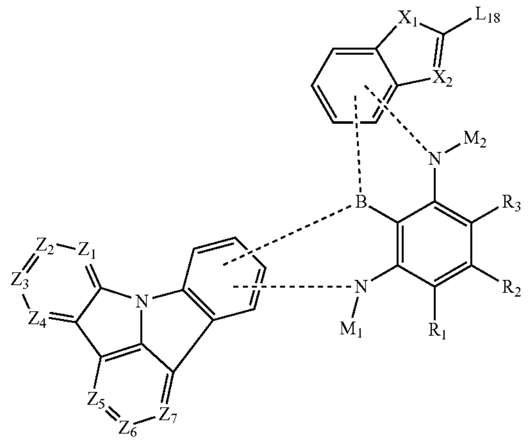
5-2
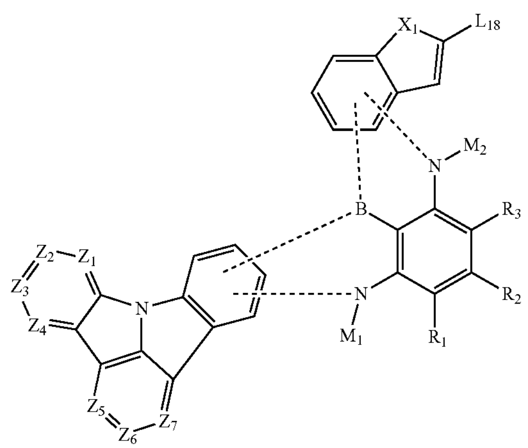
5-3
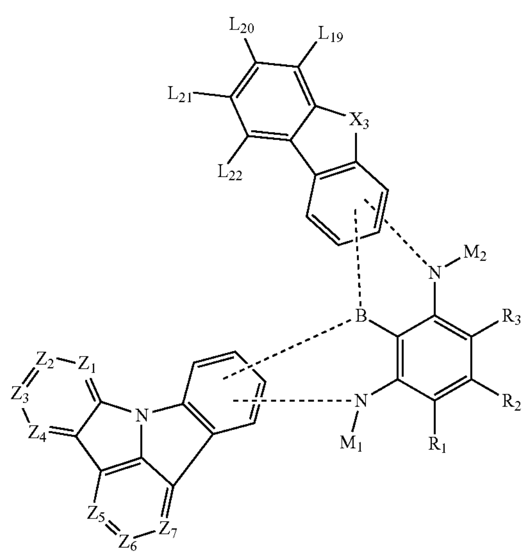
5-4
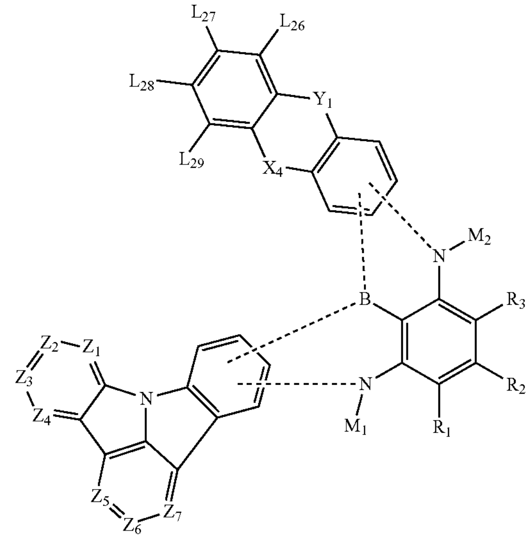
5-5
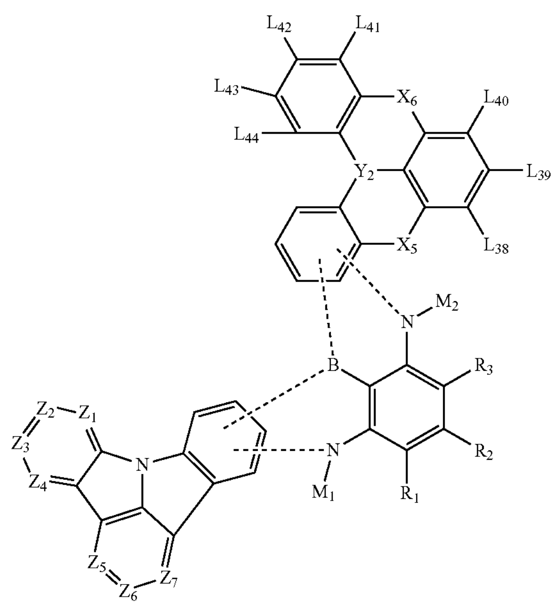
5-6
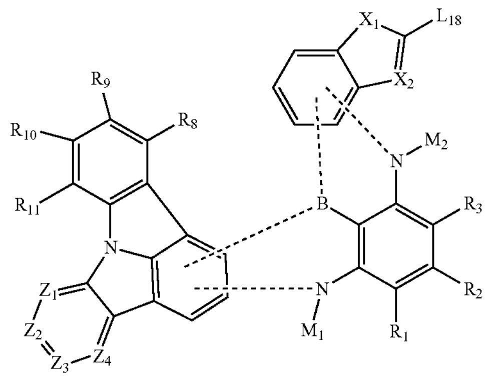

-continued 5-7

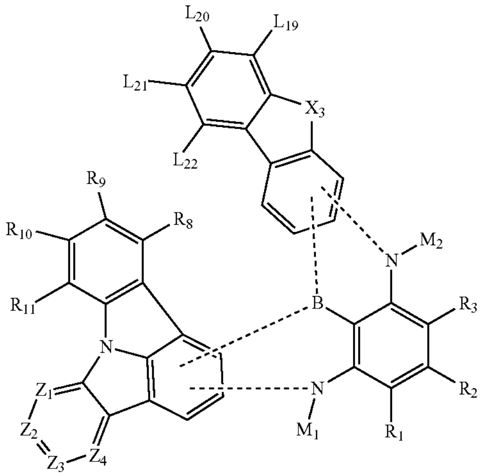

5-8

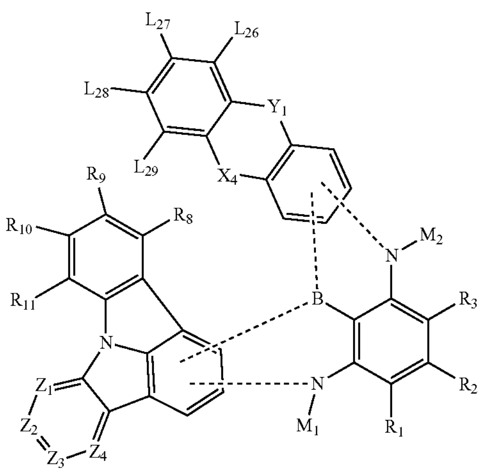

5-9

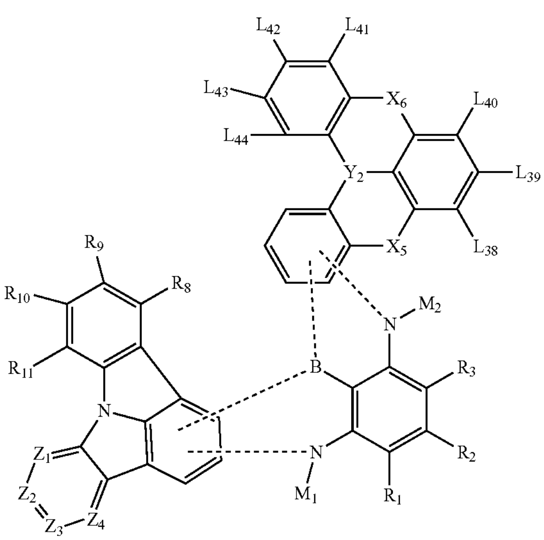

In Formulas 5-1 to 5-9, $X_1$ to $X_6$, $Y_1$, $Y_2$, $L_{18}$ to $L_{21}$, $L_{26}$ to $L_{29}$, and $L_{38}$ to $L_{44}$ may be the same as defined in T-a to T-e, and $R_1$ to $R_3$, $M_1$, $M_2$, and $Z_1$ to $Z_7$ may be the same as defined in Formulas 1 and 2.

In an embodiment, the polycyclic compound represented by Formula 1 may be any one selected from Compound Group 1, which is explained below.

In an embodiment, a light emitting diode may include a first electrode, a second electrode disposed on the first electrode, and at least one functional layer disposed between the first electrode and the second electrode, wherein the at least one functional layer may include the polycyclic compound.

In an embodiment, the at least one functional layer may include an emission layer, a hole transport region disposed between the first electrode and the emission layer, and an electron transport region disposed between the emission layer and the second electrode, and the emission layer may include the polycyclic compound.

In an embodiment, the emission layer may emit delayed fluorescence.

In an embodiment, the emission layer may include a host, an assistant dopant, and a light emitting dopant, wherein the assistant dopant may include a compound represented by Formula A, and the light emitting dopant may include the polycyclic compound.

[Formula A]

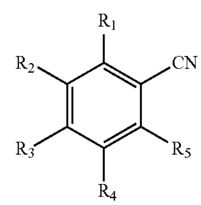

In Formula A, at least one of $R_1$ to $R_5$ may be a substituted or unsubstituted carbazole derivative, and the remainder of $R_1$ to $R_5$ may each independently be a hydrogen atom, a deuterium atom, a hydroxy group, or a cyano group.

In an embodiment, the light emitting diode may emit light having a maximum light emission wavelength equal to or less than about 470 nm and may have a CIEy of less than about 0.075.

In an embodiment, $R_1$ to $R_3$, $M_1$, $M_2$, $T_1$, and $T_2$ may each independently be a deuterium atom or a substituent including a deuterium atom.

In an embodiment, the polycyclic compound may have a molar absorption coefficient equal to or greater than about $4.0\times10^4 M^{-1} cm^{-1}$ at about 450 nm.

BRIEF DESCRIPTION OF THE DRAWINGS

The accompanying drawings are included to provide a further understanding of the embodiments, and are incorporated in and constitute a part of this specification. The drawings illustrate embodiments of the disclosure and principles thereof. The above and other aspects and features of the disclosure will become more apparent by describing in detail embodiments thereof with reference to the attached drawings, in which.

DETAILED DESCRIPTION OF THE EMBODIMENTS

Figure 1:
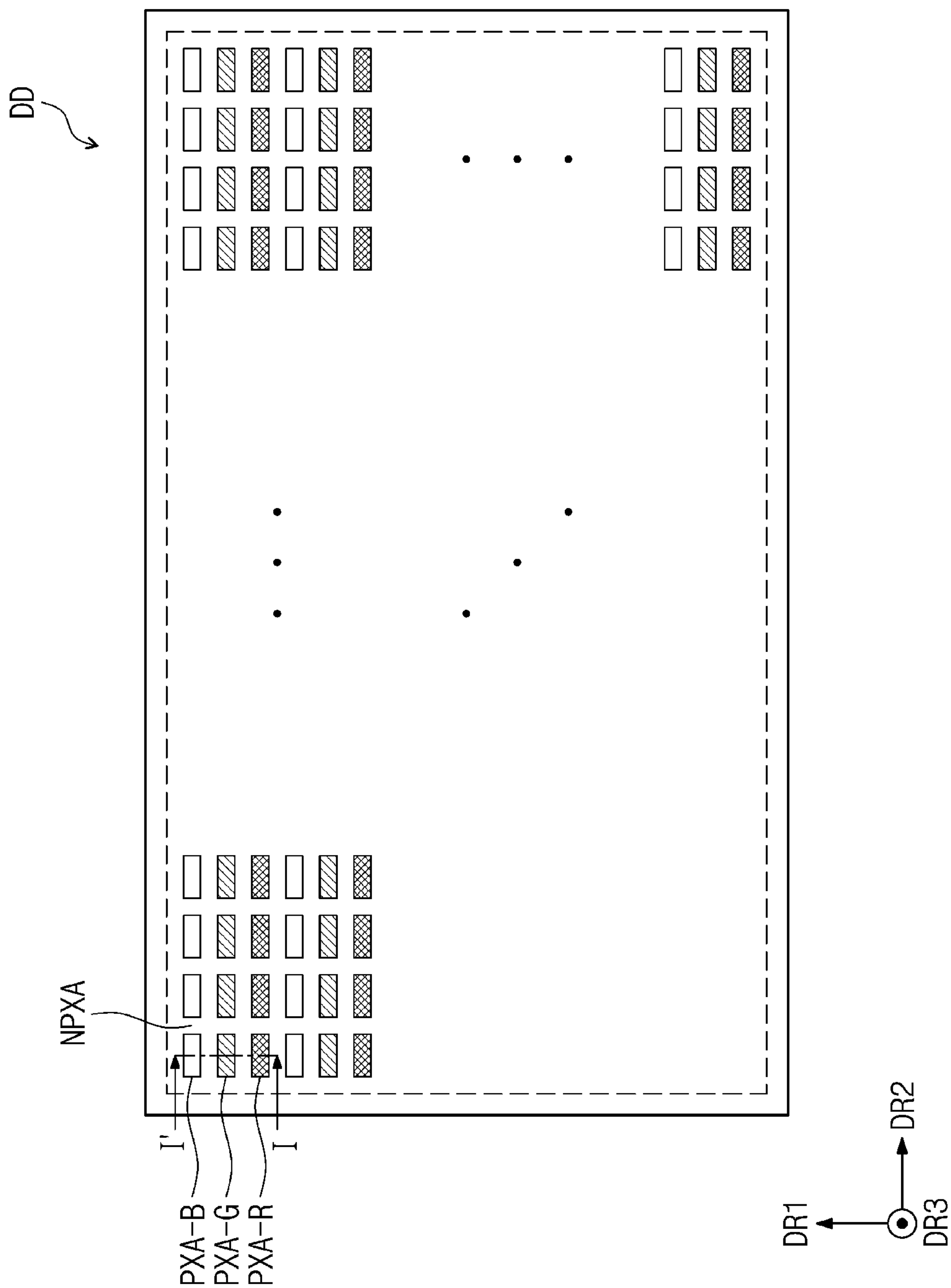
FIG. 1 is a plan view showing a display device according to an embodiment.

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

In the drawings, the sizes, thicknesses, ratios, and dimensions of the elements may be exaggerated for ease of description and for clarity. Like numbers refer to like elements throughout.

In the specification, it will be understood that when an element (or region, layer, part, etc.) is referred to as being "on", "connected to", or "coupled to" another element, it can be directly on, connected to, or coupled to the other element, or one or more intervening elements may be present therebetween. In a similar sense, when an element (or region, layer, part, etc.) is described as "covering" another element, it can directly cover the other element, or one or more intervening elements may be present therebetween.

In the specification, when an element is "directly on," "directly connected to," or "directly coupled to" another element, there are no intervening elements present. For example, "directly on" may mean that two layers or two elements are disposed without an additional element such as an adhesion element therebetween.

As used herein, the expressions used in the singular such as "a," "an," and "the," are intended to include the plural forms as well, unless the context clearly indicates otherwise.

As used herein, the term "and/or" includes any and all combinations of one or more of the associated listed items. For example, "A and/or B" may be understood to mean "A, B, or A and B." The terms "and" and "or" may be used in the conjunctive or disjunctive sense and may be understood to be equivalent to "and/or".

The term "at least one of" is intended to include the meaning of "at least one selected from" for the purpose of its meaning and interpretation. For example, "at least one of A and B" may be understood to mean "A, B, or A and B." When preceding a list of elements, the term, "at least one of," modifies the entire list of elements and does not modify the individual elements of the list.

It will be understood that, although the terms first, second, etc. may be used herein to describe various elements, these elements should not be limited by these terms. These terms are only used to distinguish one element from another element. Thus, a first element could be termed a second element without departing from the teachings of the disclosure. Similarly, a second element could be termed a first element, without departing from the scope of the disclosure.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

The terms "about" or "approximately" as used herein is inclusive of the stated value and means within an acceptable range of deviation for the recited value as determined by one of ordinary skill in the art, considering the measurement in question and the error associated with measurement of the recited quantity (i.e., the limitations of the measurement system). For example, "about" may mean within one or more standard deviations, or within ±20%, ±10%, or ±5% of the stated value.

It should be understood that the terms "comprises," "comprising," "includes," "including," "have," "having," "contains," "containing," and the like are intended to specify the presence of stated features, integers, steps, operations, elements, components, or combinations thereof in the disclosure, but do not preclude the presence or addition of one or more other features, integers, steps, operations, elements, components, or combinations thereof.

Unless otherwise defined or implied herein, all terms (including technical and scientific terms) used have the same meaning as commonly understood by those skilled in the art to which this disclosure pertains. It will be further understood that terms, such as those defined in commonly used dictionaries, should be interpreted as having a meaning that is consistent with their meaning in the context of the relevant art and should not be interpreted in an ideal or excessively formal sense unless clearly defined in the specification.

In the description, the term "substituted or unsubstituted" may mean a group that is substituted or unsubstituted with at least one substituent selected from the group consisting of a deuterium atom, a halogen atom, a cyano group, a nitro group, an amine group, a silyl group, an oxy group, a thio group, a sulfinyl group, a sulfonyl group, a carbonyl group, a boron group, a phosphine oxide group, a phosphine sulfide group, an alkyl group, an alkenyl group, an alkynyl group, a hydrocarbon ring group, an aryl group, and a heterocyclic group. Each of the substituents recited above may itself be substituted or unsubstituted. For example, a biphenyl group may be interpreted as an aryl group or as a phenyl group substituted with a phenyl group.

In the description, the term "bonded to an adjacent group to form a ring" may mean a group that is bonded to an adjacent group to form a substituted or unsubstituted hydrocarbon ring, or a substituted or unsubstituted heterocycle. The hydrocarbon ring may be an aliphatic hydrocarbon ring or an aromatic hydrocarbon ring. The heterocycle may be an aliphatic heterocycle or an aromatic heterocycle. The hydrocarbon ring and the heterocycle may each independently be monocyclic or polycyclic. A ring which is formed by adjacent groups being bonded to each other may itself be combined with another ring to form a spiro structure.

In the description, the term "adjacent group" may mean a substituent substituted for an atom which is directly connected to an atom substituted with a corresponding substituent, another substituent substituted for an atom which is substituted with a corresponding substituent, or a substituent sterically positioned at the nearest position to a corresponding substituent. For example, two methyl groups in 1,2-dimethylbenzene may be interpreted as mutually "adjacent groups" and two ethyl groups in 1,1-diethylcyclopentane may be interpreted as mutually "adjacent groups". For example, two methyl groups in 4,5-dimethylphenanthrene may be interpreted as mutually "adjacent groups".

In the description, examples of a halogen atom may include a fluorine atom, a chlorine atom, a bromine atom, or an iodine atom.

In the description, an alkyl group may be a linear, a branched, or a cyclic type. The number of carbon atoms in the alkyl group is 1 to 50, 1 to 30, 1 to 20, 1 to 10, or 1 to 6. Examples of the alkyl group may include a methyl group, an ethyl group, an n-propyl group, an isopropyl group, an n-butyl group, a s-butyl group, a t-butyl group, an i-butyl group, a 2-ethylbutyl group, a 3,3-a dimethylbutyl group, an n-pentyl group, an i-pentyl group, a neopentyl group, a t-pentyl group, a cyclopentyl group, a 1-methylpentyl group, a 3-methylpentyl group, a 2-ethylpentyl group, a 4-methyl-2-pentyl group, an n-hexyl group, a 1-methylhexyl group, a 2-ethylhexyl group, a 2-butylhexyl group, a cyclohexyl group, a 4-methylcyclohexyl group, a 4-t-butylcyclohexyl group, an n-heptyl group, a 1-methylheptyl group, a 2,2-dimethylheptyl group, a 2-ethylheptyl group, a 2-butylheptyl group, an n-octyl group, a t-octyl group, a 2-ethyloctyl group, a 2-butyloctyl group, a 2-hexyloctyl group, a 3,7-dimethyloctyl group, a cyclooctyl group, an n-nonyl group, an n-decyl group, an adamantyl group, a 2-ethyldecyl group, a 2-butyldecyl group, a 2-hexyldecyl group, a 2-octyldecyl group, an n-undecyl group, an n-dodecyl group, a 2-ethyldodecyl group, a 2-butyldodecyl group, a 2-hexyldodecyl group, a 2-octyldodecyl group, an n-tridecyl group, an n-tetradecyl group, an n-pentadecyl group, an n-hexadecyl group, a 2-ethylhexadecyl group, a 2-butylhexadecyl group, a 2-hexylhexadecyl group, a 2-octylhexadecyl group, an n-heptadecyl group, an n-octadecyl group, an n-nonadecyl group, an n-eicosyl group, a 2-ethyleicosyl group, a 2-butyleicosyl group, a 2-hexyleicosyl group, a 2-octyleicosyl group, an n-henicosyl group, an n-docosyl group, an n-tricosyl group, an n-tetracosyl group, an n-pentacosyl group, an n-hexacosyl group, an n-heptacosyl group, an n-octacosyl group, an n-nonacosyl group, an n-triacontyl group, etc., but are not limited thereto.

In the description, an alkenyl group may be a hydrocarbon group including at least one carbon-carbon double bond in the middle or end of an alkyl group having 2 or more carbon atoms. The alkenyl group may be linear or branched. The number of carbon atoms in the alkenyl group is not particularly limited, but may be 2 to 30, 2 to 20, or 2 to 10. Examples of the alkenyl group may include a vinyl group, a 1-butenyl group, a 1-pentenyl group, a 1,3-butadienyl aryl group, a styrenyl group, a styryl vinyl group, etc., but are not limited thereto.

In the description, a hydrocarbon ring group may be any functional group or substituent derived from an aliphatic hydrocarbon ring. For example, the hydrocarbon ring group may be a saturated hydrocarbon ring group having 5 to 20 ring-forming carbon atoms.

In the description, an aryl group may be any functional group or substituent derived from an aromatic hydrocarbon ring. The aryl group may be a monocyclic aryl group or a polycyclic aryl group. The number of ring-forming carbon atoms in the aryl group may be 6 to 30, 6 to 20, or 6 to 15. Examples of the aryl group may include a phenyl group, a naphthyl group, a fluorenyl group, an anthracenyl group, a phenanthryl group, a biphenyl group, a terphenyl group, a quaterphenyl group, a quinquephenyl group, a sexiphenyl group, a triphenylenyl group, a pyrenyl group, a benzofluoranthenyl group, a chrysenyl group, etc., but are not limited thereto.

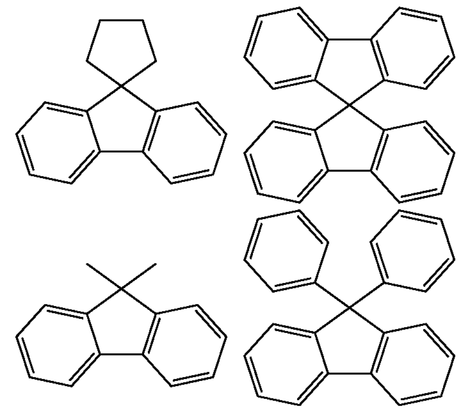

In the description, a fluorenyl group may be substituted, and two substituents may be bonded to each other to form a spiro structure. Examples of substituted fluorenyl groups are as follows. However, embodiments are not limited thereto.

In the description, a heterocyclic group may be any functional group or substituent derived from a ring including at least one of B, O, N, P, Si, or S as a heteroatom. The heterocyclic group may be an aliphatic heterocyclic group or an aromatic heterocyclic group. The aromatic heterocyclic group may be a heteroaryl group. The aliphatic heterocycle and the aromatic heterocycle may each be monocyclic or polycyclic.

In the description, the heterocyclic group may include at least one of B, O, N, P, Si, or S as a heteroatom. When the heterocyclic group includes two or more heteroatoms, the two or more heteroatoms may be the same as or different from each other. In the description, the heterocyclic group may be a monocyclic heterocyclic group or a polycyclic heterocyclic group, and the heterocyclic group may be a heteroaryl group. The number of ring-forming carbon atoms in the heterocyclic group may be 2 to 30, 2 to 20, or 2 to 10.

In the description, an aliphatic heterocyclic group may include at least one of B, O, N, P, Si, or S as a heteroatom. The number of ring-forming carbon atoms in the aliphatic heterocyclic group may be 2 to 30, 2 to 20, or 2 to 10. Examples of the aliphatic heterocyclic group may include an oxirane group, a thiirane group, a pyrrolidine group, a piperidine group, a tetrahydrofuran group, a tetrahydrothiophene group, a thiane group, a tetrahydropyran group, a 1,4-dioxane group, etc., but are not limited to thereto In the description, a heteroaryl group may include at least one of B, O, N, P, Si, or S as a heteroatom. When the heteroaryl group includes two or more heteroatoms the two or more heteroatoms may be the same as or different from each other. The heteroaryl group may be a monocyclic heteroaryl group or a polycyclic heteroaryl group. The number of ring-forming carbon atoms in the heteroaryl group may be 2 to 30, 2 to 20, or 2 to 10. Examples of the heteroaryl group may include a thiophene group, a furan group, a pyrrole group, an imidazole group, a triazole group, a pyridine group, a bipyridine group, a pyrimidine, a triazine group, a triazole group, an acridyl group, a pyridazine group, a pyrazinyl group, a quinoline group, a quinazoline group, a quinoxaline group, a phenoxazine group, a phthalazine group, a pyrido pyrimidine group, a pyrido pyrazine group, a pyrazino pyrazine group, an isoquinoline group, an indole group, a carbazole group, an N-arylcarbazole group, an N-heteroarylcarbazole group, an N-alkylcarbazole group, a benzoxazole group, a benzoimidazole group, a benzothiazole group, a benzocarbazole group, a benzothiophene group, a dibenzothiophene group, a thienothiophene group, a benzofuran group, a phenanthroline group, a thiazole group, an isoxazole group, an oxazole group, an oxadiazole group, a thiadiazole group, a phenothiazine group, a dibenzosilole group, a dibenzofuran group, etc., but are not limited thereto.

In the description, the above description of the aryl group may be applied to an arylene group, except that the arylene group is a divalent group. The above description of the heteroaryl group may be applied to a heteroarylene group, except that the heteroarylene group is a divalent group.

In the description, a boryl group may be an alkyl boryl group or an aryl boryl group. Examples of the boryl group may include a dimethylboryl group, a diethylboryl group, a t-butylmethylboryl group, a diphenylboryl group, a phenylboryl group, etc., but are not limited thereto. For example, the alkyl group in the alkyl boryl group may be the same as the examples of the alkyl group described above, and the aryl group in the aryl boryl group may be the same as the examples of the aryl group described above.

In the description, a silyl group may be an alkyl silyl group or an aryl silyl group. Examples of the silyl group may include a trimethylsilyl group, a triethylsilyl group, a t-butyldimethylsilyl group, a vinyldimethylsilyl group, a propyldimethylsilyl group, a triphenylsilyl group, a diphenylsilyl group, a phenylsilyl group, etc., but are not limited thereto.

In the description, the number of carbon atoms in an amino group is not particularly limited, but may be 1 to 30. The amino group may be an alkyl amino group, an aryl amino group, or a heteroaryl amino group. Examples of the amino group may include a methylamino group, a dimethylamino group, a phenylamino group, a diphenylamino group, a naphthylamino group, a 9-methyl-anthracenylamino group, etc., but are not limited thereto.

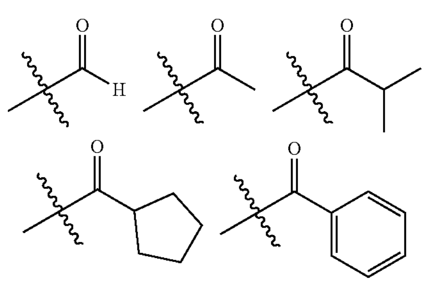

In the description, the number of carbon atoms in a carbonyl group is not particularly limited, but may be 1 to 40, 1 to 30, or 1 to 20. For example, a carbonyl group may have one of the following structures, but is not limited thereto.

In the description, the number of carbon atoms in a sulfinyl group or in a sulfonyl group is not particularly limited, but may be 1 to 30. The sulfinyl group may be an alkyl sulfinyl group or an aryl sulfinyl group. The sulfonyl group may be an alkyl sulfonyl group or an aryl sulfonyl group.

In the description, a thio group may be an alkyl thio group or an aryl thio group. A thio group may be a sulfur atom that is bonded to an alkyl group or an aryl group as defined above. Examples of the thio group may include a methylthio group, an ethylthio group, a propylthio group, a pentylthio group, a hexylthio group, an octylthio group, a dodecylthio group, a cyclopentylthio group, a cyclohexylthio group, a phenylthio group, a naphthylthio group, etc., but are not limited to thereto.

In the description, an oxy group may be an oxygen atom that is bonded to an alkyl group or aryl group as defined above. The oxy group may be an alkoxy group or an aryl oxy group. The alkoxy group may be linear, branched, or cyclic. The number of carbon atoms in the alkoxy group is not particularly limited, but may be, for example, 1 to 20, or 1 to 10. Examples of the oxy group may include methoxy, ethoxy, n-propoxy, isopropoxy, butoxy, pentyloxy, hexyloxy, octyloxy, nonyloxy, decyloxy, benzyloxy, etc., but are not limited thereto.

In the description, a boron group may be a boron atom that is bonded to an alkyl group or aryl group as defined above. The boron group may be an alkyl boron group or an aryl boron group. Examples of the boron group may include a trimethylboron group, a triethylboron group, a t-butyldimethylboron group, a triphenylboron group, a diphenylboron group, a phenylboron group, etc., but are not limited thereto.

In the description, the number of carbon atoms in an amine group is not particularly limited, but may be 1 to 30. The amine group may be an alkyl amine group or an aryl amine group. Examples of the amine group may include a methylamine group, a dimethylamine group, a phenylamine group, a diphenylamine group, a naphthylamine group, a 9-methyl-anthracenylamine group, etc., but are not limited thereto.

In the description, examples of the alkyl group may include an alkylthio group, an alkyl sulfoxy group, an alkylaryl group, an alkylamino group, an alkyl boron group, an alkyl silyl group, and an alkyl amine group.

In the description, examples of the aryl group may include an aryloxy group, an arylthio group, an aryl sulfoxy group, an arylamino group, an aryl boron group, an aryl silyl group, and an aryl amine group.

In the description, a direct linkage may be a single bond.

In the description,

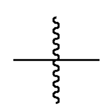

or —* each represents a binding site to a neighboring atom.

Hereinafter, embodiments will be described with reference to the accompanying drawings.

Figure 2:
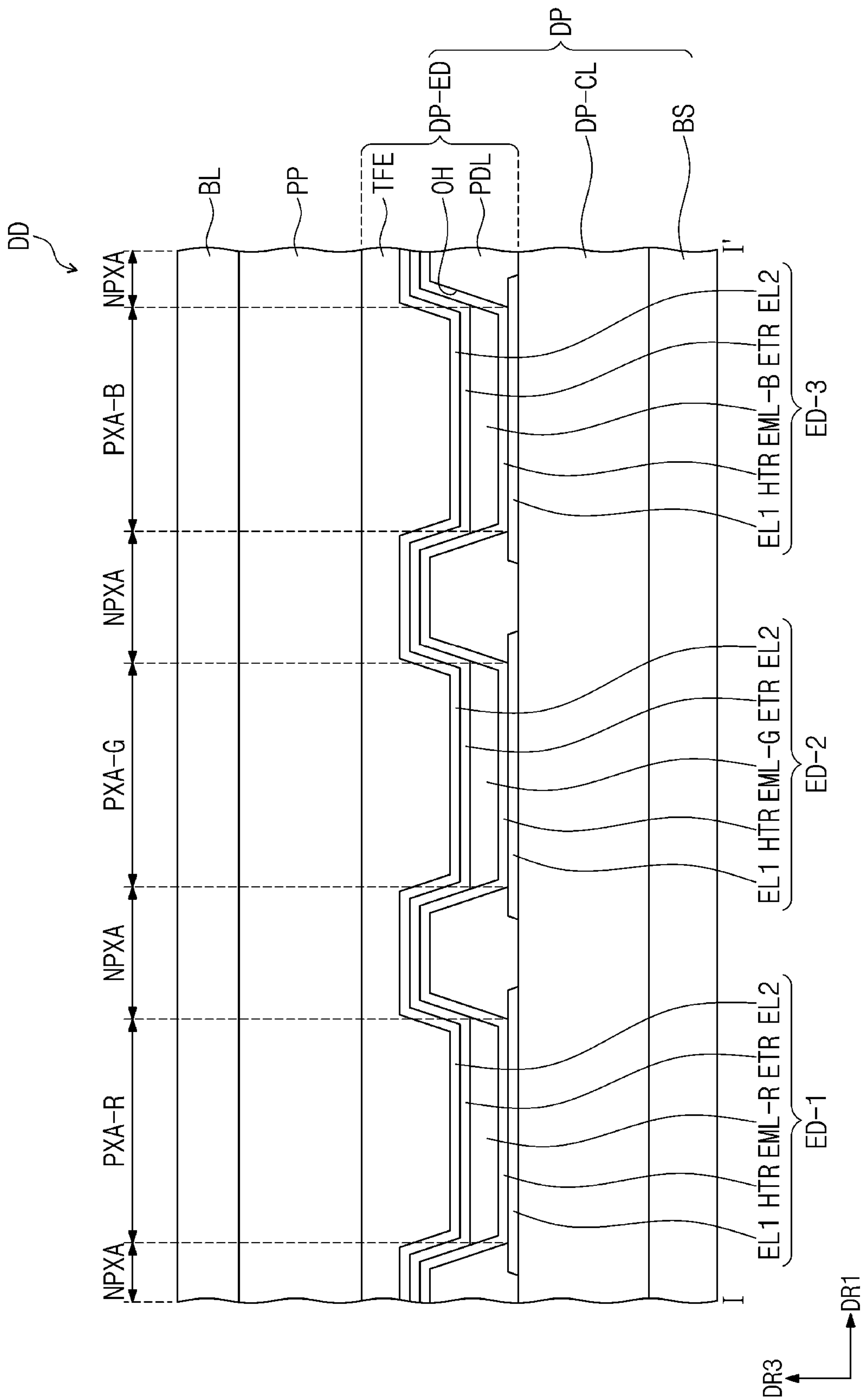
FIG. 2 is a schematic cross-sectional view of a display device according to an embodiment.

FIG. 1 is a plan view showing an embodiment of a display device DD. FIG. 2 is a schematic cross-sectional view of a display device DD of an embodiment. FIG. 2 is a schematic cross-sectional view showing a portion corresponding to line I-I' of FIG. 1.

The display device DD may include a display panel DP and an optical layer PP disposed on the display panel DP. The display panel DP includes light emitting diodes ED-1, ED-2, and ED-3. The display device DD may include multiples of each of the light emitting diodes ED-1, ED-2, and ED-3. The optical layer PP may be disposed on the display panel DP and may control light reflected at the display panel DP from an external light. The optical layer PP may include, for example, a polarizing layer or a color filter layer. Although not shown in the drawings, in an embodiment, the optical layer PP may be omitted from the display device DD.

A base substrate BL may be disposed on the optical layer PP. The base substrate BL may provide a base surface on which the optical layer PP is disposed. The base substrate BL may be a glass substrate, a metal substrate, a plastic substrate, etc. However, embodiments are not limited thereto, and the base substrate BL may include an inorganic layer, an organic layer, or a composite material layer. Although not shown in the drawings, in an embodiment, the base substrate BL may be omitted.

The display device DD according to an embodiment may further include a filling layer (not shown). The filling layer (not shown) may be disposed between a display element layer DP-ED and the base substrate BL. The filling layer (not shown) may be an organic material layer. The filling layer (not shown) may include at least one of an acrylic resin, a silicone-based resin, and an epoxy-based resin.

The display panel DP may include a base layer BS, a circuit layer DP-CL provided on the base layer BS, and a display element layer DP-ED. The display element layer DP-ED may include pixel defining films PDL, light emitting diodes ED-1, ED-2, and ED-3 disposed between the pixel defining films PDL, and an encapsulation layer TFE disposed on the light emitting diodes ED-1, ED-2, and ED-3.

The base layer BS may provide a base surface on which the display element layer DP-ED is disposed. The base layer BS may be a glass substrate, a metal substrate, a plastic substrate, etc. However, embodiments are not limited thereto, and the base layer BS may include an inorganic layer, an organic layer, or a composite material layer.

In an embodiment, the circuit layer DP-CL may be disposed on the base layer BS, and the circuit layer DP-CL may include transistors (not shown). The transistors (not shown) may each include a control electrode, an input electrode, and an output electrode. For example, the circuit layer DP-CL may include a switching transistor and a driving transistor for driving light emitting diodes ED-1, ED-2, and ED-3 of the display element layer DP-ED.

The light emitting diodes ED-1, ED-2, and ED-3 may each have a structure of a light emitting diode ED of an embodiment according to FIGS. 3 to 6, which will be described later. The light emitting diodes ED-1, ED-2, and ED-3 may each include a first electrode EL1, a hole transport region HTR, emission layers EML-R, EML-G, and EML-B, an electron transport region ETR, and a second electrode EL2.

FIG. 2 shows an embodiment in which the emission layers EML-R, EML-G, and EML-B of the light emitting diodes ED-1, ED-2, and ED-3 are disposed in openings OH defined in the pixel defining films PDL, and the hole transport region HTR, the electron transport region ETR, and the second electrode EL2 are each provided as a common layer throughout the light emitting diodes ED-1, ED-2, and ED-3. However, embodiments are not limited thereto. Although not shown in FIG. 2, in an embodiment, the hole transport region HTR and the electron transport region ETR may each be patterned to be provided in the openings OH defined in the pixel defining films PDL. For example, in an embodiment, the hole transport region HTR, the emission layers EML-R, EML-G, and EML-B, and the electron transport region ETR, etc., of the light emitting diodes ED-1, ED-2, and ED-3 may be patterned and provided through an inkjet printing method.

An encapsulation layer TFE may cover the light emitting diodes ED-1, ED-2, and ED-3. The encapsulation layer TFE may seal the display element layer DP-ED. The encapsulation layer TFE may be a thin film encapsulation layer. The encapsulation layer TFE may be a single layer or a lamination of multiple layers. The encapsulation layer TFE may include at least one insulating layer. The encapsulation layer TFE according to an embodiment may include at least one inorganic film (hereinafter, an encapsulation inorganic film). The encapsulation layer TFE according to an embodiment may include at least one organic film (hereinafter, an encapsulation organic film) and at least one encapsulation inorganic film.

The encapsulation inorganic film may protect the display element layer DP-ED from moisture and/or oxygen, and the encapsulation organic film may protect the display element layer DP-ED from foreign substances such as dust particles. The encapsulation inorganic film may include silicon nitride, silicon oxy nitride, silicon oxide, titanium oxide, aluminum oxide, etc., but is not particularly limited thereto. The encapsulation organic layer may include an acrylic compound, an epoxy-based compound, etc. The encapsulation organic layer may include a photopolymerizable organic material, without limitation.

The encapsulation layer TFE may be disposed on the second electrode EL2, and may be disposed to fill the openings OH.

Referring to FIGS. 1 and 2, the display device DD may include non-light emitting areas NPXA and light emitting areas PXA-R, PXA-G, and PXA-B. The light emitting areas PXA-R, PXA-G, and PXA-B may each be an area emitting light generated from each of the light emitting diodes ED-1, ED-2, and ED-3. The light emitting areas PXA-R, PXA-G, and PXA-B may be spaced apart from each other on a plane.

Each of the light emitting areas PXA-R, PXA-G, and PXA-B may be an area separated by the pixel defining films PDL. The non-light emitting areas NPXA may be an area between neighboring light emitting areas PXA-R, PXA-G, and PXA-B, and may correspond to the pixel defining films PDL. For example, in an embodiment, each of the light emitting areas PXA-R, PXA-G, and PXA-B may correspond to a pixel. The pixel defining films PDL may separate the light emitting diodes ED-1, ED-2, and ED-3. The emission layers EML-R, EML-G, and EML-B of the light emitting diodes ED-1, ED-2, and ED-3 may be disposed in openings OH defined by the pixel defining films PDL and separated from each other.

The light emitting areas PXA-R, PXA-G, and PXA-B may be divided into groups according to the color of light generated from each of the light emitting diodes ED-1, ED-2, and ED-3. In the display device DD of an embodiment shown in FIGS. 1 and 2, three light emitting areas PXA-R, PXA-G, and PXA-B which respectively emit red light, green light, and blue light, are shown as an example. For example, the display device DD of an embodiment may include a red light emitting area PXA-R, a green light emitting area PXA-G, and a blue light emitting area PXA-B, which are distinct from one another.

In the display device DD according to an embodiment, the light emitting diodes ED-1, ED-2, and ED-3 may each emit light having different wavelength ranges. For example, in an embodiment, the display device DD may include a first light emitting diode ED-1 emitting red light, a second light emitting diode ED-2 emitting green light, and a third light emitting diode ED-3 emitting blue light. For example, the red light emitting area PXA-R, the green light emitting area PXA-G, and the blue light emitting area PXA-B of the display device DD may correspond to the first light emitting diode ED-1, the second light emitting diode ED-2, and the third light emitting diode ED-3, respectively.

However, embodiments are not limited thereto, and the first to third light emitting diodes ED-1, ED-2, and ED-3 may emit light in a same wavelength range or may emit light in at least one different wavelength range. For example, the first to third light emitting diodes ED-1, ED-2, and ED-3 may all emit blue light.

The light emitting areas PXA-R, PXA-G, and PXA-B in the display device DD according to an embodiment may be arranged in the form of a stripe. Referring to FIG. 1, the red light emitting areas PXA-R, the green light emitting areas PXA-G, and the blue light emitting areas PXA-B may each be arranged along a second directional axis DR2. In another embodiment, the red light emitting area PXA-R, the green light emitting area PXA-G, and the blue light emitting area PXA-B may be alternately arranged in turn along a first directional axis DR1.

FIGS. 1 and 2 show that the light emitting areas PXA-R, PXA-G, and PXA-B are all similar in size, but embodiments are not limited thereto, and the light emitting areas PXA-R, PXA-G and PXA-B may be different in size from each other according to a wavelength range of emitted light. The areas of the light emitting areas PXA-R, PXA-G, and PXA-B may be areas in a plan view that are defined by the first directional axis DR1 and the second directional axis DR2.

The arrangement of the light emitting areas PXA-R, PXA-G, and PXA-B is not limited to the one shown in FIG. 1, and the order in which the red light emitting area PXA-R, the green light emitting area PXA-G, and the blue light emitting area PXA-B are arranged may be provided in various combinations according to the display quality characteristics which are required for the display device DD. For example, the light emitting areas PXA-R, PXA-G, and PXA-B may be arranged in a PENTILE® configuration or in a diamond configuration.

In an embodiment, an area of each of the light emitting areas PXA-R, PXA-G, and PXA-B may be different in size from one another. For example, in an embodiment, the green light emitting area PXA-G may be smaller than the blue light emitting area PXA-B in size, but embodiments are not limited thereto.

Hereinafter, FIGS. 3 to 6 are each a schematic cross-sectional view showing a light emitting diode according to an embodiment. The light emitting diode ED according to an embodiment may include a first electrode EL1, a second electrode EL2 disposed on the first electrode EL1, and at least one functional layer disposed between the first electrode EL1 and the second electrode EL2. The light emitting diode ED of an embodiment may include a polycyclic compound of an embodiment, which will be described later, in at least one functional layer.

In an embodiment, the at least one function layer may include an emission layer EML, a hole transport region HTR disposed between the first electrode EL1 and the emission layer EML, and an electron transport region ETR disposed between the emission layer EML and the second electrode EL2. For example, the light emitting diode ED may include a hole transport region HTR, an emission layer EML, and an electron transport region ETR, which are sequentially stacked. For example, the light emitting diode ED of an embodiment may include a first electrode EL1, a hole transport region HTR, an emission layer EML, an electron transport region ETR, and a second electrode EL2.

Figure 3:
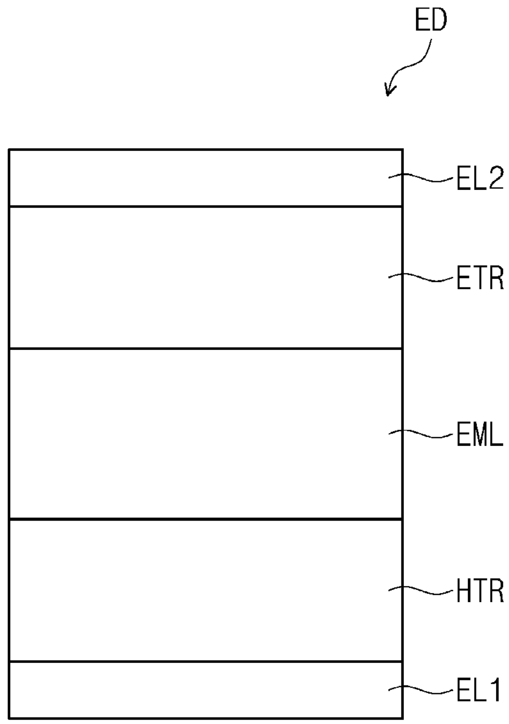
FIG. 3 is a schematic cross-sectional view showing a light emitting diode according to an embodiment.
Figure 4:
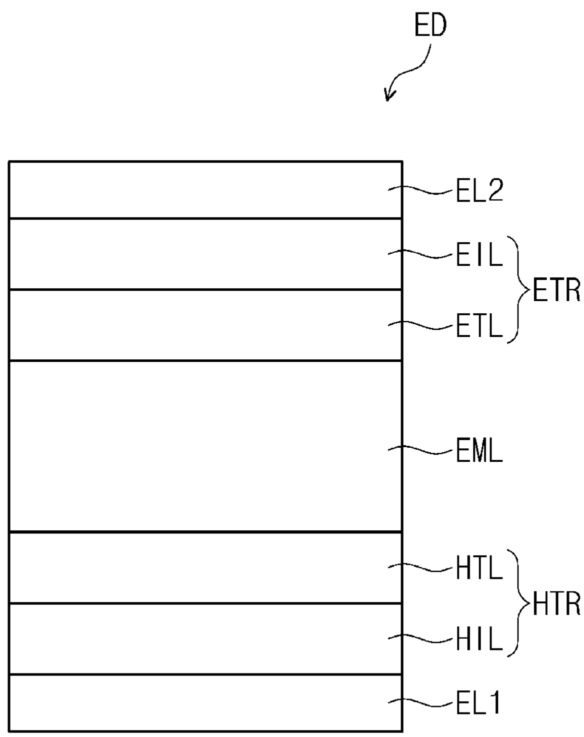
FIG. 4 is a schematic cross-sectional view showing a light emitting diode according to an embodiment.
Figure 5:
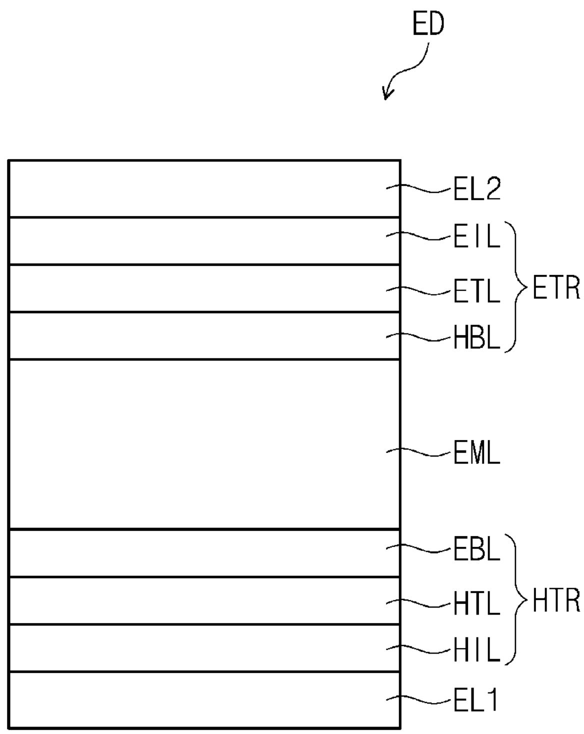
FIG. 5 is a schematic cross-sectional view showing a light emitting diode according to an embodiment.
Figure 6:
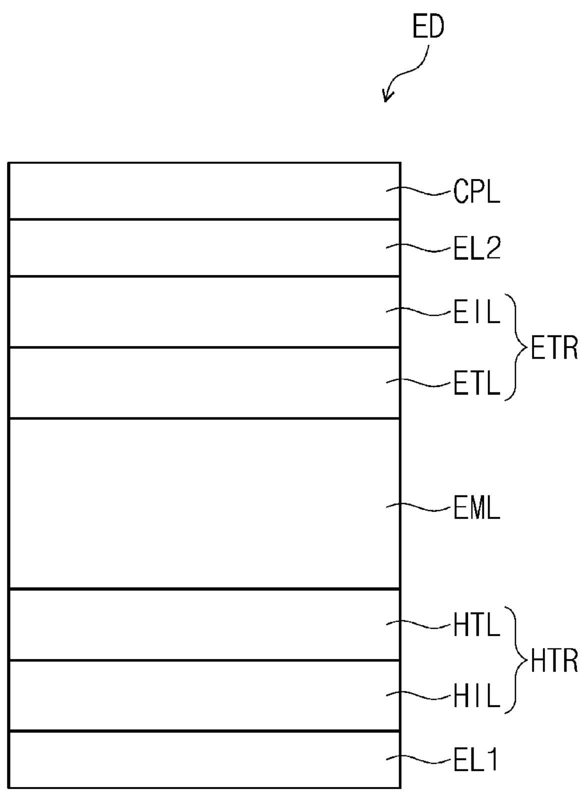
FIG. 6 is a schematic cross-sectional view showing a light emitting diode according to an embodiment.

FIG. 4 shows, in comparison with FIG. 3, a schematic cross-sectional view of a light emitting diode ED of an embodiment in which the hole transport region HTR includes a hole injection layer HIL and a hole transport layer HTL, and the electron transport region ETR includes an electron injection layer EIL and an electron transport layer ETL. FIG. 5 shows, in comparison with FIG. 3, a schematic cross-sectional view of a light emitting diode ED of an embodiment in which the hole transport region HTR includes a hole injection layer HIL, a hole transport layer HTL, and an electron blocking layer EBL, and the electron transport region ETR includes an electron injection layer EIL, an electron transport layer ETL, and a hole blocking layer HBL. FIG. 6 shows, in comparison with FIG. 4, a schematic cross-sectional view of a light emitting diode ED of an embodiment that includes a capping layer CPL disposed on the second electrode EL2.

The light emitting diode ED according to an embodiment may include a polycyclic compound of an embodiment, which will be described later, in the emission layer EML. In the display device DD (FIG. 2) of an embodiment including multiple light emitting areas, the emission layer EML constituting at least one light emitting area may include the polycyclic compound according to an embodiment, which will be described later.

In the light emitting diode ED according to an embodiment, the first electrode EL1 has conductivity. The first electrode EL1 may be formed of a metal material, a metal alloy, or a conductive compound. The first electrode EL1 may be an anode or a cathode. However, embodiments are not limited thereto. For example, the first electrode EL1 may be a pixel electrode. The first electrode EL1 may be a transmissive electrode, a transflective electrode, or a reflective electrode. The first electrode may include Ag, Mg, Cu, Al, Pt, Pd, Au, Ni, Nd, Ir, Cr, Li, Ca, LiF, Mo, Ti, W, In, Sn, Zn, an oxide thereof, a compound thereof, or a mixture thereof.

When the first electrode EL1 is a transmissive electrode, the first electrode EL1 may include a transparent metal oxide such as indium tin oxide (ITO), indium zinc oxide (IZO), zinc oxide (ZnO), and indium tin zinc oxide (ITZO). When the first electrode EL1 is a transflective electrode or a reflective electrode, the first electrode EL1 may include Ag, Mg, Cu, Al, Pt, Pd, Au, Ni, Nd, Ir, Cr, Li, Ca, LiF/Ca (a stack structure of LiF and Ca), LiF/Al (a stack structure of LiF and Al), Mo, Ti, W, a compound thereof, or a mixture thereof (e.g., a mixture of Ag and Mg). In another embodiment, the first electrode EL1 may have a multilayer structure including a reflective film or a transflective film formed of the above-described materials, and a transparent conductive film formed of indium tin oxide (ITO), indium zinc oxide (IZO), zinc oxide (ZnO), indium tin zinc oxide (ITZO), etc. For example, the first electrode EL1 may have a three-layer structure of ITO/Ag/ITO. However, embodiments are not limited thereto, and the first electrode EL1 may include the above-described metal materials, a combination of two or more metal materials selected from the above-described metal materials, or oxides of the above-described metal materials. The first electrode EL1 may have a thickness in a range of about 700 Å to about 10,000 Å. For example, the first electrode EL1 may have a thickness in a range of about 1,000 Å to about 3,000 Å.

The hole transport region HTR is provided on the first electrode EL1. The hole transport region HTR may include at least one of a hole injection layer HIL, a hole transport layer HTL, a buffer layer (not shown), a light emitting auxiliary layer (not shown), and an electron blocking layer EBL. The hole transport region HTR may have, for example, a thickness in a range of about 50 Å to about 15,000 Å.

The hole transport region HTR may be a layer formed of a single material, a layer formed of different materials, or a multilayer structure having layers formed of different materials.

For example, the hole transport region HTR may have a single-layer structure formed of the hole injection layer HIL or the hole transport layer HTL, or a single-layer structure formed of a hole injection material or a hole transport material. For example, the hole transport region HTR may have a single-layer structure formed of different materials, or a structure in which a hole injection layer HIL/hole transport layer HTL, a hole injection layer HIL/hole transport layer HTL/buffer layer (not shown), a hole injection layer HIL/buffer layer (not shown), a hole transport layer HTL/buffer layer (not shown), or a hole injection layer HIL/hole transport layer HTL/electron blocking layer EBL are stacked in its respective stated order from the first electrode EL1, but embodiments are not limited thereto.

The hole transport region HTR may be formed using various methods such as a vacuum deposition method, a spin coating method, a cast method, a Langmuir-Blodgett (LB) method, an inkjet printing method, a laser printing method, and a laser induced thermal imaging (LITI) method.

The hole transport region HTR may include a compound represented by Formula H-1.

[Formula H-1]

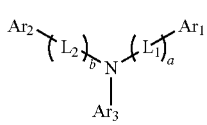

In Formula H-1, $L_1$ and $L_2$ may each independently be a direct linkage, a substituted or unsubstituted arylene group having 6 to 30 ring-forming carbon atoms, or a substituted or unsubstituted heteroarylene group having 2 to 30 ring-forming carbon atoms. In Formula H-1, a and b may each independently be an integer from 0 to 10. When a or b is 2 or greater, $L_1$ groups and $L_2$ groups may each independently be a substituted or unsubstituted arylene group having 6 to 30 ring-forming carbon atoms, or a substituted or unsubstituted heteroarylene group having 2 to 30 ring-forming carbon atoms.

In Formula H-1, $Ar_1$ and $Ar_2$ may each independently be a substituted or unsubstituted aryl group having 6 to 30 ring-forming carbon atoms, or a substituted or unsubstituted heteroaryl group having 2 to 30 ring-forming carbon atoms. In Formula H-1, $Ar_3$ may be a substituted or unsubstituted aryl group having 6 to 30 ring-forming carbon atoms.

In an embodiment, the compound represented by Formula H-1 may be a monoamine compound. In another embodiment, the compound represented by Formula H-1 may be a diamine compound in which at least one of $Ar_1$ to $Ar_3$ includes an amine group as a substituent. In still another embodiment, the compound represented by Formula H-1 may be a carbazole-based compound including a substituted or unsubstituted carbazole group in at least one of $Ar_1$ or $Ar_2$ or a substituted or unsubstituted fluorene-based group in at least one of $Ar_1$ or $Ar_2$.

The compound represented by Formula H-1 may be any one selected from Compound Group H. However, the compounds listed in Compound Group H are only examples, and the compound represented by Formula H-1 is not limited to Compound Group H.

[Compound Group H]

H-1-1

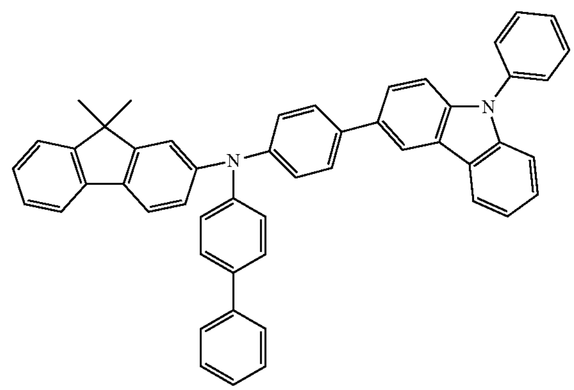

H-1-2

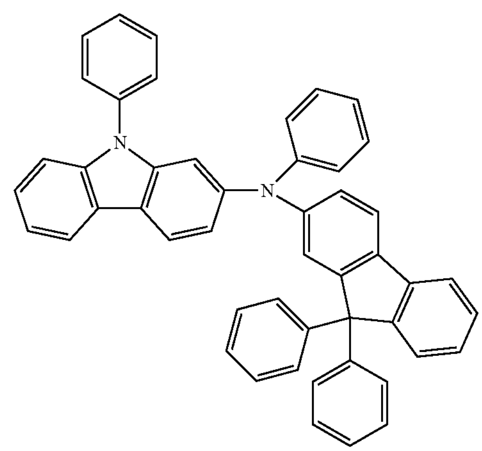

H-1-3

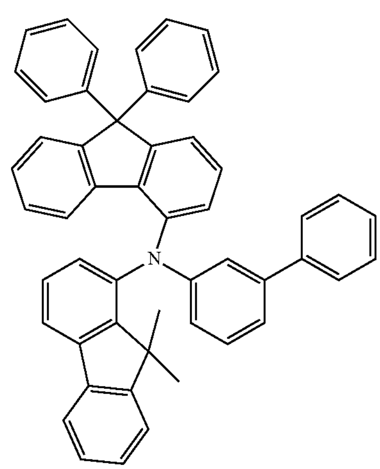

-continued
H-1-4
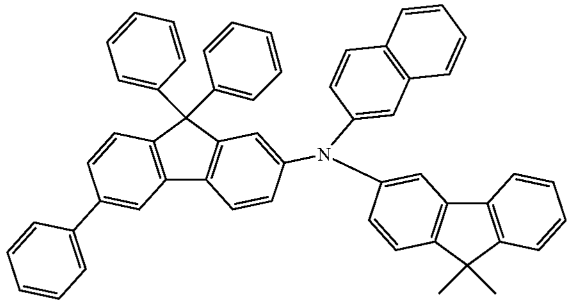
H-1-5
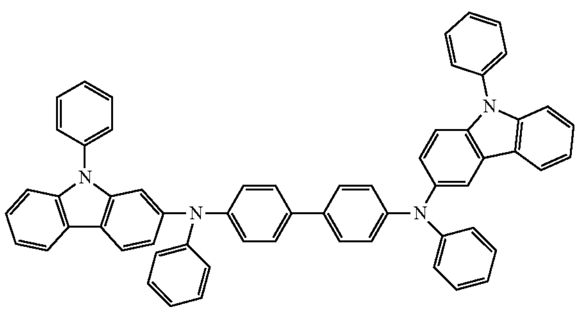
H-1-6
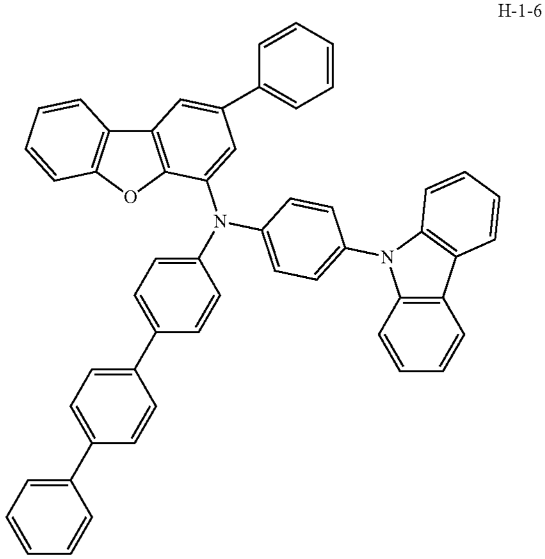
-continued
H-1-7
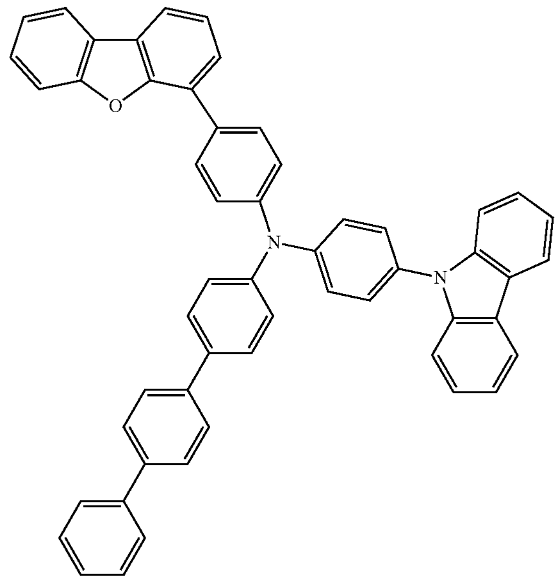
H-1-8
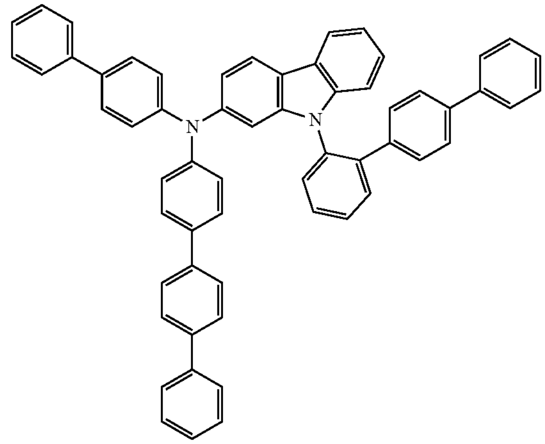
H-1-9
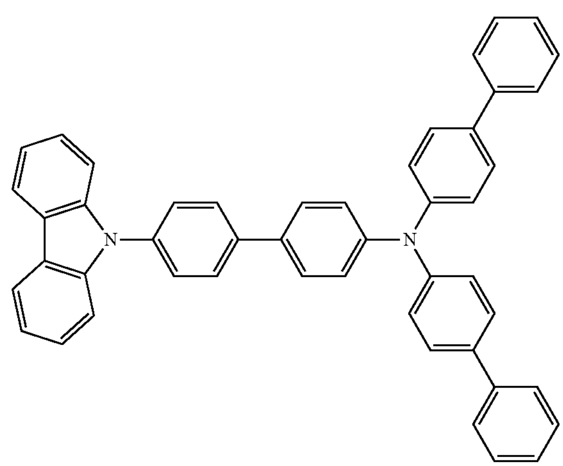

-continued
H-1-10
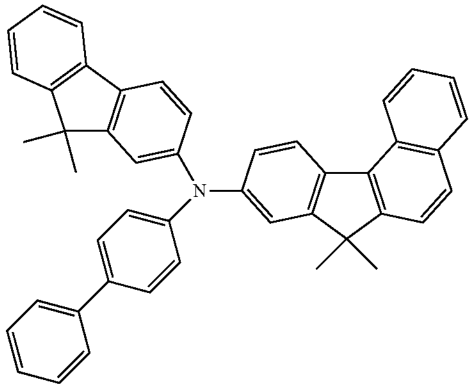
H-1-11
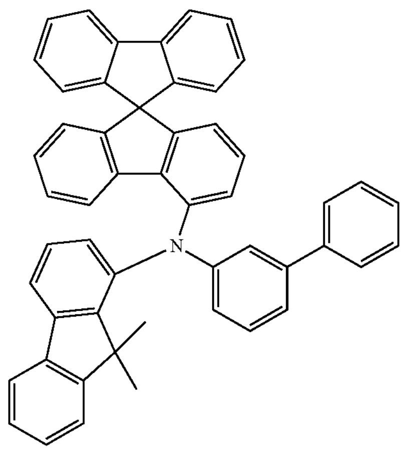
H-1-12
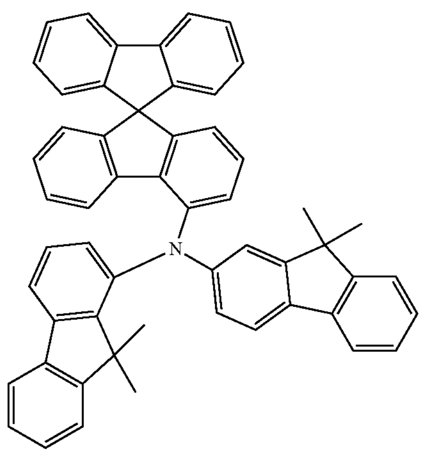
H-1-13
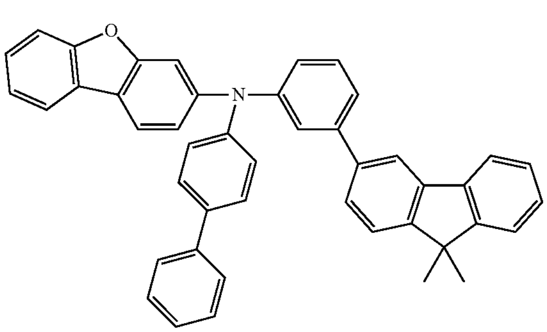
-continued
H-1-14
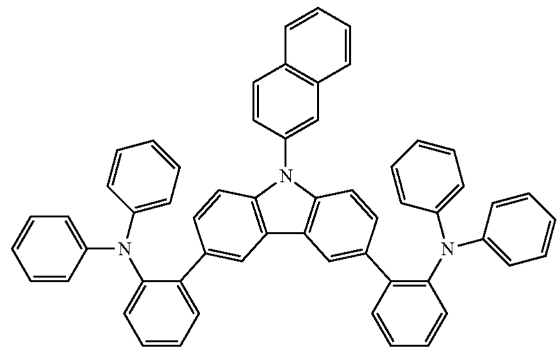
H-1-15
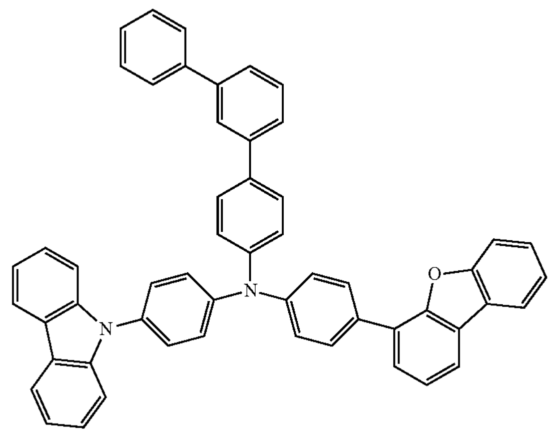
H-1-16
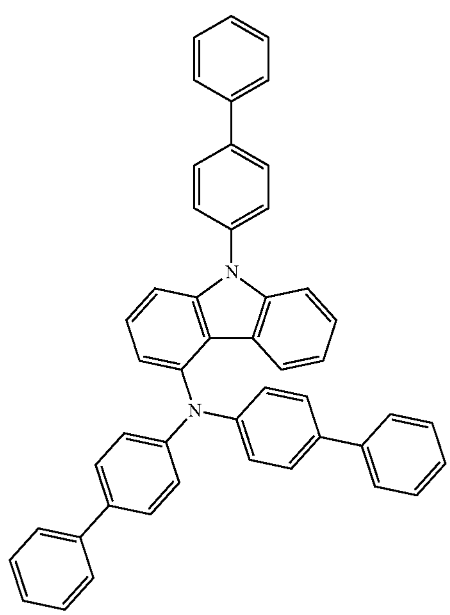

-continued

H-1-17

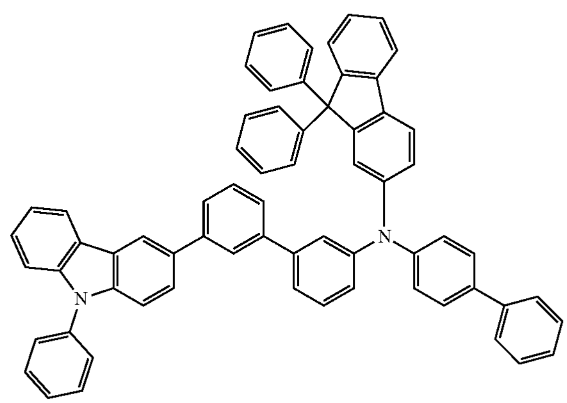

H-1-18

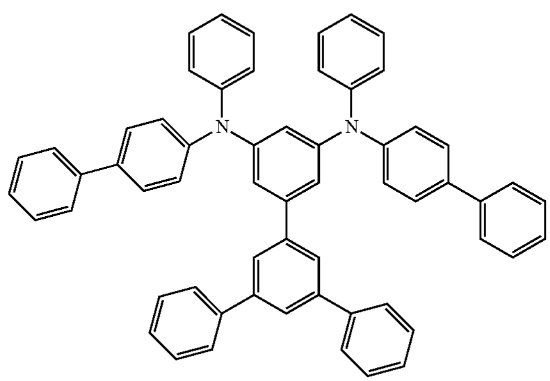

H-1-19

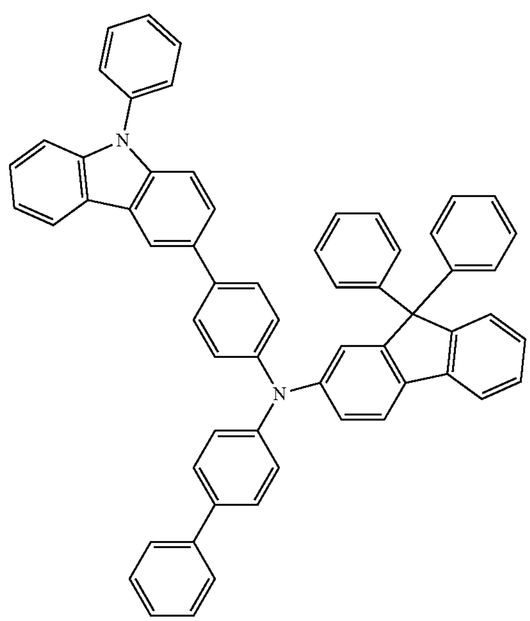

The hole transport region HTR may include a phthalocyanine compound such as copper phthalocyanine, $N^1,N^{1'}$-([1,1'-biphenyl]-4,4'-diyl)bis($N^1$-phenyl-$N^4,N^4$-di-m-tolyl-benzene-1,4-diamine) (DNTPD), 4,4',4"-[tris(3-methylphenyl)phenylamino]triphenylamine (m-MTDATA), 4,4'4"-tris(N,N-diphenylamino)triphenylamine (TDATA), 4,4',4"-tris[N(2-naphthyl)-N-phenyl amino]-triphenyl amine (2-TNATA), poly(3,4-ethylenedioxythiophene)/poly(4-styrenesulfonate) (PEDOT/PSS), polyaniline/Dodecylbenzenesulfonic acid (PANI/DBSA), polyaniline/camphor sulfonicacid (PANI/CSA), polyaniline/poly(4-styrenesulfonate) (PANI/PSS), N,N'-di(naphthalene-1-yl)-N,N'-diphenyl-benzidine (NPB or NPD), triphenylamine-containing polyetherketone (TPAPEK), 4-isopropyl-4'-methyldiphenyliodonium tetrakis(pentafluorophenyl)borate, dipyrazino[2,3-f: 2',3'-h] quinoxaline-2,3,6,7,10,11-hexacarbonitrile (HAT-CN), etc.

The hole transport region HTR may include carbazole-based derivatives such as N-phenyl carbazole and polyvinyl carbazole, fluorene-based derivatives, N,N'-bis(3-methylphenyl)-N,N'-diphenyl-[1,1-biphenyl]-4,4'-diamine (TPD), triphenylamine-based derivatives such as 4,4',4"-tris (N-carbazolyl)triphenylamine (TCTA), N,N'-di(1-naphtalene-1-yl)-N,N'-diphenyl-benzidine (NPB), 4,4'-cyclohexylidene bis[N,N-bis(4-methylphenyl)benzenamine](TAPC), 4,4'-bis[N,N'-(3-tolyl)amino]-3,3'-dimethylbiphenyl (HMTPD), 1,3-bis(N-carbazolyl)benzene (mCP), etc.

The hole transport region HTR may include 9-(4-tert-Butylphenyl)-3,6-bis(triphenylsilyl)-9H-carbazole (CzSi), 9-phenyl-9H-3,9'-bicarbazole (CCP), 1,3-bis(1,8-dimethyl-9H-carbazol-9-yl)benzene (mDCP), etc.

The hole transport region HTR may include the compounds of the hole transport region described above in at least one of a hole injection layer HIL, a hole transport layer HTL, and an electron blocking layer EBL.

The hole transport region HTR may have a thickness in a range of about 100 Å to about 10,000 Å. For example, the hole transport region HTR may have a thickness in a range of about 100 Å to about 5,000 Å. When the hole transport region HTR includes a hole injection layer HIL, the hole injection layer HIL may have a thickness, for example, in a range of about 30 Å to about 1,000 Å. When the hole transport region HTR includes a hole transport layer HTL, the hole transport layer HTL may have a thickness in a range of about 30 Å to about 1,000 Å. When the hole transport region HTR includes an electron blocking layer EBL, the electron blocking layer EBL may have a thickness, for example, in a range of about 10 Å to about 1,000 Å. When the thicknesses of the hole transport region HTR, the hole injection layer HIL, the hole transport layer HTL, and the electron blocking layer EBL satisfy the above-described ranges, satisfactory hole transport properties may be obtained without a substantial increase in driving voltage.

The hole transport region HTR may further include, in addition to the above-described materials, a charge generation material to increase conductivity. The charge generation material may be uniformly or non-uniformly dispersed in the hole transport region HTR. The charge generation material may be, for example, a p-dopant. The p-dopant may include at least one of halogenated metal compounds, quinone derivatives, metal oxides, or cyano group-containing compounds, but is not limited thereto. For example, the p-dopant may include halogenated metal compounds such as CuI and RbI, quinone derivatives such as tetracyanoquinodimethane (TCNQ) and 2,3,5,6-tetrafluoro-7,7,8,8-tetracyanoquinodimethane (F4-TCNQ), metal oxides such as tungsten oxides and molybdenum oxides, cyano group-containing compounds such as dipyrazino[2,3-f: 2',3'-h]quinoxaline-2,3,6,7,10,11-hexacarbonitrile (HATCN) and 4-[[2,3-bis[cyano-(4-cyano-2,3,5,6-tetrafluorophenyl)methylidene] cyclopropylidene]-cyanomethyl]-2,3,5,6-tetrafluorobenzonitrile (NDP9), etc., but is not limited thereto.

As described above, the hole transport region HTR may further include at least one of a buffer layer (not shown) or an electron blocking layer EBL in addition to the hole injection layer HIL and the hole transport layer HTL. The buffer layer (not shown) may compensate for a resonance distance according to wavelengths of light emitted from an emission layer EML, and may thus increase luminous efficiency. Materials which may be included in the hole transport region HTR may be used as materials included in the buffer layer (not shown). The electron blocking layer EBL may prevent electrons from being injected from the electron transport region ETR to the hole transport region HTR.

The emission layer EML is provided on the hole transport region HTR. The emission layer EML may have, for example, a thickness in a range of about 100 Å to about 1,000 Å. For example, the emission layer EML may have a thickness in a range of about 100 Å to about 300 Å. The emission layer EML may be a layer formed of a single material, a layer formed of different materials, or a multilayer structure having layers formed of different materials.

The light emitting diode ED of an embodiment may include a polycyclic compound represented by Formula 1 in at least one functional layer disposed between the first electrode EL1 and the second electrode EL2. In an embodiment, the emission layer EML of the light emitting diode ED may include a polycyclic compound represented by Formula 1.

[Formula 1]

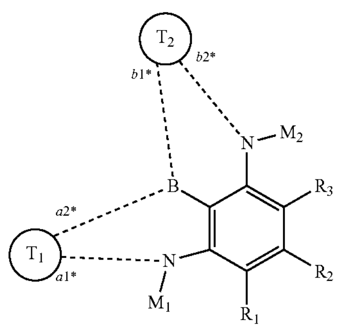

In Formula 1, $R_1$ to $R_3$, $M_1$, and $M_2$ may each independently be a hydrogen atom, a deuterium atom, a halogen atom, a cyano group, a substituted or unsubstituted oxy group, a substituted or unsubstituted thio group, a substituted or unsubstituted boryl group, a substituted or unsubstituted amine group, a substituted or unsubstituted silyl group, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms, or may be bonded to an adjacent group to form a ring.

For example, in Formula 1, $R_1$ to $R_3$, $M_1$, and $M_2$ may be combined with adjacent substituents to form a hydrocarbon ring or a heterocycle. $R_1$ to $R_3$, $M_1$, and $M_2$ may be bonded to adjacent substituents to form a hydrocarbon ring having 6 to 30 ring-forming carbon atoms, or to form a heterocycle having 2 to 30 ring-forming carbon atoms including atoms such as N, O, S, or B as a heteroatom.

In Formula 1, $T_1$ and $T_2$ may each independently be a substituted or unsubstituted hydrocarbon ring having 6 to 30 ring-forming carbon atoms, or a substituted or unsubstituted heterocycle having 5 to 30 ring-forming carbon atoms. In Formula 1, at least one of $T_1$ or $T_2$ may be a group represented by Formula 2.

In the description, a portion indicated by a dotted line (------) corresponds to a portion that is selectively bonded to an adjacent atom or to an adjacent substituent as a single bond. In Formula 1, a1* and a2* are sites where $T_1$ is bonded, and b1* and b2* are sites where $T_2$ is bonded.

In the polycyclic compound of an embodiment, the moiety of the hydrocarbon ring or heterocycle designated as $T_1$ or $T_2$ may be bonded to the neighboring B and N atoms of the group represented by

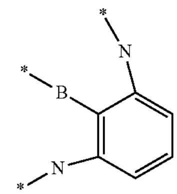

constituting the core portion of the polycyclic compound of an embodiment to form a condensed ring with the core portion.

In Formula 1, at least one of $T_1$ or $T_2$ may be a group represented by Formula 2. For example, in the polycyclic compound of an embodiment, any one selected from $T_1$ or $T_2$ may have a structure of a condensed ring represented by Formula 2, or both $T_1$ and $T_2$ may have a structure of a condensed ring represented by Formula 2.

[Formula 2]

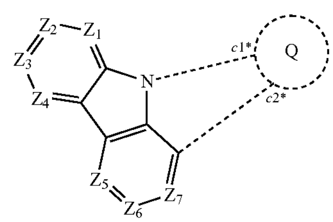

In Formula 2, Q may be 0 or 1. When Q is 0, it indicates a case that a ring compound portion named Q is not present, and when Q is 1, it indicates a case that a ring compound portion named Q is present.

In Formula 2, Q may be a substituted or unsubstituted hydrocarbon ring having 6 to 30 ring-forming carbon atoms, or a substituted or unsubstituted heterocycle having 5 to 30 ring-forming carbon atoms. For example, Q may be a substituted or unsubstituted benzene ring. However, embodiments are not limited thereto.

In Formula 2, when Q is 0, the group represented by Formula 2 may be bonded to Formula 1 at sites c1* and c2*. In Formula 2, when Q is 1, the group represented by Formula 2 may be bonded to Formula 1 through Q, or the group represented by Formula 2 may be bonded to Formula 1 at two neighboring sites selected from $Z_1$ to $Z_7$. In Formula 2, sites c1* and c2* correspond to sites a1* and a2* or to sites b1* and b2* in Formula 1 when $T_1$ or $T_2$ is a group represented by Formula 2, respectively.

In Formula 2, $Z_1$ to $Z_7$ may be each independently N or $C(R_a)$. In the group represented by Formula 2, $Z_1$ to $Z_7$ may all be $C(R_a)$, or at least one of $Z_1$ to $Z_7$ may be N and the remainder $Z_1$ to $Z_7$ may be $C(R_a)$.

In Formula 2, $R_a$ may be a hydrogen atom, a deuterium atom, a halogen atom, a cyano group, a substituted or unsubstituted oxy group, a substituted or unsubstituted thio group, a substituted or unsubstituted boryl group, a substituted or unsubstituted amine group, a substituted or unsubstituted silyl group, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms, or may be bonded to an adjacent group to form a ring.

When two or more selected from $Z_1$ to $Z_7$ are $C(R_a)$, the two or more $R_a$ groups may all be the same or at least one thereof may be different from the others. When $R_a$ is combined with adjacent groups to form a ring, the formed ring may be a hydrocarbon ring having 6 to 30 ring-forming carbon atoms, or a heterocycle having 2 to 30 ring-forming carbon atoms.

In an embodiment, the group represented by Formula 2 may be represented by any one of Formulas 2-1 to 2-3.

[Formula 2-1]

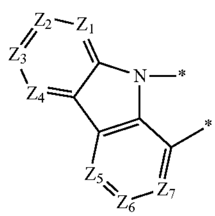

[Formula 2-2]

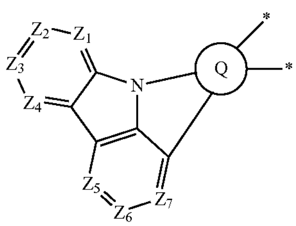

[Formula 2-3]

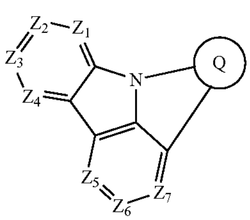

In Formulas 2-1 to 2-3, —* may be a site bonded to a1* and a2* of Formula 1 or bonded to b1* and b2* of Formula 1. Formula 2-1 indicates a case where Q is 0 in Formula 2, and Formulas 2-2 and 2-3 each indicate a case where Q is 1 in Formula 2. For example, when Q is 1, the group represented by Formula 2 may be bonded to Formula 1 through Q, or the group represented by Formula 2 may be bonded to Formula 1 not through the Q portion of indolocarbazole but in the benzene ring portion.

In Formulas 2-1 to 2-3, Q and $Z_1$ to $Z_7$ may be the same as defined in Formula 2.

In the polycyclic compound of an embodiment represented by Formula 1, at least one of $T_1$ or $T_2$ may be a group represented by one of Formulas 2-1 to 2-3. For example, $T_1$ and $T_2$ may each independently be a group represented by one of Formulas 2-1 to 2-3, or one of $T_1$ or $T_2$ may be a group represented by one of Formulas 2-1 to 2-3, and the other one of $T_1$ or $T_2$ may be a substituted or unsubstituted hydrocarbon ring having 6 to 30 ring-forming carbon atoms, or a substituted or unsubstituted heterocycle having 5 to 30 ring-forming carbon atoms, which is different from Formula 2.

In an embodiment, in the polycyclic compound represented by Formula 1, any one of $T_1$ or $T_2$ may be a group represented by Formula 2, and the other one of $T_1$ or $T_2$ may be a group represented by any one of T-a to T-e. For example, any one of $T_1$ or $T_2$ may be a group represented by any one of Formulas 2-1 to 2-3, and the other one of $T_1$ or $T_2$ may be a group represented by any one of T-a to T-e.

T-a

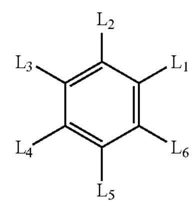

T-b

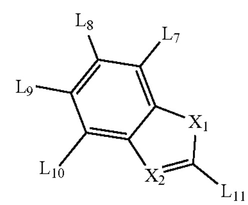

T-c

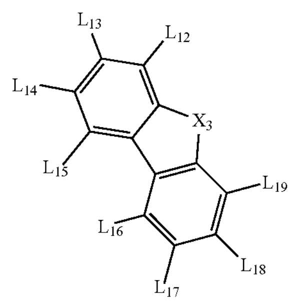

T-d

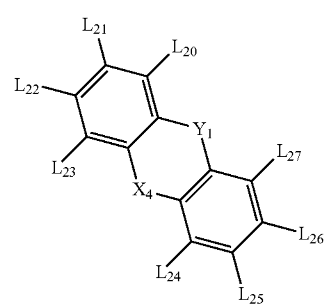

-continued

T-e

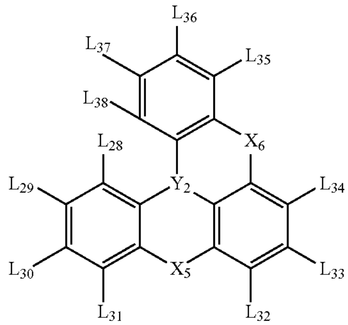

In T-a to T-e, $X_1$ to $X_6$ may each independently be N, O, S, $N(R_b)$, or $C(R_c)(R_d)$, and $Y_1$ and $Y_2$ may each independently be O, S, $B(R_e)$, or $P(=O)(R_f)$.

In T-a to T-e, $L_1$ to $L_{38}$ and $R_b$ to $R_f$ may each independently be a hydrogen atom, a deuterium atom, a halogen atom, a cyano group, a substituted or unsubstituted oxy group, a substituted or unsubstituted thio group, a substituted or unsubstituted boryl group, a substituted or unsubstituted amine group, a substituted or unsubstituted silyl group, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms, or may be bonded to an adjacent group to form a ring.

In T-a to T-e, with respect to bonding to the core portion represented by

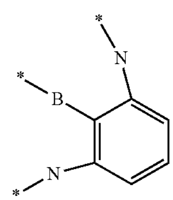

in Formula 1, except for the above description of $L_1$ to $L_{38}$ and $R_b$ to $R_f$, two neighboring sites selected from $L_1$ to $L_{38}$, and $X_1$ to $X_6$ may correspond to a1* and a2* or may correspond to b1* and b2*.

In an embodiment, in the polycyclic compound represented by Formula 1, any one of $T_1$ or $T_2$ may be a substituted or unsubstituted benzene ring, and the other one of $T_1$ or $T_2$ may be a group represented by any one of Formulas 2-1 to 2-3 described.

In an embodiment, the polycyclic compound represented by Formula 1 may be represented by any one of Formulas 4-1 to 4-8.

4-1

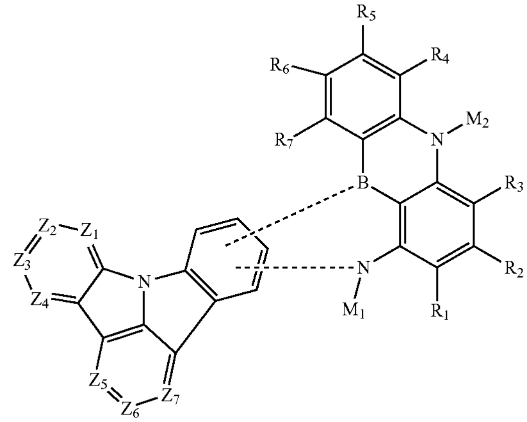

4-2

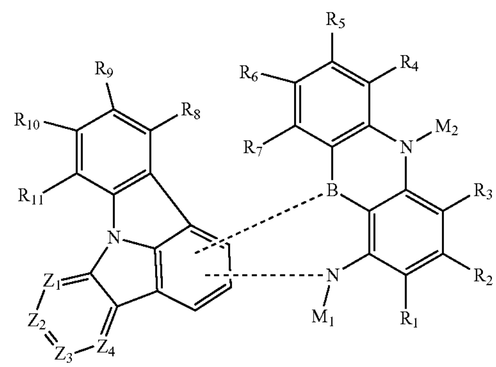

4-3

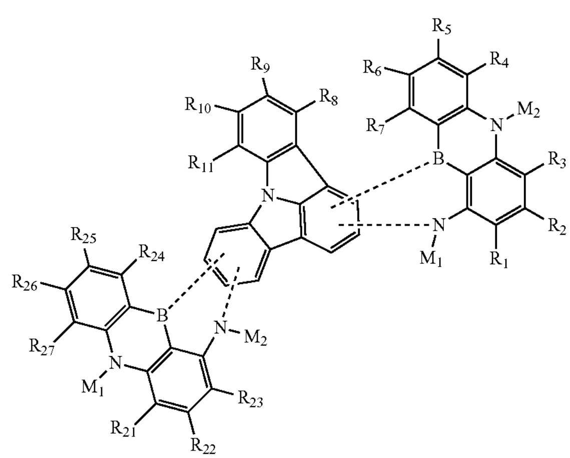

-continued
4-4
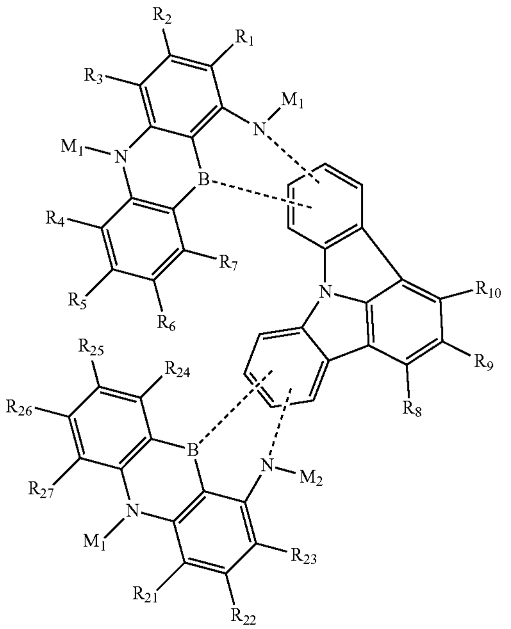
4-5
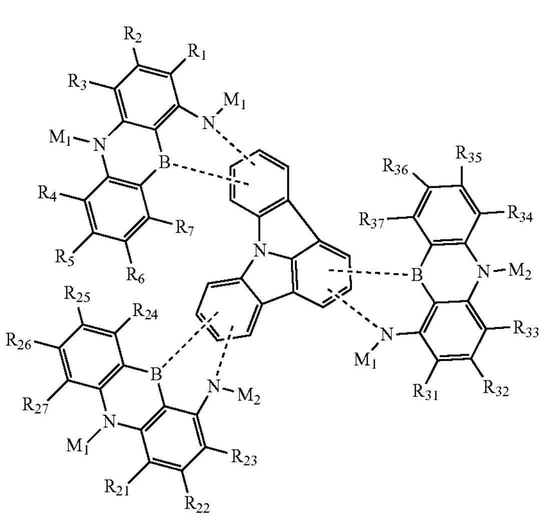
-continued
4-6
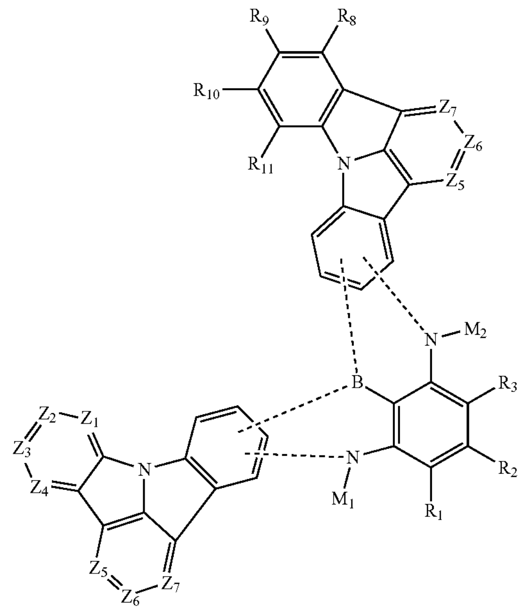
4-7
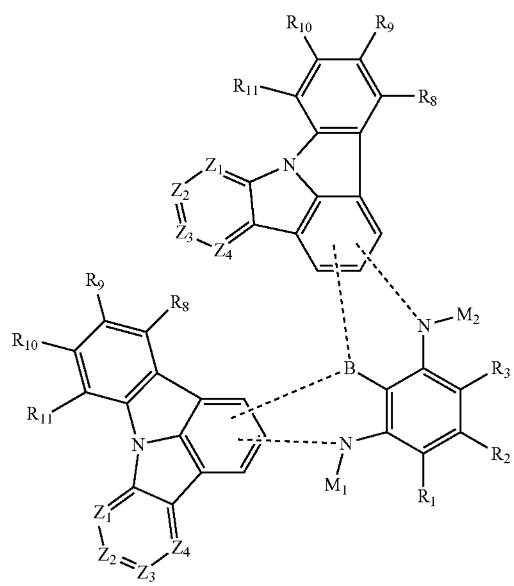

-continued 4-8

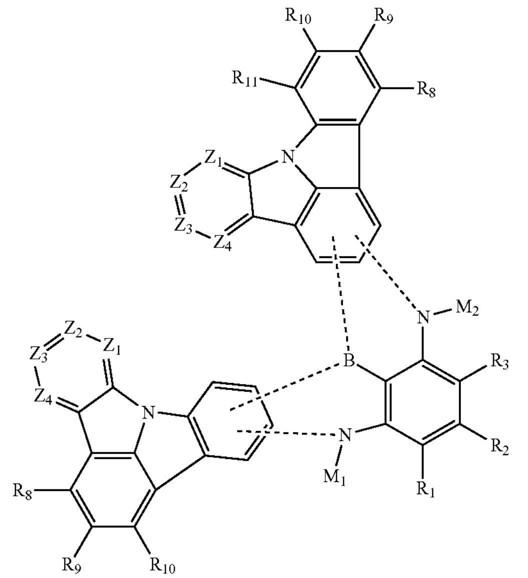

In Formulas 4-1 to 4-8, $R_4$ to $R_{11}$, $R_{21}$ to $R_{27}$, and $R_{31}$ to $R_{37}$ may each independently be a hydrogen atom, a deuterium atom, a halogen atom, a cyano group, a substituted or unsubstituted oxy group, a substituted or unsubstituted thio group, a substituted or unsubstituted boryl group, a substituted or unsubstituted amine group, a substituted or unsubstituted silyl group, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms, or may be bonded to an adjacent group to form a ring.

In Formulas 4-1 to 4-8, $R_1$ to $R_3$, $M_1$, $M_2$, and $Z_1$ to $Z_7$ may be the same as defined in Formulas 1 and 2.

In an embodiment, the polycyclic compound represented by Formula 1 may be represented by any one of Formulas 5-1 to 5-9.

5-1

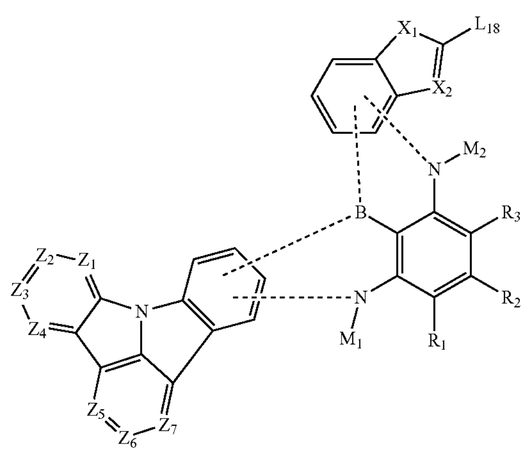

-continued 5-2

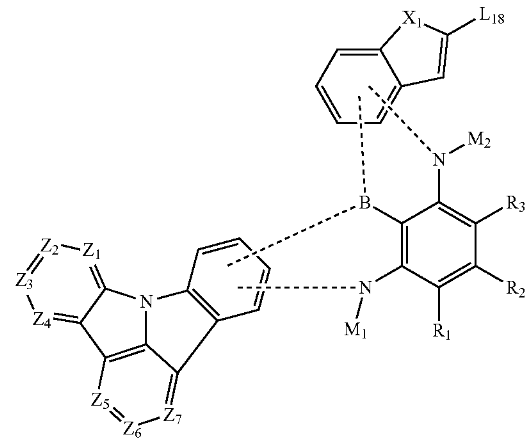

5-3

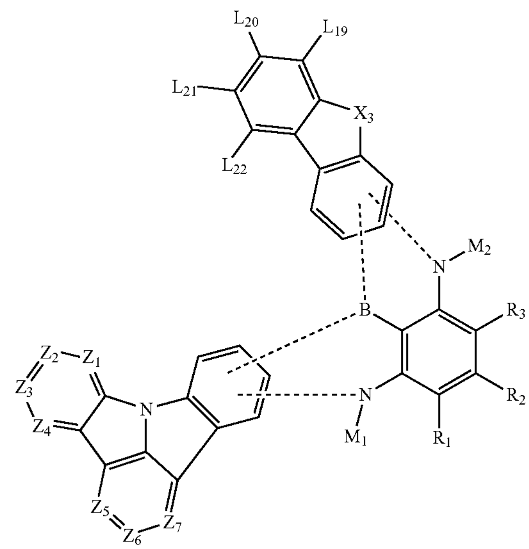

5-4

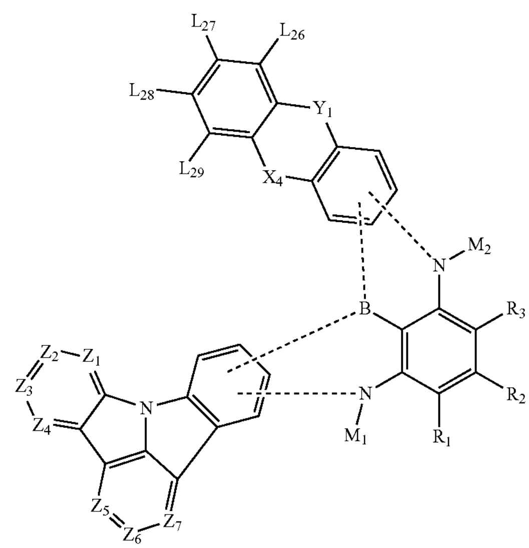

-continued 5-5

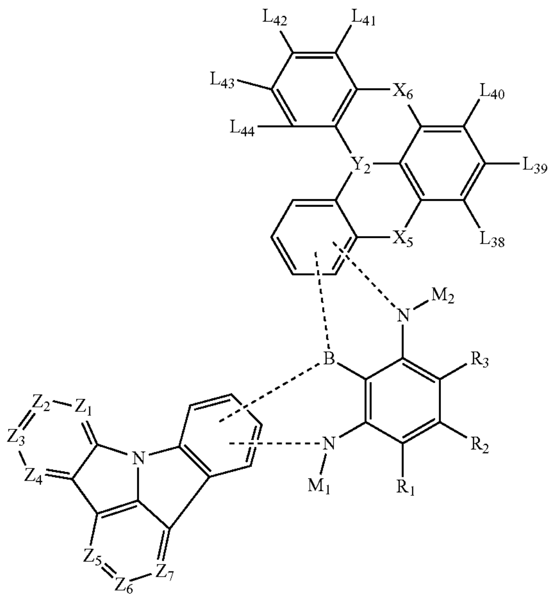

5-6

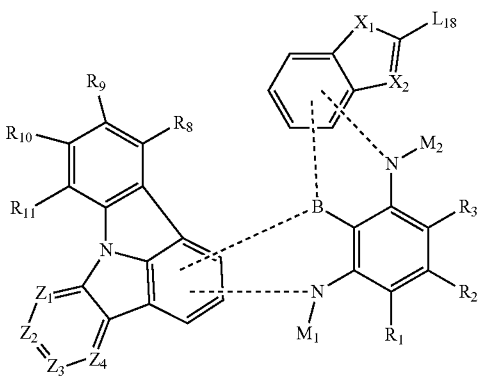

5-7

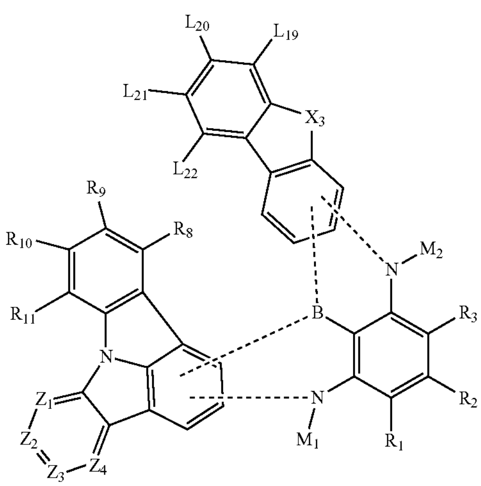

-continued 5-8

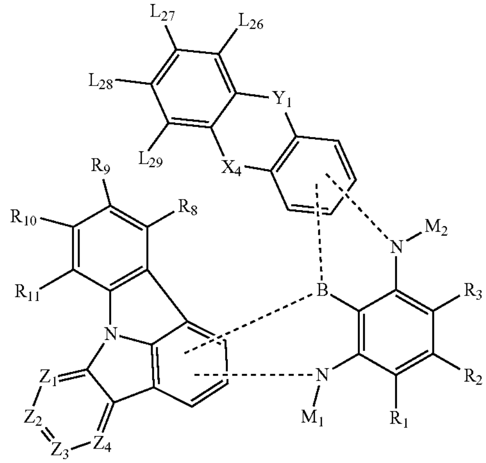

5-9

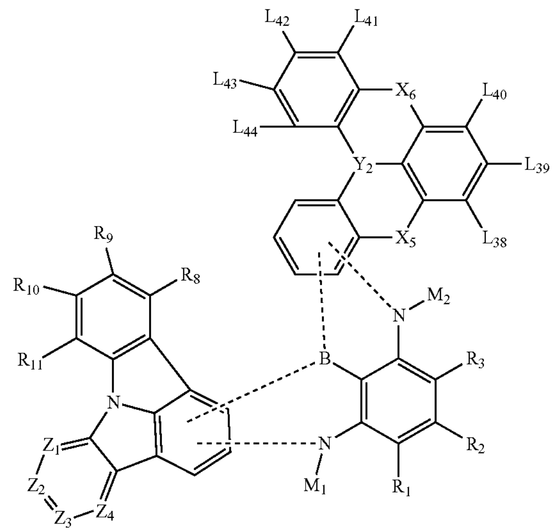

In Formulas 5-1 to 5-9, $X_1$ to $X_6$, $Y_1$, $Y_2$, Lis to $L_{21}$, $L_{26}$ to $L_{29}$, and $L_{38}$ to $L_{44}$ may be the same as defined in T-a to T-e. In Formulas 5-1 to 5-9, $R_1$ to $R_3$, $M_1$, $M_2$, and $Z_1$ to $Z_7$ may be the same as defined in Formulas 1 and 2.

The polycyclic compound of an embodiment represented by Formula 1 may include at least one deuterium atom. For example, in an embodiment, in the polycyclic compound represented by Formula 1, $R_1$ to $R_3$, $M_1$, $M_2$, $T_1$, and $T_2$ may each independently be a deuterium atom or a substituent including a deuterium atom.

The polycyclic compound of an embodiment may include B and N as ring-forming atoms, and may further include an indolocarbazole derivative represented by

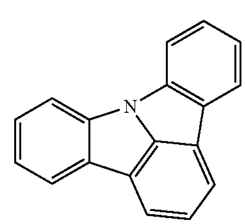 [SMILES: c1ccc2c(c1)c1cccc3c4ccccc4n2c13]

to have a structure forming a condensed ring. The polycyclic compound of an embodiment has a structural feature of including an indolocarbazole derivative in the structure of a condensed ring, and thus exhibits increased electrochemical stability and high efficiency of energy transfer from a host material, thereby contributing to the long lifespan and high efficiency characteristics of a light emitting diode when used as a material for the light emitting diode.

The polycyclic compound of an embodiment represented by Formula 1 may be any one selected from Compound Group 1. The light emitting diode ED of an embodiment may include at least one of the polycyclic compounds of Compound Group 1 in the at least one functional layer. For example, the light emitting diode ED of an embodiment may include at least one of the polycyclic compounds of Compound Group 1 in the emission layer EML.

[Compound Group 1]

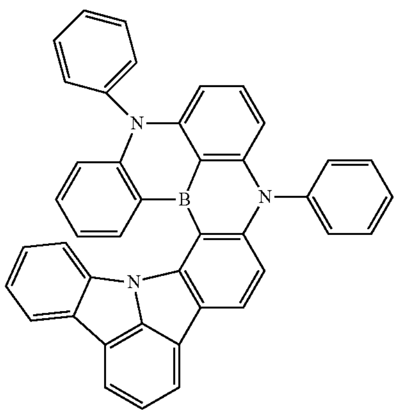
1

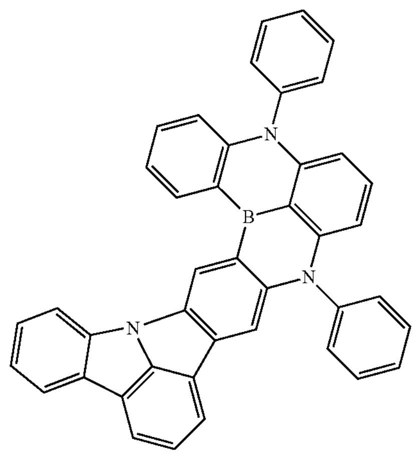
2

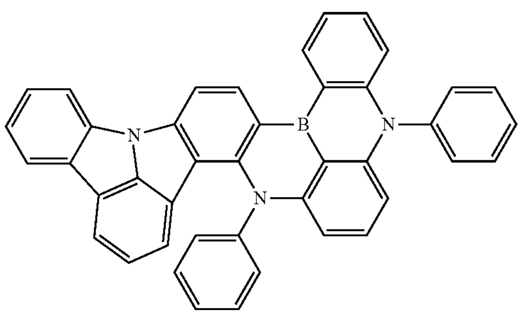
3

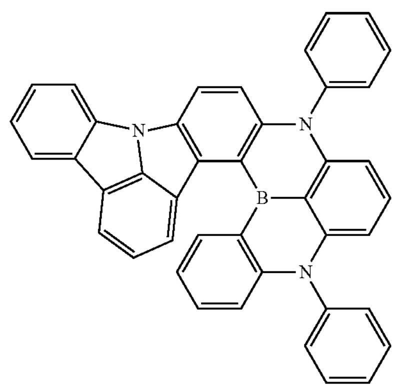
4

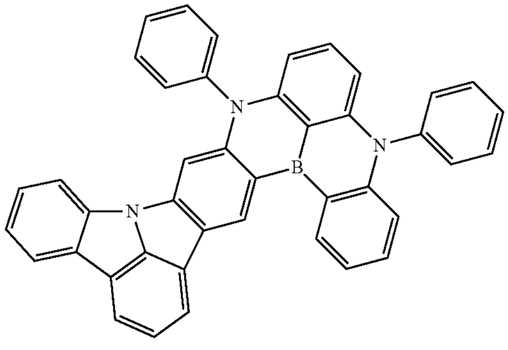
5

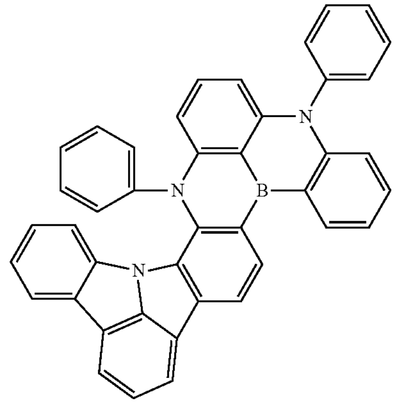
6

-continued
7
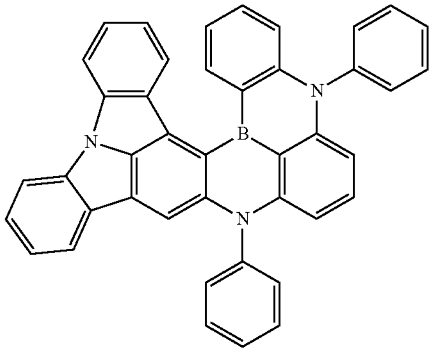
8
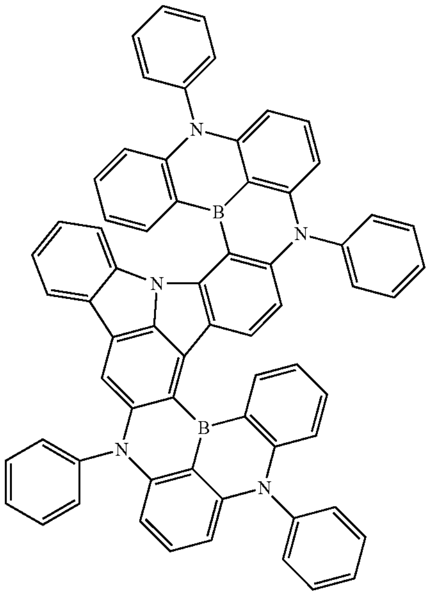
9
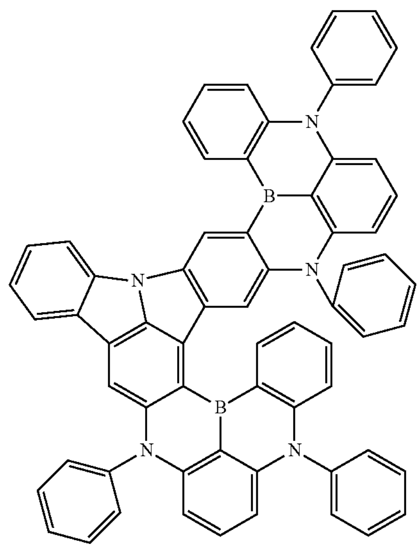
10
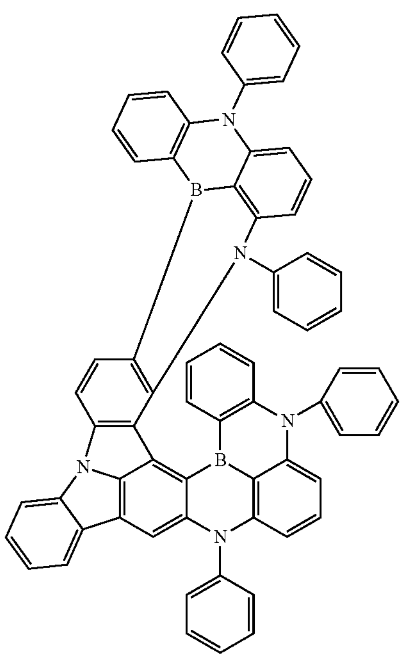
11
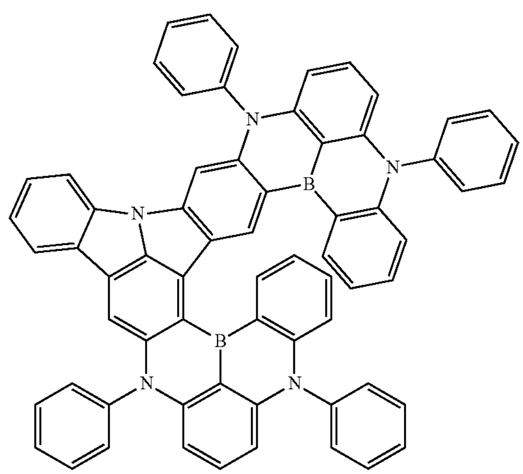

-continued
12
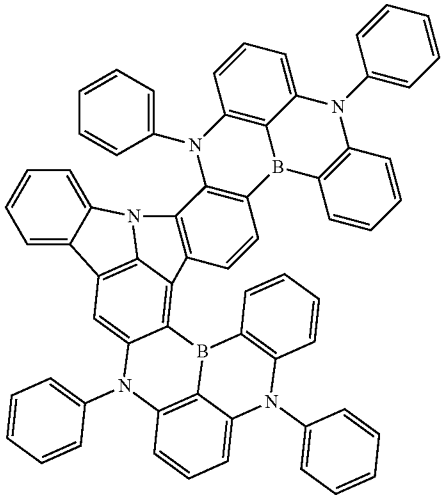
13
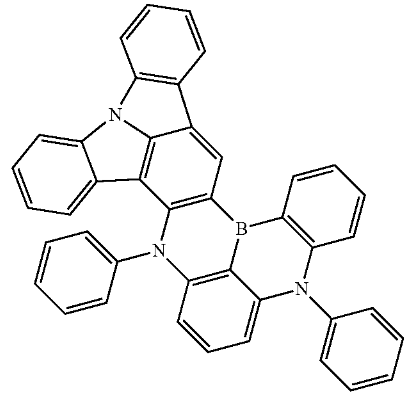
14
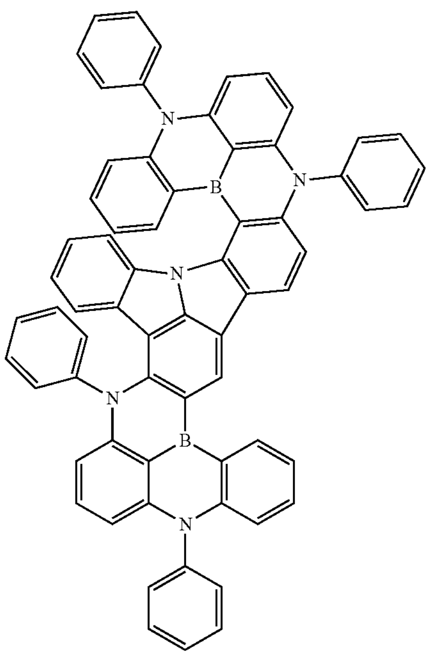
15
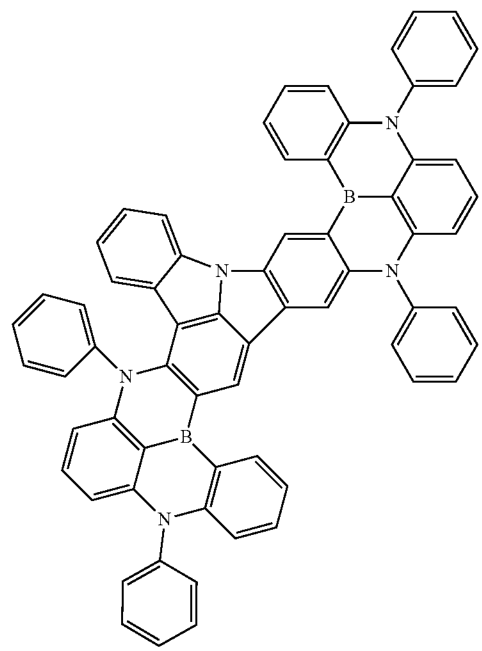
16
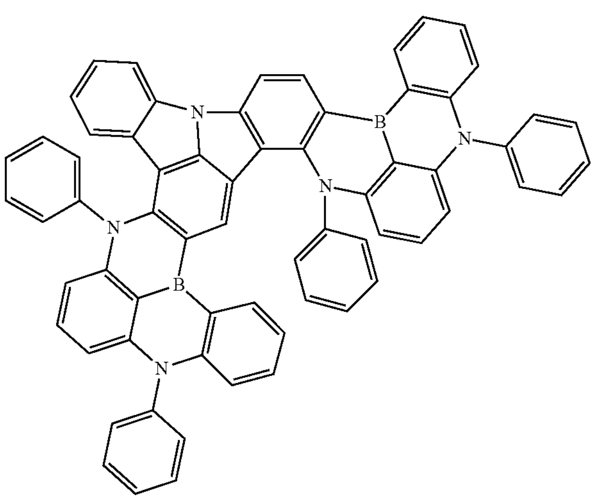
17
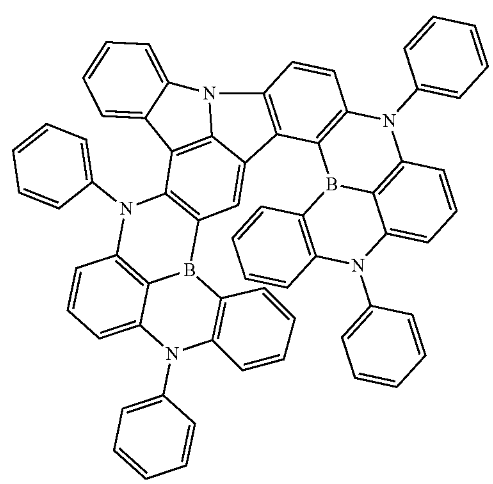

-continued
18
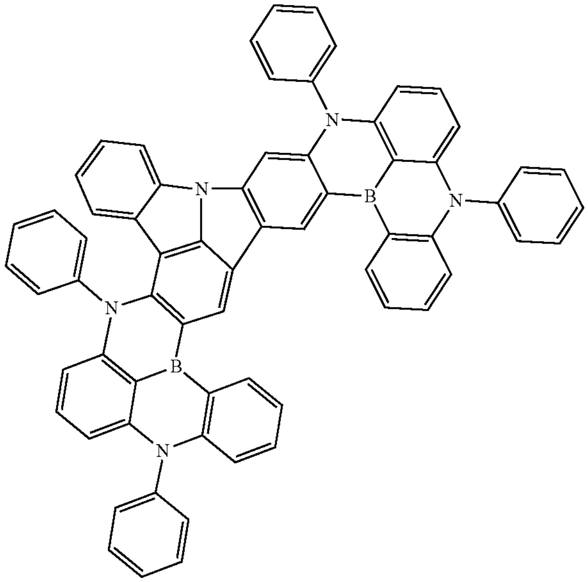
19
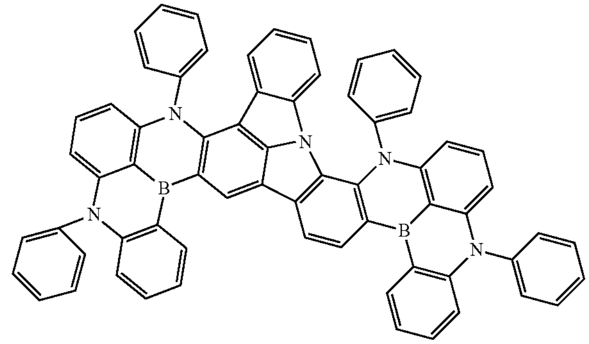
20
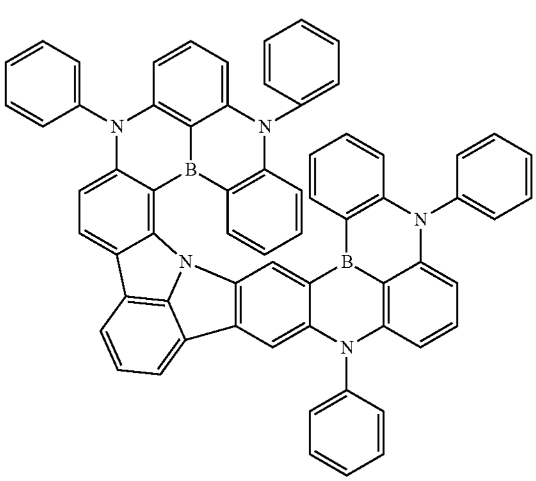
21
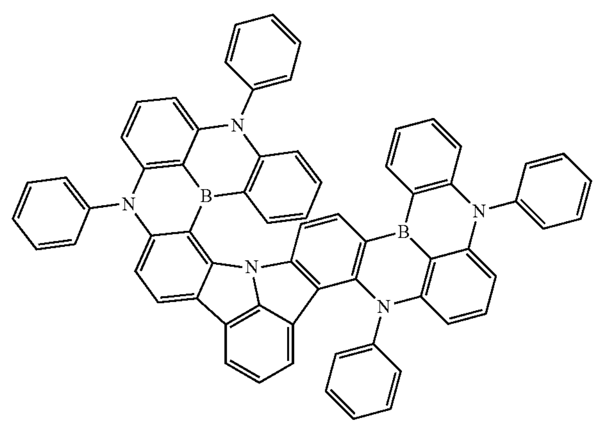

-continued
22
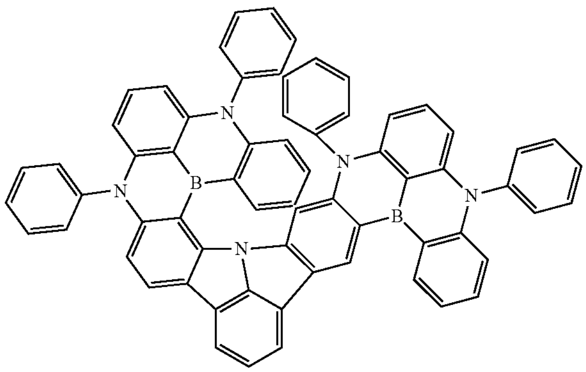
23
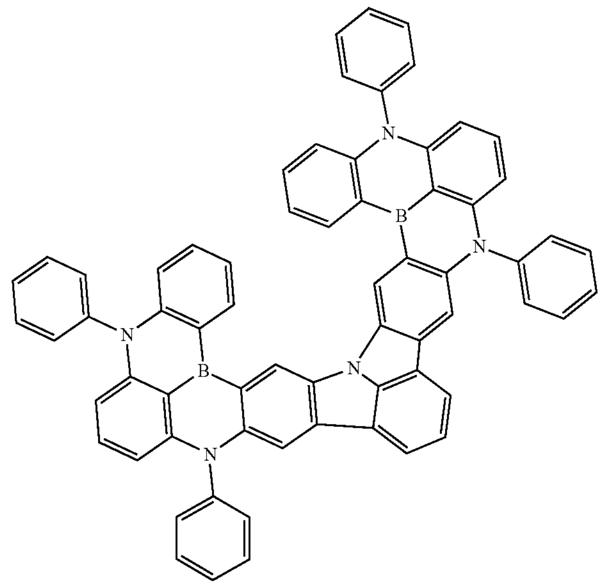
24
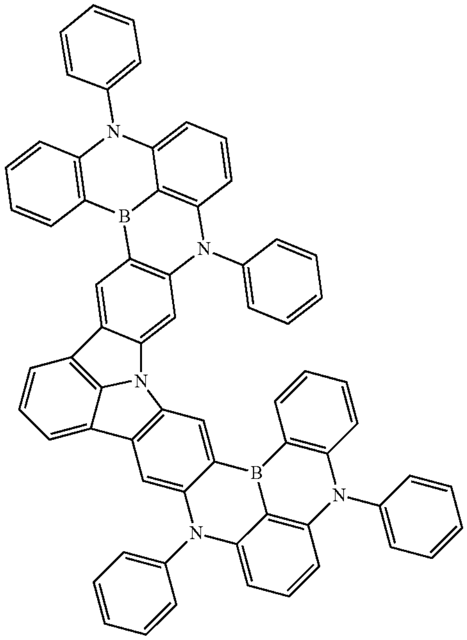
25
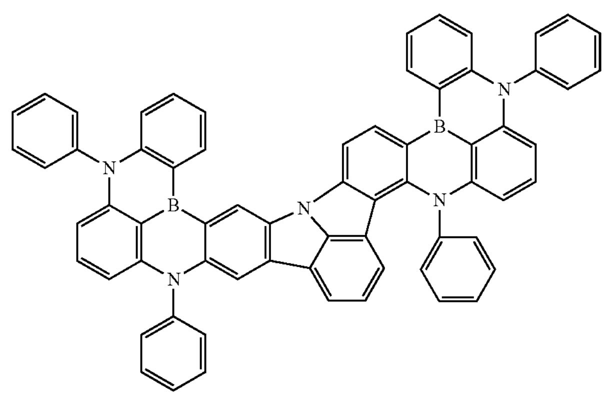
26
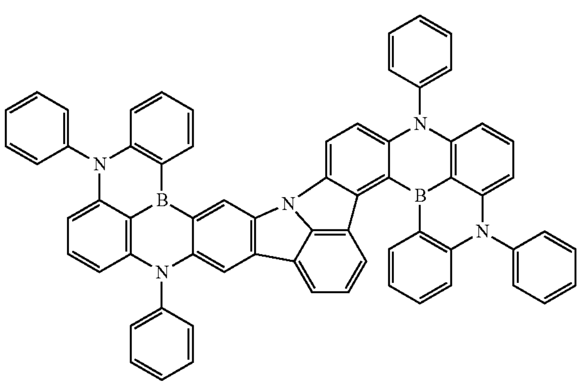
27
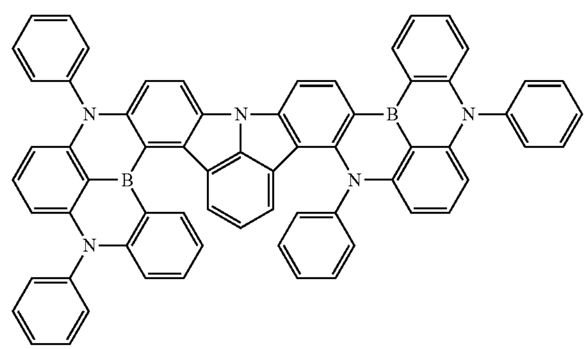

-continued
28
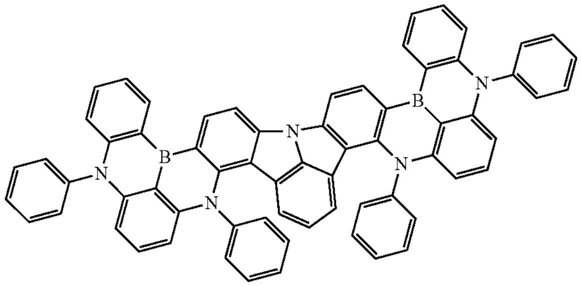
29
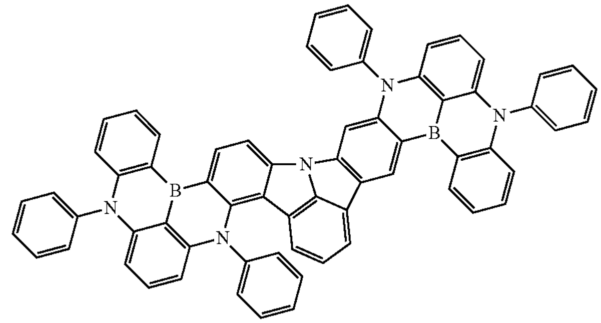
30
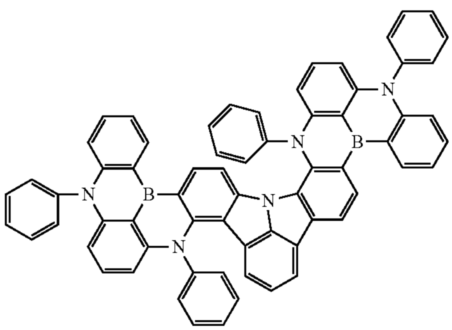
31
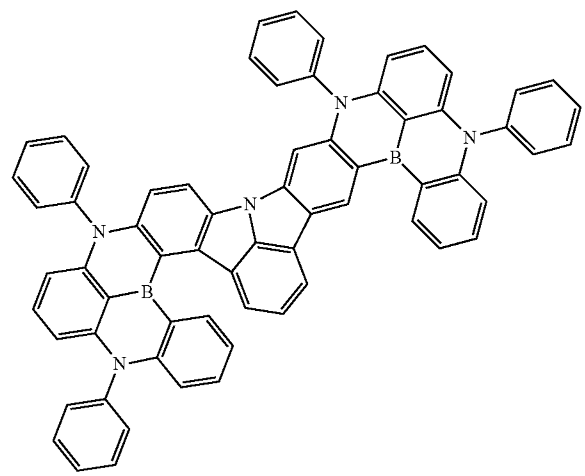
32
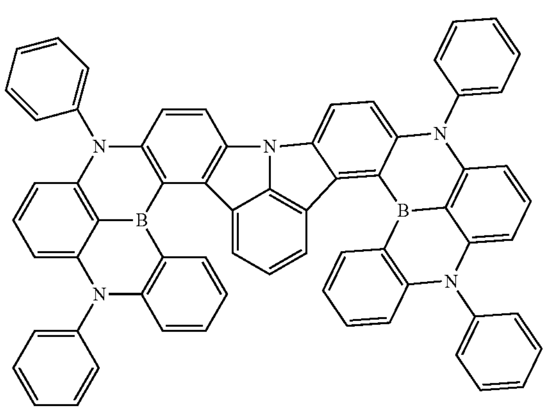
33
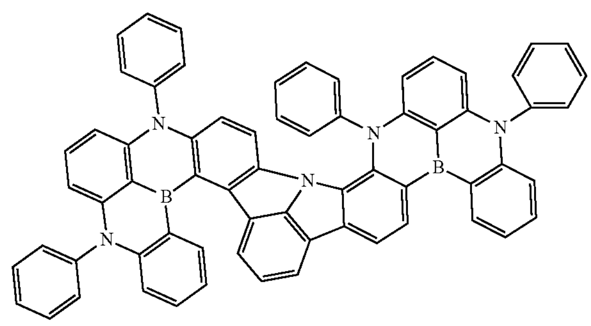
34
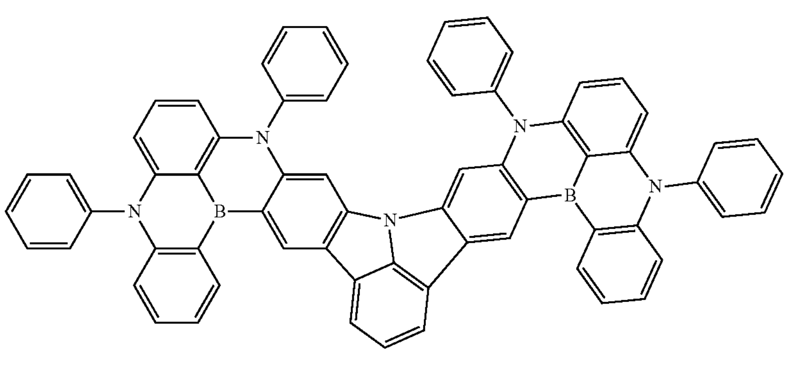

-continued
35
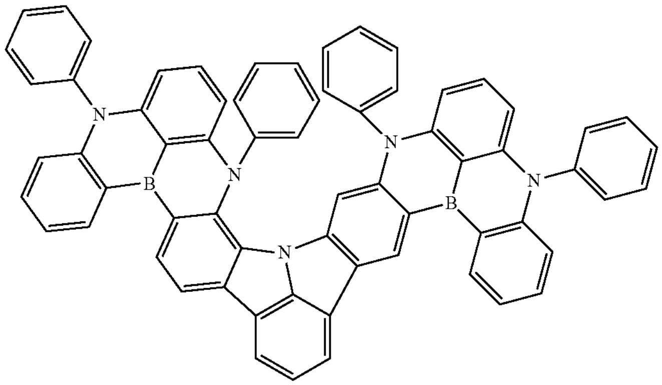
36
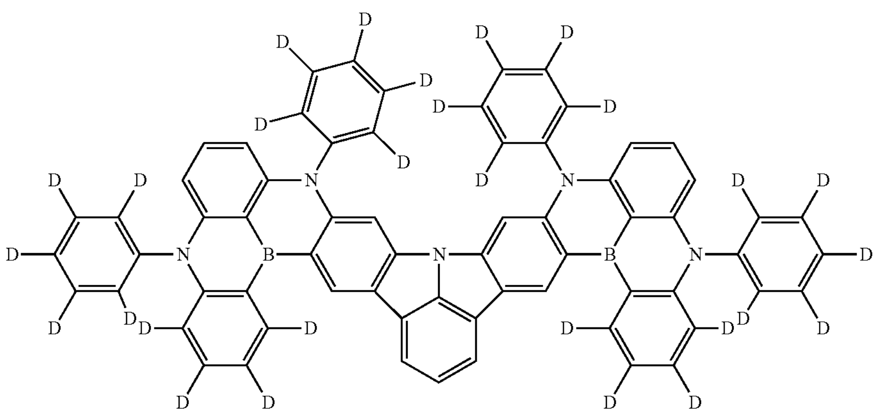
37
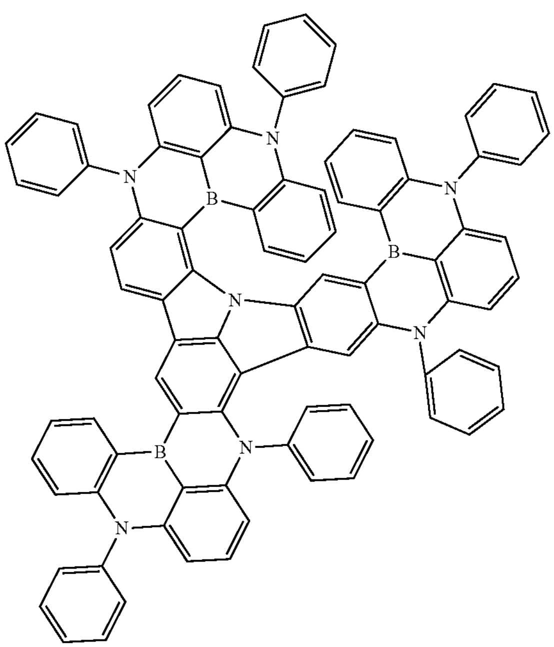
38
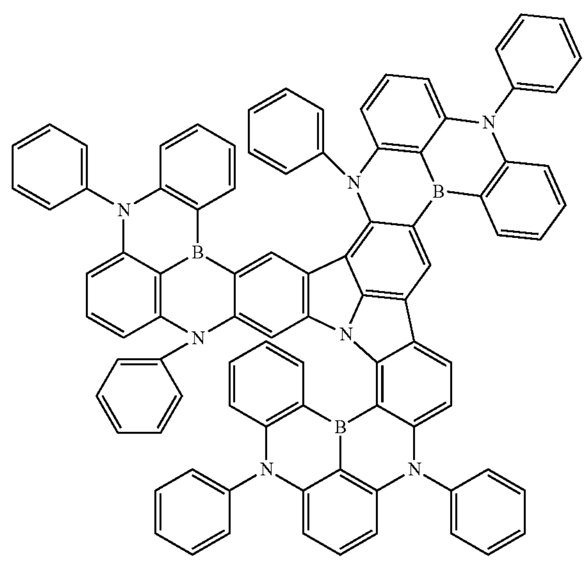

-continued
39
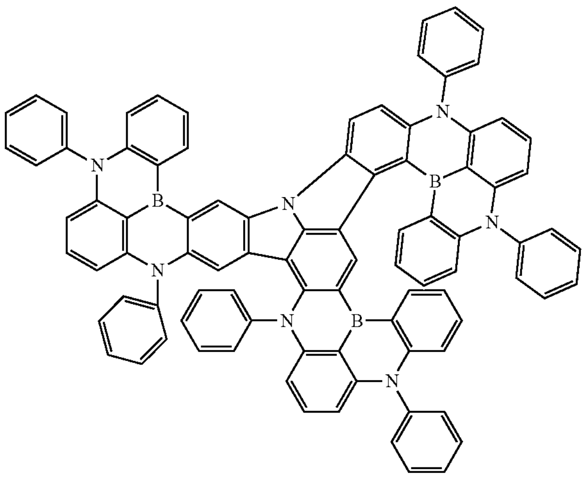
40
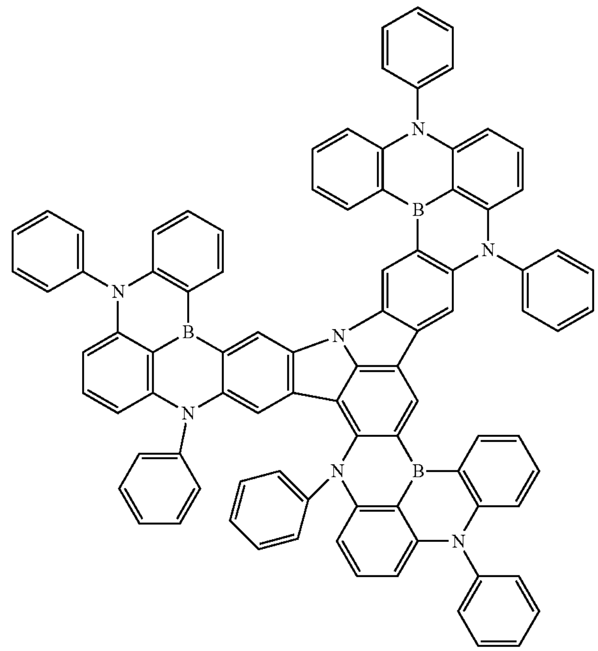
41
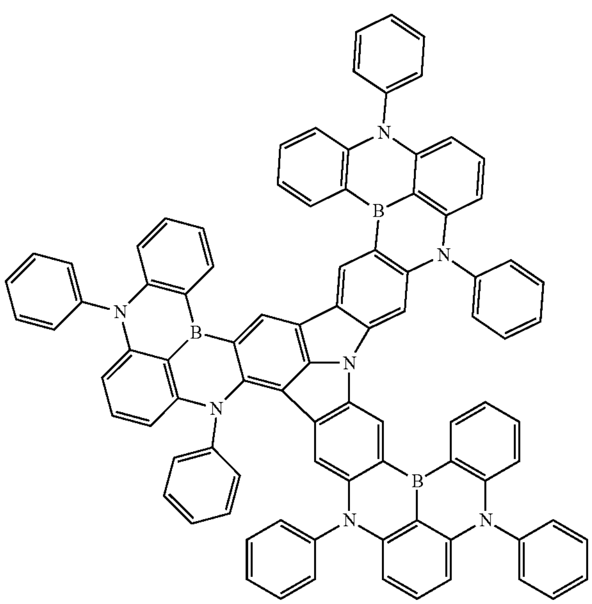
42
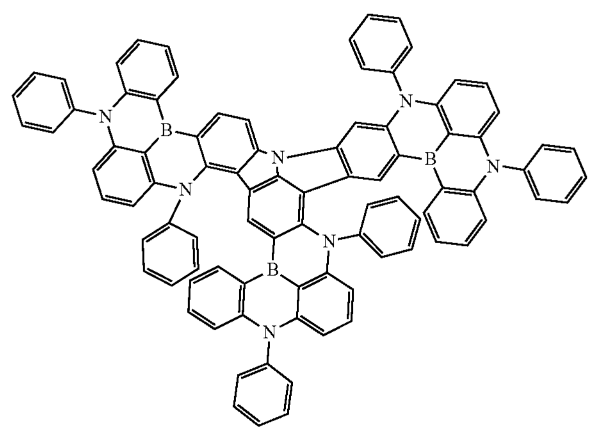

-continued
43
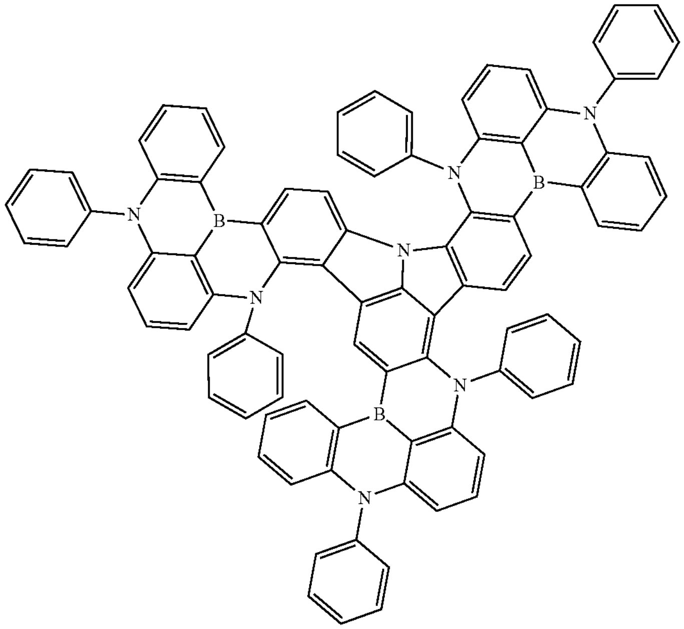
44
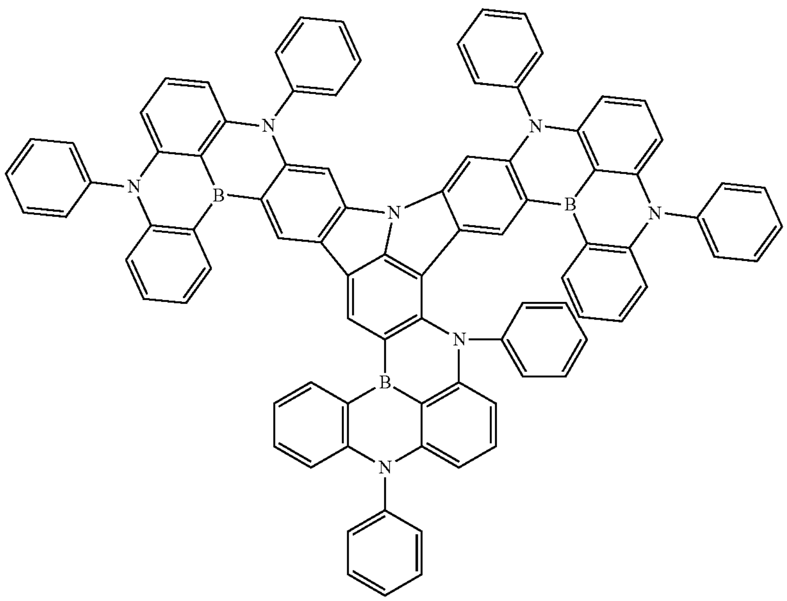

-continued
45
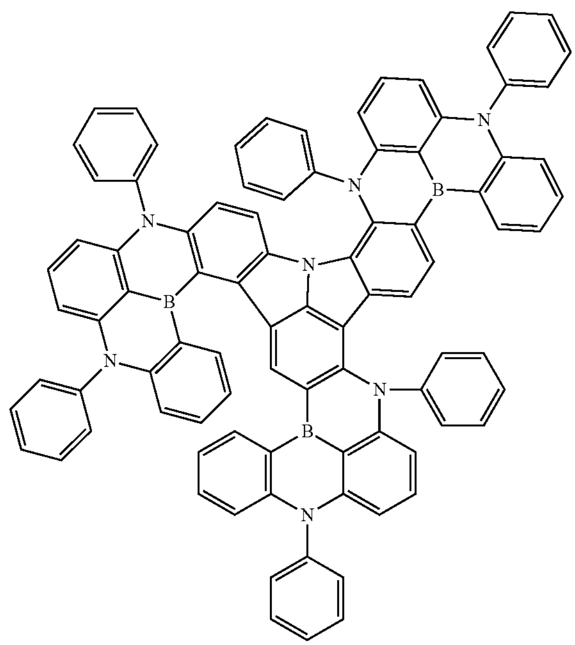
46
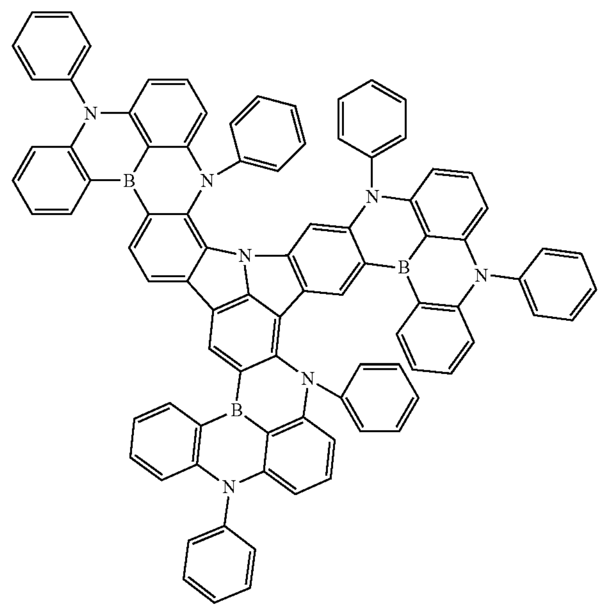
47
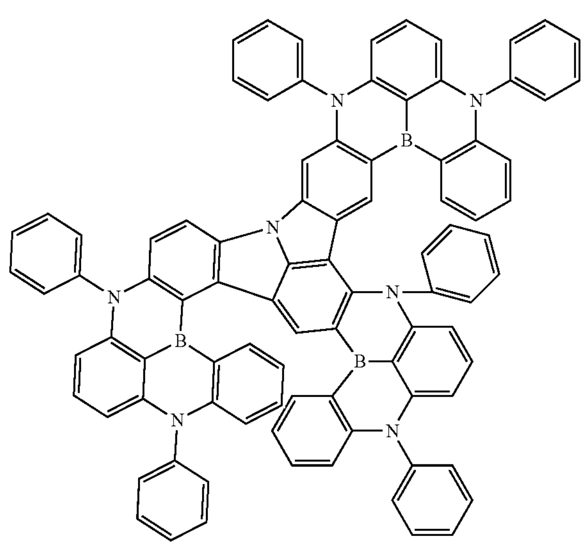
48
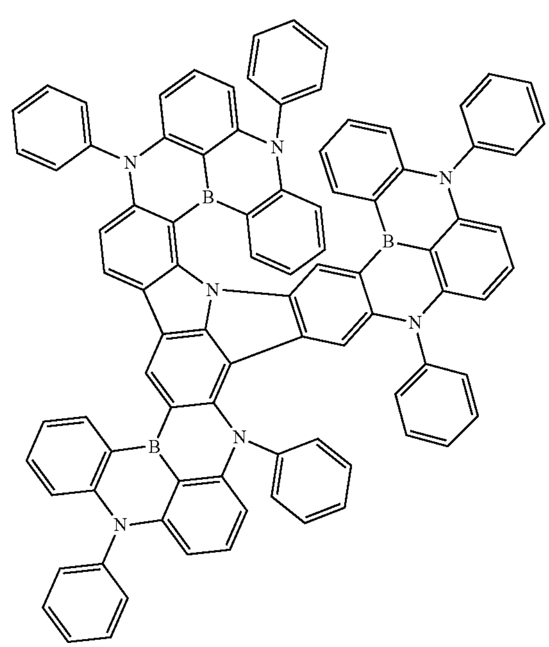

-continued
49
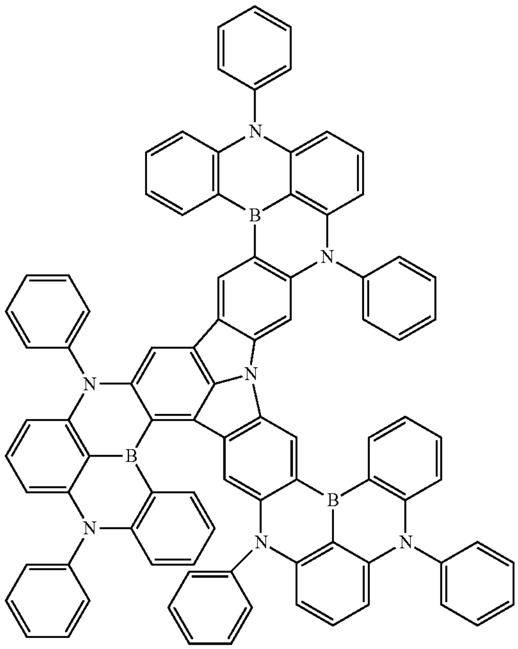
50
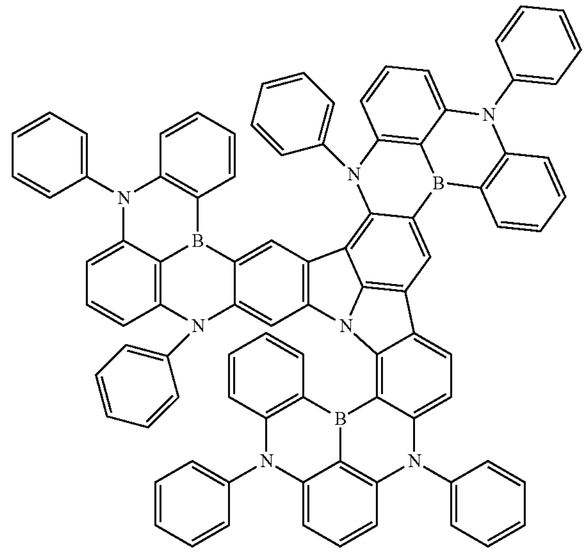
51
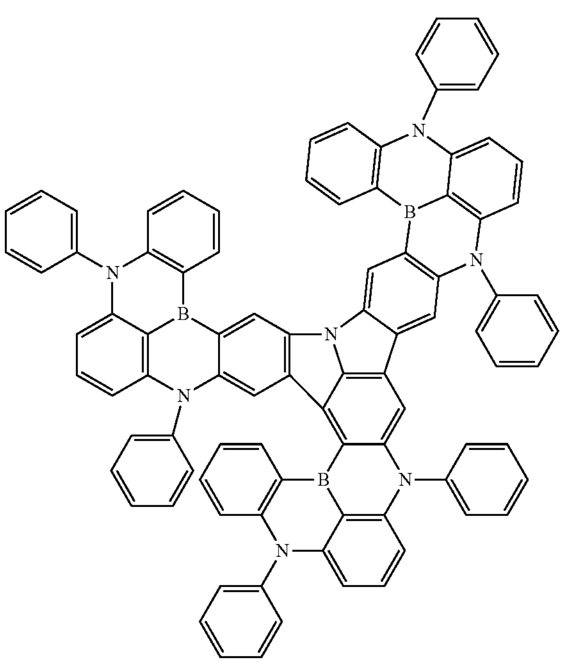
52
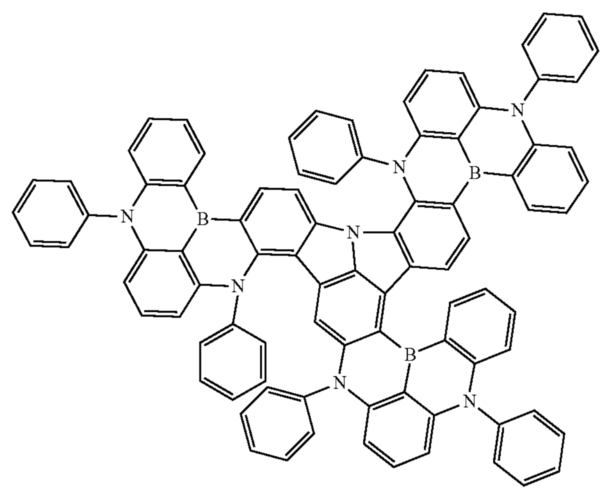

-continued
53
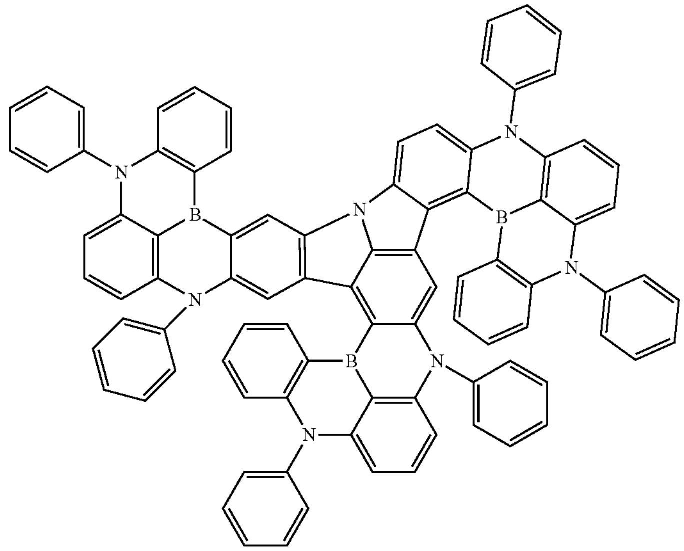
54
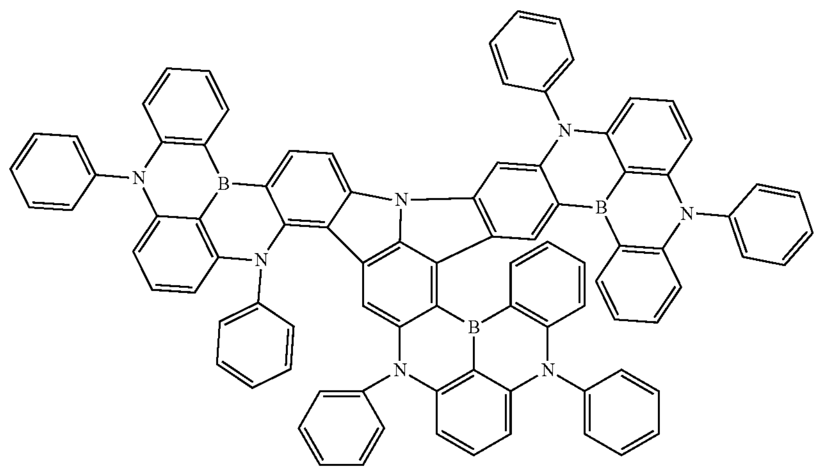
55
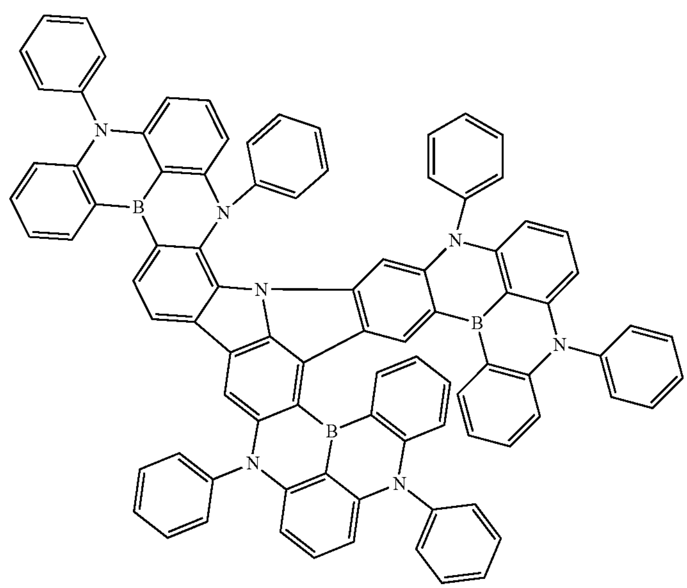

-continued
56
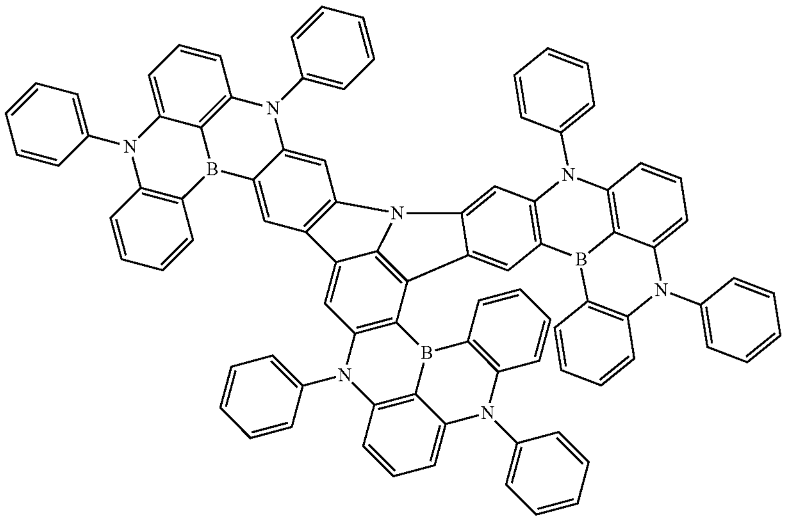
57
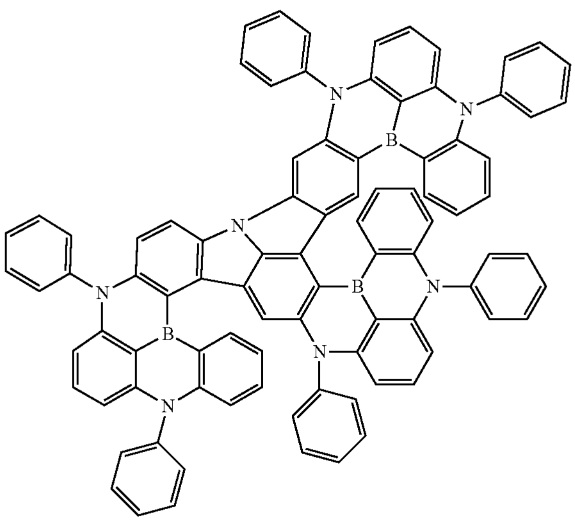
58
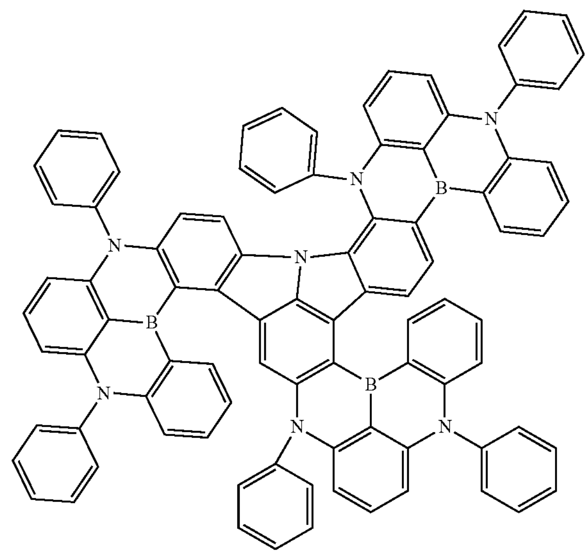
59
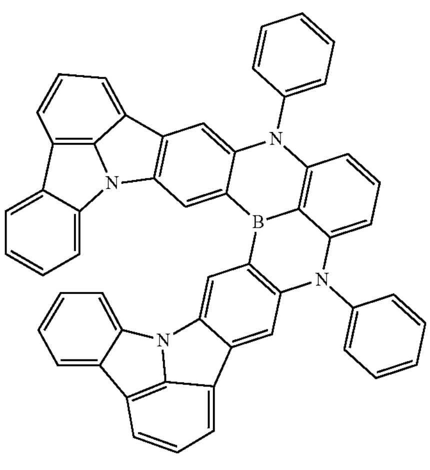
60
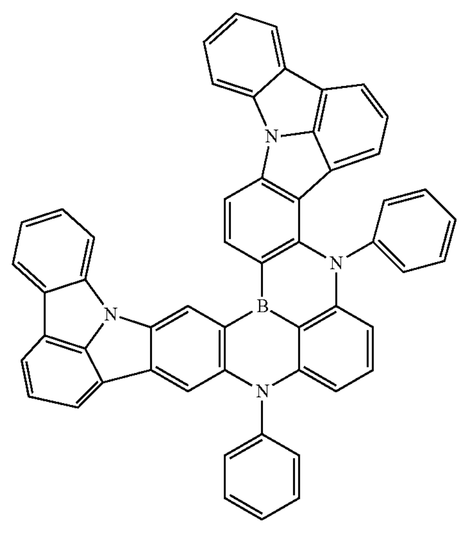

-continued
61
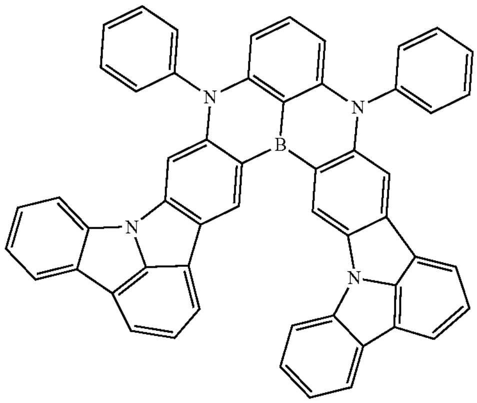
62
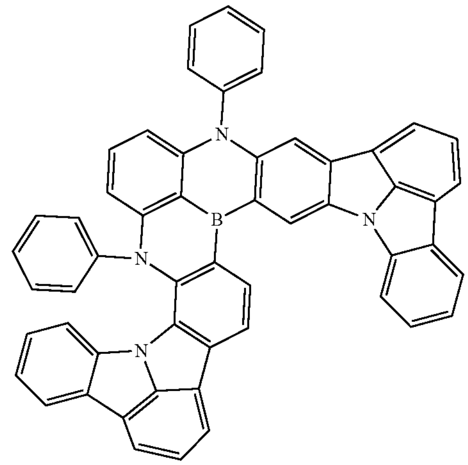
63
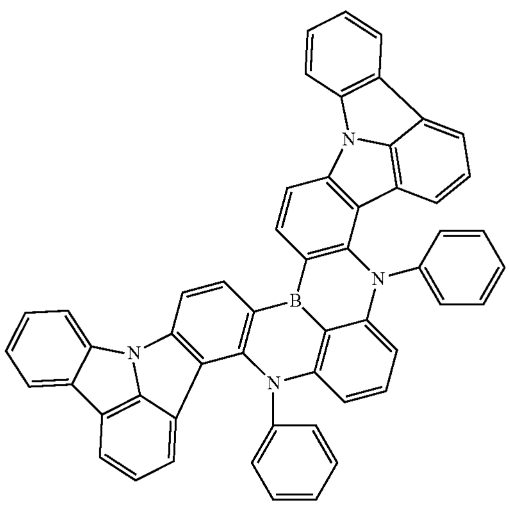
64
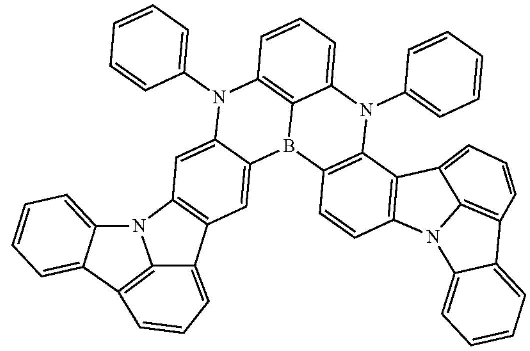
65
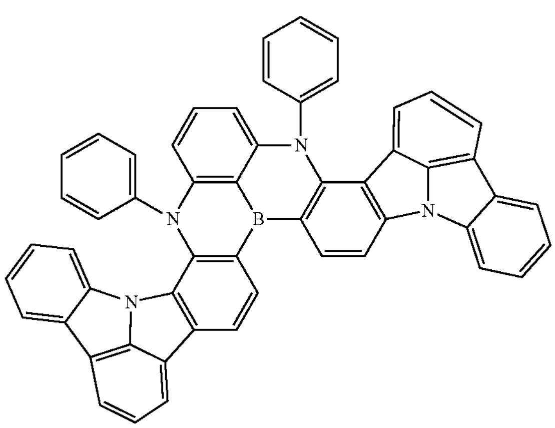
66
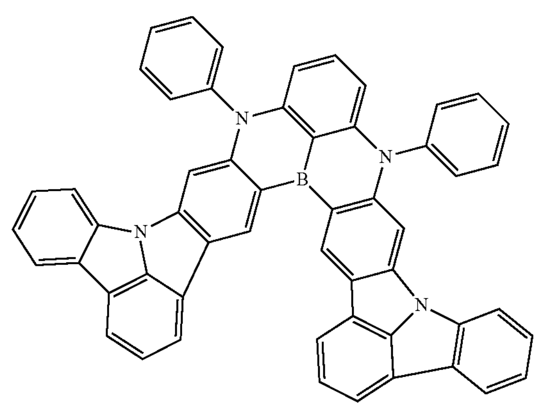

-continued
67
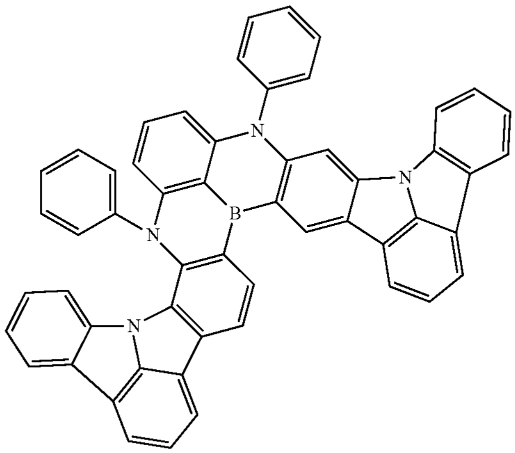
68
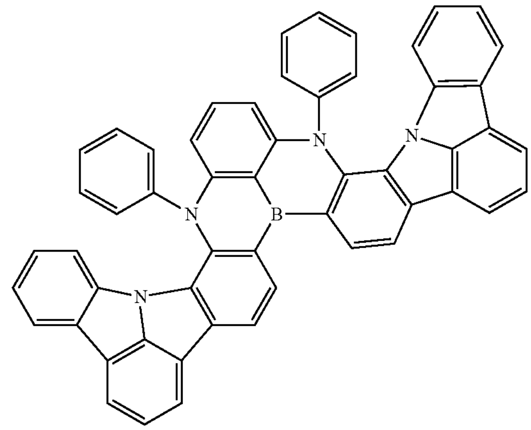
69
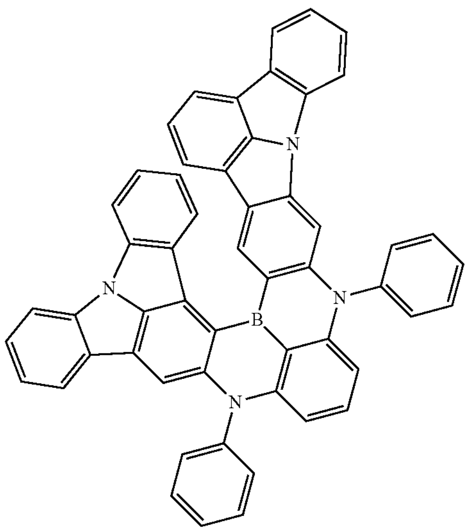
70
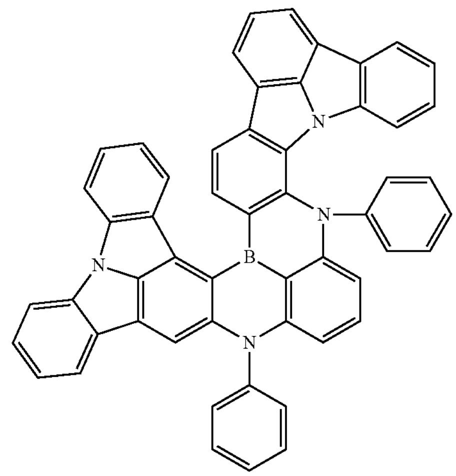
71
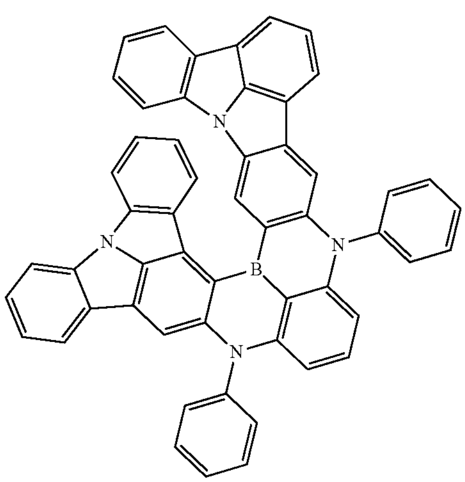
72
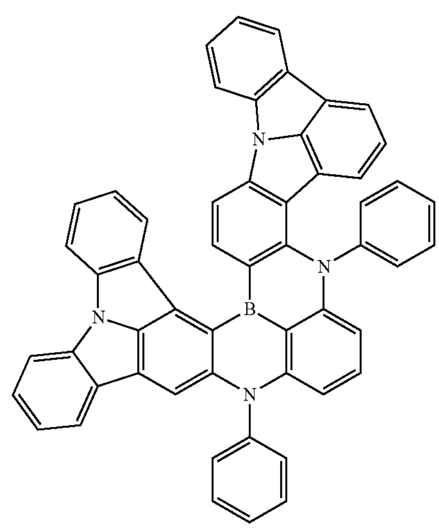

-continued
73
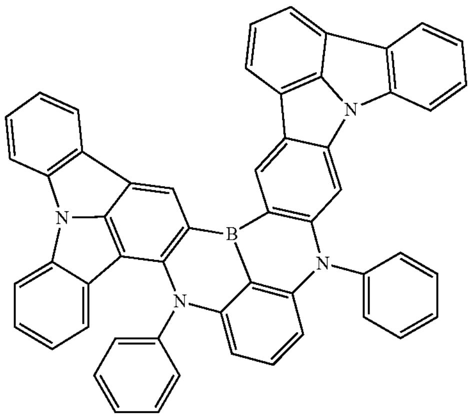
74
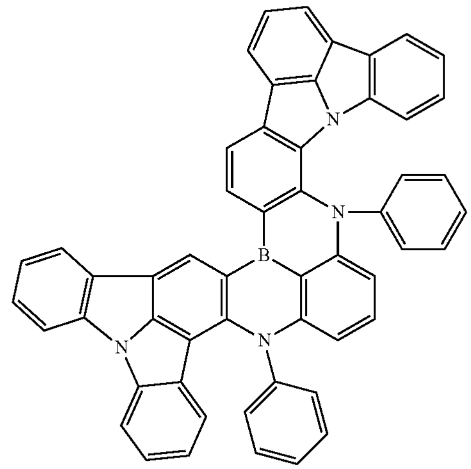
75
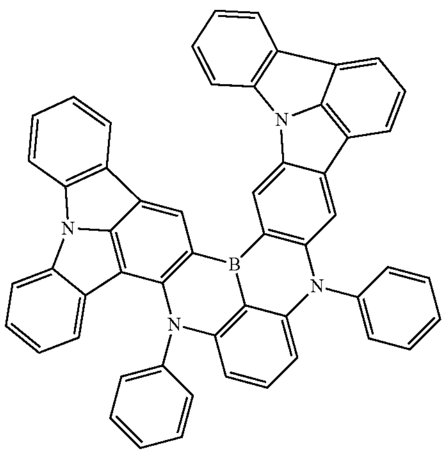
76
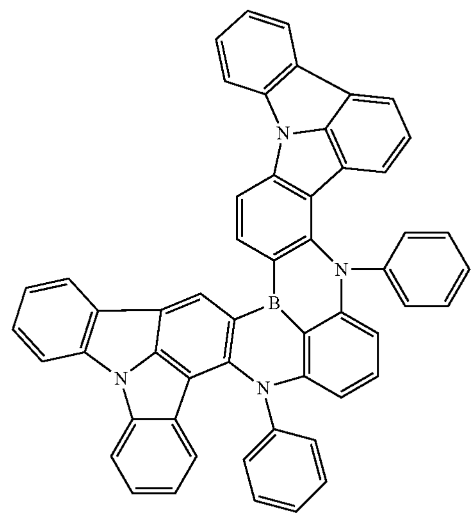
77
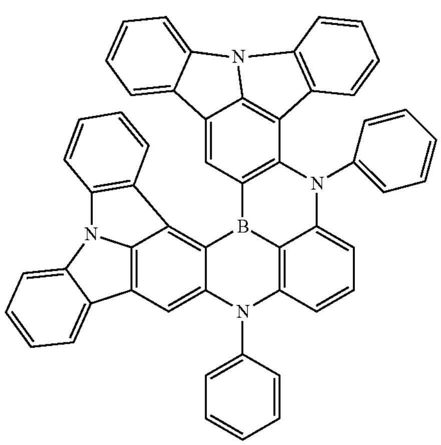
78
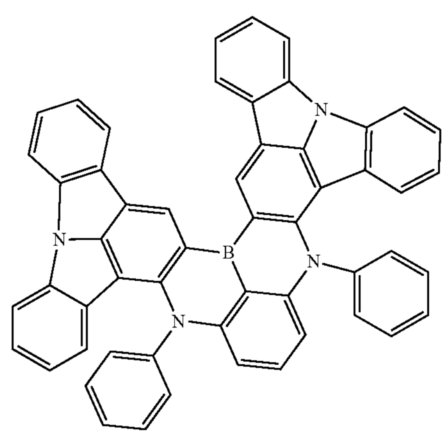

-continued
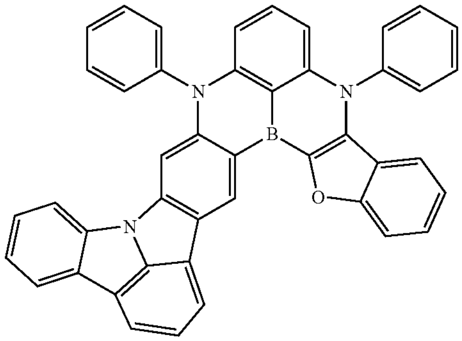
79
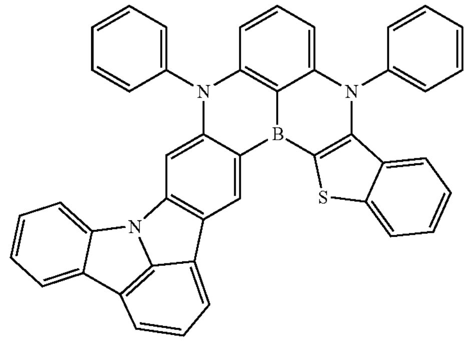
80
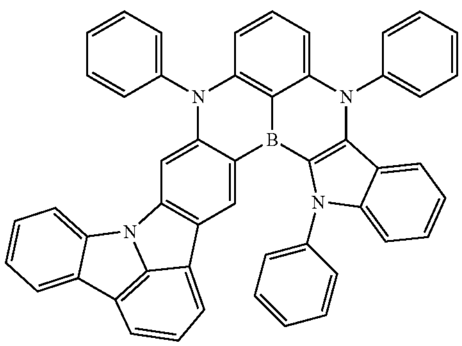
81
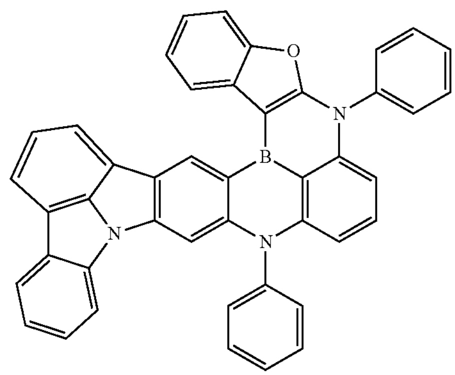
82
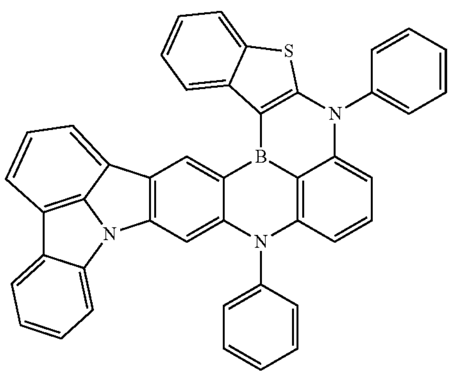
83
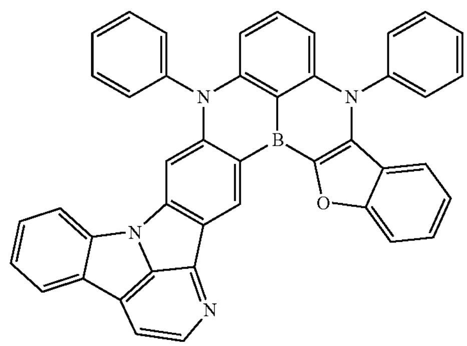
84
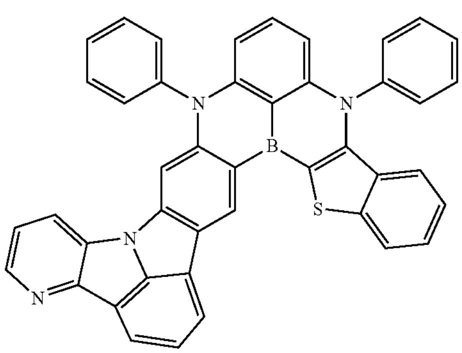
85
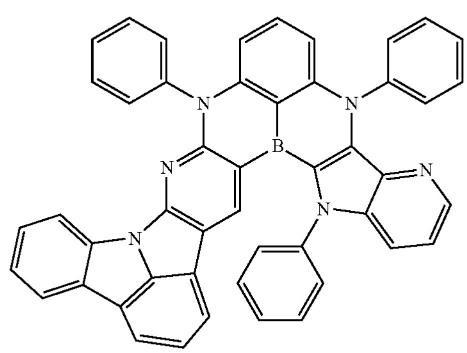
86

-continued
87
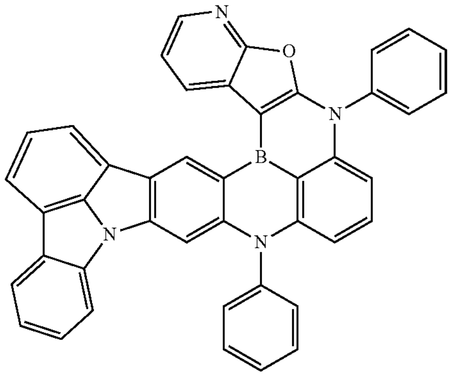
88
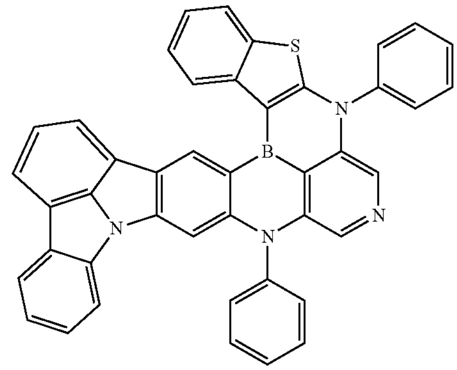
89
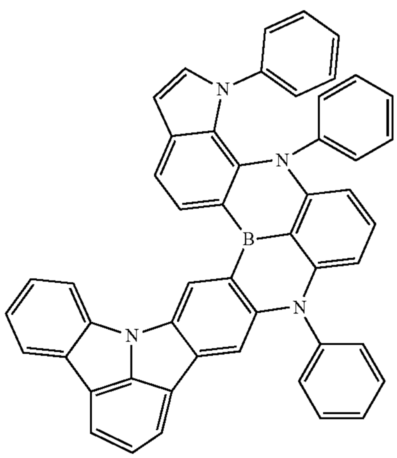
90
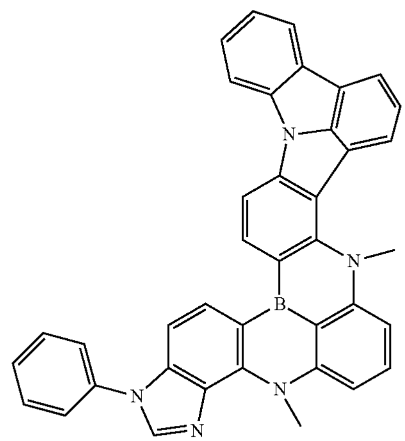
91
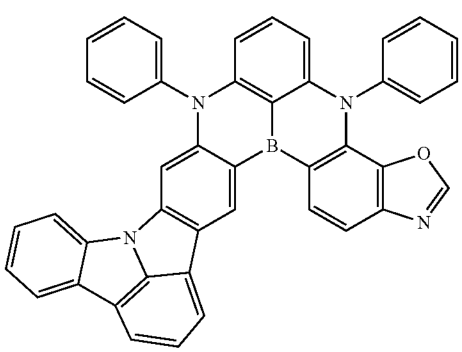
92
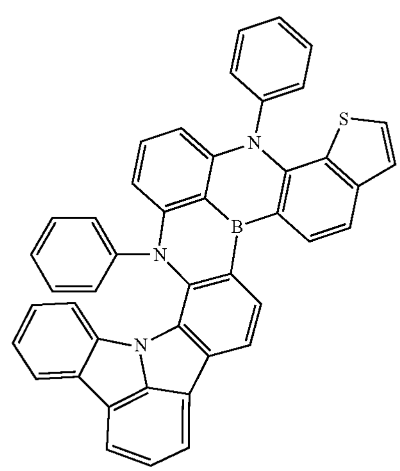

-continued
93
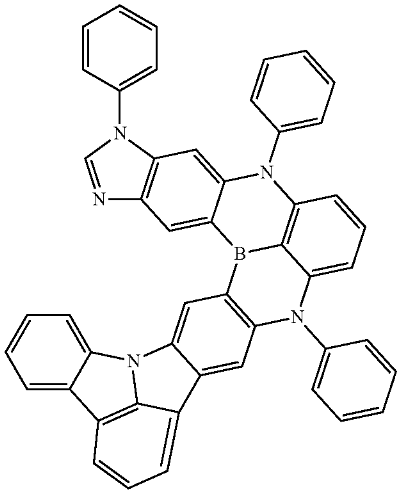
94
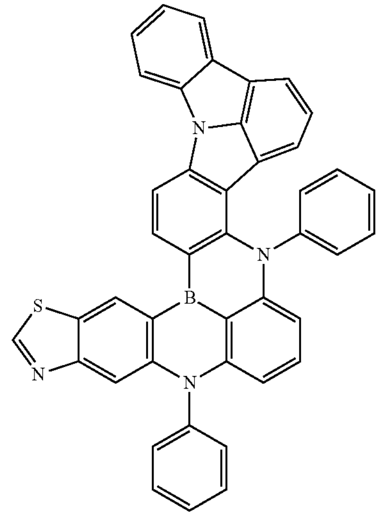
95
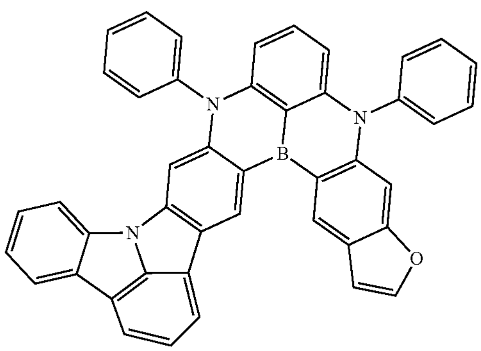
96
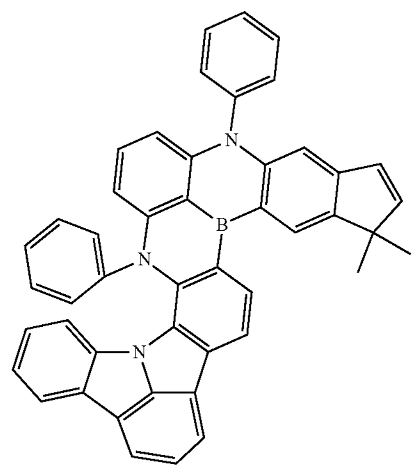
97
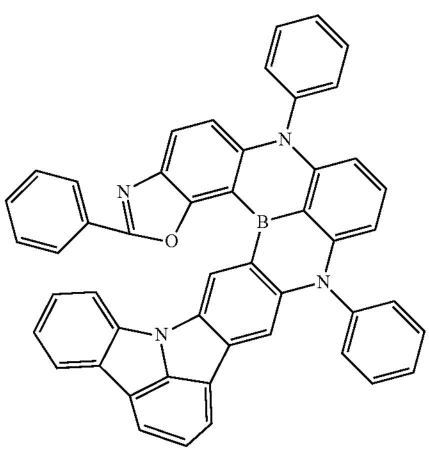
98
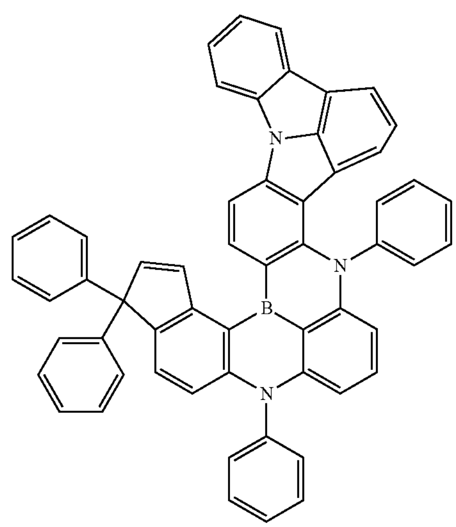

-continued
99
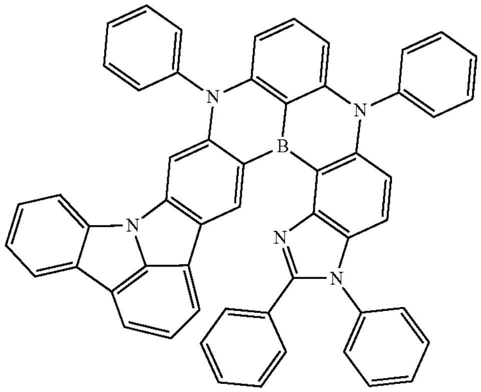
100
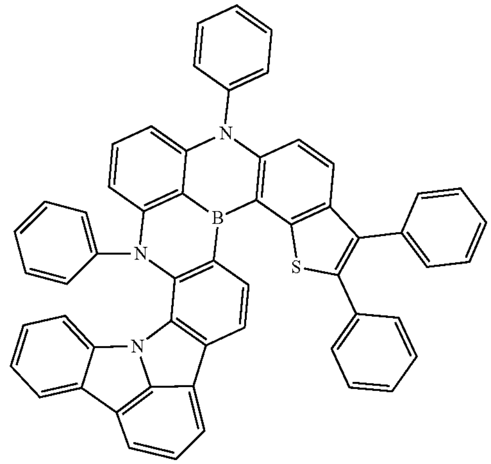
101
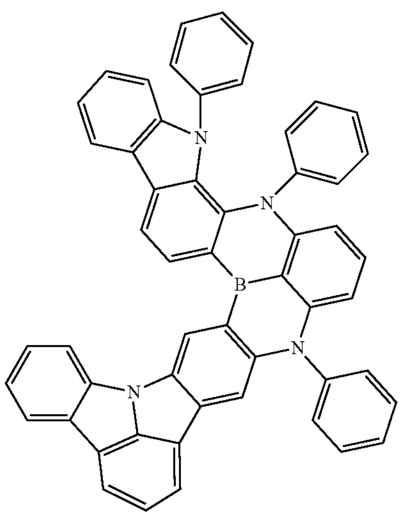
102
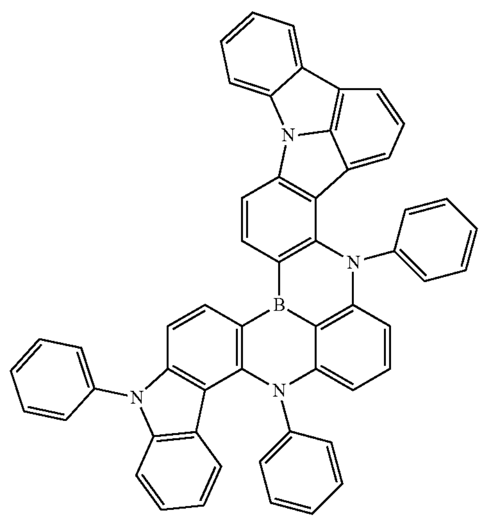
103
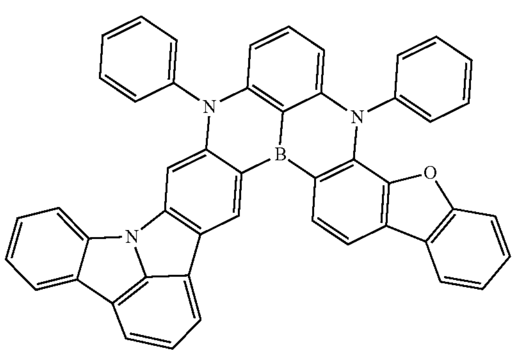
104
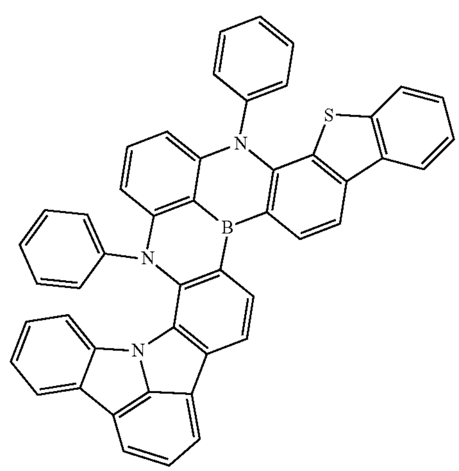

-continued
105
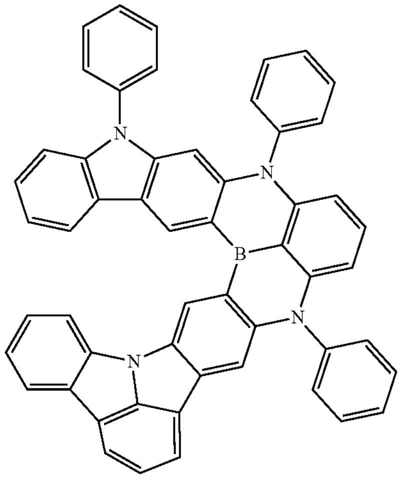
106
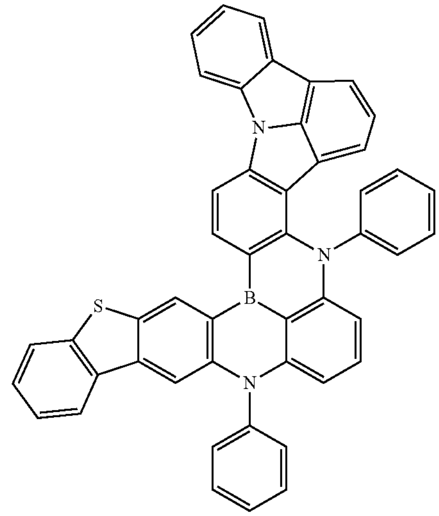
107
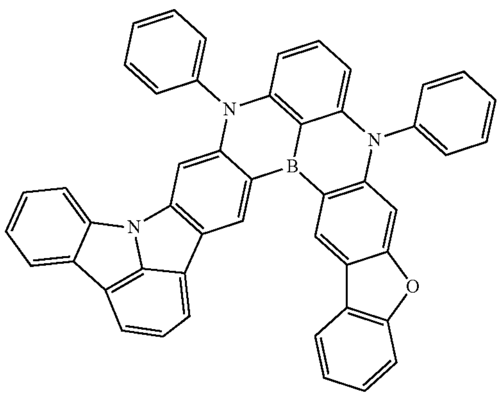
108
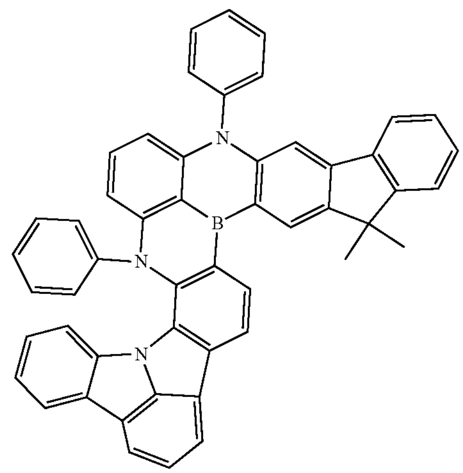
109
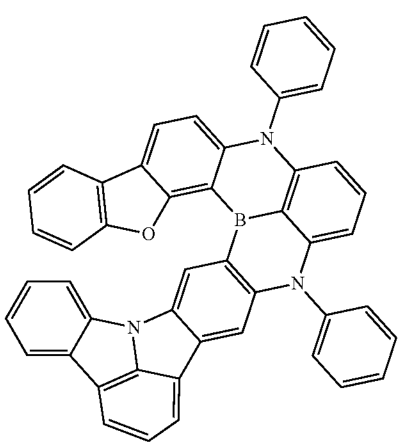
110
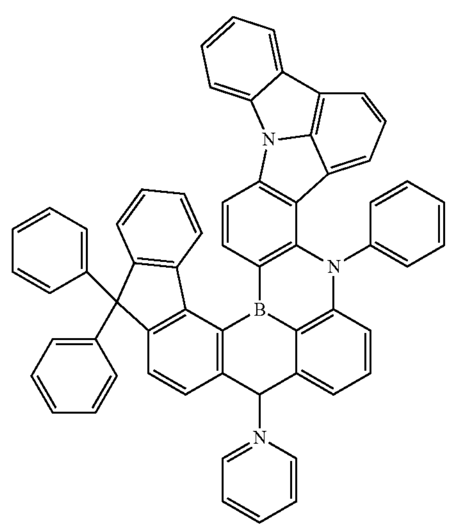

-continued
111
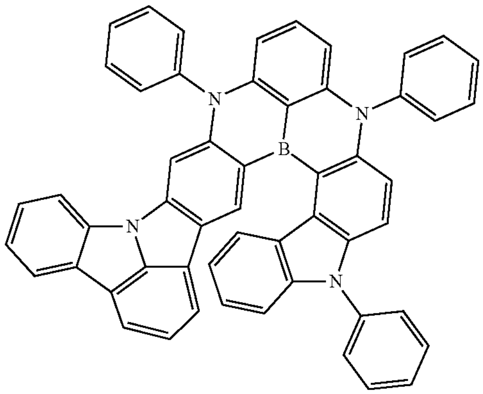
112
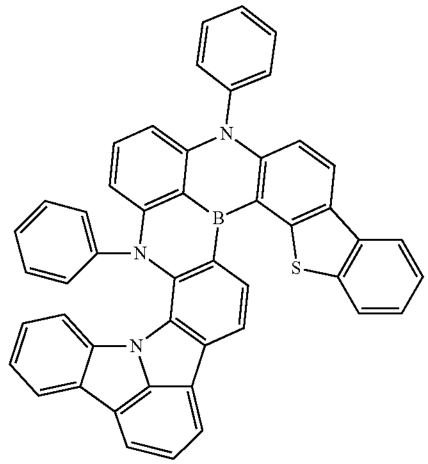
113
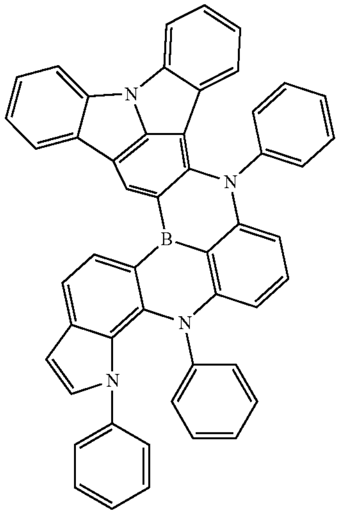
114
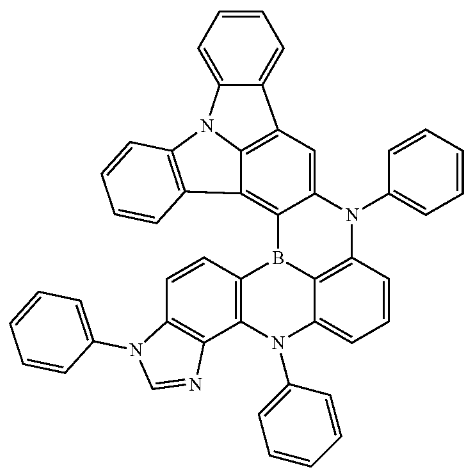
115
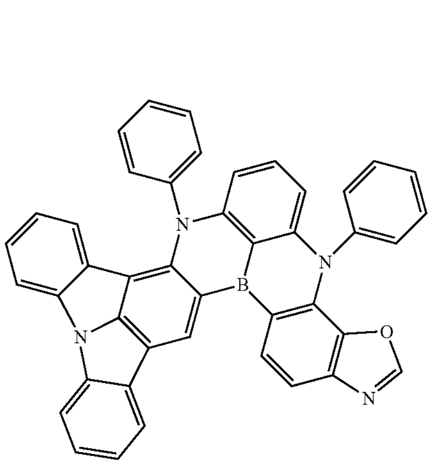
116
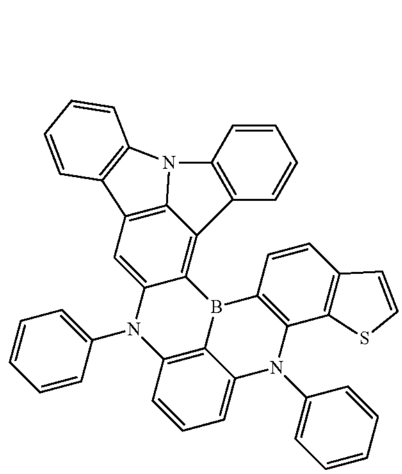

-continued
117
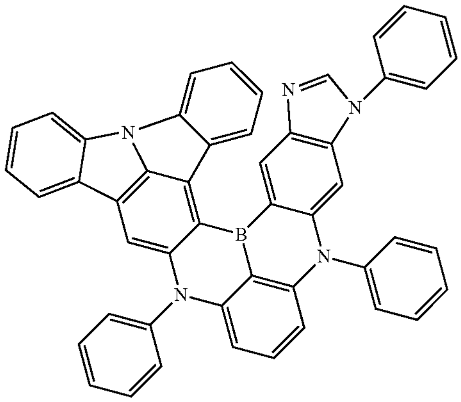
118
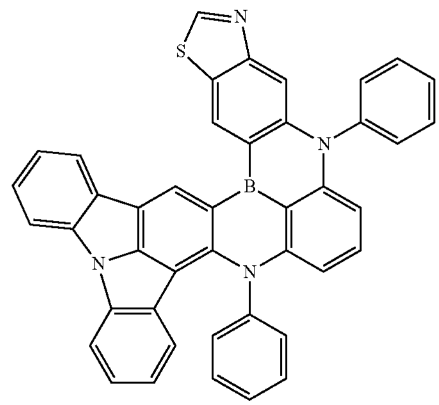
119
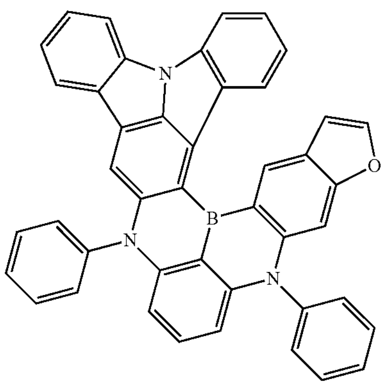
120
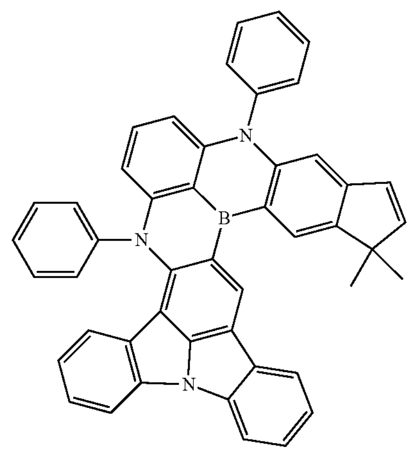
121
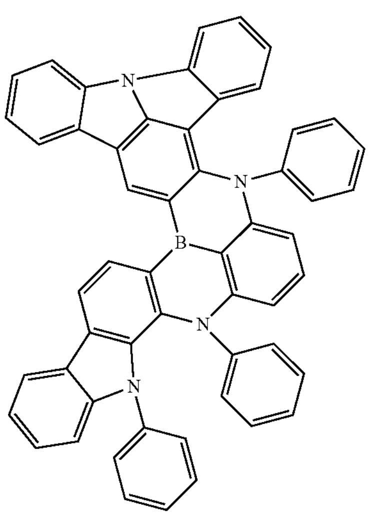
122
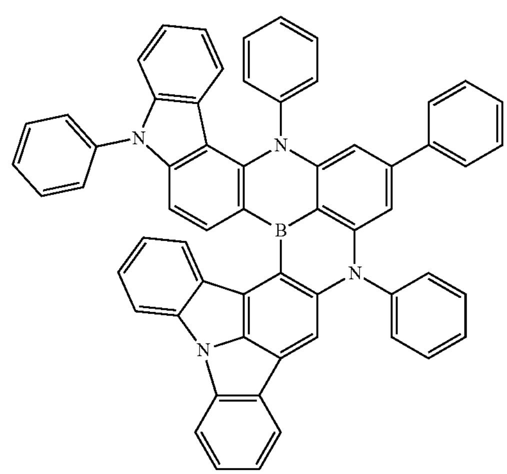

-continued
123
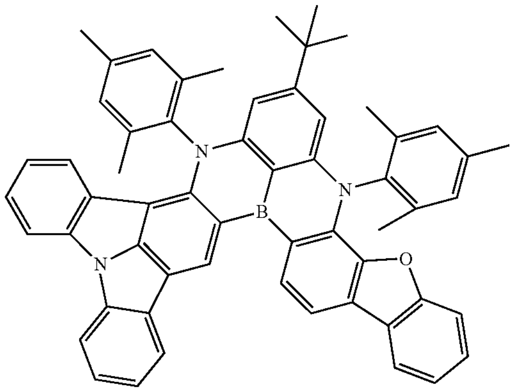
124
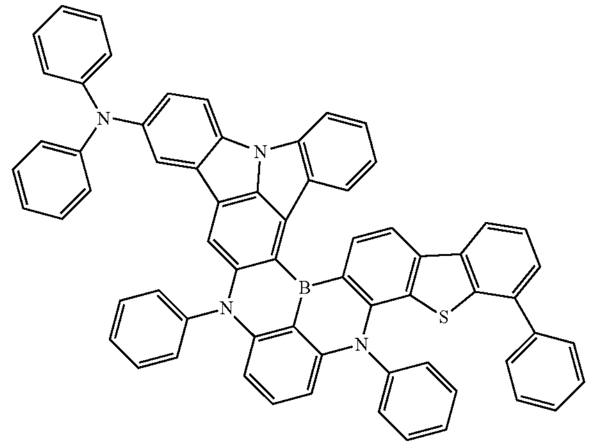
125
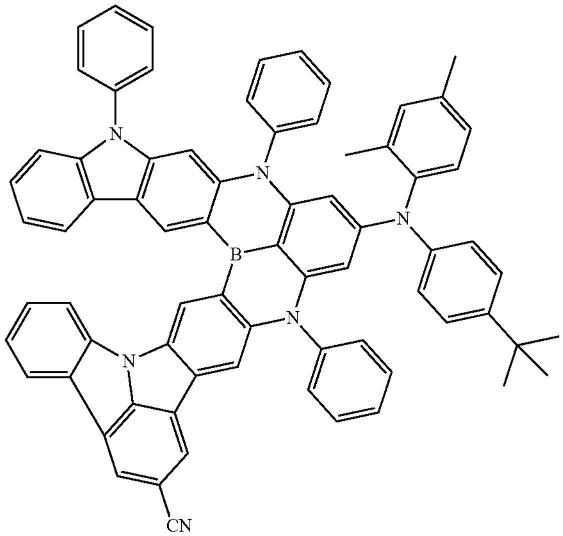
126
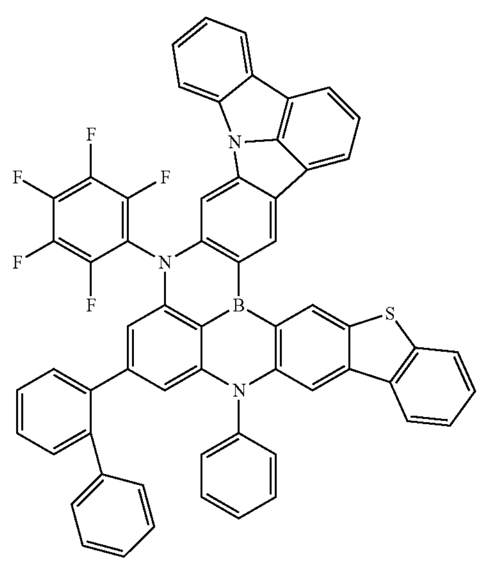

-continued
127
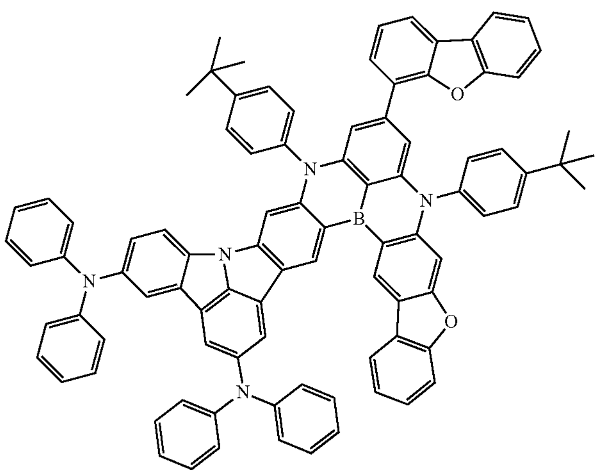
128
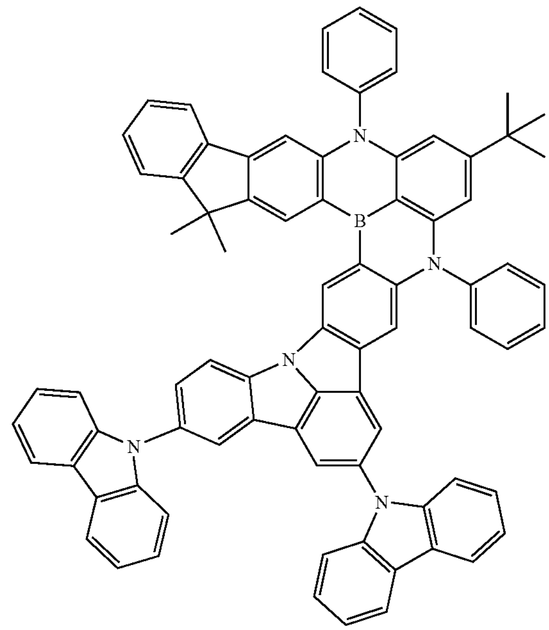
129
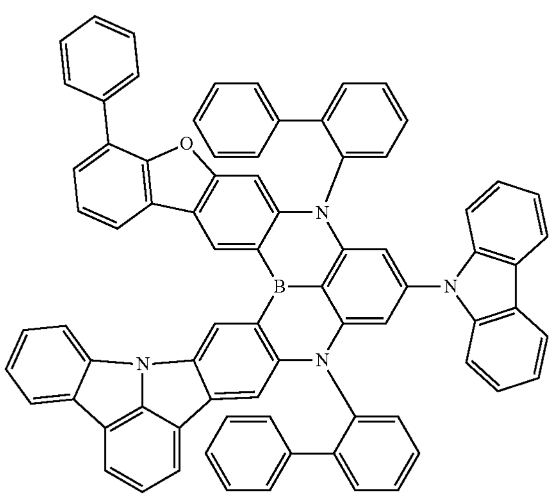
130
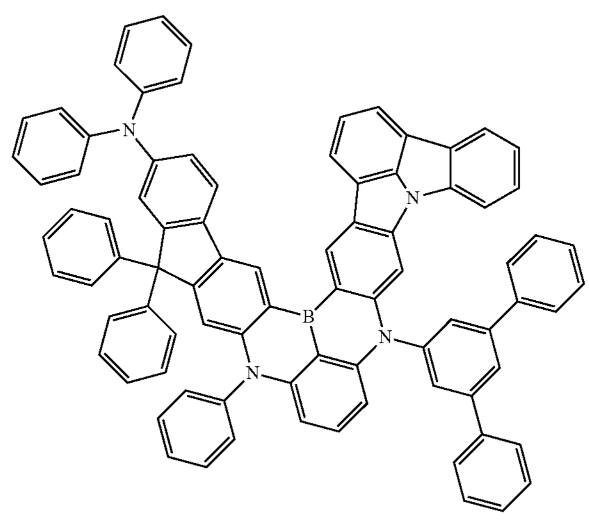

-continued
131
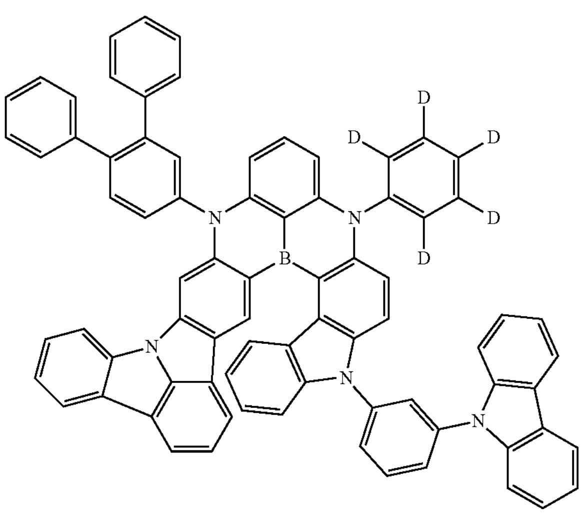
132
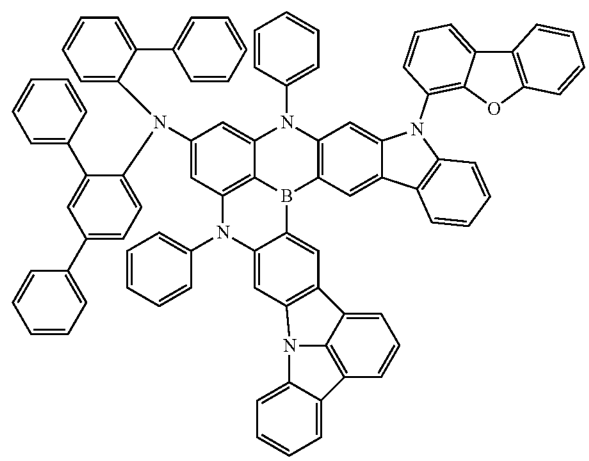
133
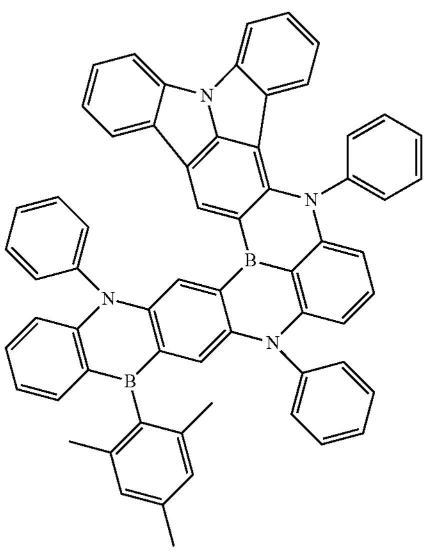
134
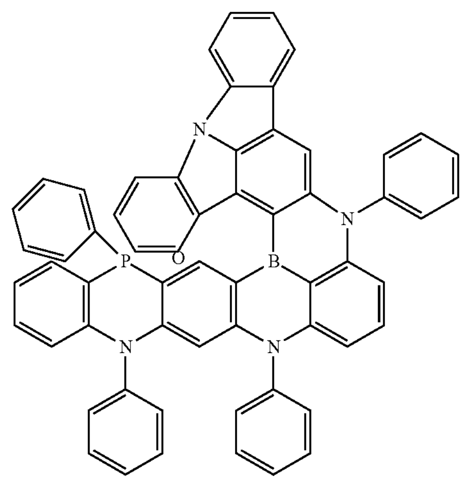
135
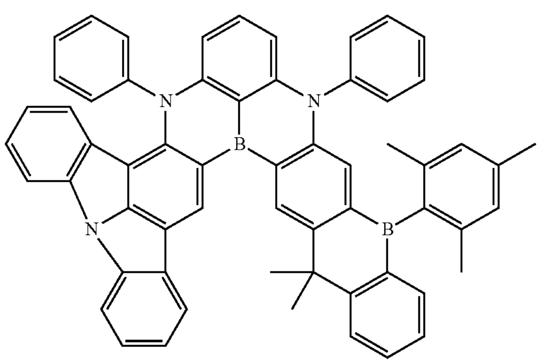
136
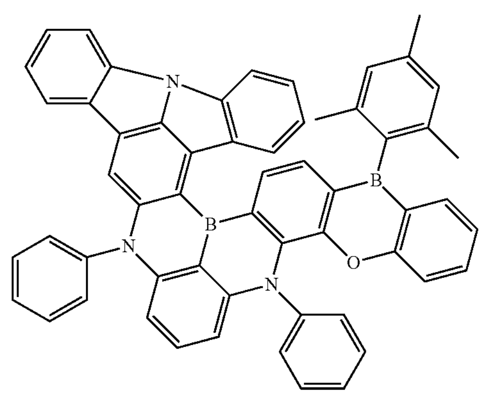

-continued
137
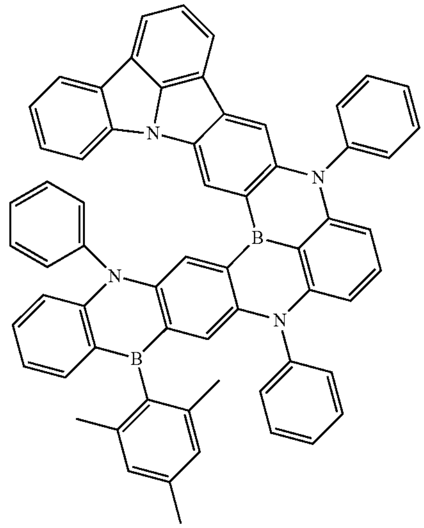
138
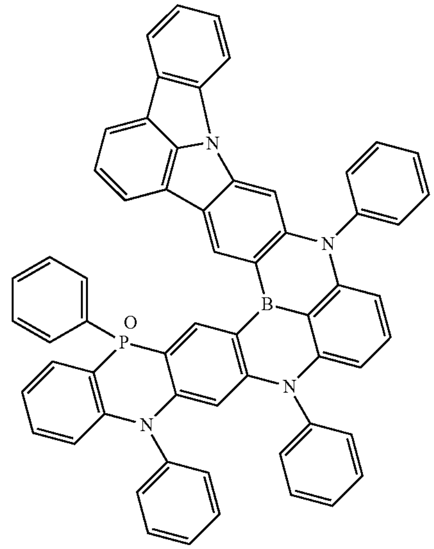
139
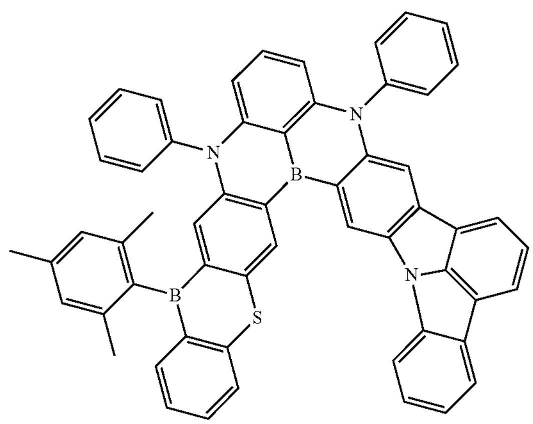
140
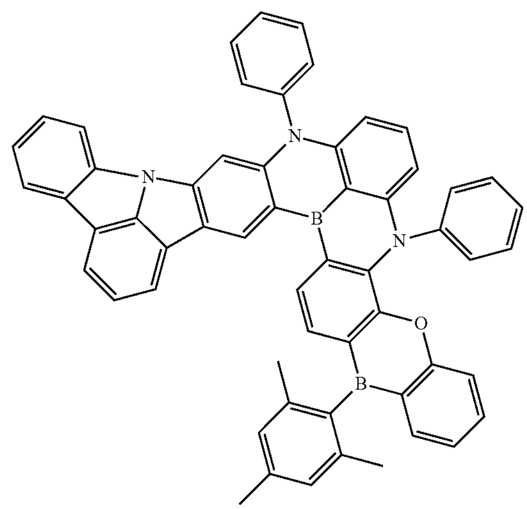
141
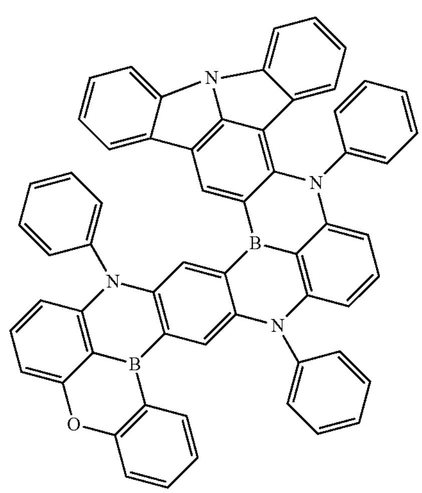
142
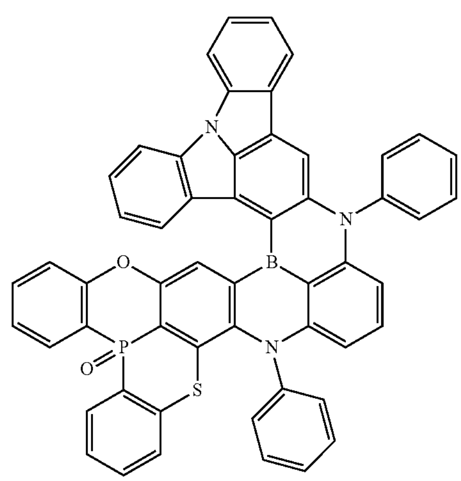

-continued
143
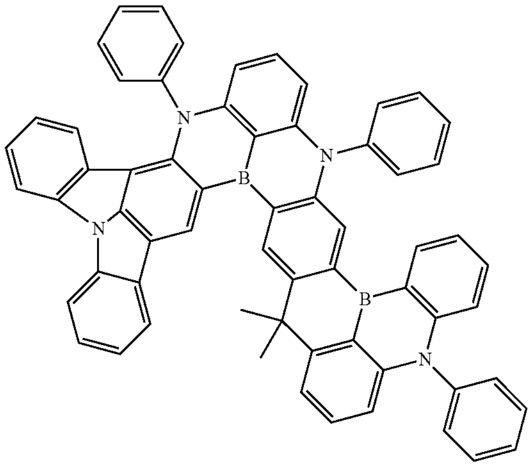
144
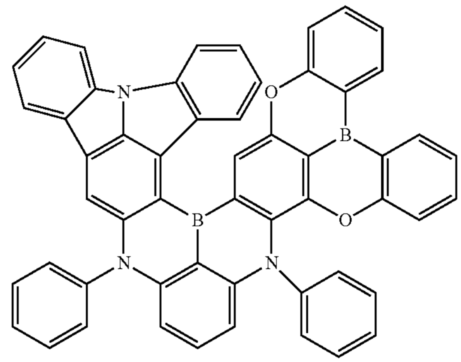
145
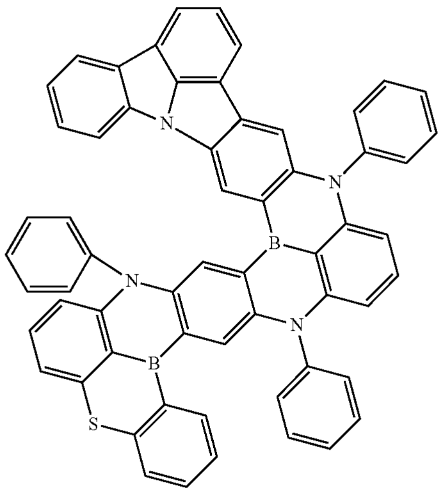
146
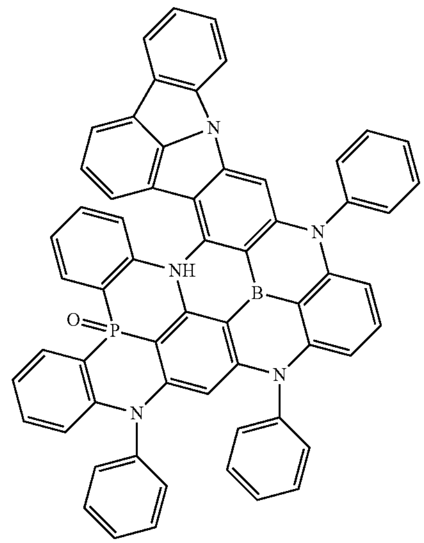
147
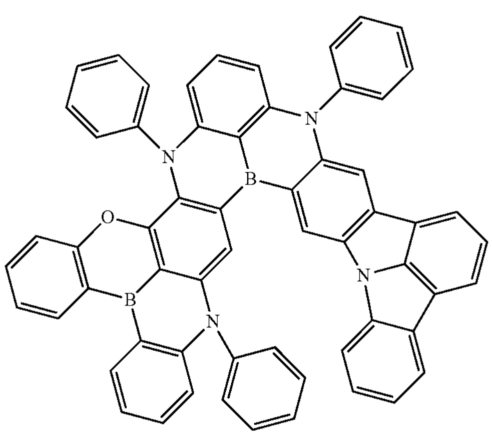
148
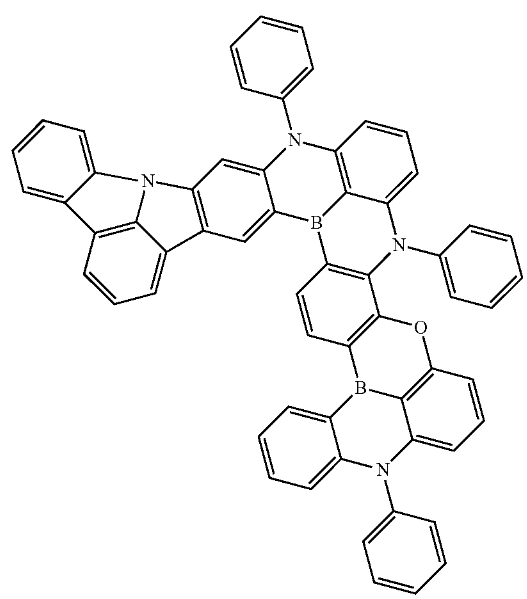

-continued
149
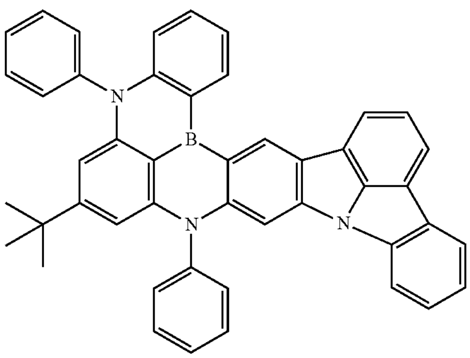
150
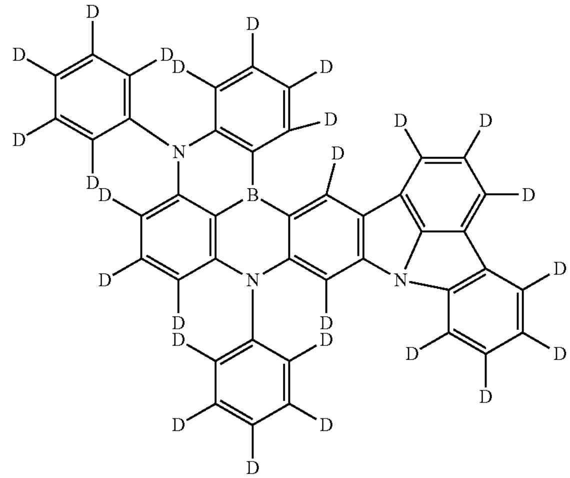
151
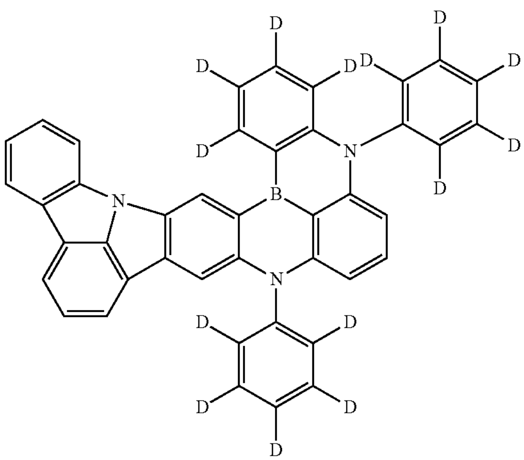
152
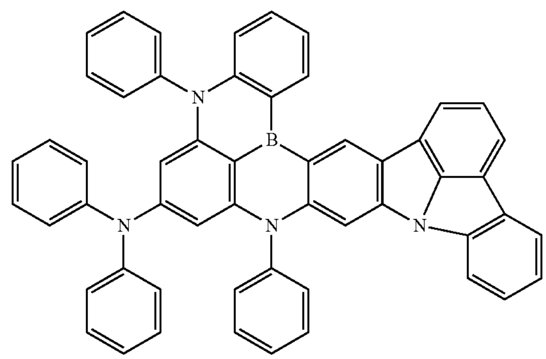
153
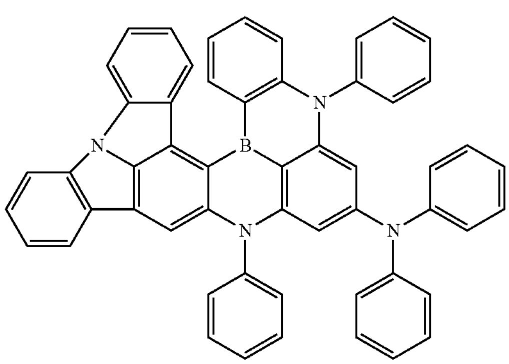
154
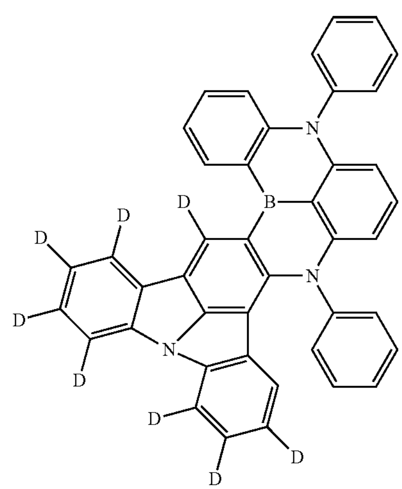

-continued
155
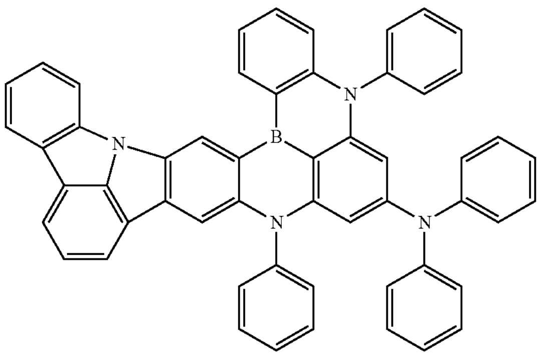
156
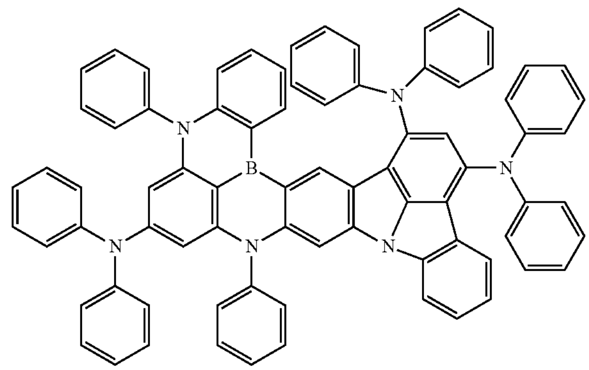
157
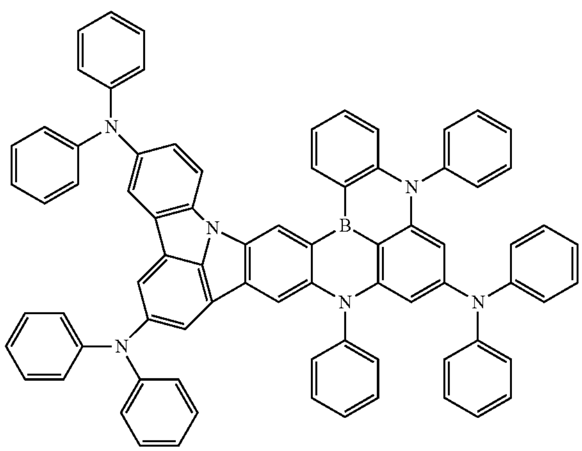
158
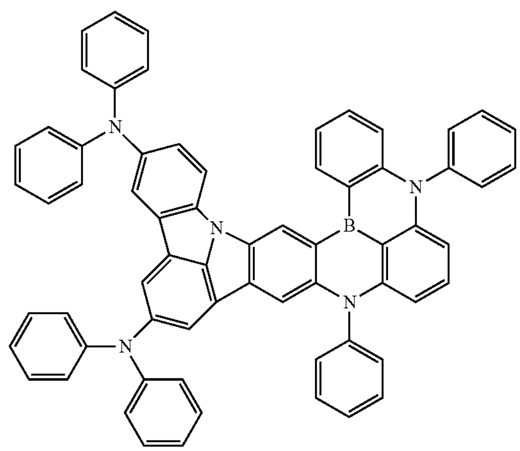
159
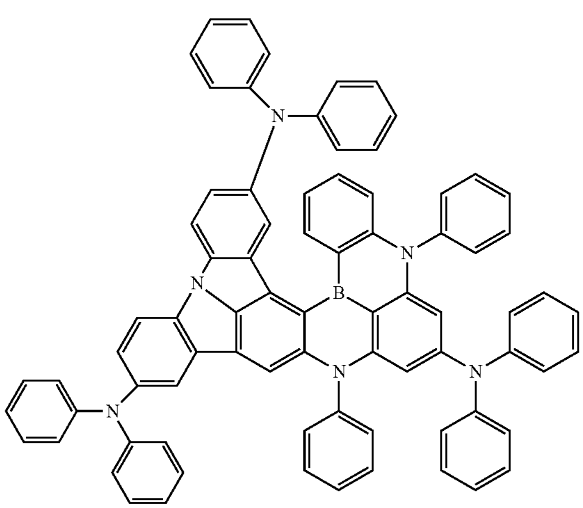
160
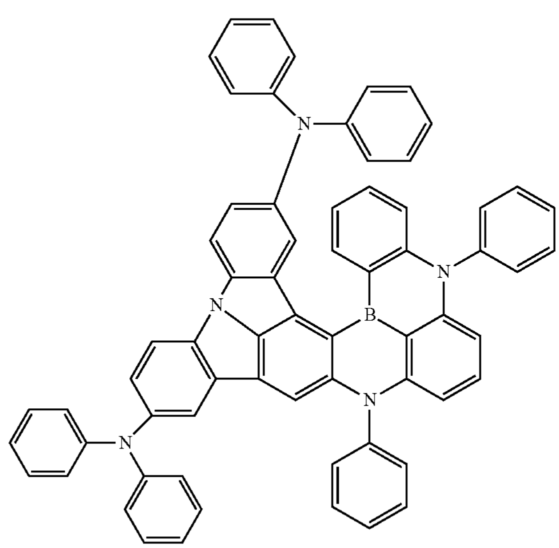

-continued
161
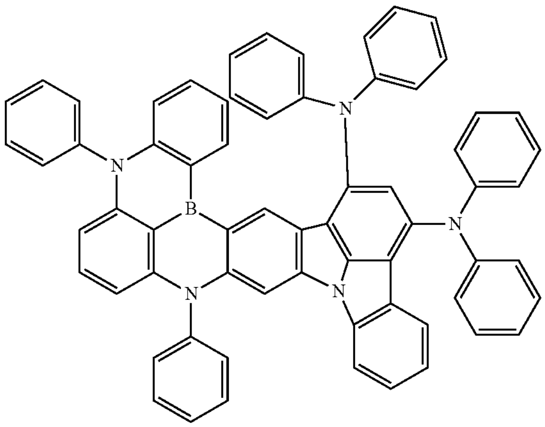
162
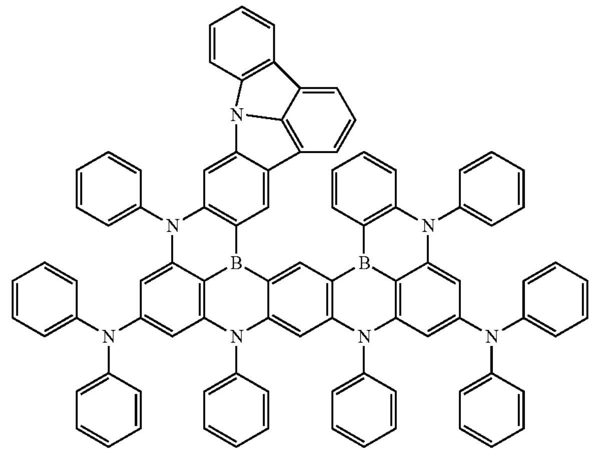
163
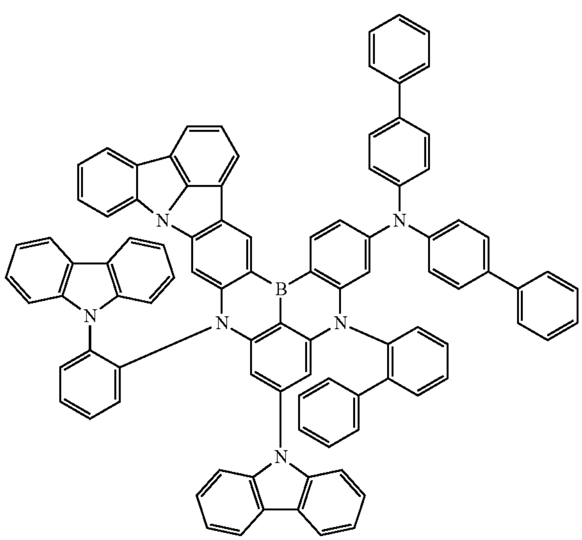
164
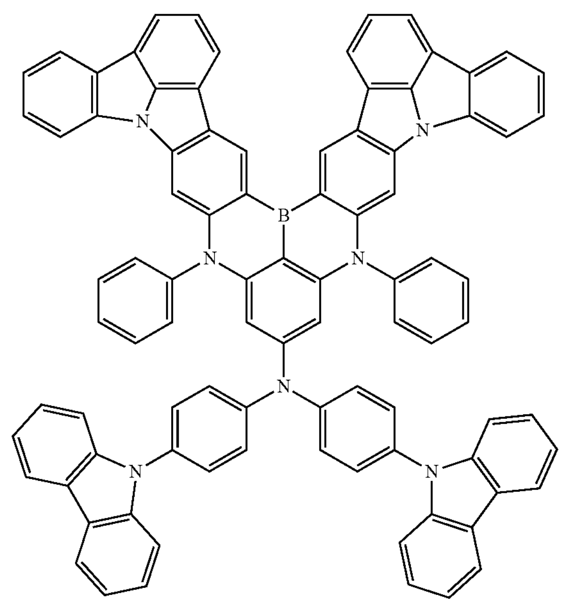

-continued
165
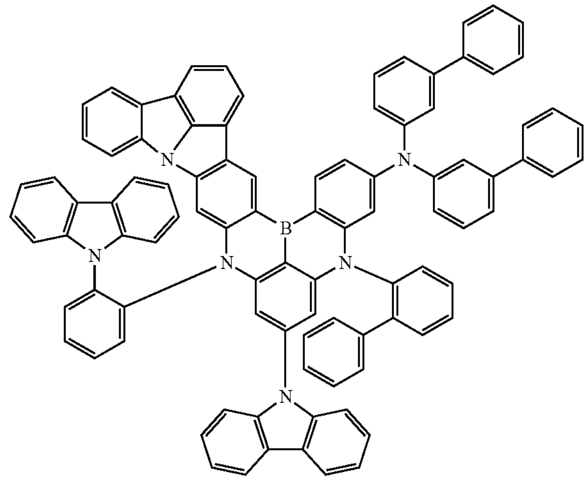
166
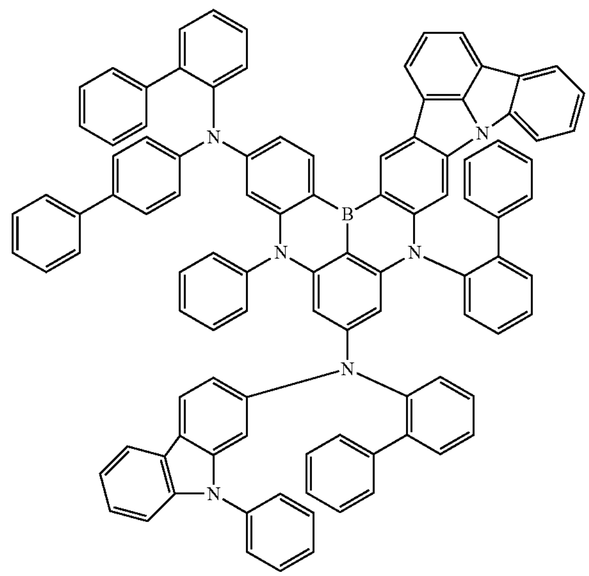
167
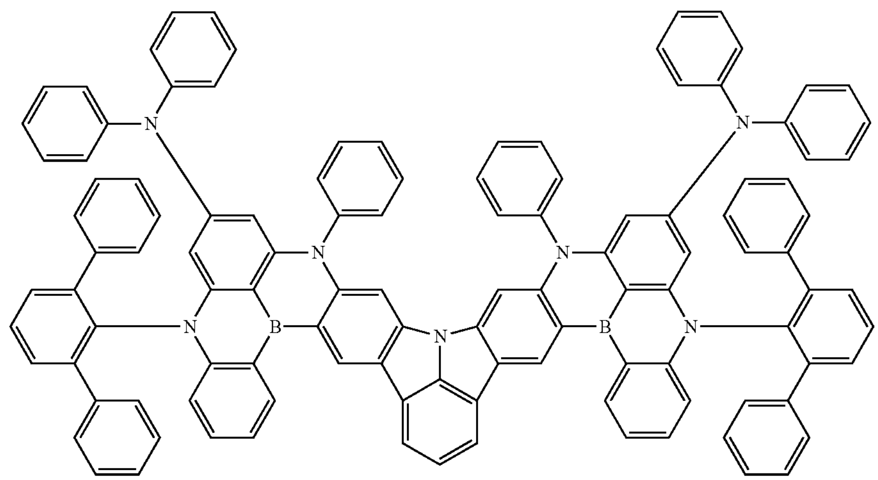
168
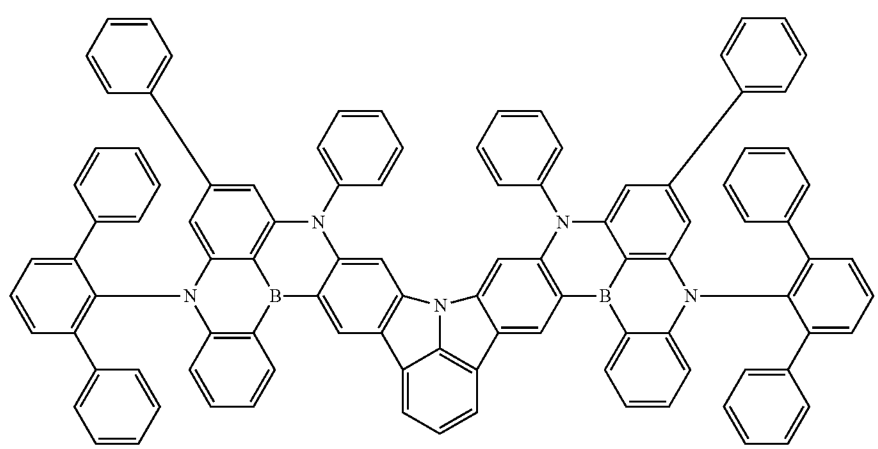

-continued
169
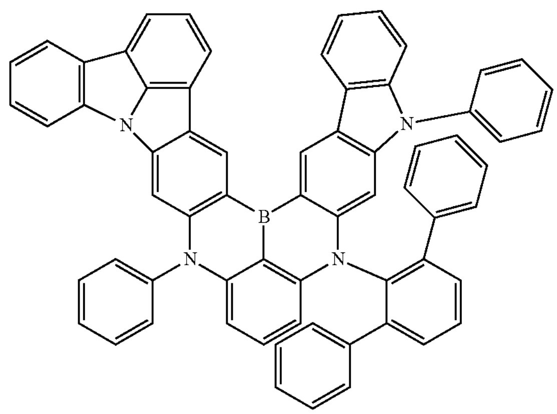
170
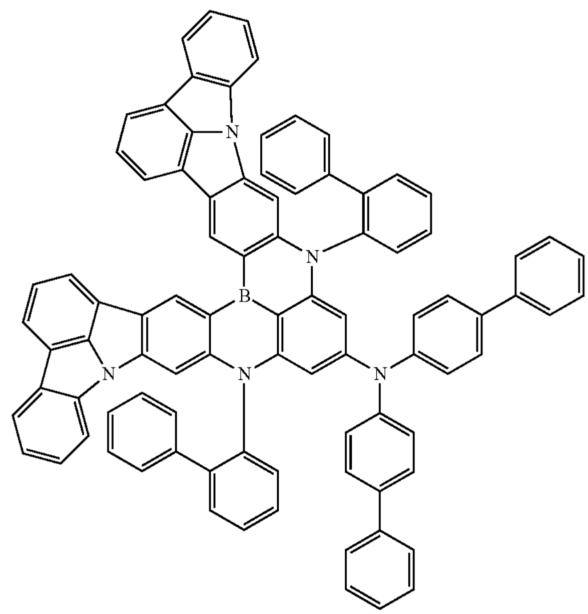
171
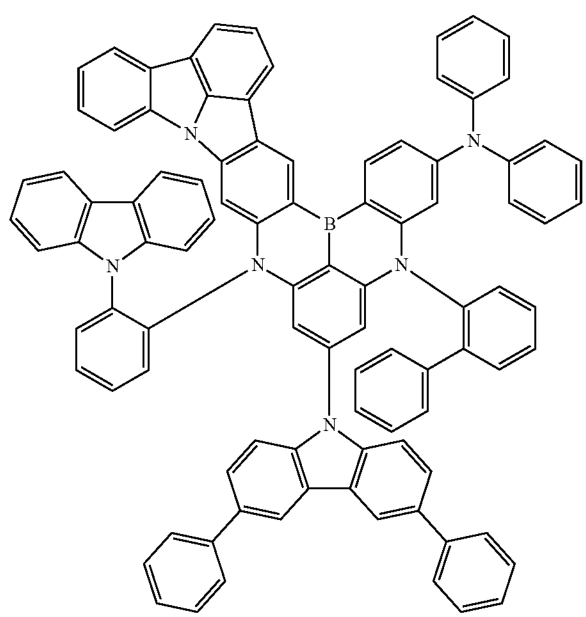
172
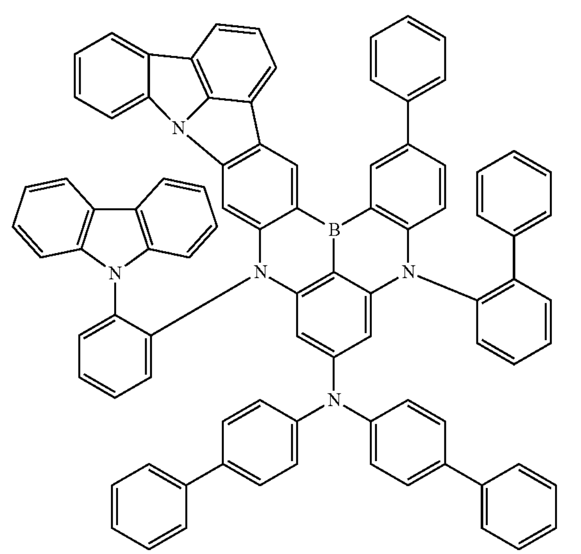

-continued
173
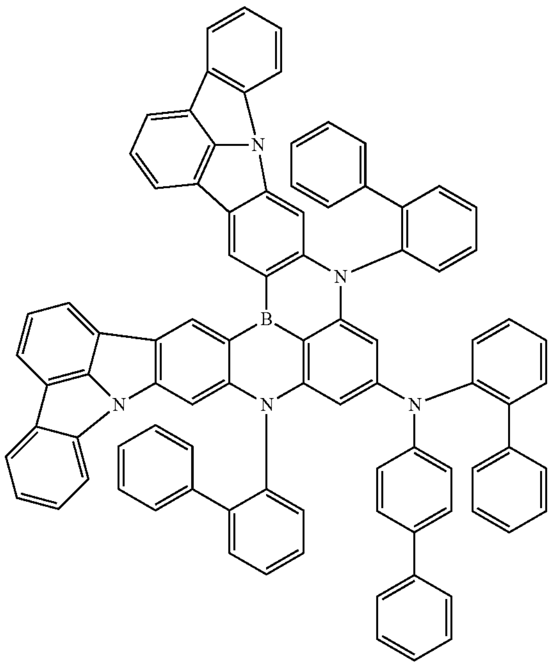
174
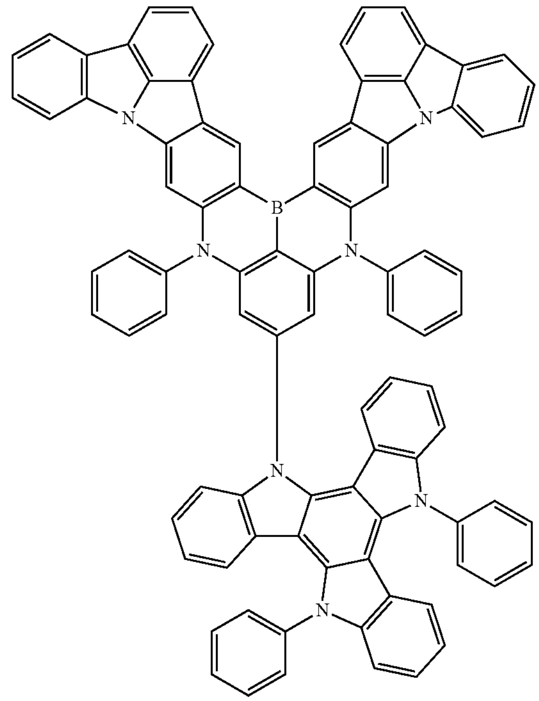
175
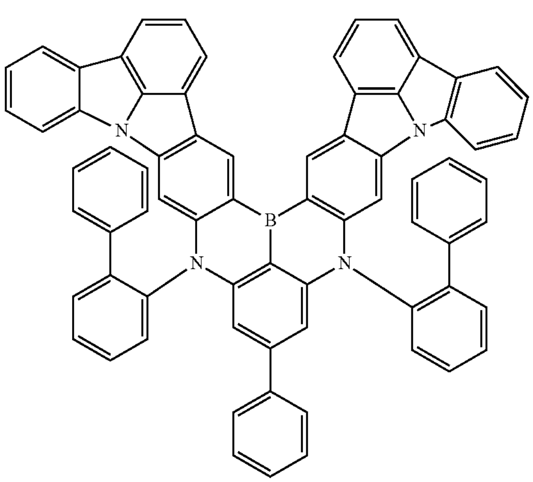

-continued
176
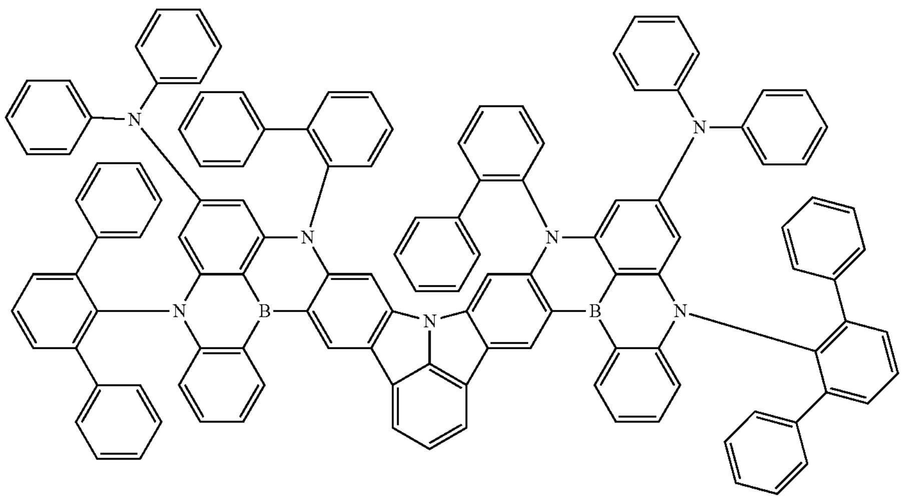
177
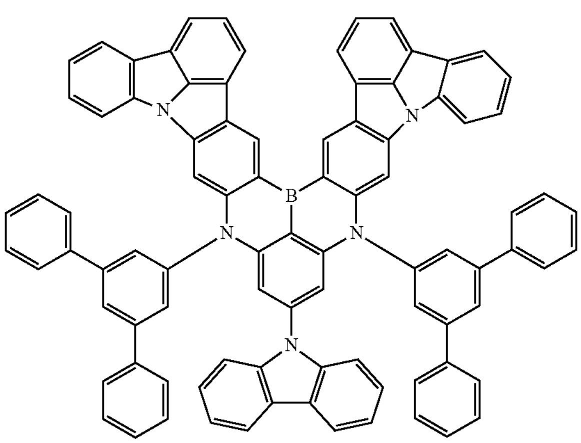
178
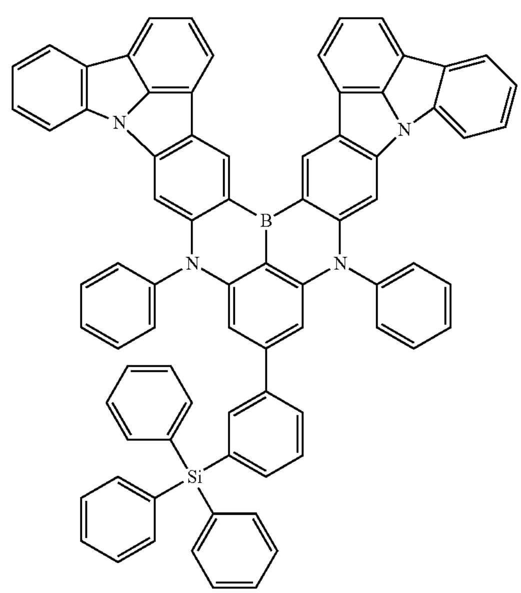

-continued
179
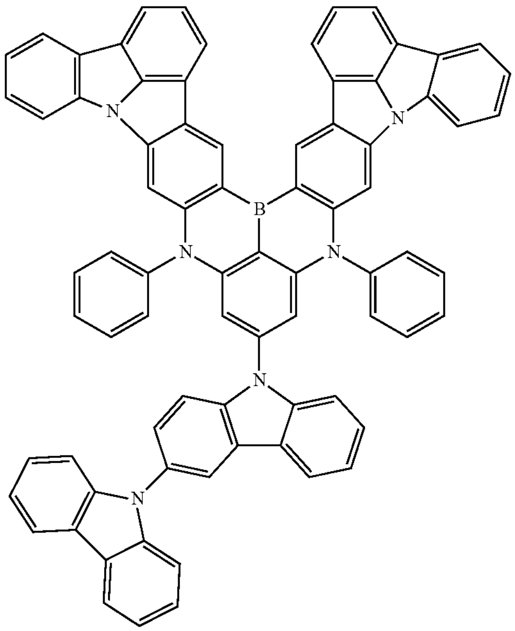
180
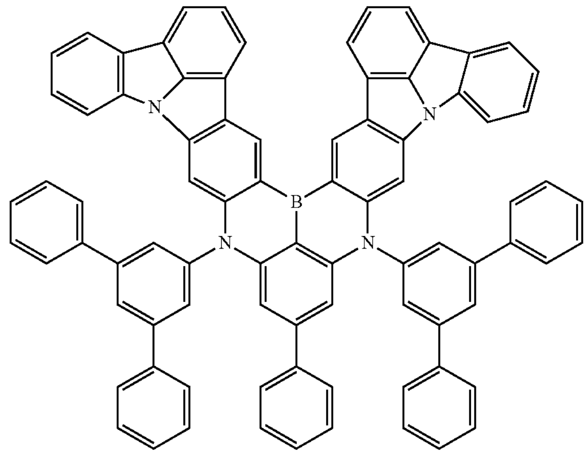
181
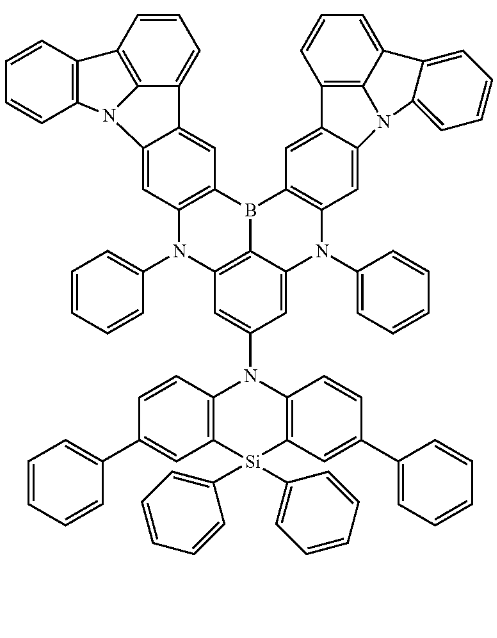
182
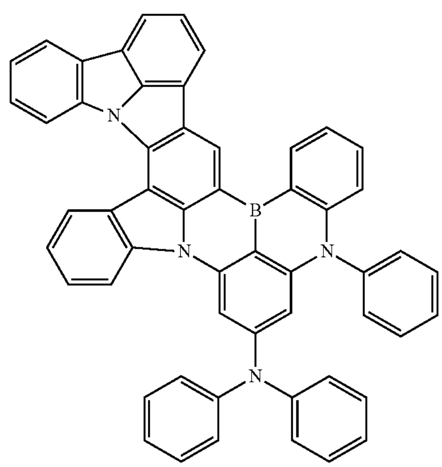

-continued
183
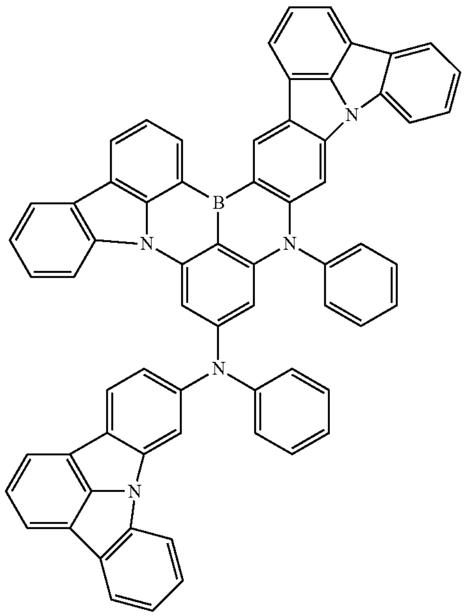
184
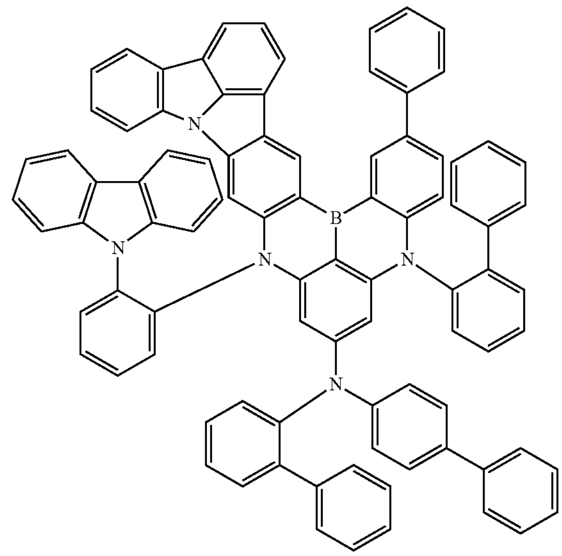
185
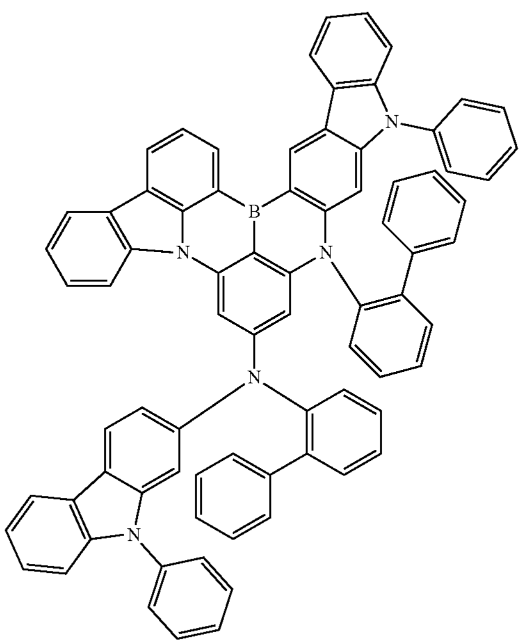
186
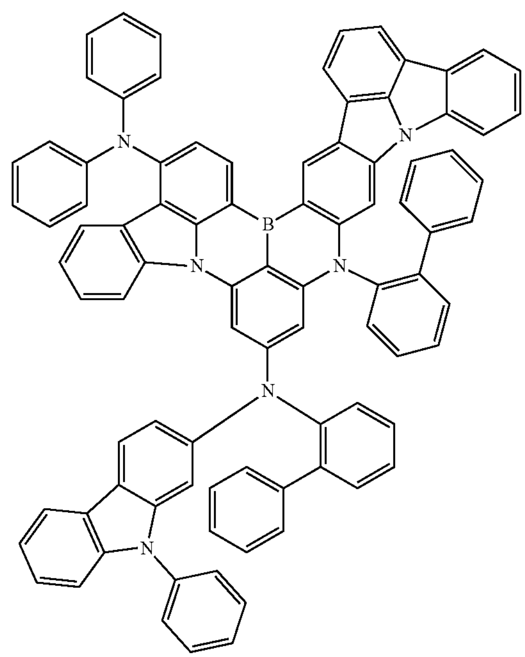

-continued
187
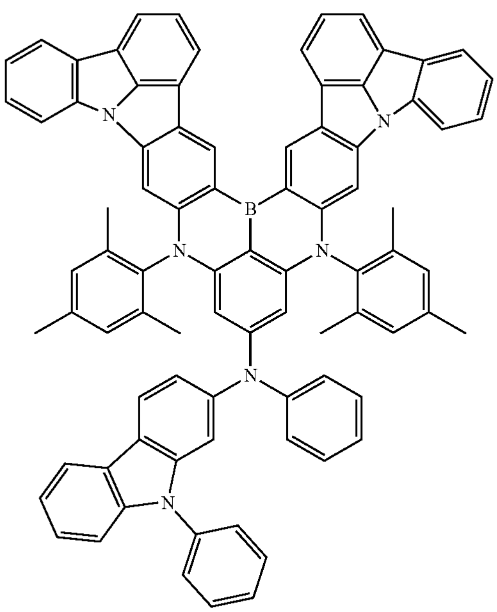
188
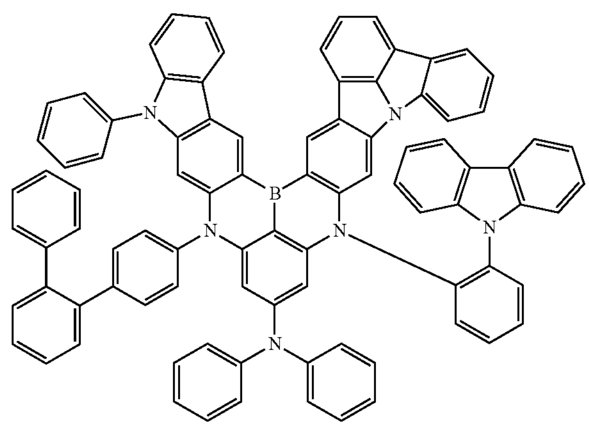
189
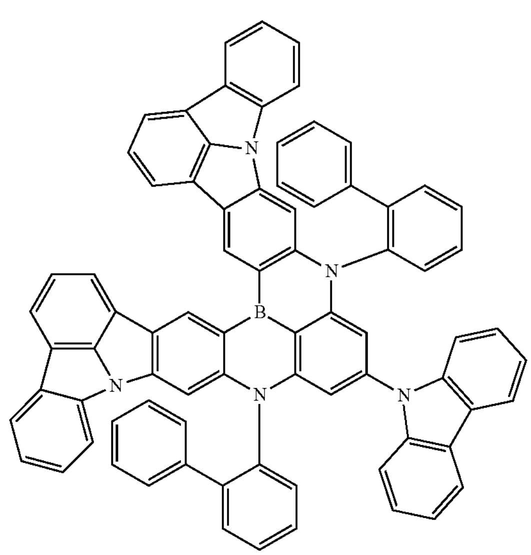
190
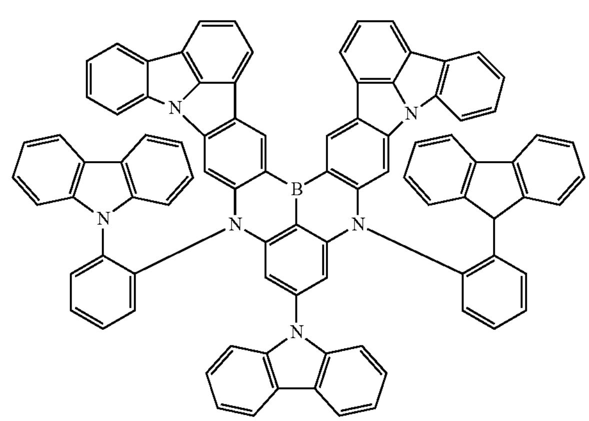

-continued
191
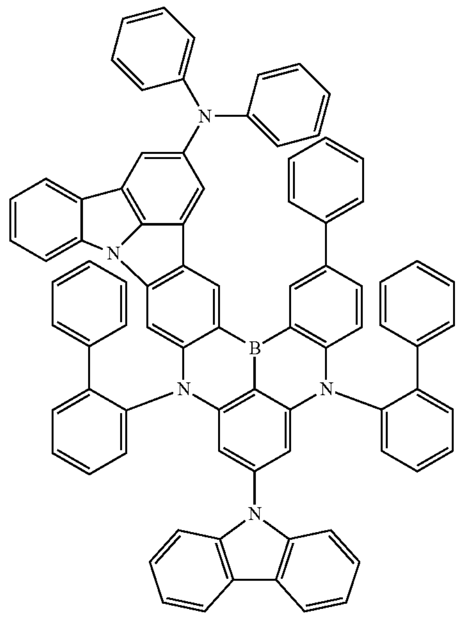
192
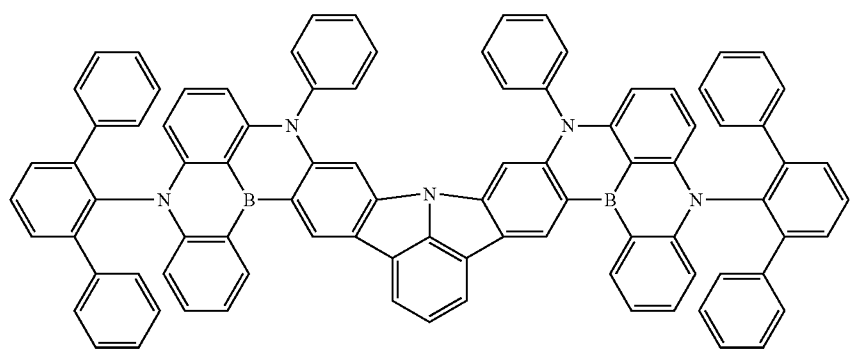
193
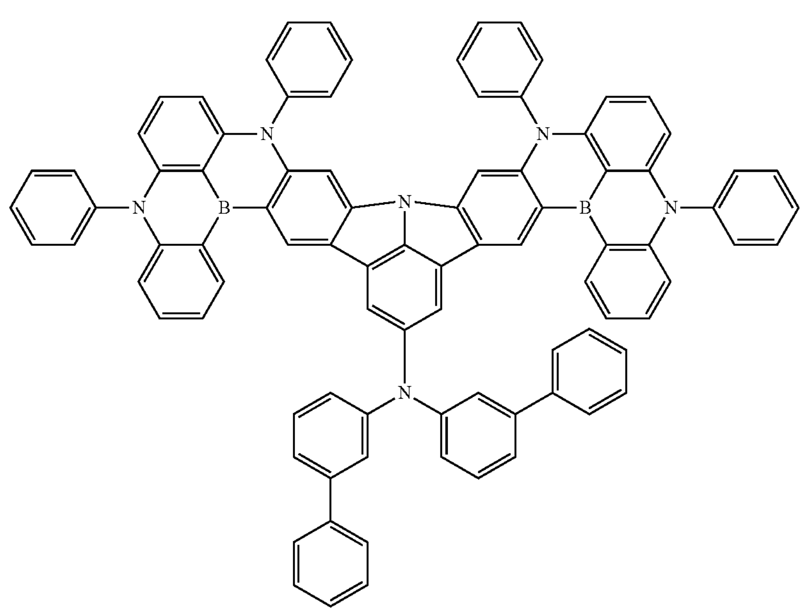

-continued
194
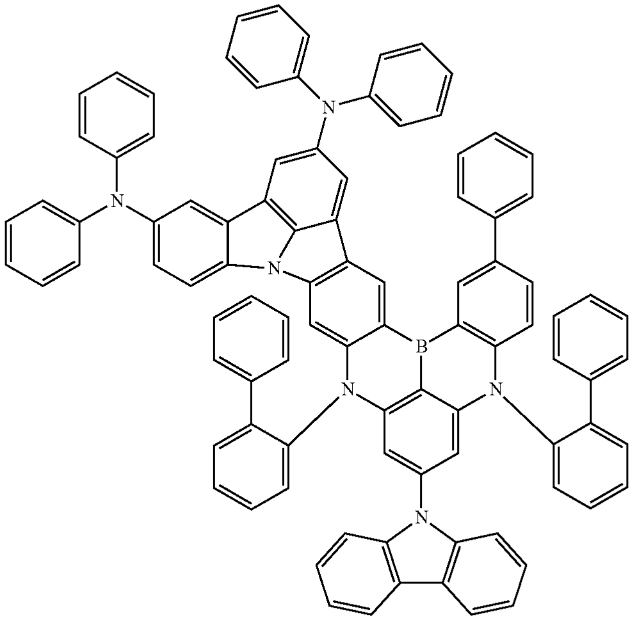
195
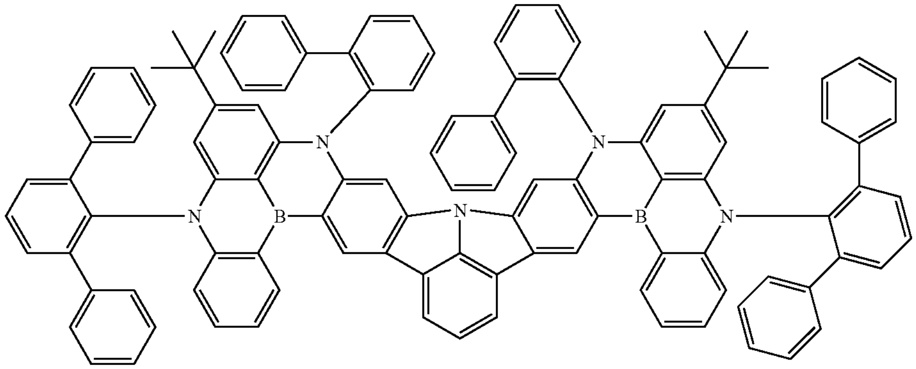
196
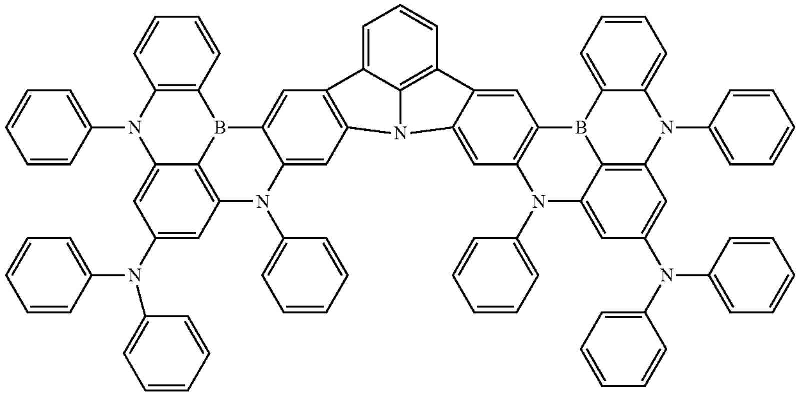

-continued
197
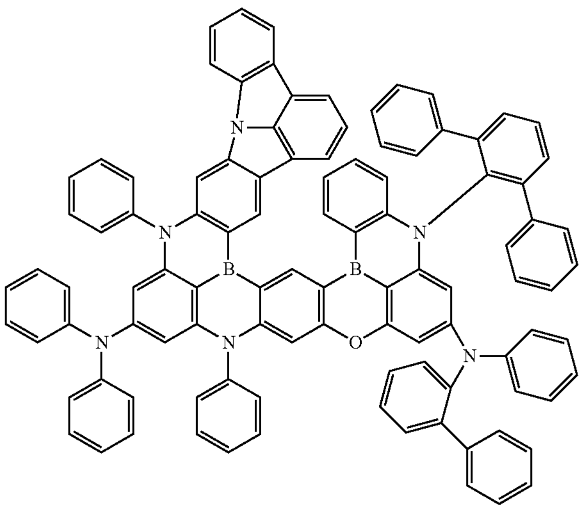
198
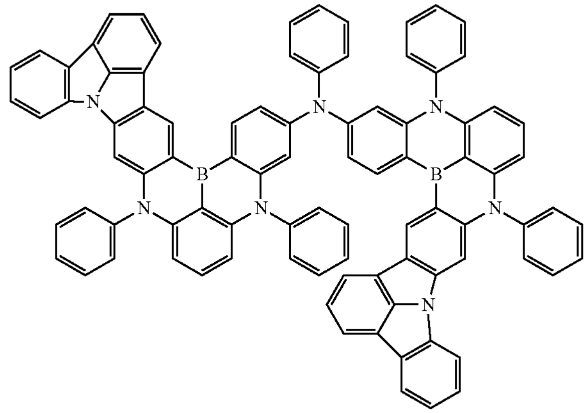
199
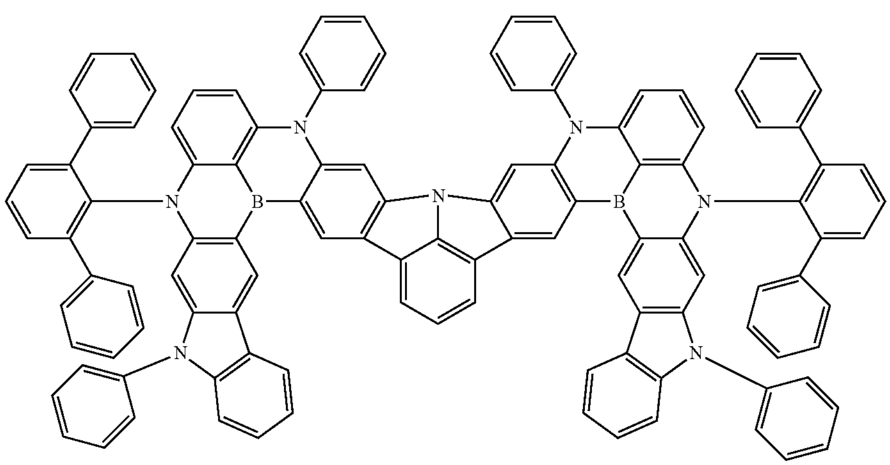

-continued
200
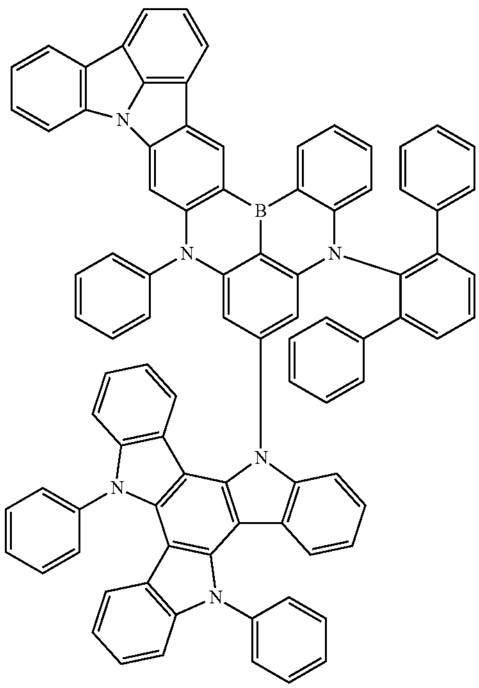
201
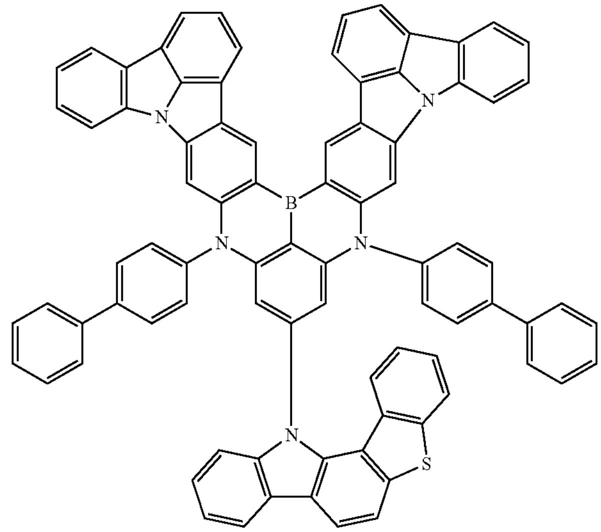
202
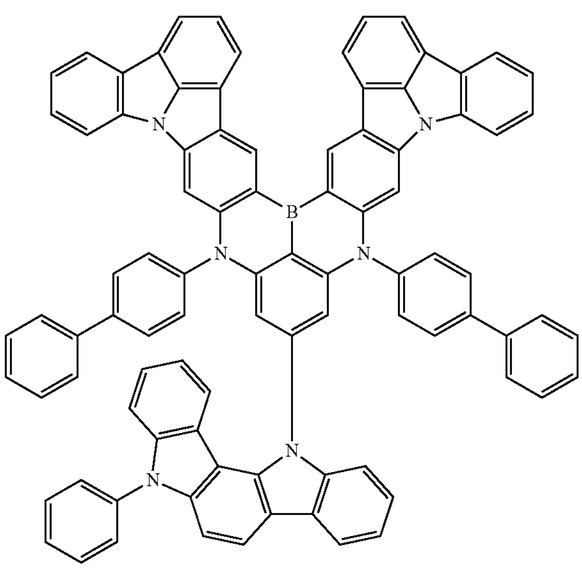
203
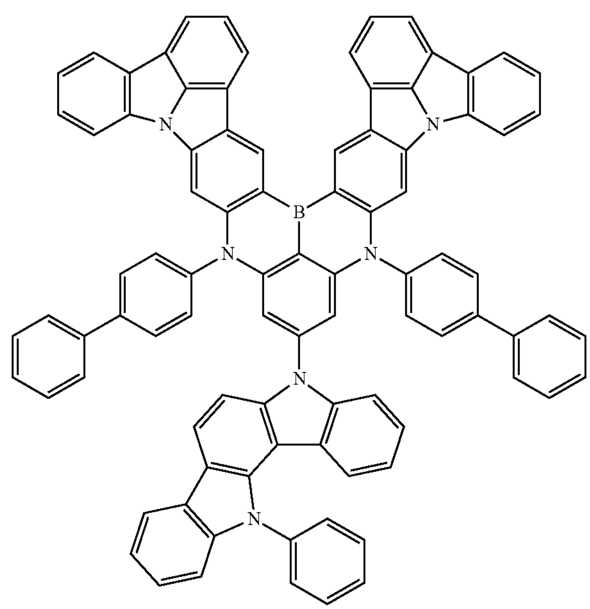

-continued
204
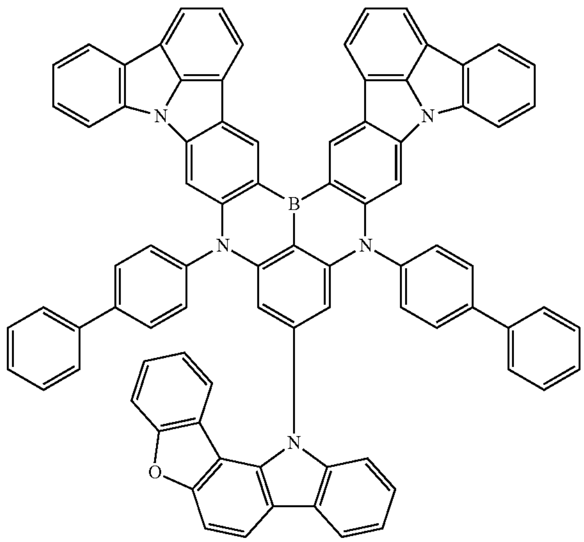
205
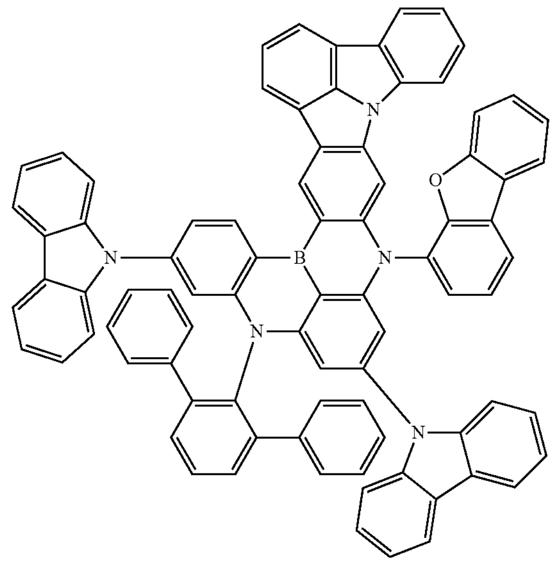
206
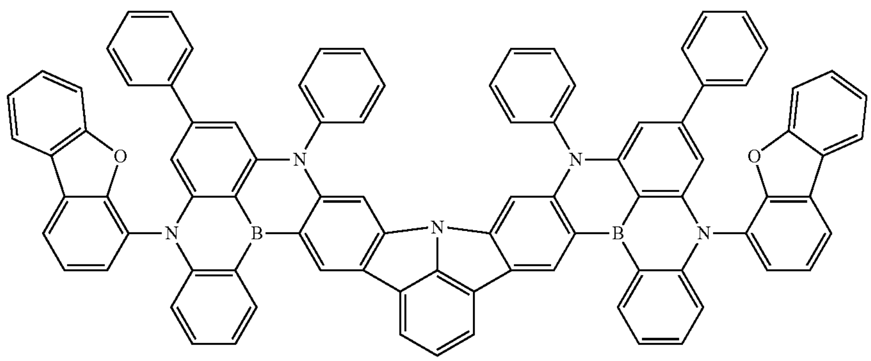
207
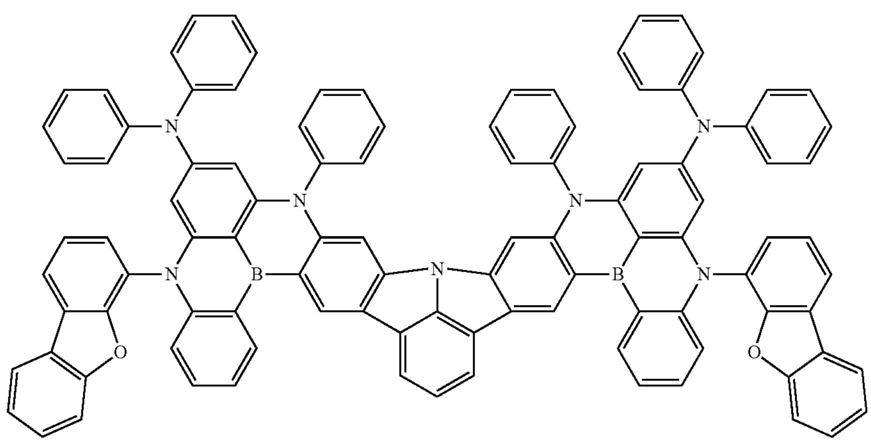

-continued
208
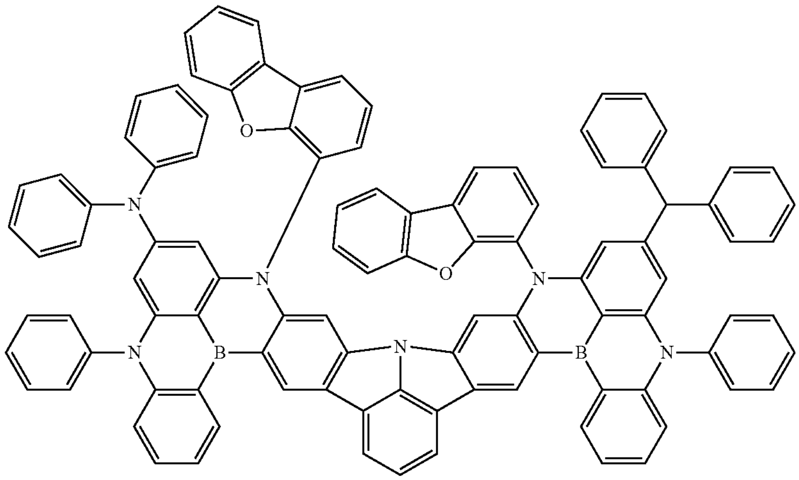
209
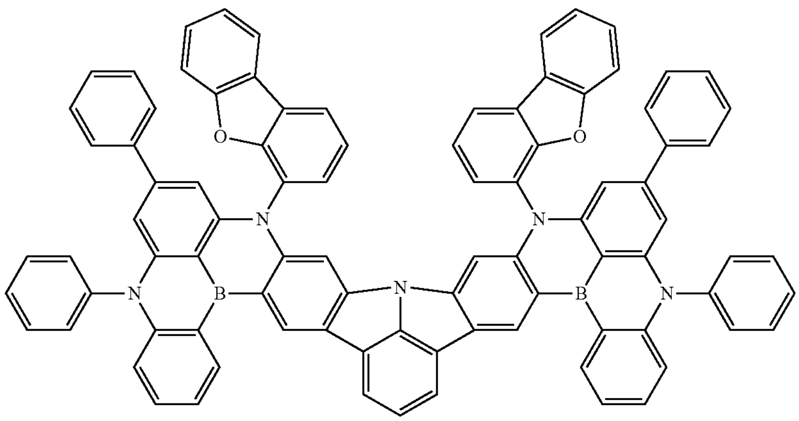
210
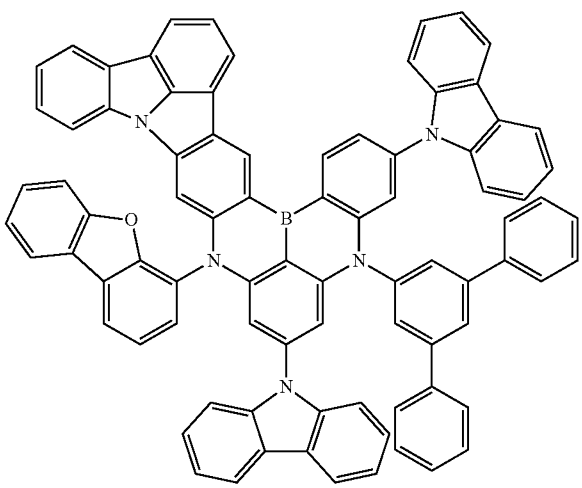
211
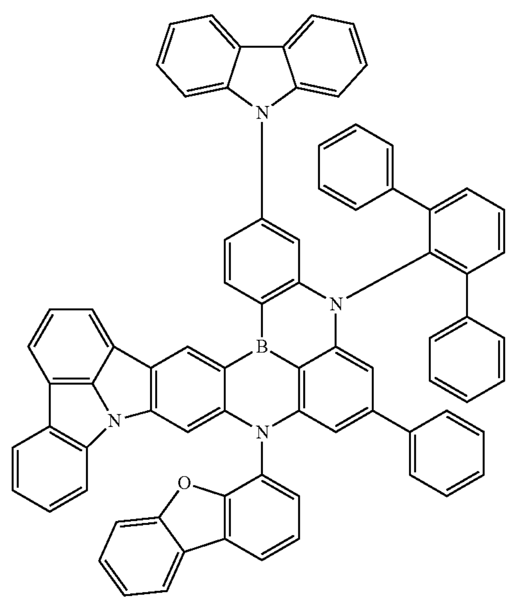

-continued

212

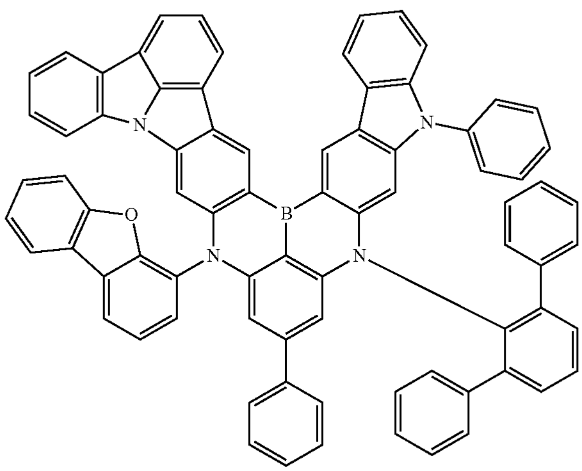

213

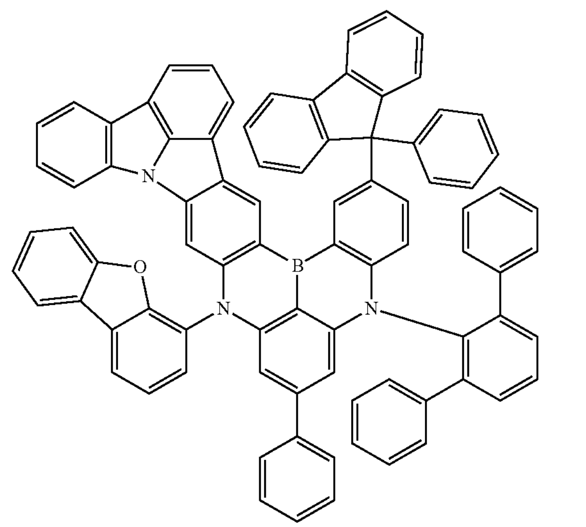

214

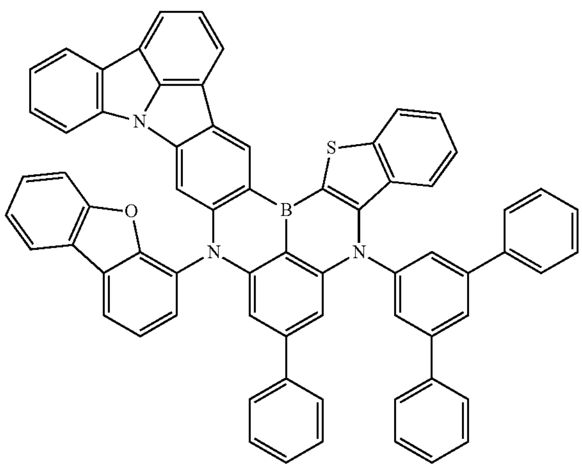

215

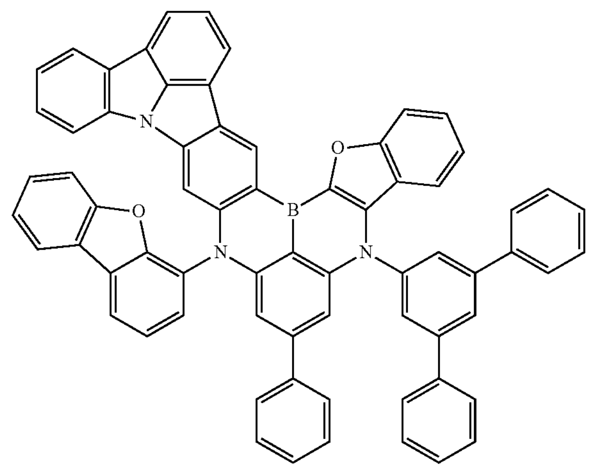

216

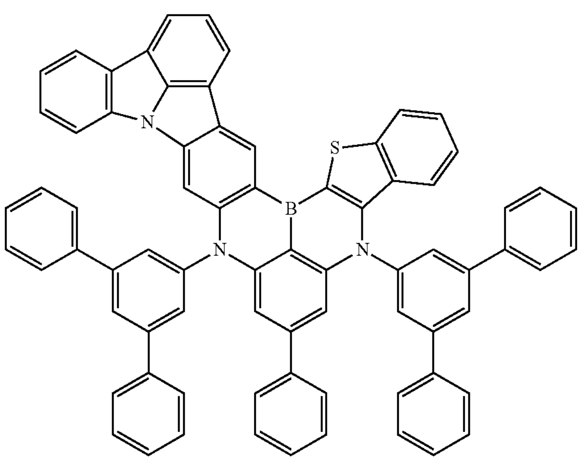

217

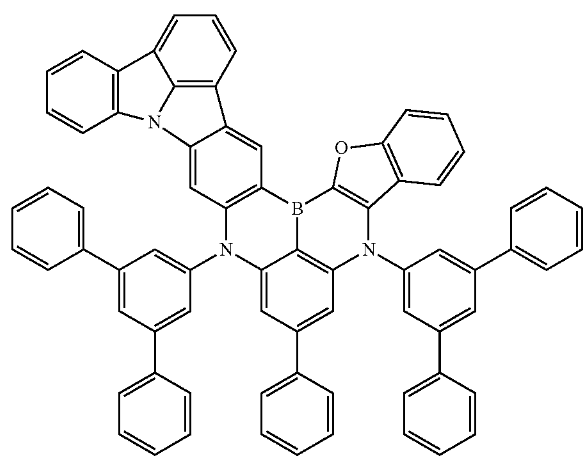

In Compound Group 1, D is a deuterium atom.

The polycyclic compound of an embodiment represented by Formula 1 may be used as a fluorescent light emitting material or a thermally activated delayed fluorescence (TADF) material. For example, the polycyclic compound of an embodiment may be used as a light emitting dopant emitting blue light. The polycyclic compound of an embodiment may be used as a TADF dopant material. In an embodiment, the emission layer EML including the polycyclic compound may emit delayed fluorescence.

The polycyclic compound of an embodiment may be a light emitting material having a central light emission wavelength (λmax) equal to or less than about 490 nm. For example, the polycyclic compound of an embodiment represented by Formula 1 may be a light emitting material having a central light emission wavelength in a range of about 460 nm to about 490 nm. For example, the polycyclic compound of an embodiment may be a blue thermally activated delayed fluorescent dopant. However, embodiments are not limited thereto.

In the light emitting diode ED of the embodiment shown in FIGS. 3 to 6, the emission layer EML may include a host and a dopant, and the emission layer EML may include the polycyclic compound of an embodiment as a dopant.

In an embodiment, the emission layer EML of the light emitting diode ED may include a host, an assistant dopant, and a light emitting dopant, and the light emitting dopant may include the polycyclic compound of an embodiment, and the assistant dopant may include a compound represented by Formula A.

[Formula A]

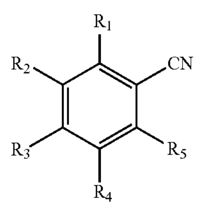

In Formula A, at least one of $R_1$ to $R_5$ may be a substituted or unsubstituted carbazole derivative, and the remainder of $R_1$ to $R_5$ may each independently be a hydrogen atom, a deuterium atom, a hydroxy group, or a cyano group. In an embodiment, in Formula A, the substituted or unsubstituted carbazole derivative may be a group represented by any one of Cz-1 to Cz-5.

Cz-1

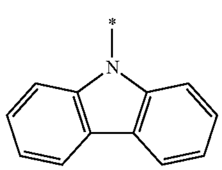

Cz-2

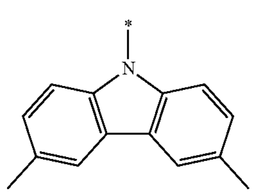

Cz-3

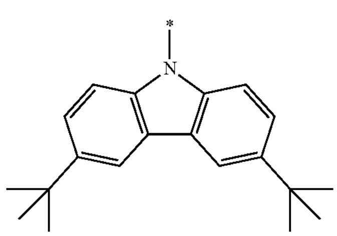

-continued

Cz-4

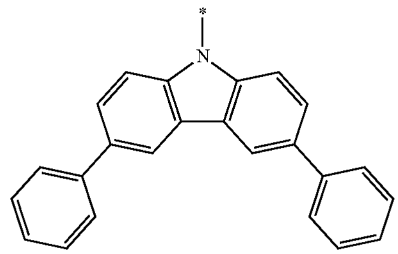

Cz-5

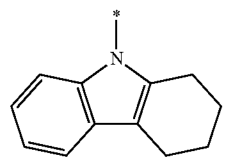

The compound represented by Formula A may be any one selected from Compound Group AD. In an embodiment, the light emitting diode ED may include at least one of the compounds of Compound Group AD as an assistant dopant. For example, in an embodiment, the assistant dopant may include Compound AD-1.

[Compound Group AD]

AD-1

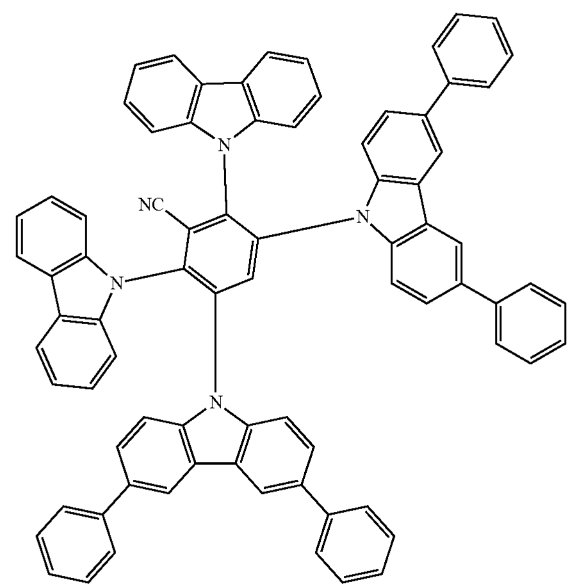

AD-2

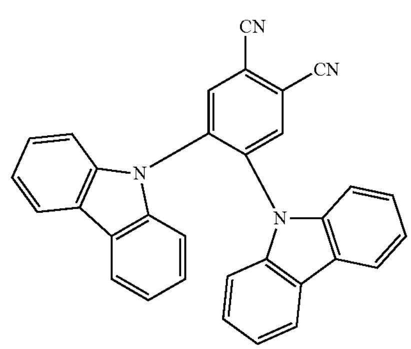

-continued
AD-3
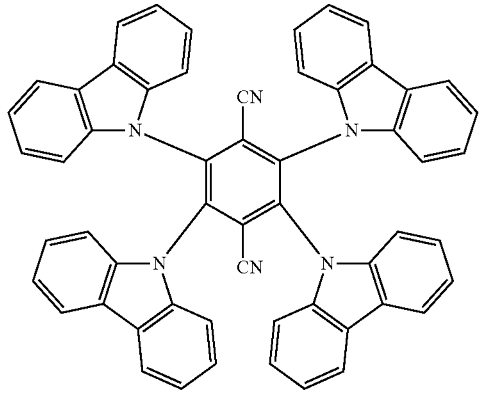
AD-4
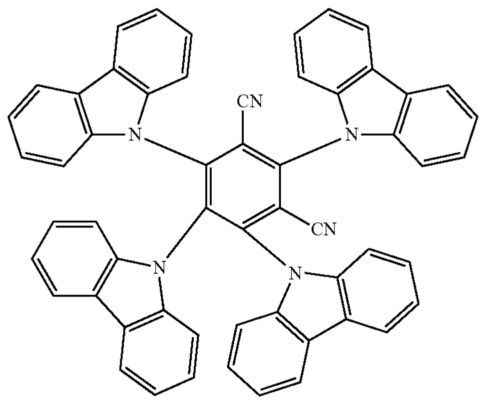
AD-5
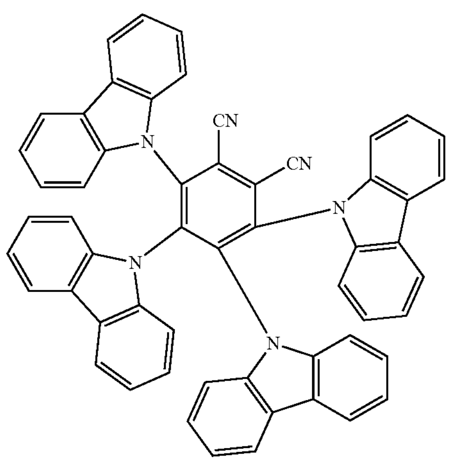
AD-6
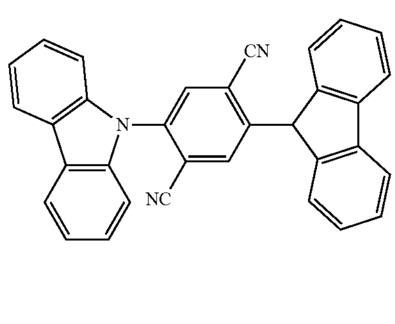
-continued
AD-7
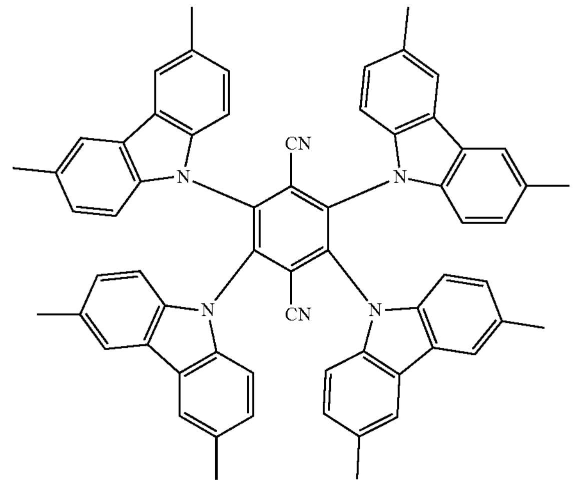
AD-8
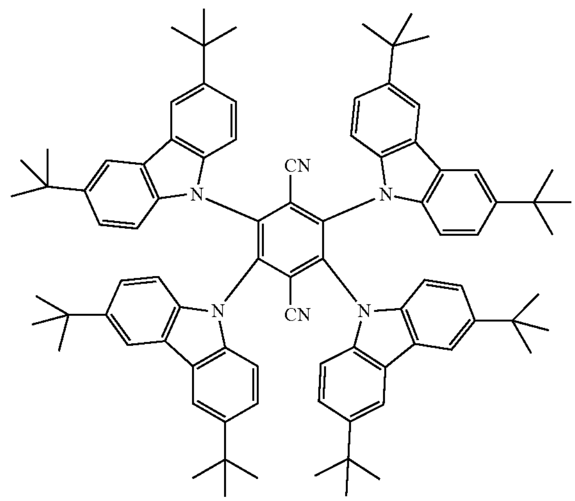
AD-9
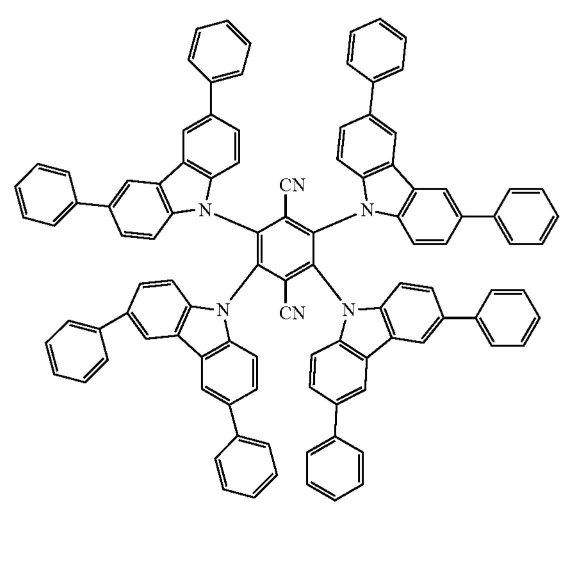

-continued

AD-10

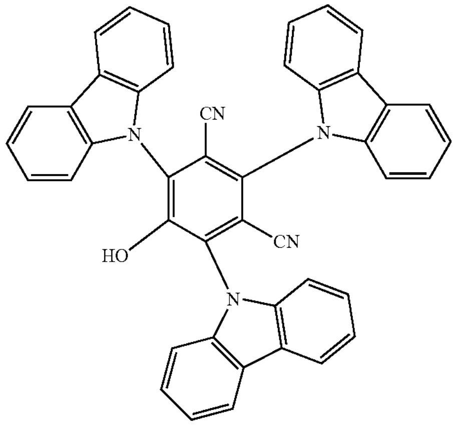

AD-11

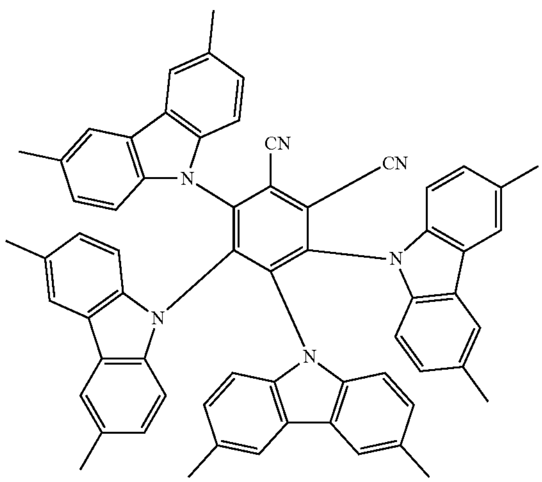

AD-12

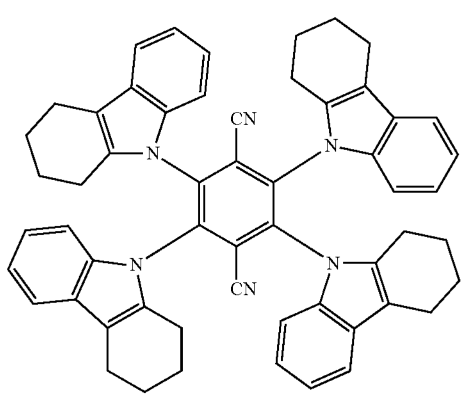

In the light emitting diode ED of an embodiment, the assistant dopant included in the emission layer EML may transfer energy to the light emitting dopant to increase the rate at which the light emitting dopant emits fluorescence. The material used as the assistant dopant in an embodiment is not limited to Compound Group AD, and any material capable of transferring energy of a host to the polycyclic compound of an embodiment, which is a light emitting dopant, may be used without limitation.

In the light emitting diode ED of an embodiment, the emission layer EML may further include a compound represented by Formula E-1. For example, the compound represented by Formula E-1 may be included as a fluorescent host material.

[Formula E-1]

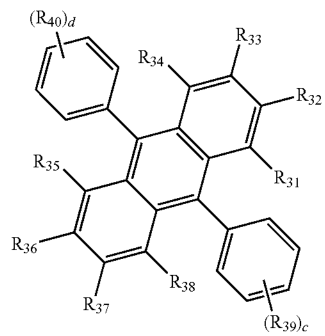

In Formula E-1, $R_{31}$ to $R_{40}$ may each independently be a hydrogen atom, a deuterium atom, a halogen atom, a substituted or unsubstituted silyl group, a substituted or unsubstituted thio group, a substituted or unsubstituted oxy group, a substituted or unsubstituted alkyl group having 1 to 10 carbon atoms, a substituted or unsubstituted alkenyl group having 2 to 10 carbon atoms, a substituted or unsubstituted aryl group having 6 to 30 ring-forming carbon atoms, a substituted or unsubstituted heteroaryl group having 2 to 30 ring-forming carbon atoms, or may be bonded to an adjacent group to form a ring. In Formula E-1, $R_{31}$ to $R_{40}$ may be bonded to an adjacent group to form a saturated hydrocarbon ring, an unsaturated hydrocarbon ring, a saturated heterocycle, or an unsaturated heterocycle.

In Formula E-1, c and d may each independently be an integer from 0 to 5.

The compound represented by Formula E-1 may be any one selected from

Compound E1 to E19

E1

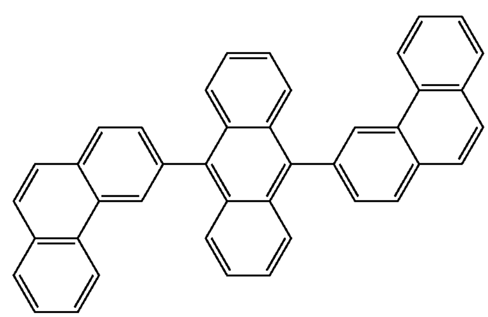

E2

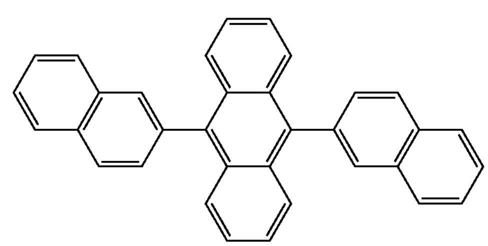

-continued
E3
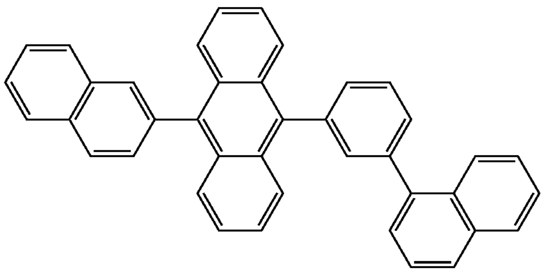
E4
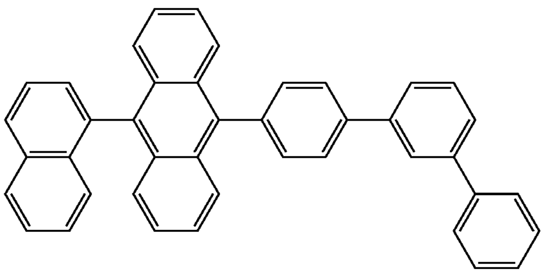
E5
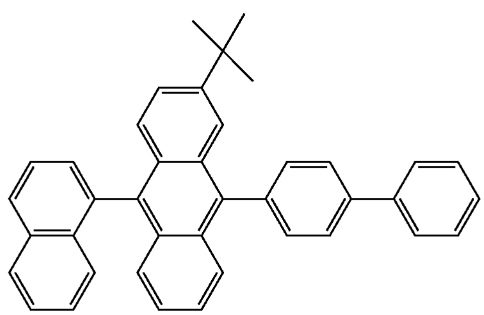
E6
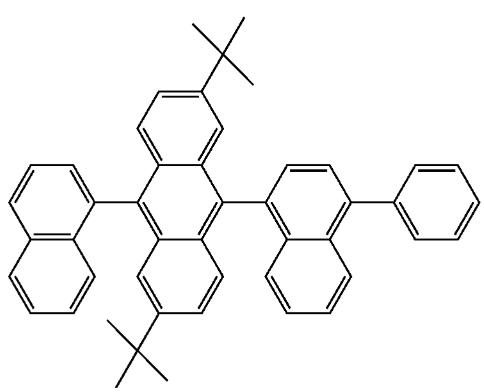
E7
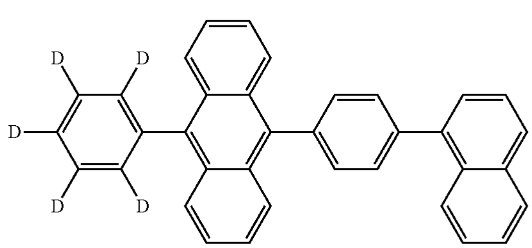
-continued
E8
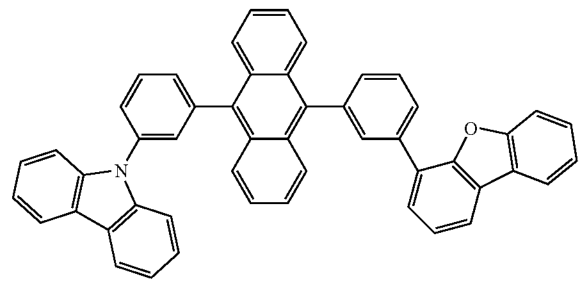
E9
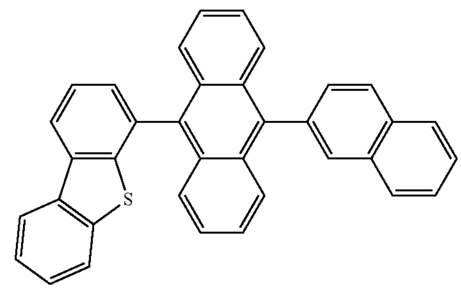
E10
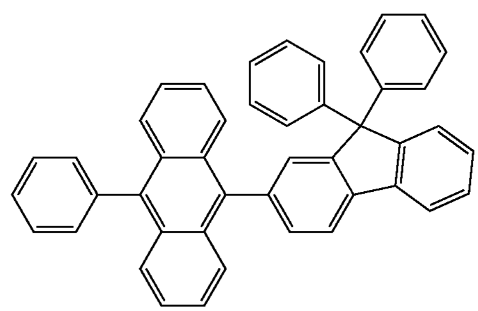
E11
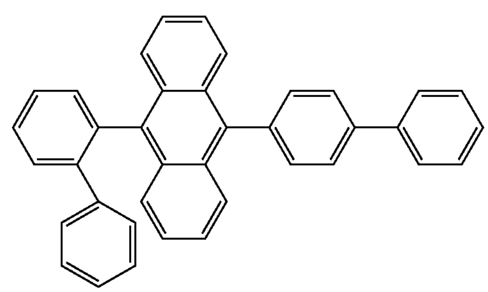
E12
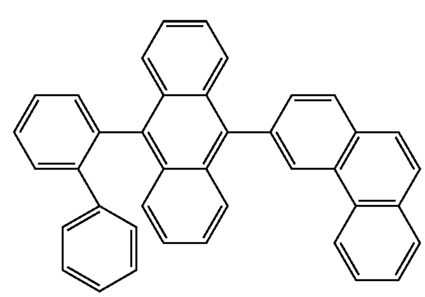

-continued
E13
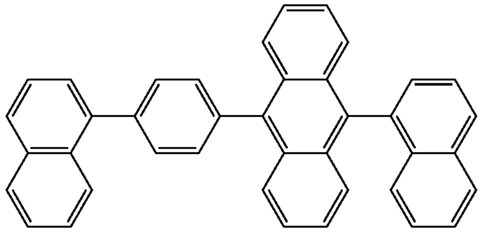
E14
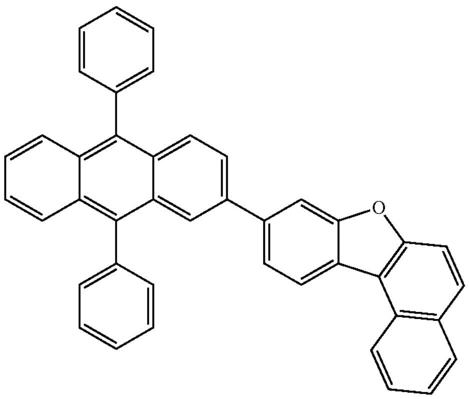
E15
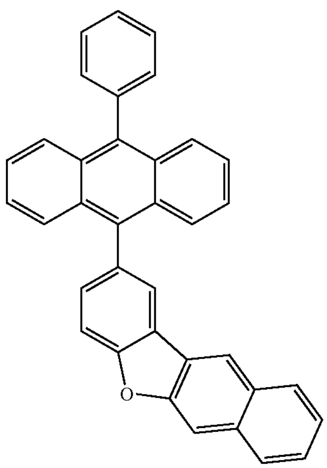
E16
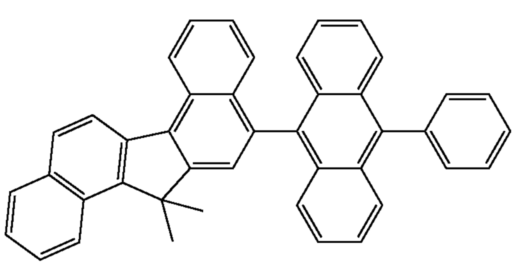
-continued
E17
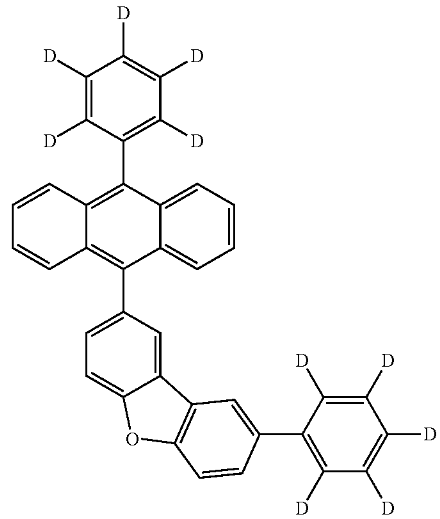
E18
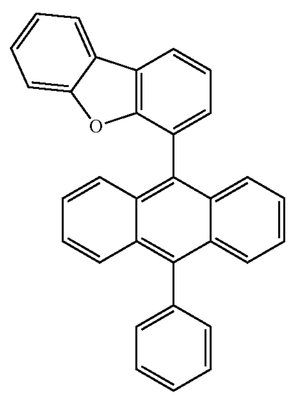
E19
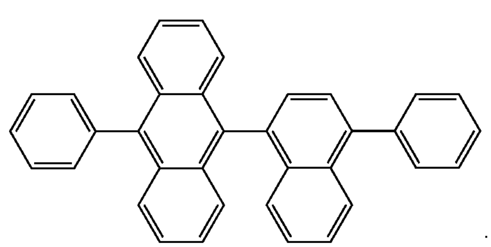
In an embodiment, the emission layer EML may include a compound represented by Formula E-2a or Formula E-2b. The compound represented by Formula E-2a or Formula E-2b may be used as a phosphorescent host material.

[Formula E-2a]

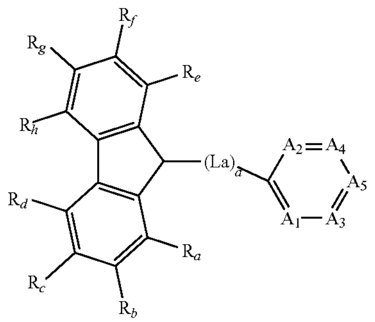

In Formula E-2a, a may be an integer from 0 to 10, and $L_a$ may be a direct linkage, a substituted or unsubstituted arylene group having 6 to 30 ring-forming carbon atoms, or a substituted or unsubstituted heteroarylene group having 2 to 30 ring-forming carbon atoms. When a is 2 or greater, multiple $L_a$ groups may each independently be a substituted or unsubstituted arylene group having 6 to 30 ring-forming carbon atoms, or a substituted or unsubstituted heteroarylene group having 2 to 30 ring-forming carbon atoms.

In Formula E-2a, $A_1$ to $A_5$ may N or $C(R_i)$. $R_a$ to $R_i$ may each independently be a hydrogen atom, a deuterium atom, a substituted or unsubstituted amine group, a substituted or unsubstituted thio group, a substituted or unsubstituted oxy group, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, a substituted or unsubstituted heteroaryl group having 2 to 30 ring-forming carbon atoms, or may be bonded to an adjacent group to form a ring. $R_a$ to $R_i$ may be bonded to an adjacent group to form a hydrocarbon ring or a heterocycle containing N, O, S, etc. as a ring-forming atom.

In Formula E-2a, two or three of $A_1$ to $A_5$ may be N, and the remainder of $A_1$ to $A_5$ may be $C(R_i)$.

[Formula E-2b]

$$(\mathrm{Cbz1})\!-\!(L_b)_b\!-\!(\mathrm{Cbz2})$$

In Formula E-2b, Cbz1 and Cbz2 may each independently be an unsubstituted carbazole group or an aryl-substituted carbazole group having 6 to 30 ring-forming carbon atoms. $L_b$ may be a direct linkage, a substituted or unsubstituted arylene group having 6 to 30 ring-forming carbon atoms, or a substituted or unsubstituted heteroarylene group having 2 to 30 ring-forming carbon atoms. In Formula E-2b, b may be an integer from 0 to 10, and when b is 2 or greater, multiple $L_b$ groups may each independently be a substituted or unsubstituted arylene group having 6 to 30 ring-forming carbon atoms, or a substituted or unsubstituted heteroarylene group having 2 to 30 ring-forming carbon atoms.

The compound represented by Formula E-2a or Formula E-2b may be any one selected from Compound Group E-2. However, the compounds listed in Compound Group E-2 are presented only as examples, and the compound represented by Formula E-2a or Formula E-2b is not limited to Compound Group E-2.

[Compound Group E-2]

E-2-1

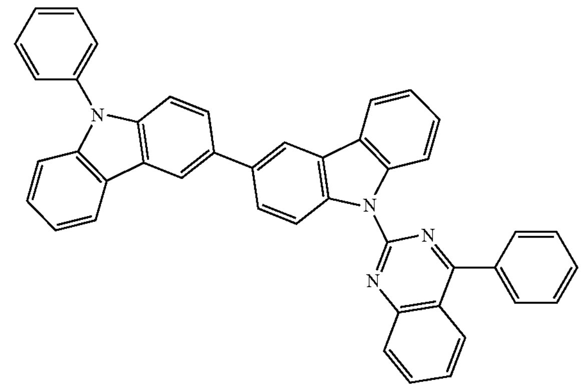

E-2-2

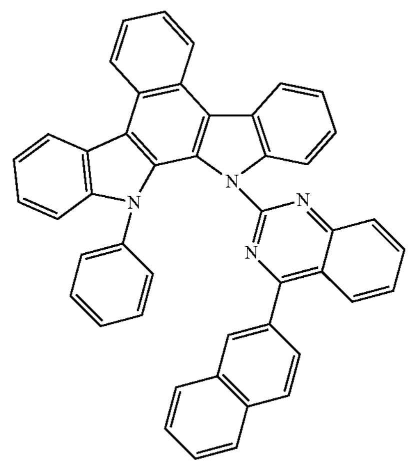

E-2-3

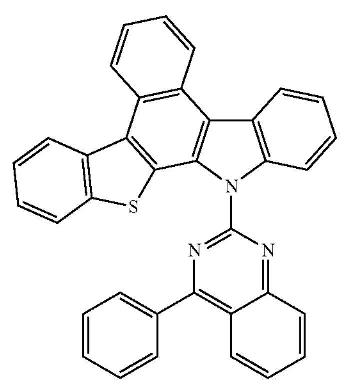

E-2-4
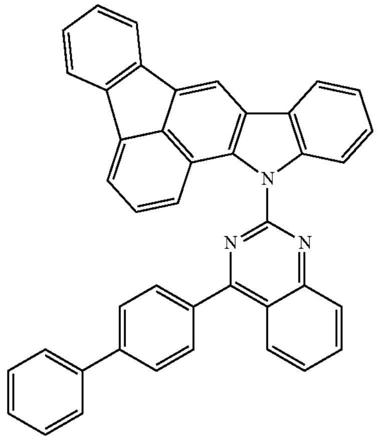
E-2-5
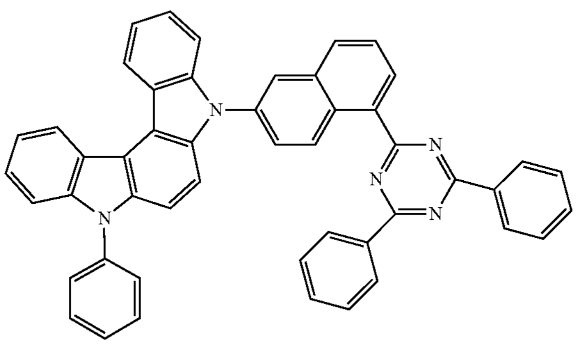
E-2-6
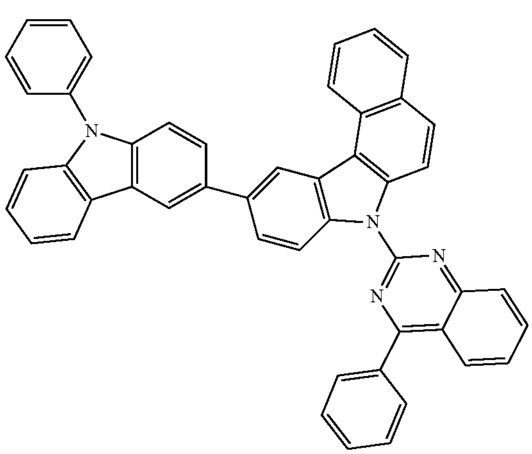
E-2-7
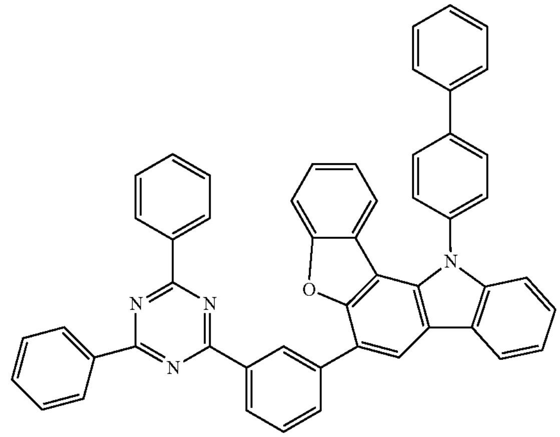
E-2-8
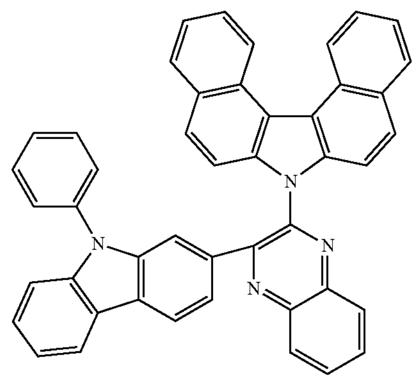
E-2-9
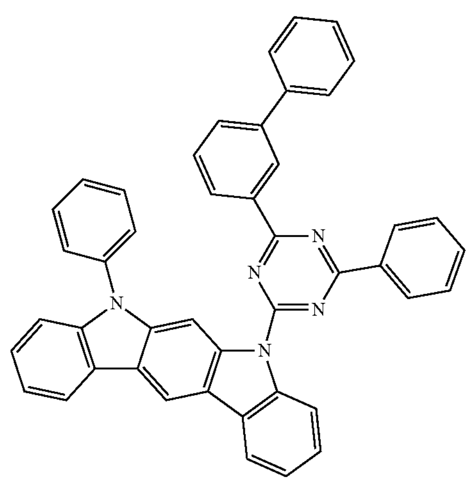

-continued
E-2-10
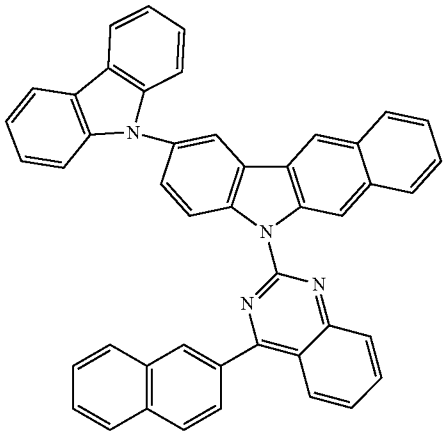
E-2-11
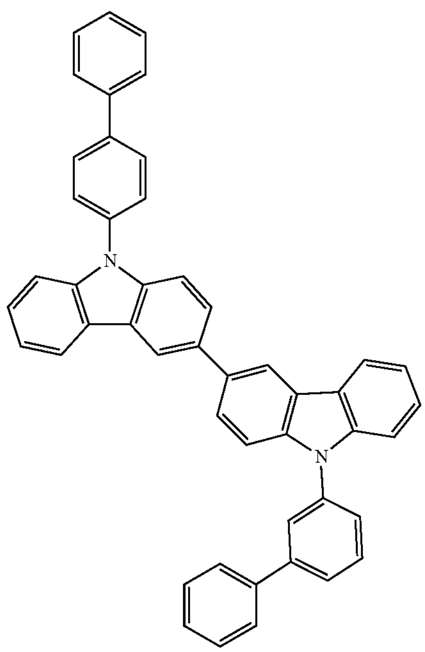
E-2-12
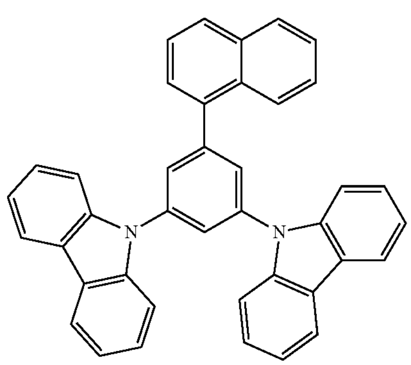
-continued
E-2-13
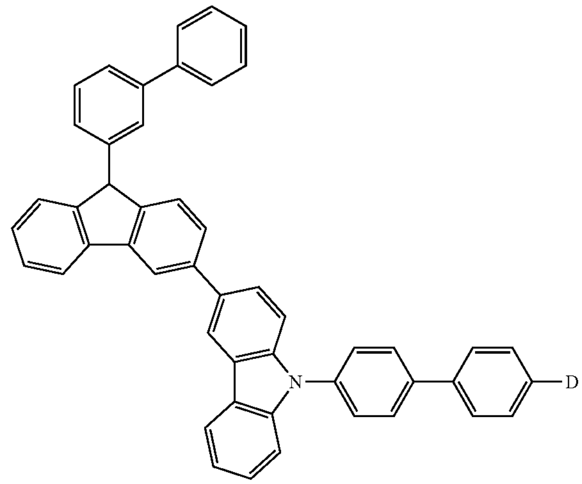
E-2-14
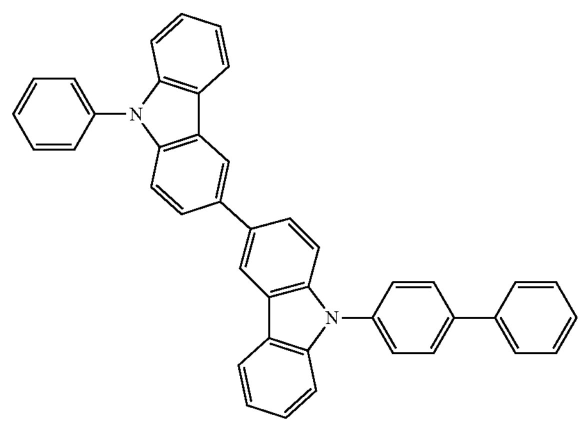
E-2-15
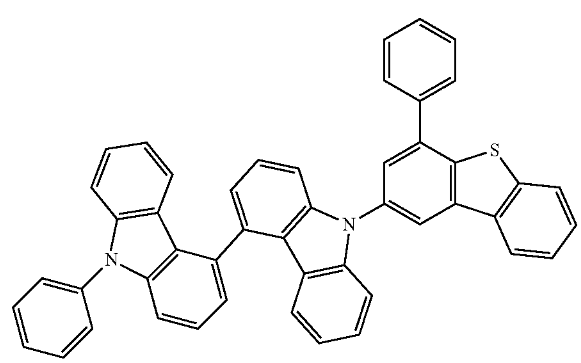

E-2-16
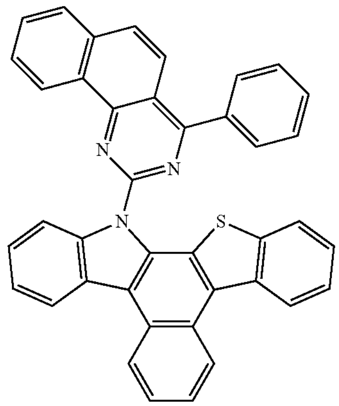
E-2-17
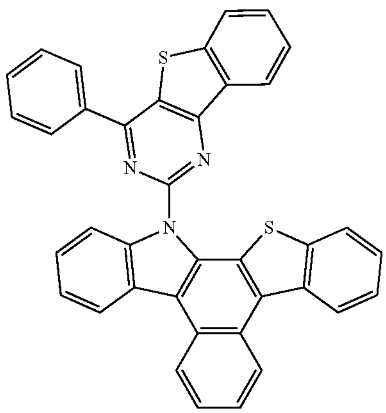
E-2-18
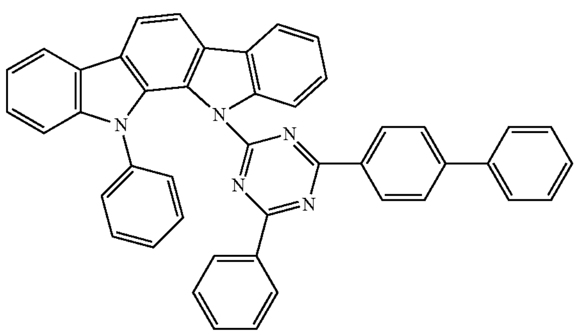
E-2-19
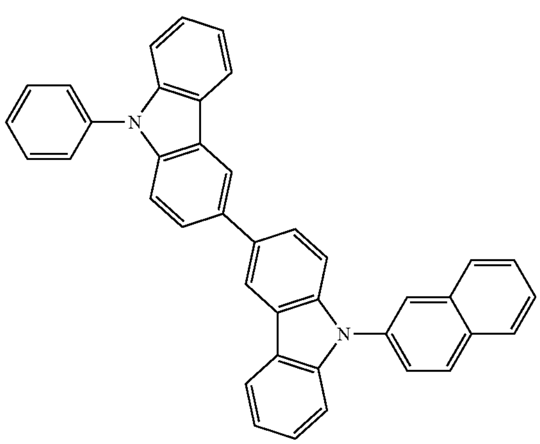
E-2-20
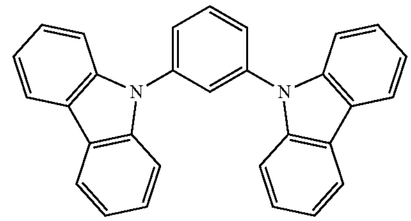
E-2-21
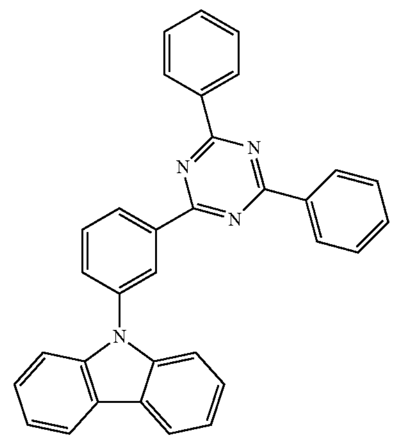
E-2-22
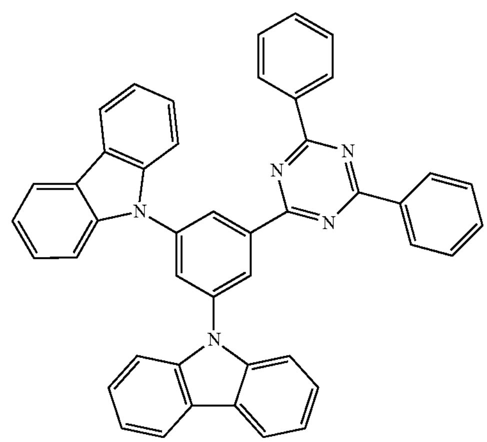
E-2-23
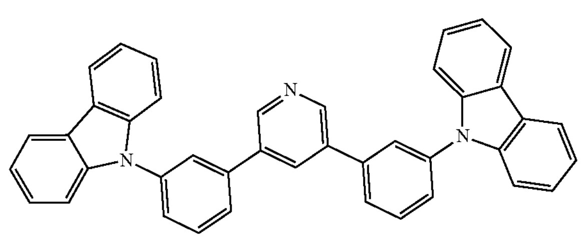

-continued

E-2-24

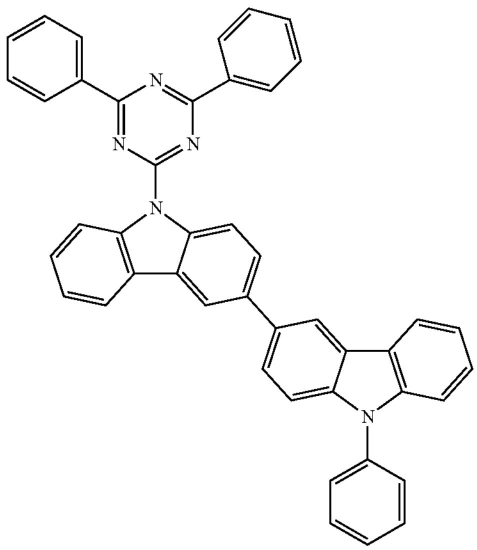

The emission layer EML may further include a general material of the art as a host material. For example, the emission layer EML may include, as a host material, at least one among bis(4-(9H-carbazol-9-yl)phenyl)diphenylsilane (BCPDS), (4-(1-(4-(diphenylamino)phenyl)cyclohexyl)phenyl)diphenyl-phosphine oxide (POPCPA), bis[2-(diphenylphosphino)phenyl]ether oxide (DPEPO), 4,4'-bis(N-carbazolyl)-1,1'-biphenyl (CBP), 1,3-bis(carbazolyl-9-yl) benzene (mCP), 2,8-bis(diphenylphosphoryl)dibenzofuran (PPF), 4,4',4"-tris(carbazol-9-yl)-triphenylamine (TCTA), and 1,3,5-tris(1-phenyl-1H-benzo[d]imidazol-2-yl)benzene (TPBi). However, embodiments are not limited thereto, and for example, tris(8-hydroxyquinolino)aluminum ($Alq_3$), 9,10-di(naphthalene-2-yl)anthracene (ADN), 3-tert-butyl-9,10-di(naphth-2-yl)anthracene (TBADN), distyrylarylene (DSA), 4,4'-bis(9-carbazolyl)-2,2'-dimethyl-biphenyl (CDBP), 2-methyl-9,10-bis(naphthalen-2-yl)anthracene (MADN), hexaphenyl cyclotriphosphazene (CP1), 1,4-bis(triphenylsilyl)benzene (UGH2), hexaphenylcyclotrisiloxane ($DPSiO_3$), octaphenylcyclotetrasiloxane ($DPSiO_4$), etc. may be used as a host material.

The emission layer EML may include a compound represented by Formula M-a or Formula M-b. The compound represented by Formula M-a or Formula M-b below may be used as a phosphorescent dopant material. In an embodiment, the compound represented by Formula M-a or Formula M-b may be used as an assistant dopant material.

[Formula M-a]

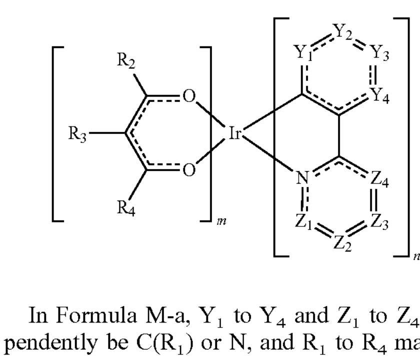

In Formula M-a, $Y_1$ to $Y_4$ and $Z_1$ to $Z_4$ may each independently be $C(R_1)$ or N, and $R_1$ to $R_4$ may each independently be a hydrogen atom, a deuterium atom, a substituted or unsubstituted amine group, a substituted or unsubstituted thio group, a substituted or unsubstituted oxy group, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, a substituted or unsubstituted heteroaryl group having 2 to 30 ring-forming carbon atoms, or may be bonded to an adjacent group to form a ring. In Formula M-a, m may be 0 or 1, and n may be 2 or 3. In Formula M-a, when m is 0, n may be 3, and when m is 1, n may be 2.

The compound represented by Formula M-a may be used as a phosphorescent dopant.

The compound represented by Formula M-a may be any one selected from Compounds M-a1 to M-a25. However, Compounds M-a1 to M-a25 are presented only as examples, and the compound represented by Formula M-a is not limited to Compounds M-a1 to M-a25.

M-a1

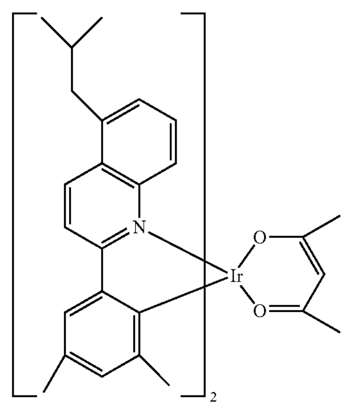

M-a2

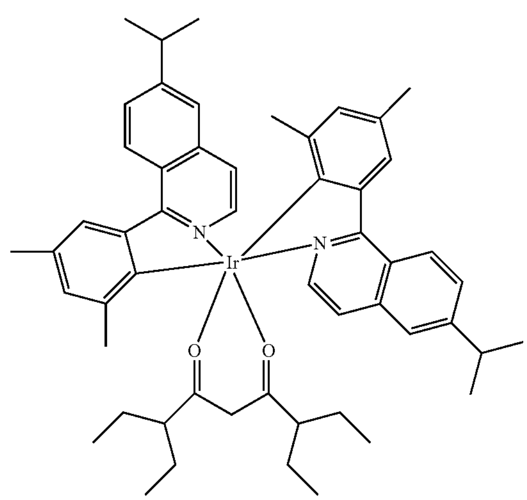

-continued
M-a3
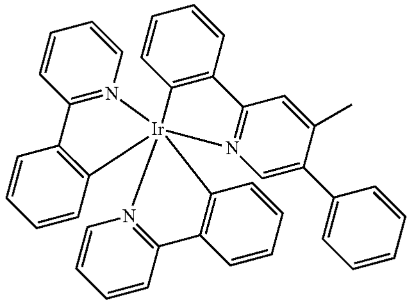
M-a4
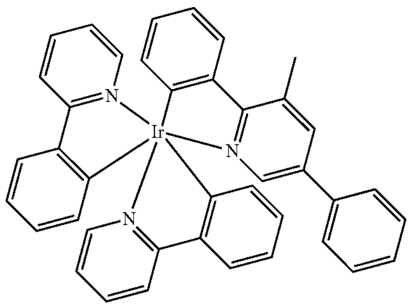
M-a5
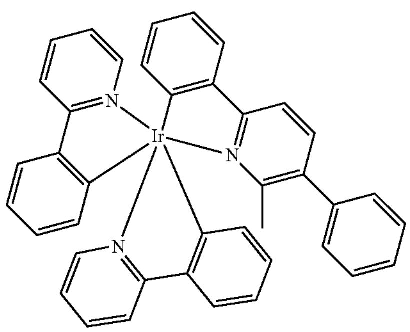
M-a6
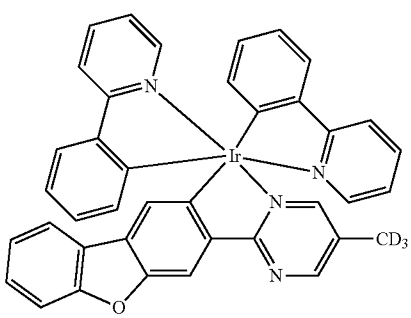
M-a7
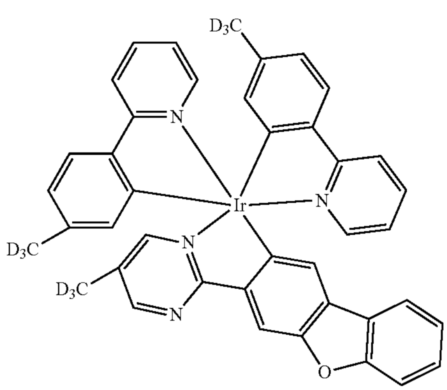
-continued
M-a8
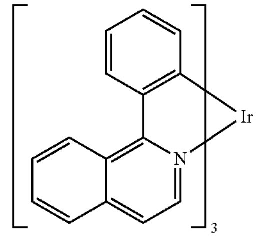
M-a9
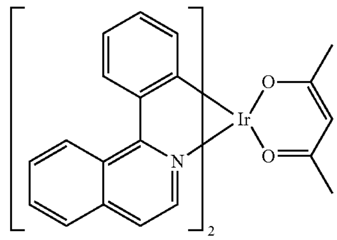
M-a10
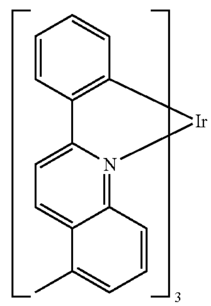
M-a11
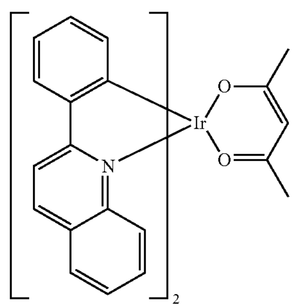
M-a12
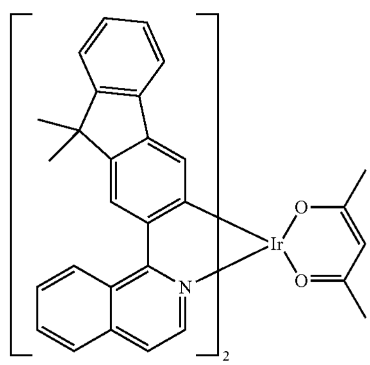

M-a13
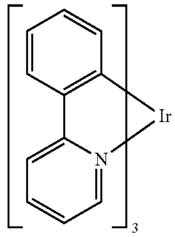
M-a14
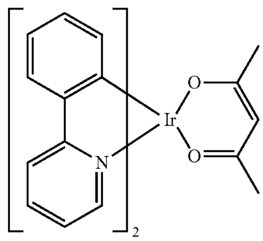
M-a15
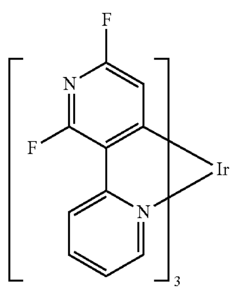
M-a16
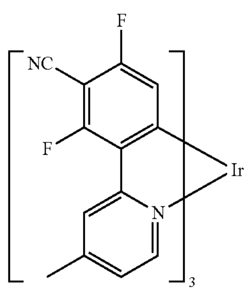
M-a17
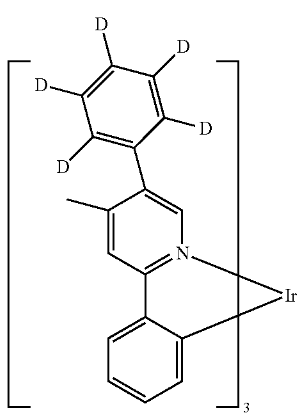
M-a18
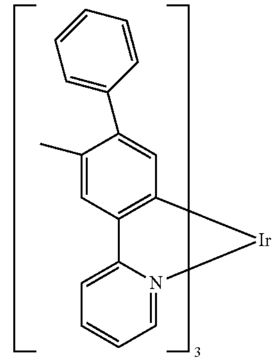
M-a19
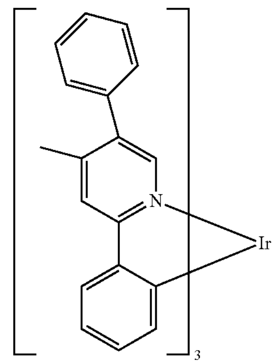
M-a20
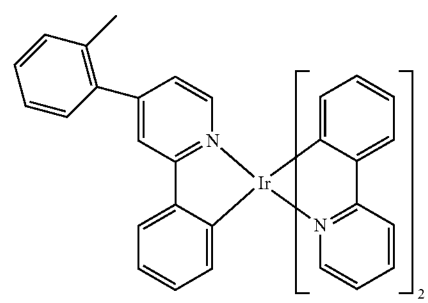
M-a21
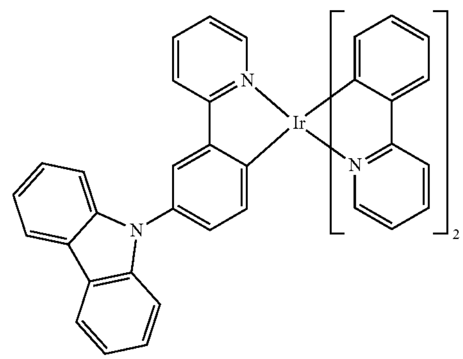

-continued

M-a22

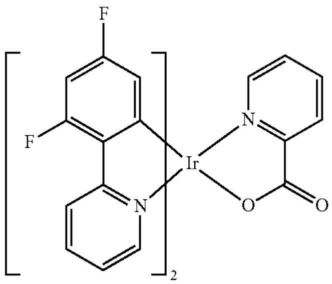

M-a23

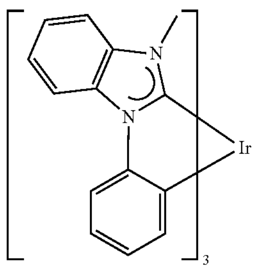

M-a24

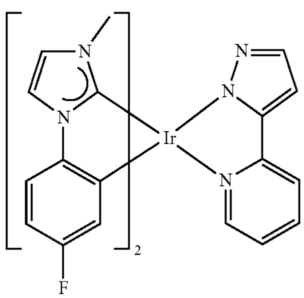

M-a25

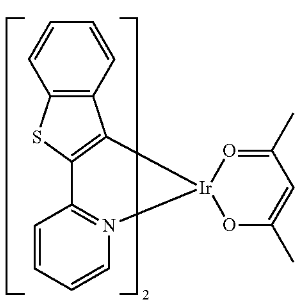

Compound M-a1 and Compound M-a2 may be used as a red dopant material, and Compounds M-a3 to M-a7 may be used as a green dopant material.

[Formula M-b]

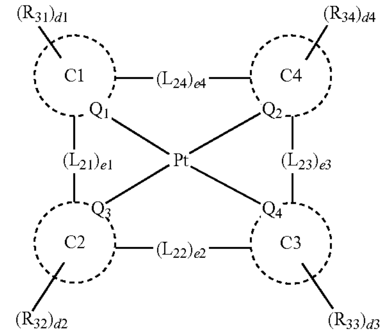

In Formula M-b, $Q_1$ to $Q_4$ may each independently be C or N, and C1 to C4 may each independently be a substituted or unsubstituted hydrocarbon ring having 5 to 30 ring-forming carbon atoms, or a substituted or unsubstituted heterocycle having 2 to 30 ring-forming carbon atoms. In Formula M-b, $L_{21}$ to $L_{24}$ may each independently be a direct linkage,

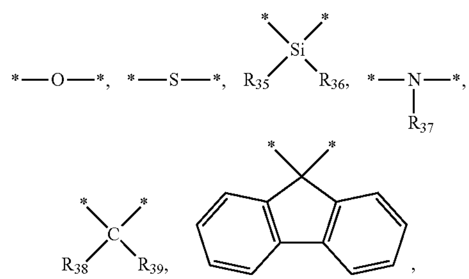

a substituted or unsubstituted divalent alkyl group having 1 to 20 carbon atoms, a substituted or unsubstituted arylene group having 6 to 30 ring-forming carbon atoms, or a substituted or unsubstituted heteroarylene group having 2 to 30 ring-forming carbon atoms, and e1 to e4 may each independently be 0 or 1. In Formula M-b, $R_{31}$ to $R_{39}$ may each independently be a hydrogen atom, a deuterium atom, a halogen atom, a cyano group, a substituted or unsubstituted amine group, a substituted or unsubstituted alkyl group having 1 to 20 carbon atoms, a substituted or unsubstituted aryl group having 6 to 30 ring-forming carbon atoms, a substituted or unsubstituted heteroaryl group having 2 to 30 ring-forming carbon atoms, or may be bonded to an adjacent group to form a ring, and d1 to d4 may each independently be an integer from 0 to 4.

The compound represented by Formula M-b may be used as a blue phosphorescent dopant or as a green phosphorescent dopant. In an embodiment, the compound represented by Formula M-b may be further included as an assistant dopant in the emission layer EML The compound represented by Formula M-b may be any one selected from Compound M-b-1 to Compound M-b-11. However, Compound M-b-1 to Compound M-b-11 are presented only as examples, and the compound represented by Formula M-b is not limited to Compound M-b-1 to Compound M-b-11.

-continued
M-b-1
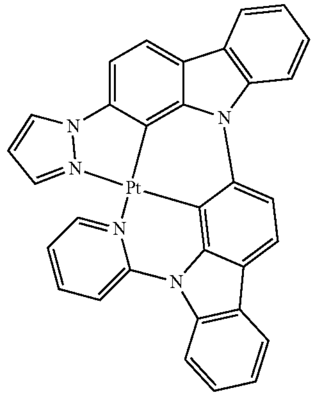
M-b-2
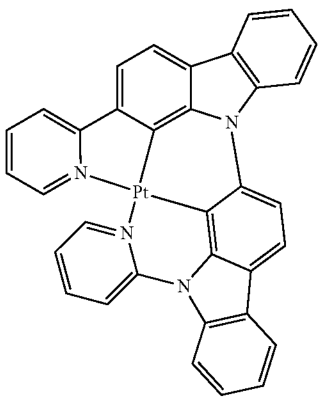
M-b-3
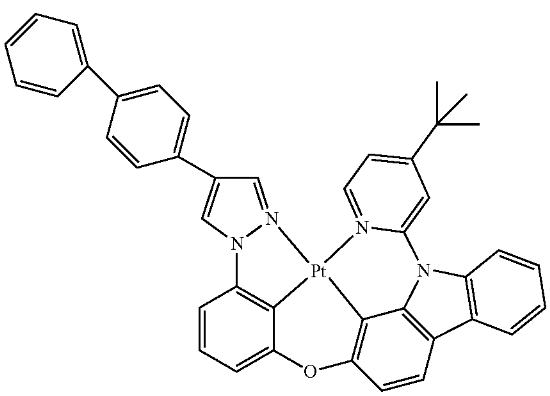
M-b-4
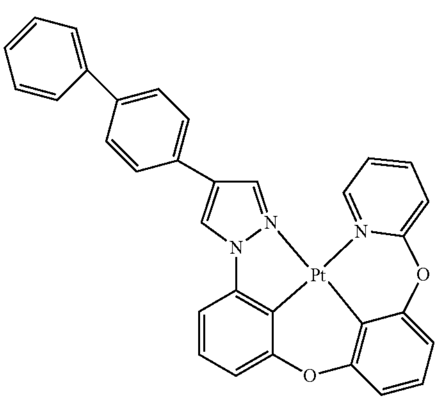
M-b-5
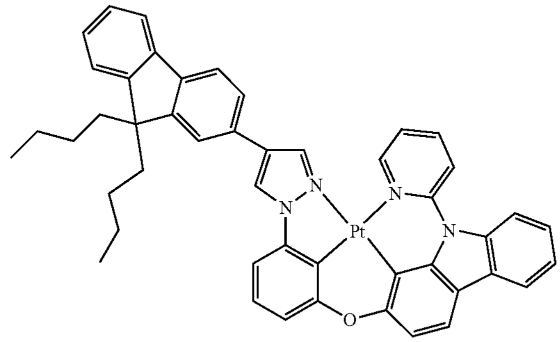
M-b-6
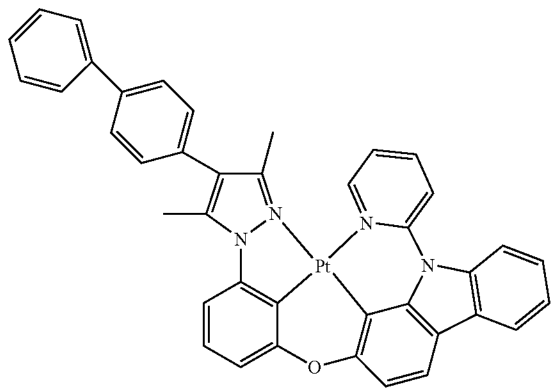
M-b-7
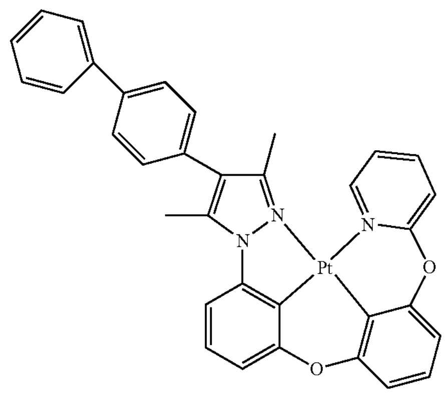
M-b-8
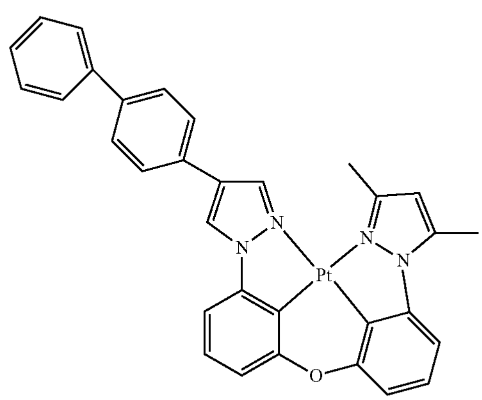

-continued

M-b-9

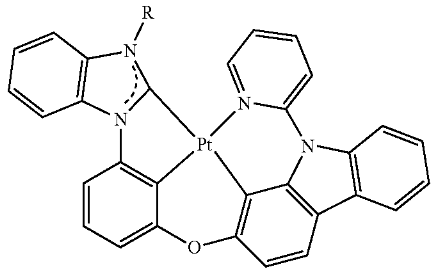

M-b-10

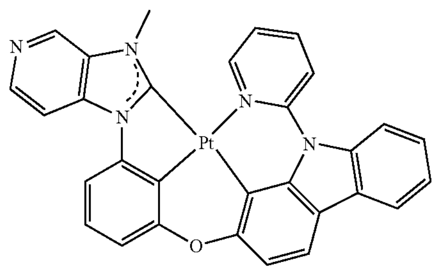

M-b-11

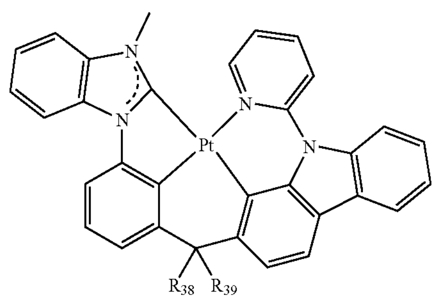

In Compound M-b-1 to Compound M-b-11, R, $R_{38}$, and $R_{39}$ may each independently be a hydrogen atom, a deuterium atom, a halogen atom, a cyano group, a substituted or unsubstituted amine group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms.

The emission layer EML may further include a compound represented by any one of Formulas F-a to F-c. The compounds represented by Formulas F-a to F-c may be used as a fluorescent dopant material.

[Formula F-a]

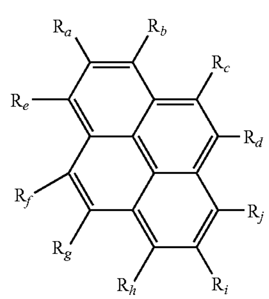

In Formula F-a, two selected from $R_a$ to $R_j$ may each independently be substituted with a group represented by $*\!-\!NAr_1Ar_2$. The remainder of $R_a$ to $R_j$ which are not substituted with the group represented by $*\!-\!NAr_1Ar_2$ may each independently be a hydrogen atom, a deuterium atom, a halogen atom, a cyano group, a substituted or unsubstituted amine group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms.

In the group represented by $*\!-\!NAr_1Ar_2$, $Ar_1$ and $Ar_2$ may each independently be a substituted or unsubstituted aryl group having 6 to 30 ring-forming carbon atoms, or a substituted or unsubstituted heteroaryl group having 2 to 30 ring-forming carbon atoms. For example, at least one of $Ar_1$ or $Ar_2$ may be a heteroaryl group containing O or S as a ring-forming atom.

[Formula F-b]

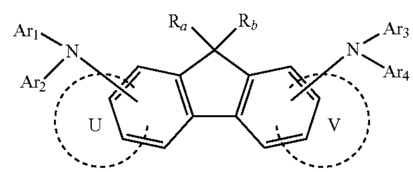

In Formula F-b, $R_a$ and $R_b$ may each independently be a hydrogen atom, a deuterium atom, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, a substituted or unsubstituted heteroaryl group having 2 to 30 ring-forming carbon atoms, or may be bonded to an adjacent group to form a ring.

In Formula F-b, U and V may each independently be a substituted or unsubstituted hydrocarbon ring having 5 to 30 ring-forming carbon atoms, or a substituted or unsubstituted heterocycle having 2 to 30 ring-forming carbon atoms.

In Formula F-b, the number of rings represented by U and V may each independently be 0 or 1. For example, in Formula F-b, when the number of U or V is 1, a condensed ring may be present at a portion indicated by U or V, and when the number of U or V is 0, a condensed ring may not be present at the portion indicated by U or V. When the number of U is 0 and the number of V is 1, or when the number of U is 1 and the number of V is 0, a condensed ring having a fluorene core of Formula F-b may be a cyclic compound having four rings. When both U and V are 0, the condensed ring of Formula F-b may be a cyclic compound having three rings. When both U and V are 1, the condensed ring having a fluorene core of Formula F-b may be a cyclic compound having five rings.

[Formula F-c]

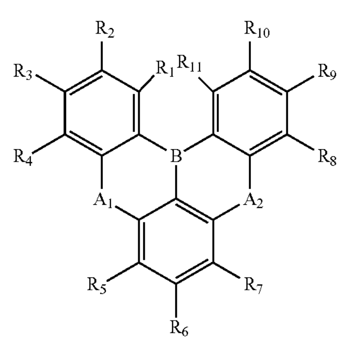

In Formula F-c, $A_1$ and $A_2$ may each independently be O, S, Se, or $N(R_m)$, and $R_m$ may be a hydrogen atom, a deuterium atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms. In Formula F-c, $R_1$ to $R_{11}$ may each independently be a hydrogen atom, a deuterium atom, a halogen atom, a cyano group, a substituted or unsubstituted amine group, a substituted or unsubstituted boryl group, a substituted or unsubstituted oxy group, a substituted or unsubstituted thio group, a substituted or unsubstituted alkyl group having 1 to 20 carbon atoms, a substituted or unsubstituted aryl group having 6 to 30 ring-forming carbon atoms, a substituted or unsubstituted heteroaryl group having 2 to 30 ring-forming carbon atoms, or may be bonded to an adjacent group to form a ring.

In Formula F-c, $A_1$ and $A_2$ may each independently be bonded to substituents of neighboring rings to form a condensed ring. For example, when $A_1$ and $A_2$ are each independently $N(R_m)$, $A_1$ may be bonded to $R_4$ or $R_5$ to form a ring. For example, $A_2$ may be bonded to $R_7$ or $R_8$ to form a ring.

The emission layer EML may include, as a dopant material, styryl derivatives (e.g., 1,4-bis[2-(3-N-ethylcarbazoryl)vinyl]benzene (BCzVB), 4-(di-p-tolylamino)-4'-[(di-p-tolylamino)styryl]stilbene (DPAVB), and N-(4-((E)-2-(6-((E)-4-(diphenylamino)styryl)naphthalen-2-yl)vinyl)phenyl)-N-phenylbenzenamine (N-BDAVBi)), perylene and derivatives thereof (e.g., 2,5,8,11-tetra-t-butylperylene (TBP)), pyrene and derivatives thereof (e.g., 1,1-dipyrene, 1,4-dipyrenylbenzene, 1,4-bis(N,N-diphenylamino)pyrene), etc.

In an embodiment, when multiple emission layers EML are included, at least one emission layer EML may include a phosphorescent dopant material. For example, as a phosphorescent dopant, a metal complex including iridium (Ir), platinum (Pt), osmium (Os), gold (Au), titanium (Ti), zirconium (Zr), hafnium (Hf), europium (Eu), and terbium (Tb), or thulium (Tm) may be used. To be specific, iridium (III) bis(4,6-difluorophenylpyridinato-N,C2') (Firpic), bis(2,4-difluorophenylpyridinato)-tetrakis(1-pyrazolyl)borate iridium(III) ($Fir_6$), platinum octaethyl porphyrin (PtOEP), etc. may be used as a phosphorescent dopant. However, embodiments are not limited thereto.

At least one emission layer EML may include a quantum dot material. The quantum dot may be a Group II-VI compound, a Group III-VI compound, a Group 1-III-VI compound, a Group III-V compound, a Group III-II-V compound, a Group IV-VI compound, a Group IV element, a Group IV compound, or a combination thereof.

The Group II-VI compound may be a binary compound selected from the group consisting of CdSe, CdTe, CdS, ZnS, ZnSe, ZnTe, ZnO, HgS, HgSe, HgTe, MgSe, MgS, and a mixture thereof; a ternary compound selected from the group consisting of CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a mixture thereof, a quaternary compound selected from the group consisting of HgZnTeS, CdZnSeS, CdZnSeTe, CdZnSTe, CdHgSeS, CdHgSeTe, CdHgSTe, HgZnSeS, HgZnSeTe, HgZnSTe, and a mixture thereof, or any combination thereof.

The Group III-VI compound may include a binary compound such as $In_2S_3$ and $In_2Se_3$; a ternary compound such as $InGaS_3$ and $InGaSe_3$; or any combination thereof.

The Group 1-III-VI compound may include a ternary compound selected from the group consisting of AgInS, $AgInS_2$, CuInS, $CuInS_2$, $AgGaS_2$, $CuGaS_2$, $CuGaO_2$, $AgGaO_2$, $AgAlO_2$, or any mixture thereof, a quaternary compound such as $AgInGaS_2$ and $CuInGaS_2$; or any combination thereof.

The Group III-V compound may be a binary compound selected from the group consisting of GaN, GaP, GaAs, GaSb, AlN, AlP, AlAs, AlSb, InN, InP, InAs, InSb, and a mixture thereof, a ternary compound selected from the group consisting of GaNP, GaNAs, GaNSb, GaPAs, GaPSb, AlNP, AlNAs, AlNSb, AlPAs, AlPSb, InGaP, InAlP, InNP, InNAs, InNSb, InPAs, InPSb, and a mixture thereof, a quaternary compound selected from the group consisting of GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a mixture thereof, or any combination thereof. The Group III-V compound may further include a Group II metal. For example, InZnP, etc. may be selected as a Group III-II-V compound.

The Group IV-VI compound may be a binary compound selected from the group consisting of SnS, SnSe, SnTe, PbS, PbSe, PbTe, and a mixture thereof, a ternary compound selected from the group consisting of SnSeS, SnSeTe, SnSTe, PbSeS, PbSeTe, PbSTe, SnPbS, SnPbSe, SnPbTe, and a mixture thereof, a quaternary compound selected from the group consisting of SnPbSSe, SnPbSeTe, SnPbSTe, and a mixture thereof, or any combination thereof. The Group IV element may be selected from the group consisting of Si, Ge, and a mixture thereof. The Group IV compound may be a binary compound selected from the group consisting of SiC, SiGe, and a mixture thereof.

A binary compound, a ternary compound, or a quaternary compound may be present in particles at a uniform concentration distribution, or may be present in particles at a partially different concentration distribution. In an embodiment, the quantum dot may have a core/shell structure in which one quantum dot surrounds another quantum dot. The core/shell structure may have a concentration gradient in which the concentration of an element present in the shell decreases towards the core.

In embodiments, a quantum dot may have a core/shell structure including a core having nano-crystals, and a shell surrounding the core. The shell of the quantum dot may be a protection layer that prevents chemical deformation of the core so as to keep semiconductor properties, and/or may be a charging layer that imparts electrophoresis properties to the quantum dot. The shell may be a single layer or multiple layers. Examples of the shell of the quantum dot may include a metal oxide, a non-metal oxide, a semiconductor compound, or a combination thereof.

For example, the metal oxide or the non-metal oxide may be a binary compound such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, NiO, or a ternary compound such as $MgAl_2O_4$, $CoFe_2O_4$, $NiFe_2O_4$, and $CoMn_2O_4$, but embodiments are not limited thereto.

The semiconductor compound may be, for example, CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, etc., but embodiments are not limited thereto.

A quantum dot may have a full width of half maximum (FWHM) of a light emission wavelength spectrum equal to or less than about 45 nm. For example, the quantum dot may have a FWHM of a light emission wavelength spectrum equal to or less than about 40 nm. For example, the quantum dot may have a FWHM of a light emission wavelength spectrum equal to or less than about 30 nm. Within these ranges, color purity or color reproducibility may be enhanced. Light emitted through such a quantum dot may be emitted in all directions, and thus a wide viewing angle may be improved.

The form of a quantum dot is not particularly limited as long as it is a form used in the art. For example, a quantum dot may have a spherical shape, a pyramidal shape, a multi-arm shape, or a cubic shape, or the quantum dot may be in the form of nanoparticles, nanotubes, nanowires, nanofibers, nanoplatelets, etc.

The quantum dot may control the colors of emitted light according to a particle size thereof, and thus the quantum dot may have various light emission colors such as blue, red, green, etc.

In the light emitting diode ED of an embodiment shown in FIGS. 3 to 6, an electron transport region ETR is provided on the emission layer EML. The electron transport region ETR may include at least one of a hole blocking layer HBL, an electron transport layer ETL, or an electron injection layer EIL, but embodiments are not limited thereto.

The electron transport region ETR may be a layer formed of a single material, a layer formed of different materials, or a multilayer structure having layers formed of different materials.

For example, the electron transport region ETR may have a single layer structure of an electron injection layer EIL or an electron transport layer ETL, or may have a single layer structure formed of an electron injection material and an electron transport material. The electron transport region ETR may have a single layer structure formed of different materials, or may have a structure in which an electron transport layer ETL/electron injection layer EIL, a hole blocking layer HBL/electron transport layer ETL/electron injection layer EIL, or an electron transport layer ETL/buffer layer (not shown)/electron injection layer EIL are stacked in it respective stated order from the emission layer EVIL, but embodiments are not limited thereto. The electron transport region ETR may have a thickness, for example, in a range of about 1,000 Å to about 1,500 Å.

The electron transport region ETR may be formed using various methods such as a vacuum deposition method, a spin coating method, a cast method, a Langmuir-Blodgett (LB) method, an inkjet printing method, a laser printing method, a laser induced thermal imaging (LITI) method, etc.

The electron transport region ETR may include a compound represented by Formula ET-1.

[Formula ET-1]

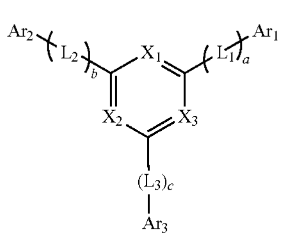

In Formula ET-1, at least one of $X_1$ to $X_3$ may be N and the remainder of $X_1$ to $X_3$ may be $C(R_a)$. $R_a$ may be a hydrogen atom, a deuterium atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms.

In Formula ET-1, $Ar_1$ to $Ar_3$ may each independently be a hydrogen atom, a deuterium atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms.

In Formula ET-1, a to c may each independently be an integer from 0 to 10. In Formula ET-1, $L_1$ to $L_3$ may each independently be a direct linkage, a substituted or unsubstituted arylene group having 6 to 30 ring-forming carbon atoms, or a substituted or unsubstituted heteroarylene group having 2 to 30 ring-forming carbon atoms. When a to c are 2 or greater, $L_1$ to $L_3$ may each independently be a substituted or unsubstituted arylene group having 6 to 30 ring-forming carbon atoms, or a substituted or unsubstituted heteroarylene group having 2 to 30 ring-forming carbon atoms.

The electron transport region ETR may include an anthracene-based compound. However, embodiments are not limited thereto, and the electron transport region ETR may include, for example, tris(8-hydroxyquinolinato)aluminum ($Alq_3$), 1,3,5-tri[(3-pyridyl)-phen-3-yl]benzene, 2,4,6-tris(3'-(pyridin-3-yl)biphenyl-3-yl)-1,3,5-triazine, 2-(4-(N-phenylbenzoimidazolyl-1-ylphenyl)-9,10-dinaphthylanthracene, 1,3,5-tri(1-phenyl-1H-benzo[d]imidazol-2-yl)benzene (TPBi), 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), bis(2-methyl-8-quinolinolato-N1,O8)-(1,1'-biphenyl-4-olato)aluminum (Balq), berylliumbis(benzoquinolin-10-olate ($Bebq_2$), 9,10-di(naphthalene-2-yl)anthracene (ADN), 1,3-bis[3,5-di(pyridin-3-yl)phenyl]benzene (BmPyPhB), diphenyl(4-(triphenylsilyl)phenyl)phosphine oxide (TSPO1), or a mixture thereof.

The electron transport region ETR may include at least one selected from Compounds ET1 to ET36.

ET1

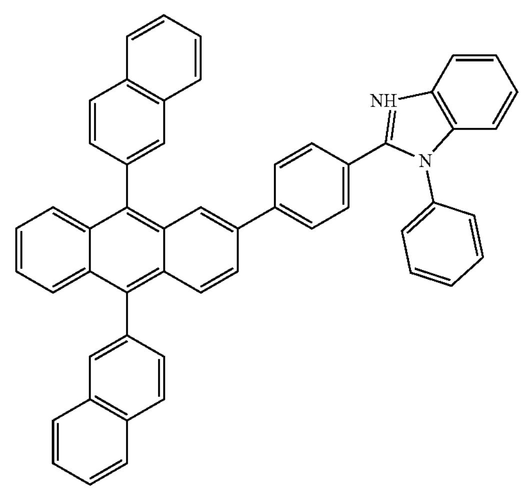

-continued
ET2
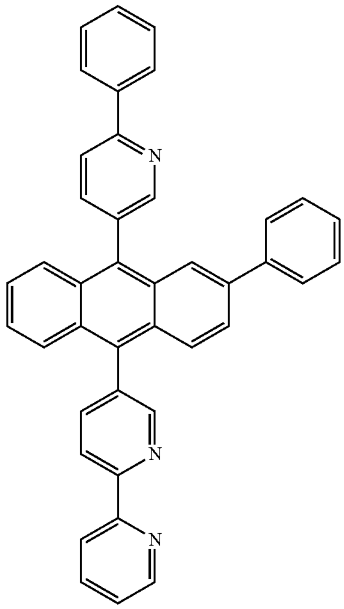
ET3
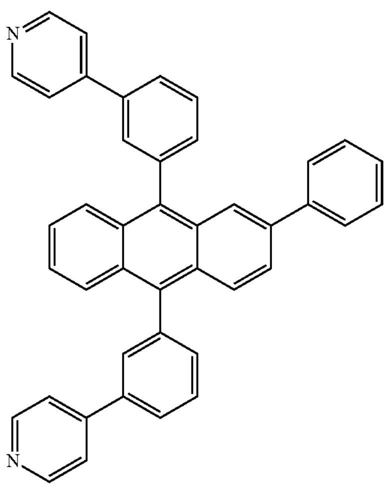
ET4
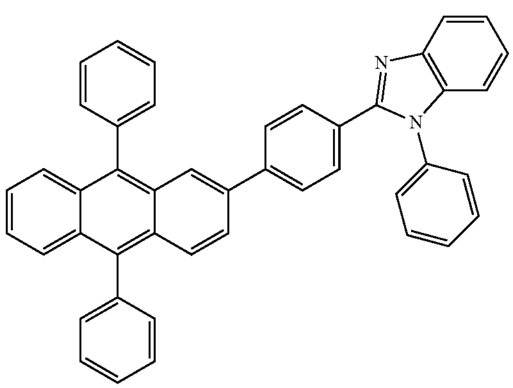
-continued
ET5
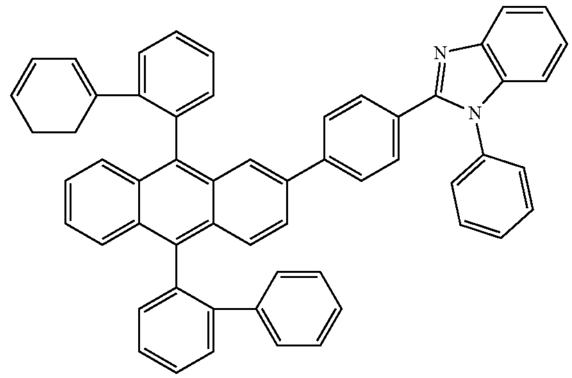
ET6
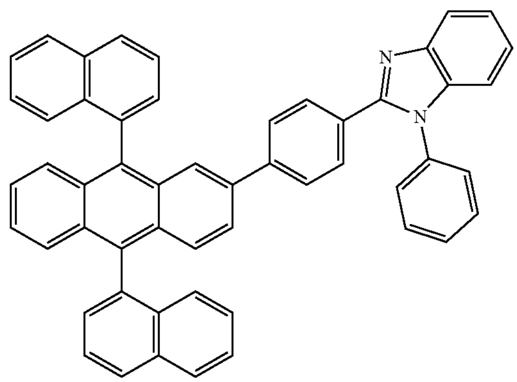
ET7
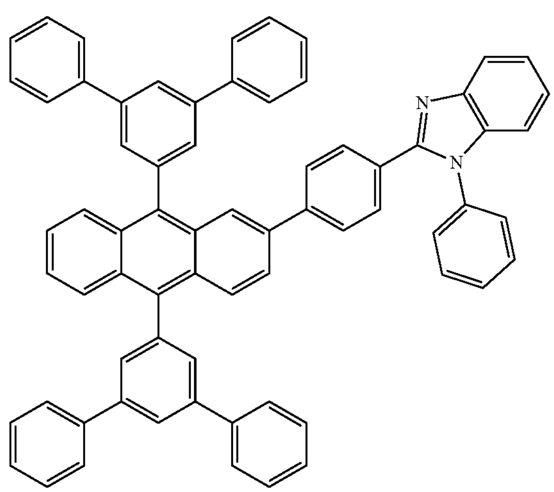

-continued
ET8
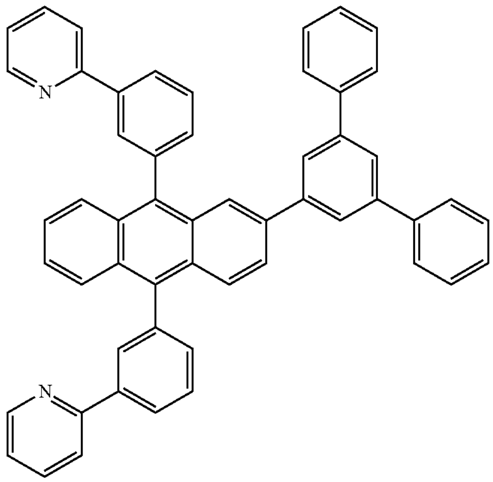
ET9
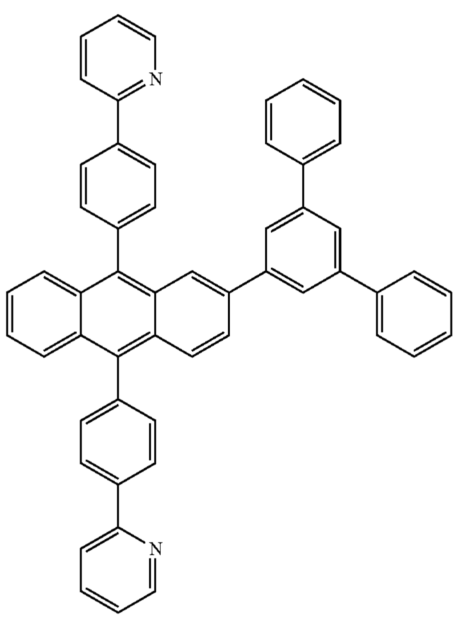
-continued
ET10
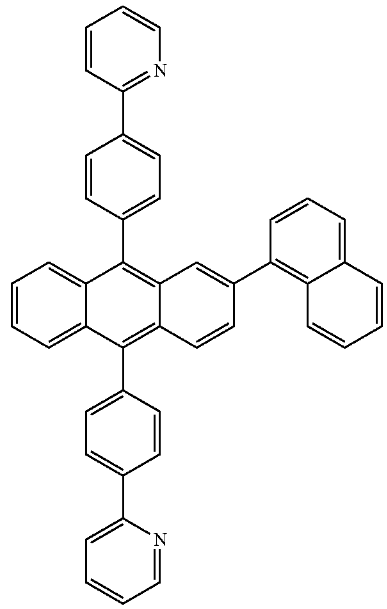
ET11
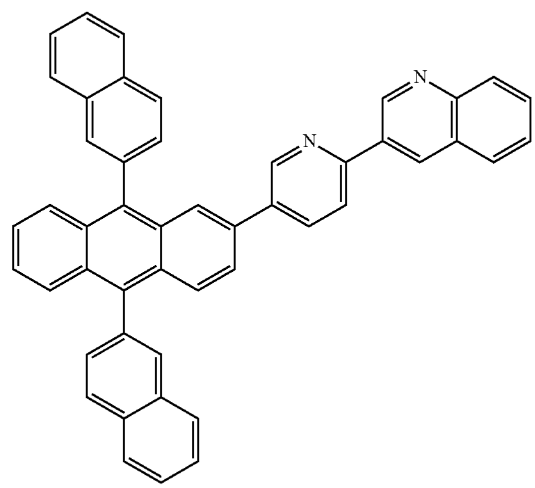
ET12
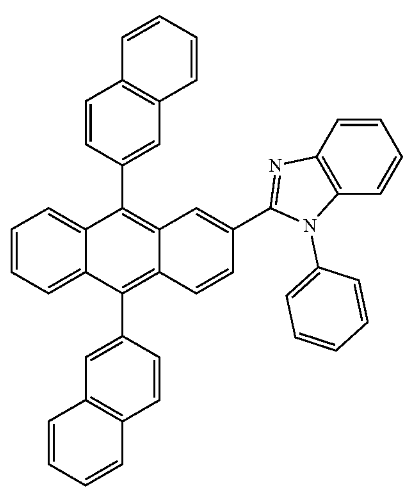

-continued
ET13
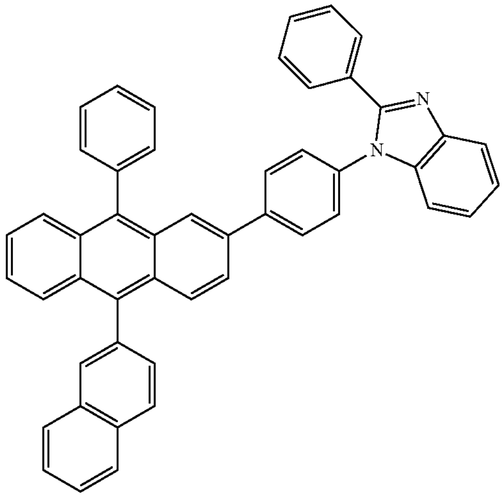
ET14
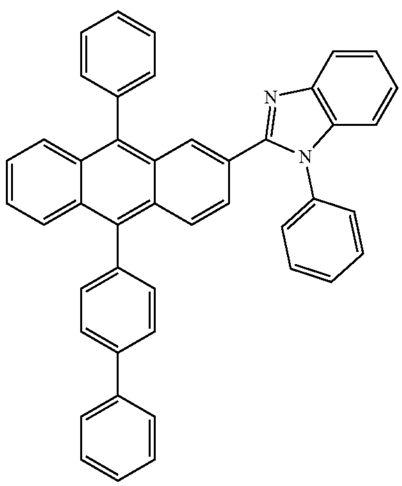
ET15
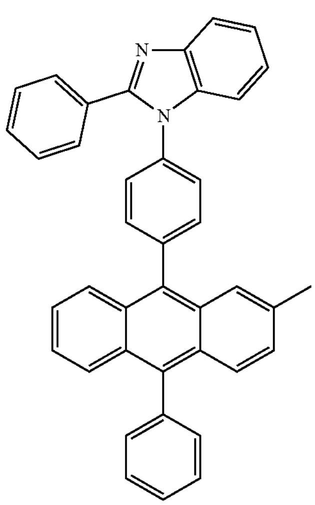
-continued
ET16
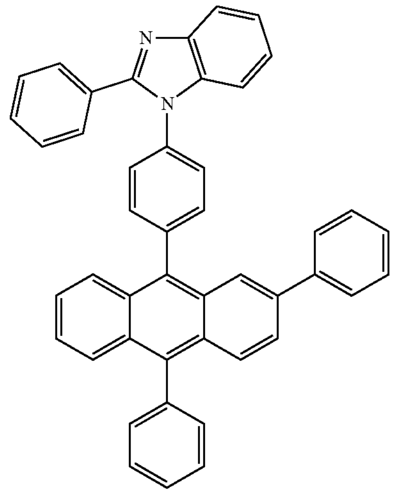
ET17
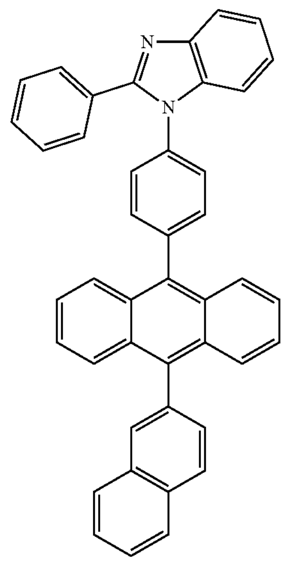
ET18
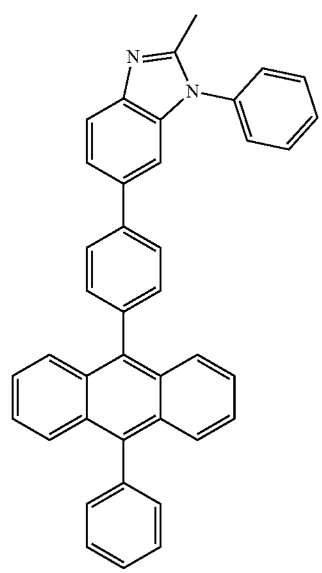

ET19
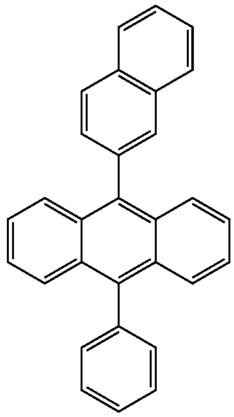
ET20
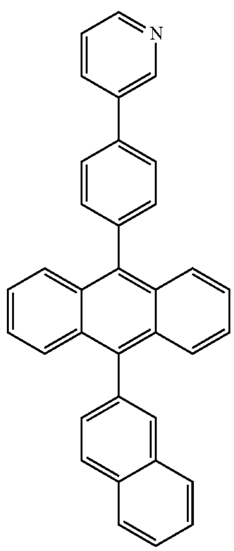
ET21
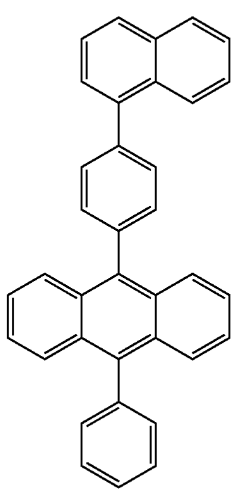
ET22
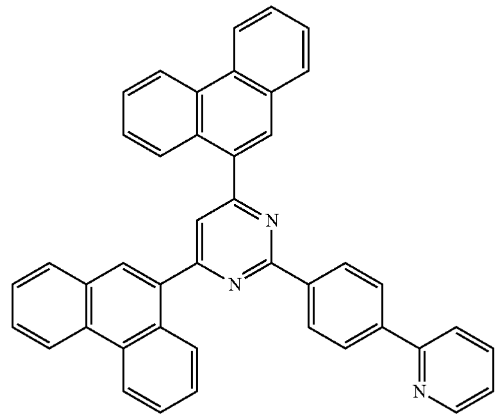
ET23
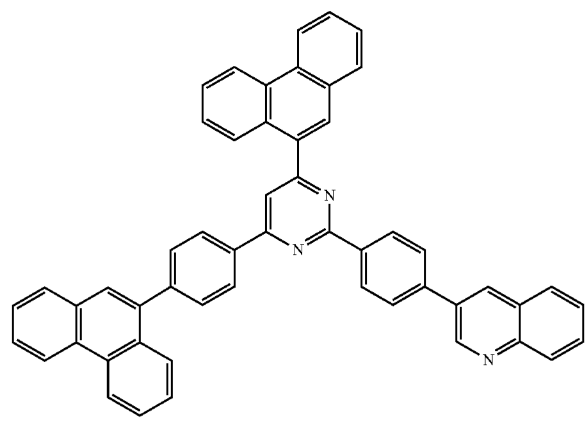
ET24
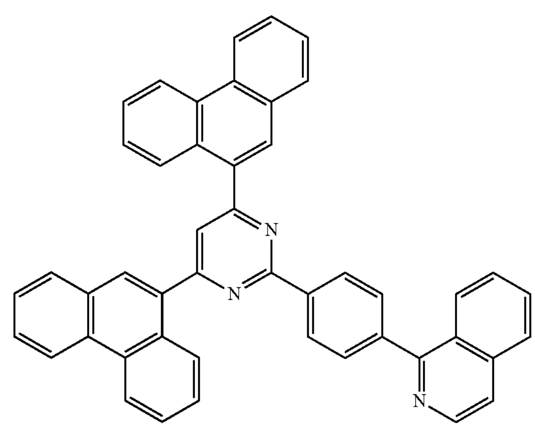

-continued
ET25
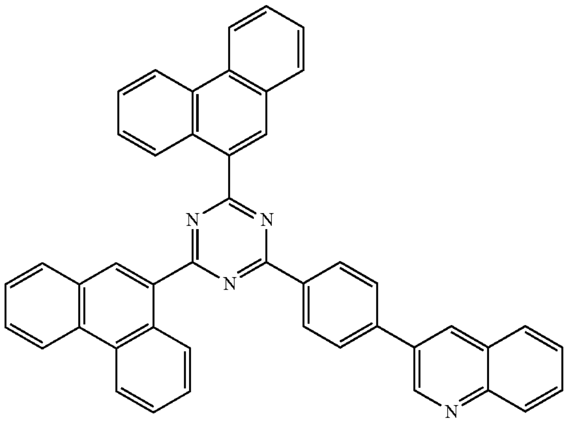
ET26
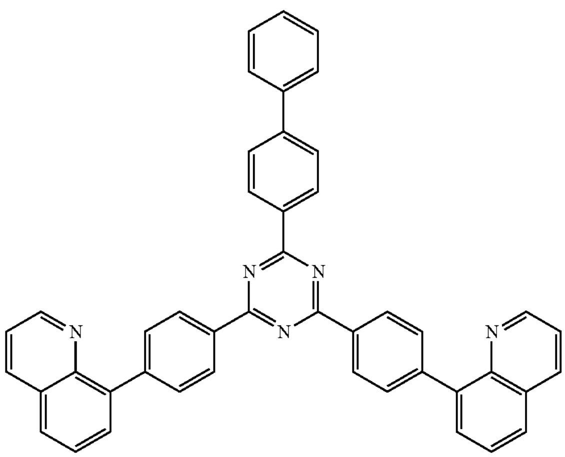
ET27
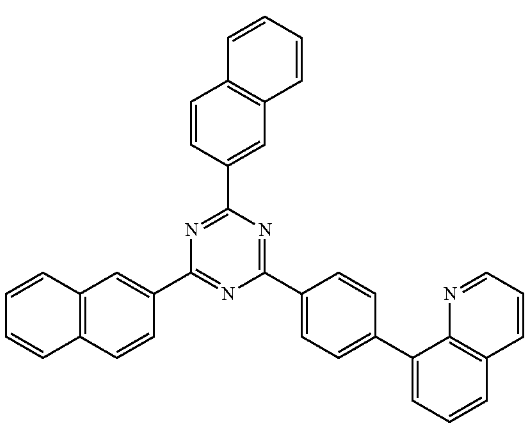
-continued
ET28
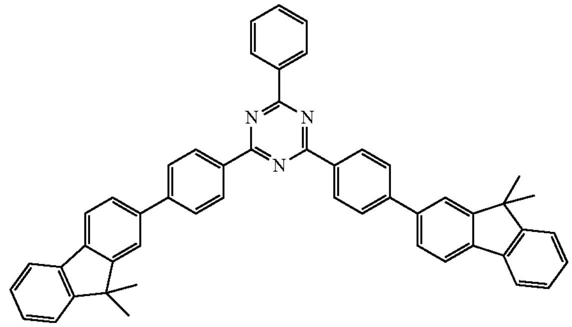
ET29
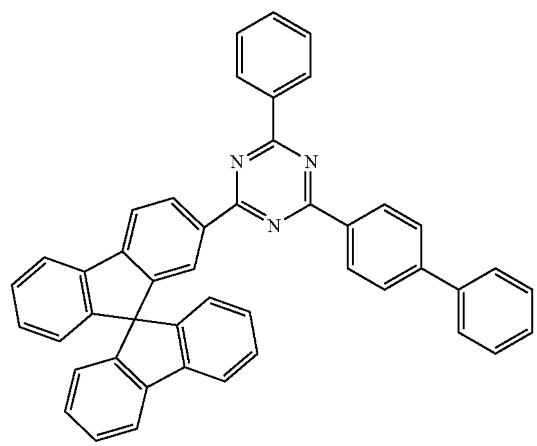
ET30
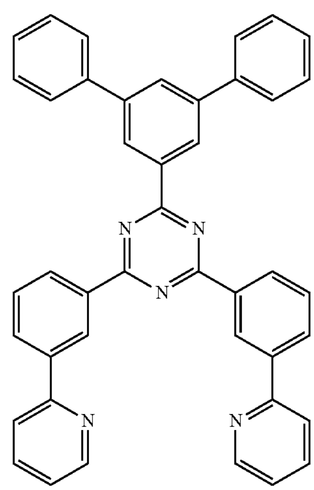

-continued

ET31

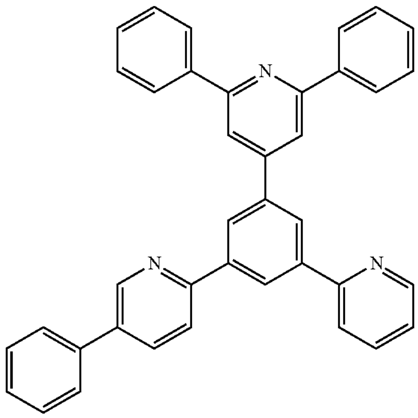

ET32

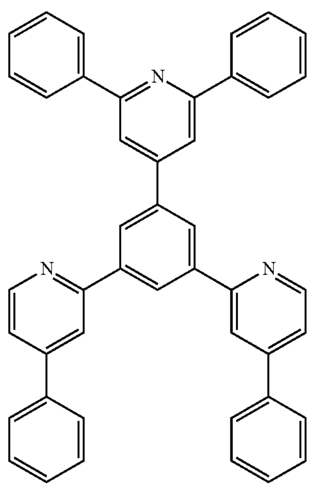

ET33

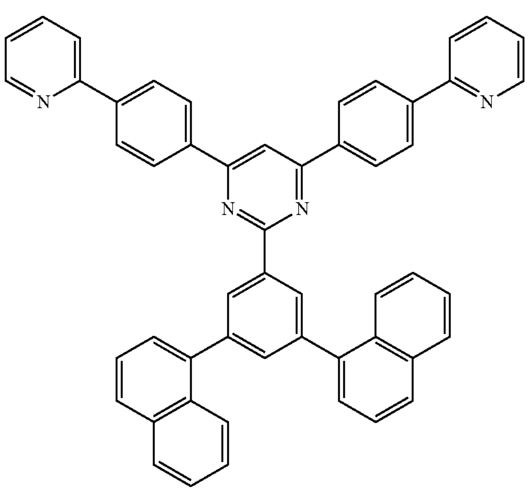

-continued

ET34

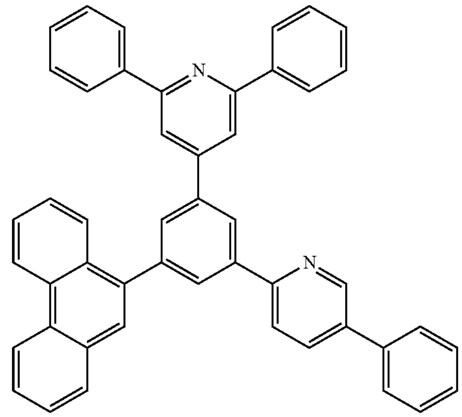

ET35

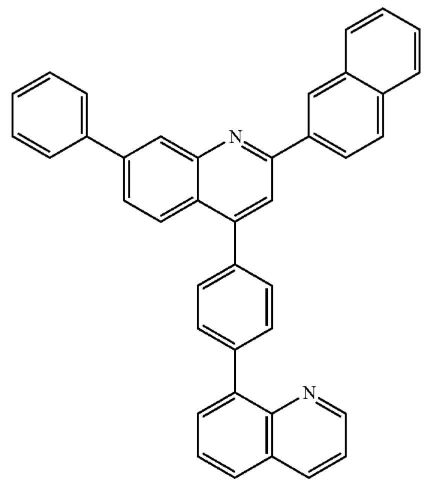

ET36

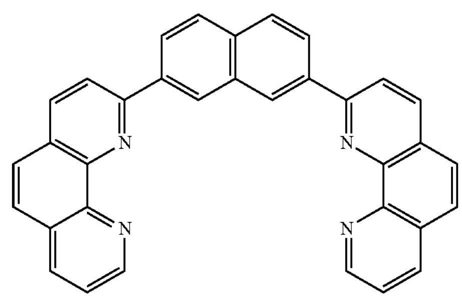

The electron transport region ETR may include halogenated metals such as LiF, NaCl, CsF, RbCl, RbI, CuI, and KI, lanthanide metals such as Yb, co-deposited materials of a halogenated metal and a lanthanide metal. For example, the electron transport region ETR may include KI:Yb, RbI:Yb, etc. as a co-deposited material. The electron transport region ETR may include a metal oxide such as $Li_2O$ and BaO, or 8-hydroxyl-lithium quinolate (Liq), etc., but embodiments are not limited thereto. The electron transport region ETR may also be formed of a mixture material of an electron transport material and an insulating organo-metal salt. The organo-metal salt may be a material having an energy band gap equal to or greater than about 4 eV. For example, the organo-metal salt may include metal acetates, metal benzoates, metal acetoacetates, metal acetylacetonates, or metal stearates.

The electron transport region ETR may further include, for example, at least one of 2,9-dimethyl-4,7-diphenyl-1,10- phenanthroline (BCP) or 4,7-diphenyl-1,10-phenanthroline (Bphen) in addition to the materials described above, but embodiments are not limited thereto.

The electron transport region ETR may include the compounds of the electron transport region described above in at least one of the electron injection layer EIL, the electron transport layer ETL, and the hole blocking layer HBL.

When the electron transport region ETR includes an electron transport layer ETL, the electron transport layer ETL may have a thickness in a range of about 100 Å to about 1,000 Å. For example, the electron transport layer ETL may have a thickness in a range of about 150 Å to about 500 Å. When the thickness of the electron transport layer ETL satisfies the above-described range, satisfactory electron transport properties may be obtained without a substantial increase in driving voltage. When the electron transport region ETR includes an electron injection layer EIL, the electron injection layer EIL may have a thickness in a range of about 1 Å to about 100 Å. For example, the electron injection layer EIL may have a thickness in a range of about 3 Å to about 90 Å. When the thickness of the electron injection layer EIL satisfies the above-described ranges, satisfactory electron injection properties may be obtained without a substantial increase in driving voltage.

The second electrode EL2 is provided on the electron transport region ETR. The second electrode EL2 may be a common electrode. The second electrode EL2 may be a cathode or an anode but embodiments are not limited thereto. For example, when the first electrode EL1 is an anode, the second electrode EL2 may be a cathode, and when the first electrode EL1 is a cathode, the second electrode EL2 may be an anode. The second electrode may include at least one selected from Ag, Mg, Cu, Al, Pt, Pd, Au, Ni, Nd, Ir, Cr, Li, Ca, LiF, Mo, Ti, W, In, Sn, Zn, an oxide thereof, a compound thereof, or a mixture thereof.

The second electrode EL2 may be a transmissive electrode, a transflective electrode, or a reflective electrode. When the second electrode EL2 is a transmissive electrode, the second electrode EL2 may be formed of a transparent metal oxide, for example, indium tin oxide (ITO), indium zinc oxide (IZO), zinc oxide (ZnO), indium tin zinc oxide (ITZO), etc.

When the second electrode EL2 is a transflective electrode or a reflective electrode, the second electrode EL2 may include Ag, Mg, Cu, Al, Pt, Pd, Au, Ni, Nd, Ir, Cr, Li, Ca, LiF/Ca (a stack structure of LiF and Ca), LiF/Al (a stack structure of LiF and Al), Mo, Ti, W, a compound thereof, or a mixture thereof (e.g., AgMg, AgYb, or MgYb). In another embodiment, the second electrode EL2 may have a multilayer structure including a reflective film or a transflective film formed of the above-described materials, and a transparent conductive film formed of indium tin oxide (ITO), indium zinc oxide (IZO), zinc oxide (ZnO), indium tin zinc oxide (ITZO), etc. For example, the second electrode EL2 may include the above-described metal materials, a combination of two or more metal materials selected from the above-described metal materials, or oxides of the above-described metal materials.

Although not shown in the drawings, the second electrode EL2 may be electrically connected to an auxiliary electrode. When the second electrode EL2 is electrically connected to the auxiliary electrode, the resistance of the second electrode EL2 may decrease.

In an embodiment, the light emitting diode ED may further include a capping layer CPL disposed on the second electrode EL2. The capping layer CPL may be a multilayer or a single layer.

In an embodiment, the capping layer CPL may include an organic layer or an inorganic layer. For example, when the capping layer CPL includes an inorganic material, the inorganic material may include an alkali metal compound such as LiF, an alkaline earth metal compound such as $MgF_2$, SiON, $SiN_x$, $SiO_y$, etc.

For example, when the capping layer CPL includes an organic material, the organic material may include 2,2'-dimethyl-N,N'-di-[(1-naphthyl)-N,N'-diphenyl]-1,1'-biphenyl-4,4'-diamine(α-NPD), NPB, TPD, m-MTDATA, $Alq_3$ CuPc, N4,N4,N4',N4'-tetra(biphenyl-4-yl) biphenyl-4,4'-diamine (TPD15), 4,4',4"-tris(carbazol-9-yl)triphenylamine (TCTA), etc., or may include epoxy resins or acrylates such as methacrylates. However, embodiments are not limited thereto, and the capping layer CPL may include at least one of Compounds P1 to P5.

P1

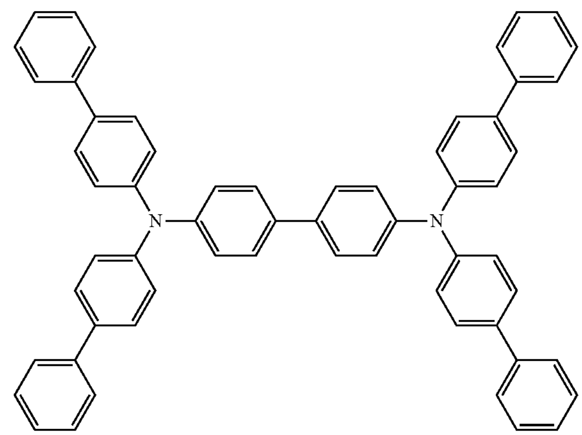

P2

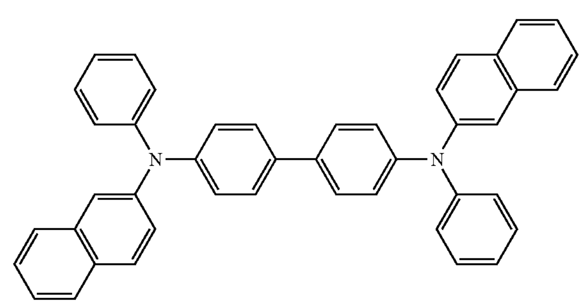

-continued

P3

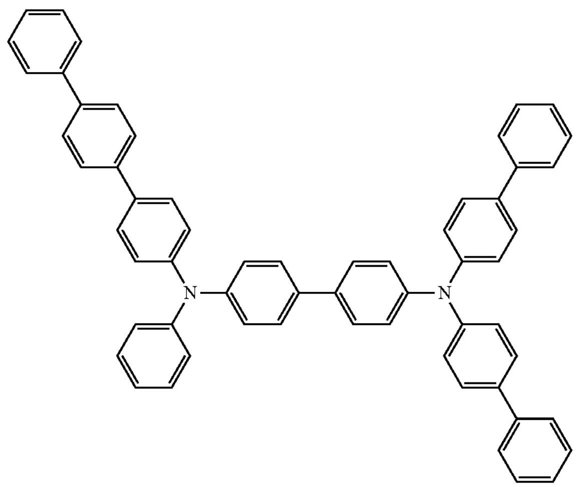

P4

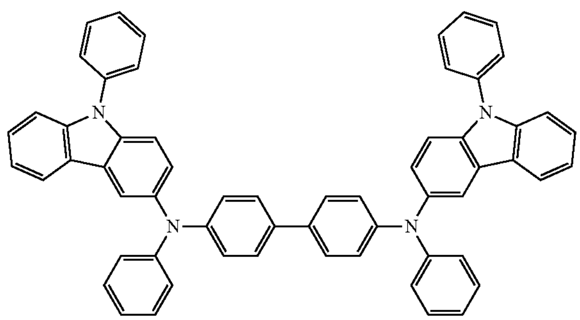

P5

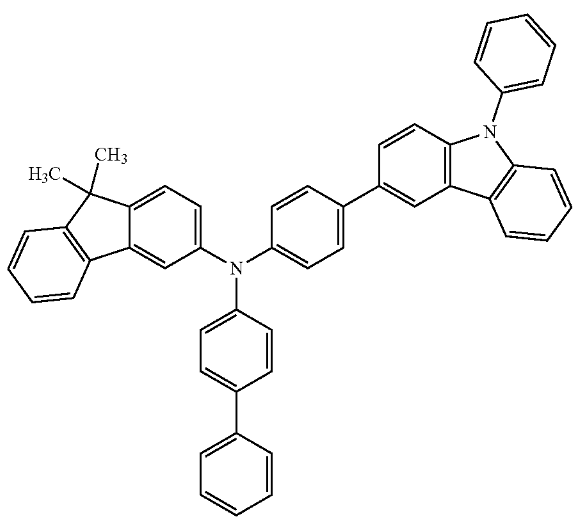

Figure 7:
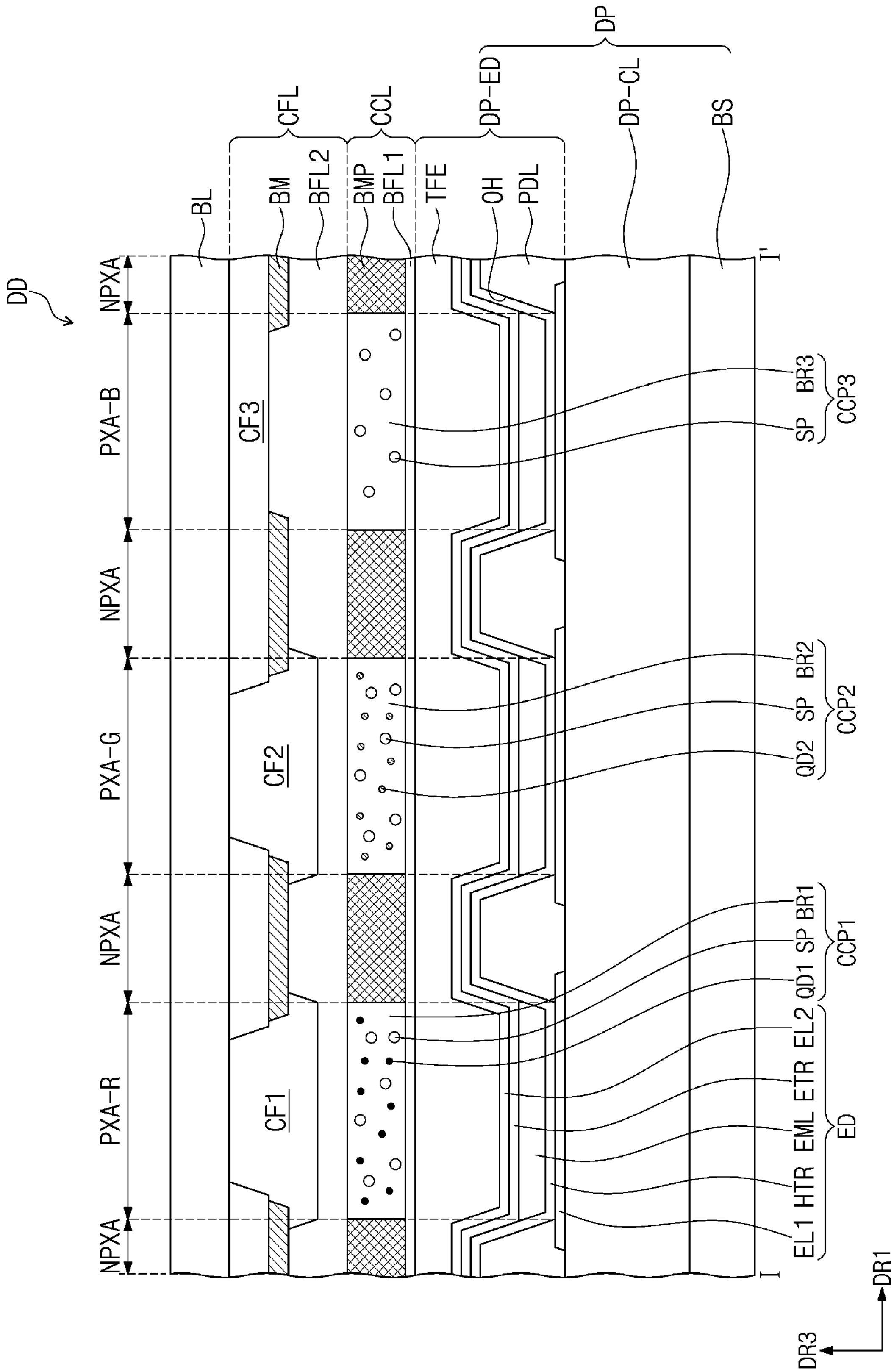
FIG. 7 is a schematic cross-sectional view of a display device according to an embodiment.
Figure 8:
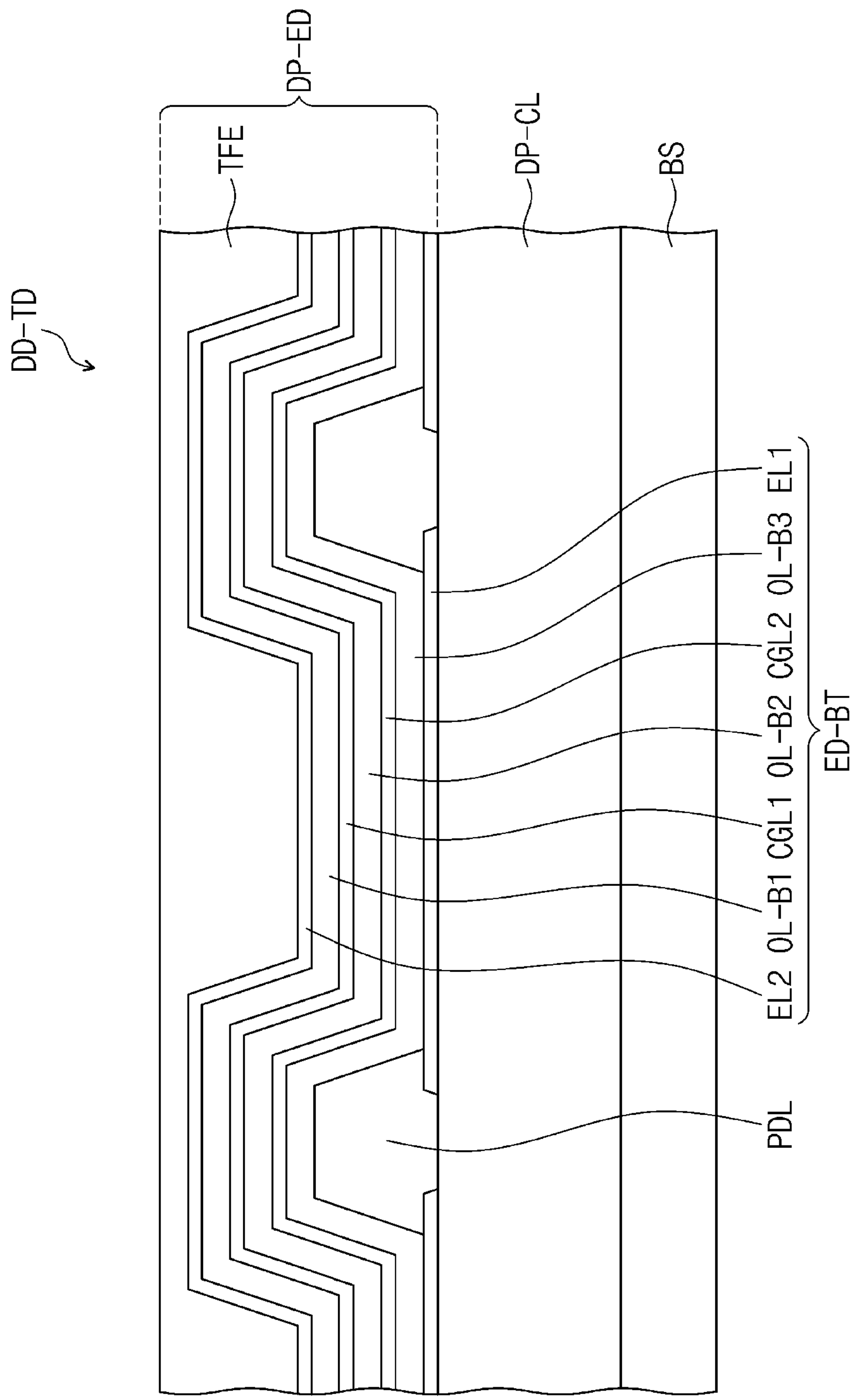
FIG. 8 is a schematic cross-sectional view of a display device according to an embodiment.

FIGS. 7 and 8 are each a schematic cross-sectional view of a display device according to an embodiment. Hereinafter, in the description of the display device according to an embodiment with reference to FIGS. 7 and 8, content which overlaps the descriptions with respect to FIGS. 1 to 6 will not be described again, and the differences will be described.

Referring to FIG. 7, the display device DD according to an embodiment may include a display panel DP having a display element layer DP-ED, a light control layer CCL disposed on the display panel DP, and a color filter layer CFL.

In an embodiment illustrated in FIG. 7, the display panel DP may include a base layer BS, a circuit layer DP-CL provided on the base layer BS, and a display element layer DP-ED, and the element layer DP-ED may include a light emitting diode ED.

The light emitting diode ED may include a first electrode EL1, a hole transport region HTR disposed on the first electrode EL1, an emission layer EML disposed on the hole transport region HTR, an electron transport region ETR disposed on the emission layer EML, and a second electrode EL2 disposed on the electron transport region ETR. A structure of the light emitting diode ED shown in FIG. 7 may be the same as a structure of the light emitting diode described in one of FIGS. 3 to 6.

Referring to FIG. 7, the emission layer EML may be disposed in the openings OH defined in the pixel defining films PDL. For example, the emission layer EML which separated by the pixel defining films PDL and provided corresponding to each of the light emitting areas PXA-R, PXA-G, and PXA-B may emit light in a same wavelength range. In the display device DD of an embodiment, the emission layer EML may emit blue light. Although not shown in the drawings, in an embodiment, the emission layer EML may be provided as a common layer throughout the light emitting areas PXA-R, PXA-G, and PXA-B.

At least one of the emission layers EML provided corresponding to the light emitting areas PXA-R, PXA-G, and PXA-B may include the polycyclic compound of an embodiment represented by Formula 1. At least one of the emission layers EML provided corresponding to the light emitting areas PXA-R, PXA-G, and PXA-B may include the polycyclic compound of an embodiment represented by Formula 1, and the remaining emission layers EML may include an additional fluorescent light emitting material, a phosphorescent light emitting material, quantum dots, etc. However, embodiments are not limited thereto.

The light control layer CCL may be disposed on the display panel DP. The light control layer CCL may include a photoconverter. The photoconverter may include a quantum dot or a phosphor. The photoconverter may convert the wavelength of a provided light, and may emit the resulting light. For example, the light control layer CCL may be a layer containing quantum dots or phosphors.

The light control layer CCL may include light control units CCP1, CCP2, and CCP3. The light control units CCP1, CCP2, and CCP3 may be spaced apart from each other.

Referring to FIG. 7, a division pattern BMP may be disposed between the light control units CCP1, CCP2, and CCP3 spaced apart from each other, but embodiments are not limited thereto. In FIG. 7, the division pattern BMP is shown not to overlap the light control units CCP1, CCP2, and CCP3, but edges of the light control units CCP1, CCP2, and CCP3 may overlap at least a portion of the division pattern BMP.

The light control layer CCL may include a first light control unit CCP1 including a first quantum dot QD1 that converts first color light provided from the light emitting diode ED into second color light, a second light control unit CCP2 including a second quantum dot QD2 that converts the first color light into third color light, and a third light control unit CCP3 transmitting the first color light.

In an embodiment, the first light control unit CCP1 may provide red light, which is the second color light, and the second light control unit CCP2 may provide green light, which is the third color light. The third light control unit CCP3 may transmit and provide blue light, which is the first color light provided from the light emitting diode ED. For example, the first quantum dot QD1 may be a red quantum dot and the second quantum dot QD2 may be a green quantum dot. The same descriptions as provided above with respect to quantum dots may be applied to the quantum dots QD1 and QD2.

The light control layer CCL may further include scatterers SP. The first light control unit CCP1 may include the first quantum dot QD1 and the scatterers SP, the second light control unit CCP2 may include the second quantum dot QD2 and the scatterers SP, and the third light control unit CCP3 may not include a quantum dot but may include the scatterers SP.

The scatterers SP may be inorganic particles. For example, the scatterers SP may include at least one of $TiO_2$, ZnO, $Al_2O_3$, $SiO_2$, and hollow silica. The scatterers SP may include any one of $TiO_2$, ZnO, $Al_2O_3$, $SiO_2$, and hollow silica, or may be a mixture of two or more materials selected from $TiO_2$, ZnO, $Al_2O_3$, $SiO_2$, and hollow silica.

The first light control unit CCP1, the second light control unit CCP2, and the third light control unit CCP3 may each include base resins BR1, BR2, and BR3 for dispersing the quantum dots QD1 and QD2 and the scatterers SP. In an embodiment, the first light control unit CCP1 may include the first quantum dot QD1 and the scatterers SP dispersed in the first base resin BR1, the second light control unit CCP2 may include the second quantum dot QD2 and the scatterers SP dispersed in the second base resin BR2, and the third light control unit CCP3 may include the scatterers SP dispersed in the third base resin BR3. The base resins BR1, BR2, and BR3 may each be a medium in which the quantum dots QD1 and QD2 and the scatterers SP are dispersed, and may be formed of various resin compositions, which may be generally referred to as a binder. For example, the base resins BR1, BR2, and BR3 may each independently be an acrylic resin, a urethane-based resin, a silicone-based resin, an epoxy-based resin, etc. The base resins BR1, BR2, and BR3 may be a transparent resin. In an embodiment, the first base resin BR1, the second base resin BR2, and the third base resin BR3 may each be the same as or different from each other.

The light control layer CCL may include a barrier layer BFL1. The barrier layer BFL1 may prevent moisture and/or oxygen (hereinafter referred to as "moisture/oxygen") from being introduced. The barrier layer BFL1 may be disposed on the light control units CCP1, CCP2, and CCP3 to prevent the light control units CCP1, CCP2, and CCP3 from being exposed to moisture/oxygen. The barrier layer BFL1 may cover the light control units CCP1, CCP2, and CCP3. A barrier layer BFL2 may be provided between the light control units CCP1, CCP2, and CCP3 and the color filter layer CFL.

The barrier layers BFL1 and BFL2 may include at least one inorganic layer. For example, the barrier layers BFL1 and BFL2 may each be formed of an inorganic material. For example, the barrier layers BFL1 and BFL2 may each independently include silicon nitride, aluminum nitride, zirconium nitride, titanium nitride, hafnium nitride, tantalum nitride, silicon oxide, aluminum oxide, titanium oxide, tin oxide, cerium oxide, silicon oxynitride, or a metal thin film in which light transmittance is secured, etc. The barrier layers BFL1 and BFL2 may each further include an organic film. The barrier layers BFL1 and BFL2 may be formed of a single layer or of multiple layers.

In the display device DD of an embodiment, the color filter layer CFL may be disposed on the light control layer CCL. In an embodiment, the color filter layer CFL may be directly disposed on the light control layer CCL. For example, the barrier layer BFL2 may be omitted.

The color filter layer CFL may include a light blocking unit BM and filters CF1, CF2, and CF3. For example, the color filter layer CFL may include a first filter CF1 transmitting second color light, a second filter CF2 transmitting third color light, and a third filter CF3 transmitting first color light. For example, the first filter CF1 may be a red filter, the second filter CF2 may be a green filter, and the third filter CF3 may be a blue filter. The filters CF1, CF2, and CF3 may each include a polymer photosensitive resin, a pigment, or a dye. The first filter CF1 may include a red pigment or a red dye, the second filter CF2 may include a green pigment or a green dye, and the third filter CF3 may include a blue pigment or a blue dye. However, embodiments are not limited thereto, and the third filter CF3 may not include a pigment or a dye. The third filter CF3 may include a polymer photosensitive resin, but may not include a pigment or a dye. The third filter CF3 may be transparent. The third filter CF3 may be formed of a transparent photosensitive resin.

In an embodiment, the first filter CF1 and the second filter CF2 may each be a yellow filter. The first filter CF1 and the second filter CF2 may not be separated from each other and may be provided as a single body.

The light blocking unit BM may be a black matrix. The light blocking unit BM may include an organic light blocking material or an inorganic light blocking material, each including a black pigment or a black dye. The light blocking unit BM may prevent light leakage, and may separate boundaries between the adjacent filters CF1, CF2, and CF3. In an embodiment, the light blocking unit BM may be formed of a blue filter.

The first to third filters CF1, CF2, and CF3 may be disposed corresponding to the red light emitting area PXA-R, green light emitting area PXA-G, and blue light emitting area PXA-B, respectively.

A base substrate BL may be disposed on the color filter layer CFL. The base substrate BL may provide a base surface on which the color filter layer CFL and the light control layer CCL are disposed. The base substrate BL may be a glass substrate, a metal substrate, a plastic substrate, etc. However, embodiments are not limited thereto, and the base substrate BL may include an inorganic layer, an organic layer, or a composite material layer. Although not shown in the drawings, in an embodiment, the base substrate BL may be omitted.

FIG. 8 is a schematic cross-sectional view showing a portion of a display device according to an embodiment. FIG. 8 shows a schematic cross-sectional view of a portion corresponding to the display panel DP of FIG. 7. In a display device DD-TD of an embodiment, a light emitting diode ED-BT may include light emitting structures OL-B1, OL-B2, and OL-B3. The light emitting diode ED-BT may include the first electrode EL1 and the second electrode EL2 facing each other, and the light emitting structures OL-B1, OL-B2, and OL-B3 provided by being sequentially stacked in a thickness direction between the first electrode EL1 and the second electrode EL2. The light emitting structures OL-B1, OL-B2, and OL-B3 may each include the emission layer EML (FIG. 7), and a hole transport region HTR and an electron transport region ETR disposed with the emission layer EML (FIG. 7) therebetween.

For example, the light emitting diode ED-BT included in the display device DD-TD of an embodiment may be a light emitting diode having a tandem structure and including multiple emission layers.

In an embodiment illustrated in FIG. 8, light emitted from each of the light emitting structures OL-B1, OL-B2, and OL-B3 may all be blue light. However, embodiments are not limited thereto, and wavelength ranges of light emitted from each of the light emitting structures OL-B1, OL-B2, and OL-B3 may be different from each other. For example, the light emitting diode ED-BT including the light emitting structures OL-B1, OL-B2, and OL-B3 emitting light in different wavelength ranges may emit white light.

Charge generation layers CGL1 and CGL2 may be disposed between neighboring light emitting structures OL-B1, OL-B2, and OL-B3. The charge generation layers CGL1 and CGL2 may each independently include a p-type charge generation layer and/or an n-type charge generation layer.

At least one of the light emitting structures OL-B1, OL-B2, and OL-B3 included in the display device DD-TD of an embodiment may include the polycyclic compound of an embodiment described above.

The light emitting diode ED according to an embodiment includes the polycyclic compound of an embodiment described above in at least one functional layer disposed between the first electrode EL1 and the second electrode EL2, and may thus exhibit improved luminous efficiency and lifespan characteristics. For example, the light emitting diode ED according to an embodiment may include the polycyclic compound of an embodiment described above in the emission layer EML, and may thus exhibit excellent luminous efficiency and long lifespan characteristics.

The polycyclic compound of an embodiment described above includes B and N as ring-forming heteroatoms in the core portion constituting the condensed ring, and further includes an indolocarbazole derivative, and may thus exhibit delayed fluorescence characteristics. The polycyclic compound of an embodiment includes an indolocarbazole derivative in the condensed ring to increase electrochemical stability, thereby contributing to improvement of the lifespan of a light emitting diode.

Hereinafter, a polycyclic compound and a light emitting diode of an embodiment will be described with reference to the Examples and the Comparative Examples. The Examples shown below are only illustrations for understanding the disclosure and the scope thereof is not limited thereto.

EXAMPLES

Synthesis of Polycyclic Compounds

A method of synthesizing polycyclic compounds according to embodiments will be described in detail by providing a method of synthesizing Compound 5, Compound 13, Compound 168, Compound 177, Compound 178, and Compound 189 as examples. A process of synthesizing polycyclic compounds, which will be described hereinafter, is provided as an example, and thus a process of synthesizing polycyclic compounds according to embodiments is not limited to the Examples below.

(1) Synthesis of Compound 5

Polycyclic compound 5 according to an embodiment may be synthesized by, for example, processes of Reaction Formulas below.

Synthesis of Intermediate A-1

[Reaction Formula 1-1]

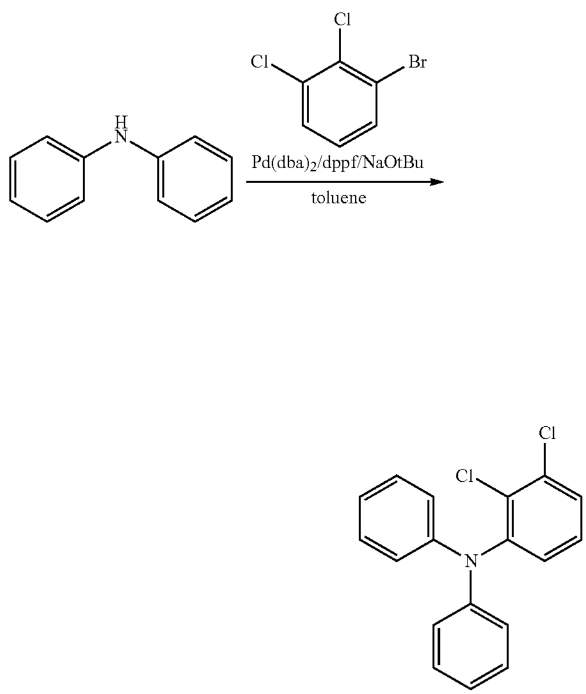

A-1

In a 2 L 2-necked flask, diphenylamine (25.0 g), 1-bromo-2,3-dichrolobenzene (33.4 g), bis(dibenzylideneacetone) palladium(0) (1.70 g), diphenylphosphinoferrocene (dppf, 3.28 g), sodium t-butoxide (14.9 g), and toluene (740 mL) were added, and heated and stirred at 80° C. for 3 hours. The obtained reaction solution was filtered through Celite, concentrated and purified using column chromatography (eluent: toluene/hexane=1:1), thereby obtaining a colorless liquid (40.8 g, yield: 88%). The fact that the FAB-MS of the obtained product indicated m/z=314 confirmed that it was a target, Intermediate A-1.

Synthesis of Intermediate A-2

[Reaction Formula 1-2]

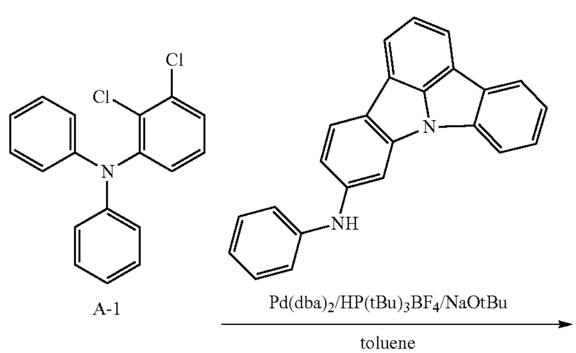

-continued

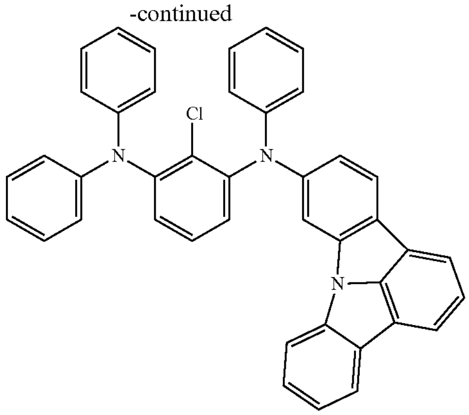

A-2

In a 500 mL 2-necked flask, Intermediate A-1 (10.0 g), n-phenylindolo[3,2,1-jk]carbazol-6-amine (10.6 g), bis (dibenzylideneacetone)palladium(0) (0.37 g), $IP(tBu)_3BF_4$ (0.37 g), sodium t-butoxide (3.21 g), and toluene (160 mL) were added, and heated and stirred at 120° C. for 3 hours. The obtained reaction solution was filtered through Celite, concentrated and purified using column chromatography (eluent: toluene/hexane=1:1), thereby obtaining a white solid (15.5 g, yield: 80%). The fact that the FAB-MS of the obtained product indicated m/z=610 confirmed that it was a target, Intermediate A-2.

Synthesis of Compound 5

[Reaction Formula 1-3]

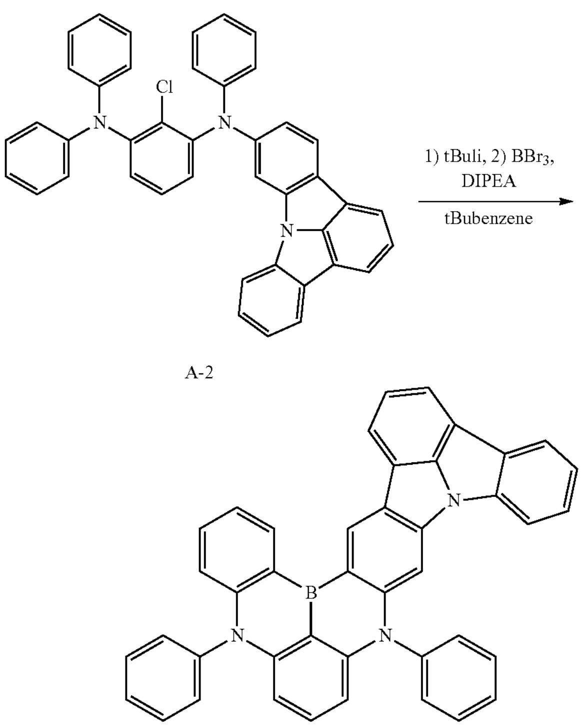

A-2

5

In a 200 mL 3-necked flask where Intermediate A-2 (5.00 g) was added and dried, tBubenzene (48 mL) was added in an argon (Ar) atmosphere, and the mixture was cooled to −78° C., and tBuLi solution (1.60 M in pentane, 10 mL) was slowly added thereto, and the resultant mixture was heated and stirred at 60° C. for 3 hours. The obtained mixture was cooled at −78° C., and $BBr_3$ (1.56 mL) was added thereto and stirred at room temperature for 30 minutes. N,N-diisopropylethylamine (3 mL) was added to the obtained reaction solution while cooling on ice, and the mixture was heated and stirred at 120° C. for 3 hours. The reaction solution was cooled to room temperature, and MeOH was added thereto to precipitate a solid. The precipitated solid was subjected to ultrasonic cleaning and the precipitate was collected. The precipitated reaction crude product was purified using column chromatography (eluent:toluene/hexane=1/1), and the molecular weight was confirmed through FAB-MS. A yellow solid (1.43 g, yield: 30%) was obtained. FAB-MS measurement of m/z=584 confirmed that it was Compound 5.

(2) Synthesis of Compound 13

Polycyclic compound 13 according to an embodiment may be synthesized by, for example, processes of Reaction Formulas below.

Synthesis of Intermediate A-3>

[Reaction Formula 2-1]

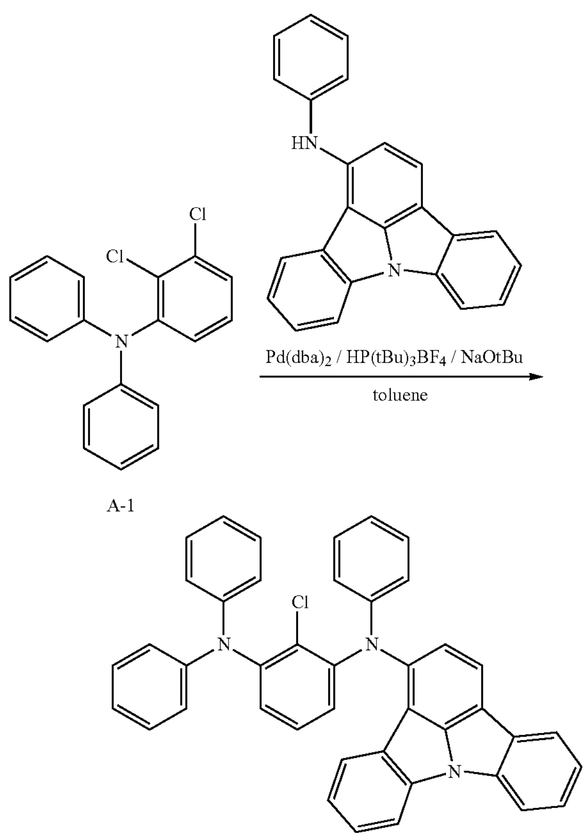

A-1

A-3

The reaction was performed in the same manner as in the synthesis process of Intermediate A-2, except that N-phenylindolo[3,2,1-jk]carbazol-3-amine (10.6 g), instead of N-phenylindolo[3,2,1-jk]carbazol-6-amine, was added to Intermediate A-1. The reaction product was purified using column chromatography (eluent: toluene/hexane=1:1), thereby obtaining a white solid (14.8 g, yield: 76%). The fact that FAB-MS of the obtained product indicated m/z=610 confirmed that it was a target, Intermediate A-3.

Synthesis of Compound 13

[Reaction Formula 2-2]

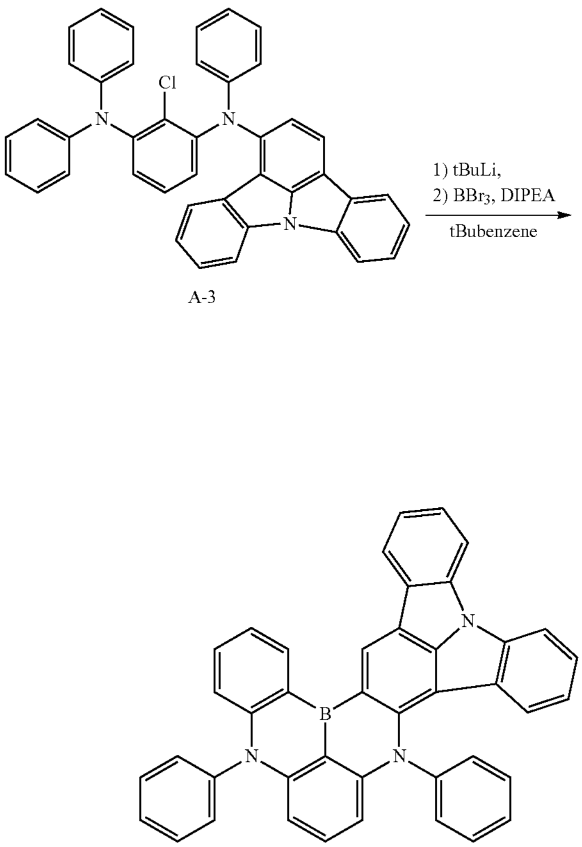

A-3

13

The reaction was performed in the same manner as in the synthesis process of Compound 5, except that Intermediate A-3 (5.00 g) was used instead of Intermediate A-2. The reaction product was purified using column chromatography (eluent: toluene/hexane=1:1), thereby obtaining a yellow solid (1.72 g, yield: 36%). The fact that the FAB-MS measurement of the obtained product indicated m/z=584 confirmed that it was Compound 13.

(3) Synthesis of Compound 168

Polycyclic compound 168 according to an embodiment may be synthesized by, for example, processes of Reaction Formulas below.

Synthesis of Intermediate A-4

[Reaction Formula 3-1]

A-4

In a 500 mL 2-necked flask, [1,1':3',1"-terphenyl]-2'-amine (11.0 g), 3,5-dichloro-1,1'-biphenyl (10.0 g), bis(dibenzylideneacetone)palladium(0) (1.03 g), xantphos (2.08 g), sodium t-butoxide (4.52 g), and toluene (230 mL) were added, and the mixture was heated and stirred at 140° C. for 3 hours. The obtained reaction solution was filtered through Celite, concentrated and purified using column chromatography (eluent: toluene/hexane=1:1), thereby obtaining a colorless liquid (15.5 g, yield: 80%). The fact that the FAB-MS of the obtained product indicated m/z=432 confirmed that it was a target, Intermediate A-4.

Synthesis of Intermediate A-5

[Reaction Formula 3-2]

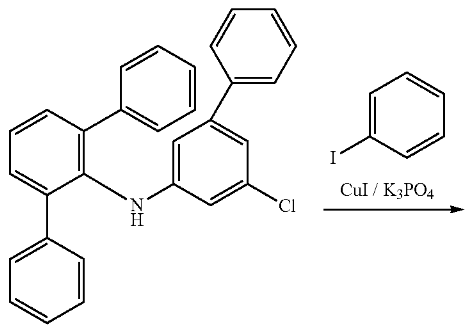

A-4

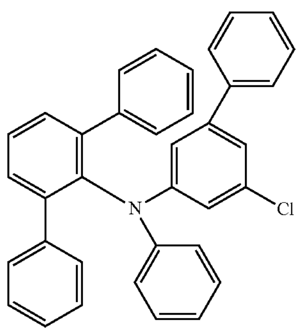

A-5

In a 500 mL 2-necked flask, Intermediate A-4 (15.4 g), iodobenzene (109 g), CuI(I) (6.80 g), and $K_3PO_4$ (75.8 g) were added, and the mixture was heated and stirred at 120° C. for 3 hours. The obtained reaction solution was filtered through Celite, concentrated and purified using column chromatography (eluent: toluene/hexane=1:1), thereby obtaining a white solid (14.5 g, yield: 80%). The fact that the FAB-MS of the obtained product indicated m/z=508 confirmed that it was a target, Intermediate A-5.

Synthesis of Intermediate A-6

[Reaction Formula 3-3]

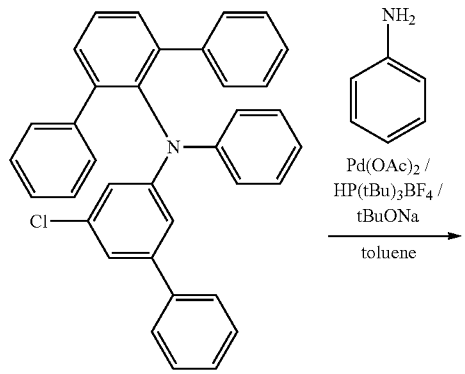

A-5

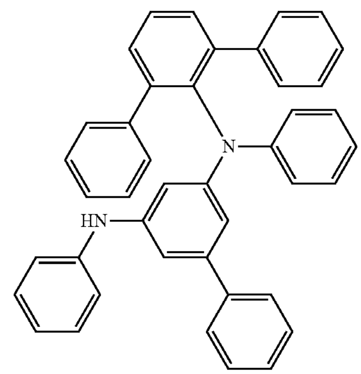

A-6

In a 200 mL 2-necked flask, Intermediate A-5 (8.00 g), aniline (2.88 mL), bis(dibenzylideneacetone)palladium(0) (0.72 g), $IP(tBu)_3BF_4$ (0.73 g), sodium t-butoxide (2.27 g), and toluene (80 mL) were added, and the mixture was heated and stirred at 140° C. for 3 hours. The obtained reaction solution was filtered through Celite, concentrated and purified using column chromatography (eluent: toluene/hexane=1:1), thereby obtaining a white solid (8.18 g, yield: 92%). The fact that the FAB-MS of the obtained product indicated m/z=565 confirmed that it was a target, Intermediate A-6.

Synthesis of Intermediate A-7

[Reaction Formula 3-4]

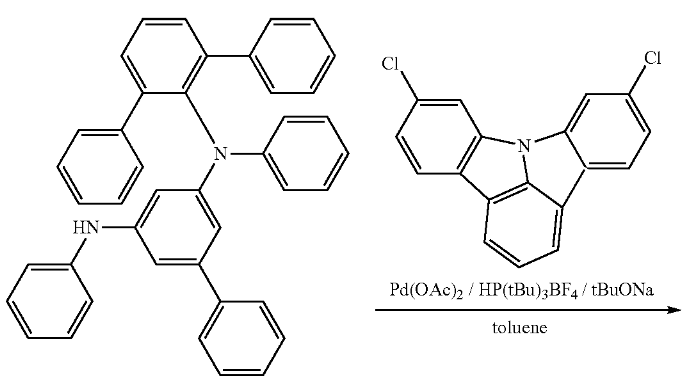

A-6

-continued

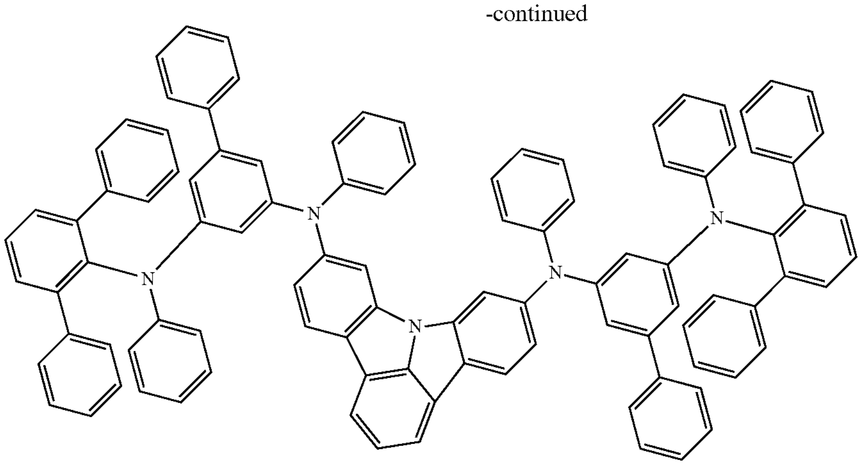

A-7

In a 200 mL 2-necked flask, Intermediate A-6 (8.23 g), 6,10-dichloroindolo[3,2,1-jk]carbazole (2.26 g), bis(dibenzylideneacetone)palladium(0) (0.34 g), $HP(tBu)_3BF_4$ (0.34 g), sodium t-butoxide (1.47 g), and toluene (40 mL) were added, and the mixture was heated and stirred at 140° C. for 3 hours. The obtained reaction solution was filtered through Celite, concentrated and purified using column chromatography (eluent: toluene/hexane=1:1), thereby obtaining a white solid (7.77 g, yield: 78%). The fact that the FAB-MS of the obtained product indicated m/z=1367 confirmed that it was a target, Intermediate A-7.

Synthesis of Compound 168

[Reaction Formula 3-5]

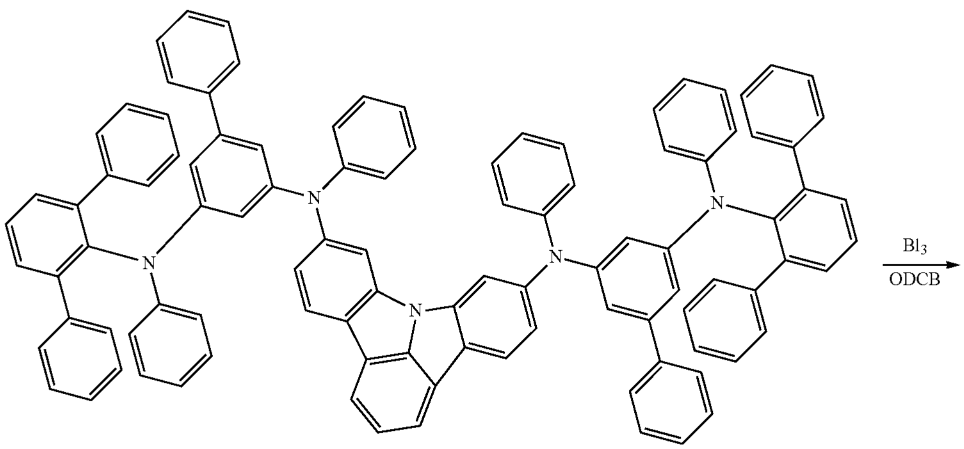

A-7

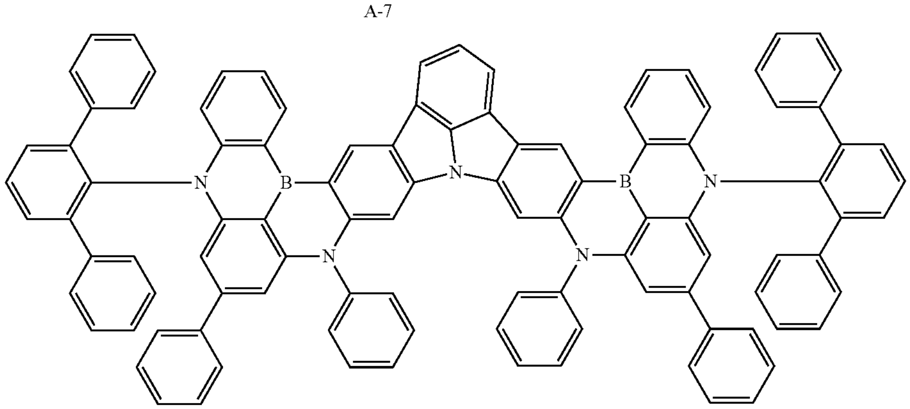

168

In a 100 mL 3-necked flask where $BI_3$ (6.88 g) was added to Intermediate A-7 (3.00 g) and dried, o-dichlorobenzene (ODCB, 45 mL) was added in an argon (Ar) atmosphere, and the mixture was heated and stirred at 180° C. for 8 hours. N,N-diisopropylethylamine (9.2 mL) was added thereto while cooling on ice. MeOH was added to the reaction solution to precipitate a solid, and the precipitated solid was subjected to ultrasonic cleaning and the precipitate was collected. The precipitated reaction crude product was purified using column chromatography (eluent: toluene/hexane=1:1), thereby obtaining a yellow solid (0.152 g, yield: 5%). The fact that FAB-MS of the obtained product indicated m/z=1382 confirmed that it was Compound 168.

(4) Synthesis of Compound 177

Polycyclic compound 177 according to an embodiment may be synthesized by, for example, processes of Reaction Formulas below.

Synthesis of Intermediate A-8

[Reaction Formula 4-1]

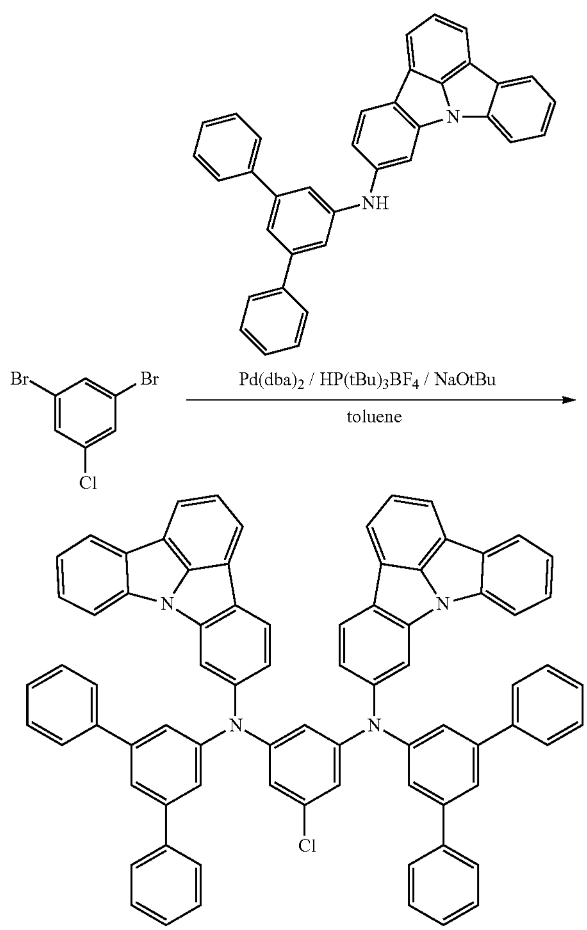

A-8

The reaction was performed in the same manner as in the synthesis process of Intermediate A-2, except that 1,3-diboromo-5-chlorobenzene (2.0 g) instead of Intermediate A-1, and N-([1,1':3',1"-terphenyl]-5'-yl)indolo[3,2,1-jk]carbazol-6-amine (7.17 g) instead of N-phenylindolo[3,2,1-jk]carbazol-6-amine were added. The reaction product was purified using column chromatography (eluent: toluene/hexane=1:1), thereby obtaining a white solid (6.38 g, yield: 80%). The fact that FAB-MS of the obtained product indicated m/z=1078 confirmed that it was a target, Intermediate A-8.

Synthesis of Intermediate A-9

[Reaction Formula 4-2]

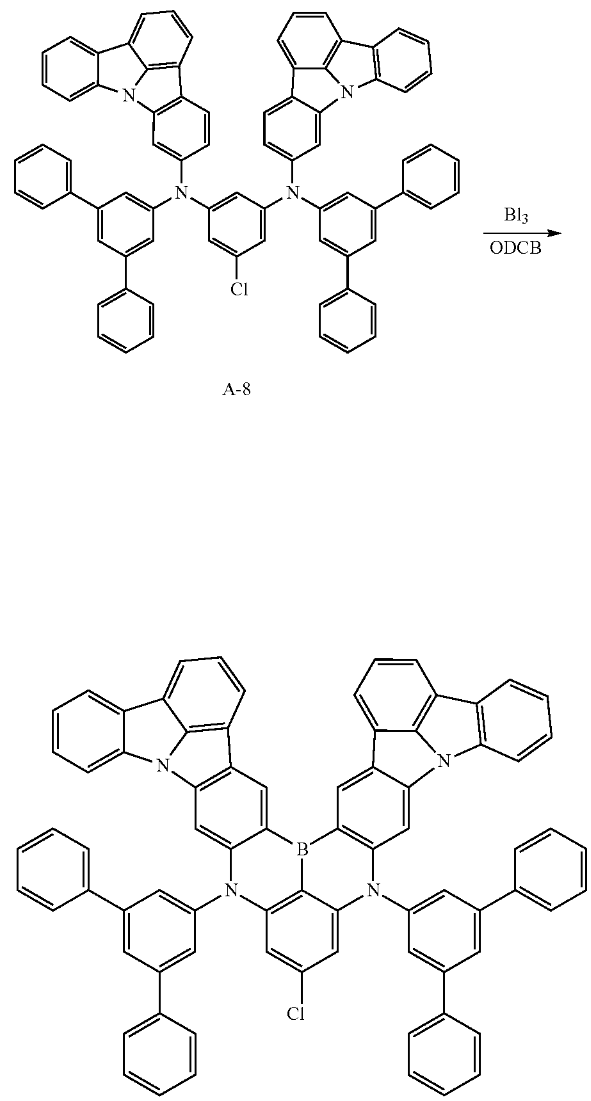

A-9

The reaction was performed in the same manner as in the synthesis process of Compound 168, except that A-8 (6.30 g) and $BI_3$ (9.16 g) were added instead of Intermediate A-9. The reaction product was purified using column chromatography (eluent: toluene/hexane=1:1), thereby obtaining a yellow solid (1.27 g, yield: 20%). The fact that FAB-MS of the obtained product indicated m/z=1086 confirmed that it was a target, Intermediate A-9.

Synthesis of Compound 177

[Reaction Formula 4-3]

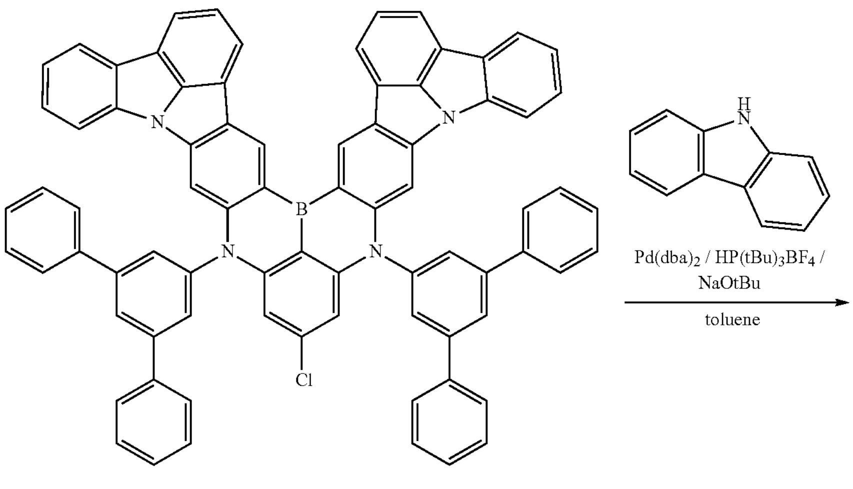

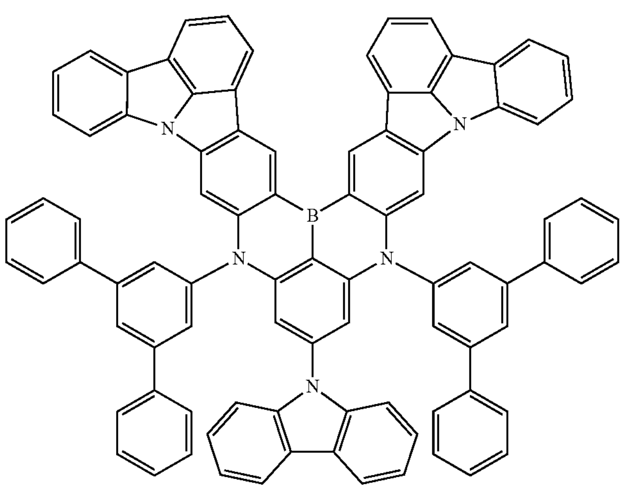

177

The reaction was performed in the same manner as in the synthesis process of Intermediate A-2, except that A-9 (1.20 g) instead of Intermediate A-1, and 9H-carbazole (0.26 g) instead of N-phenylindolo[3,2,1-jk]carbazol-6-amine were added. The reaction product was purified using column chromatography (eluent: toluene/hexane=1:1), thereby obtaining a yellow solid (0.774 g, yield: 65%). The fact that FAB-MS of the obtained product indicated m/z=1078 confirmed that it was a target, Compound 177.

(5) Synthesis of Compound 178

Polycyclic compound 178 according to an embodiment may be synthesized by, for example, processes of Reaction Formulas below.

Synthesis of Intermediate A-10

[Reaction Formula 5-1]

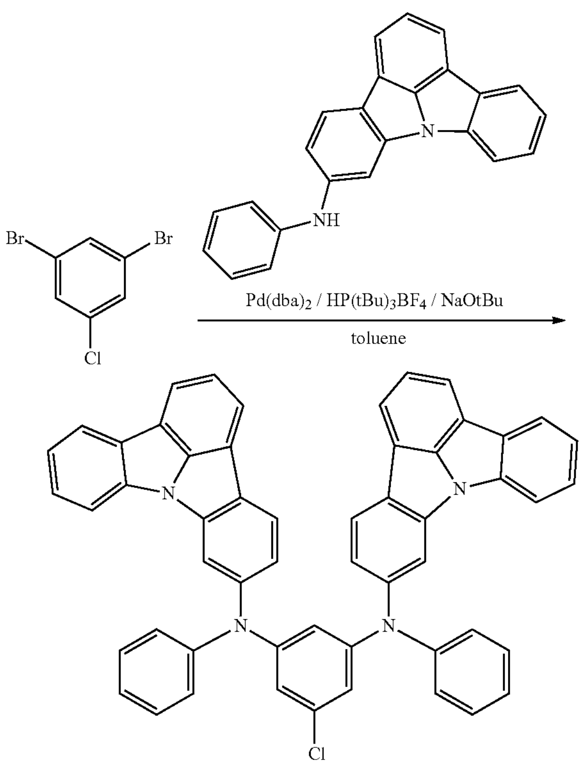

A-10

The reaction was performed in the same manner as in the synthesis process of Intermediate A-2, except that 1,3-diboromo-5-chlorobenzene (4.0 g) was added instead of Intermediate A-1. The reaction product was purified using column chromatography (eluent: toluene/hexane=1:1), thereby obtaining a white solid (8.92 g, yield: 78%). The fact that FAB-MS of the obtained product indicated m/z=773 confirmed that it was a target, Intermediate A-10.

Synthesis of Intermediate A-11

[Reaction Formula 5-2]

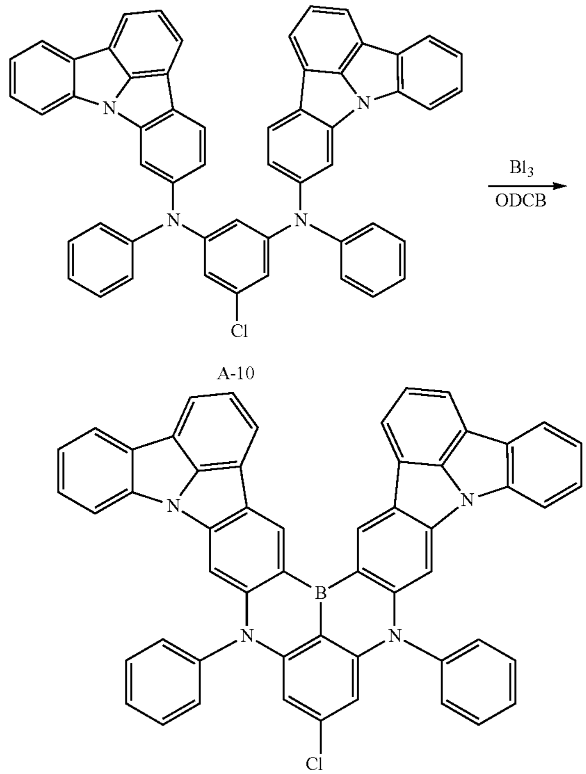

A-11

The reaction was performed in the same manner as in the synthesis process of Compound 168, except that A-10 (8.9 g) and $BI_3$ (18.0 g) were added instead of Intermediate A-7. The reaction product was purified using column chromatography (eluent: toluene/hexane=1:1), thereby obtaining a yellow solid (2.88 g, yield: 32%). The fact that FAB-MS of the obtained product indicated m/z=781 confirmed that it was a target, Intermediate A-11.

Synthesis of Intermediate 178

[Reaction Formula 5-3]

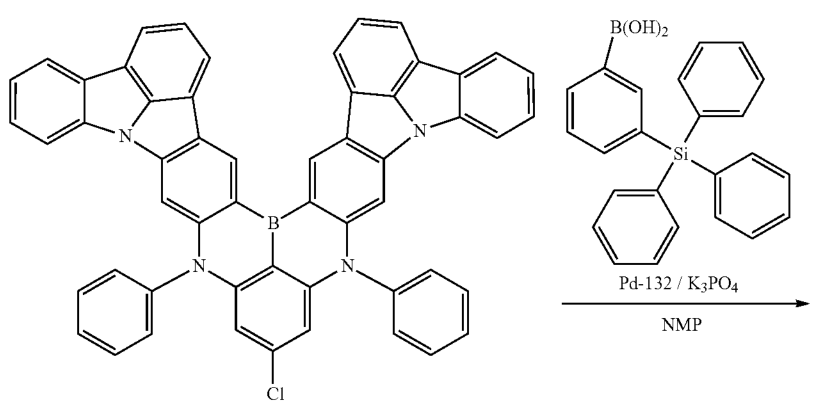

-continued

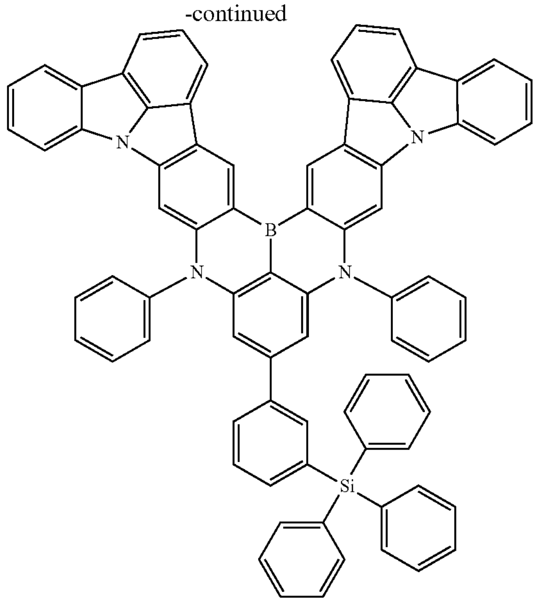

178

In a 300 mL 2-necked flask, Intermediate A-11 (2.80 g), (3-(triphenylsilyl)phenyl)-boronic acid (6.82 g), Pd-132 (2.54 g), $K_3PO_4$ (3.04 g), and NMP (150 mL) were added, and the mixture was heated and stirred at 140° C. for 3 hours. The obtained reaction solution was filtered through Celite, concentrated and purified using column chromatography (eluent: toluene/hexane=1:1), thereby obtaining a yellow solid (2.09 g, yield: 54%). The fact that FAB-MS of the obtained product indicated m/z=1081 confirmed that it was a target, Compound 178.

(6) Synthesis of Compound 189

Polycyclic compound 189 according to an embodiment may be synthesized by, for example, processes of Reaction Formulas below.

Synthesis of Intermediate A-12

[Reaction Formula 6-1]

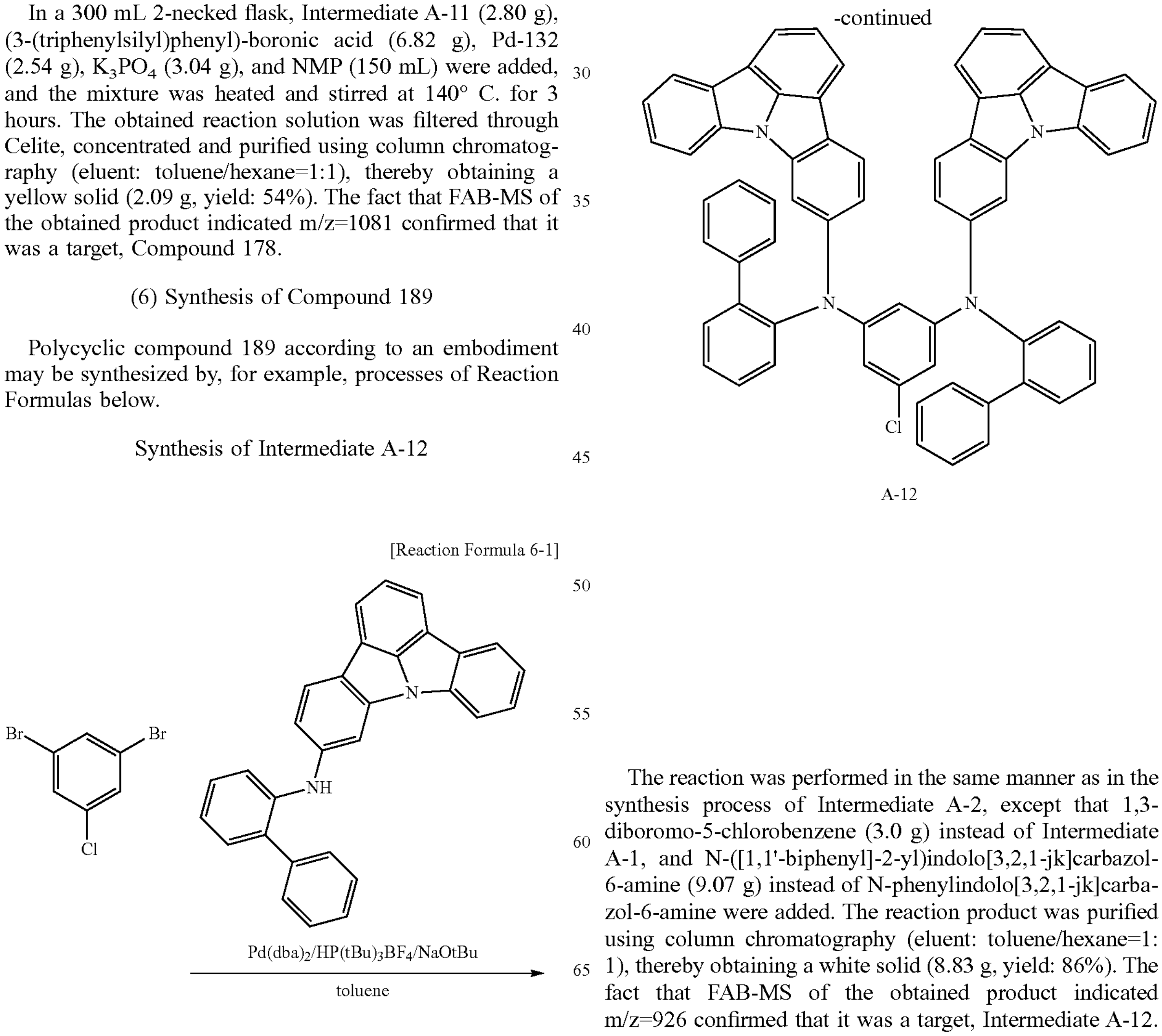

A-12

The reaction was performed in the same manner as in the synthesis process of Intermediate A-2, except that 1,3-diboromo-5-chlorobenzene (3.0 g) instead of Intermediate A-1, and N-([1,1'-biphenyl]-2-yl)indolo[3,2,1-jk]carbazol-6-amine (9.07 g) instead of N-phenylindolo[3,2,1-jk]carbazol-6-amine were added. The reaction product was purified using column chromatography (eluent: toluene/hexane=1:1), thereby obtaining a white solid (8.83 g, yield: 86%). The fact that FAB-MS of the obtained product indicated m/z=926 confirmed that it was a target, Intermediate A-12.

Synthesis of Intermediate A-13

[Reaction Formula 6-2]

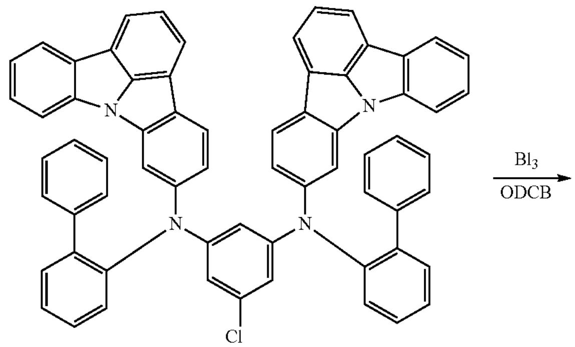

A-12

-continued

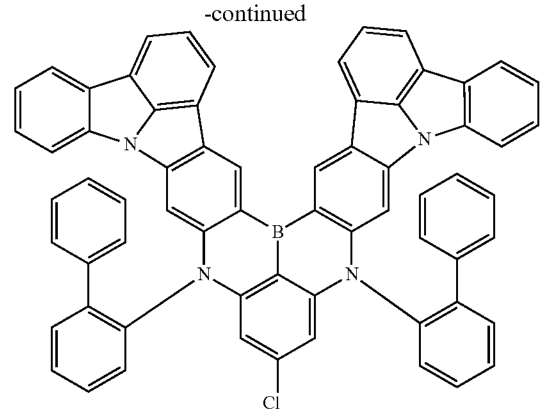

A-13

The reaction was performed in the same manner as in the synthesis process of Compound 168, except that A-12 (8.80 g) and $BI_3$ (14.9 g) were added instead of Intermediate A-7. The reaction product was purified using column chromatography (eluent: toluene/hexane=1:1), thereby obtaining a yellow solid (1.60 g, yield: 18%). The fact that FAB-MS of the obtained product indicated m/z=933 confirmed that it was a target, Intermediate A-13.

Synthesis of Compound 189

[Reaction Formula 6-3]

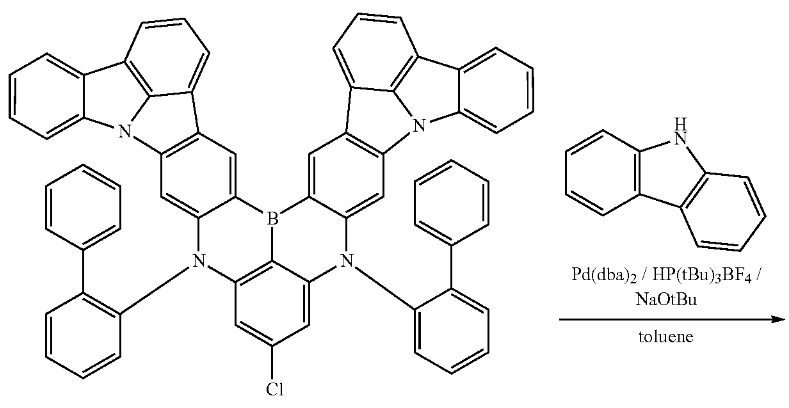

A-13

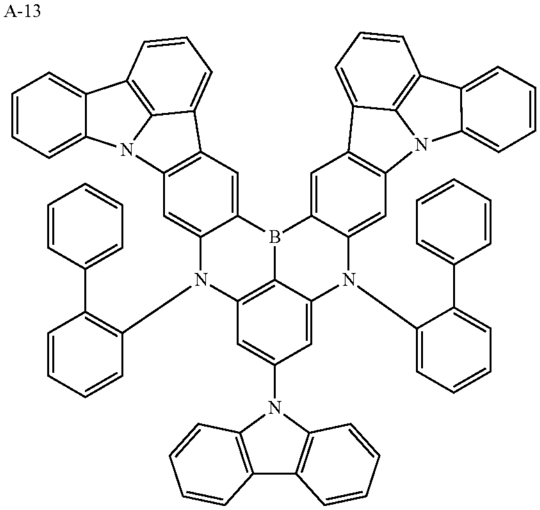

189

The reaction was performed in the same manner as in the synthesis process of Intermediate A-2, except that A-13 (1.60 g) instead of Intermediate A-1, and 9H-carbazole (0.40 g) instead of N-phenylindolo[3,2,1-jk]carbazol-6-amine were added. The reaction product was purified using column chromatography (eluent: toluene/hexane=1:1), thereby obtaining a yellow solid (1.39 g, yield: 76%). The fact that FAB-MS of the obtained product indicated m/z=1064 confirmed that it was a target, Compound 189.

2. Evaluation of Fluorescence Properties for Polycyclic Compounds

Fluorescence properties were evaluated for compounds of Examples and Comparative Examples shown in Table 1 below.

TABLE 1

Example Compound 5

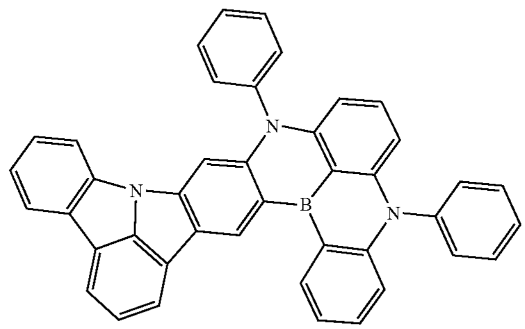 [SMILES: c1ccc(N2c3ccccc3B3c4cc5c6cccc7c8ccccc8n(c5cc4N(c4ccccc4)c4cccc2c43)c76)cc1]

Example Compound 13

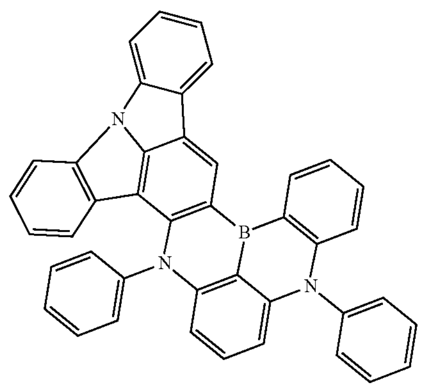 [SMILES: c1ccc(N2c3ccccc3B3c4cc5c6ccccc6n6c7ccccc7c(c4N(c4ccccc4)c4cccc2c43)c56)cc1]

Example Compound 168

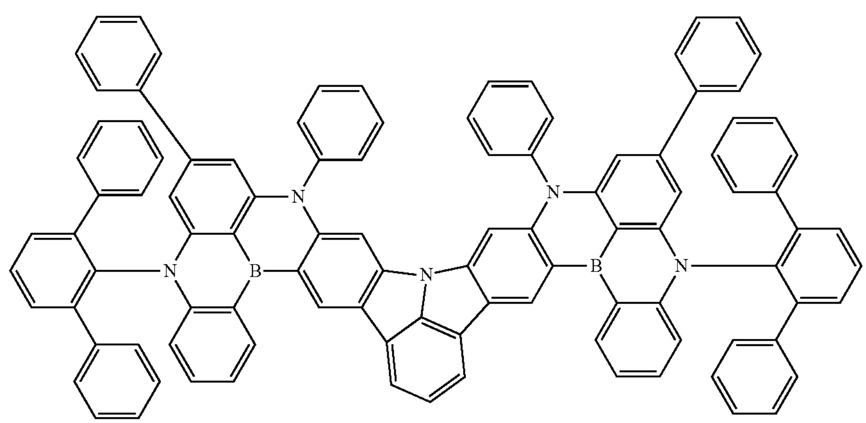 [SMILES: c1ccc(-c2cc3c4c(c2)N(c2c(-c5ccccc5)cccc2-c2ccccc2)c2ccccc2B4c2cc4c5cccc6c7cc8c(cc7n(c4cc2N3c2ccccc2)c56)N(c2ccccc2)c2cc(-c3ccccc3)cc3c2B8c2ccccc2N3c2c(-c3ccccc3)cccc2-c2ccccc2)cc1]

TABLE 1-continued
Example Compound 177
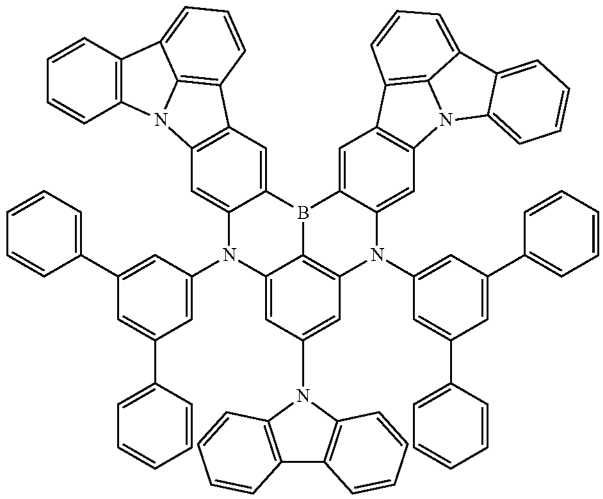 [SMILES: c1ccc(-c2cc(-c3ccccc3)cc(N3c4cc5c(cc4B4c6cc7c8cccc9c%10ccccc%10n(c7cc6N(c6cc(-c7ccccc7)cc(-c7ccccc7)c6)c6cc(-n7c%10ccccc%10c%10ccccc%107)cc3c64)c98)c3cccc4c6ccccc6n5c43)c2)cc1]
Example Compound 178
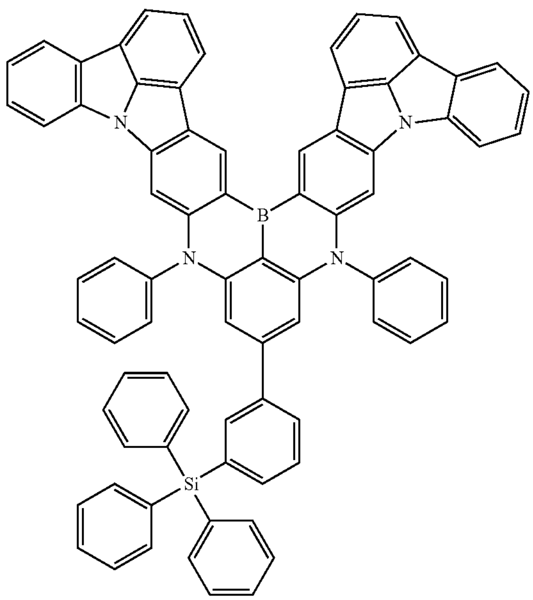 [SMILES: c1ccc(N2c3cc4c(cc3B3c5cc6c7cccc8c9ccccc9n(c6cc5N(c5ccccc5)c5cc(-c6cccc([Si](c9ccccc9)(c9ccccc9)c9ccccc9)c6)cc2c53)c87)c2cccc3c5ccccc5n4c32)cc1]
Example Compound 189
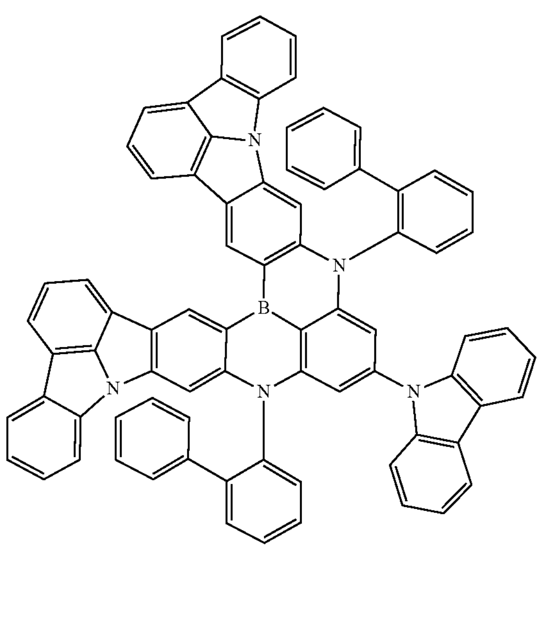 [SMILES: c1ccc(-c2ccccc2N2c3cc4c(cc3B3c5cc6c7cccc8c9ccccc9n(c6cc5N(c5ccccc5-c5ccccc5)c5cc(-n6c9ccccc9c9ccccc96)cc2c53)c87)c2cccc3c5ccccc5n4c32)cc1]

TABLE 1-continued
| | |
|---|---|
| Comparative Example Compound XI | 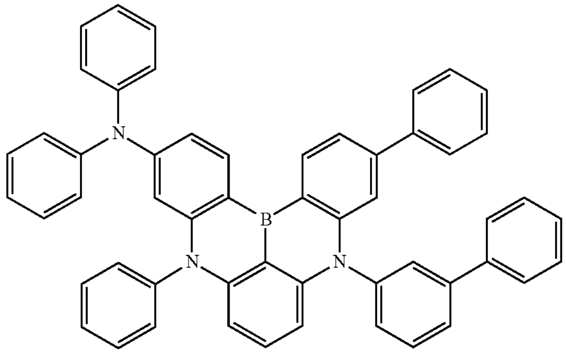 [SMILES: c1ccc(-c2cccc(N3c4cc(-c5ccccc5)ccc4B4c5ccc(N(c6ccccc6)c6ccccc6)cc5N(c5ccccc5)c5cccc3c54)c2)cc1] |
| Comparative Example Compound X2 | 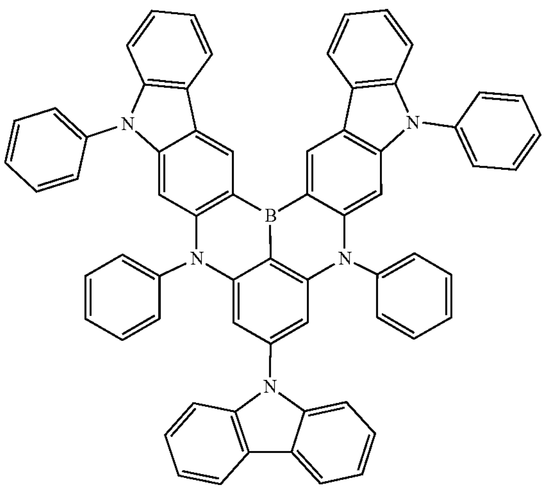 [SMILES: c1ccc(N2c3cc4c(cc3B3c5cc6c7ccccc7n(-c7ccccc7)c6cc5N(c5ccccc5)c5cc(-n6c7ccccc7c7ccccc76)cc2c53)c2ccccc2n4-c2ccccc2)cc1] |
| Comparative Example Compound X3 | 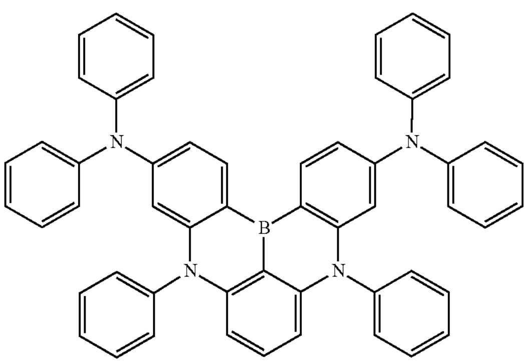 [SMILES: c1ccc(N(c2ccccc2)c2ccc3c(c2)N(c2ccccc2)c2cccc4c2B3c2ccc(N(c3ccccc3)c3ccccc3)cc2N4c2ccccc2)cc1] |
| Comparative Example Compound X4 | 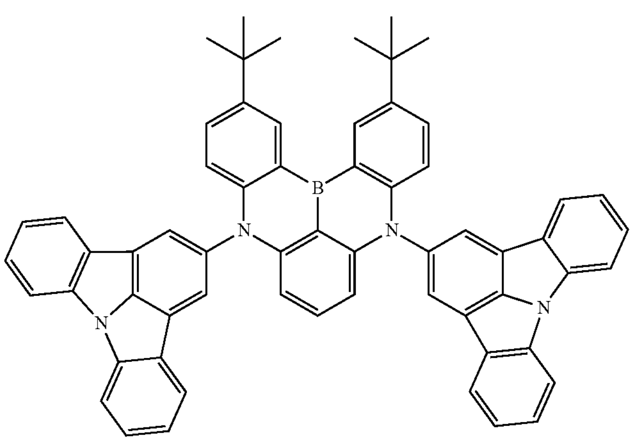 [SMILES: CC(C)(C)c1ccc2c(c1)B1c3cc(C(C)(C)C)ccc3N(c3cc4c5ccccc5n5c6ccccc6c(c3)c45)c3cccc(c31)N2c1cc2c3ccccc3n3c4ccccc4c(c1)c23] |

The light absorption properties of the compounds of Examples and Comparative Examples in a toluene solution were evaluated using a U-3900 type spectrophotometer from Hitachi High-Tech. The luminescence properties of the compounds of Examples and Comparative Examples were evaluated in an inert gas atmosphere using a F-7000 spectrofluorescence photometer from Hitachi High-Tech.

Table 2 shows the molar absorption coefficient (abs@450 nm) at 450 nm, the maximum light emission wavelength ($PL\lambda_{max}$), and the full width of half maximum (FWHM) of a light emission spectrum for the compounds of Examples and Comparative Examples.

TABLE 2

| Compound | abs@450 nm ($\times 10^4 M^{-1} cm^{-1}$) | $PL\lambda_{max}$ (nm) | FWHM (nm) |
|---|---|---|---|
| Example Compound 5 | 4.12 | 461 | 19 |
| Example Compound 13 | 4.05 | 463 | 19 |
| Example Compound 168 | 9.80 | 461 | 17 |
| Example Compound 177 | 5.63 | 459 | 18 |
| Example Compound 178 | 4.97 | 460 | 18 |
| Example Compound 189 | 5.40 | 458 | 19 |
| Comparative Example Compound X1 | 3.84 | 464 | 25 |
| Comparative Example Compound X2 | 3.20 | 461 | 21 |
| Comparative Example Compound X3 | 3.63 | 455 | 25 |
| Comparative Example Compound X4 | 0.96 | 456 | 25 |

Referring to results of Table 2, it is confirmed that the Example compounds have a greater molar absorption coefficient than the Comparative Example compounds. Against this backdrop, it is seen that the Example compounds show a higher absorption rate of energy transferred from a host than the Comparative Example compounds, and accordingly, a light emitting diode including the Example compounds may have a greater efficiency than a light emitting diode including the Comparative Example compounds. For example, the Example compounds may have a molar absorption coefficient equal to or greater than about $4.0\times 10^4 M^{-1} cm^{-1}$ at about 450 nm.

Referring to Table 2, it is seen that both the Example compounds and the Comparative Example compounds emit deep blue light with a maximum light emission wavelength of 470 nm or less. It can be seen that the Example compounds exhibited a luminous characteristic having a smaller full width of half maximum than the Comparative Example compounds. It is confirmed that the Example compounds emit light having high color purity compared to the Comparative Example compounds.

3. Manufacture and Evaluation of Light Emitting Diodes

Light emitting diodes including compounds of Examples and Comparative Examples in an emission layer were evaluated using the following method. A method for manufacturing a light emitting diode for evaluation is described below.

Light emitting diodes of Examples 1 to 6 were manufactured respectively using Example compounds 5, 13, 168, 177, 178, and 189 shown in Table 1 above as dopant materials of an emission layer. Light emitting diodes of Comparative Examples 1 to 4 were manufactured respectively using Comparative Example compounds X1 to X4 as dopant materials of an emission layer.

(1) Manufacture and Evaluation of Light Emitting Diode 1

<Manufacture of Light Emitting Diode 1>

Light emitting diodes of Examples and Comparative Examples were manufactured as follows. ITO was patterned on a glass substrate to form a first electrode. TNATA was deposited at a thickness of 600 Å to form a hole injection layer, and NPB was deposited at a thickness of 300 Å to form a hole transport layer. When an emission layer is formed, in Examples, a compound of Example and ADN were co-deposited at 2:98 to form a layer having a thickness of 300 Å, and in Comparative Examples, a compound of Comparative Example and ADN were co-deposited at 2:98 to form a layer having a thickness of 300 Å.

On the emission layer, $Alq_3$ was used to form an electron transport layer having a thickness of 300 Å, and LiF was used to form an electron injection layer having a thickness of 10 Å. Aluminum (Al) was used to form a second electrode having a thickness of 3,000 Å.

The compounds of each functional layer used for manufacturing the light emitting diodes are as follows.

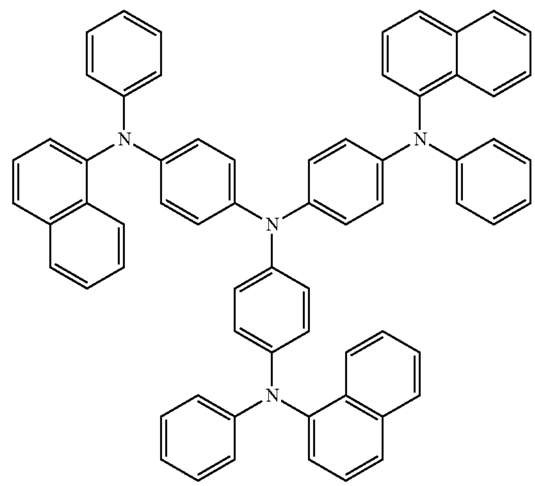

TNATA

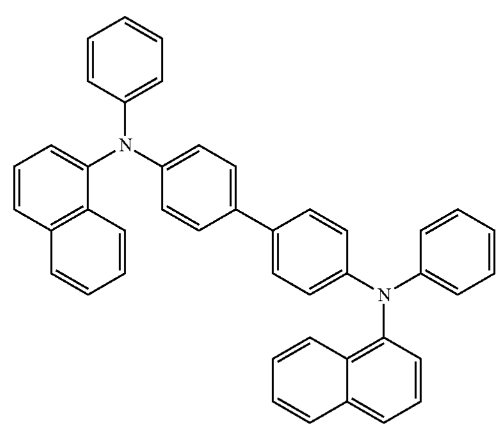

NPB

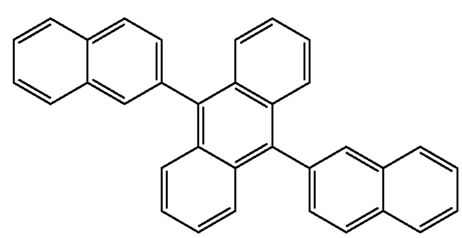

ADN

-continued

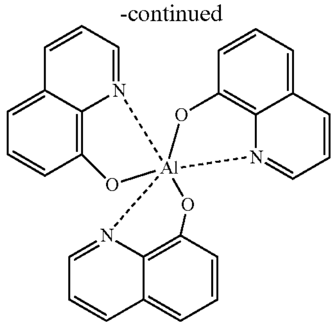

$Alq_3$

<Evaluation of Light Emitting Diode 1>

Table 3 shows results of evaluating the light emitting diodes of Examples and Comparative Examples manufactured as manufacturing examples of the light emitting diode 1 described above. Table 3 compares and show maximum light emission wavelength (λmax), maximum external quantum efficiency ($EQE_{max}$), and CIEy when driven at a current density of 10 $mA/cm^2$ in the light emitting diodes.

TABLE 3

| (Example of Manufacturing diodes) | Emission layer | $\lambda_{max}$ (Nm) | $EQE_{max}$ (%) | CIEy |
|---|---|---|---|---|
| Example 1 | Example Compound 5 | 461 | 7.5 | 0.069 |
| Example 2 | Example Compound 13 | 464 | 7.6 | 0.074 |
| Example 3 | Example Compound 168 | 462 | 8.2 | 0.070 |
| Example 4 | Example Compound 177 | 460 | 7.8 | 0.066 |
| Example 5 | Example Compound 178 | 461 | 7.7 | 0.068 |
| Example 6 | Example Compound 189 | 459 | 7.9 | 0.063 |
| Comparative Example 1 | Comparative Example Compound X1 | 465 | 7.3 | 0.095 |
| Comparative Example 2 | Comparative Example Compound X2 | 462 | 7.4 | 0.078 |
| Comparative Example 3 | Comparative Example Compound X3 | 458 | 6.9 | 0.075 |
| Comparative Example 4 | Comparative Example Compound X4 | 459 | 5.6 | 0.076 |

Referring to Table 3, it is seen that both the Example light emitting diodes and the Comparative Example light emitting diodes emit light in a blue wavelength range having a maximum light emission wavelength of 470 nm or less. It can be seen that the Example light emitting diodes exhibit high external quantum efficiency values compared to the Comparative Examples light emitting diodes. In CIEy representing color coordinate values, the fact that Examples show smaller CIEy values than Comparative Examples confirms that the light emitting didoes of Examples emit a value closer to the color coordinate of pure blue light than the light emitting diodes of Comparative Examples and thus, exhibit high color purity. The light emitting diodes of Examples including the Example compounds in the emission layer may emit light having a maximum light emission wavelength equal to or less than about 470 nm and a color coordinate CIEy of less than about 0.075.

(2) Manufacture and Evaluation of Light Emitting Diode 2

<Manufacture of Light Emitting Diode 2>

Light emitting diodes of Examples and Comparative Examples were manufactured as follows. ITO was patterned on a glass substrate to form a first electrode. HAT-CN was deposited at a thickness of 100 Å to form a hole injection layer, TAPC was deposited at a thickness of 200 Å and Tris-PCz was deposited at a thickness of 100 Å to form a hole transport layer, and mCBP was deposited at a thickness of 50 Å to from an electron blocking layer. When an emission layer is formed, in Examples, “Example compound: assistant dopant: mCBP” was co-deposited at a ratio of 0.05:0.20:0.75:99 to form a layer having a thickness of 300 Å, and in Comparative Examples, “Comparative Example compound: assistant dopant: mCBP” was co-deposited at a ratio of 0.05:0.20:0.75:99 to form a layer having a thickness of 300 Å. Compound AD-1 was used as an assistant dopant.

On the emission layer, SF3-TRZ was used to form a layer having a thickness of 100 Å, and SF3-TRZ:Liq was used to form a layer having a thickness of 250 Å, and Liq was used to form a layer having a thickness of 20 Å, thereby forming an electron transport region. Aluminum (Al) was used to form a second electrode having a thickness of 1000 Å.

The compounds of each functional layer used for manufacturing the light emitting diode 2 are as follows.

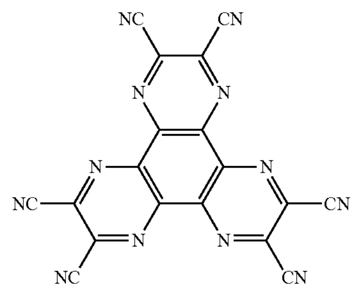

HAT-CN

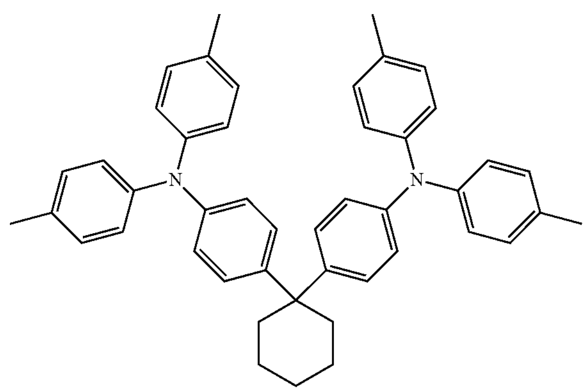

TAPC

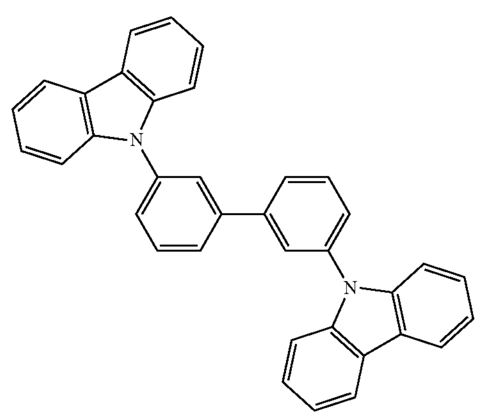

mCBP

-continued

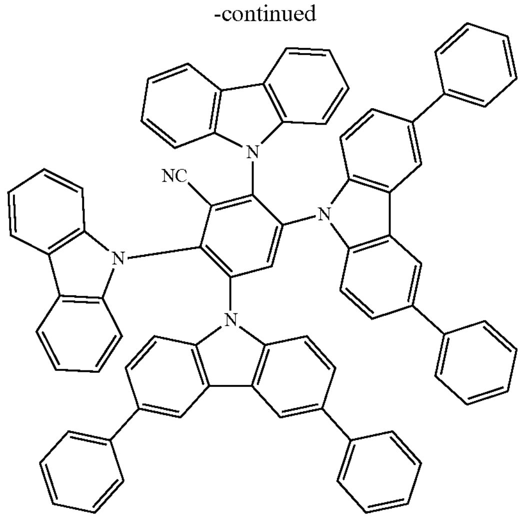

AD-1

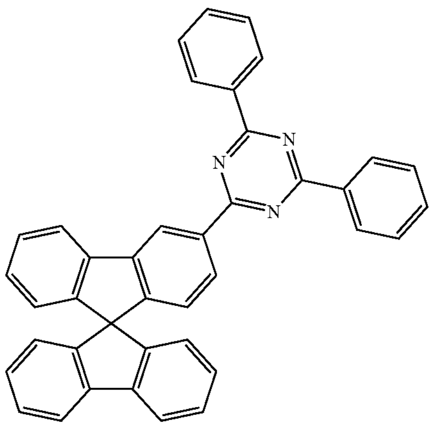

SF3-TRZ

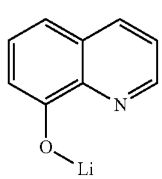

Liq

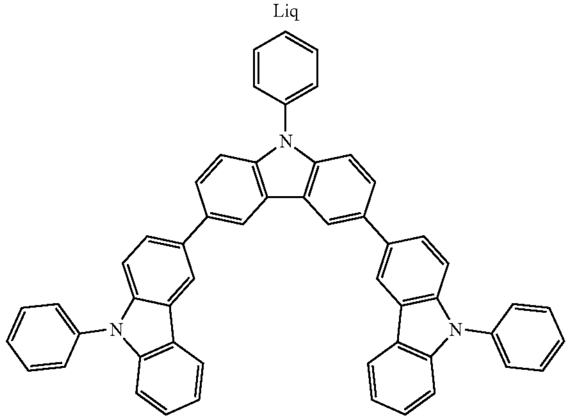

Tris-PCz

<Evaluation of Light Emitting Diode2>

Table 4 shows results of evaluating the light emitting diodes of Examples and Comparative Examples manufactured as manufacturing examples of the light emitting diode 2 described above.

Table 4 shows, in the light emitting diodes, maximum light emission wavelength ($\lambda_{max}$), external quantum efficiency (EQE) at 1000 cd/m$^2$, and relative diode lifespan expressed as a relative value compared to Comparative Example 1. The relative diode lifespan refers to a value shown relative to Comparative Example 1 for a time having a luminance value of 50% from the initial luminance when continuously driven at 1000 cd/m$^2$.

TABLE 4

| (Example of Manufacturing diodes) | Emission layer | λmax (Nm) | EQE (%) | Relative diode lifespan (%) |
|---|---|---|---|---|
| Example 1 | Example Compound 5 | 461 | 15.4 | 1.24 |
| Example 2 | Example Compound 13 | 464 | 15.7 | 1.26 |
| Example 3 | Example Compound 168 | 462 | 17.0 | 1.78 |
| Example 4 | Example Compound 177 | 460 | 15.8 | 1.57 |
| Example 5 | Example Compound 178 | 461 | 16.3 | 1.49 |
| Example 6 | Example Compound 189 | 459 | 16.1 | 1.45 |
| Comparative Example 1 | Comparative Example Compound X1 | 465 | 14.8 | 1.00 |
| Comparative Example 2 | Comparative Example Compound X2 | 462 | 15.1 | 1.02 |
| Comparative Example 3 | Comparative Example Compound X3 | 458 | 14.4 | 0.91 |
| Comparative Example 4 | Comparative Example Compound X4 | 459 | 12.3 | 0.93 |

Referring to Table 4, it is seen that both the Example light emitting diodes and the Comparative Example light emitting diodes emit light in a blue wavelength range having a maximum light emission wavelength of 470 nm or less. It can be seen that the Example light emitting diodes exhibit high external quantum efficiency values compared to the Comparative Examples light emitting diodes. In the evaluation of the relative diode lifespan, it is seen that Examples exhibit superior lifespan characteristics to Comparative Examples.

It can be seen that the polycyclic compound of an embodiment includes a core in which indolocarbazole is condensed in addition to a condensed ring including B and N as ring-forming atoms, and thus have improved electrochemical stability to exhibit excellent lifespan characteristics. The polycyclic compound of an embodiment includes a core structure in which indolocarbazole is condensed in addition to a condensed ring including B and N, and thus may exhibit both excellent luminous efficiency characteristics and improved lifespan characteristics.

A light emitting diode according to an embodiment includes a polycyclic compound according to an embodiment, and may thus exhibit high efficiency and long lifespan characteristics.

A polycyclic compound of an embodiment may be used as a light emitting material for achieving improved characteristics of a light emitting diode with high efficiency and long lifespan.

Embodiments have been disclosed herein, and although terms are employed, they are used and are to be interpreted in a generic and descriptive sense only and not for purpose of limitation. In some instances, as would be apparent by one of ordinary skill in the art, features, characteristics, and/or elements described in connection with an embodiment may be used singly or in combination with features, characteristics, and/or elements described in connection with other embodiments unless otherwise specifically indicated. Accordingly, it will be understood by those of ordinary skill in the art that various changes in form and details may be made without departing from the spirit and scope of the disclosure as set forth in the following claims.

What is claimed is:

1. A light emitting diode comprising:

a first electrode;

a second electrode disposed on the first electrode; and at least one functional layer disposed between the first electrode and the second electrode, wherein the at least one functional layer includes a polycyclic compound represented by Formula 1:

[Formula 1]

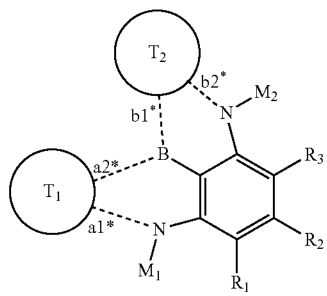

wherein in Formula 1, $R_1$ to $R_3$, $M_1$, and $M_2$ are each independently a hydrogen atom, a deuterium atom, a halogen atom, a cyano group, a substituted or unsubstituted oxy group, a substituted or unsubstituted thio group, a substituted or unsubstituted boryl group, a substituted or unsubstituted amine group, a substituted or unsubstituted silyl group, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms, or are bonded to an adjacent group to form a ring, $T_1$ and $T_2$ are each independently a substituted or unsubstituted hydrocarbon ring having 6 to 30 ring-forming carbon atoms, or a substituted or unsubstituted heterocycle having 5 to 30 ring-forming carbon atoms, at least one of $T_1$ or $T_2$ is a group represented by Formula 2, a1* and a2* are sites where $T_1$ is bonded, and b1* and b2* are sites where $T_2$ is bonded,

[Formula 2]

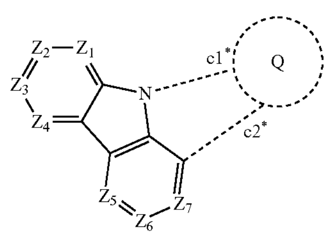

wherein in Formula 2,

Q is 0 or 1, when Q is 0, the group represented by Formula 2 is bonded to Formula 1 at sites c1* and c2*, when Q is 1, the group represented by Formula 2 is bonded to Formula 1 through Q or the group represented by Formula 2 is bonded to Formula 1 at two neighboring sites selected from $Z_1$ to $Z_7$, Q is a substituted or unsubstituted hydrocarbon ring having 6 to 30 ring-forming carbon atoms, or a substituted or unsubstituted heterocycle having 5 to 30 ring-forming carbon atoms, $Z_1$ to $Z_7$ are each independently N or $C(R_a)$, and $R_a$ is a hydrogen atom, a deuterium atom, a halogen atom, a cyano group, a substituted or unsubstituted oxy group, a substituted or unsubstituted thio group, a substituted or unsubstituted boryl group, a substituted or unsubstituted amine group, a substituted or unsubstituted silyl group, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms, or is bonded to an adjacent group to form a ring, and wherein the light emitting diode emits light having a maximum light emission wavelength equal to or less than about 470 nm and having a CIEy of less than about 0.075.

2. The light emitting diode of claim 1, wherein the at least one functional layer comprises:

an emission layer;

a hole transport region disposed between the first electrode and the emission layer; and an electron transport region disposed between the emission layer and the second electrode, and the emission layer includes the polycyclic compound.

3. The light emitting diode of claim 2, wherein the emission layer emits delayed fluorescence.

4. The light emitting diode of claim 2, wherein:

the emission layer comprises:

a host;

an assistant dopant; and a light emitting dopant, the assistant dopant includes a compound represented by Formula A; and the light emitting dopant includes the polycyclic compound,

[Formula A]

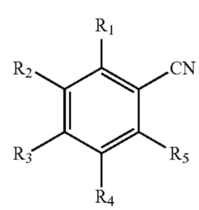

wherein in Formula A, at least one of $R_1$ to $R_5$ is a substituted or unsubstituted carbazole derivative, and the remainder of $R_1$ to $R_5$ are each independently a hydrogen atom, a deuterium atom, a hydroxy group, or a cyano group.

5. The light emitting diode of claim 4, wherein the group represented by Formula 2 is represented by one of Formulas 2-1 to 2-3:

[Formula 2-1]

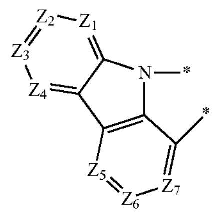

[Formula 2-2]

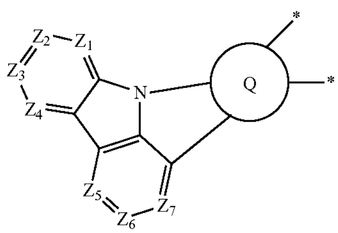

[Formula 2-3]

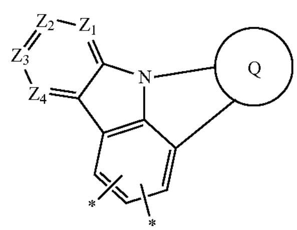

wherein in Formulas 2-1 to 2-3,

-* is a site bonded to a1* and a2* of Formula 1 or bonded to b1* and b2* of Formula 1, and Q and $Z_1$ to $Z_7$ are the same as defined in Formula 2.

6. The light emitting diode of claim 5, wherein in Formula 1, one of $T_1$ or $T_2$ is a substituted or unsubstituted benzene ring, and the other one of $T_1$ or $T_2$ is a group represented by one of Formulas 2-1 to 2-3.

7. The light emitting diode of claim 4, wherein the polycyclic compound represented by Formula 1 is represented by one of Formulas 4-1 to 4-8:

4-1

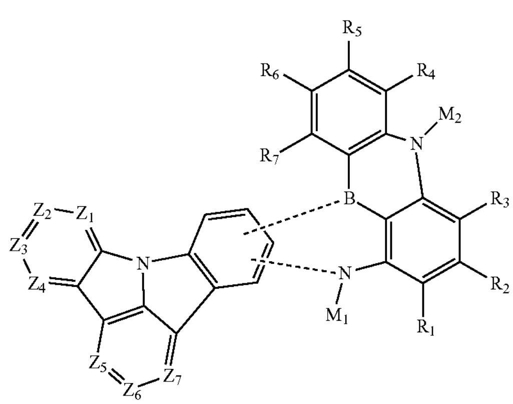

-continued 4-2

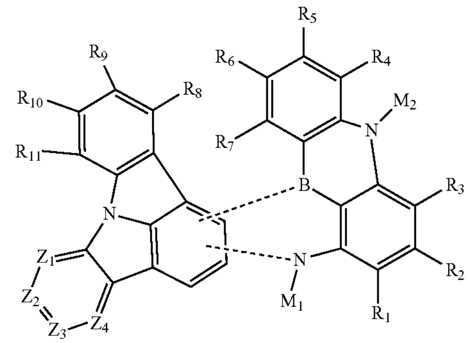

4-3

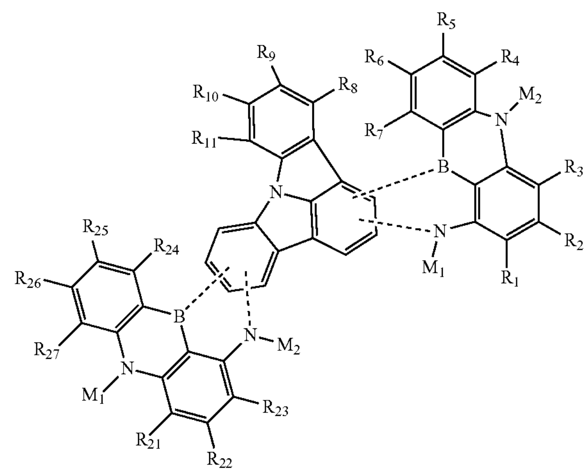

4-4

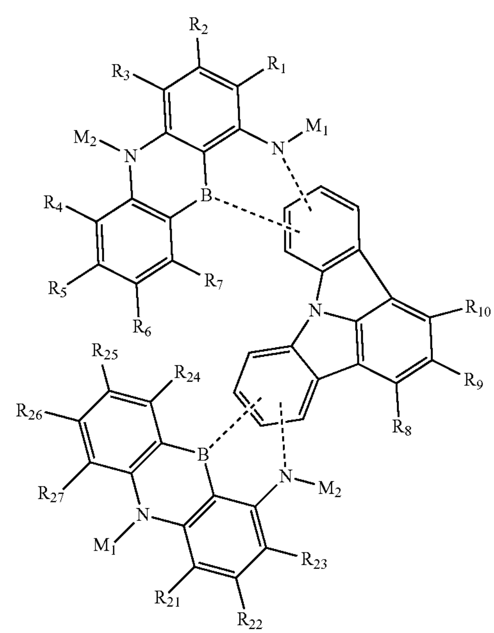

-continued 4-5

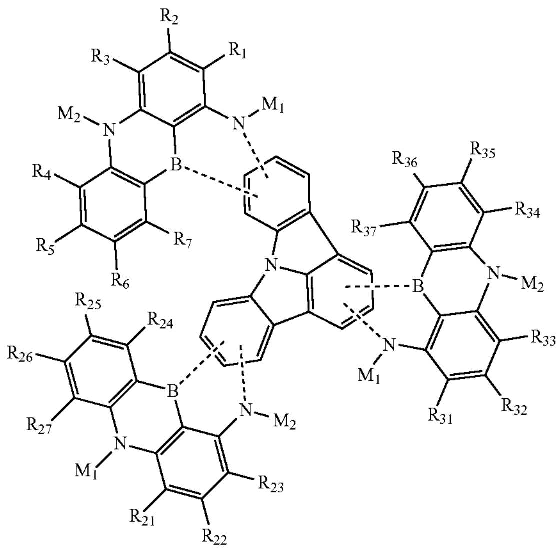

4-6

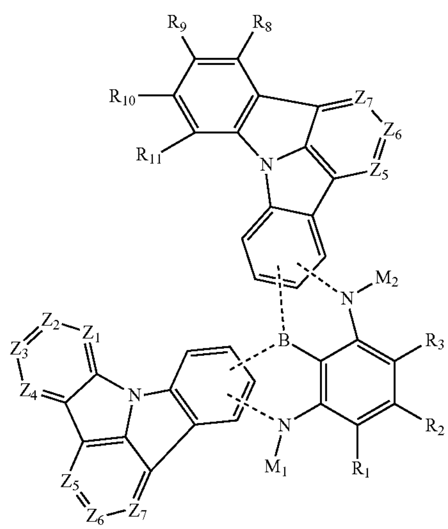

4-7

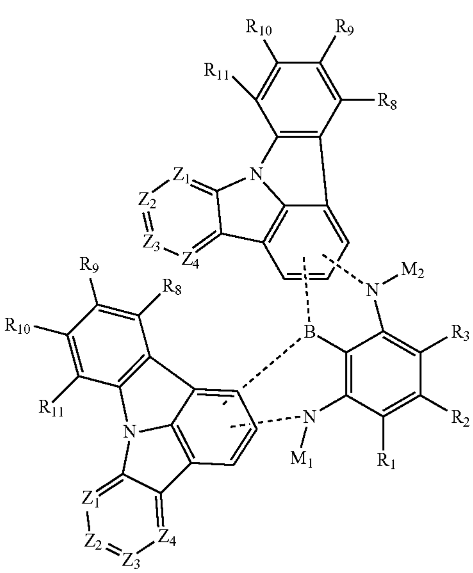

-continued 4-8

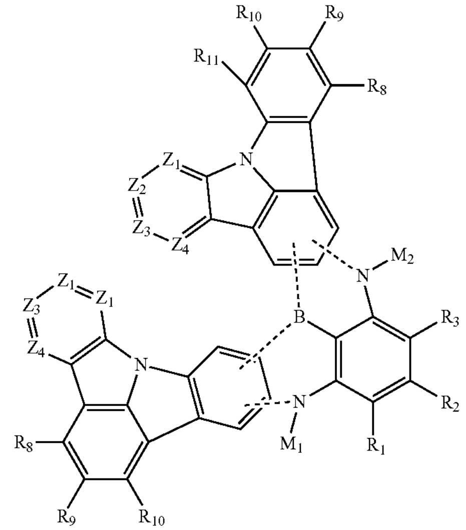

wherein in Formulas 4-1 to 4-8, $R_4$ to $R_{11}$, $R_{21}$ to $R_{27}$, and $R_{31}$ to $R_{37}$ are each independently a hydrogen atom, a deuterium atom, a halogen atom, a cyano group, a substituted or unsubstituted oxy group, a substituted or unsubstituted thio group, a substituted or unsubstituted boryl group, a substituted or unsubstituted amine group, a substituted or unsubstituted silyl group, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms, or are bonded to an adjacent group to form a ring, and $R_1$ to $R_3$, $M_1$, $M_2$, and $Z_1$ to $Z_7$ are the same as defined in Formulas 1 and 2.

8. The light emitting diode of claim 4, wherein in Formula 1, one of $T_1$ or $T_2$ is a group represented by Formula 2, and the other one of $T_1$ or $T_2$ is a group represented by one of T-a to T-e:

T-a

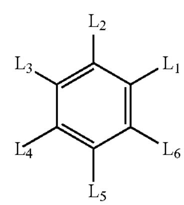

T-b

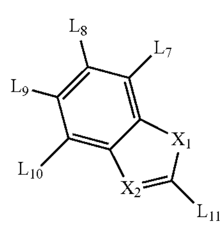

-continued

T-c

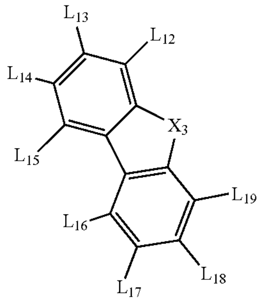

T-d

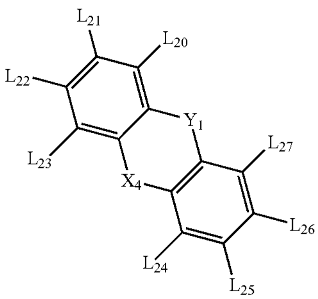

T-e

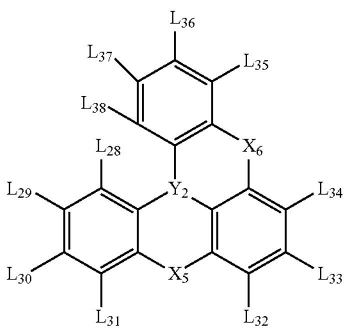

wherein in T-a to T-e, $X_1$ to $X_6$ are each independently N, O, S, N($R_b$), or C($R_c$)($R_a$), $Y_1$ and $Y_2$ are each independently O, S, B($R_e$), or P(=O)($R_f$), $L_1$ to $L_{38}$, and $R_b$ to $R_f$ are each independently a hydrogen atom, a deuterium atom, a halogen atom, a cyano group, a substituted or unsubstituted oxy group, a substituted or unsubstituted thio group, a substituted or unsubstituted boryl group, a substituted or unsubstituted amine group, a substituted or unsubstituted silyl group, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms, or are bonded to an adjacent group to form a ring, except that two neighboring sites selected from $L_1$ to $L_{38}$, and $X_1$ to $X_6$ correspond to a1* and a2* or correspond to b1* and b2*.

9. The light emitting diode of claim 8, wherein the polycyclic compound represented by Formula 1 is represented by one of Formulas 5-1 to 5-9:

5-1

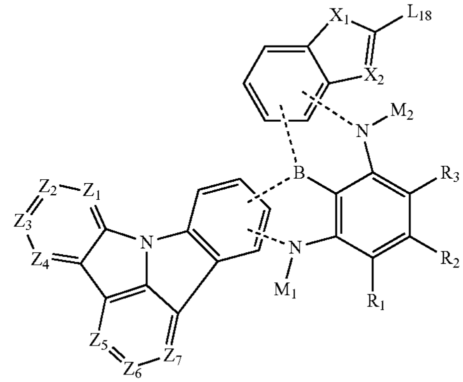

5-2

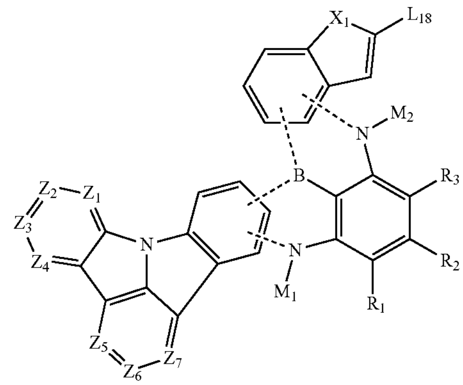

5-3

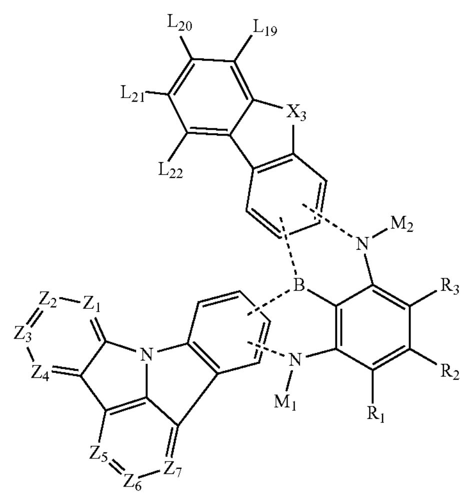

-continued
5-4
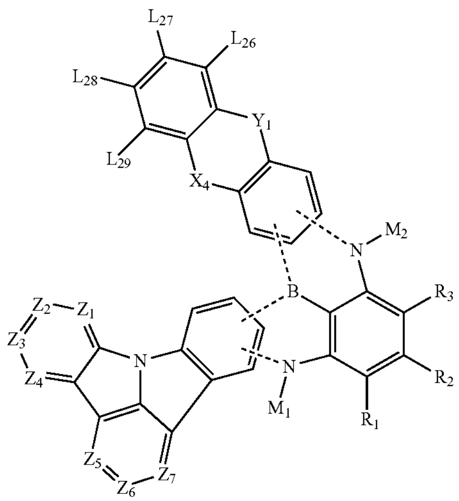
5-5
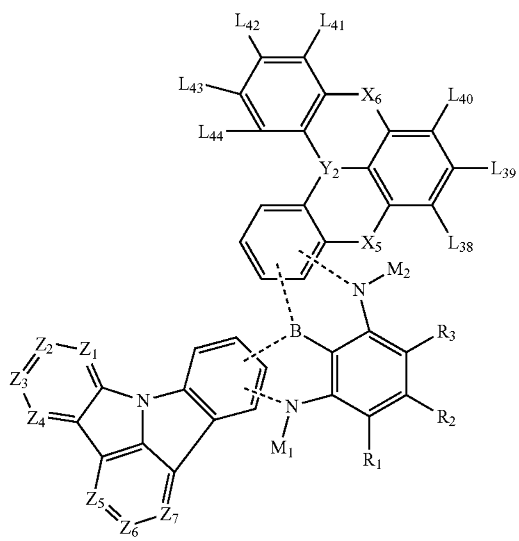
5-6
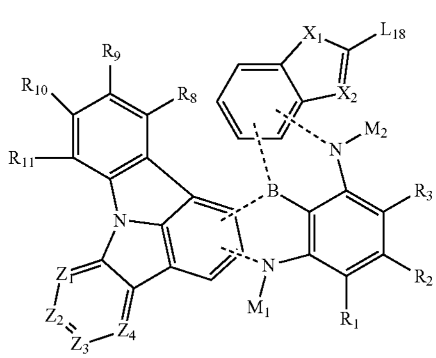
-continued
5-7
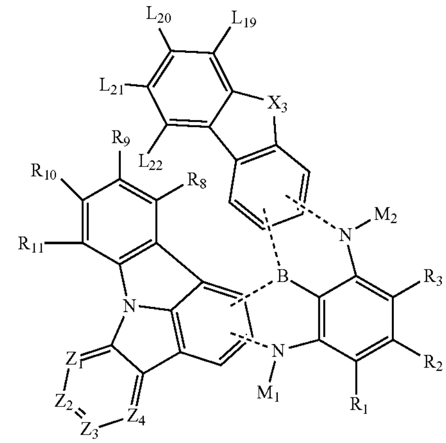
5-8
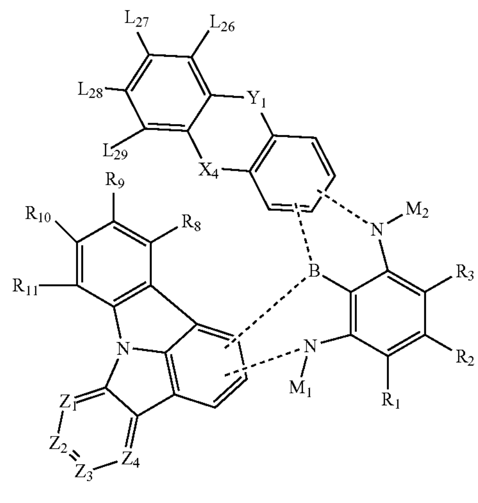
5-9
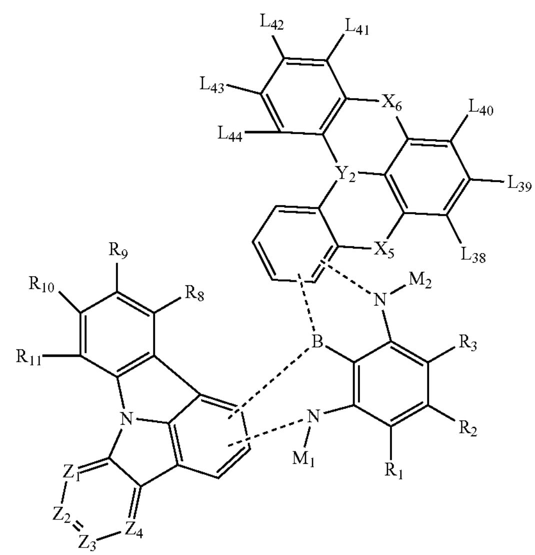
wherein in Formulas 5-1 to 5-9,
$X_1$ to $X_6$, $Y_1$, $Y_2$, $L_{18}$ to $L_{21}$, $L_{26}$ to $L_{29}$, and $L_{38}$ to $L_{44}$ are the same as defined in T-a to T-e, and
$R_1$ to $R_3$, $M_1$, $M_2$, and $Z_1$ to $Z_7$ are the same as defined in Formulas 1 and 2.

10. The light emitting diode of claim 1, wherein in Formula 1, $R_1$ to $R_3$, $M_1$, $M_2$, $T_1$, and $T_2$ are each independently a deuterium atom or a substituent including a deuterium atom.

11. A light emitting diode comprising;

a first electrode;

a second electrode disposed on the first electrode; and at least one functional layer disposed between the first electrode and the second electrode, wherein the at least one functional layer includes a polycyclic compound represented by Formula 1:

[Formula 1]

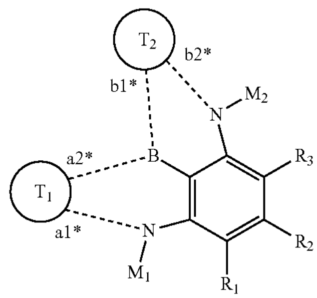

wherein in Formula 1, $R_1$ to $R_3$, $M_1$, and $M_2$ are each independently a hydrogen atom, a deuterium atom, a halogen atom, a cyano group, a substituted or unsubstituted oxy group, a substituted or unsubstituted thio group, a substituted or unsubstituted boryl group, a substituted or unsubstituted amine group, a substituted or unsubstituted silyl group, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms, or are bonded to an adjacent group to form a ring, $T_1$ and $T_2$ are each independently a substituted or unsubstituted hydrocarbon ring having 6 to 30 ring-forming carbon atoms, or a substituted or unsubstituted heterocycle having 5 to 30 ring-forming carbon atoms, at least one of $T_1$ or $T_2$ is a group represented by Formula 2, a1* and a2* are sites where Ti is bonded, and b1* and b2* are sites where $T_2$ is bonded,

[Formula 2]

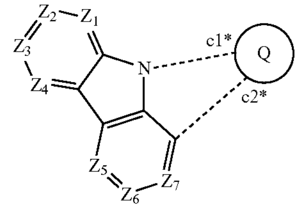

wherein in Formula 2,

Q is 0 or 1, when Q is 0, the group represented by Formula 2 is bonded to Formula 1 at sites c1* and c2*, when Q is 1, the group represented by Formula 2 is bonded to Formula 1 through Q or the group represented by Formula 2 is bonded to Formula 1 at two neighboring sites selected from $Z_1$ to $Z_7$, Q is a substituted or unsubstituted hydrocarbon ring having 6 to 30 ring-forming carbon atoms, or a substituted or unsubstituted heterocycle having 5 to 30 ring-forming carbon atoms, $Z_1$ to $Z_7$ are each independently N or $C(R_a)$, and $R_a$ is a hydrogen atom, a deuterium atom, a halogen atom, a cyano group, a substituted or unsubstituted oxy group, a substituted or unsubstituted thio group, a substituted or unsubstituted boryl group, a substituted or unsubstituted amine group, a substituted or unsubstituted silyl group, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms, or is bonded to an adjacent group to form a ring, and wherein the polycyclic compound has a molar absorption coefficient equal to or greater than about $4.0\times10^4$ $M^{-1}$ $cm^{-1}$ at about 450 nm.

12. The light emitting diode of claim 4, wherein the polycyclic compound represented by Formula 1 is one selected from Compound Group 1:

[Compound Group 1]

1

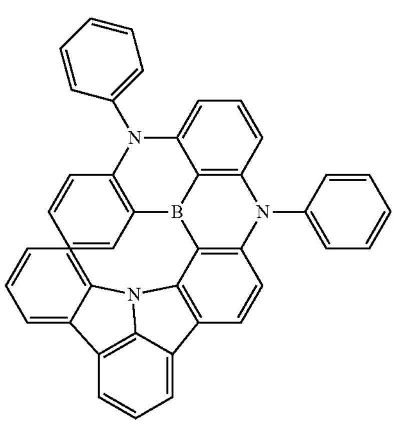

2

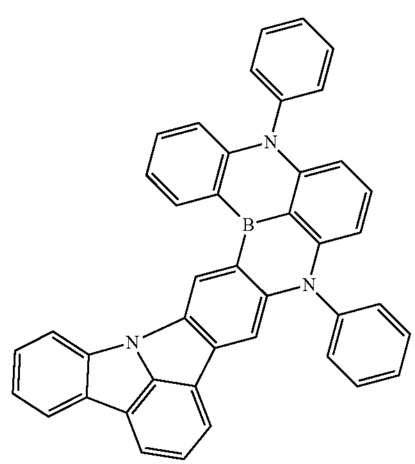

-continued
4
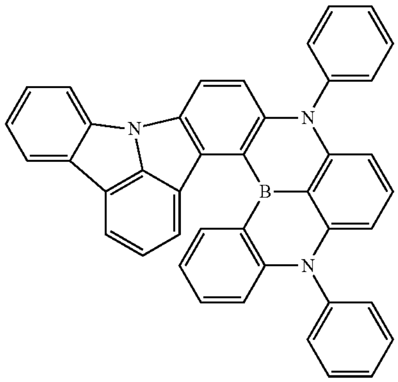
5
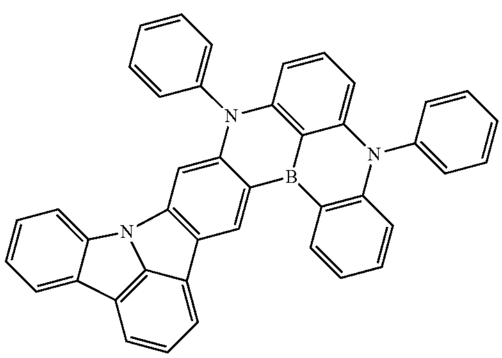
6
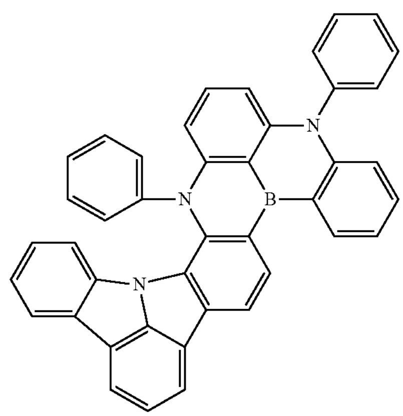
7
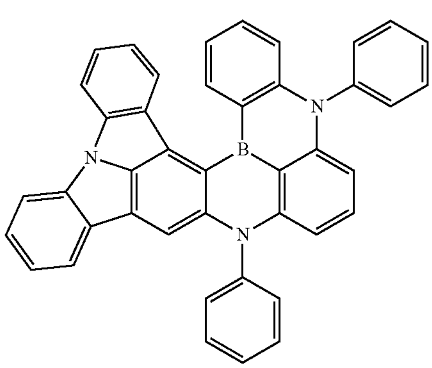

-continued
8
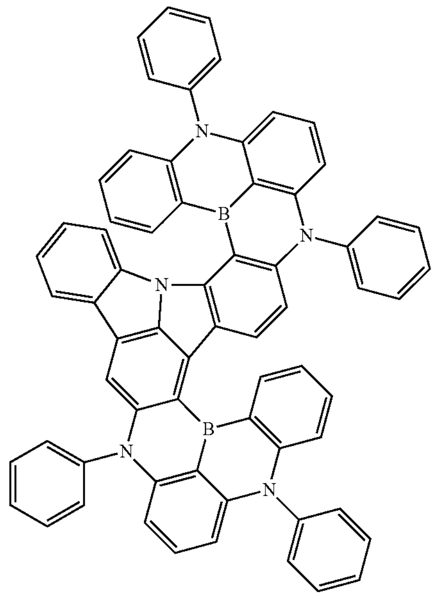
9
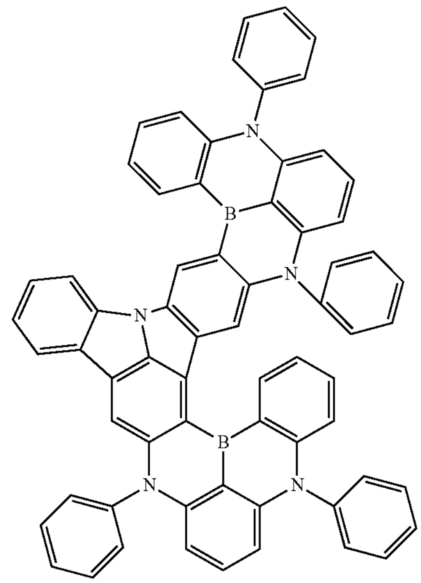
10
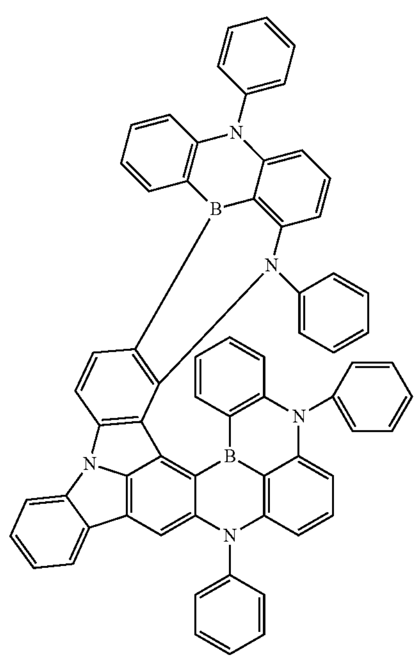
11
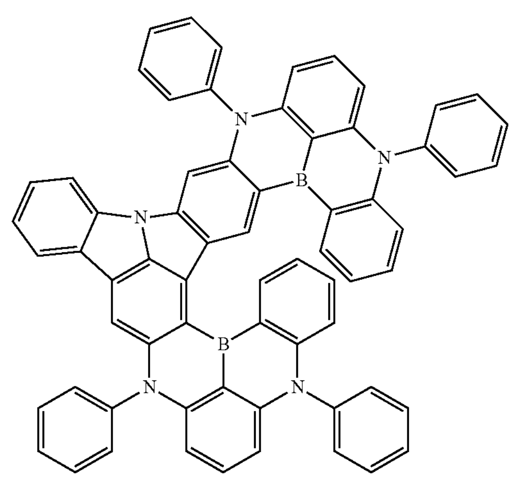

-continued
12
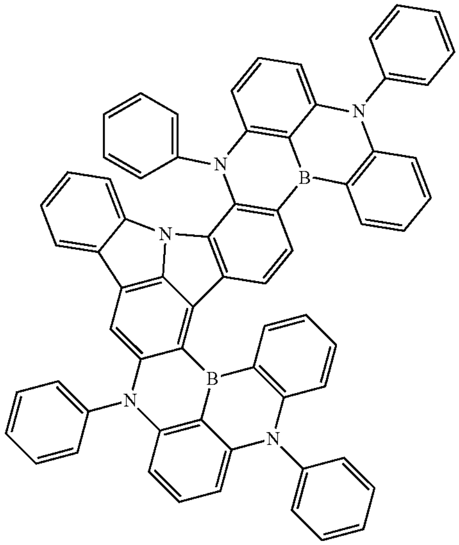
13
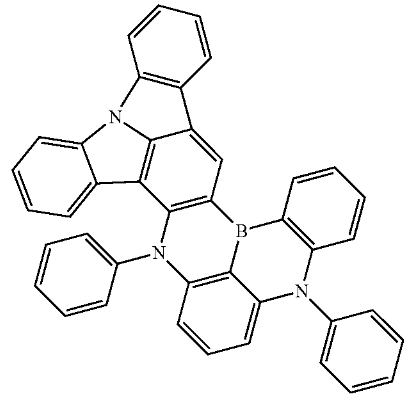
14
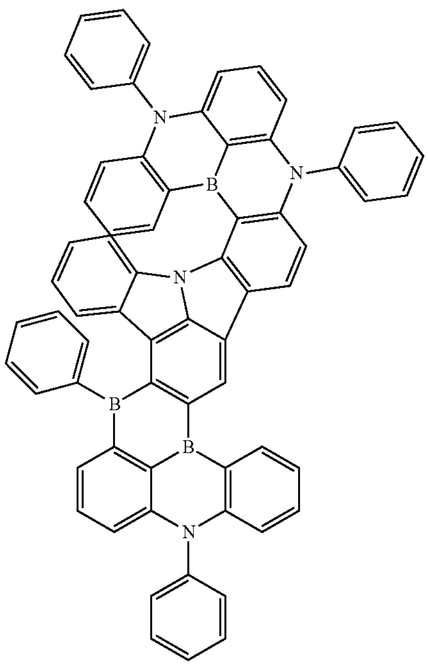
15
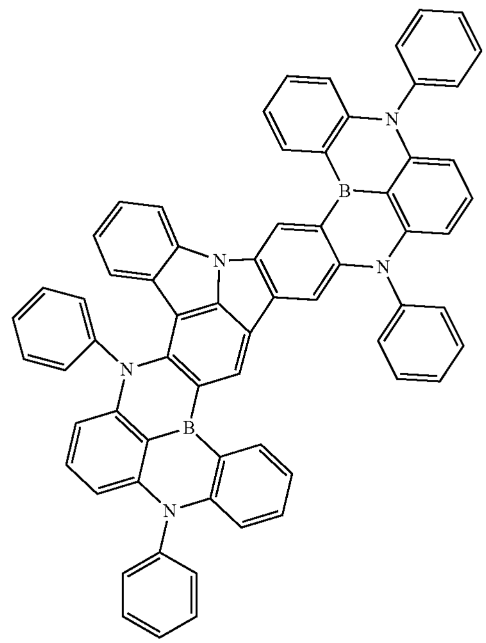
16
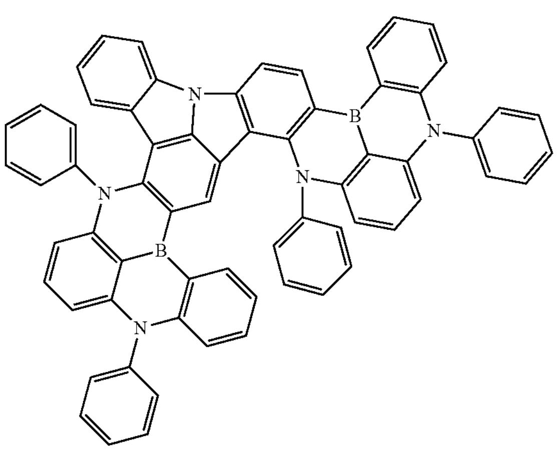
17
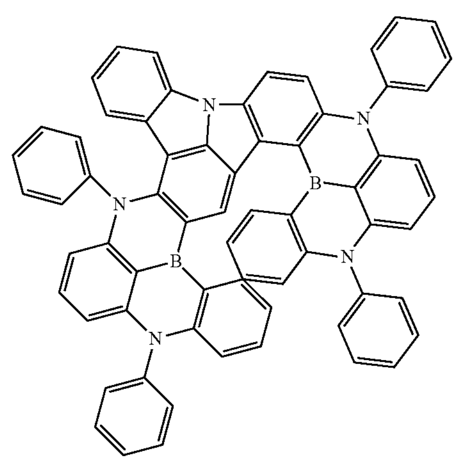

-continued
18
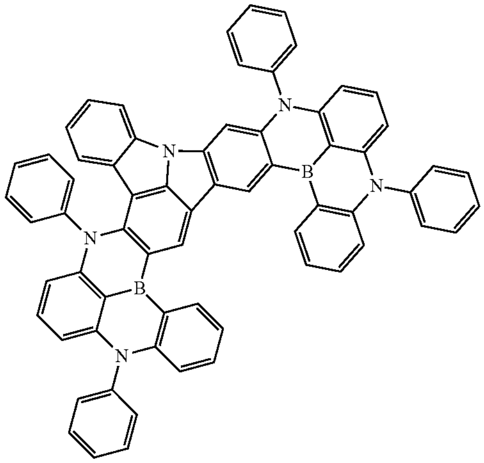
19
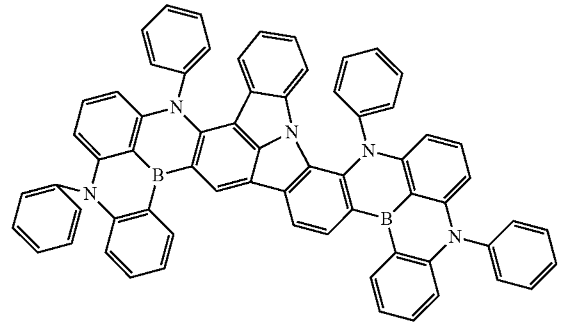
20
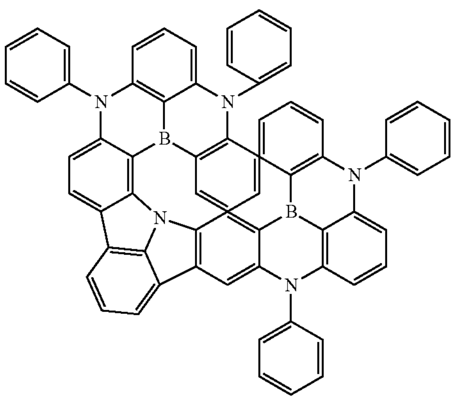
21
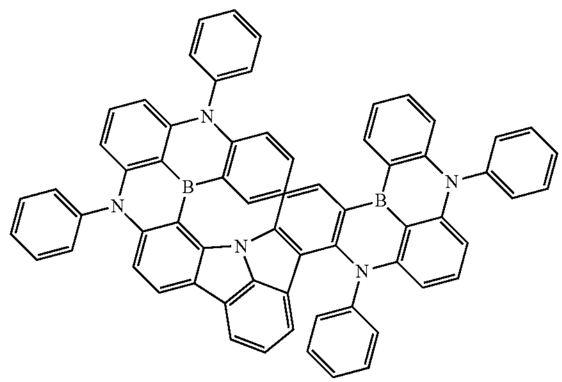
22
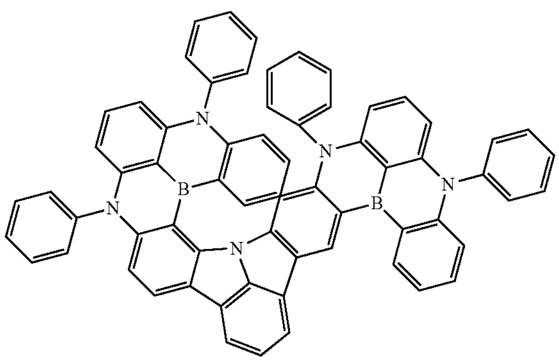
23
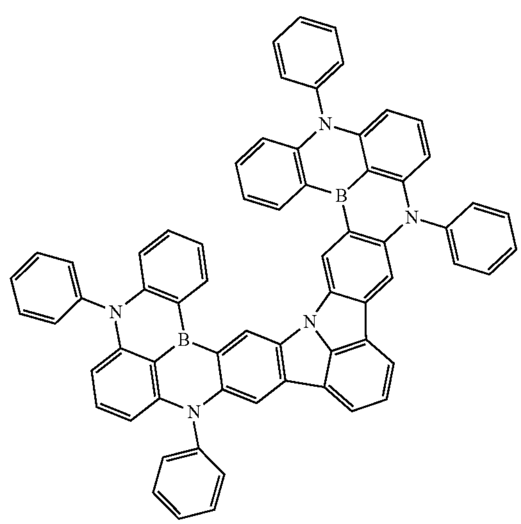

-continued
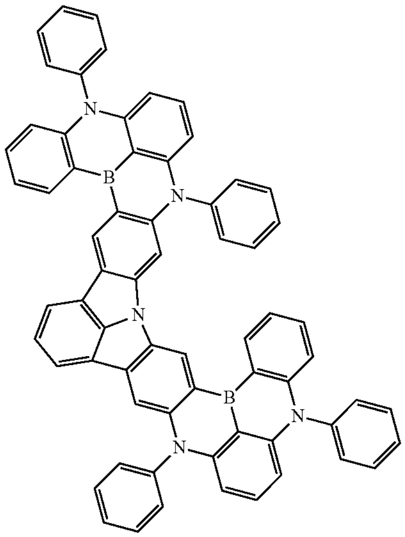
24
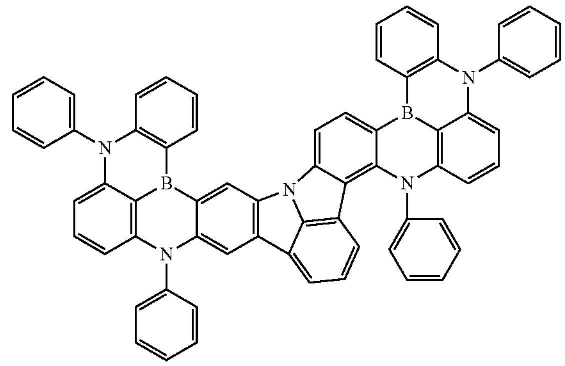
25
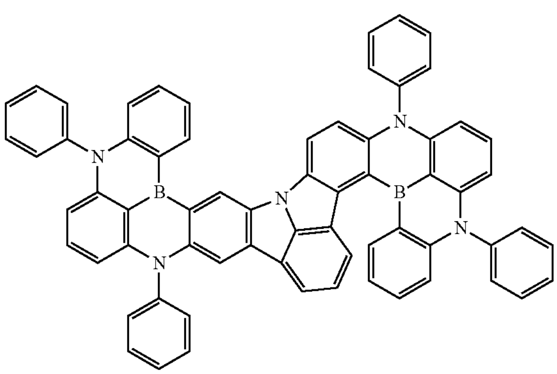
26
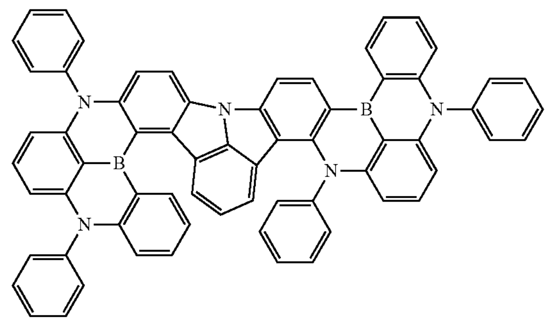
27
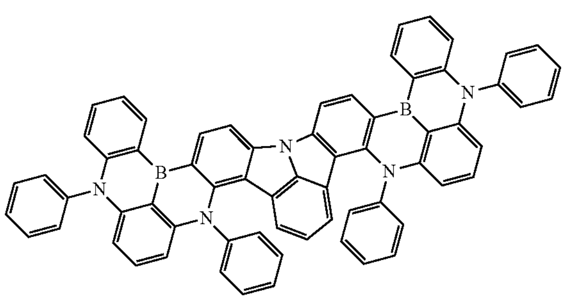
28
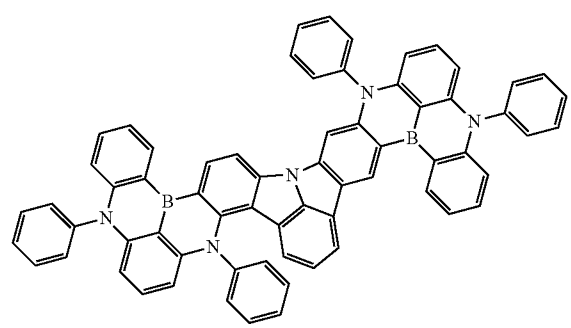
29

-continued
30
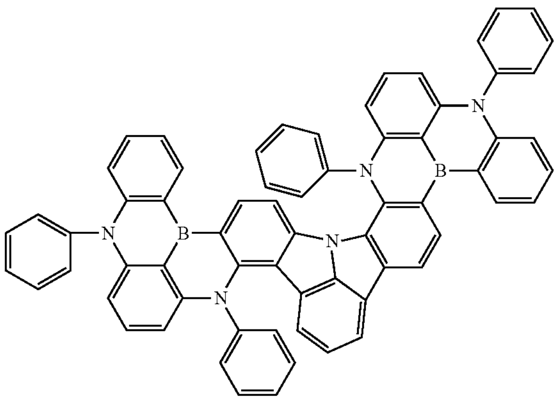
31
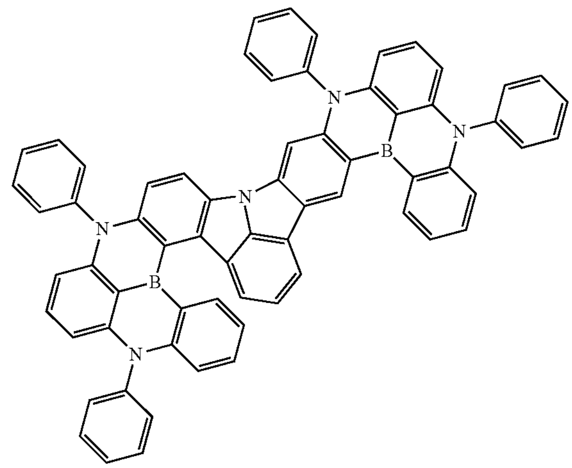
32
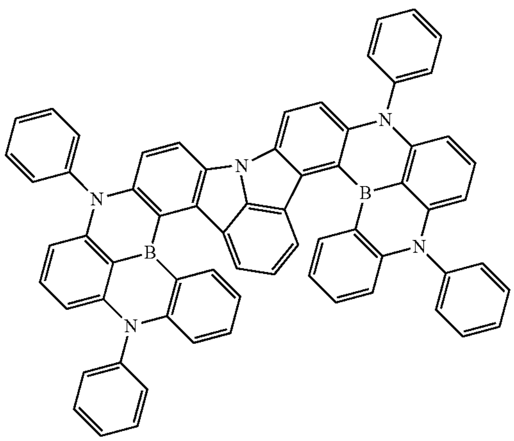
33
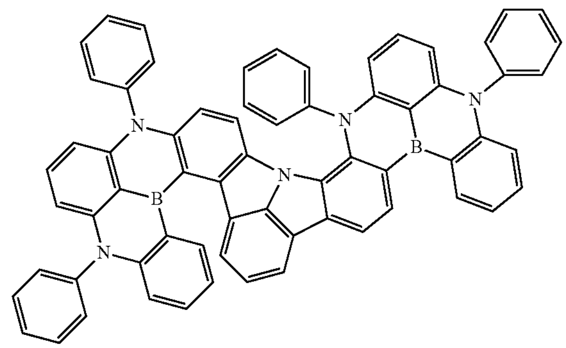
34
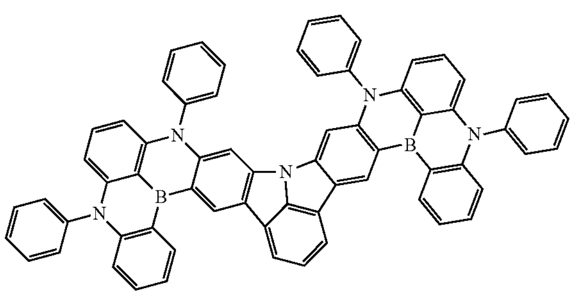
35
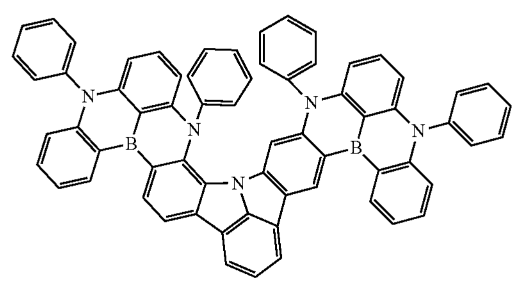
36
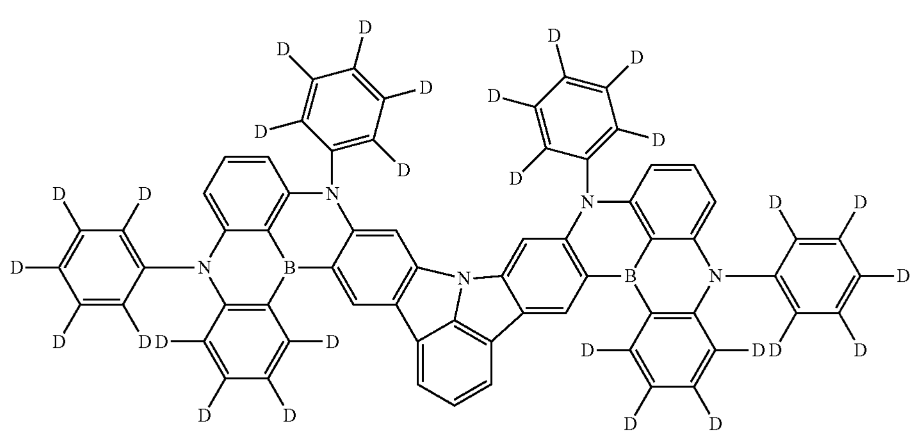

-continued
37
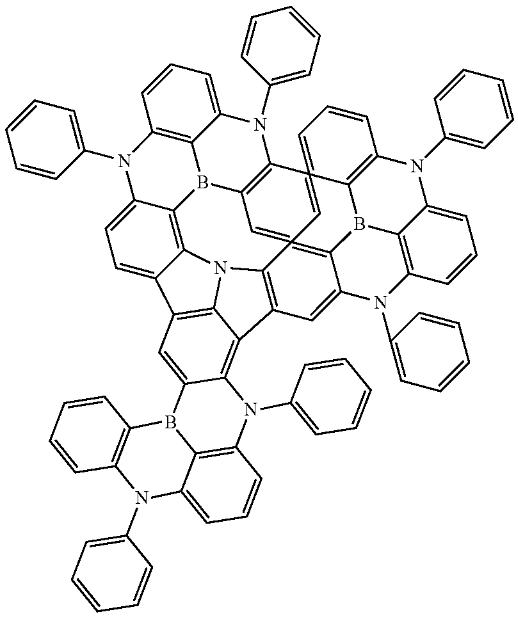
38
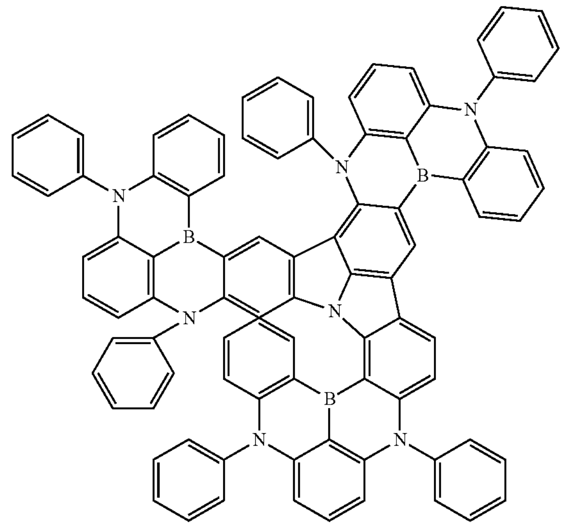
39
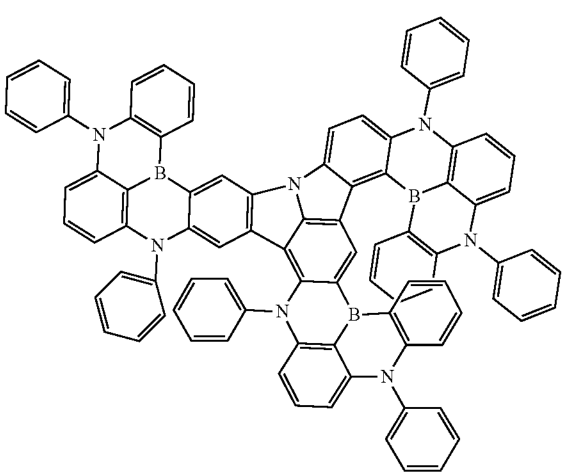
40
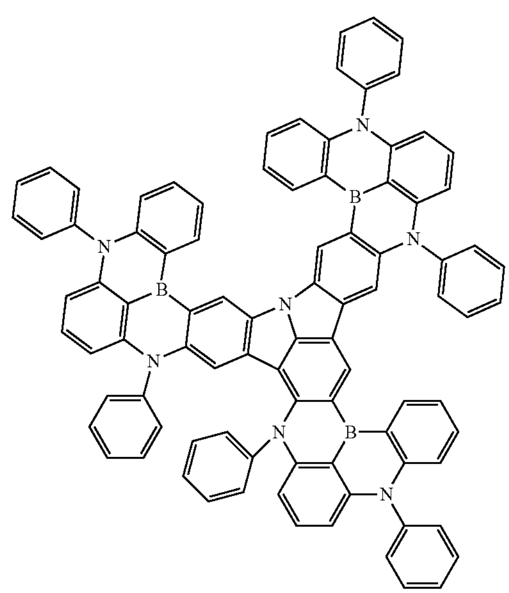

-continued
41
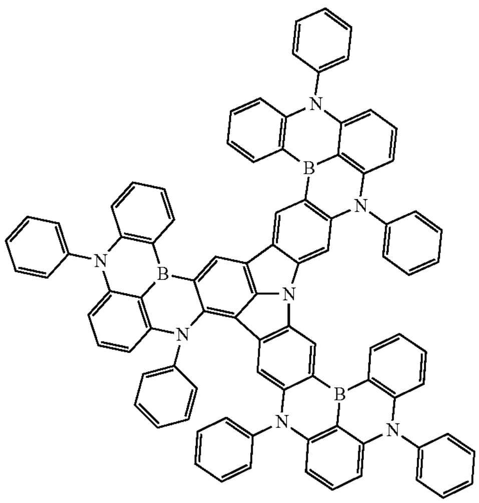
42
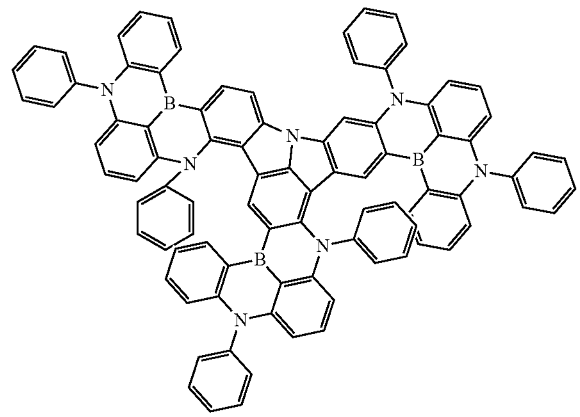
43
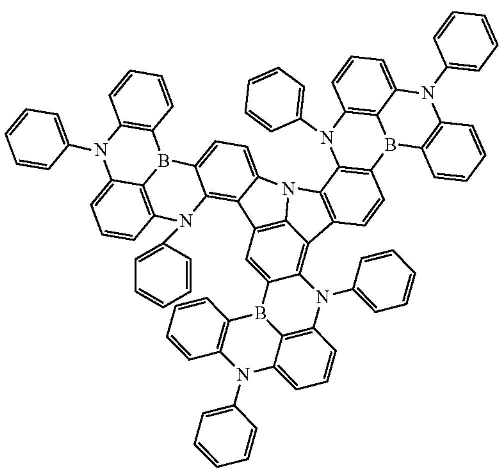
44
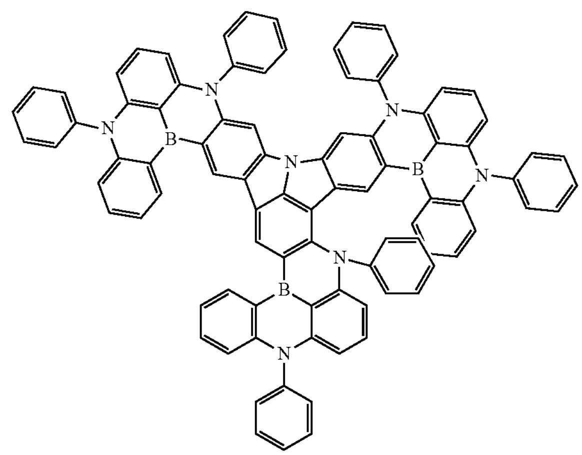
45
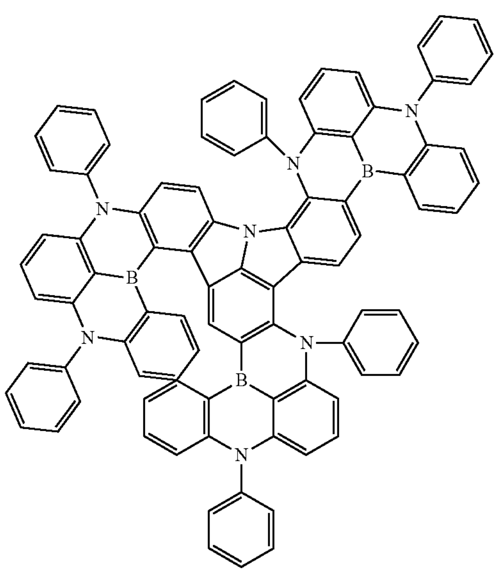
46
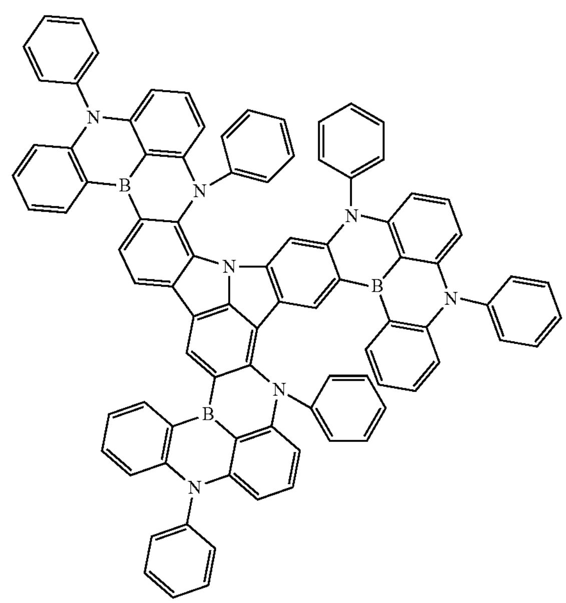

-continued
47
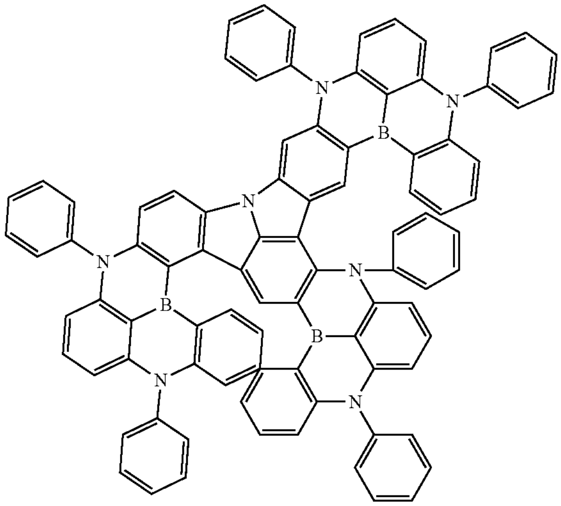
48
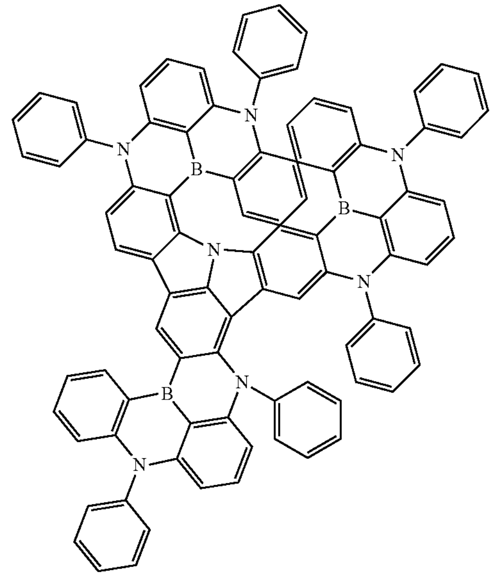
49
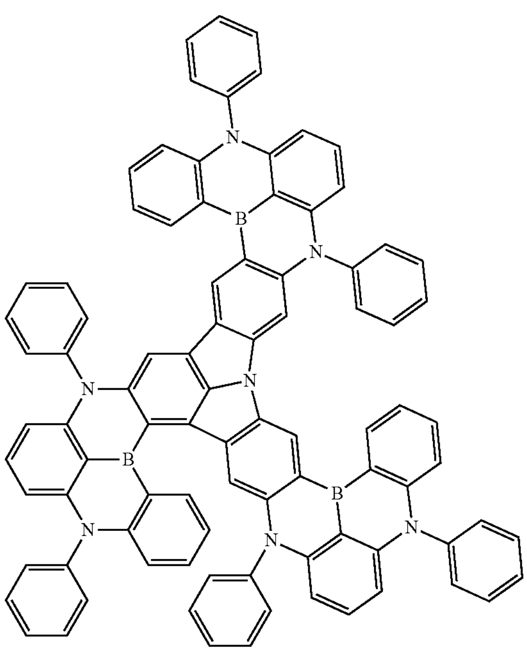
50
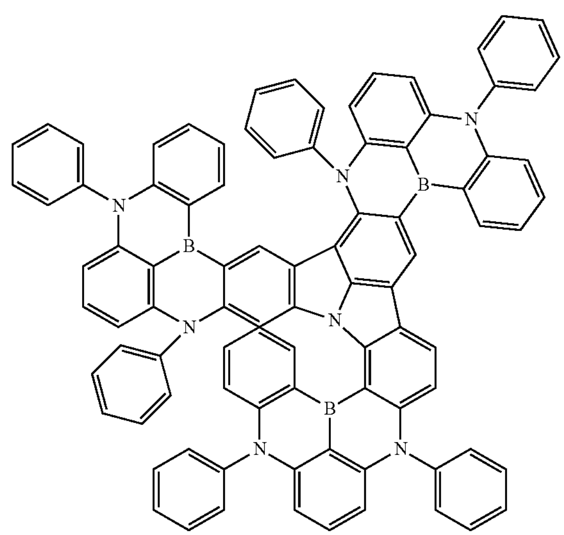

-continued
51
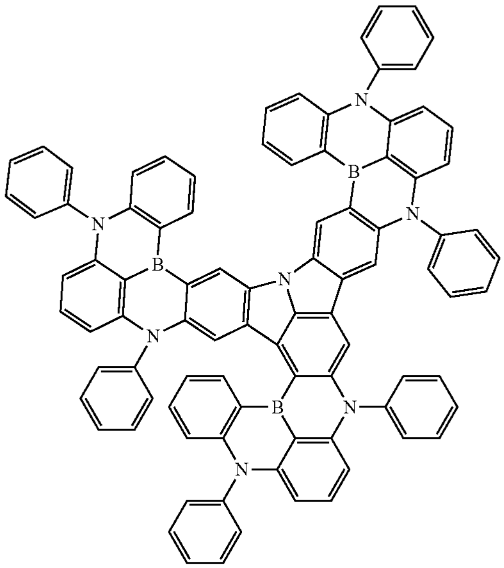
52
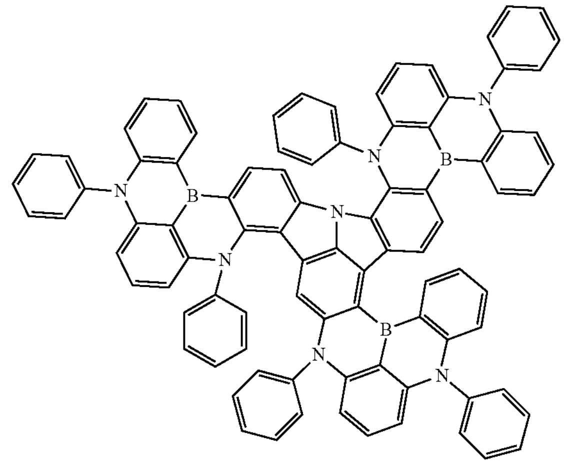
53
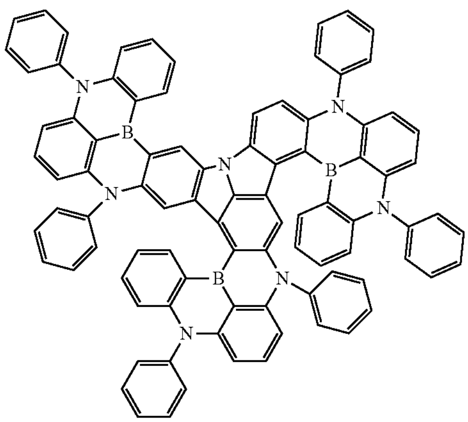
54
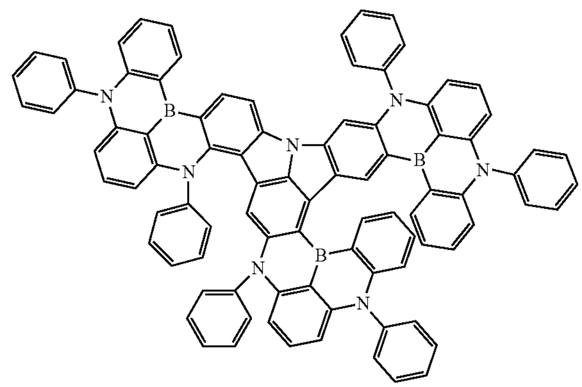
55
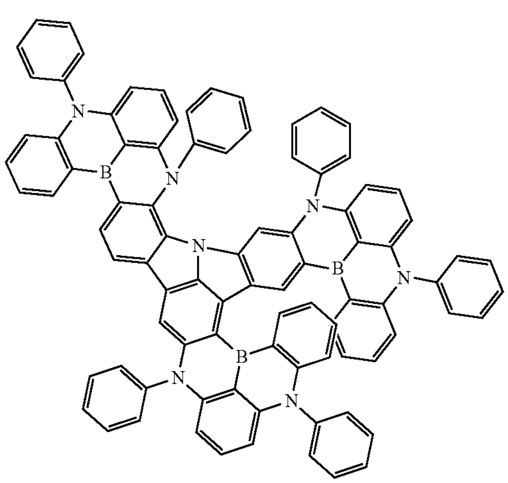
56
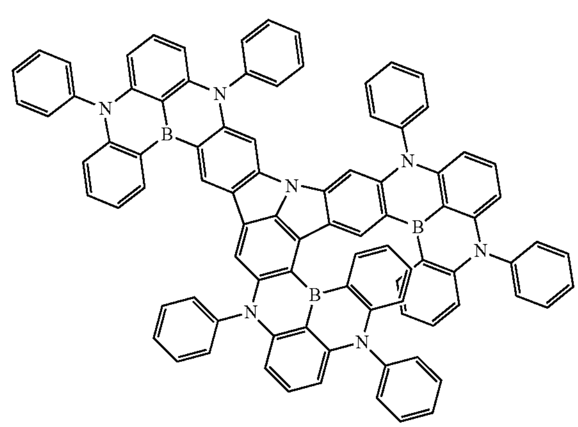

-continued
57
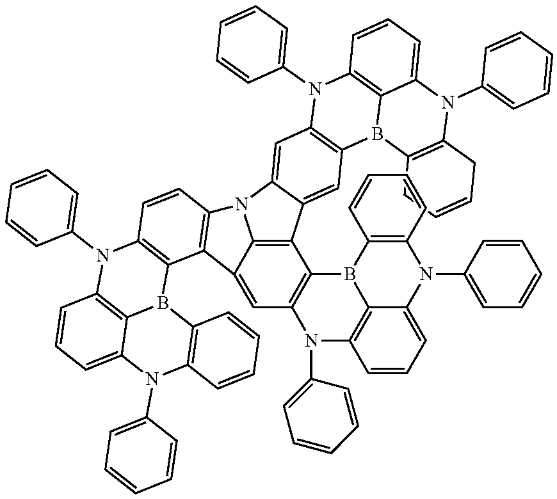
58
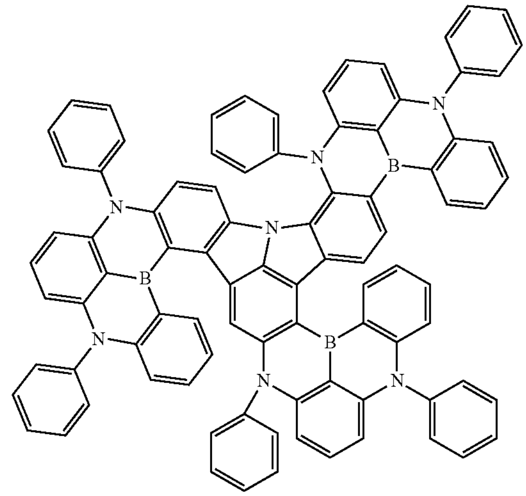
59
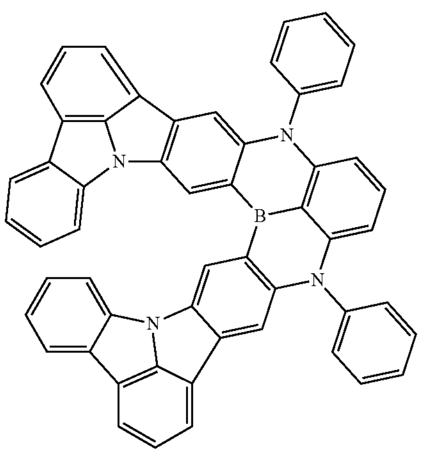
60
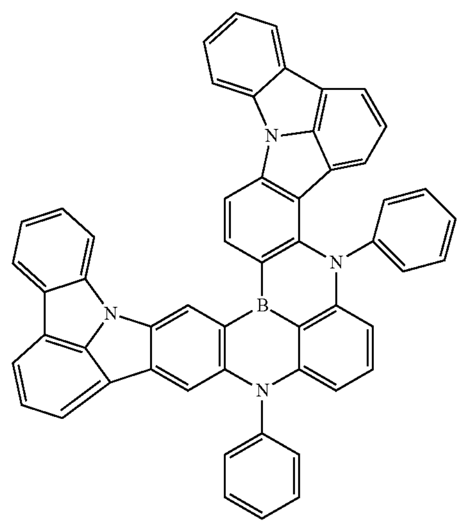
61
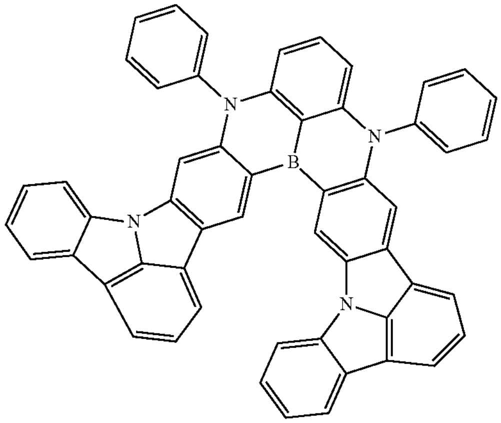
62
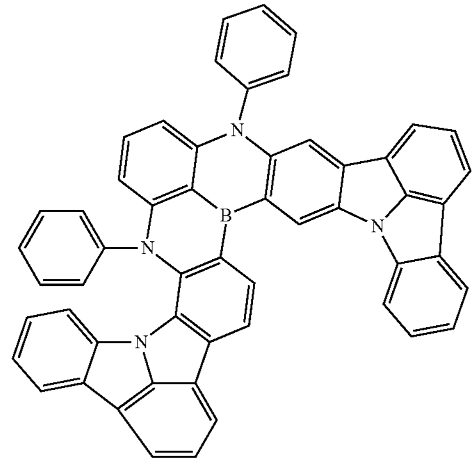

-continued
63
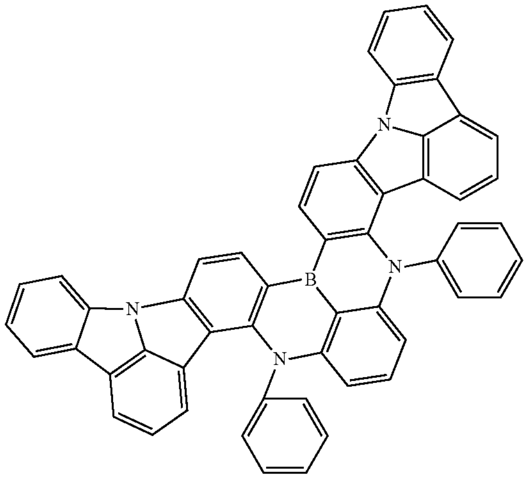
64
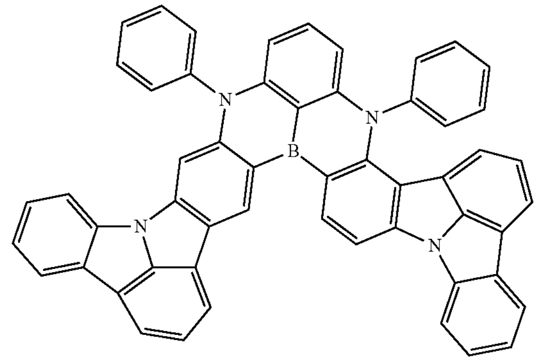
65
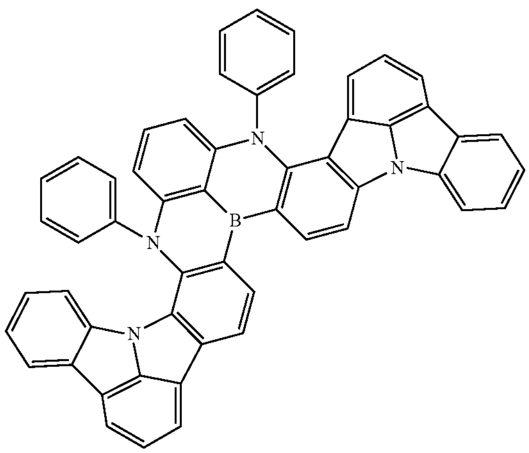
66
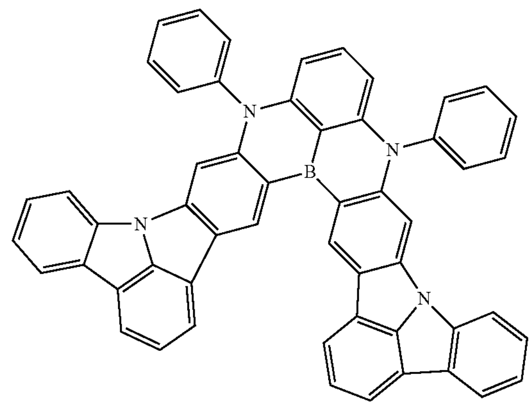
67
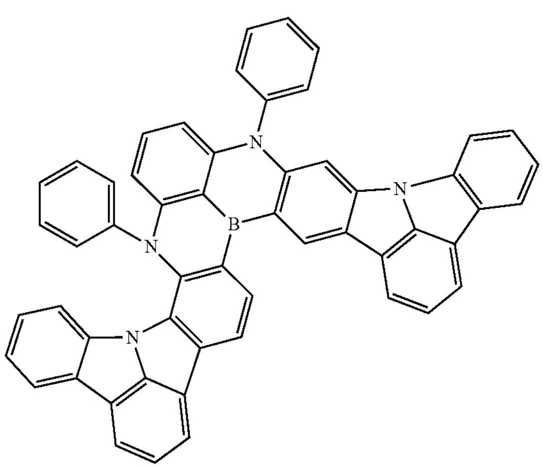
68
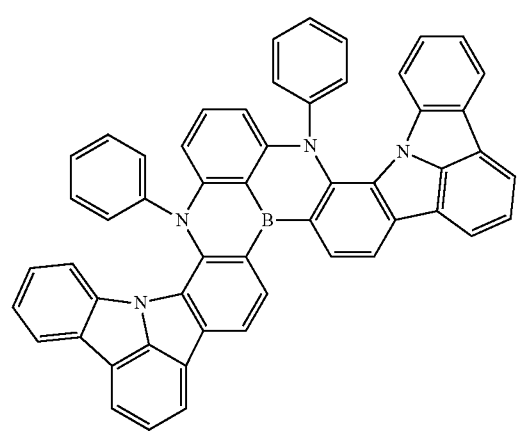

-continued
69
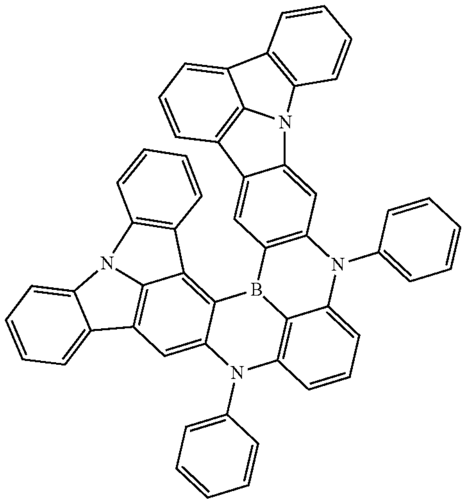
70
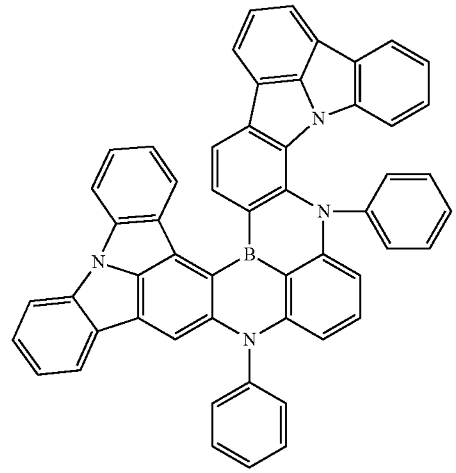
71
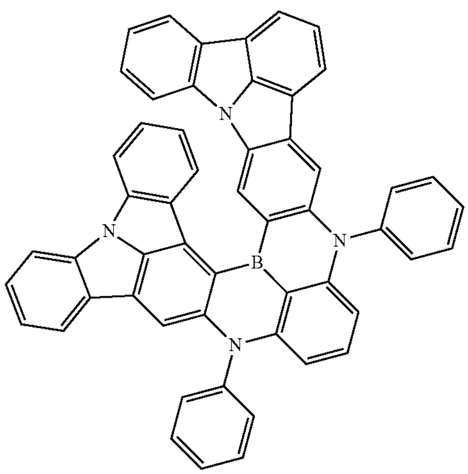
72
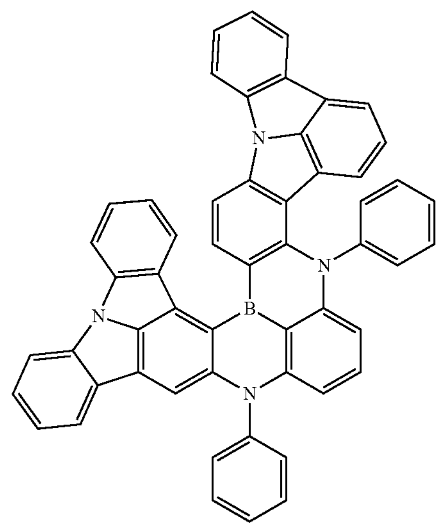
73
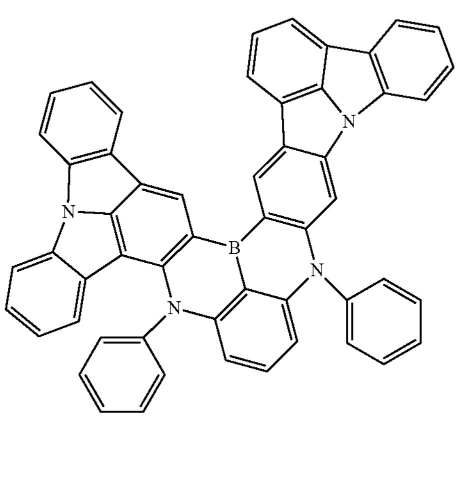
74
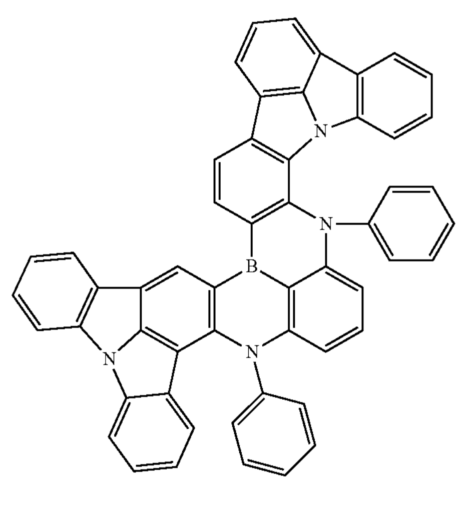

-continued
75
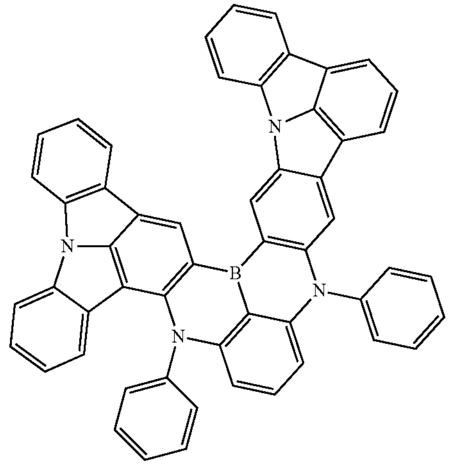
76
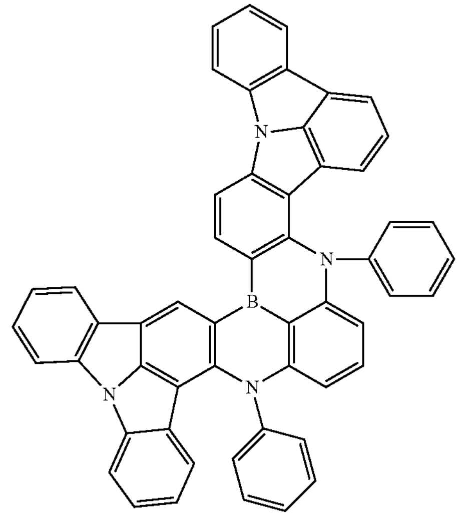
77
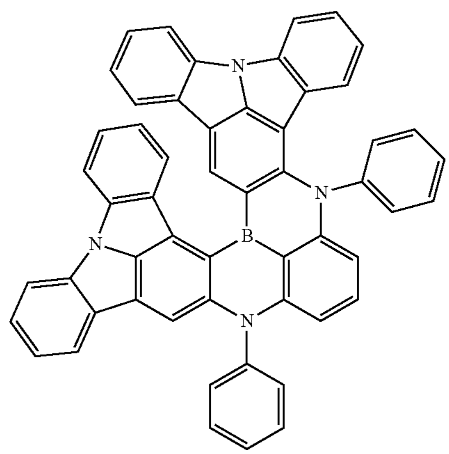
78
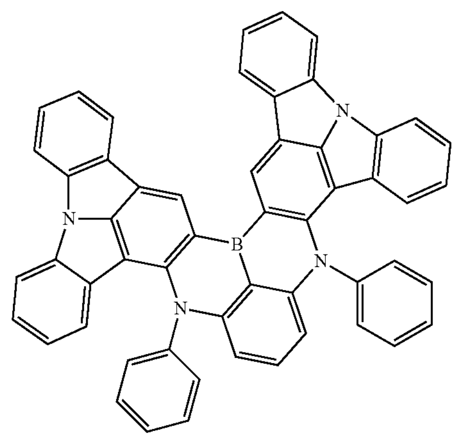
79
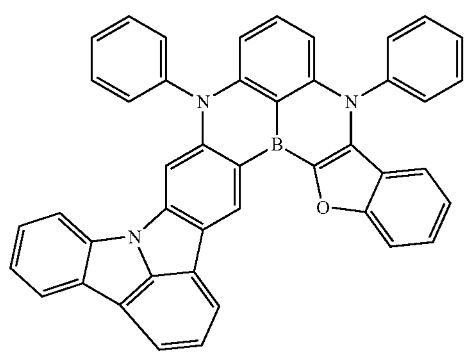
80
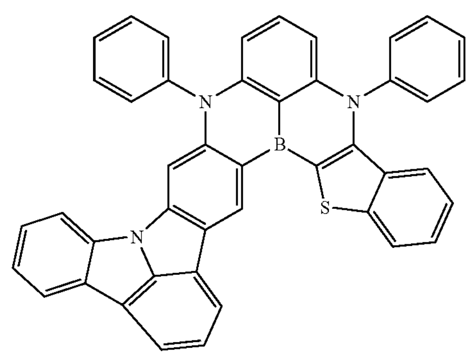

-continued
81
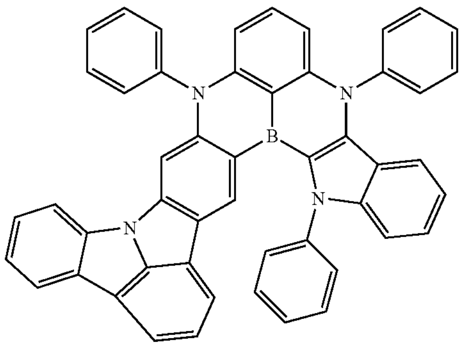
82
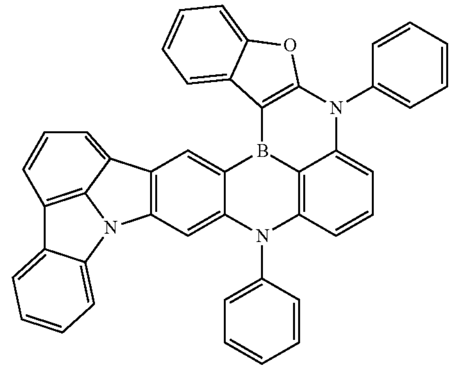
83
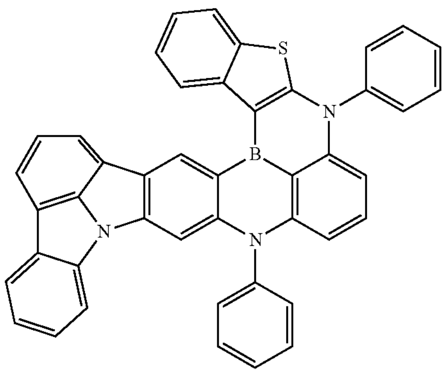
84
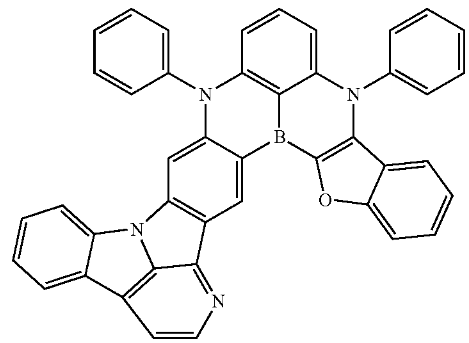
85
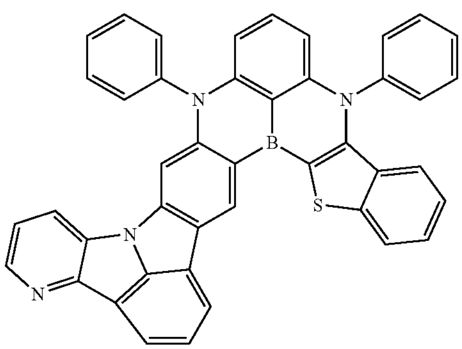
86
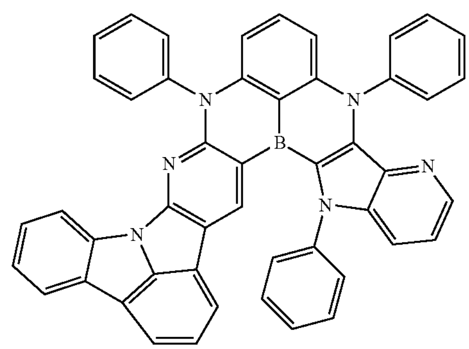
87
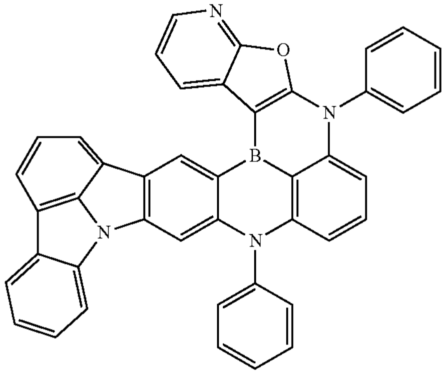
88
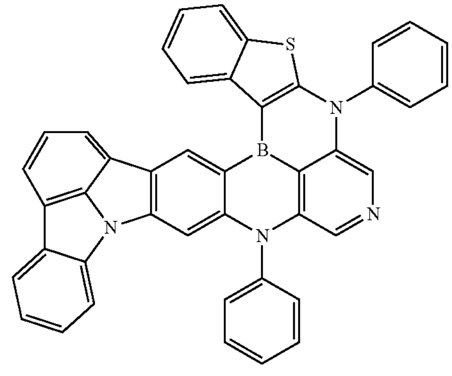

-continued
89
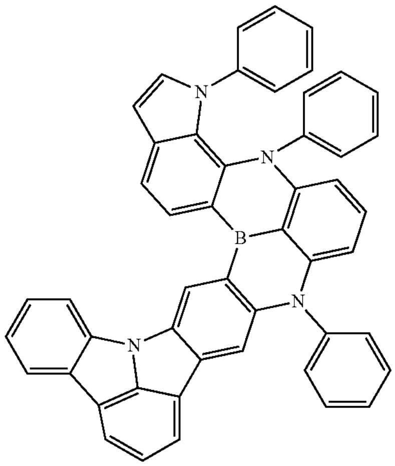
90
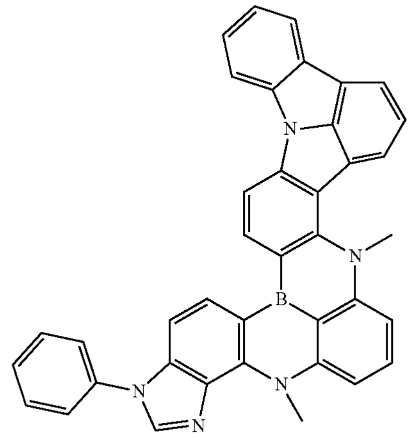
91
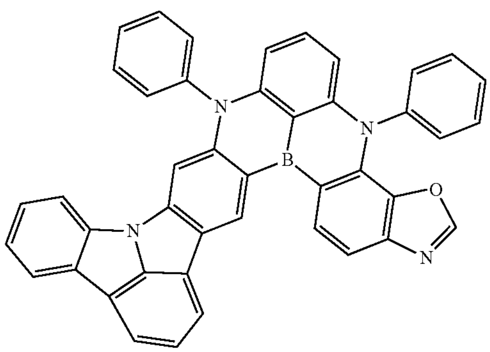
92
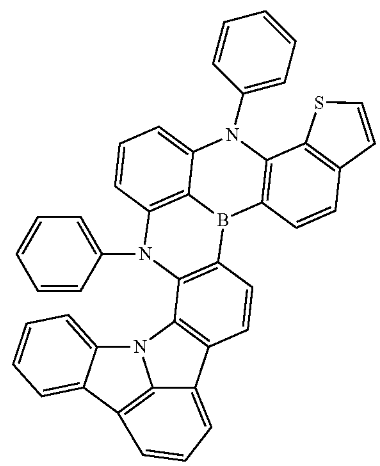
93
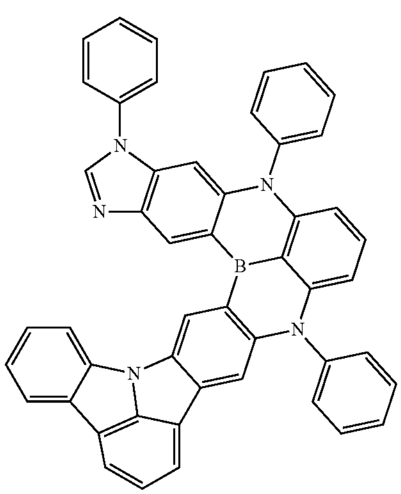
94
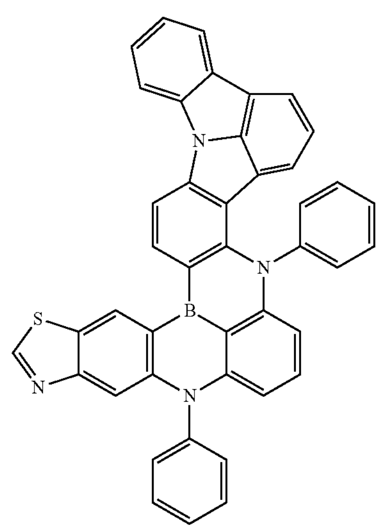

-continued
95
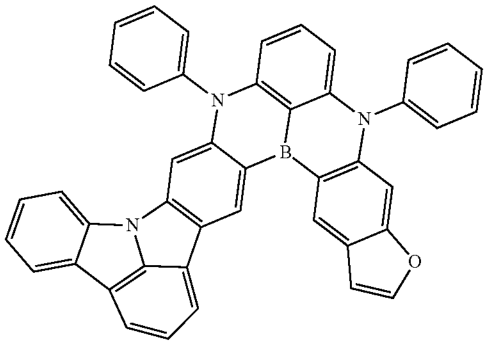
96
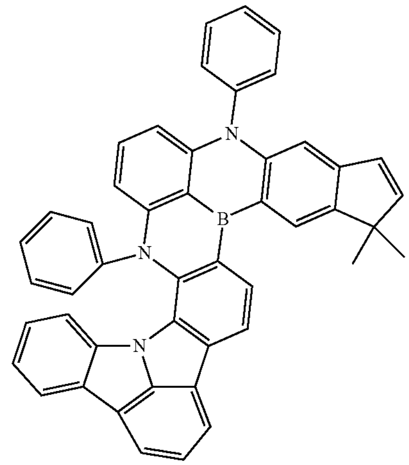
97
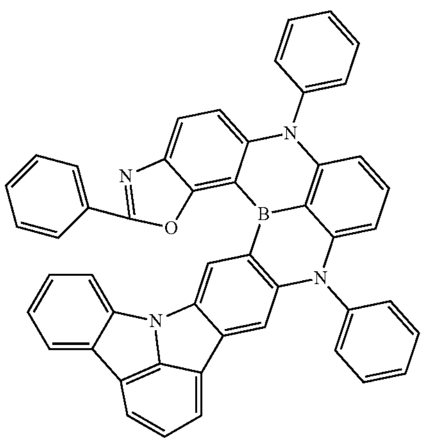
98
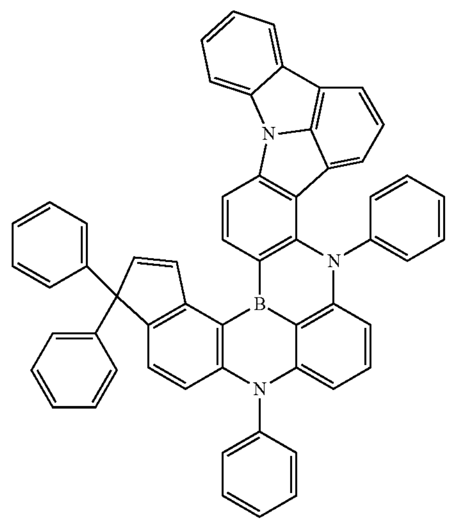
99
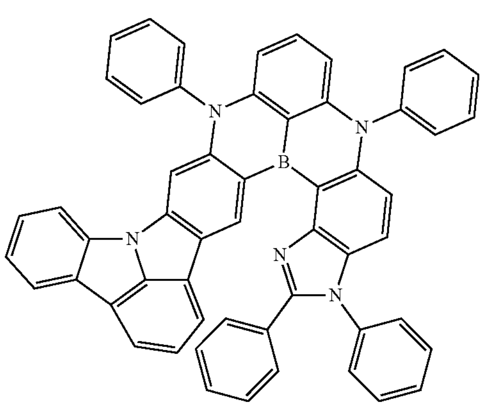
100
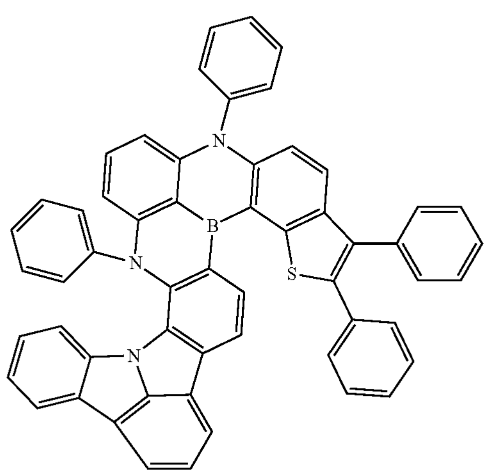

-continued
101
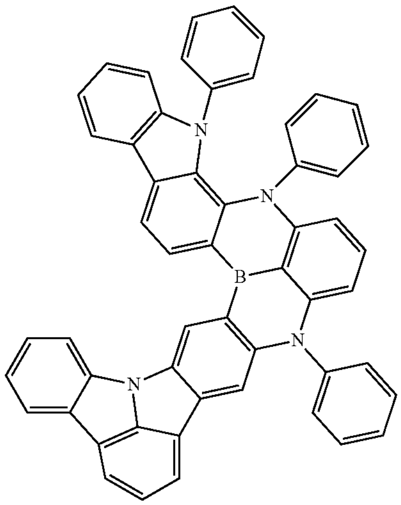
102
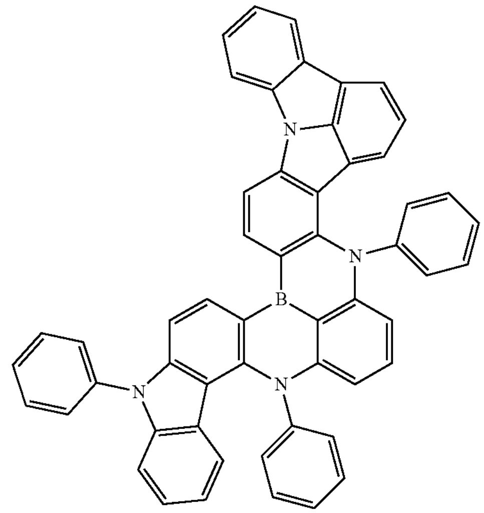
103
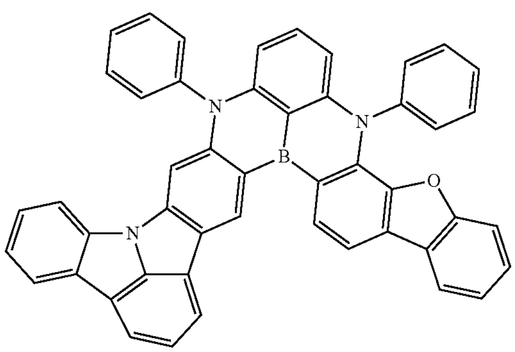
104
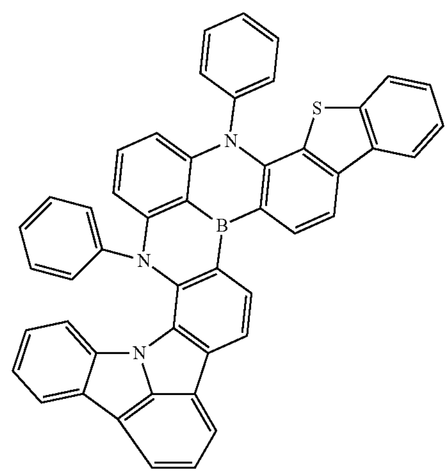
105
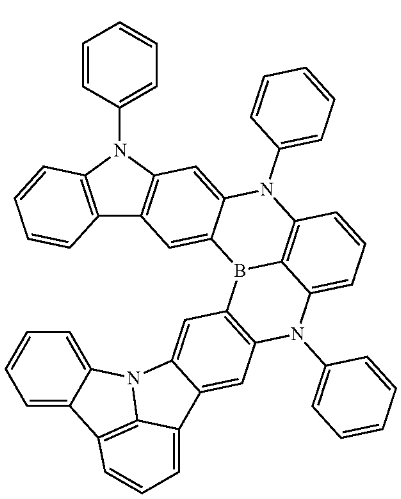
106
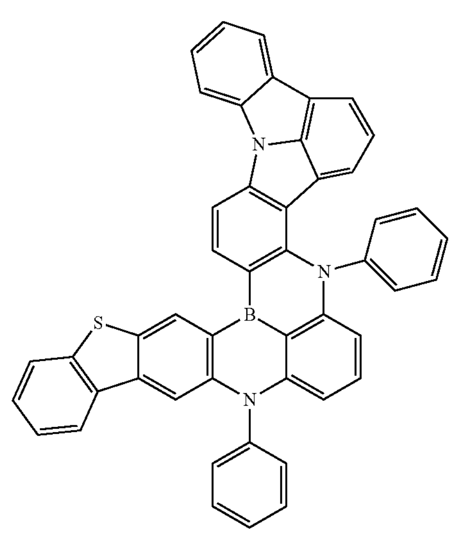

-continued
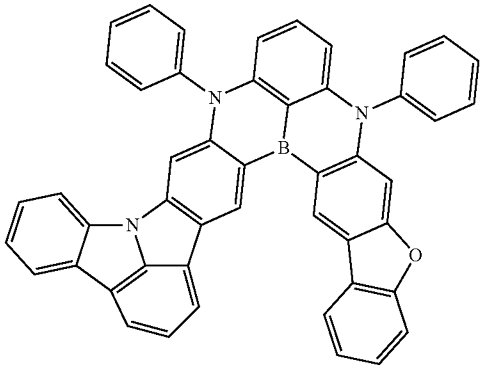
107
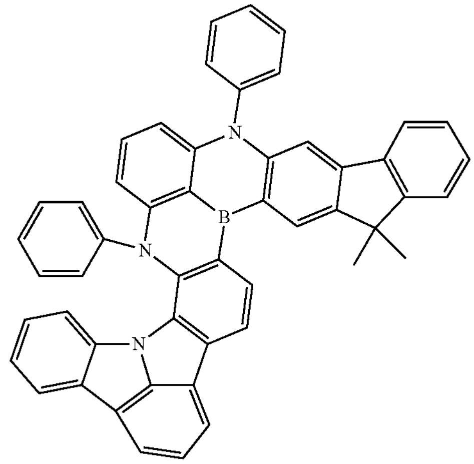
108
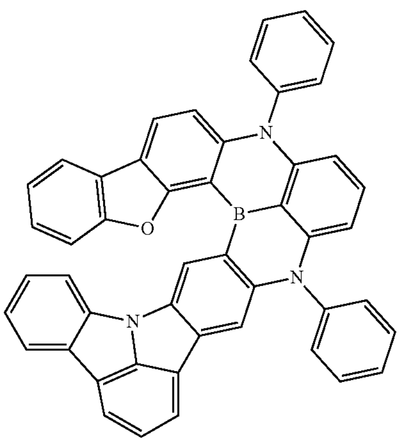
109
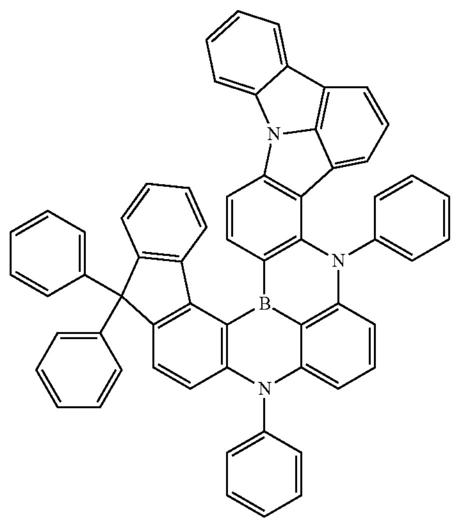
110
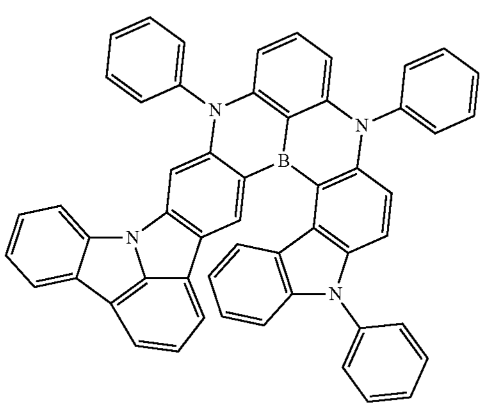
111
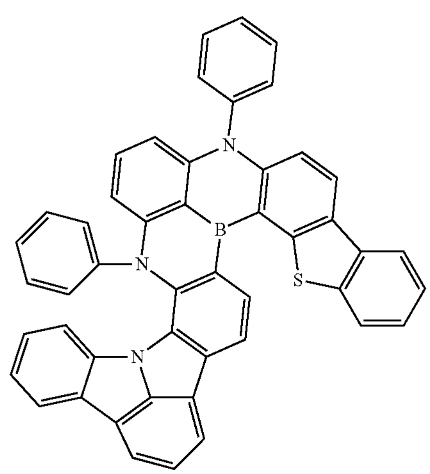
112

-continued
113
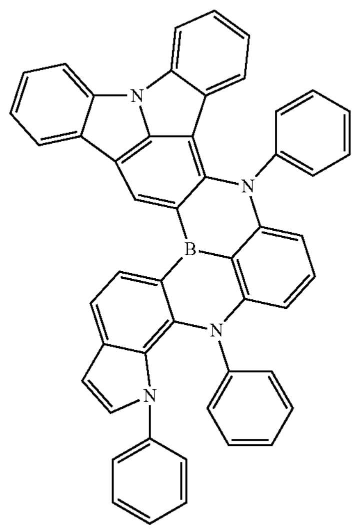
114
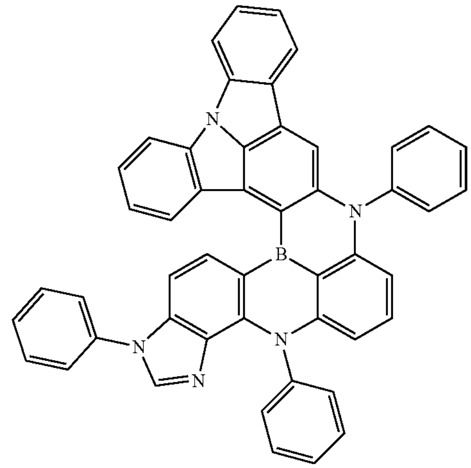
115
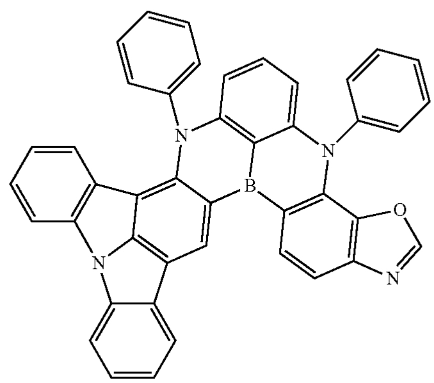
116
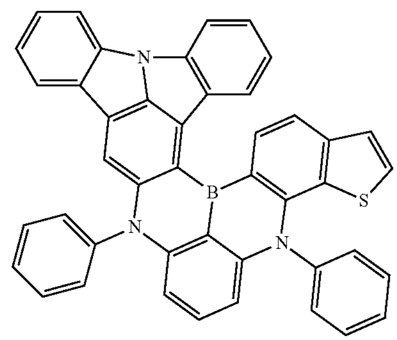
117
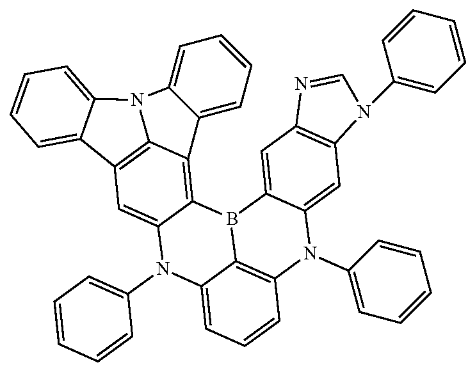
118
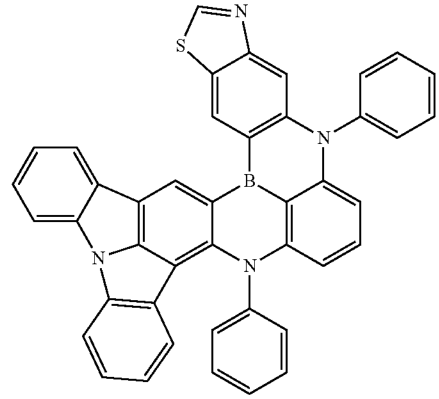

-continued
119
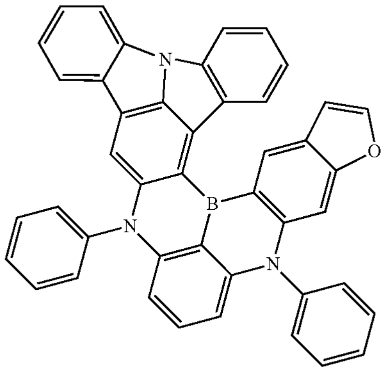
120
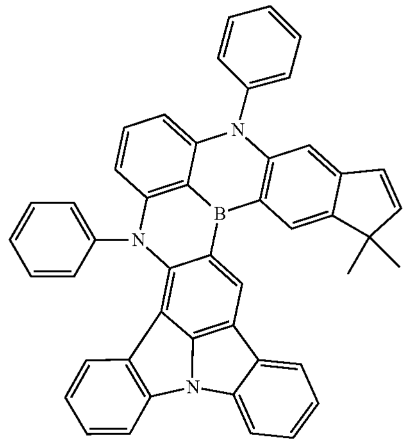
121
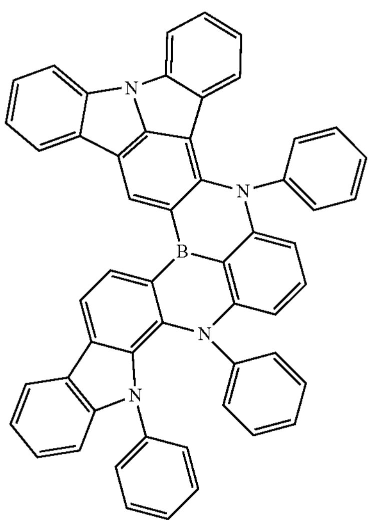
122
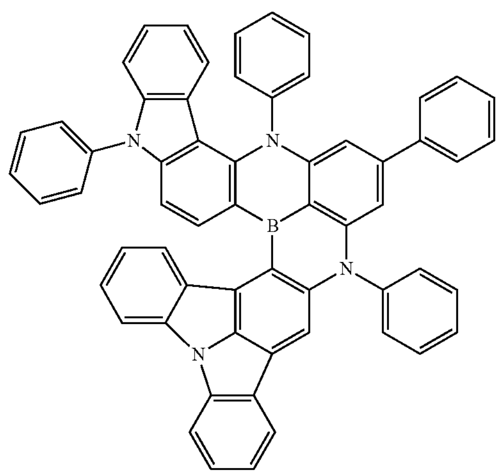
123
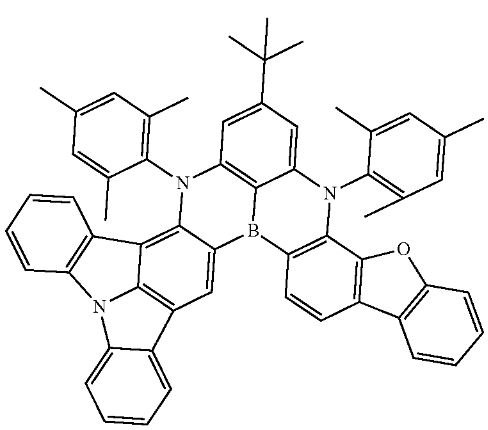
124
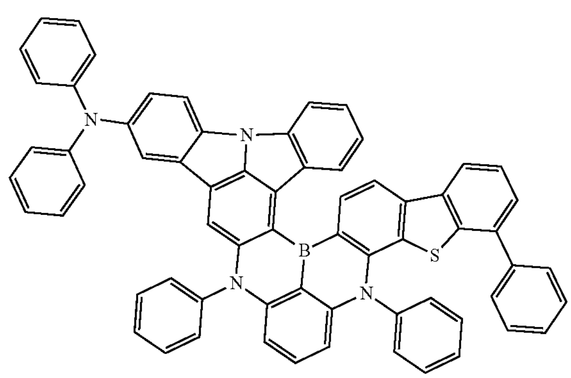

-continued
125
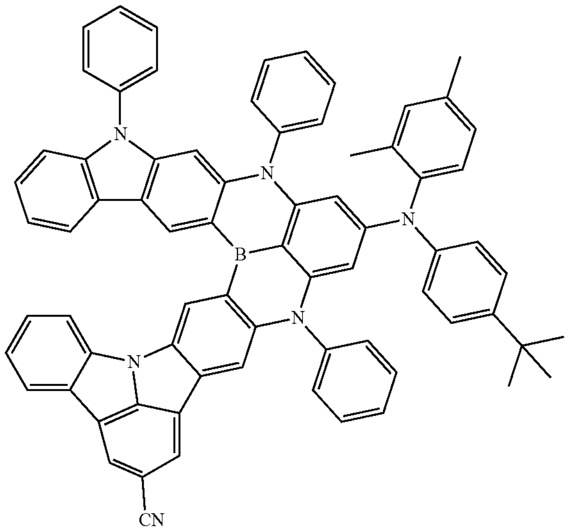
126
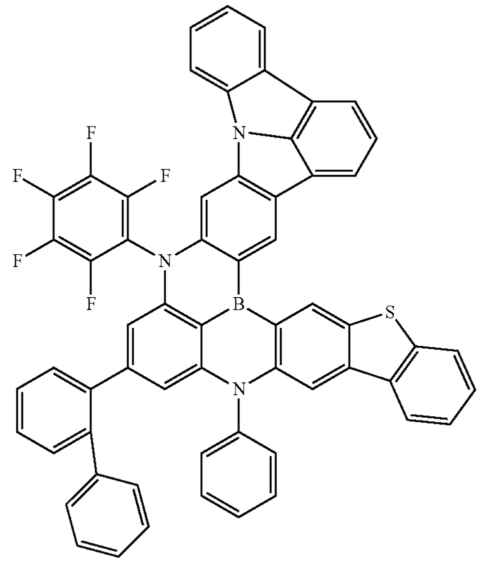
127
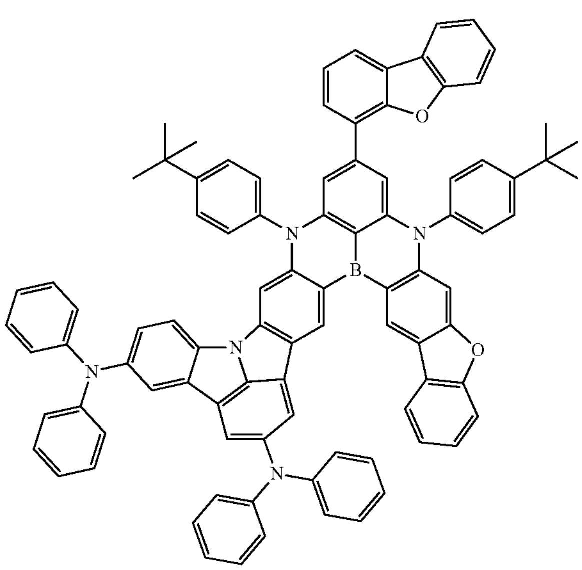
128
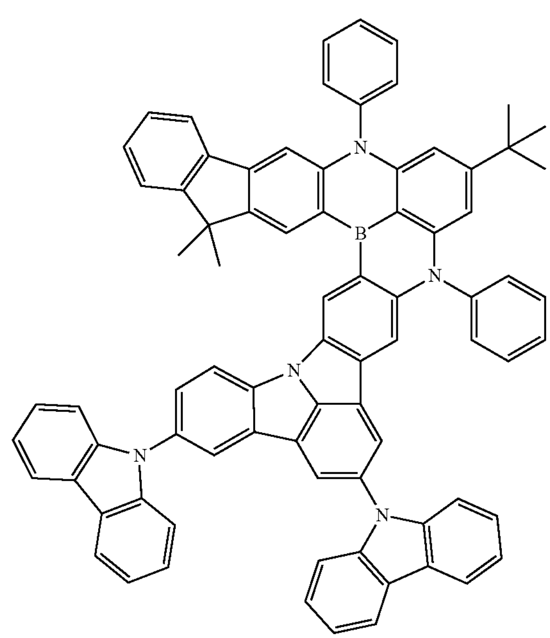

-continued
129
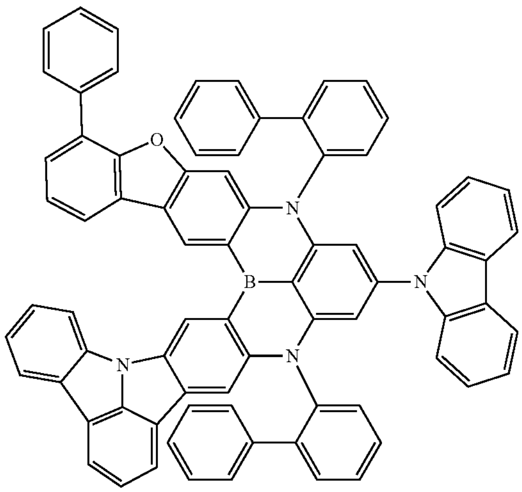
130
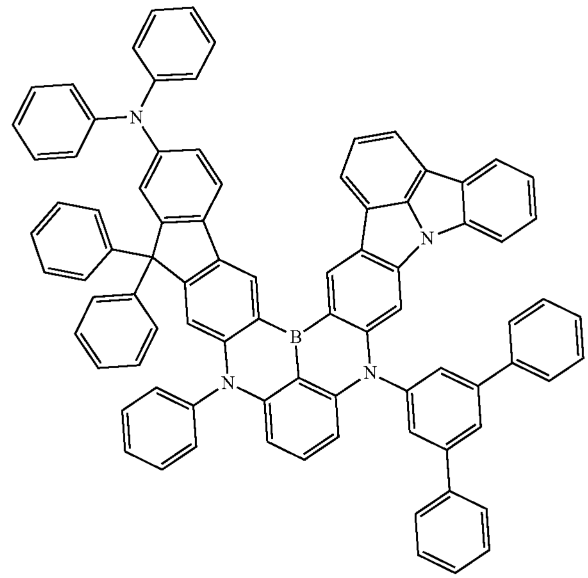
131
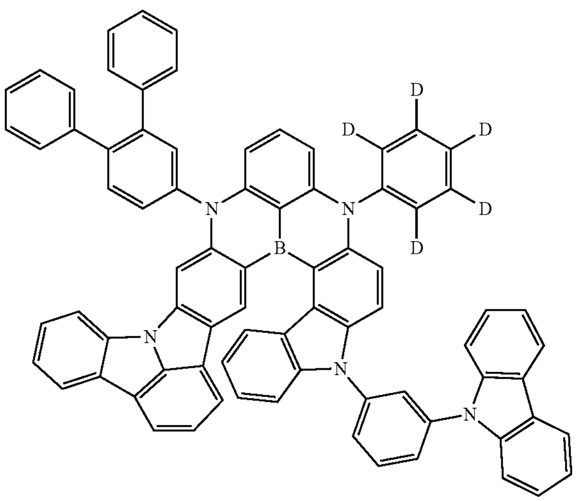
132
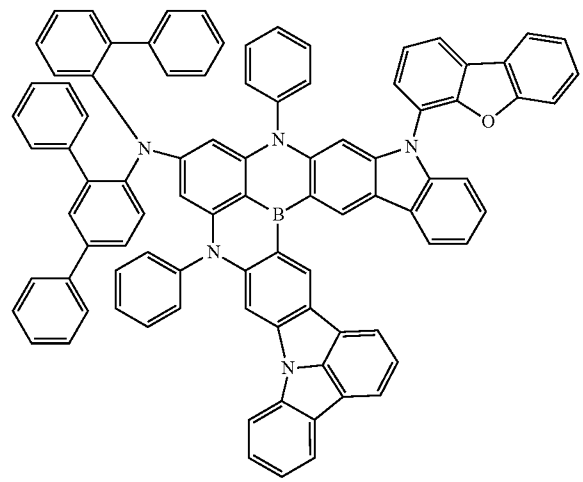
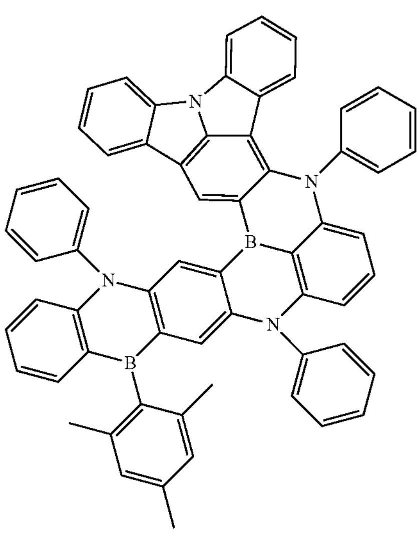
134
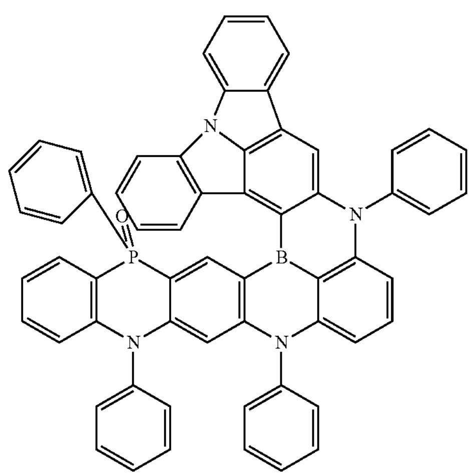

-continued
135
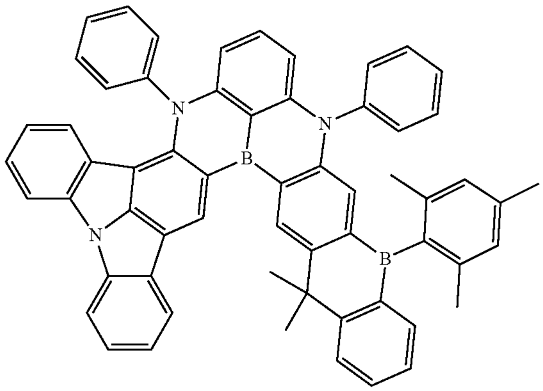
136
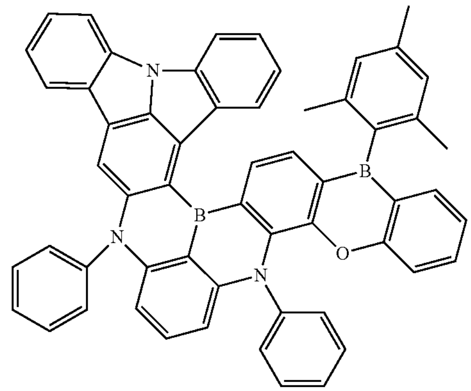
137
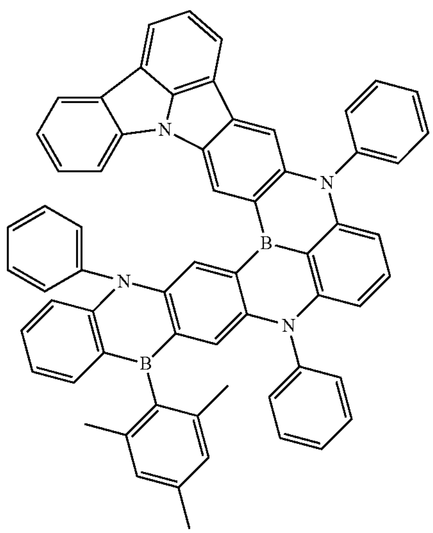
138
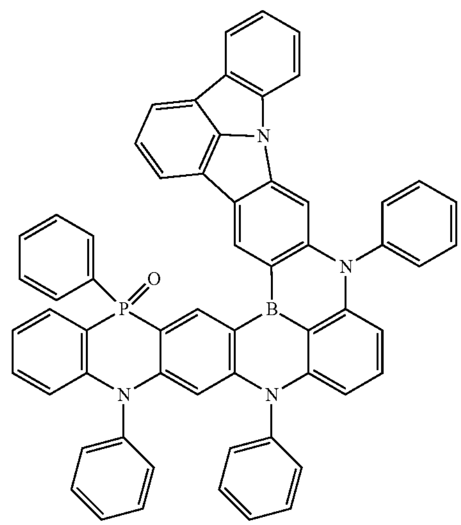
139
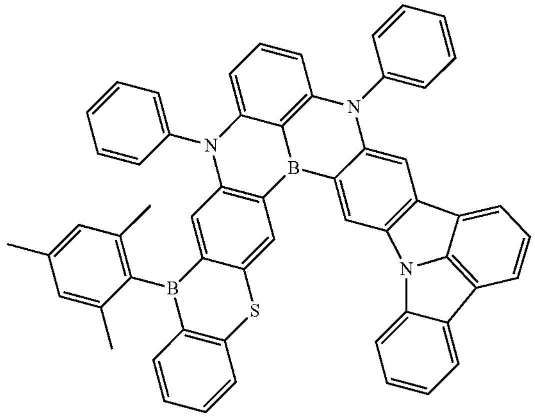
140
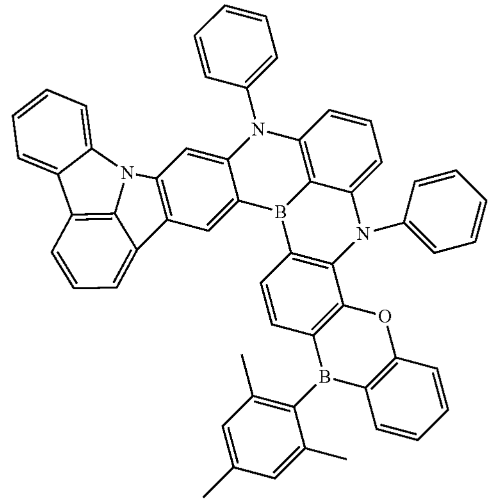

-continued
141
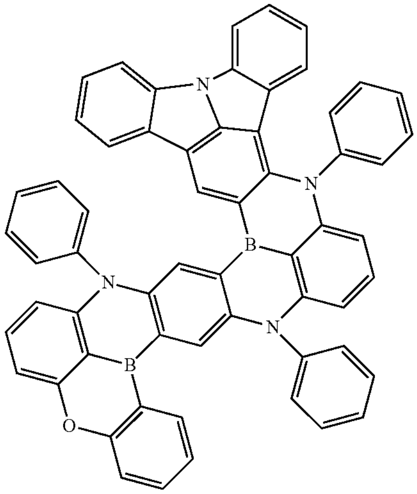
142
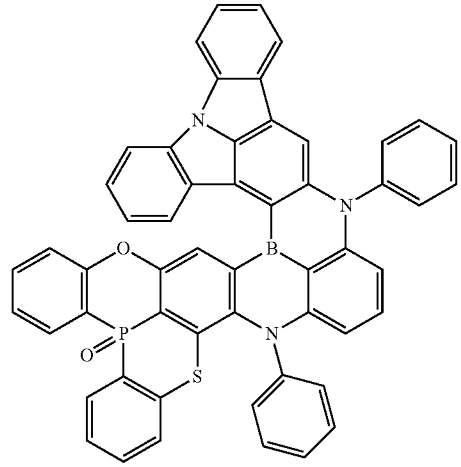
143
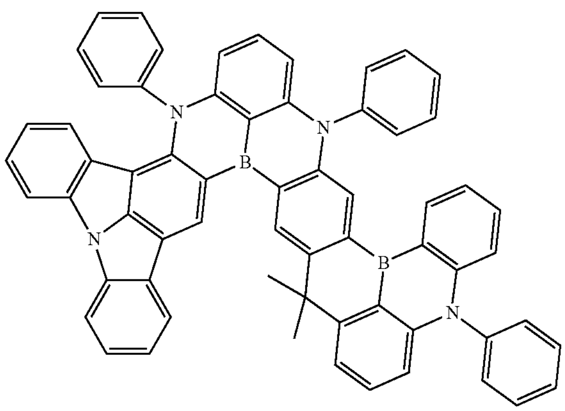
144
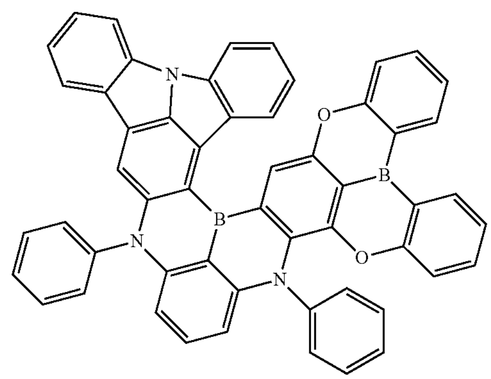
145
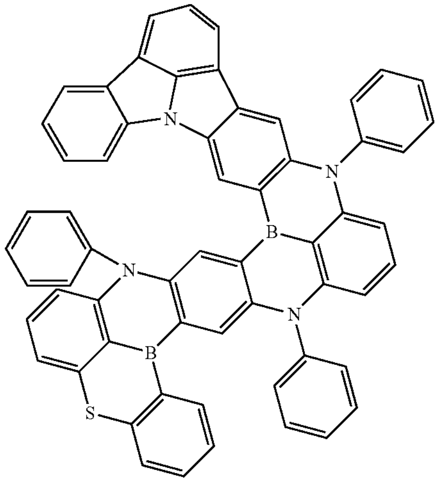
146
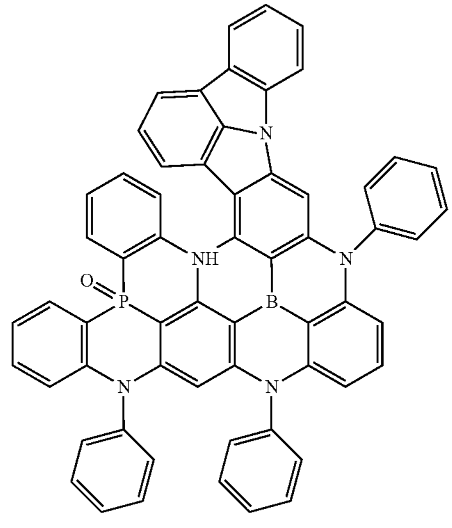

-continued
147
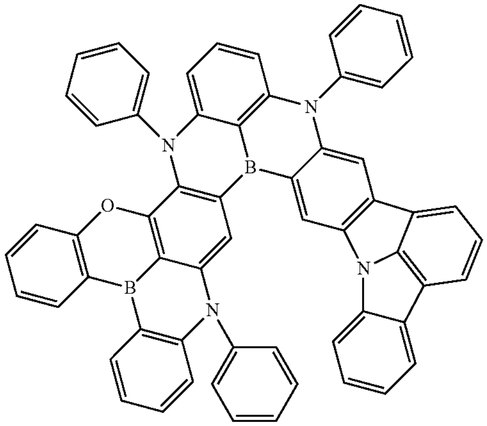
148
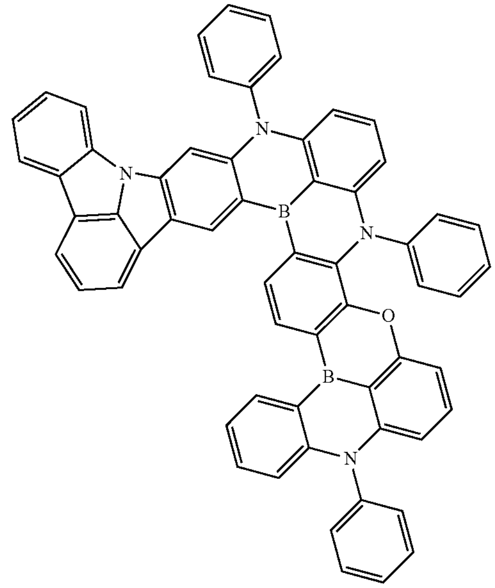
149
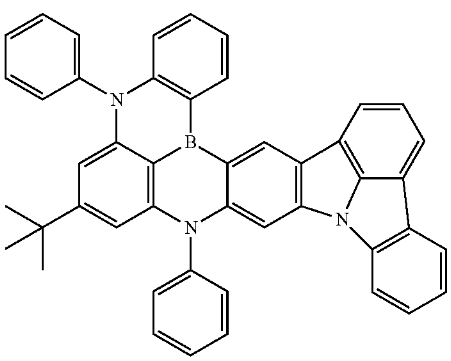
150
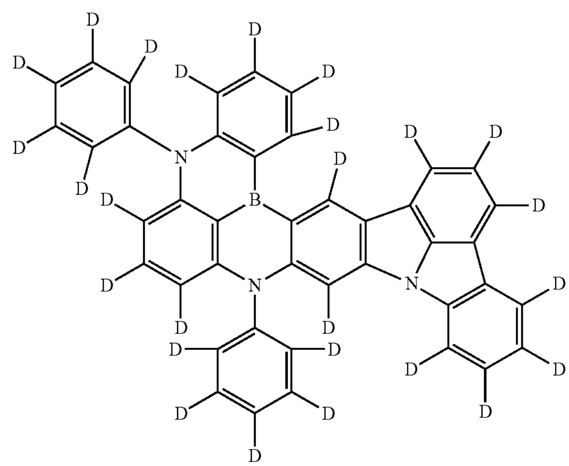
151
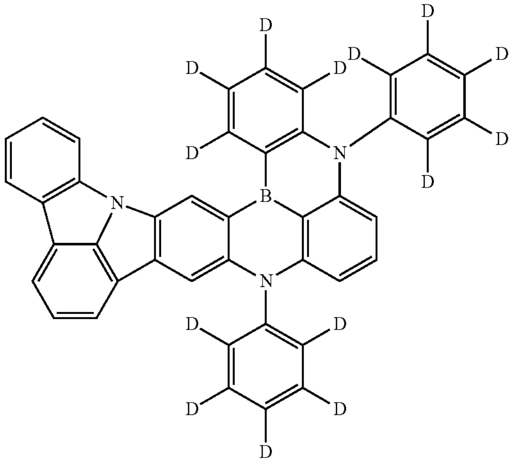
152
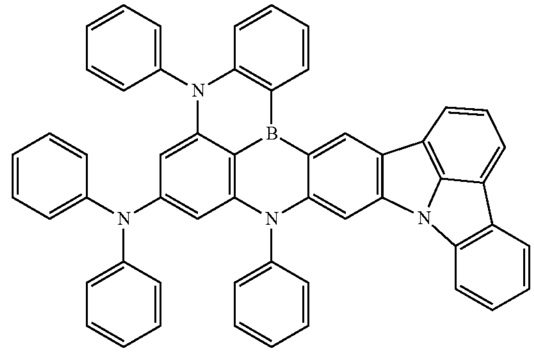

-continued
153
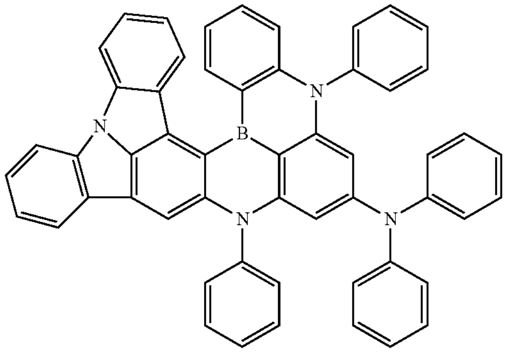
154
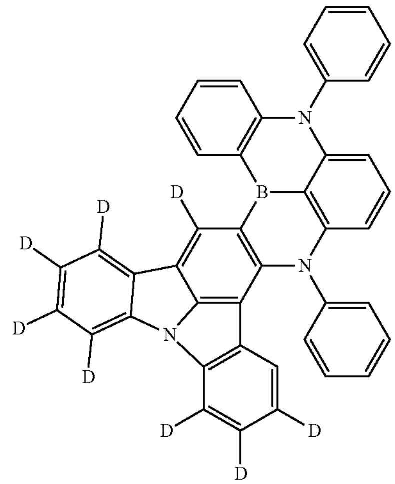
155
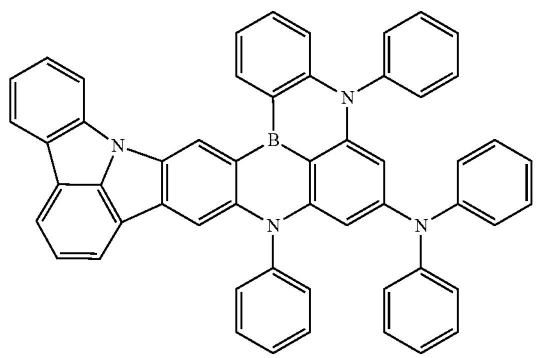
156
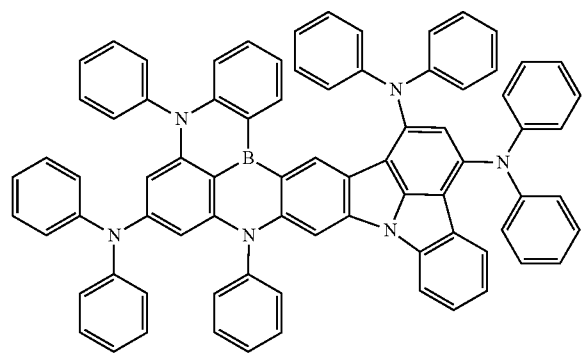
157
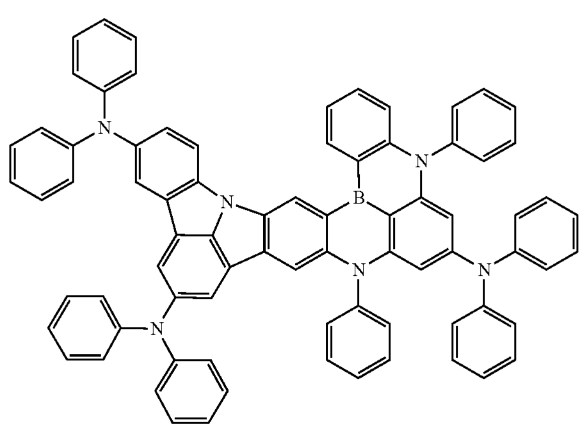
158
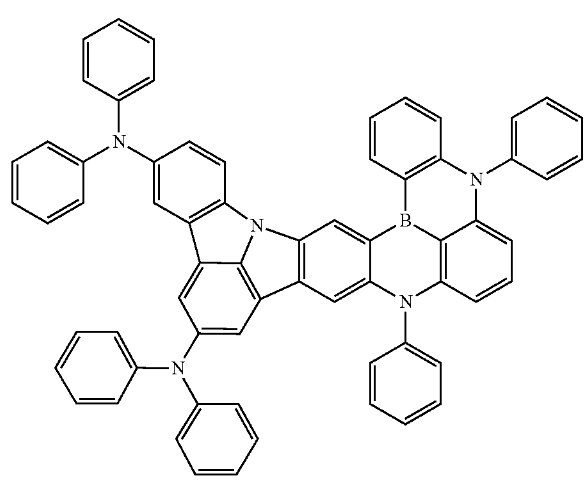

-continued
159
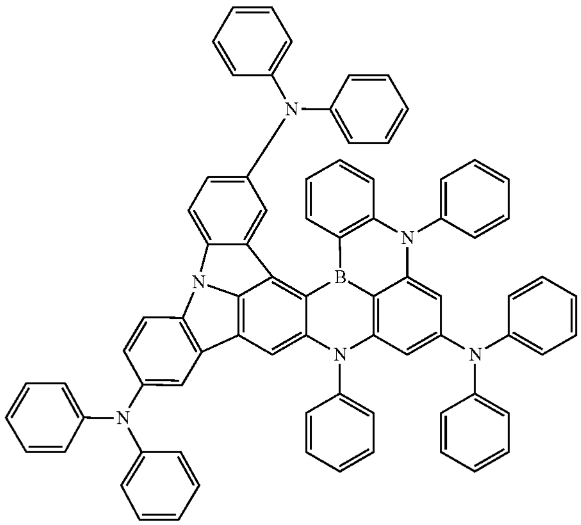
160
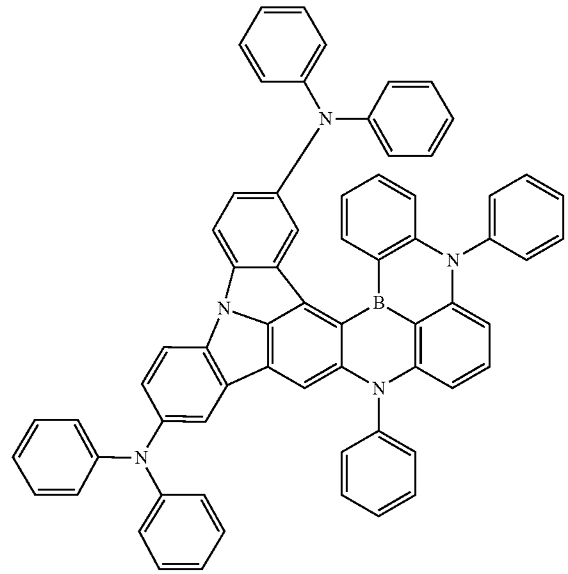
161
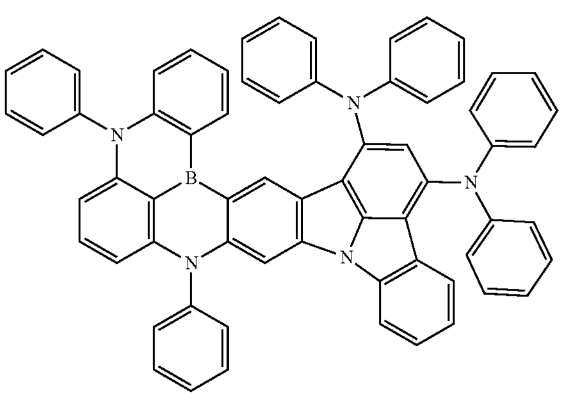
162
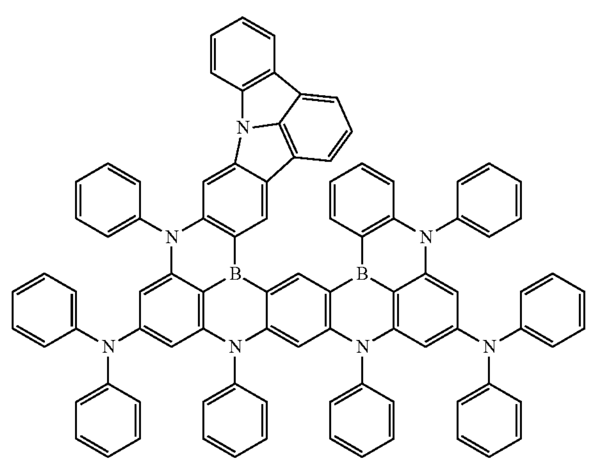

-continued
163
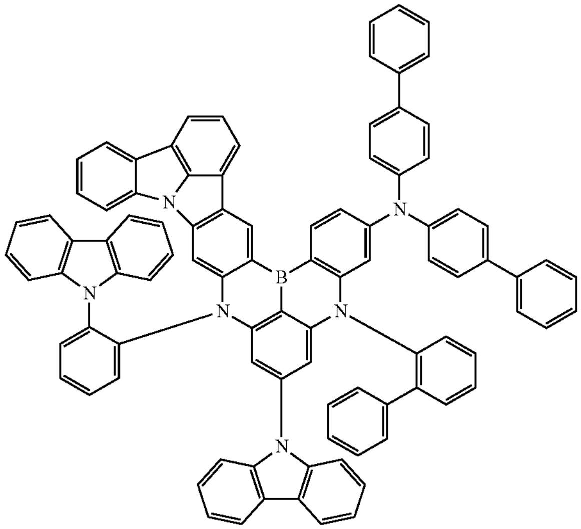
164
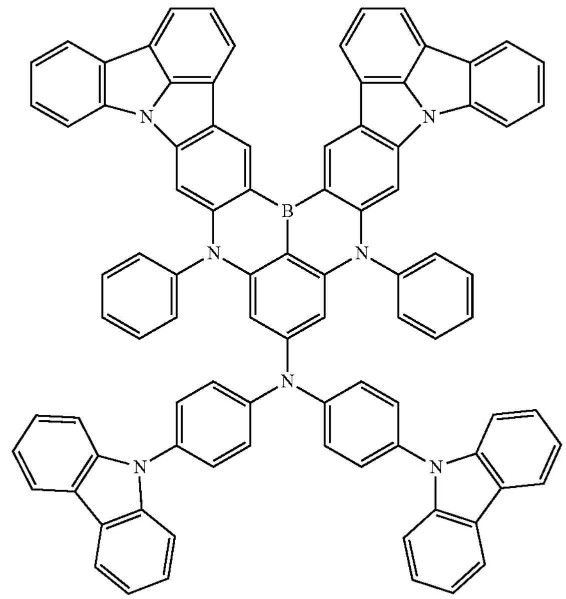
165
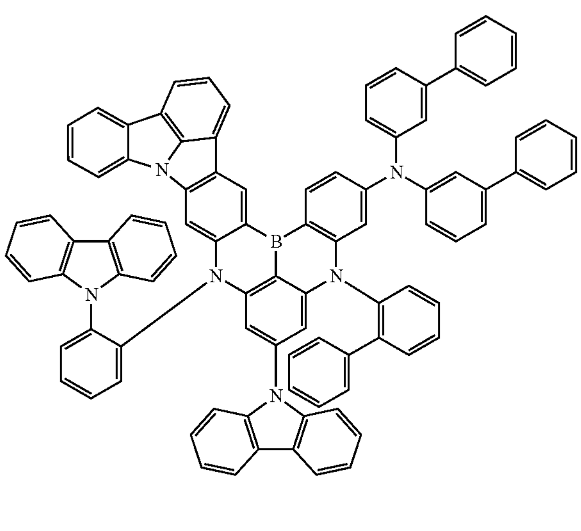
166
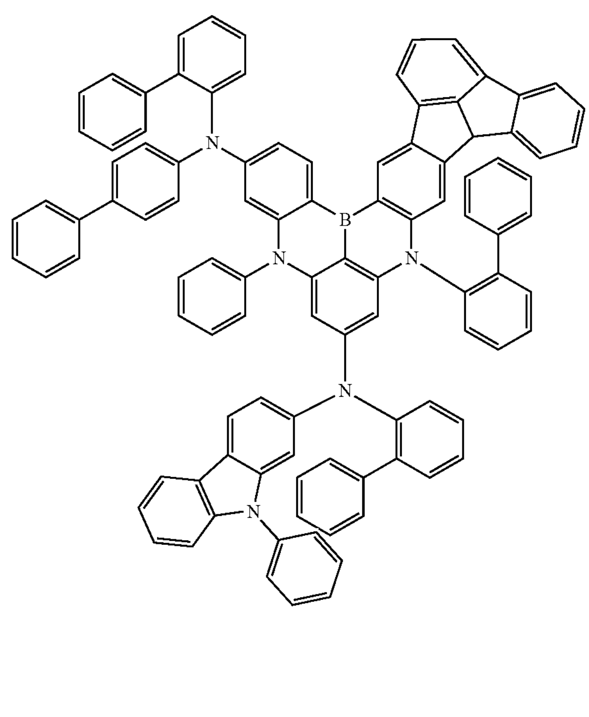

-continued
167
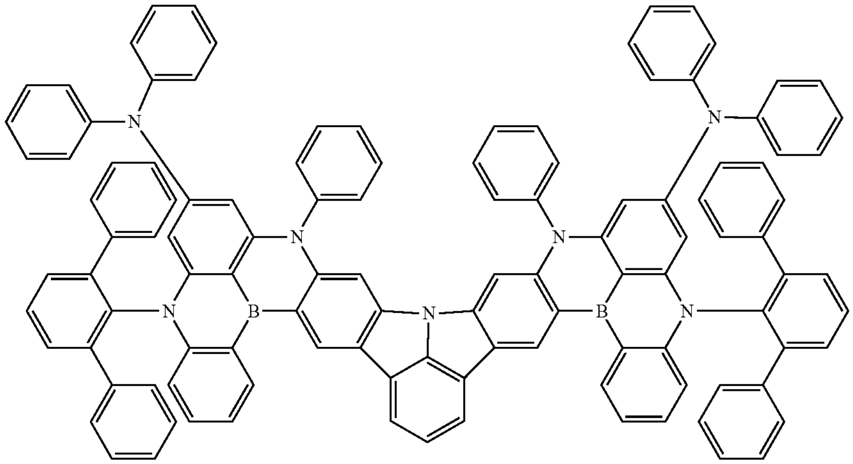
168
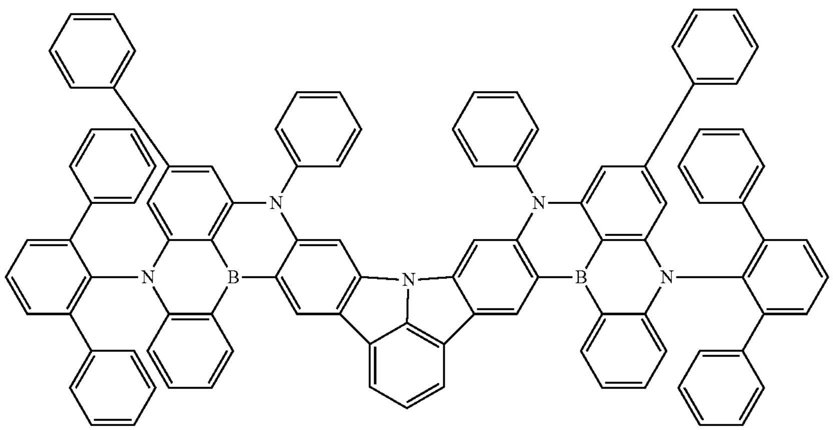
169
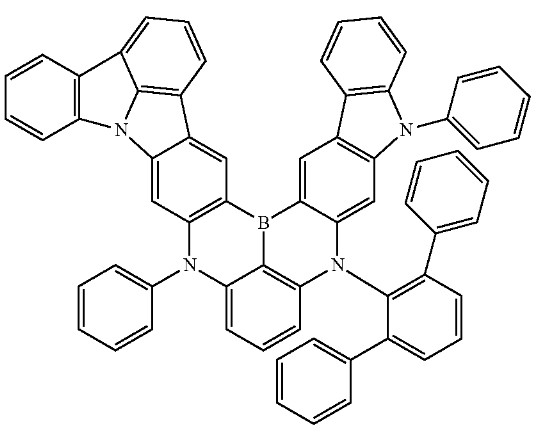
170
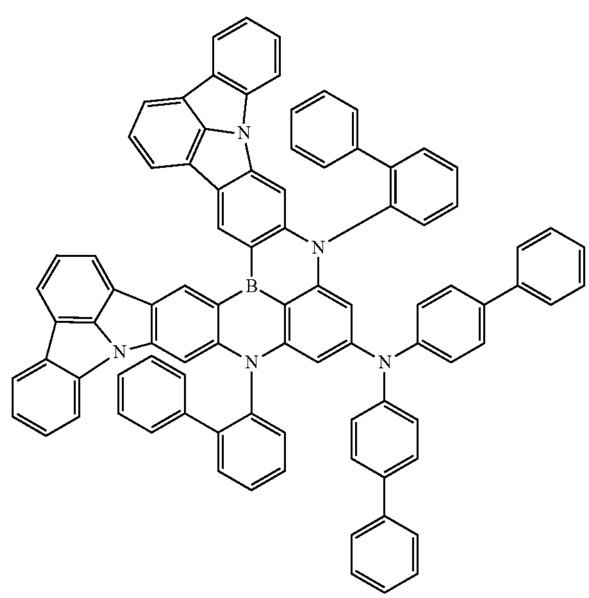

-continued
171
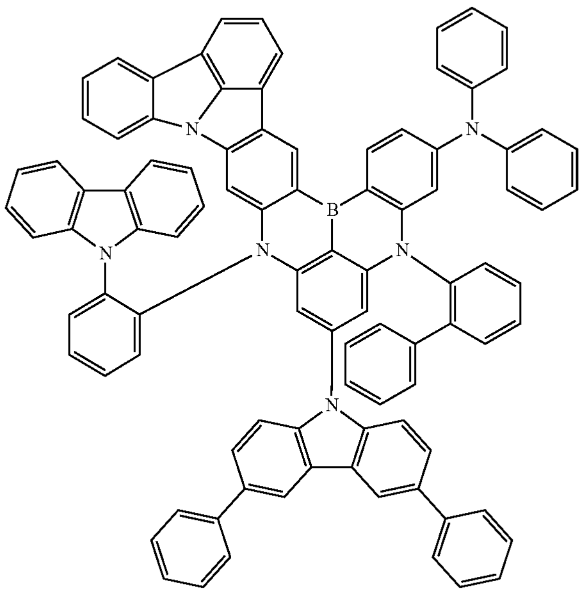
172
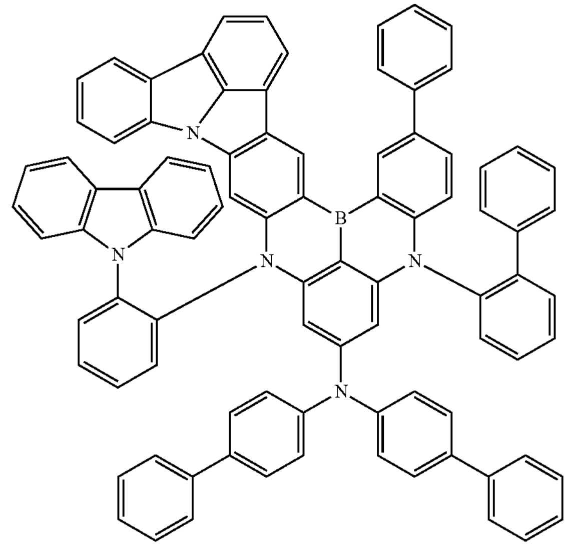
173
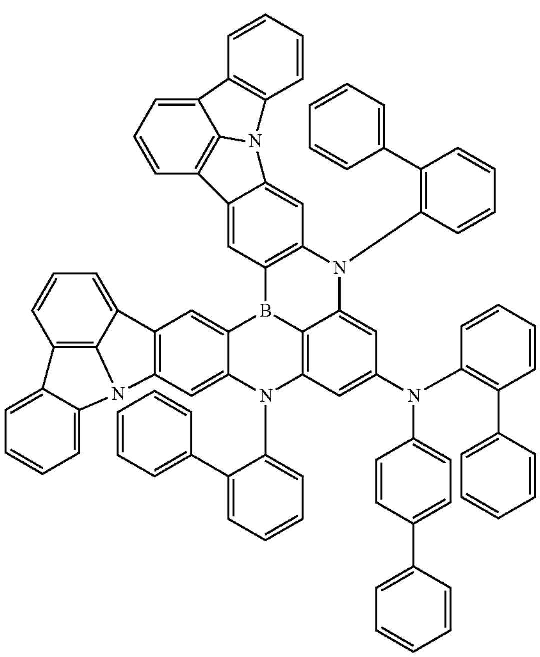
174
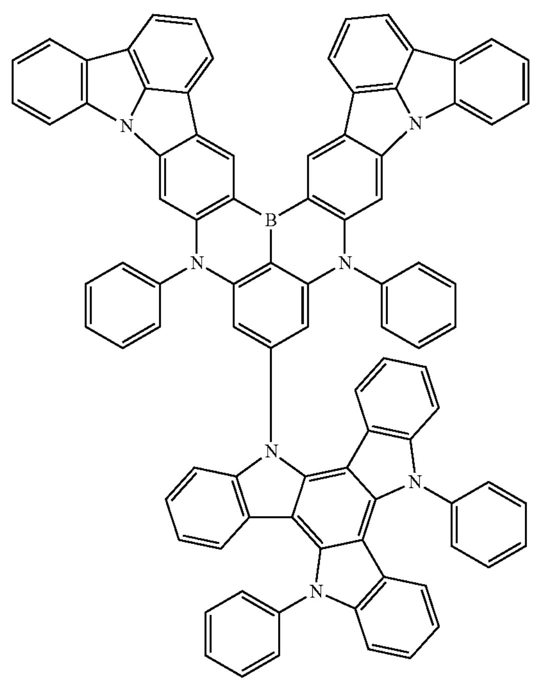

-continued
175
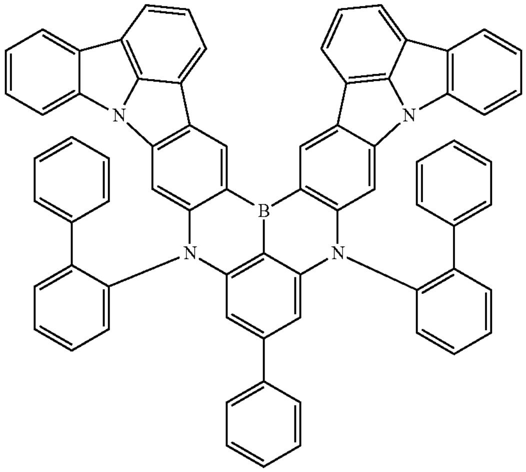
176
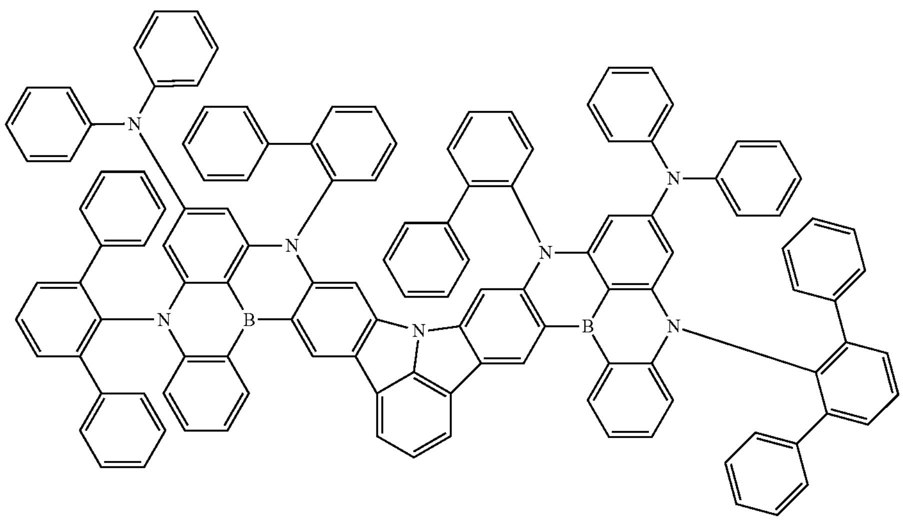
177
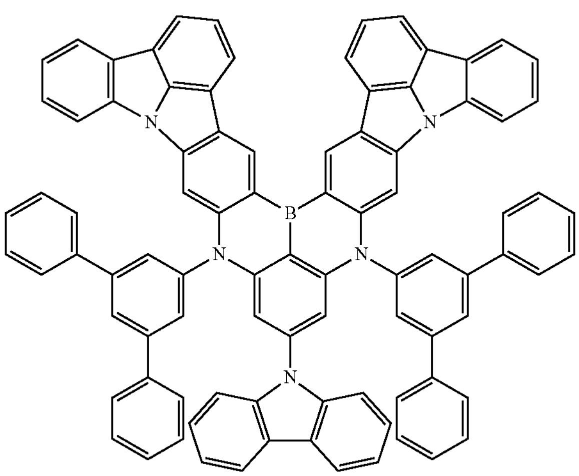
178
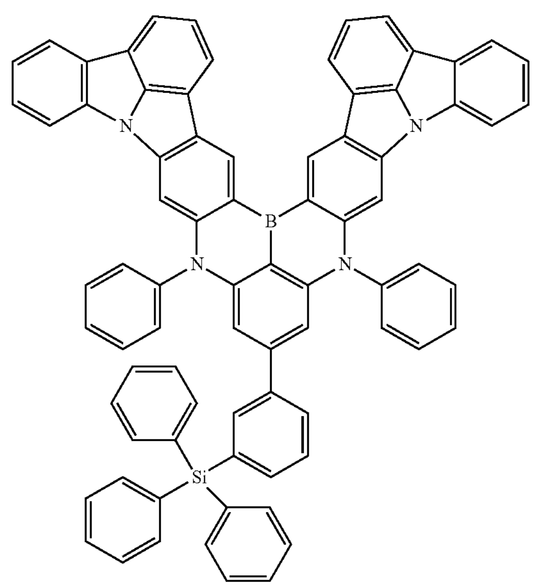

-continued
179
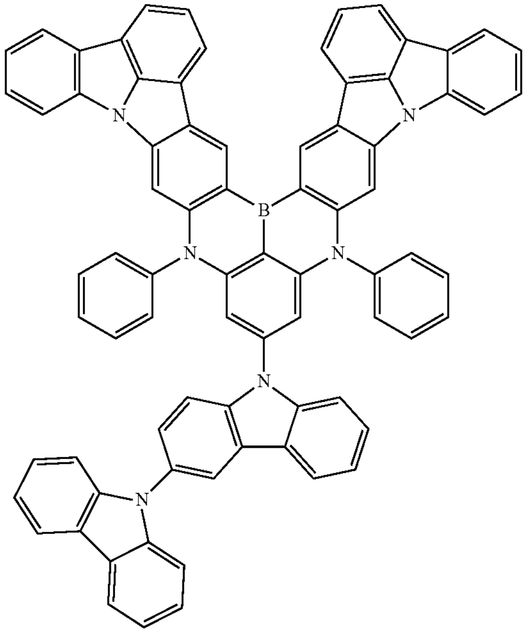
180
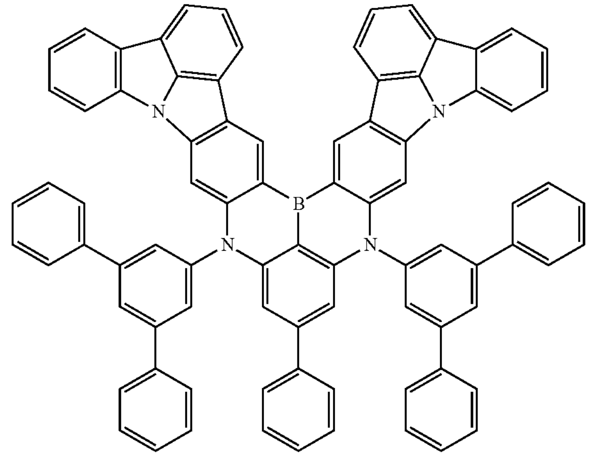
181
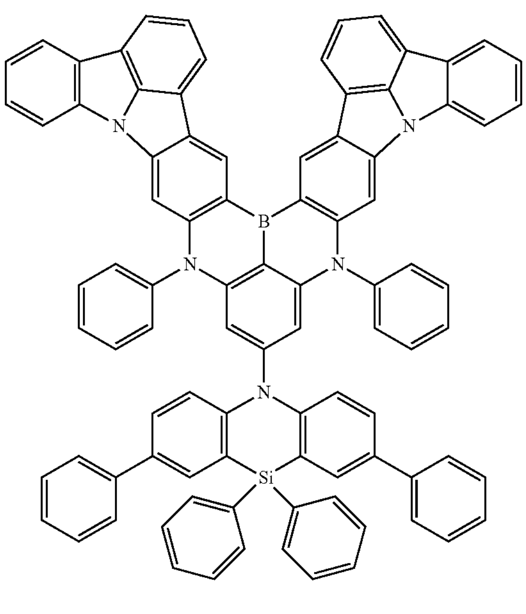
182
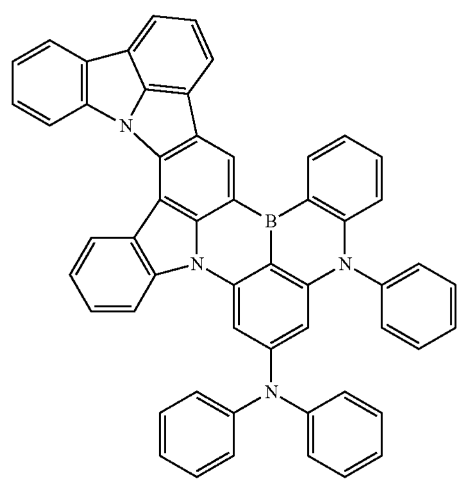

-continued
183
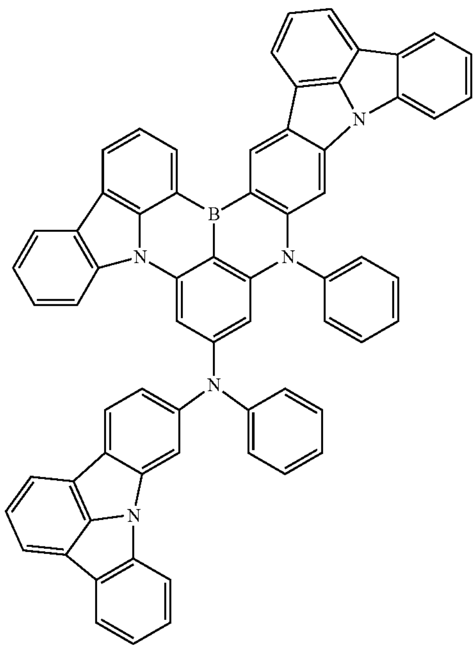
184
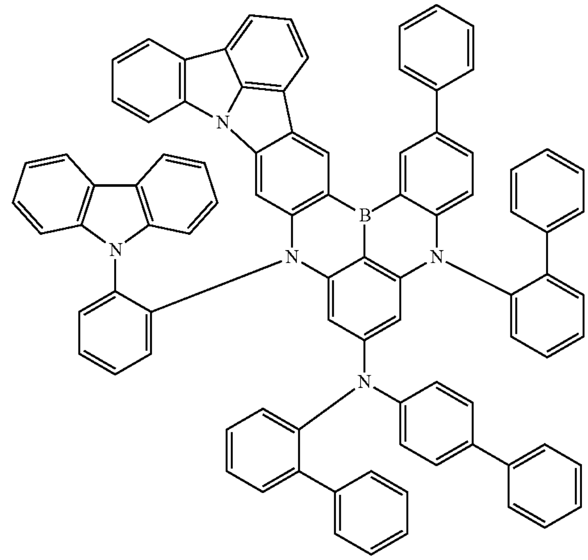
185
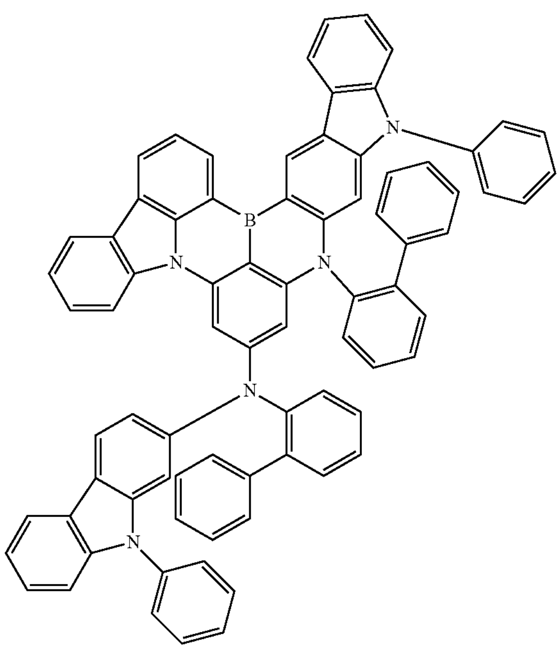
186
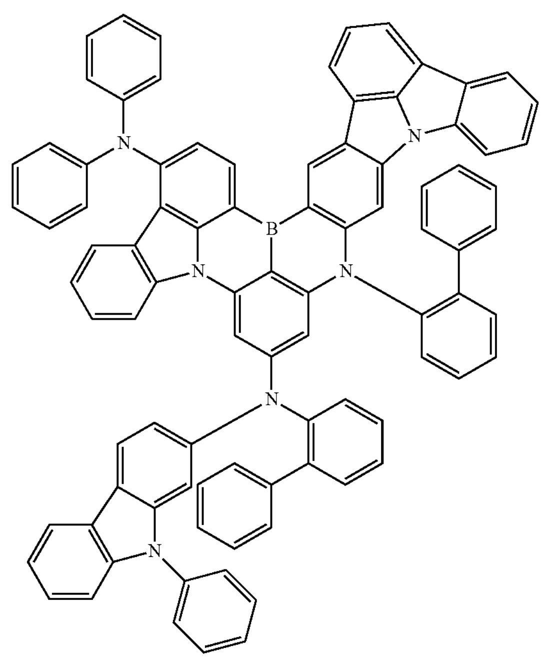

-continued
187
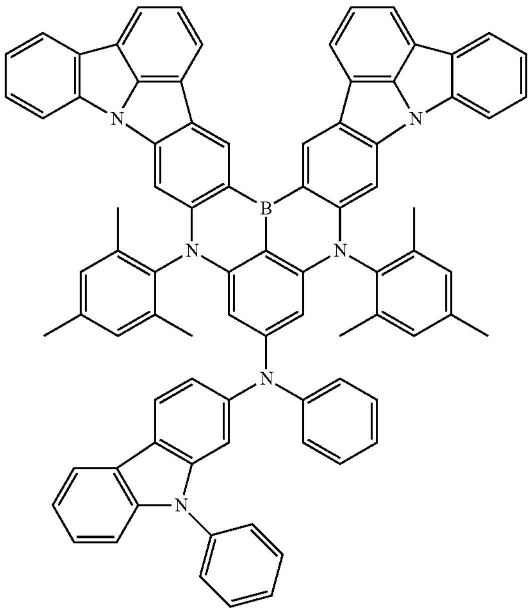
188
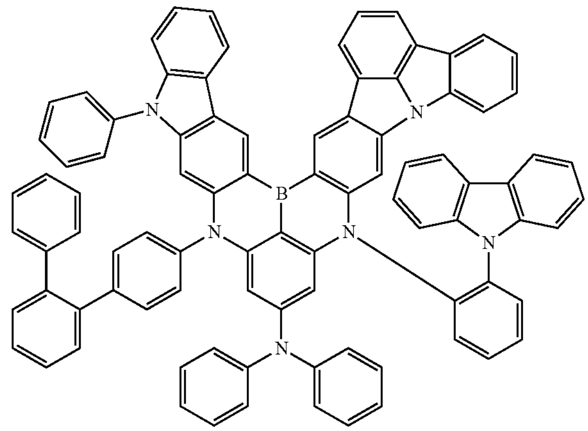
189
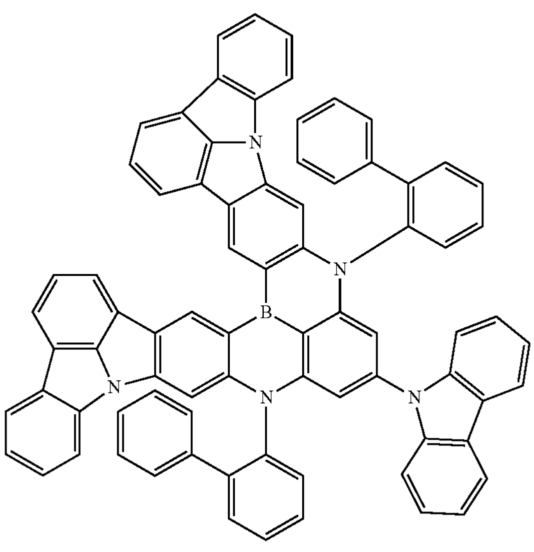
190
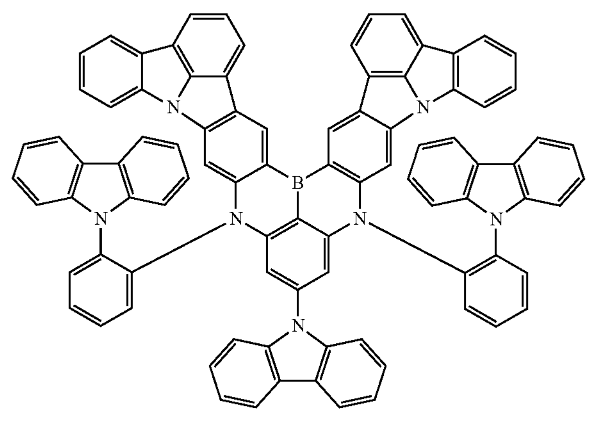

-continued
191
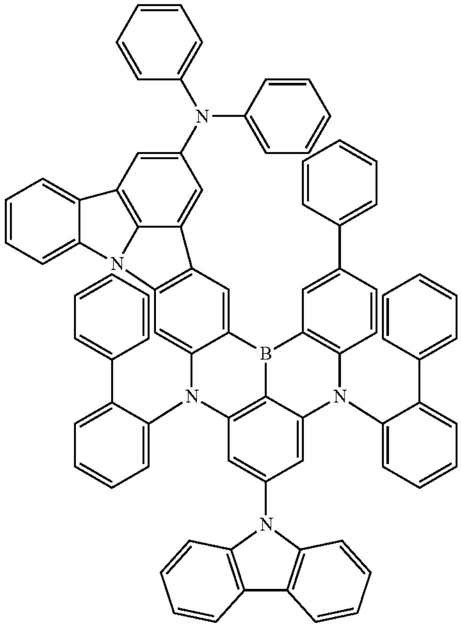
192
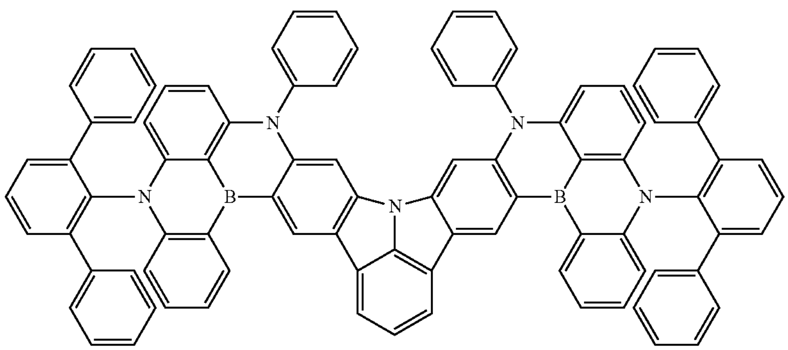
193
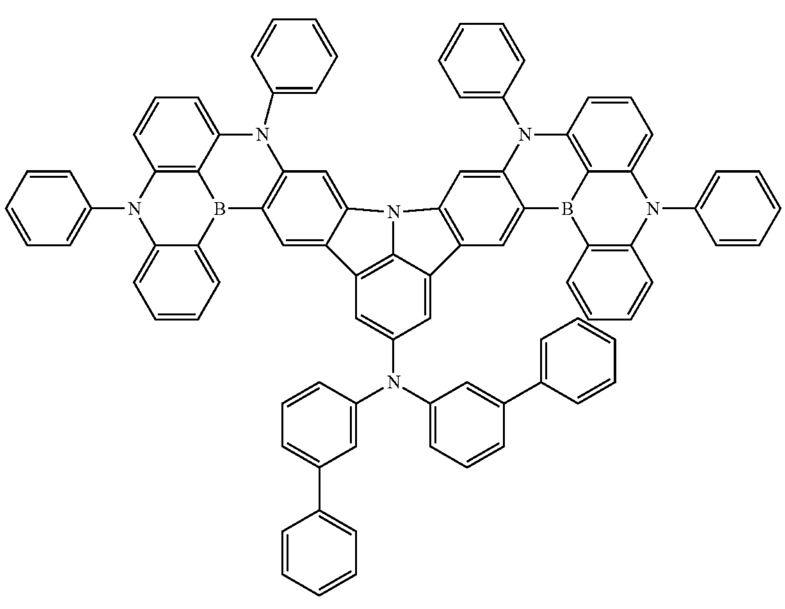

-continued
194
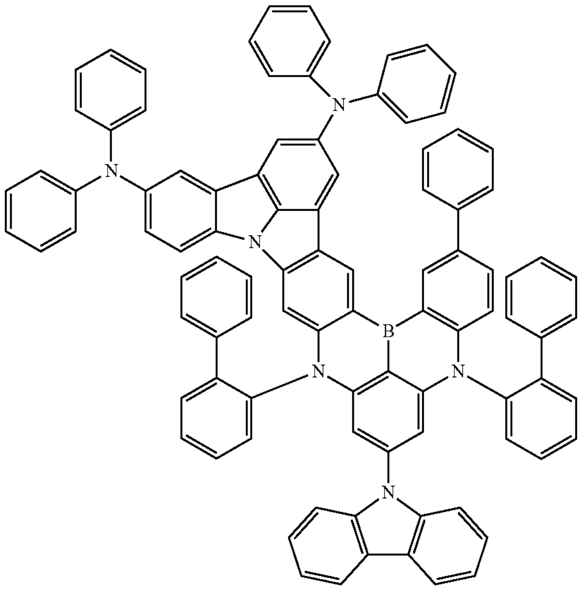
195
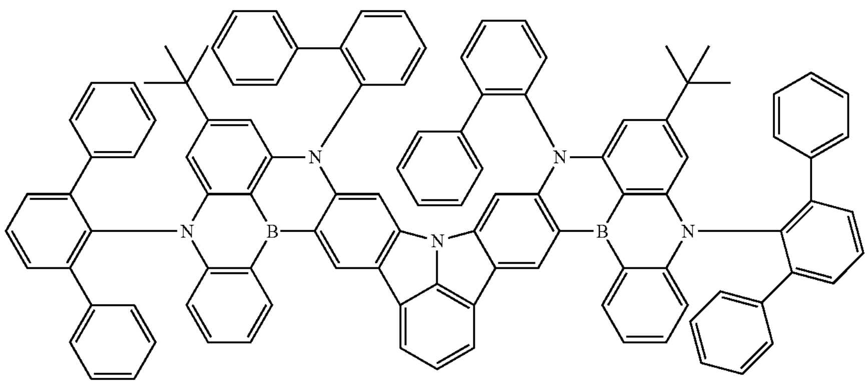
196
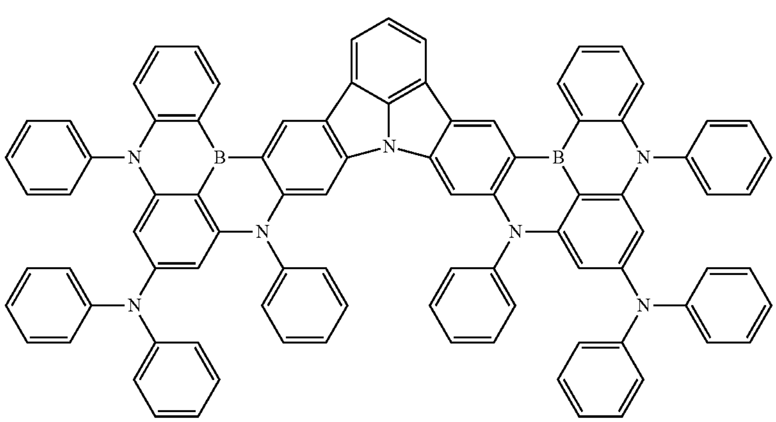

-continued
197
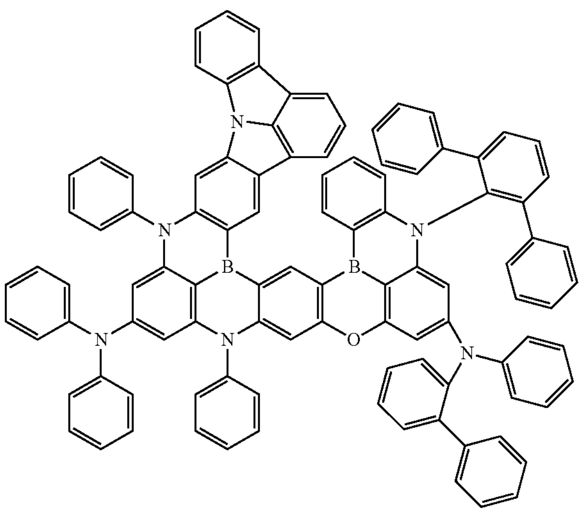
198
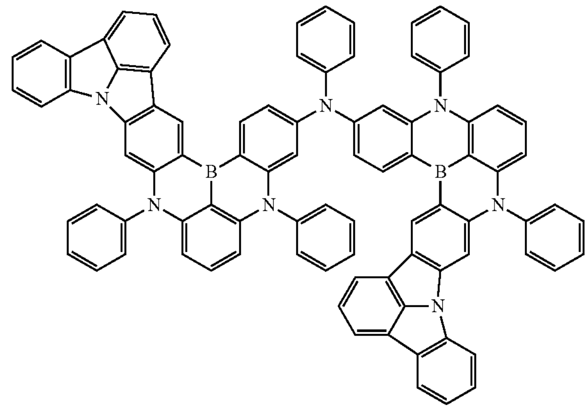
199
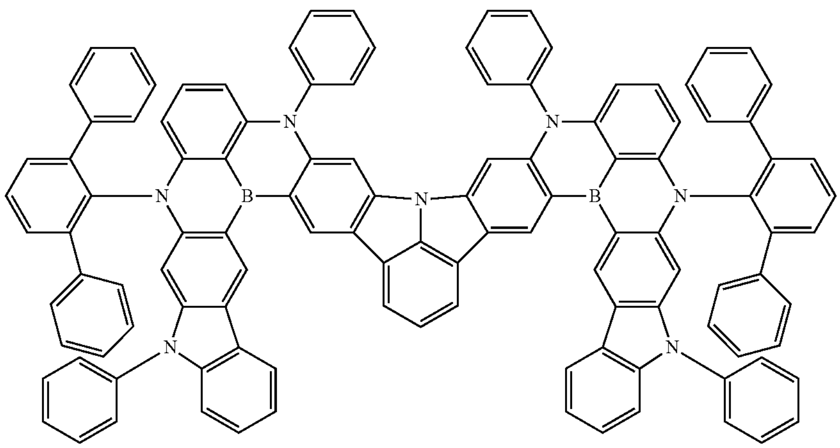
200
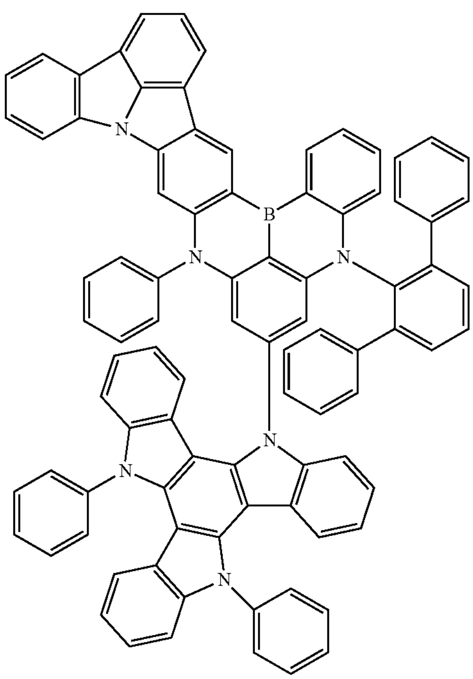
201
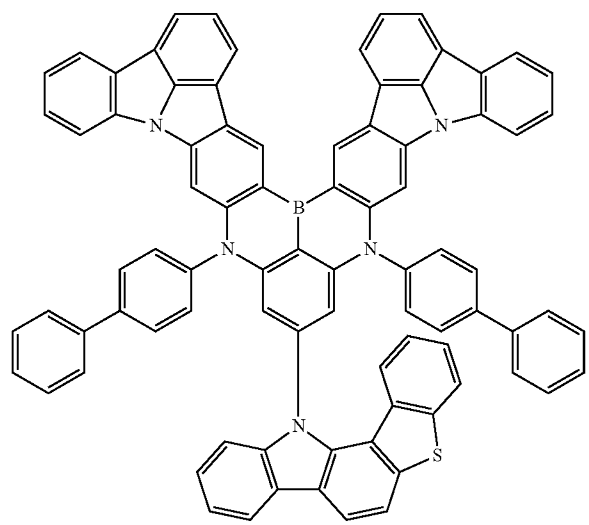

-continued
202
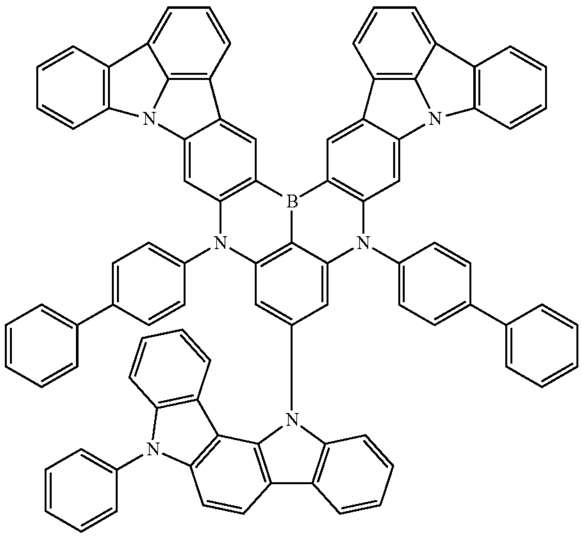
203
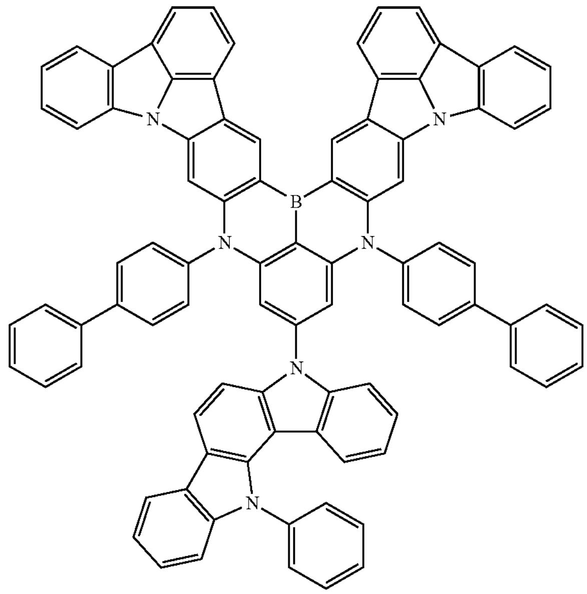
204
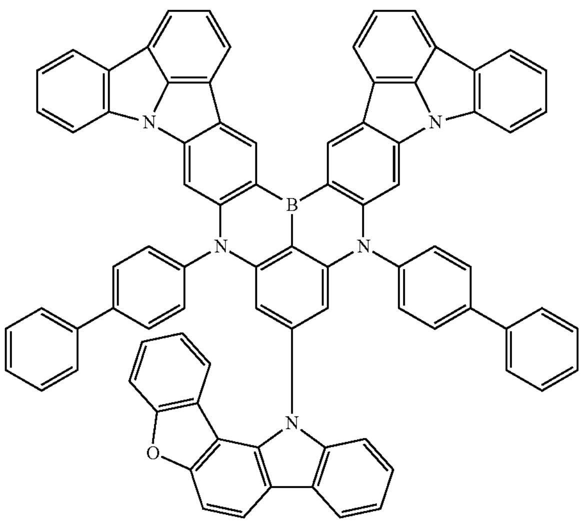
205
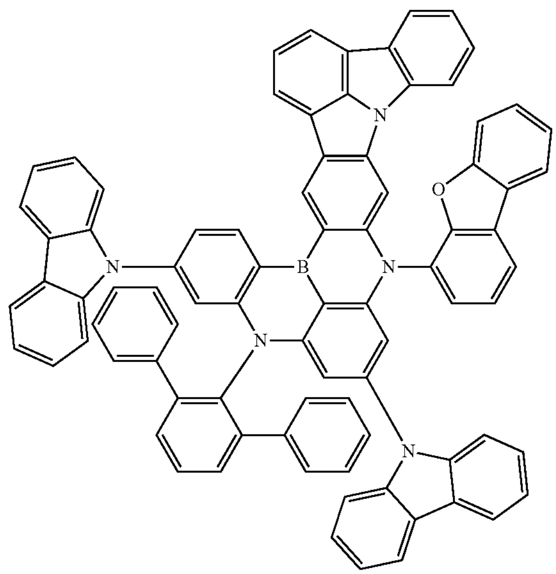
206
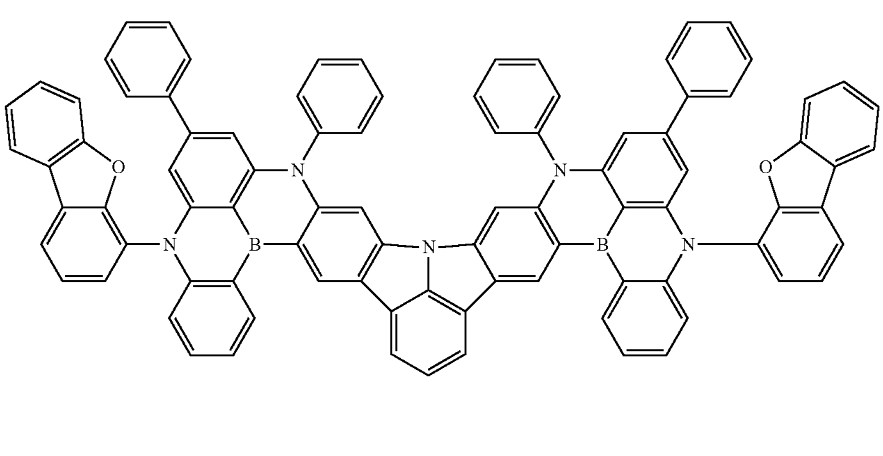

-continued
207
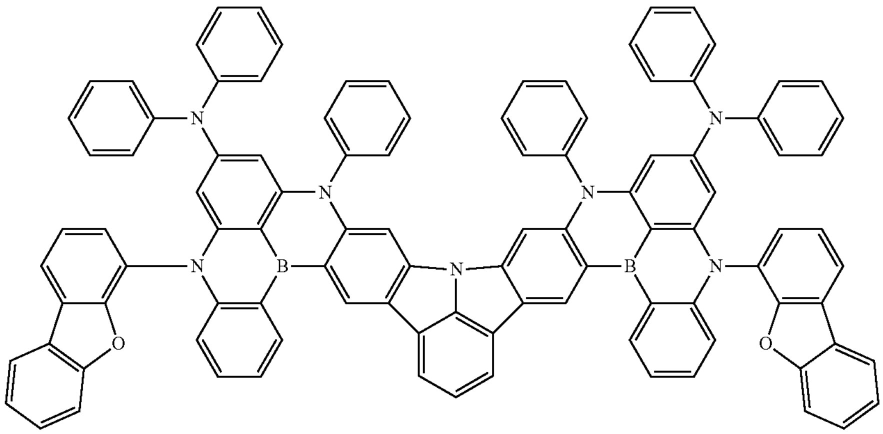
208
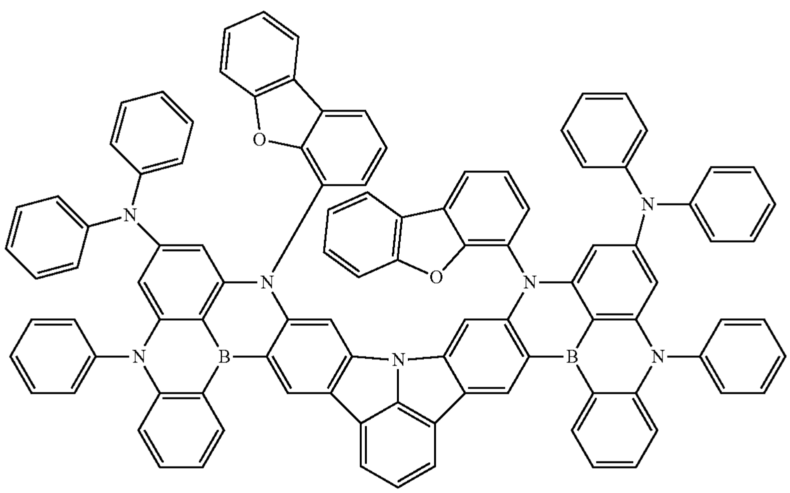
209
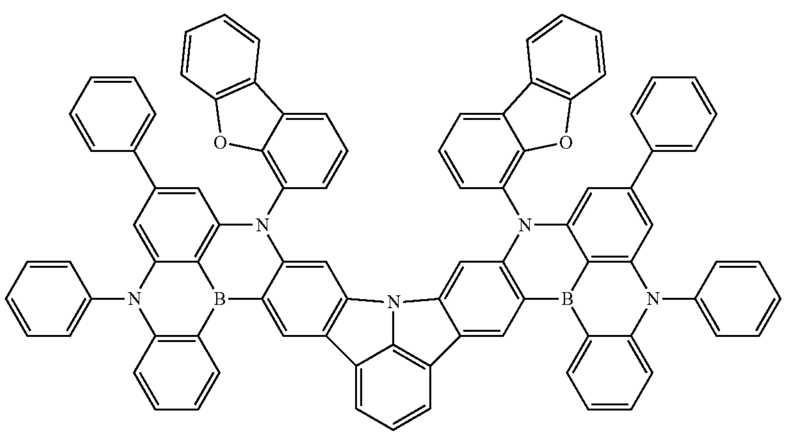

-continued
210
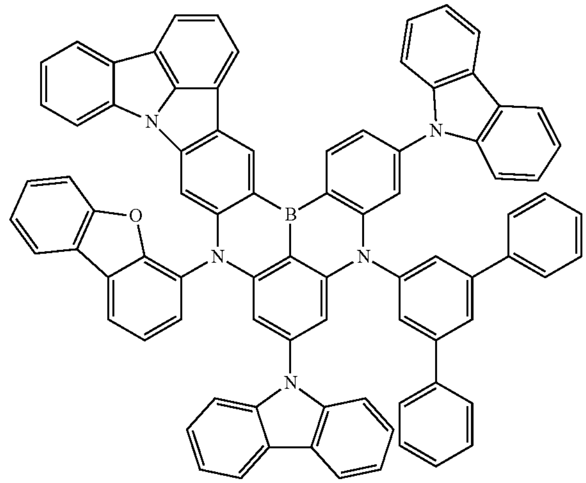
211
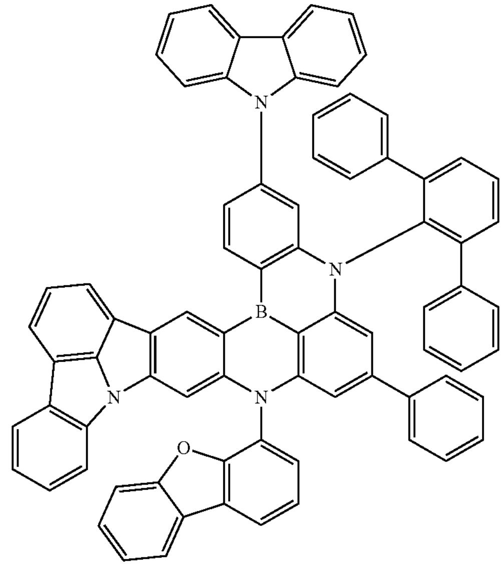
212
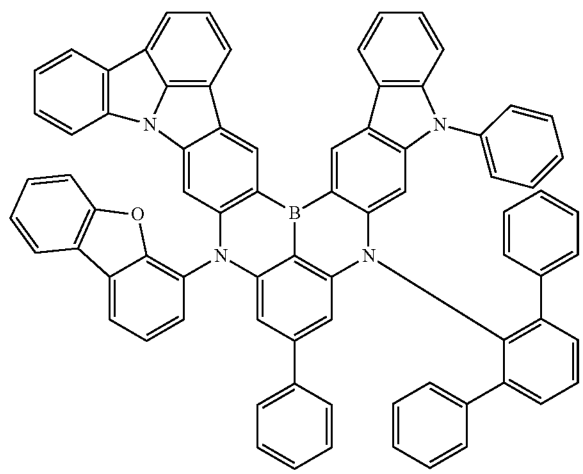
213
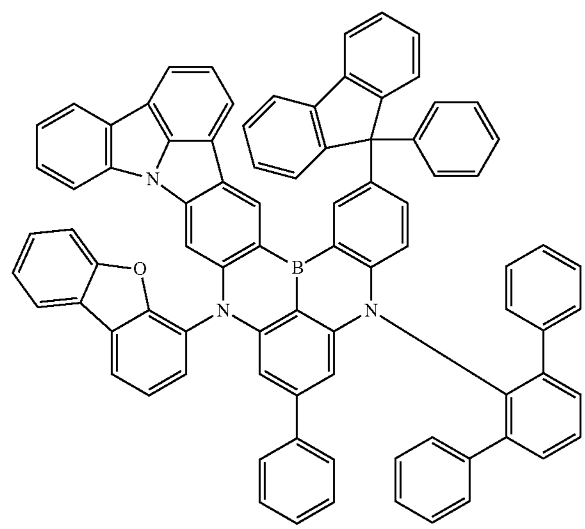
214
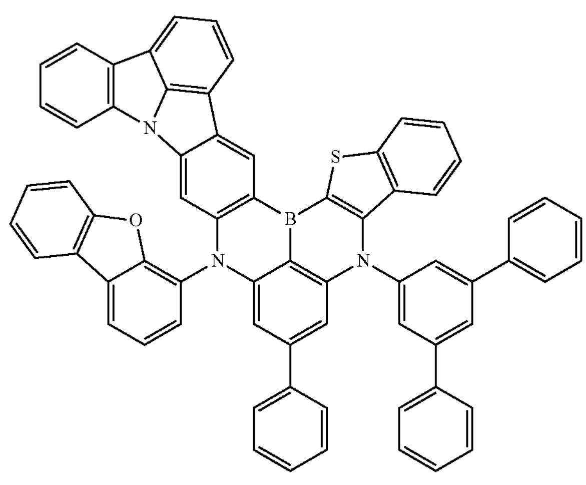
215
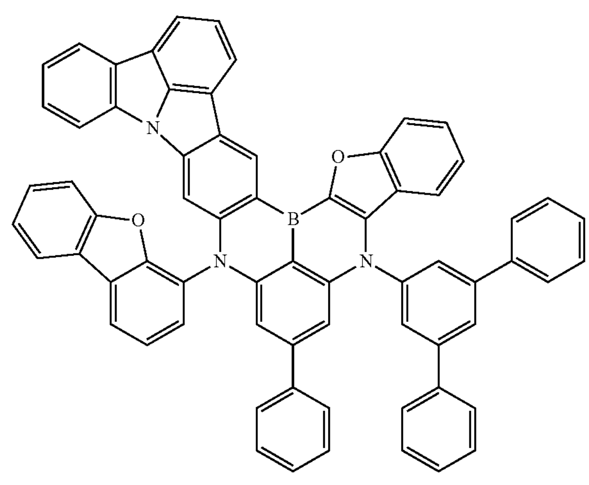

-continued

216

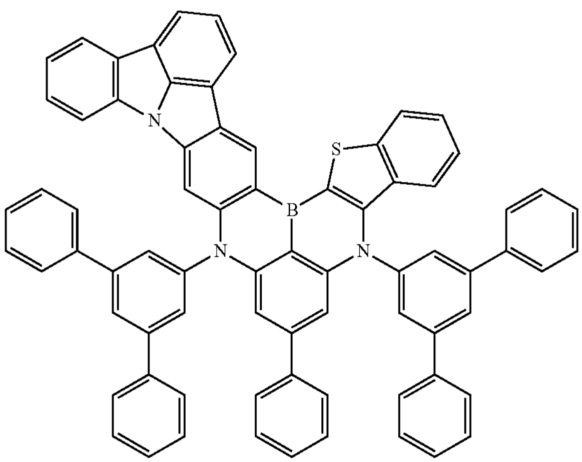

217

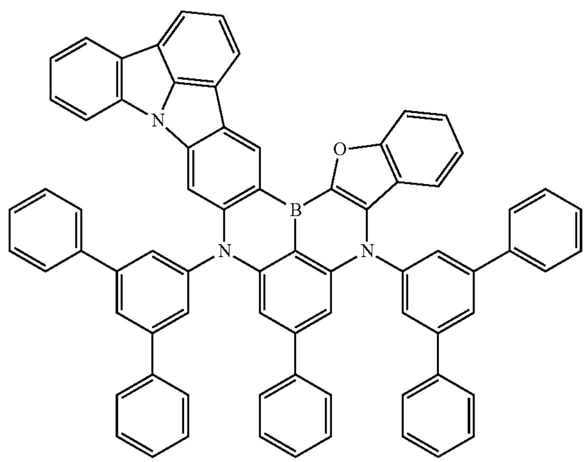

wherein in Compound Group 1,

D is a deuterium atom.

13. A polycyclic compound represented by Formula 1:

[Formula 1]

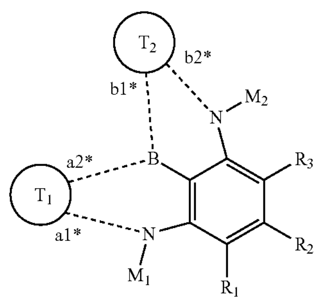

wherein in Formula 1, $R_1$ to $R_3$, $M_1$, and $M_2$ are each independently a hydrogen atom, a deuterium atom, a halogen atom, a cyano group, a substituted or unsubstituted oxy group, a substituted or unsubstituted thio group, a substituted or unsubstituted boryl group, a substituted or unsubstituted amine group, a substituted or unsubstituted silyl group, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms, or are bonded to an adjacent group to form a ring, $T_1$ and $T_2$ are each independently a substituted or unsubstituted hydrocarbon ring having 6 to 30 ring-forming carbon atoms, or a substituted or unsubstituted heterocycle having 5 to 30 ring-forming carbon atoms, at least one of $T_1$ or $T_2$ is a group represented by Formula 2, a1* and a2* are sites where $T_1$ is bonded, and b1* and b2* are sites where $T_2$ is bonded,

[Formula 2]

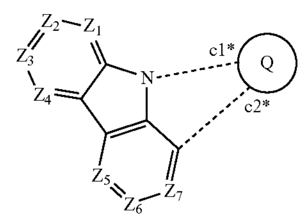

wherein in Formula 2,

Q is 0 or 1, when Q is 0, the group represented by Formula 2 is bonded to Formula 1 at sites c1* and c2*, when Q is 1, the group represented by Formula 2 is bonded to Formula 1 through Q, or the group represented by Formula 2 is bonded to Formula 1 at two neighboring sites selected from $Z_1$ to $Z_7$, Q is a substituted or unsubstituted hydrocarbon ring having 6 to 30 ring-forming carbon atoms, or a substituted or unsubstituted heterocycle having 5 to 30 ring-forming carbon atoms, $Z_1$ to $Z_7$ are each independently N or $C(R_a)$, and $R_a$ is a hydrogen atom, a deuterium atom, a halogen atom, a cyano group, a substituted or unsubstituted oxy group, a substituted or unsubstituted thio group, a substituted or unsubstituted boryl group, a substituted or unsubstituted amine group, a substituted or unsubstituted silyl group, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms, or is bonded to an adjacent group to form a ring, wherein when the polycyclic compound represented by Formula 1 is represented by Formula 4-1, the polycyclic compound is represented by Formula 4-1a or Formula 4-1b,

[Formula 4-1]

4-1

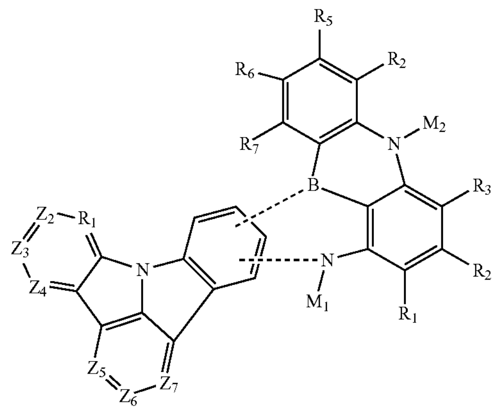

4-1a

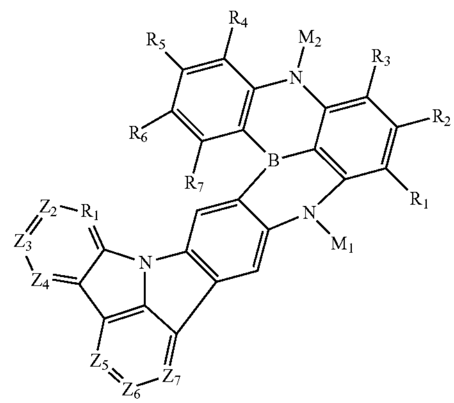

4-1b

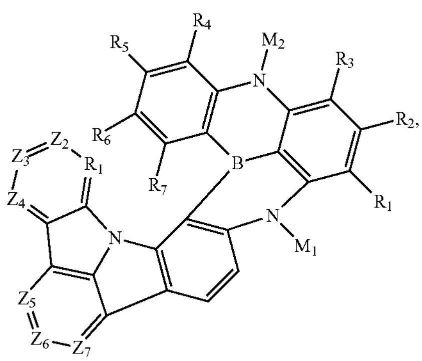

and wherein in Formula 4-1, Formula 4-1a and Formula 4-1b, $R_4$ to $R_7$ are each independently a hydrogen atom, a deuterium atom, a halogen atom, a cyano group, a substituted or unsubstituted oxy group, a substituted or unsubstituted thio group, a substituted or unsubstituted boryl group, a substituted or unsubstituted amine group, a substituted or unsubstituted silyl group, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms, or are bonded to an adjacent group to form a ring, and $R_1$ to $R_3$, $M_1$, $M_2$, and $Z_1$ to $Z_7$ are the same as defined in Formulas 1 and 2, and wherein the polycyclic compound has a molar absorption coefficient equal to or greater than about $4.0\times10^{-4}$ $M^{-1}$ $cm^{-1}$ at about 450 nm.

14. The polycyclic compound of claim 13, wherein the group represented by Formula 2 is represented by one of Formulas 2-1 to 2-3:

[Formula 2-1]

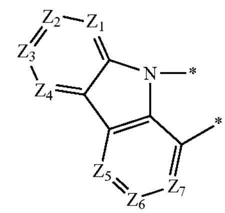

[Formula 2-2]

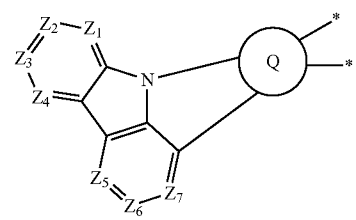

[Formula 2-3]

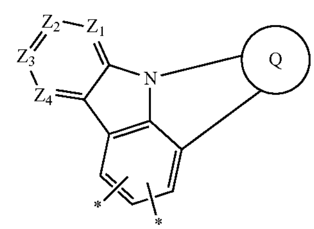

wherein in Formulas 2-1 to 2-3,

-* is a site bonded to a1* and a2* of Formula 1 or bonded to b1* and b2* of Formula 1, and Q and $Z_1$ to $Z_7$ are the same as defined in Formula 2.

15. The polycyclic compound of claim 14, wherein in Formula 1, one of $T_1$ or $T_2$ is a substituted or unsubstituted benzene ring, and the other one of $T_1$ or $T_2$ is a group represented by one of Formulas 2-1 to 2-3.

16. The polycyclic compound of claim 13, wherein the polycyclic compound represented by Formula 1 is represented by one of Formulas 4-1 to 4-8:

4-1

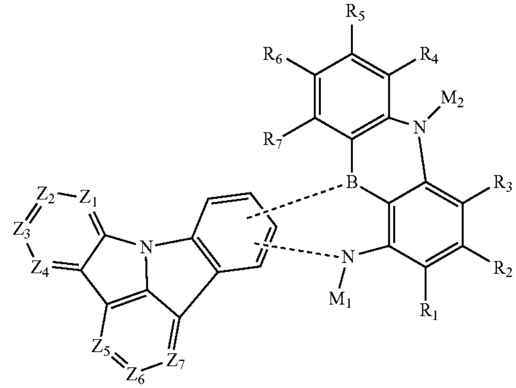

-continued
4-2
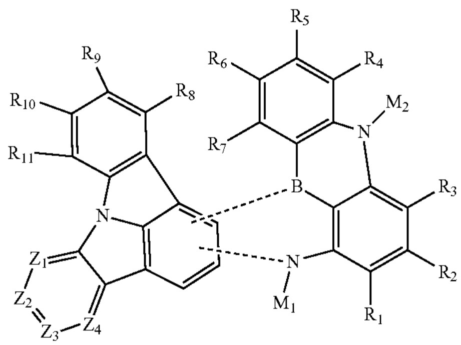
4-3
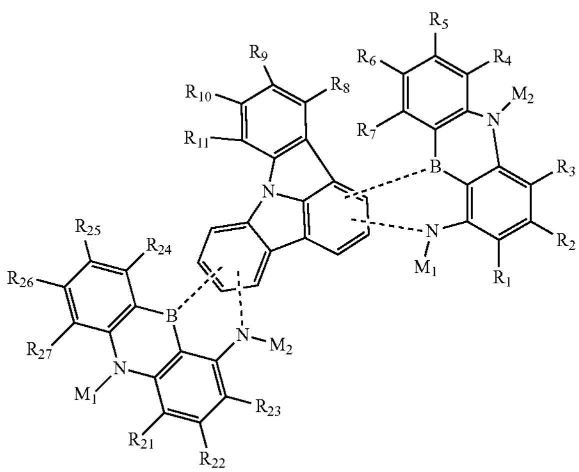
4-4
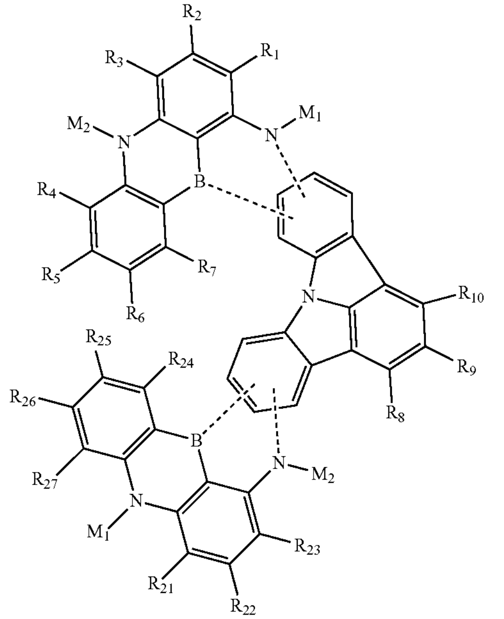
-continued
4-5
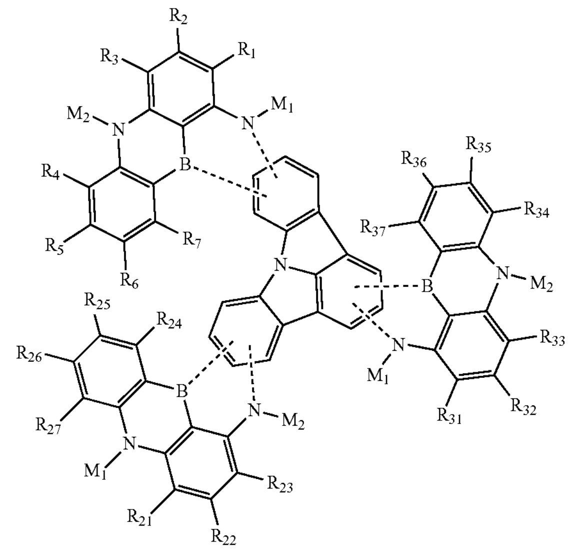
4-6
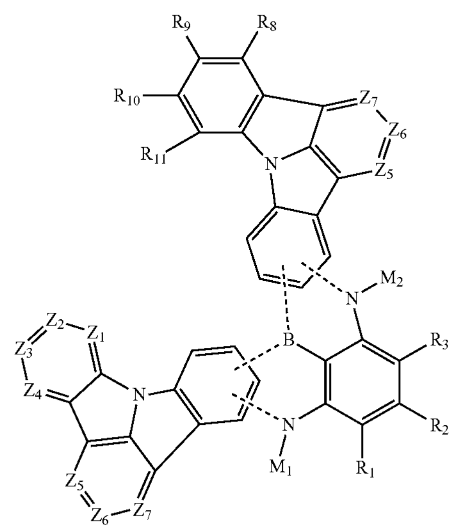
4-7
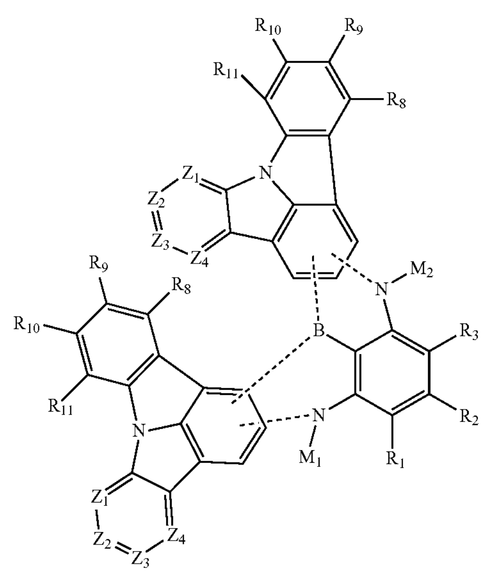

-continued 4-8

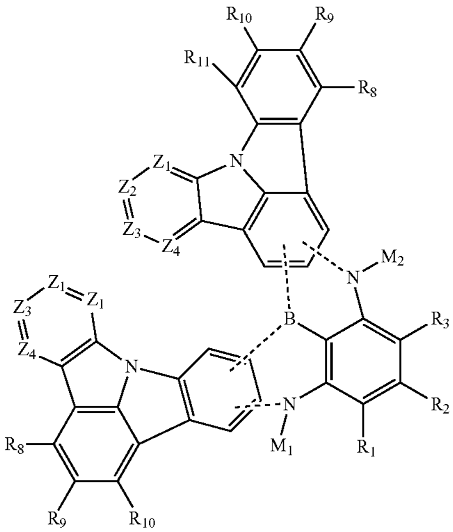

wherein in Formulas 4-1 to 4-8, $R_4$ to $R_{11}$, $R_{21}$ to $R_{27}$, and $R_{31}$ to $R_{37}$ are each independently a hydrogen atom, a deuterium atom, a halogen atom, a cyano group, a substituted or unsubstituted oxy group, a substituted or unsubstituted thio group, a substituted or unsubstituted boryl group, a substituted or unsubstituted amine group, a substituted or unsubstituted silyl group, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms, or are bonded to an adjacent group to form a ring, and $R_1$ to $R_3$, $M_1$, $M_2$, and $Z_1$ to $Z_7$ are the same as defined in Formulas 1 and 2.

17. The polycyclic compound of claim 13, wherein in Formula 1, one of $T_1$ or $T_2$ is a group represented by Formula 2, and the other one of $T_1$ or $T_2$ is a group represented by one of T-a to T-e:

T-a

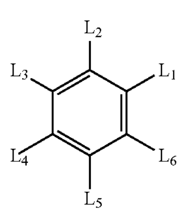

T-b

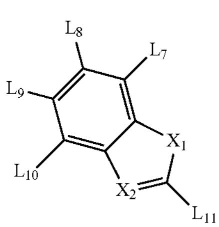

-continued

T-c

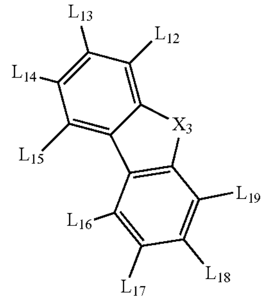

T-d

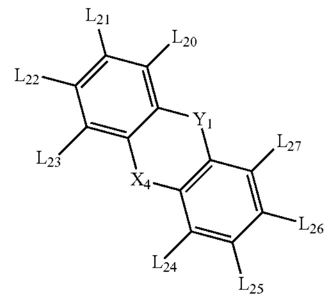

T-e

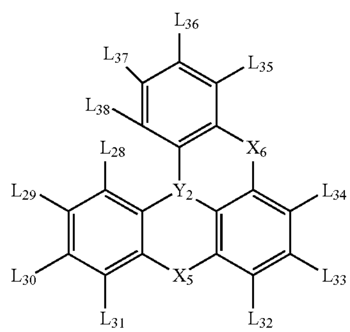

wherein in T-a to T-e, $X_1$ to $X_6$ are each independently N, O, S, $N(R_b)$, or $C(R_c)(R_a)$, $Y_1$ and $Y_2$ are each independently O, S, $B(R_e)$, or $P(=O)(R_f)$, $L_1$ to $L_{38}$, and $R_b$ to $R_f$ are each independently a hydrogen atom, a deuterium atom, a halogen atom, a cyano group, a substituted or unsubstituted oxy group, a substituted or unsubstituted thio group, a substituted or unsubstituted boryl group, a substituted or unsubstituted amine group, a substituted or unsubstituted silyl group, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms, or are bonded to an adjacent group to form a ring, except that two neighboring sites selected from $L_1$ to $L_{38}$, and $X_1$ to $X_6$ correspond to a1* and a2* or correspond to b1* and b2*.

18. The polycyclic compound of claim 17, wherein the polycyclic compound represented by Formula 1 is represented by one of Formulas 5-1 to 5-9:

-continued
5-1
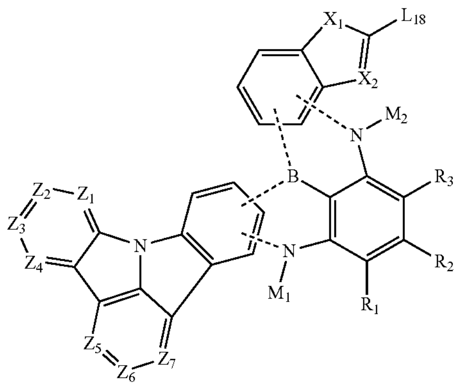
5-2
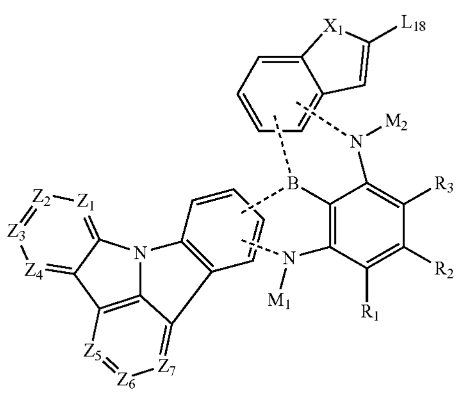
5-3
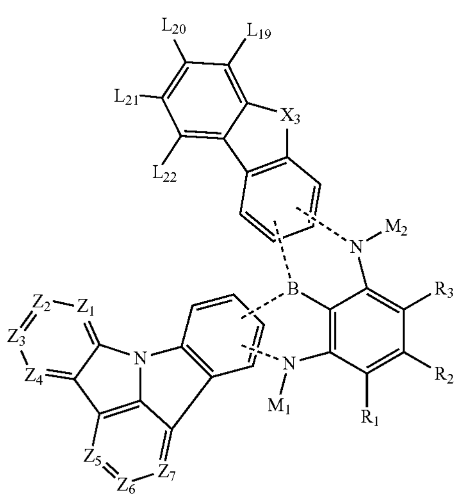
5-4
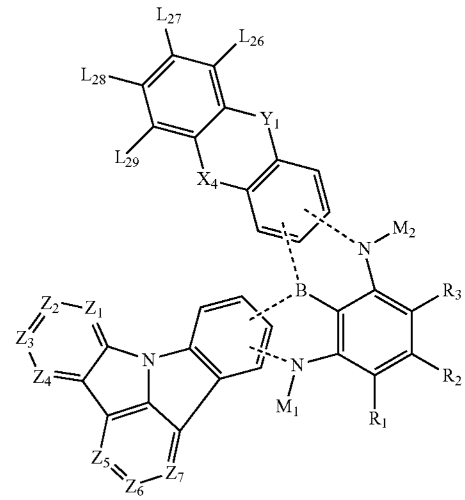
5-5
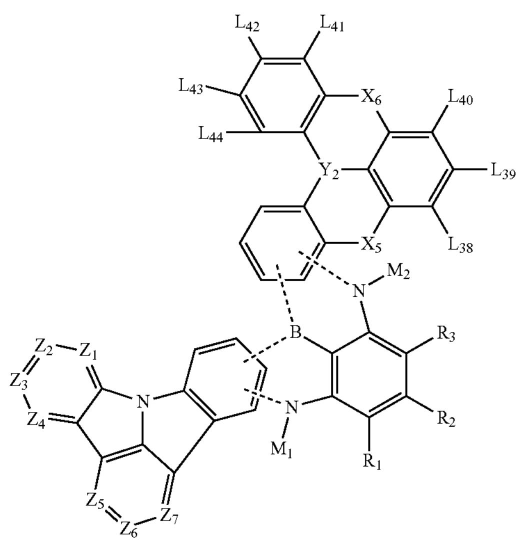
5-6
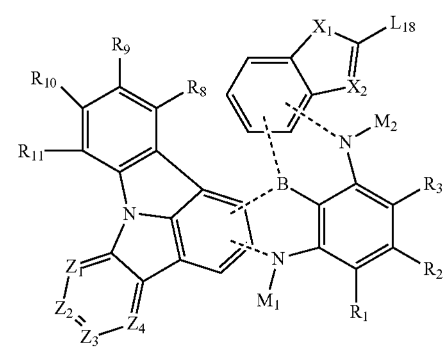

-continued
5-7
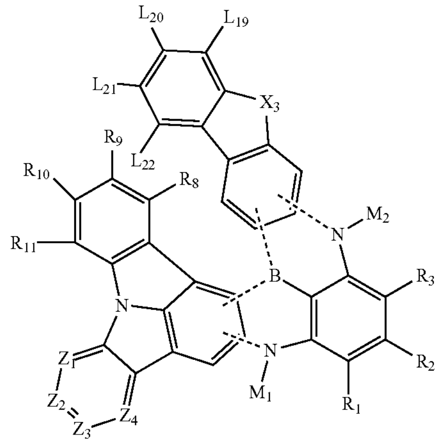
5-8
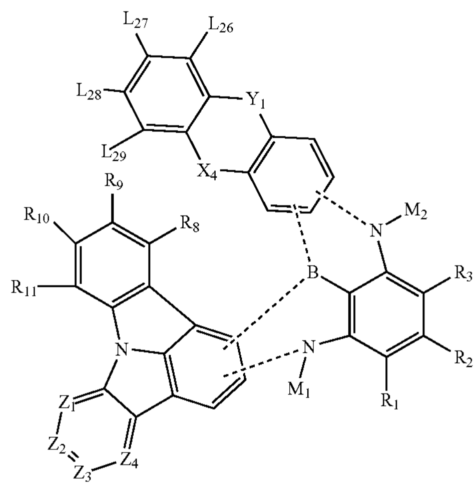
5-9
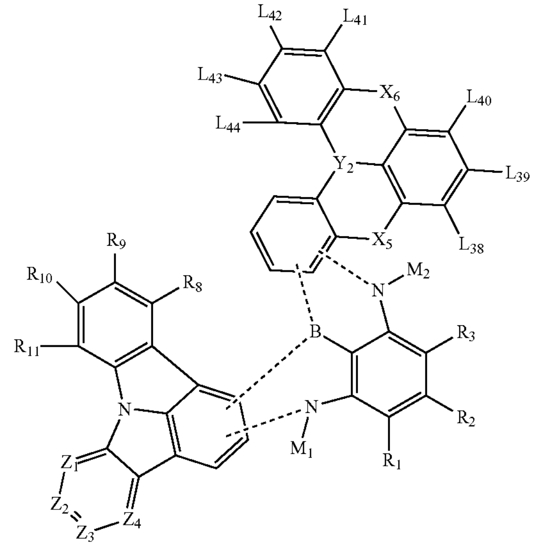
wherein in Formulas 5-1 to 5-9,
$X_1$ to $X_6$, $Y_1$, $Y_2$, $L_{18}$ to $L_{21}$, $L_{26}$ to $L_{29}$, and $L_{38}$ to $L_{44}$ are the same as defined in T-a to T-e, and
$R_1$ to $R_3$, $M_1$, $M_2$, and $Z_1$ to $Z_7$ are the same as defined in Formulas 1 and 2.
19. The polycyclic compound of claim 13, wherein the polycyclic compound represented by Formula 1 is one selected from Compound Group 1:
[Compound Group 1]
1
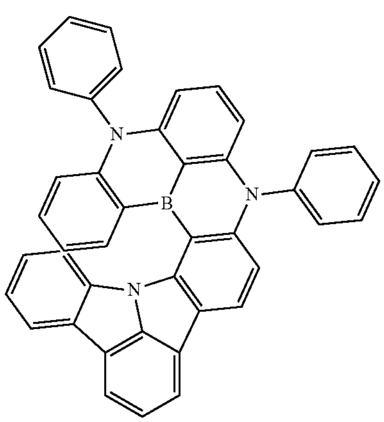
2
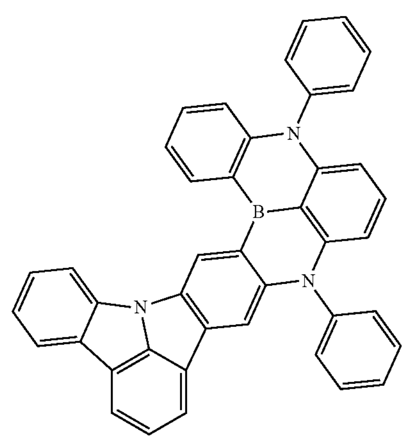

-continued
4
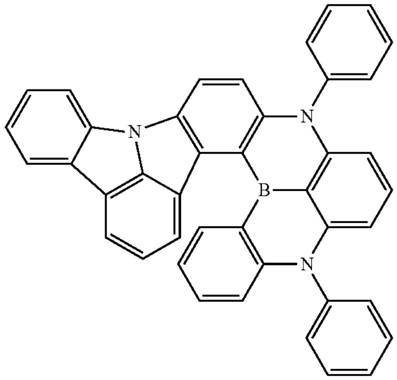
5
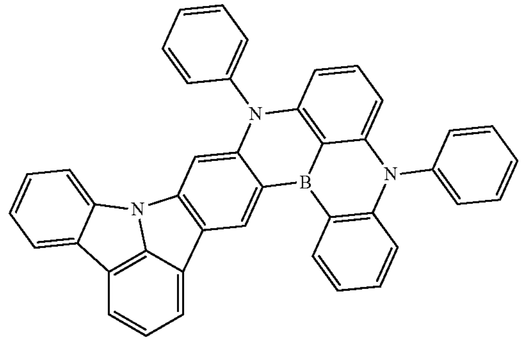
6
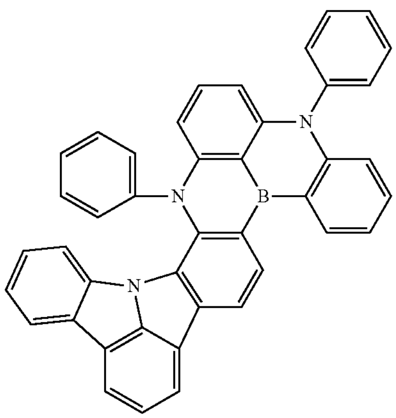
7
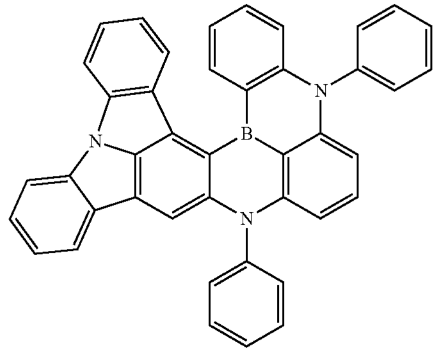
8
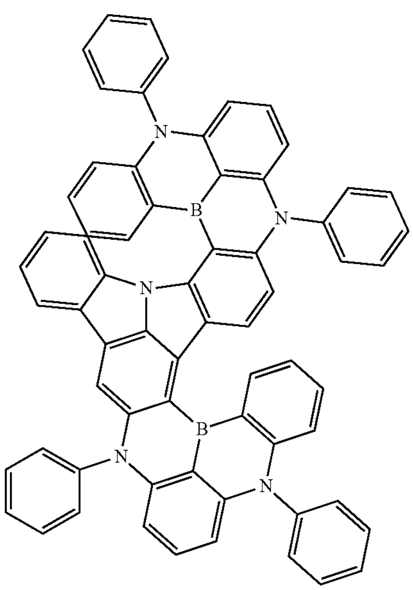
9
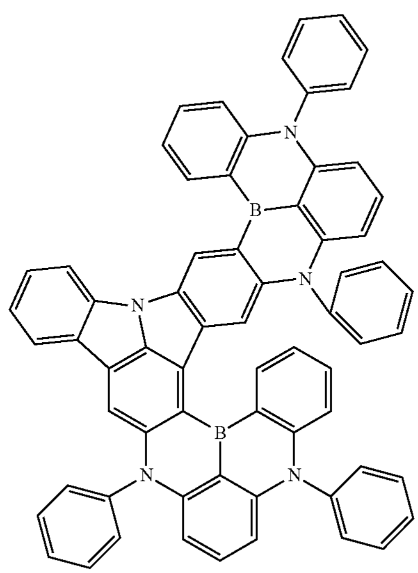

-continued
10
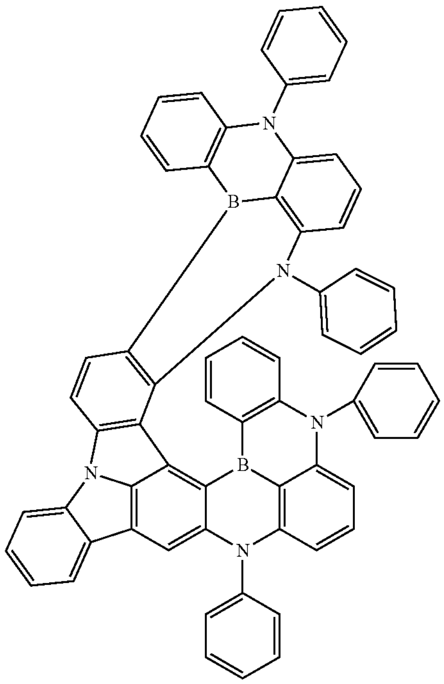
11
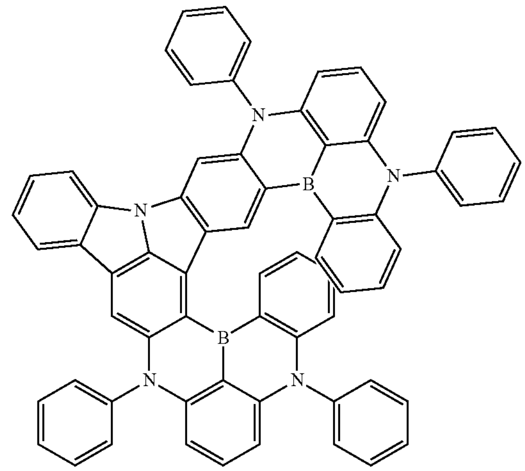
12
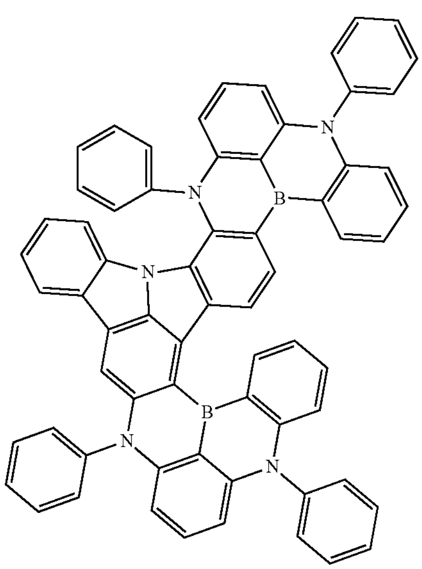
13
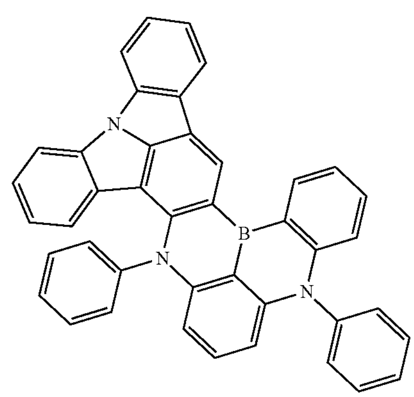

-continued
14
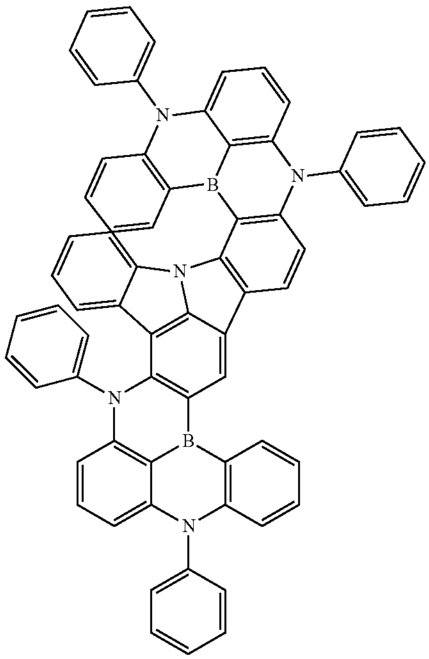
15
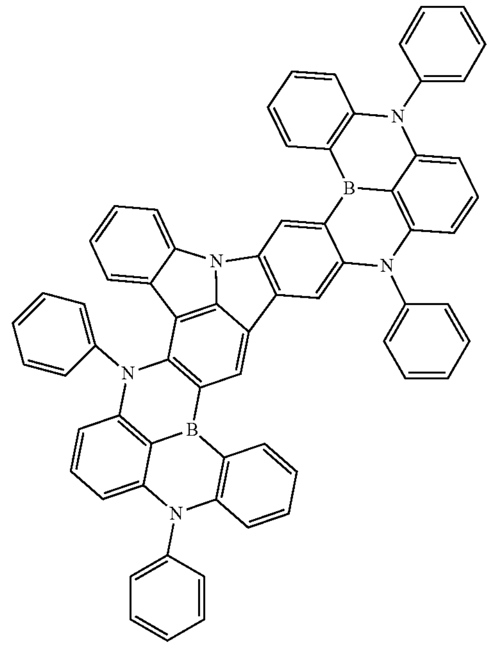
16
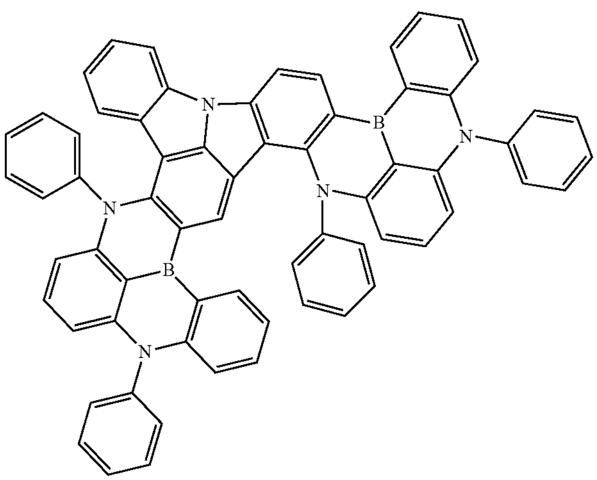
17
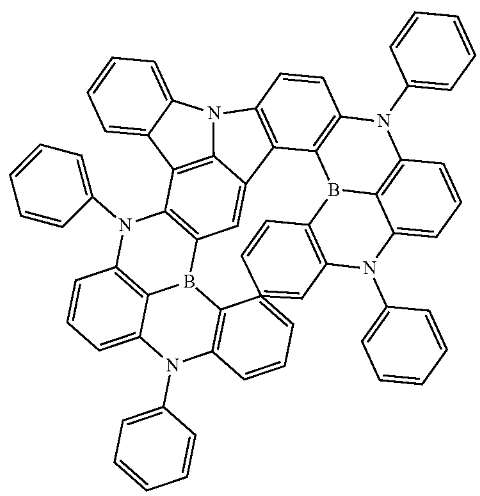
18
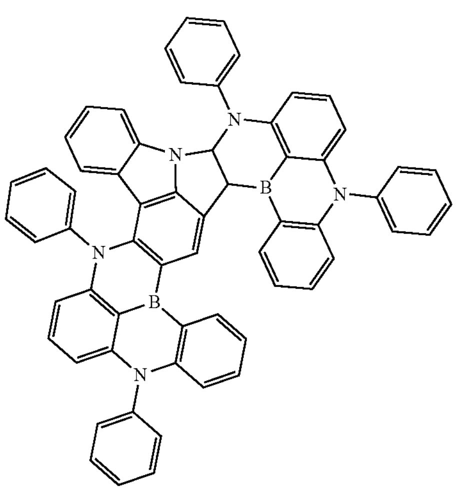
19
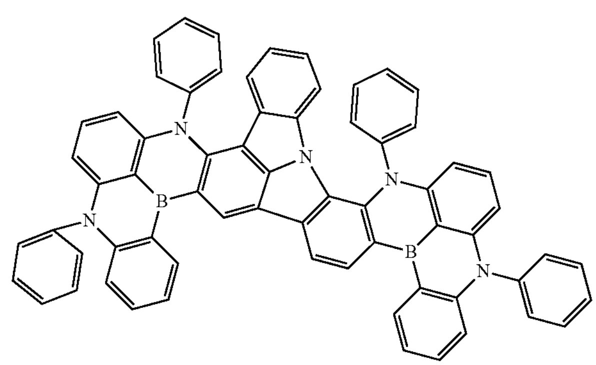

-continued
20
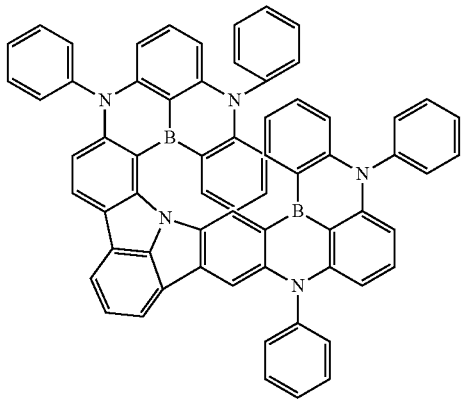
21
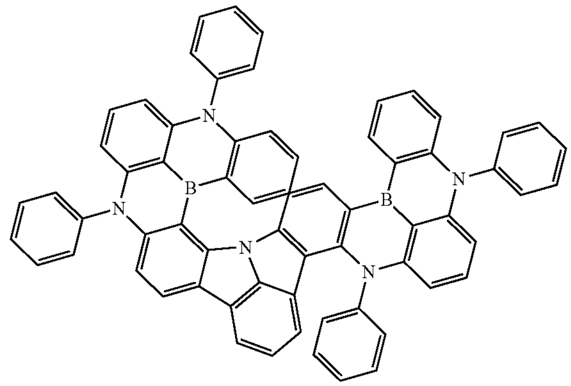
22
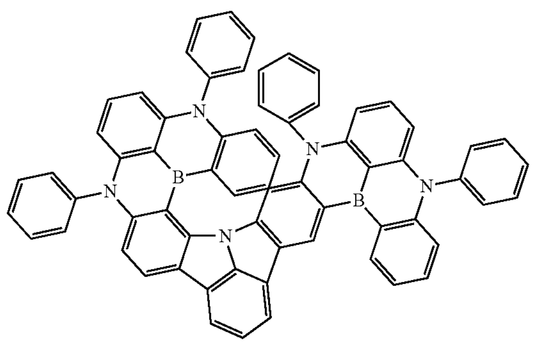
23
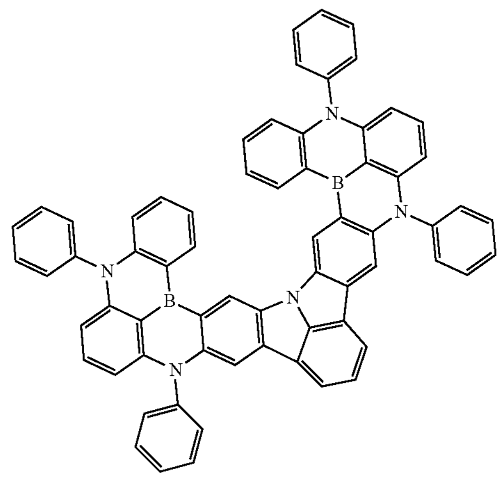
24
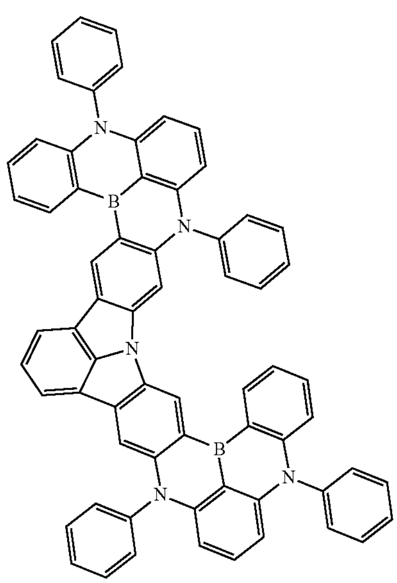
25
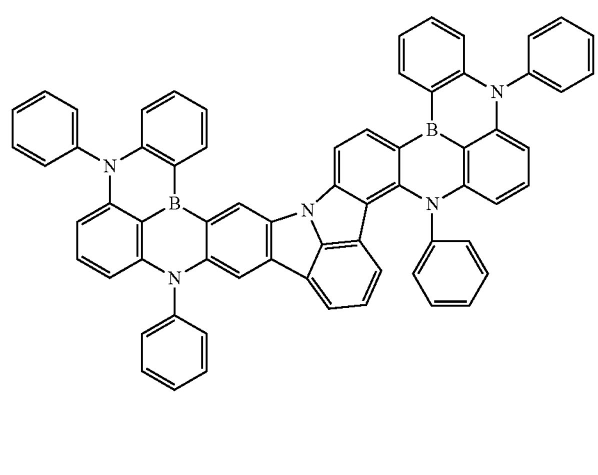

-continued
26
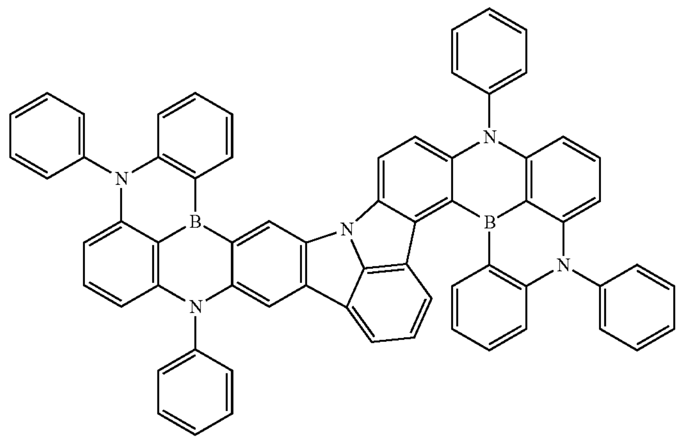
27
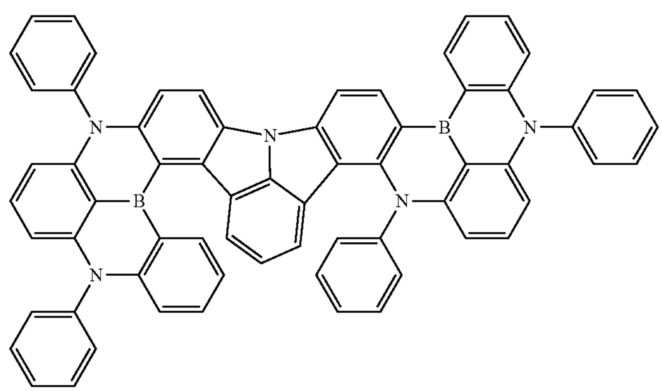
28
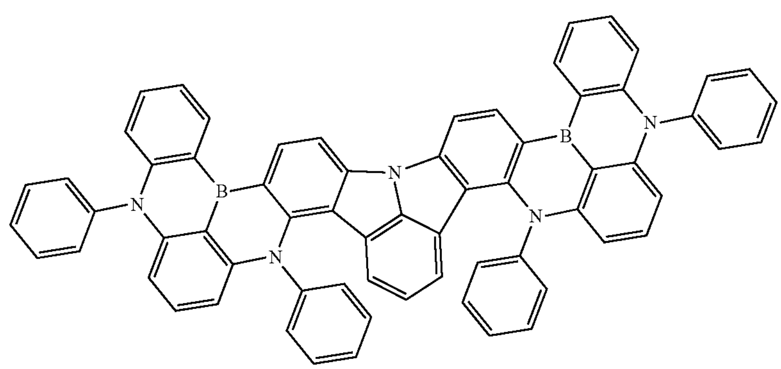
29
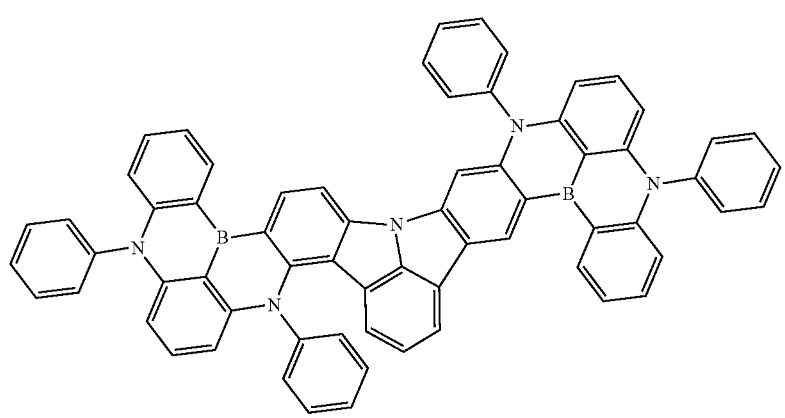

-continued
30
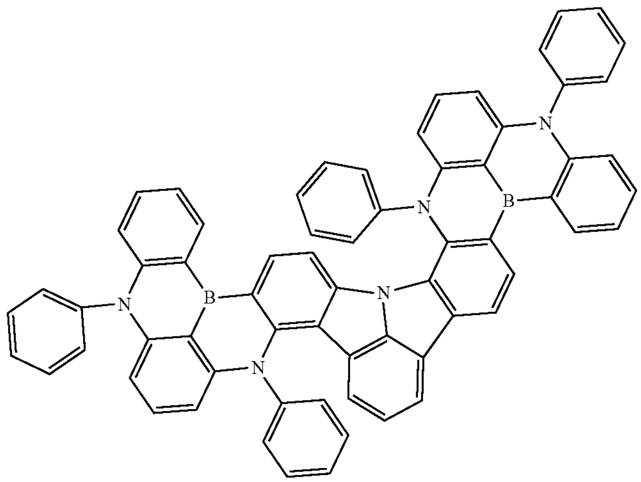
31
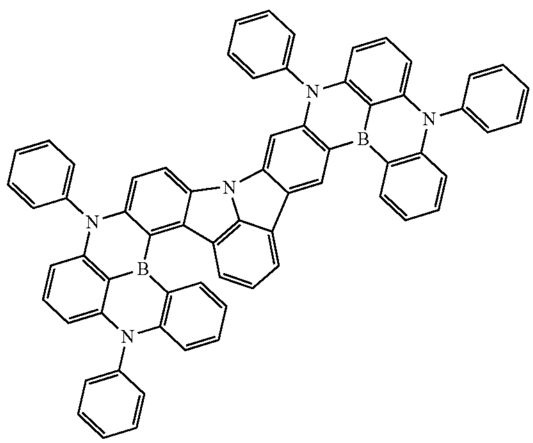
32
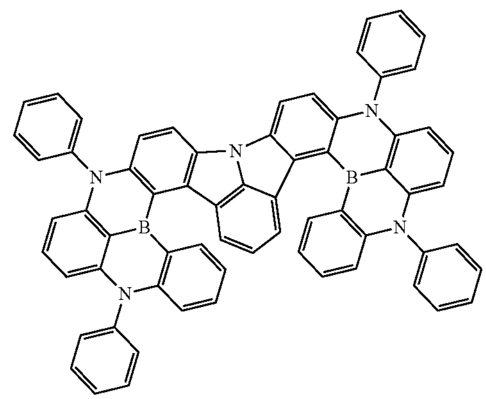
33
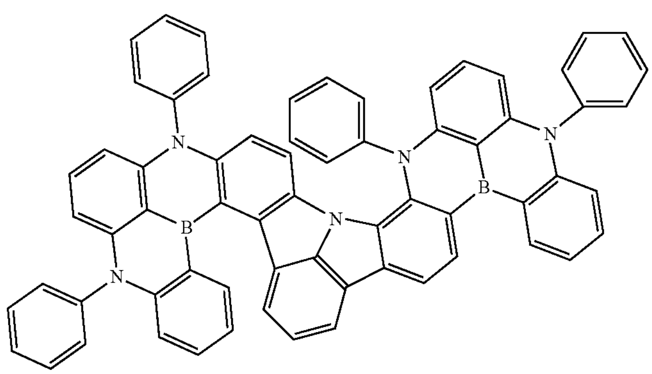
34
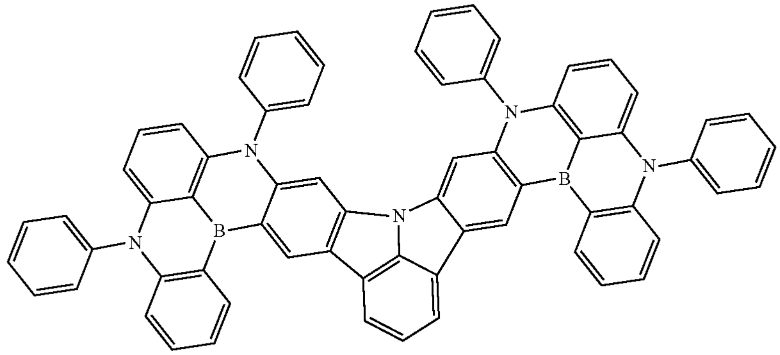

-continued
35
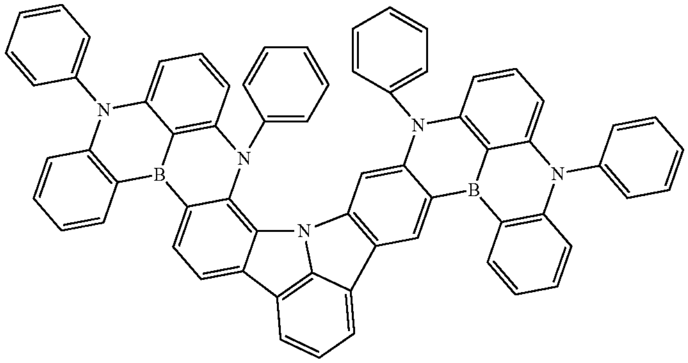
36
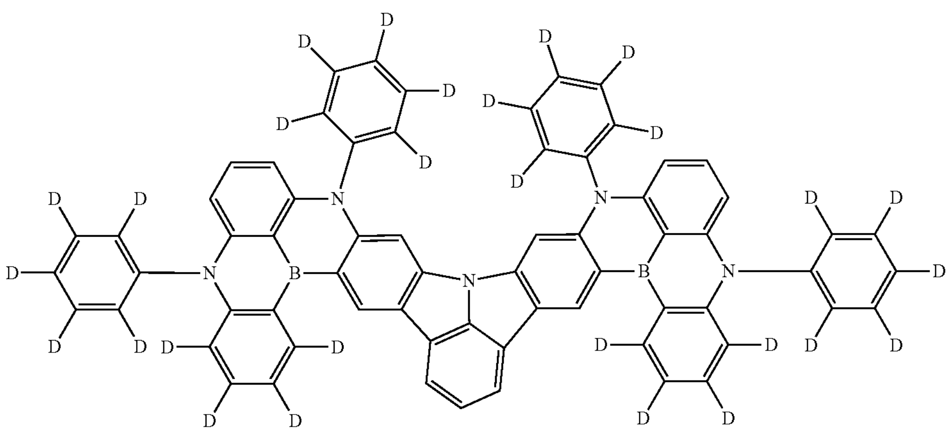
37
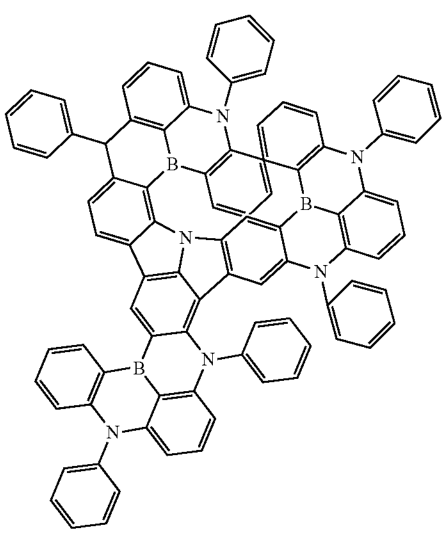
38
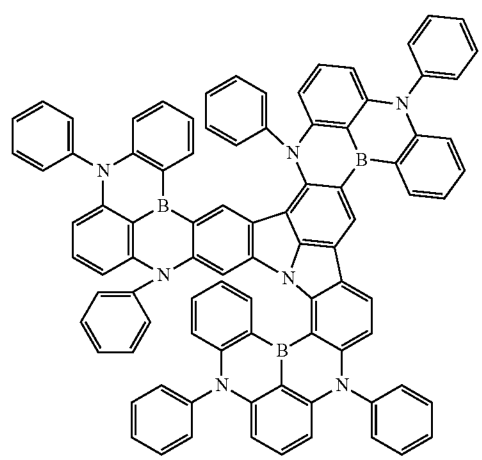

-continued
39
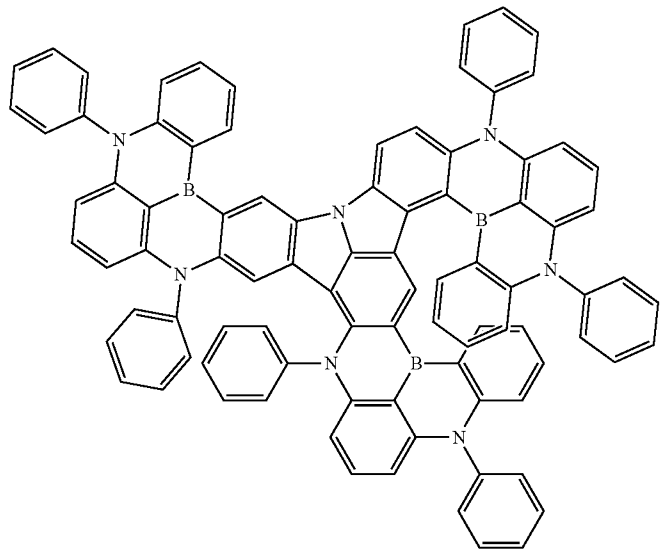
40
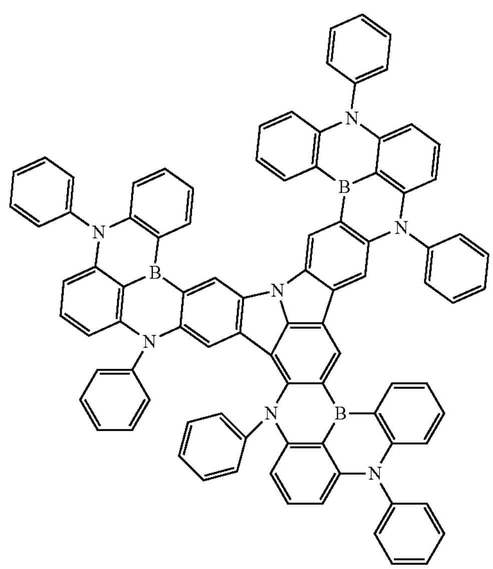
41
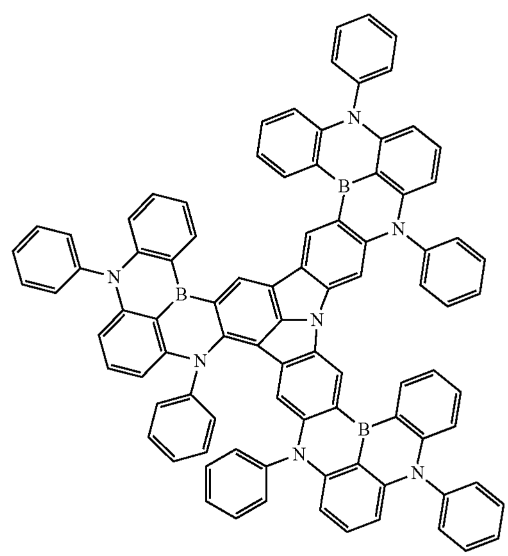

-continued
42
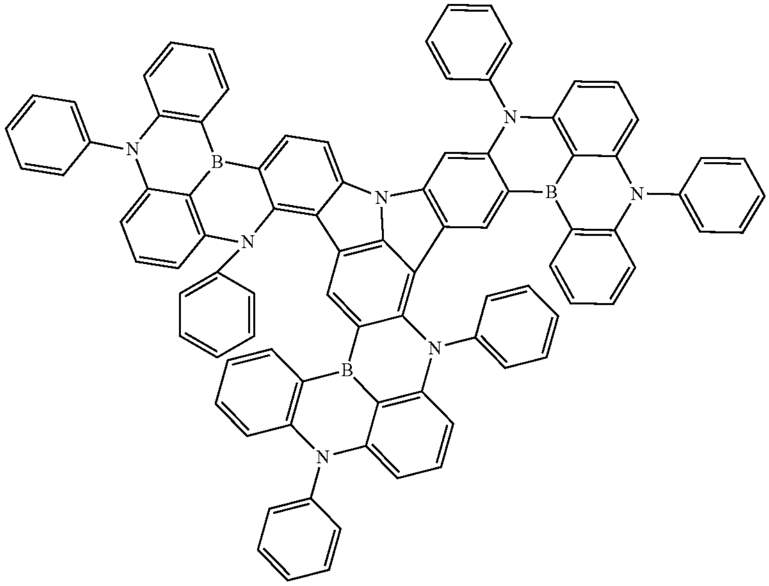
43
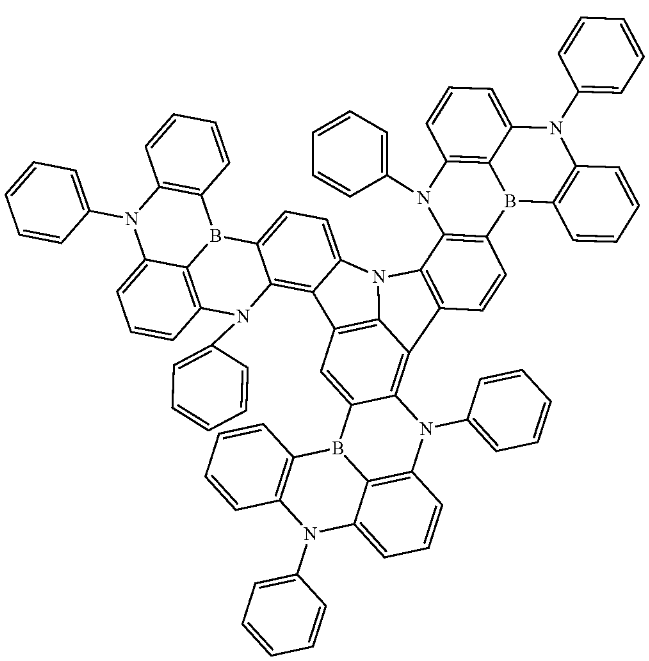

-continued
44
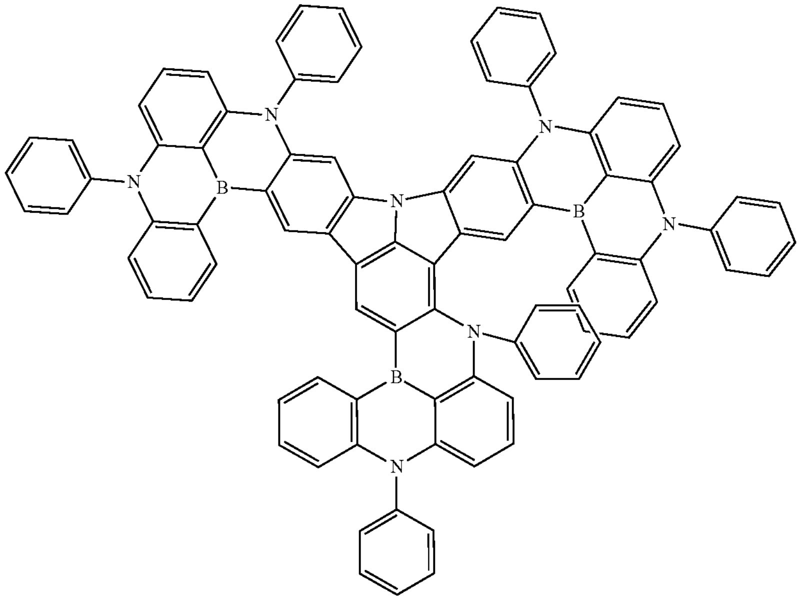
45
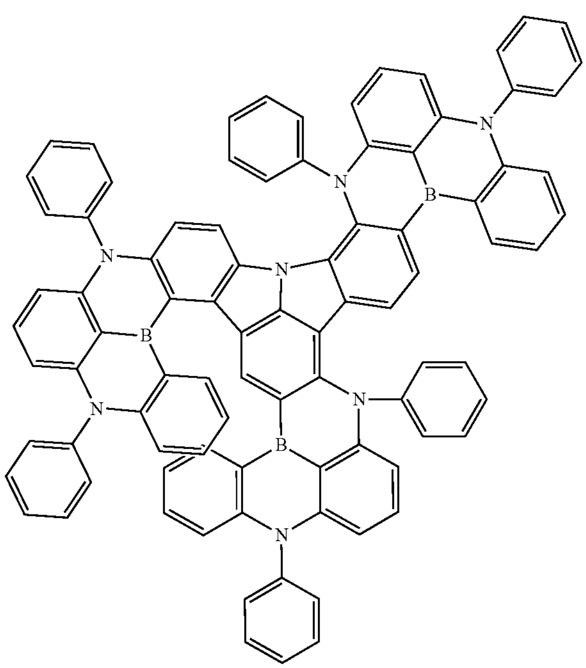

-continued
46
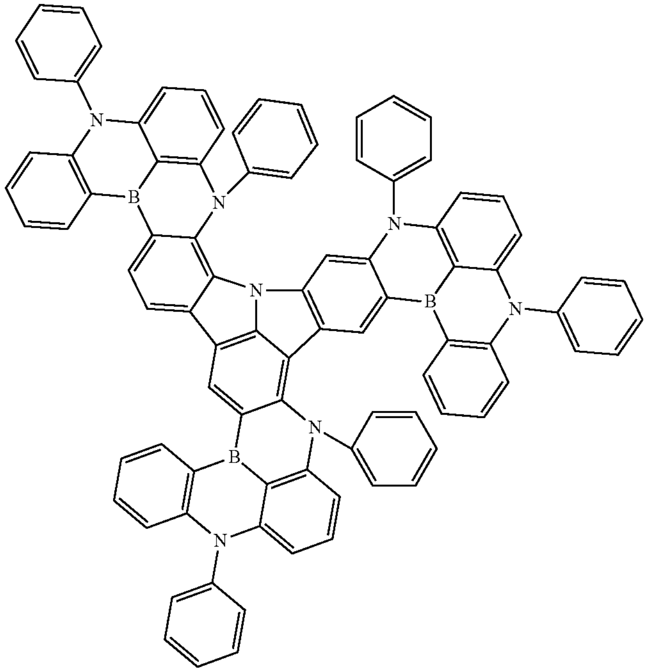
47
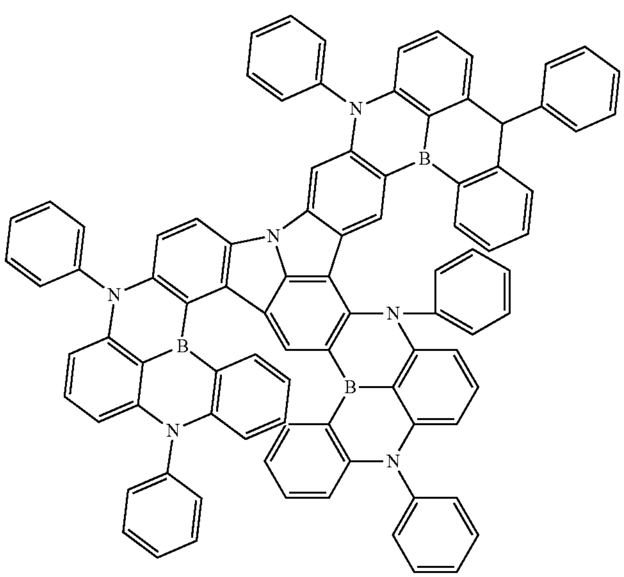

-continued
48
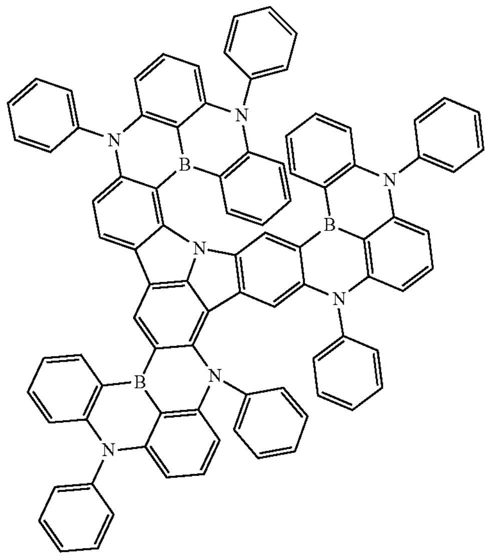
49
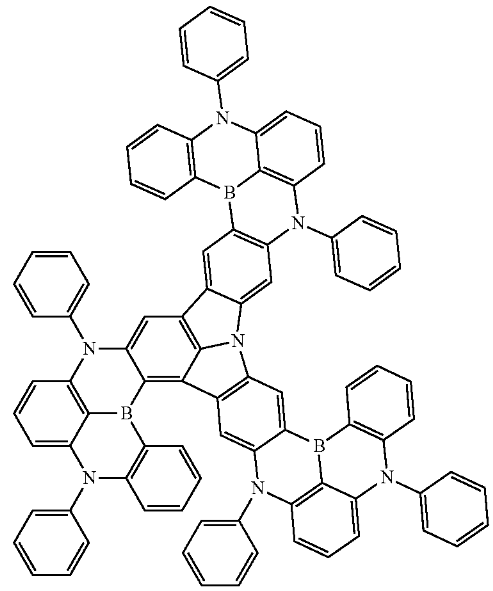
50
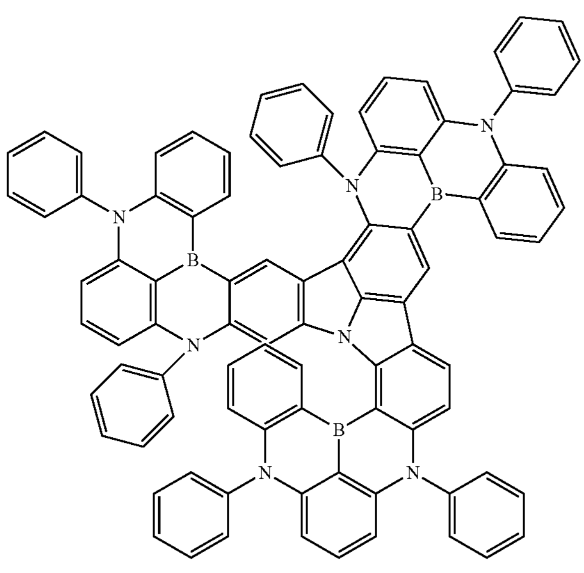

-continued
51
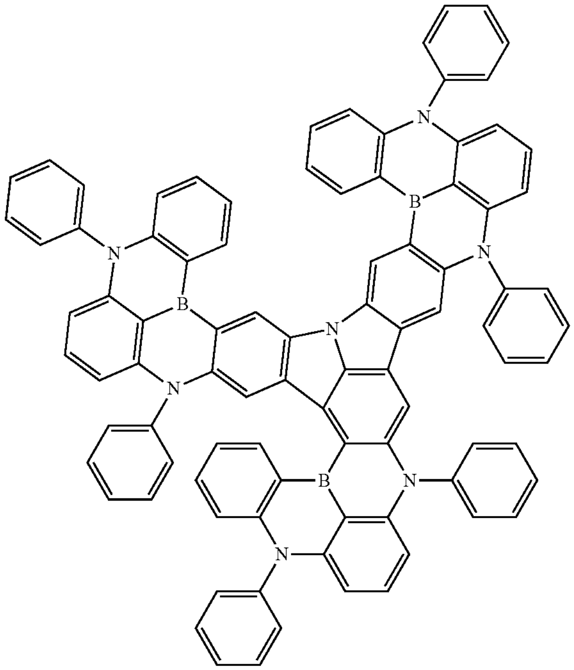
52
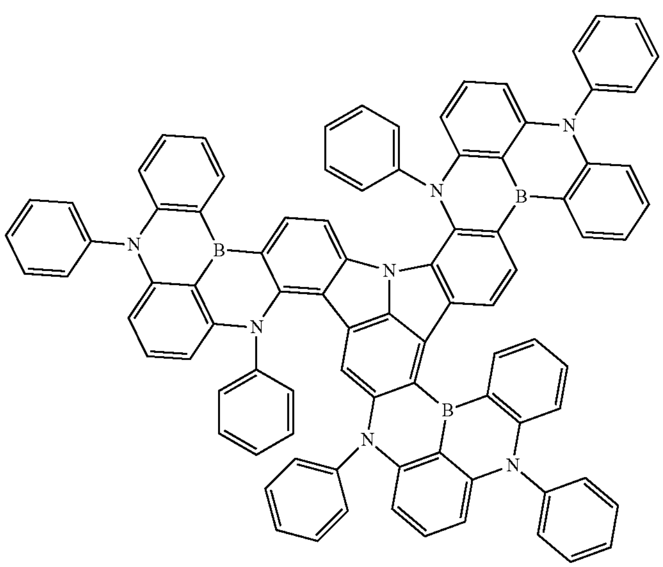

-continued
53
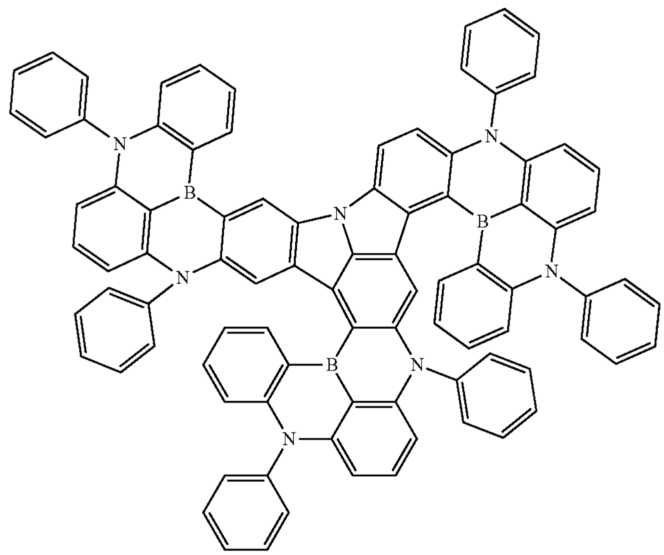
54
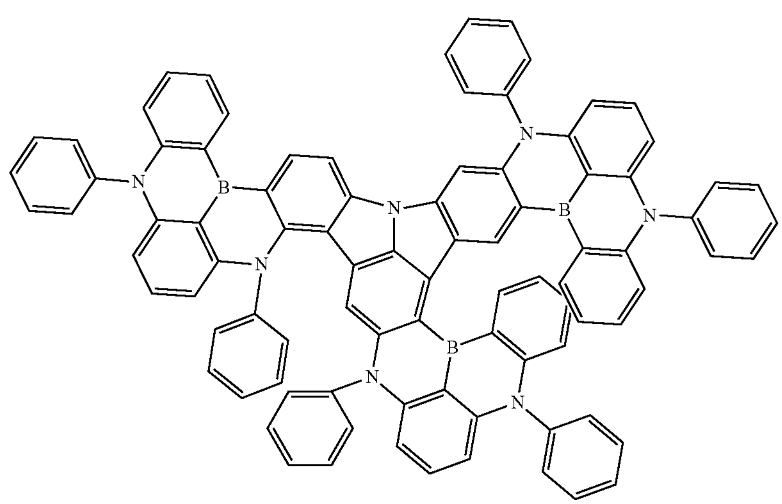

55
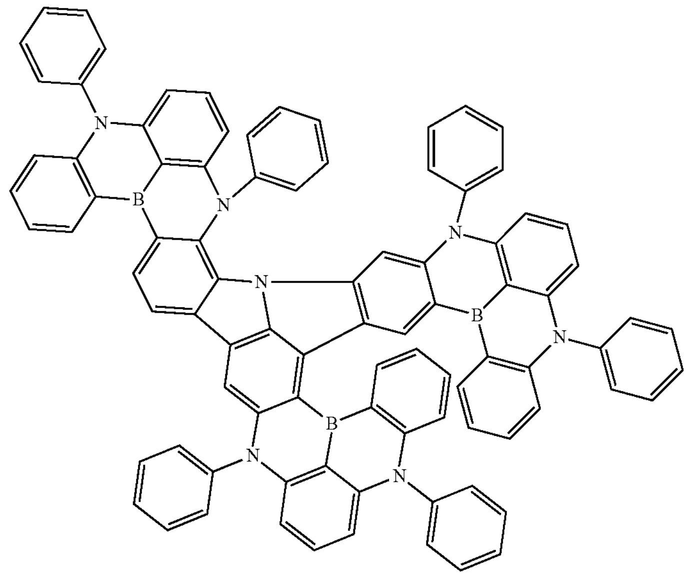
56
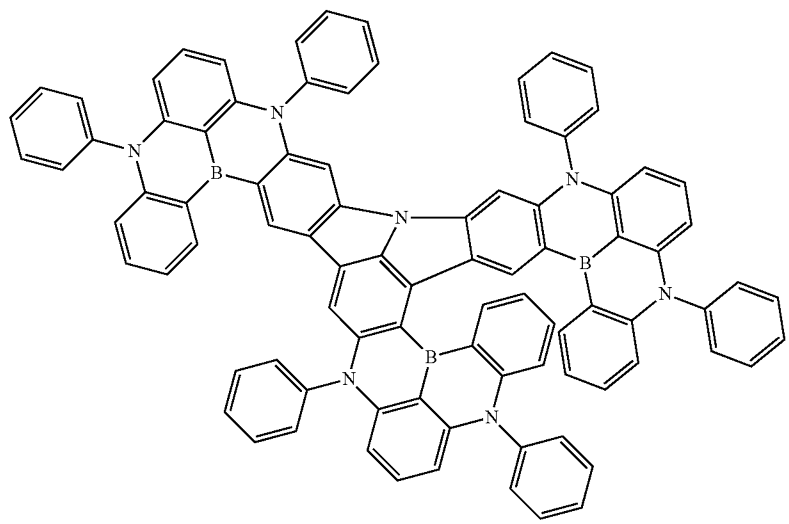
57
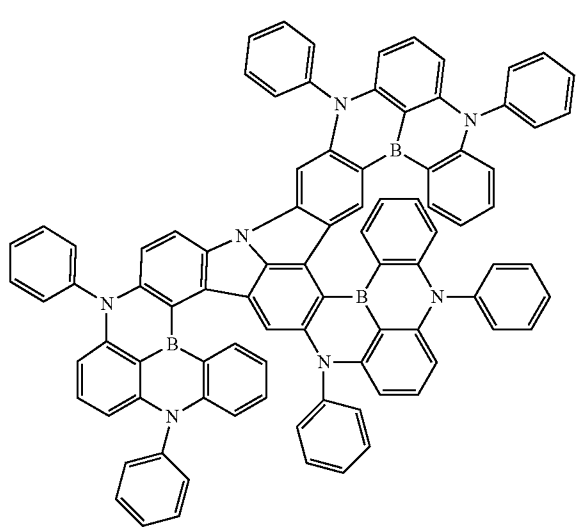
58
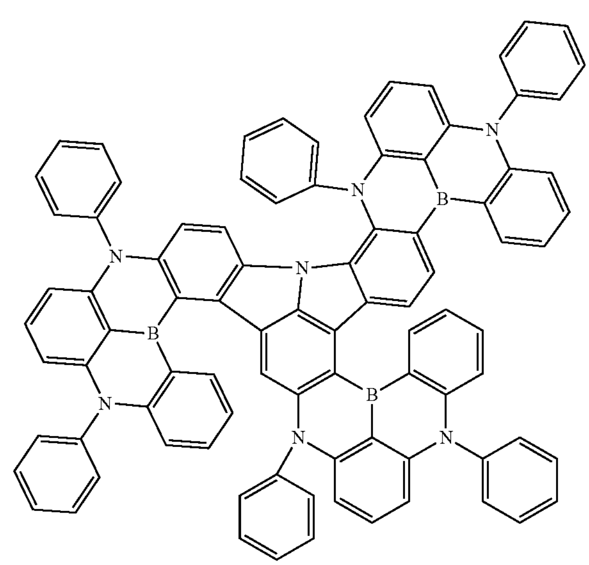

-continued
59
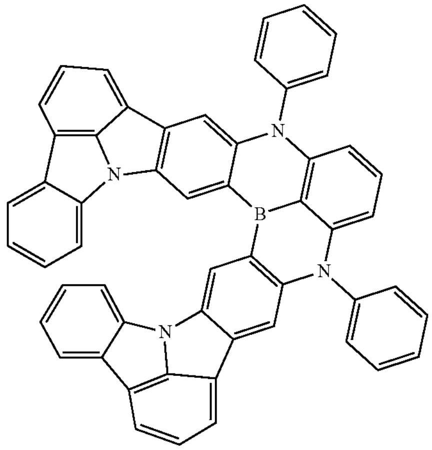
60
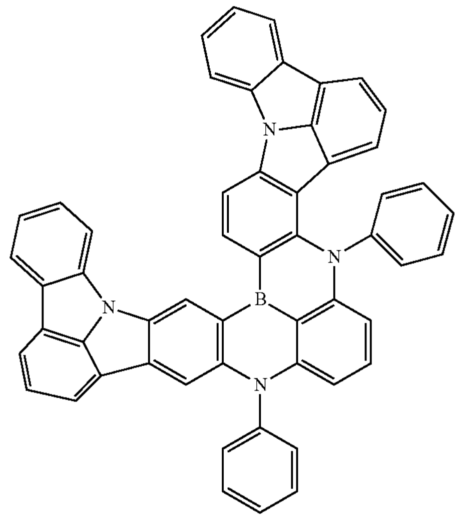
61
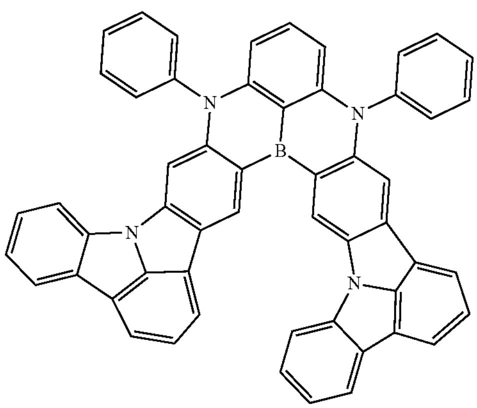
62
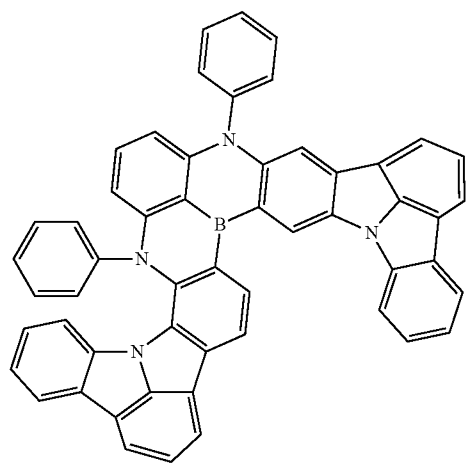
63
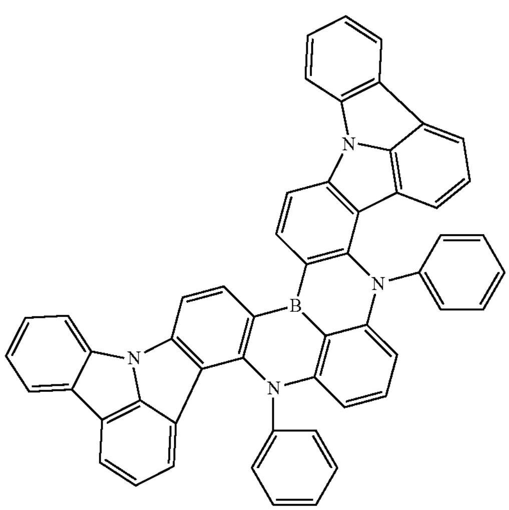
64
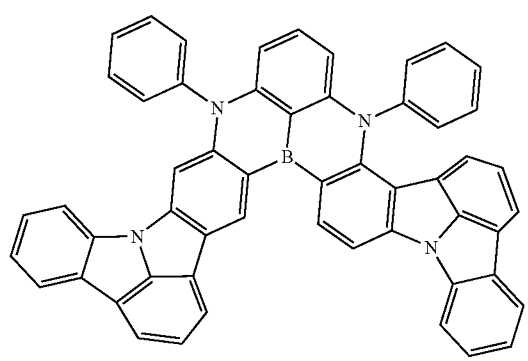

-continued
65
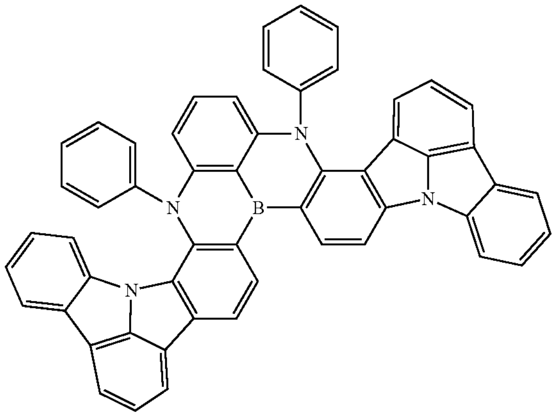
66
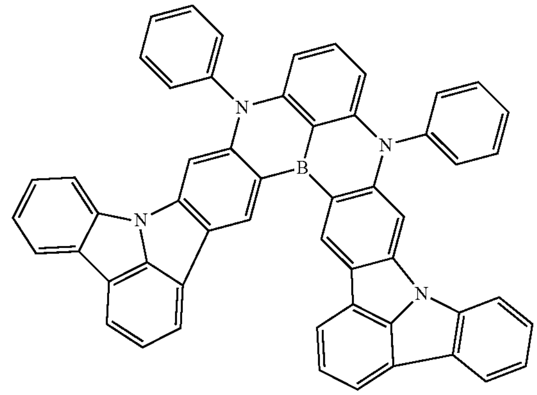
67
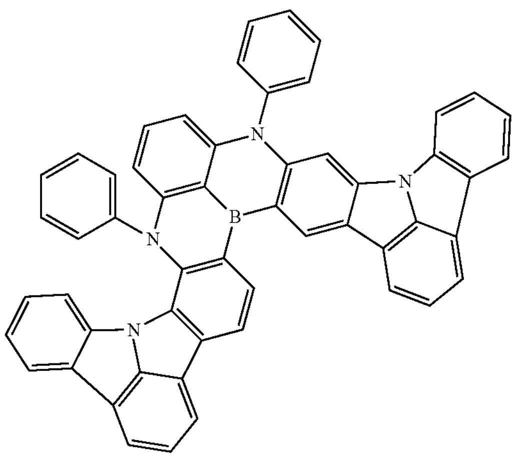
68
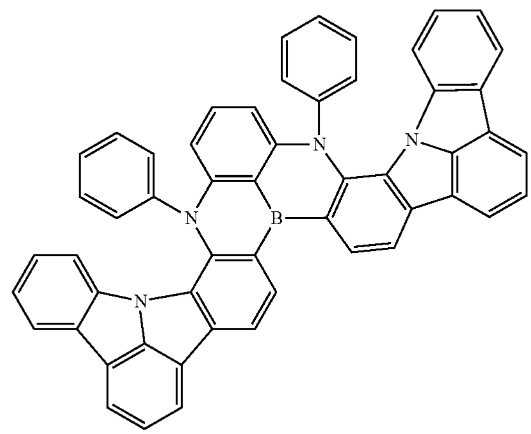
69
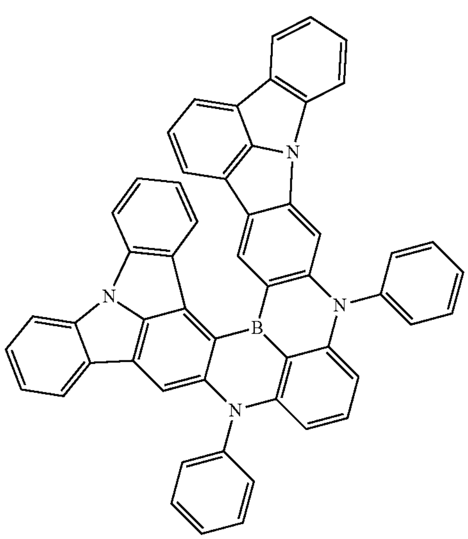
70
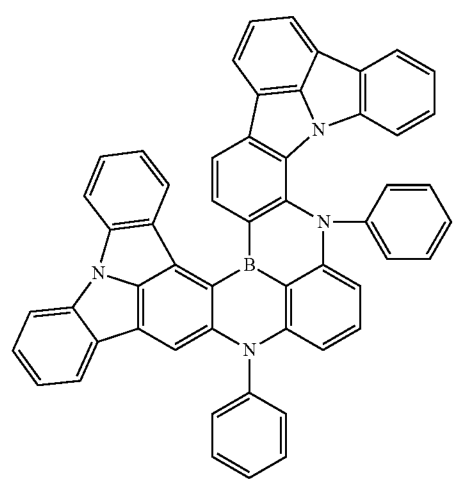

-continued
71
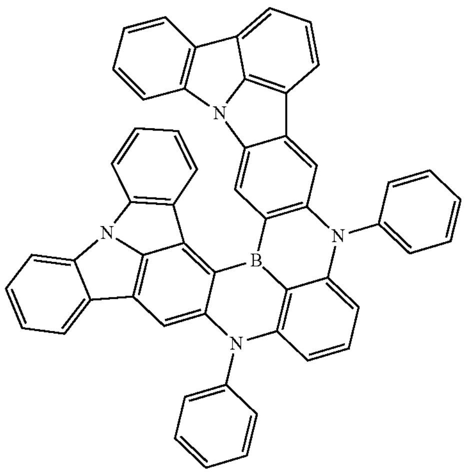
72
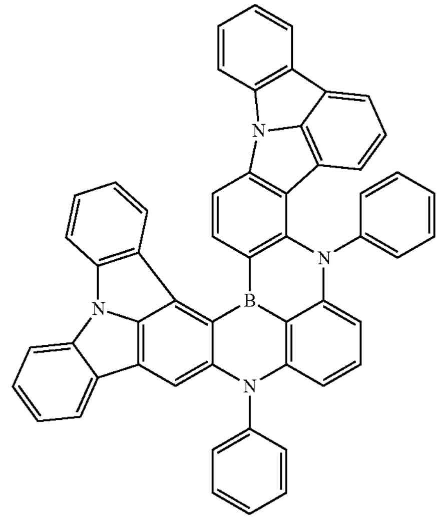
73
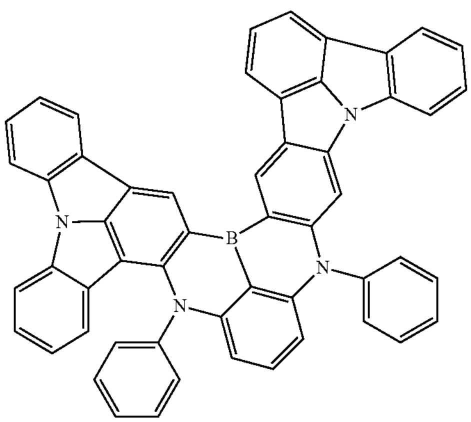
74
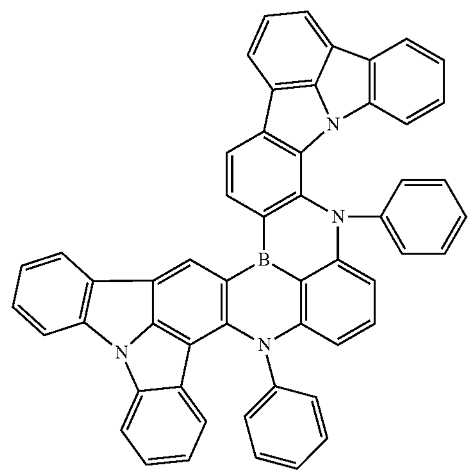
75
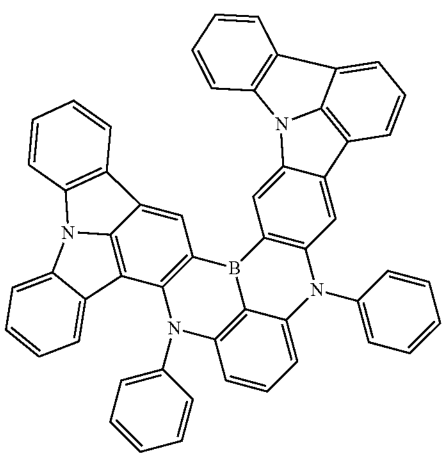
76
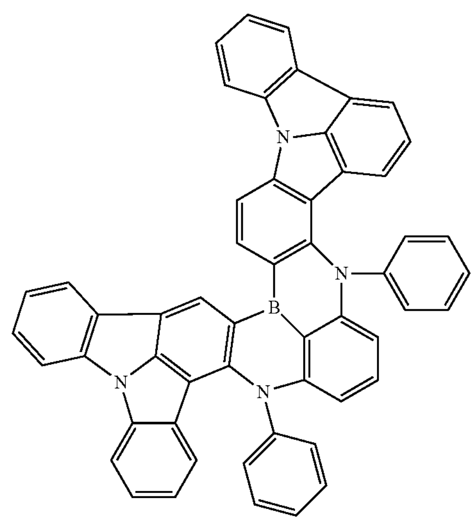

-continued
77
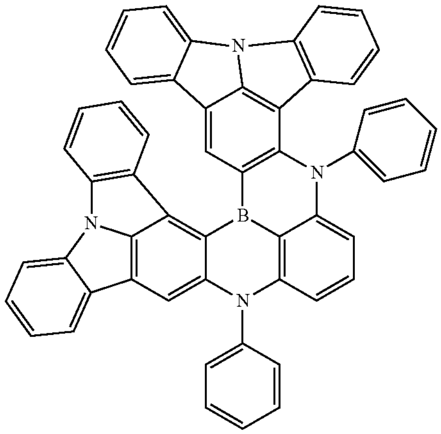
78
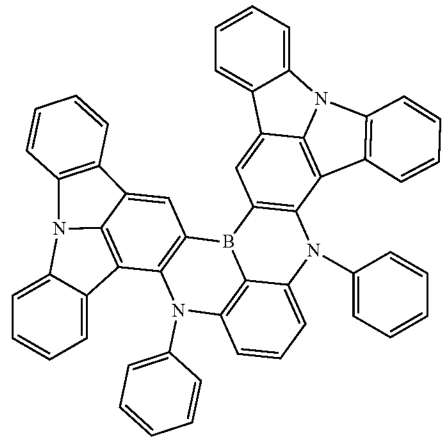
79
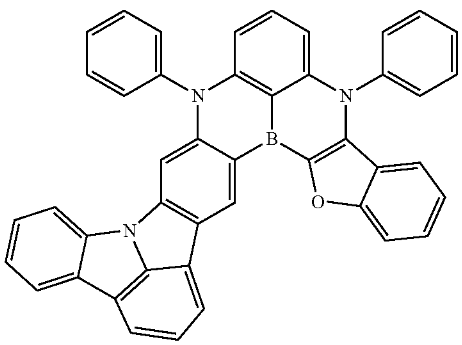
80
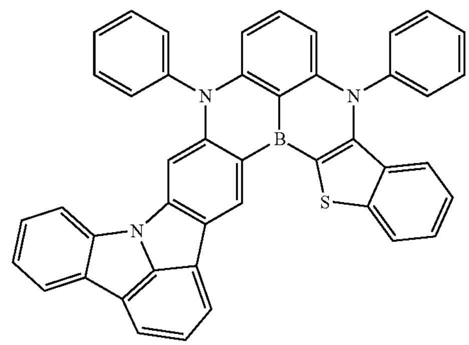
81
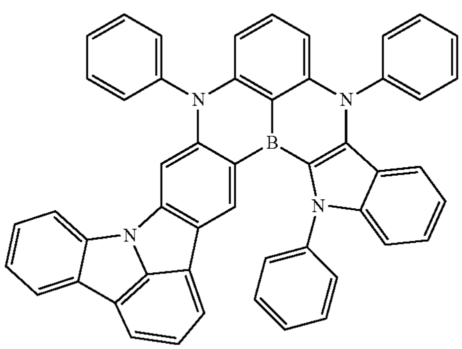
82
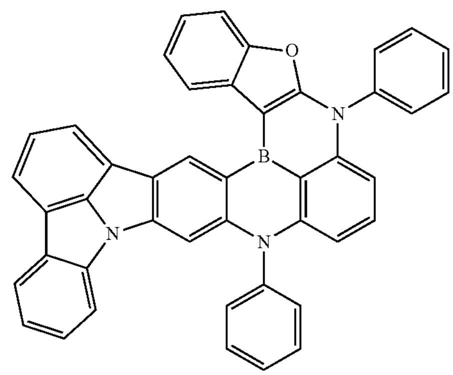
83
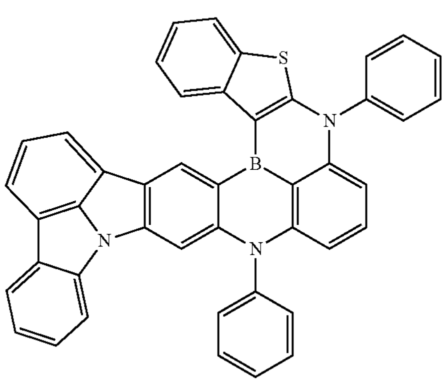
84
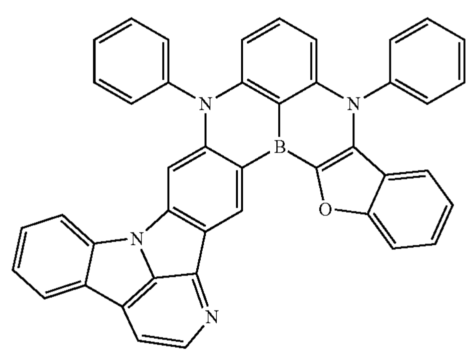

-continued
85
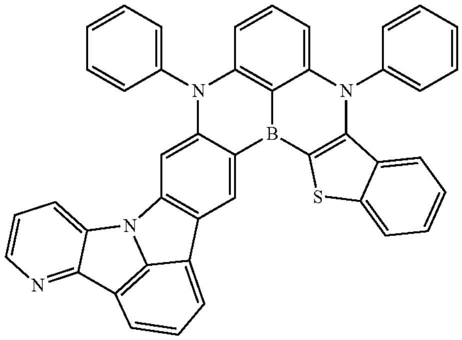
86
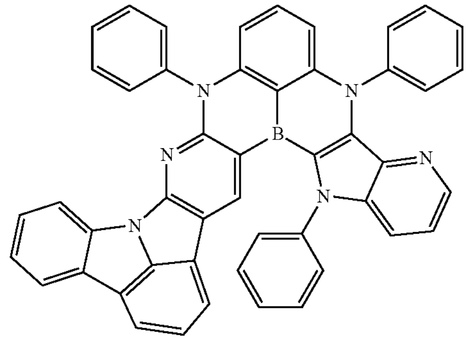
87
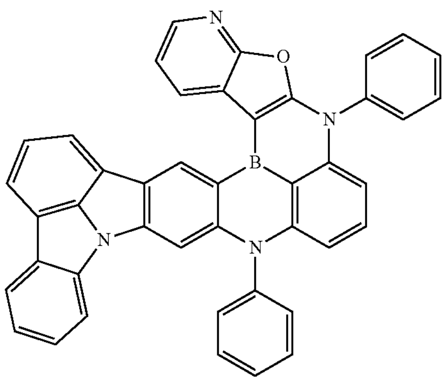
88
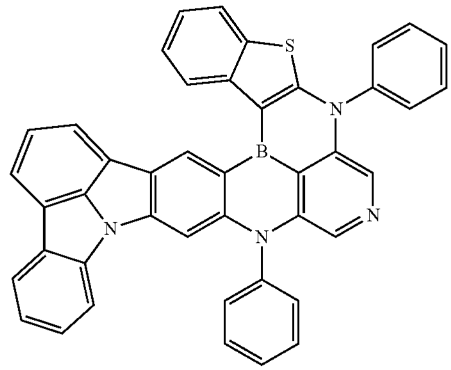
89
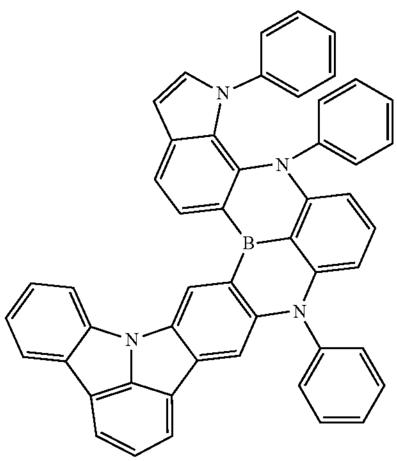
90
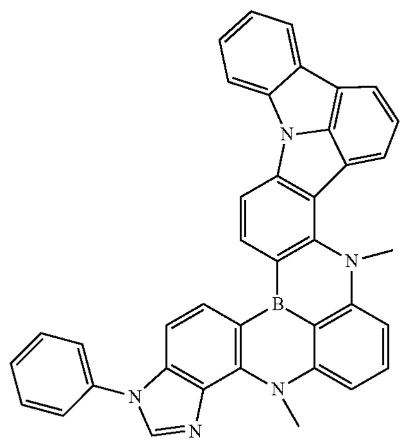
91
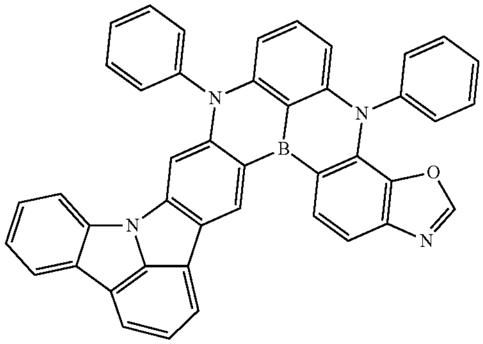
92
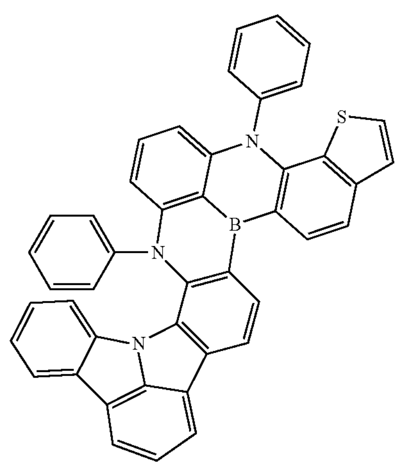

-continued
93
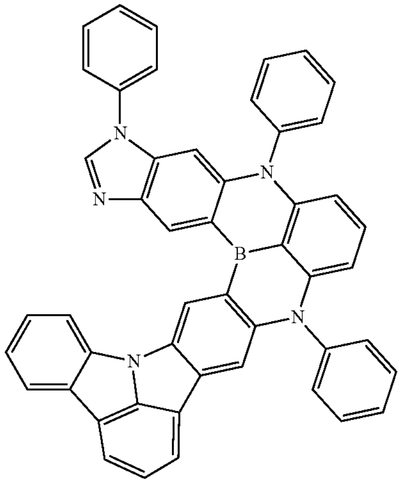
94
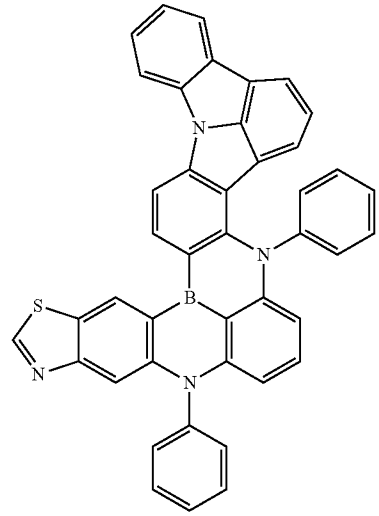
95
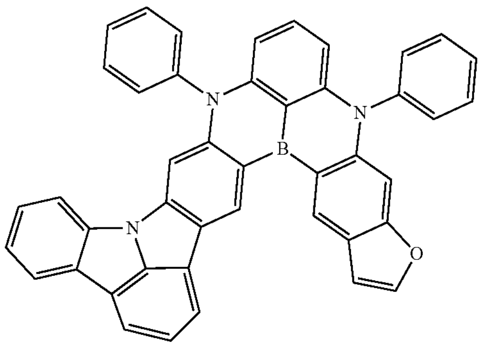
96
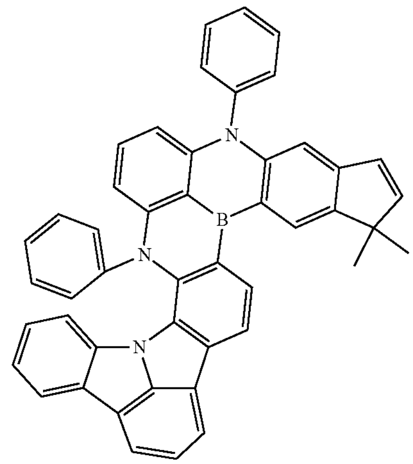
97
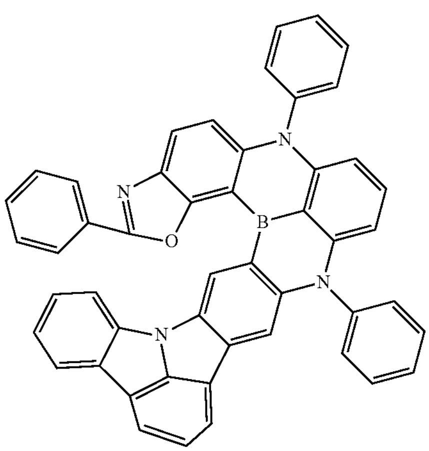
98
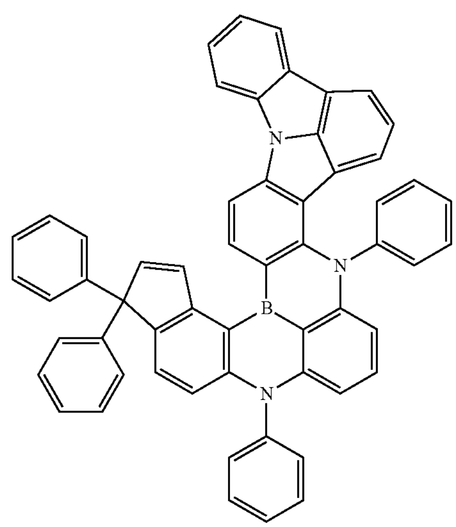

-continued
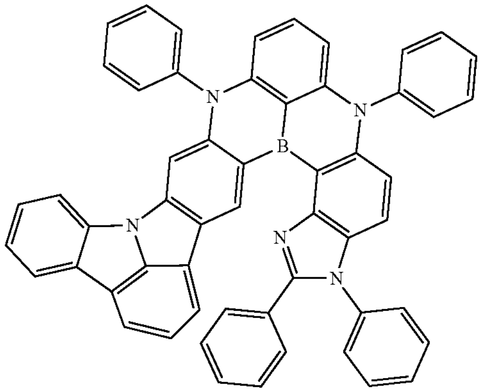
99
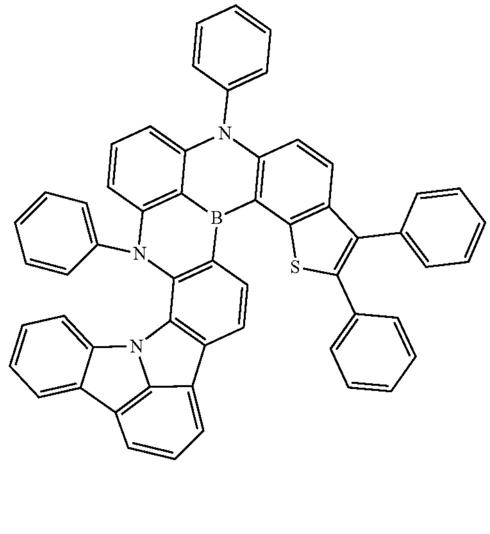
100
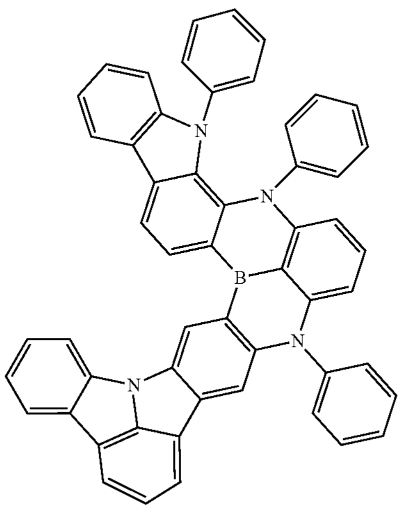
101
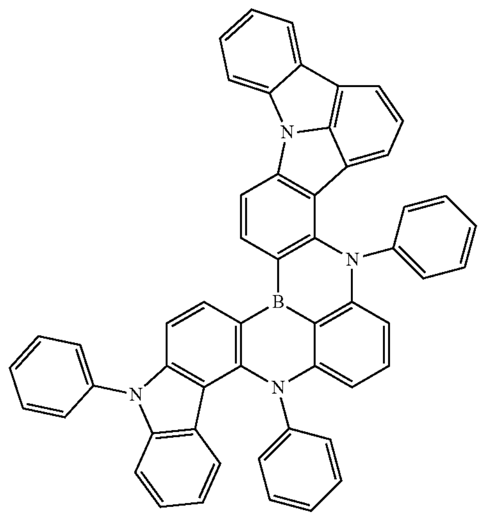
102
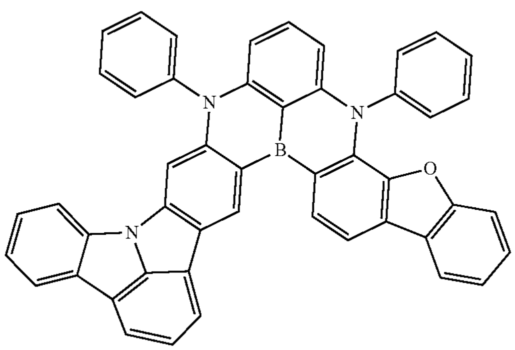
103
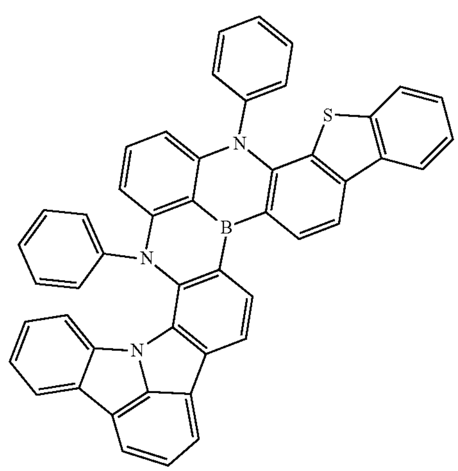
104

-continued
105
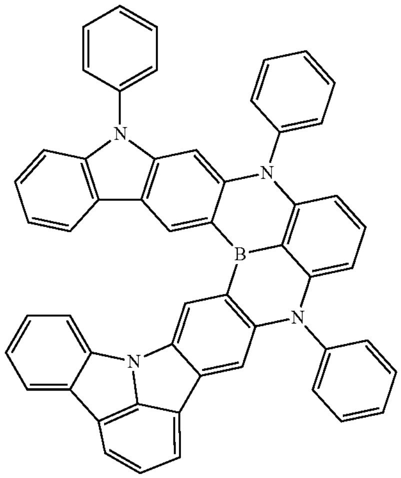
106
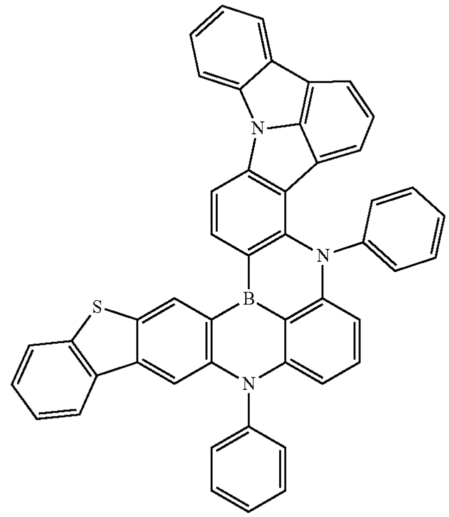
107
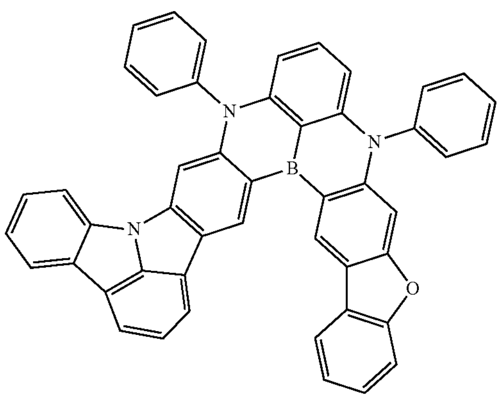
108
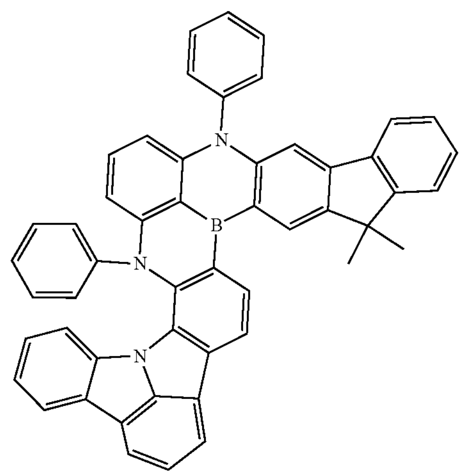
109
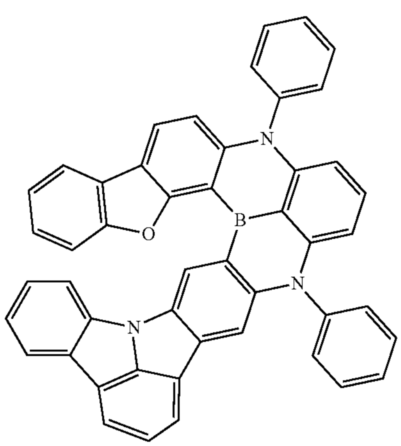
110
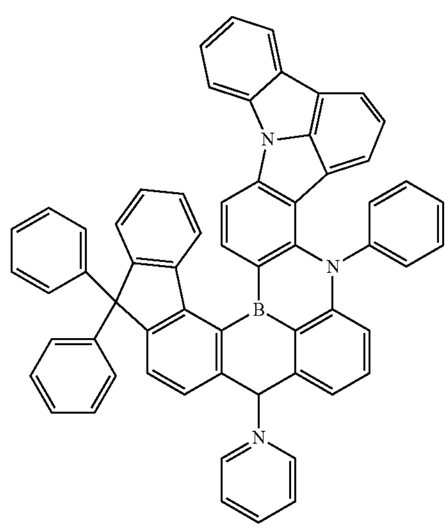

-continued
111
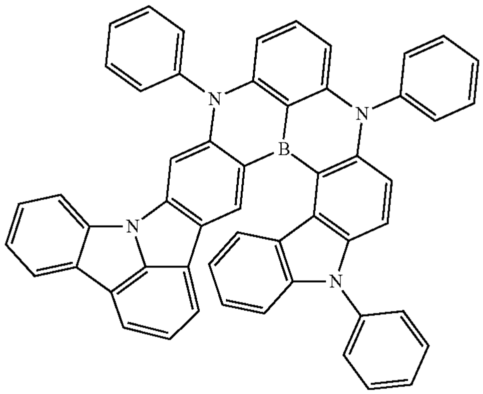
112
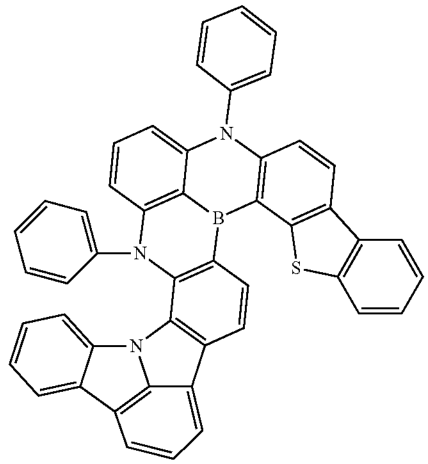
113
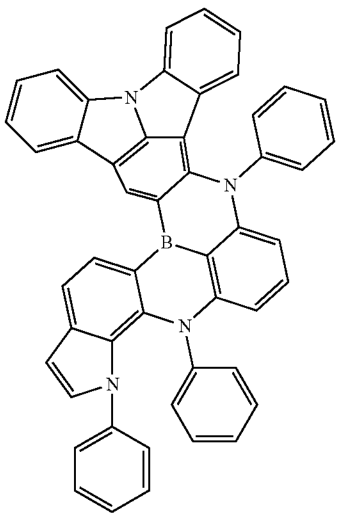
114
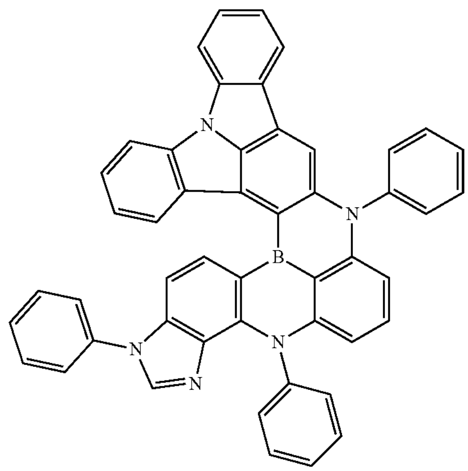
115
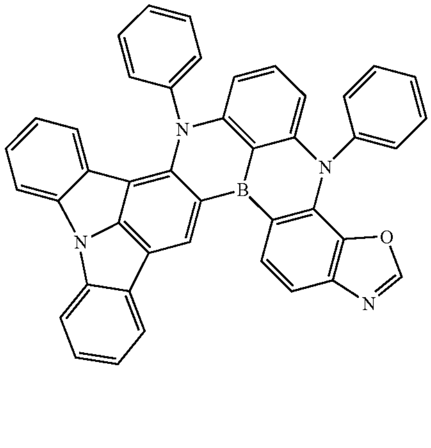
116
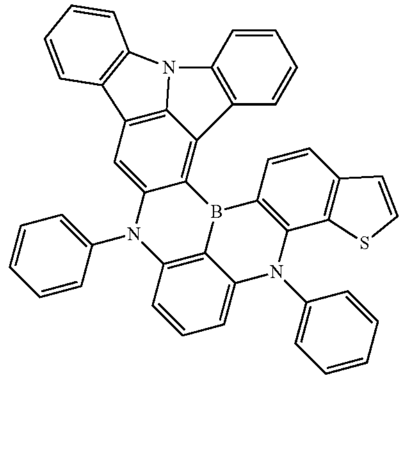

-continued
117
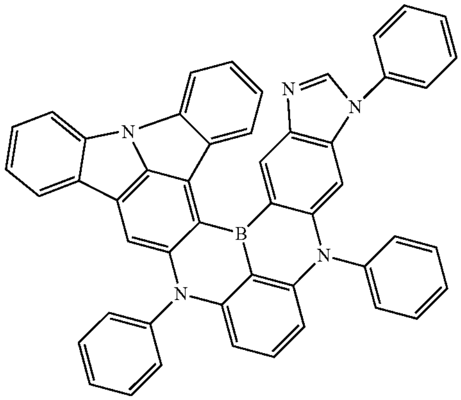
118
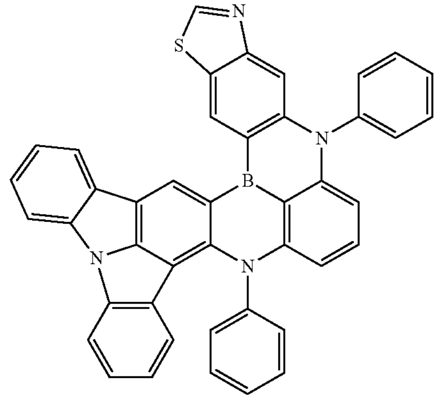
119
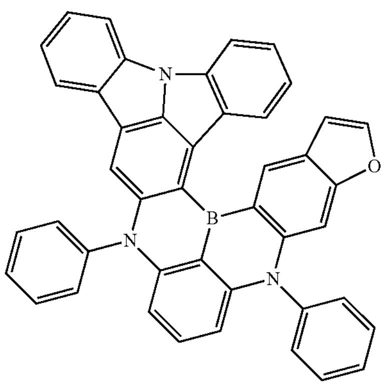
120
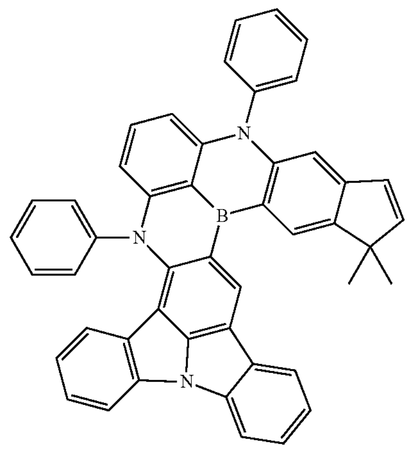
121
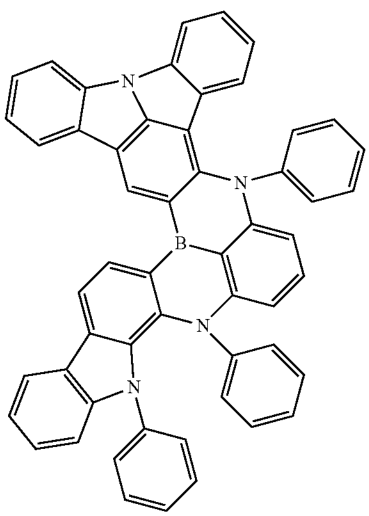
122
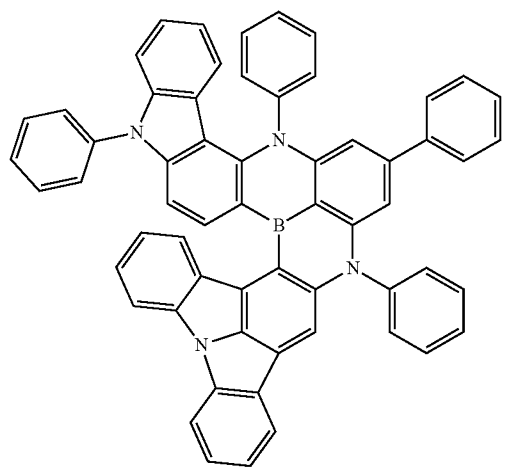

-continued
123
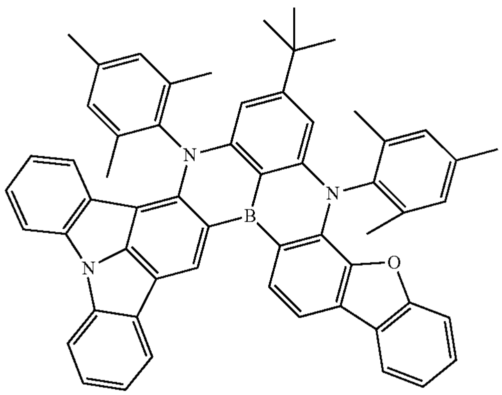
124
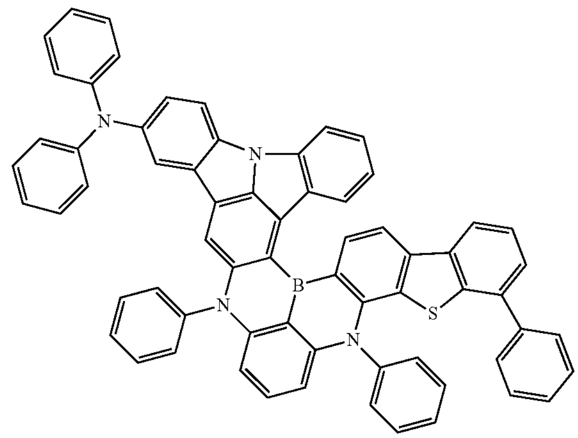
125
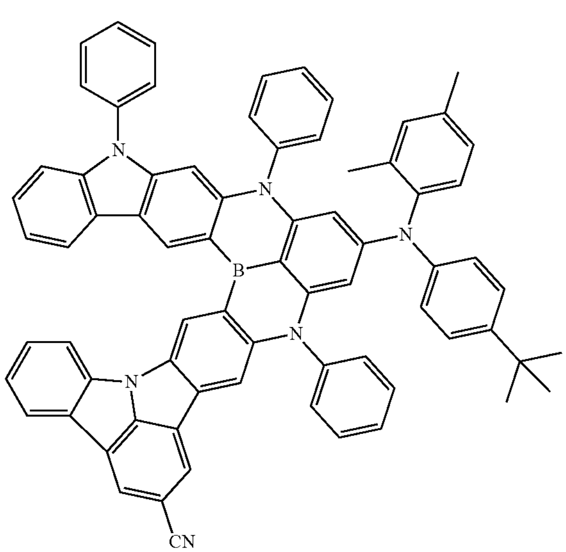
126
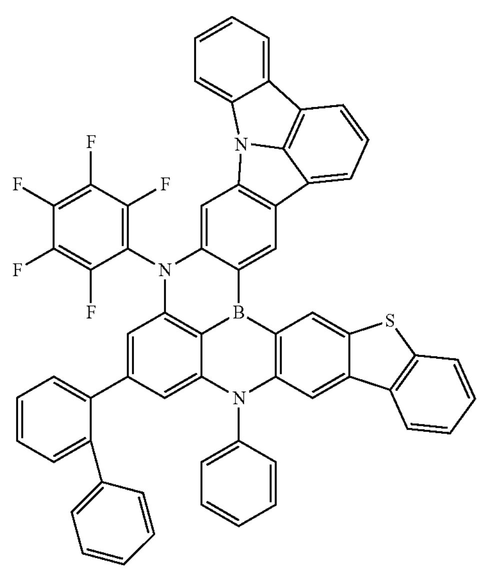

127
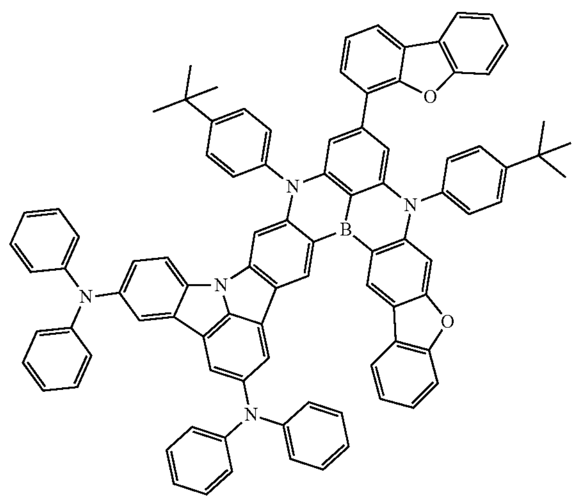
128
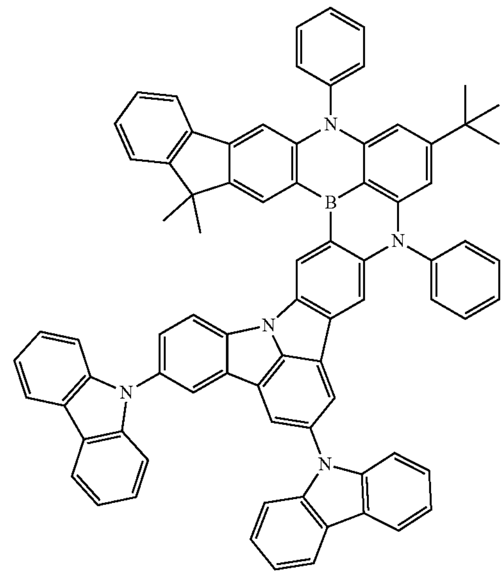
129
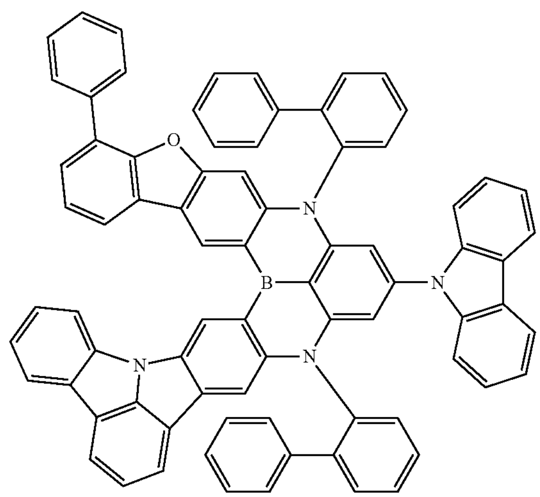
130
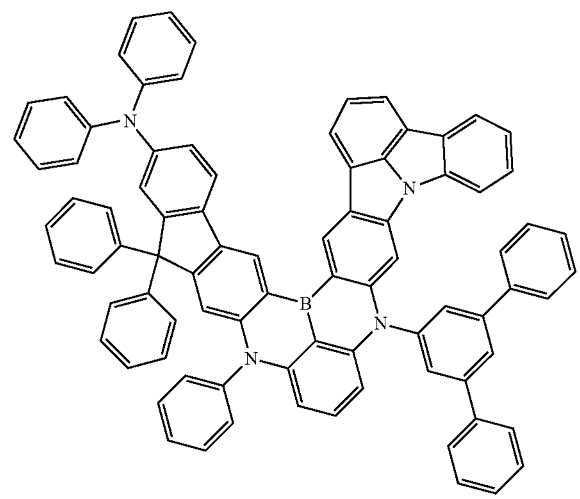
131
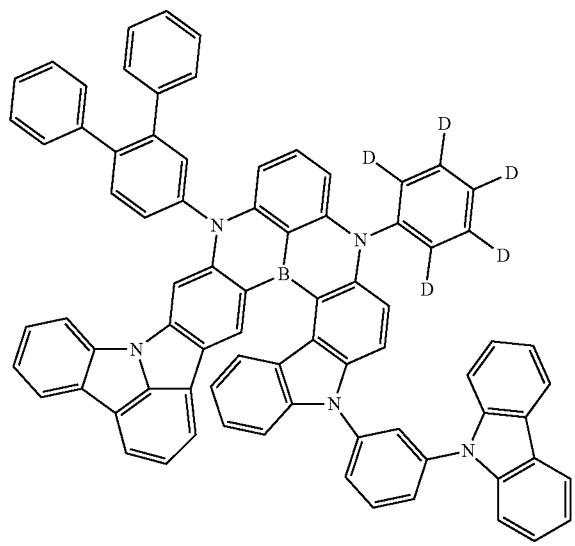
132
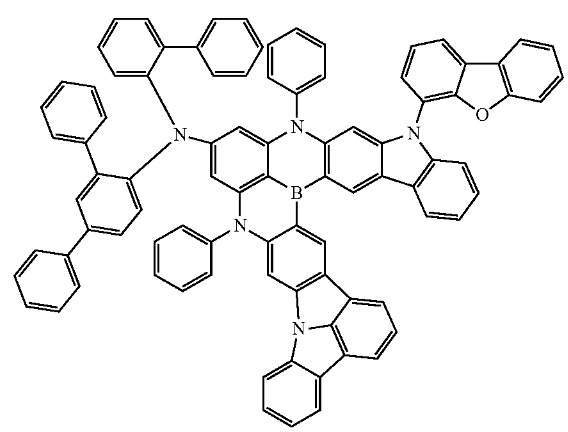

-continued
133
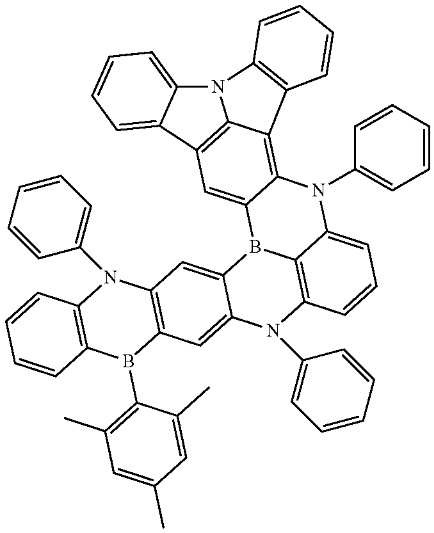
134
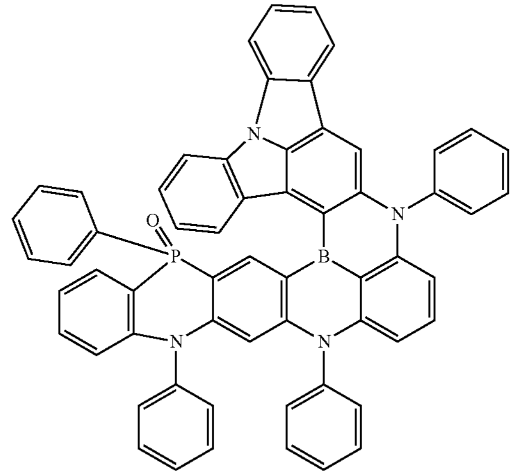
135
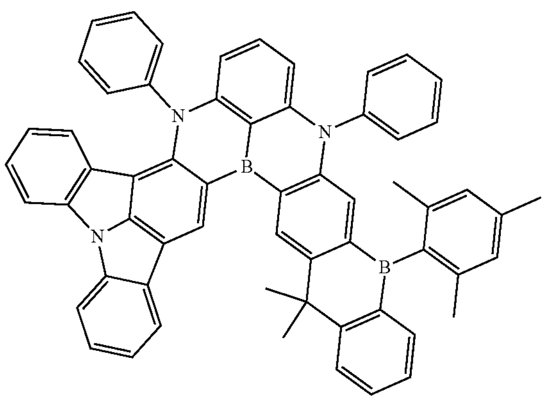
136
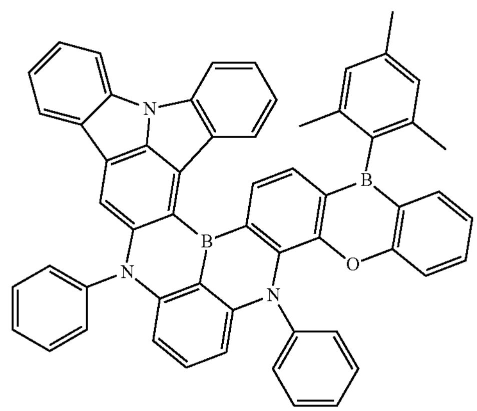
137
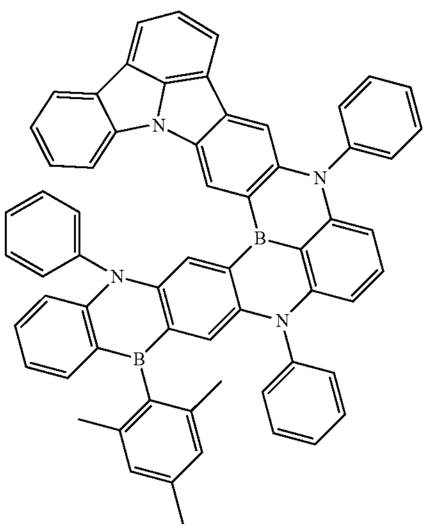
138
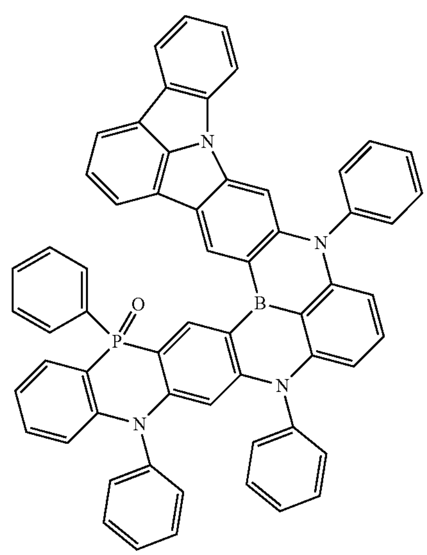

-continued
139
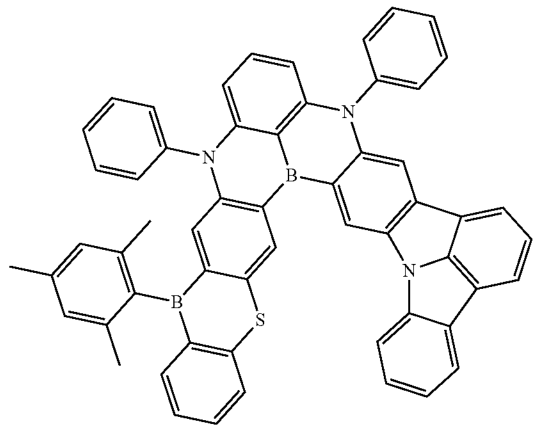
140
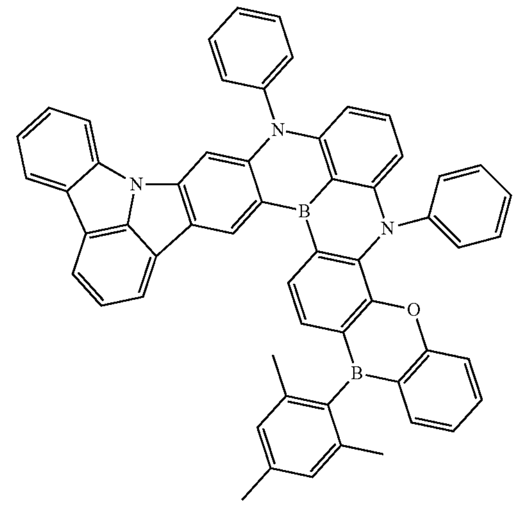
141
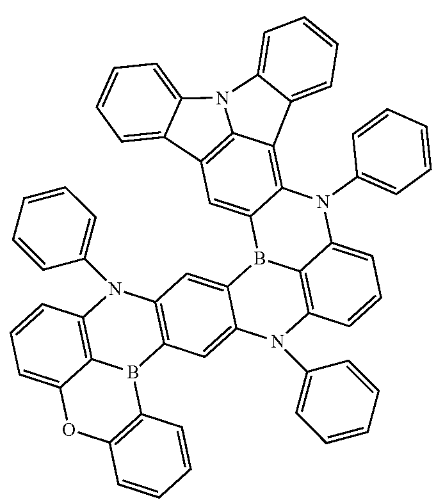
142
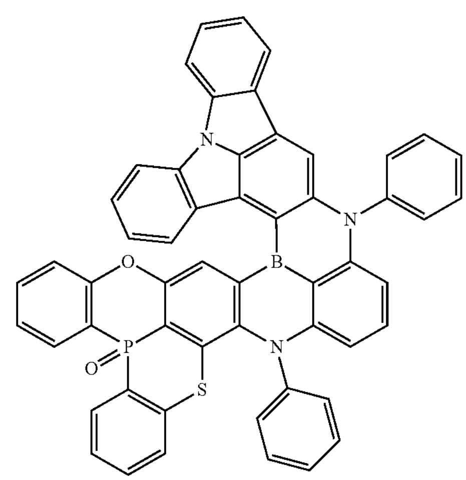
143
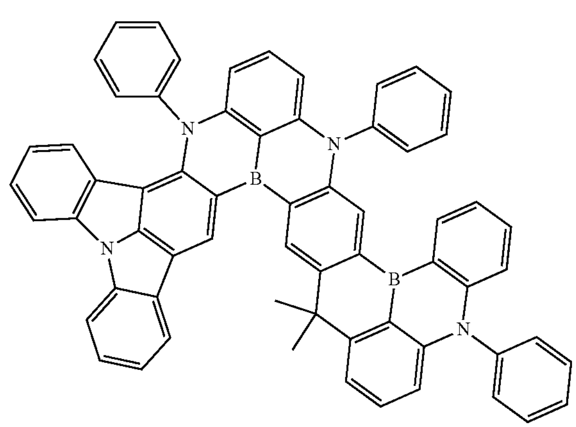
144
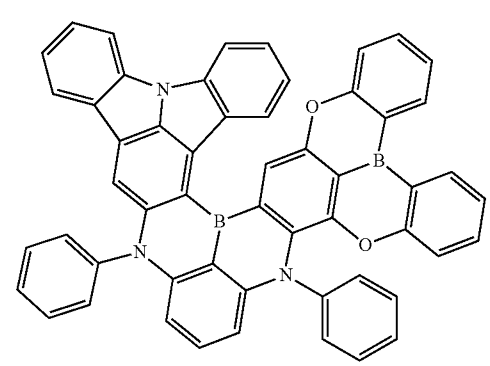

-continued
145
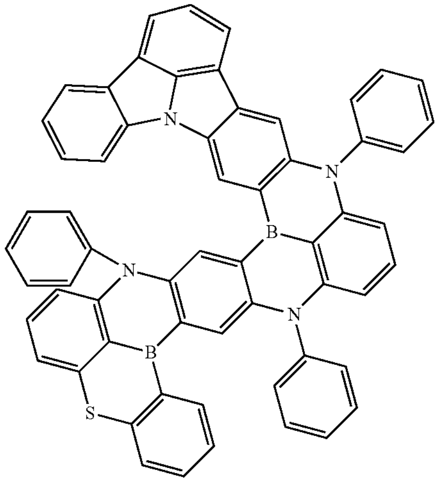
146
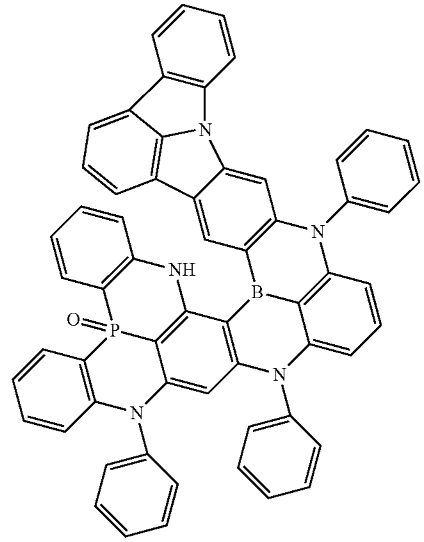
147
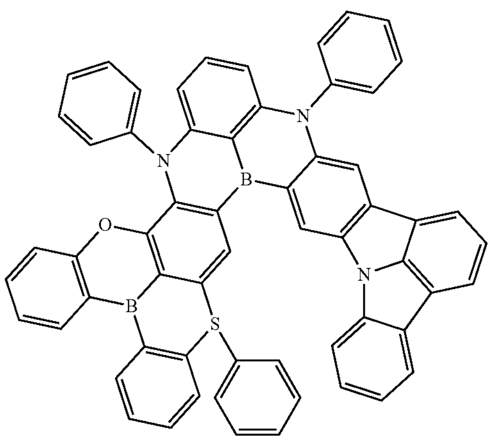
148
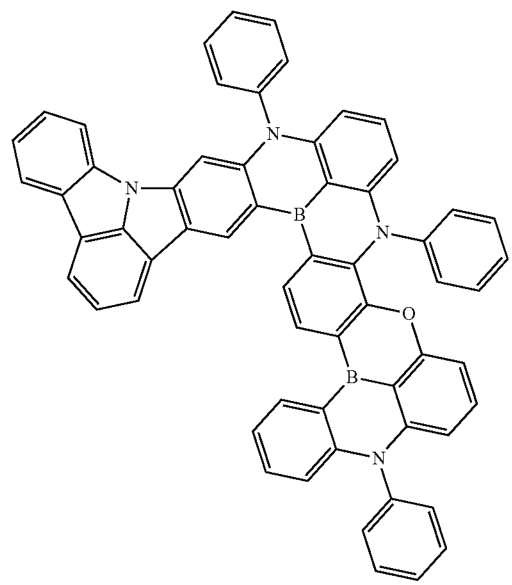
149
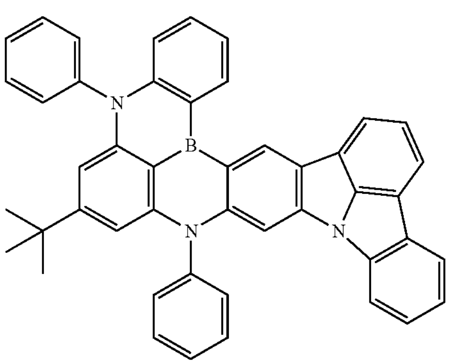
150
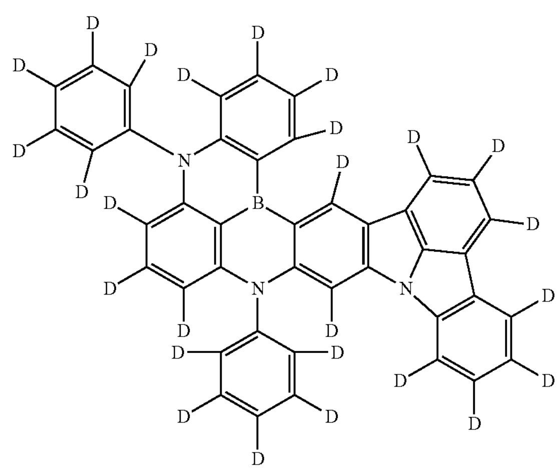

-continued
151
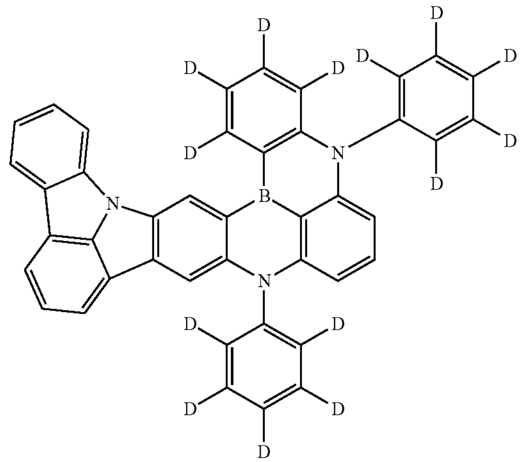
152
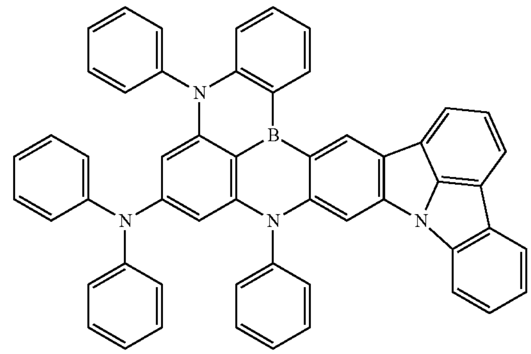
153
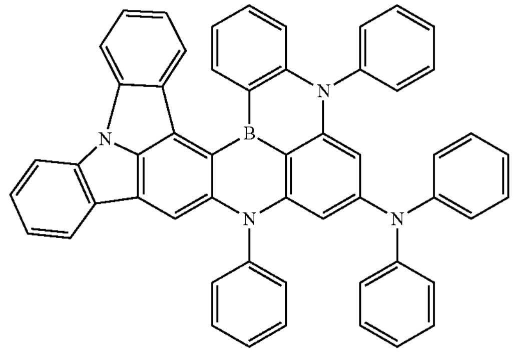
154
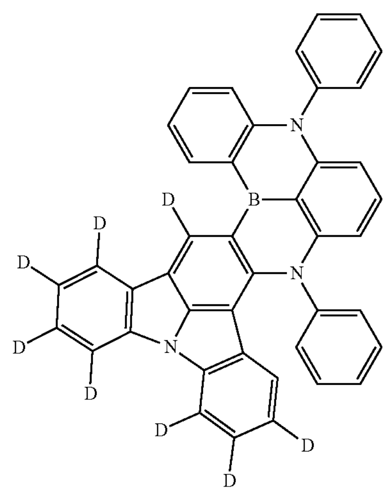
155
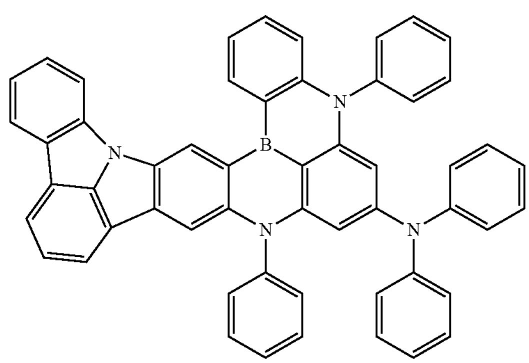
156
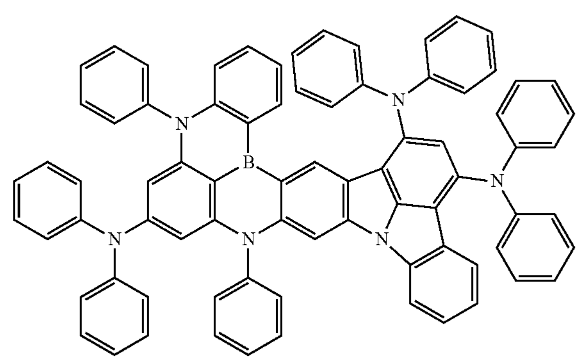

-continued
157
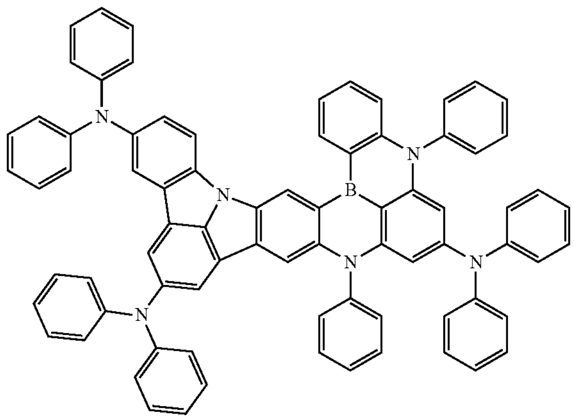
158
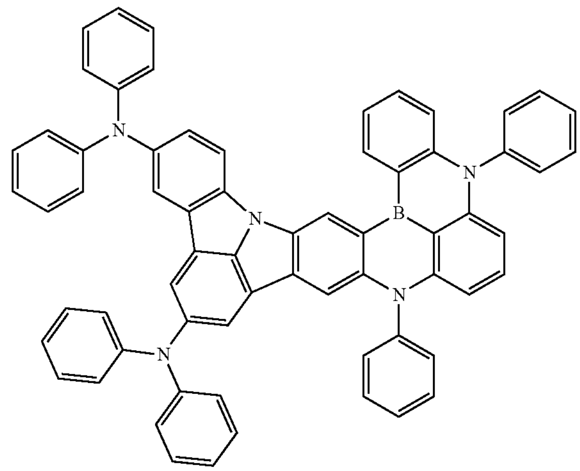
159
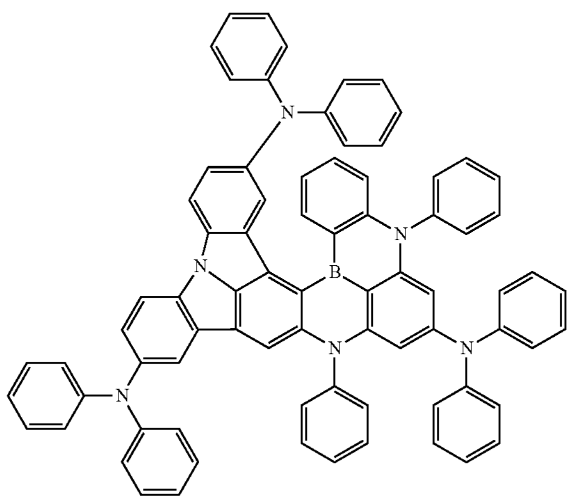
160
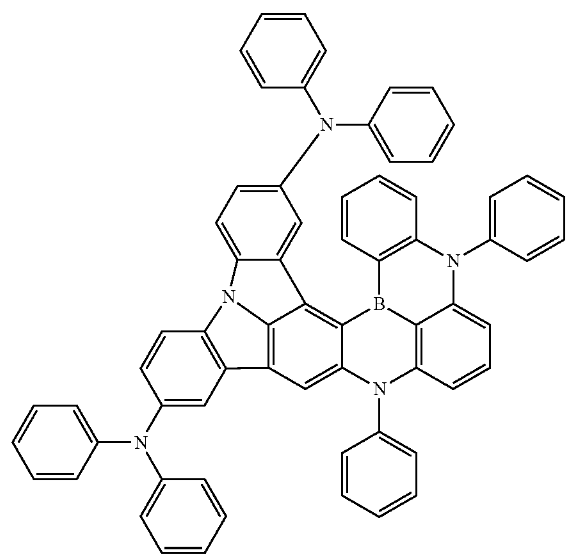
161
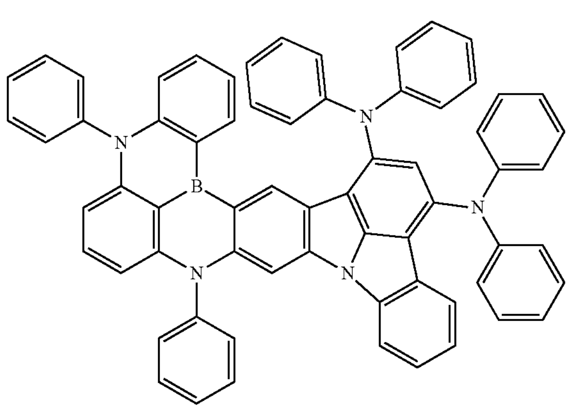
162
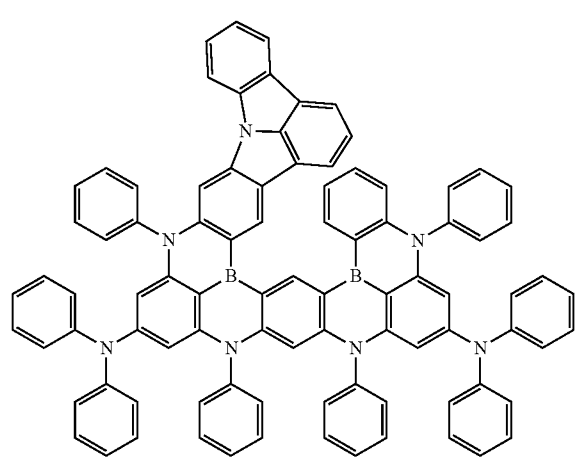

-continued
163
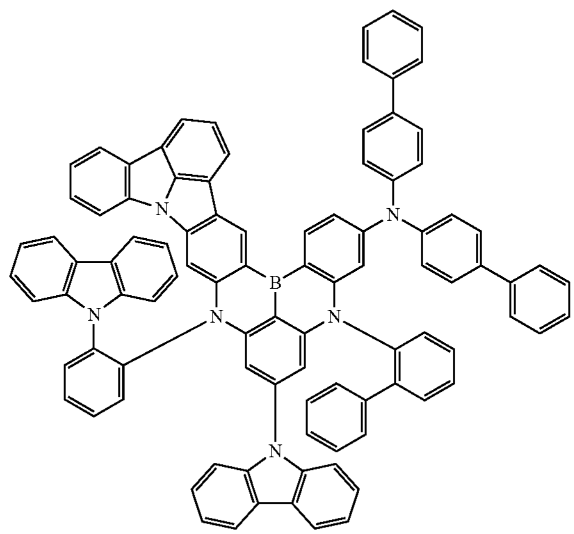
164
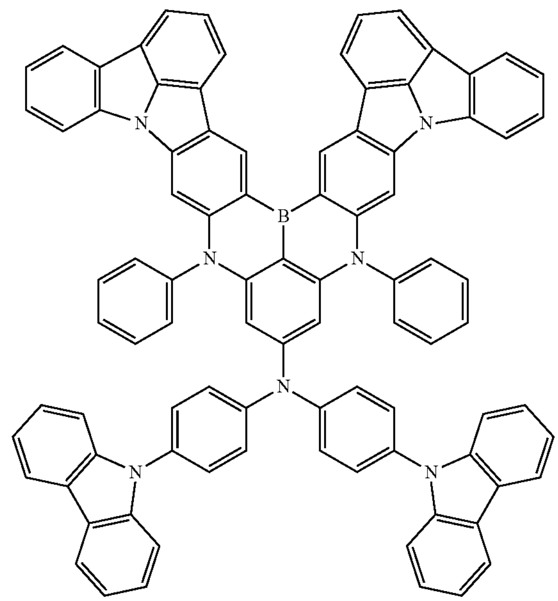
165
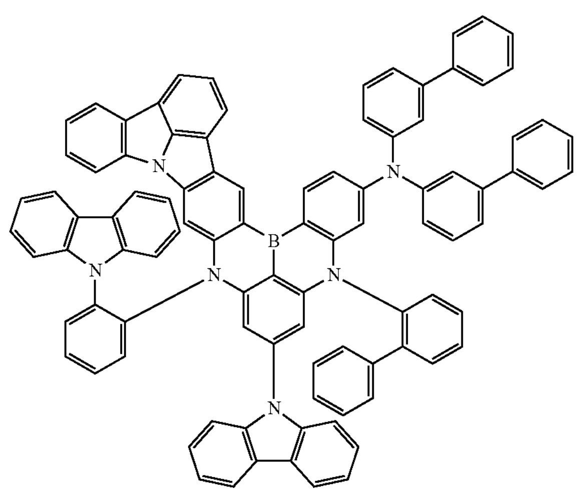
166
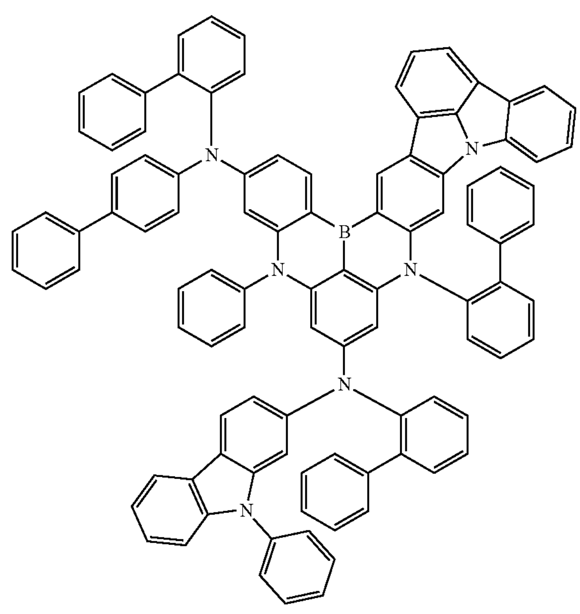

-continued
167
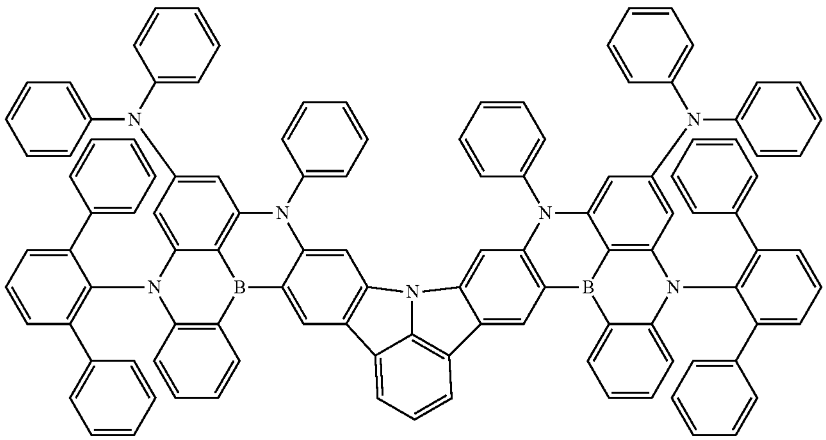
168
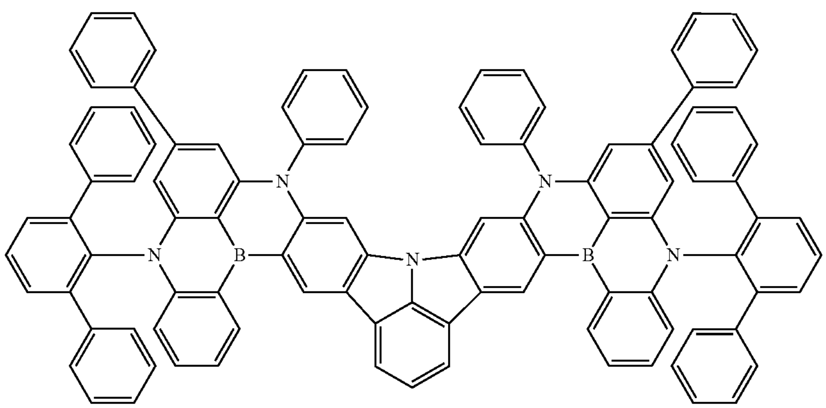
169
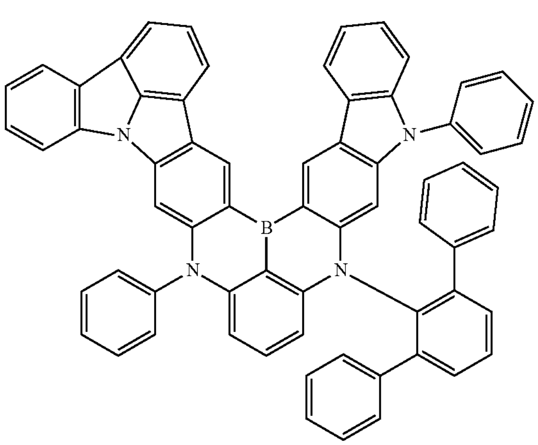
170
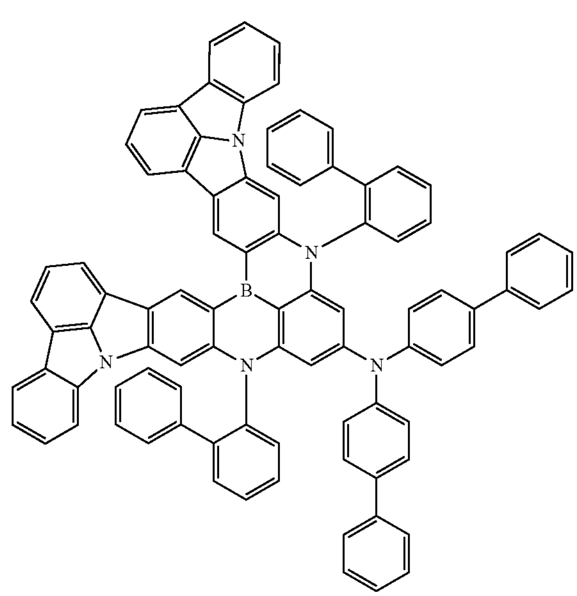

-continued
171
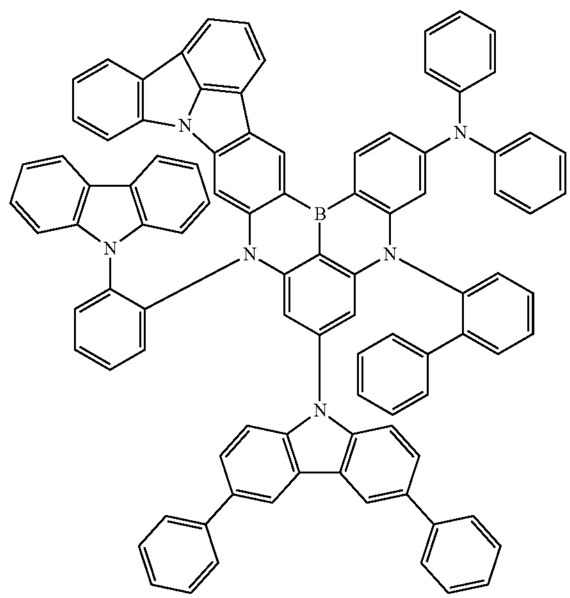
172
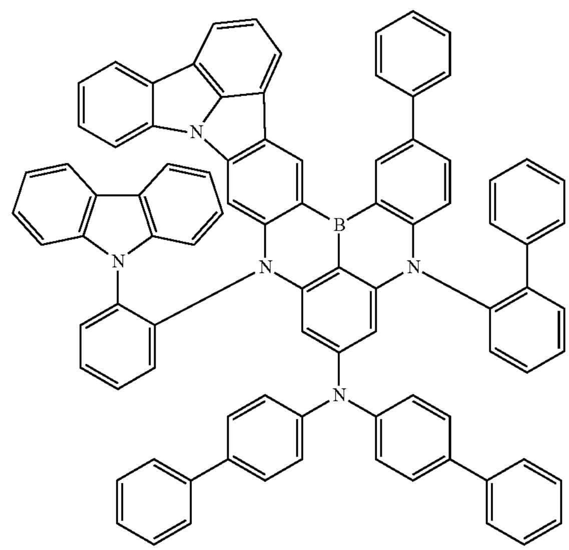
173
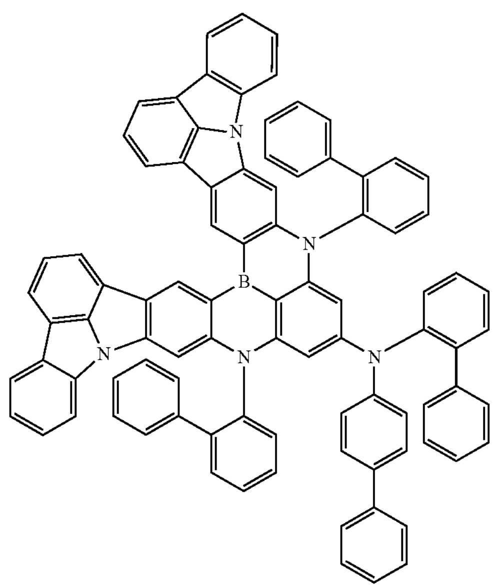
174
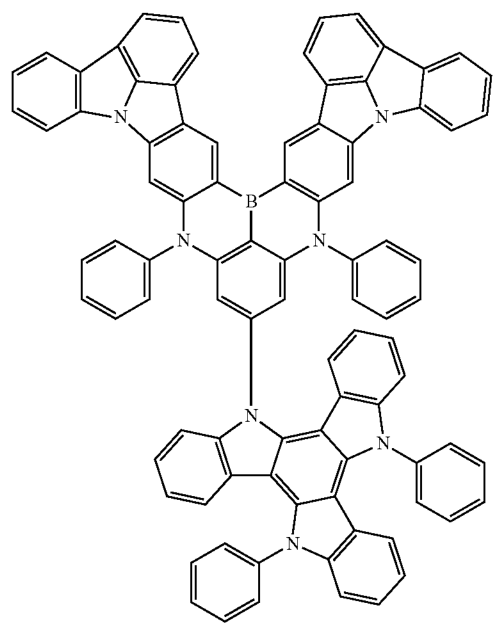

-continued
175
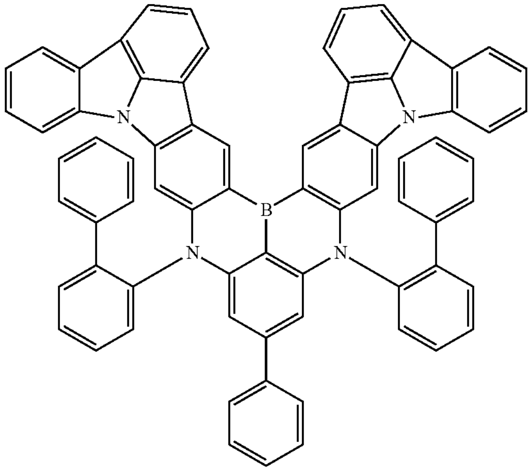
176
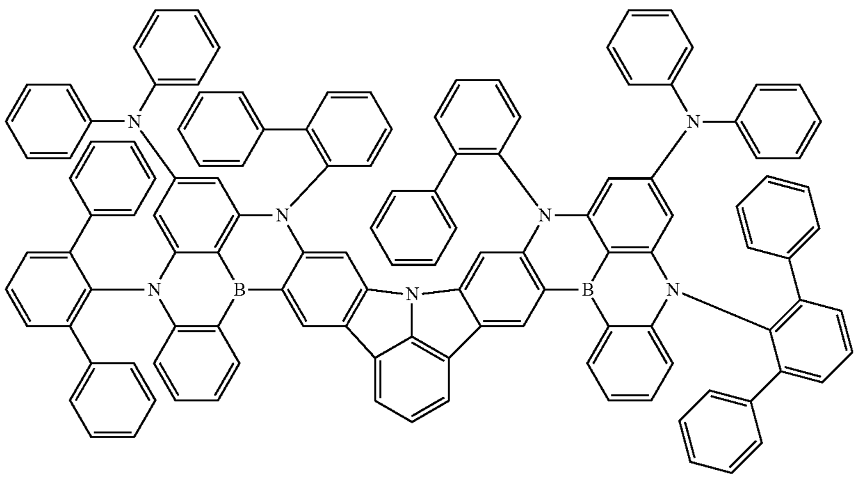
177
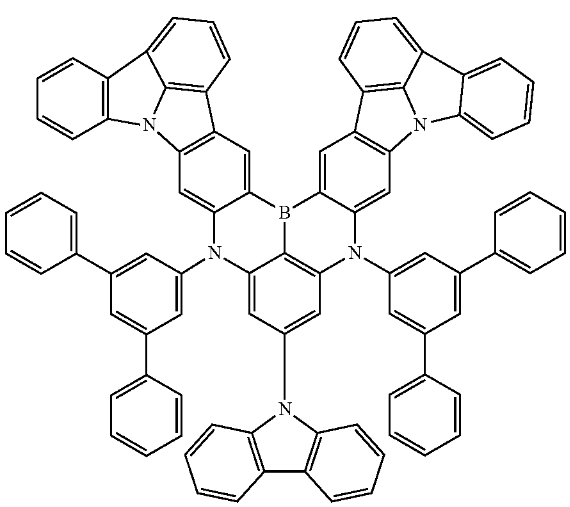
178
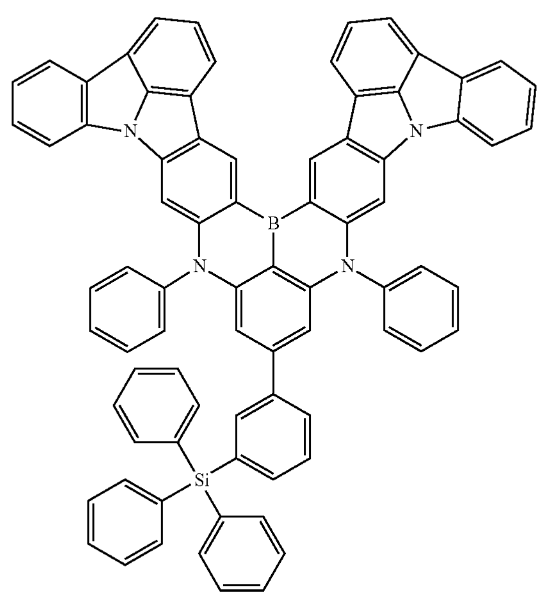

-continued
179
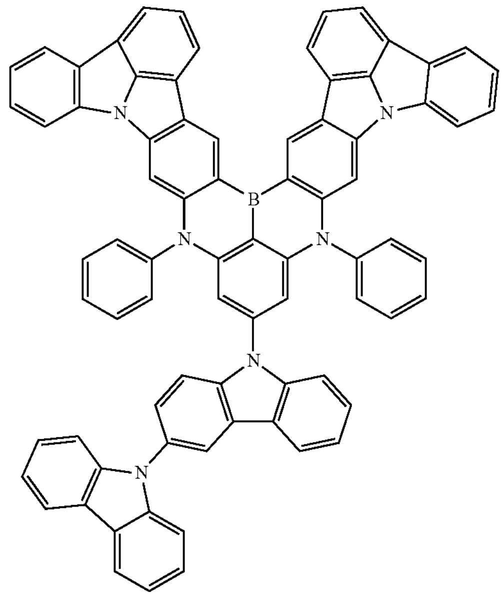
180
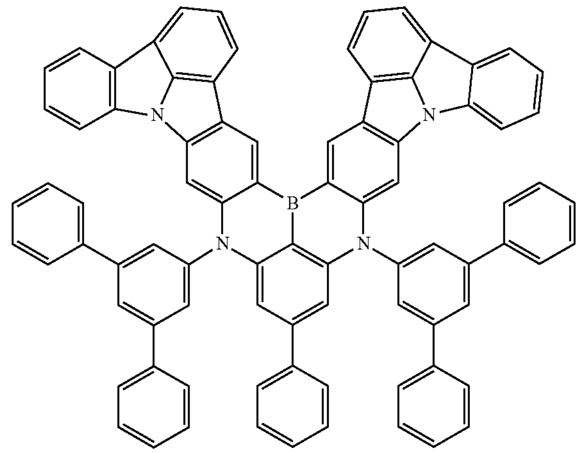
181
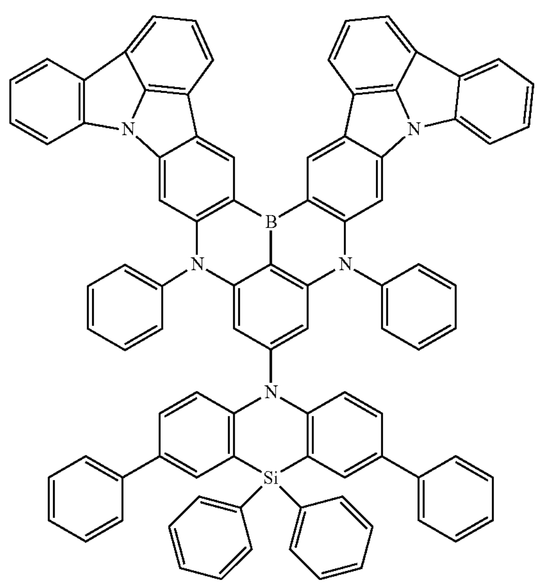
182
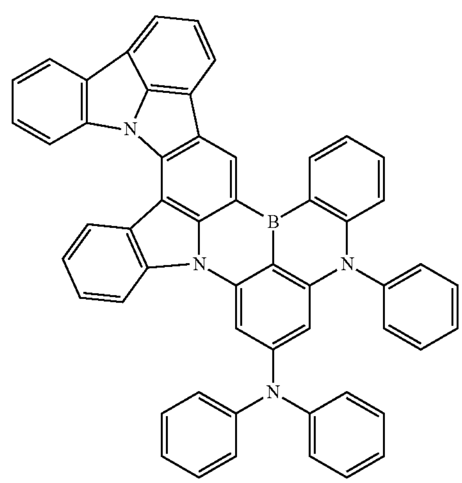

-continued
183
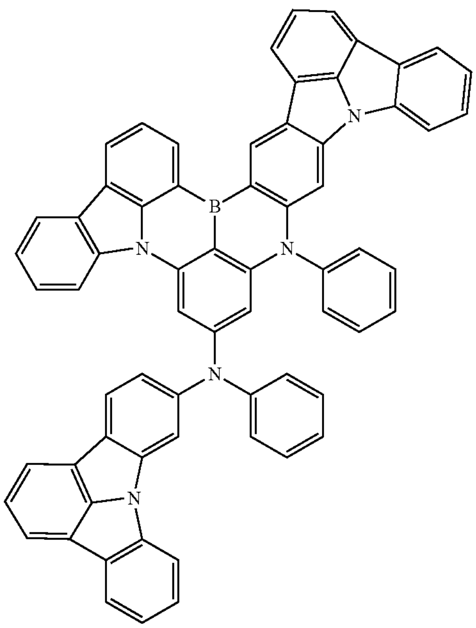
184
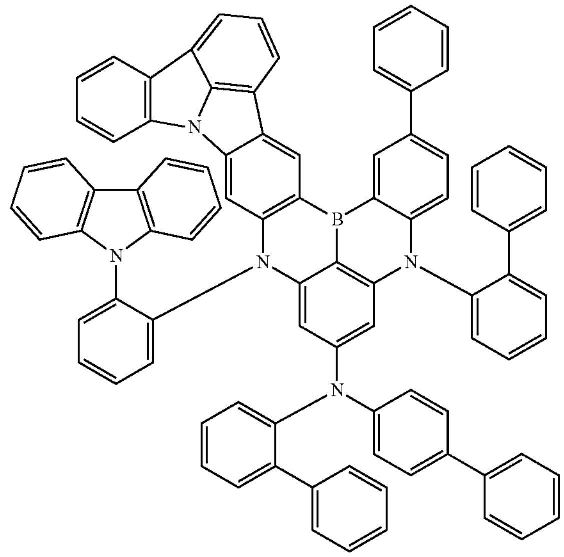
185
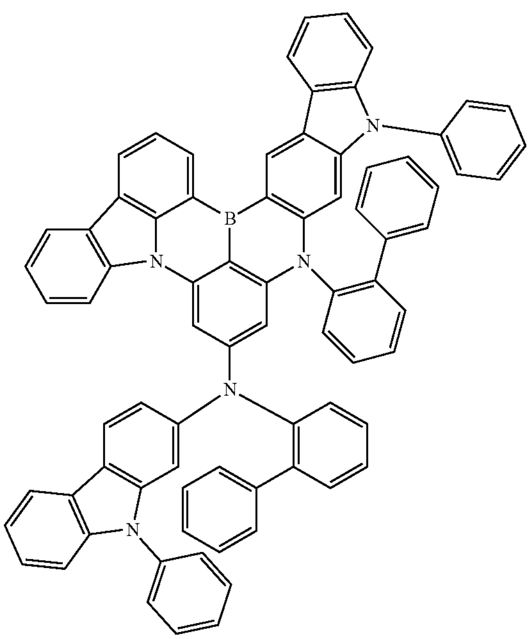
186
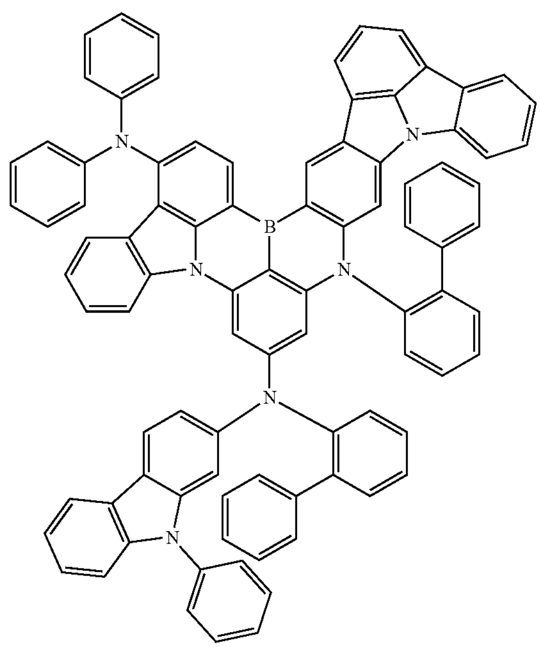

-continued
187
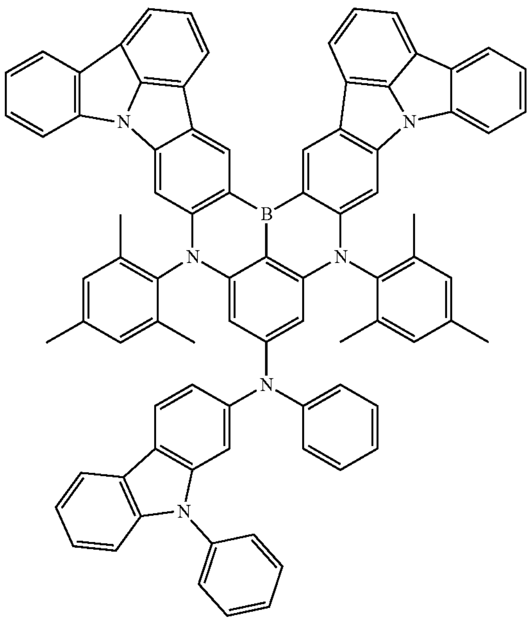
188
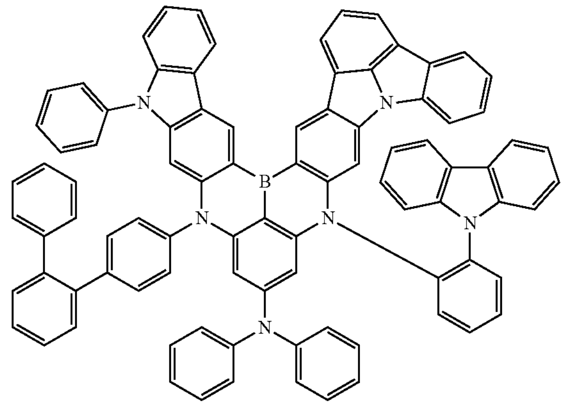
189
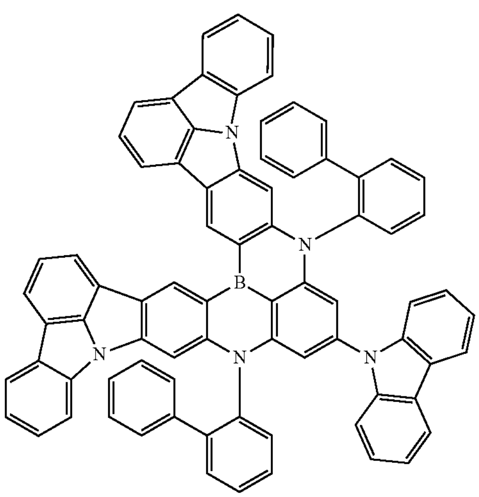

190
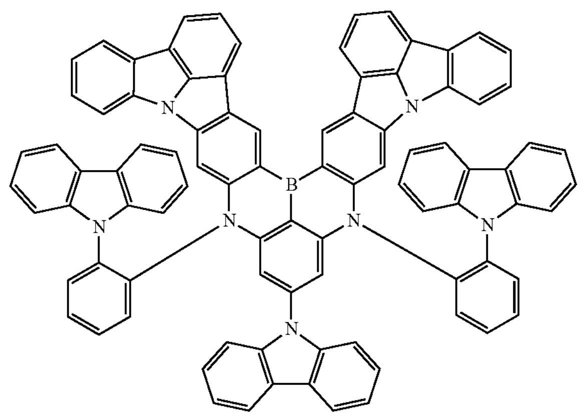
191
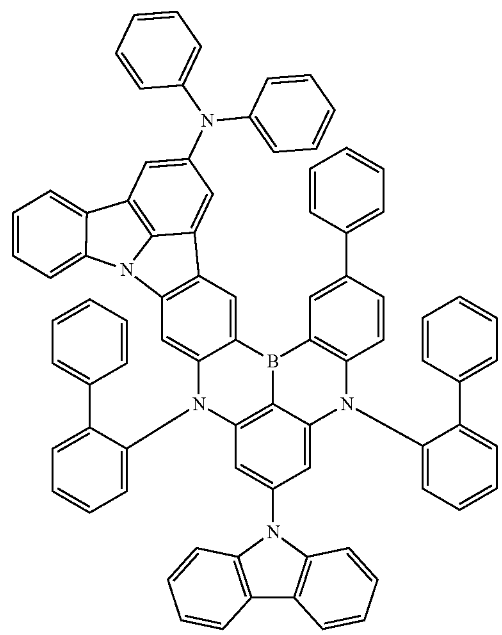
192
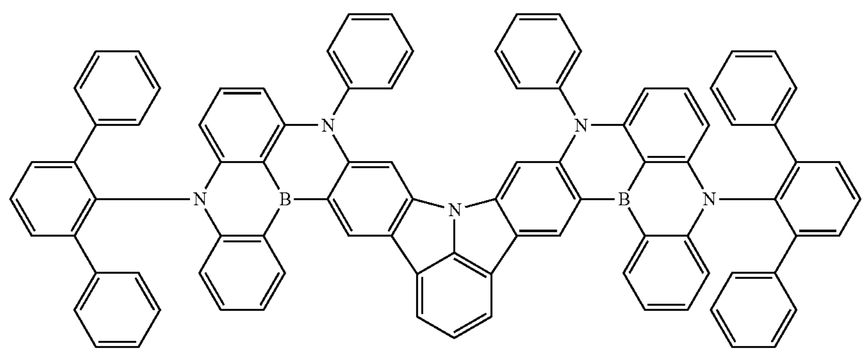
193
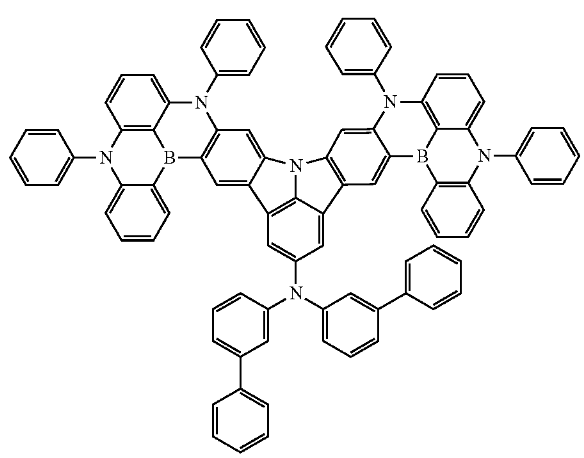
194
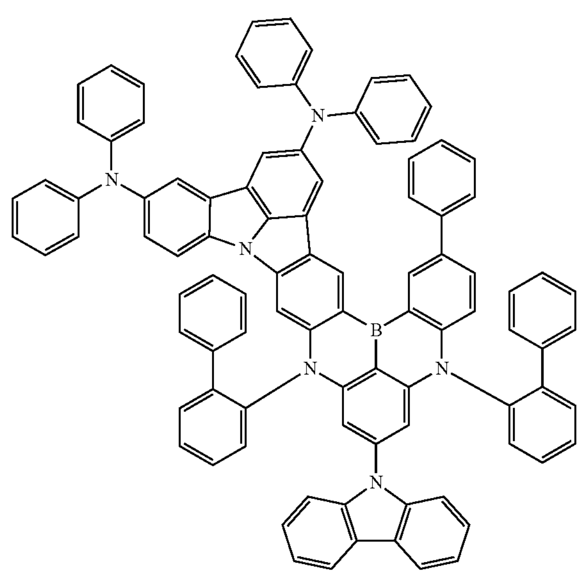

-continued
195
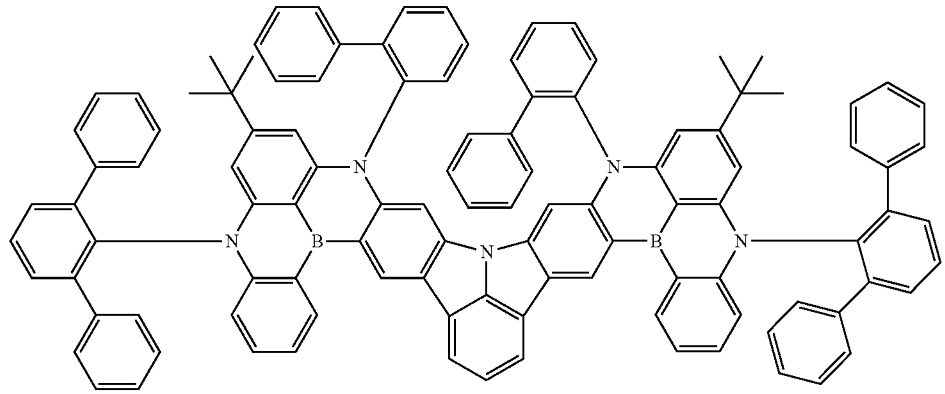
196
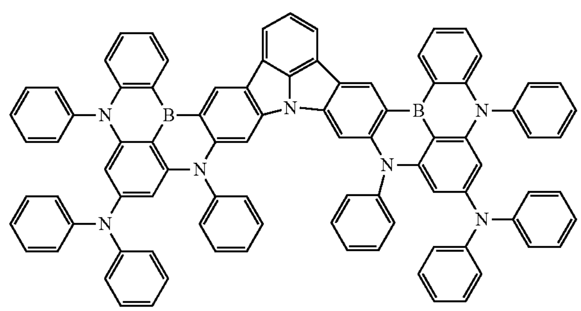
197
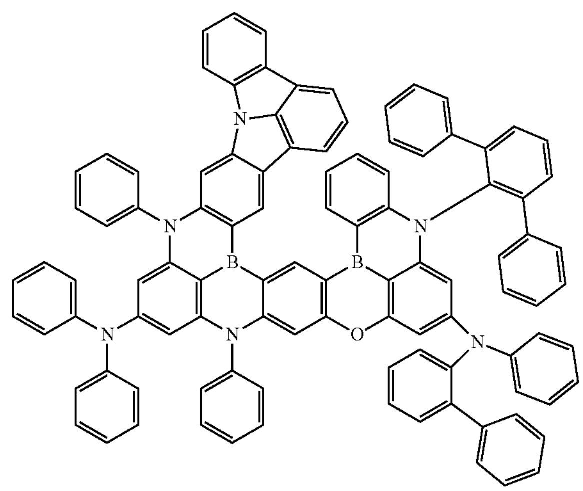
198
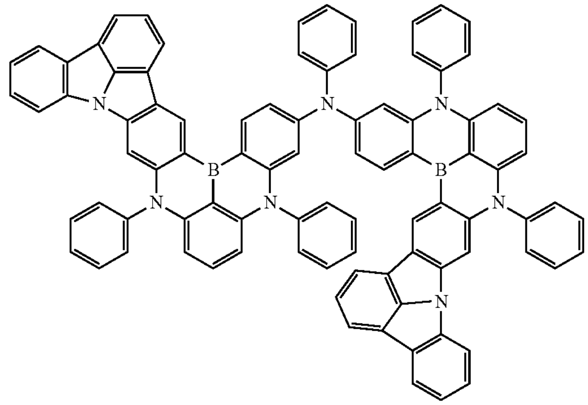

-continued
199
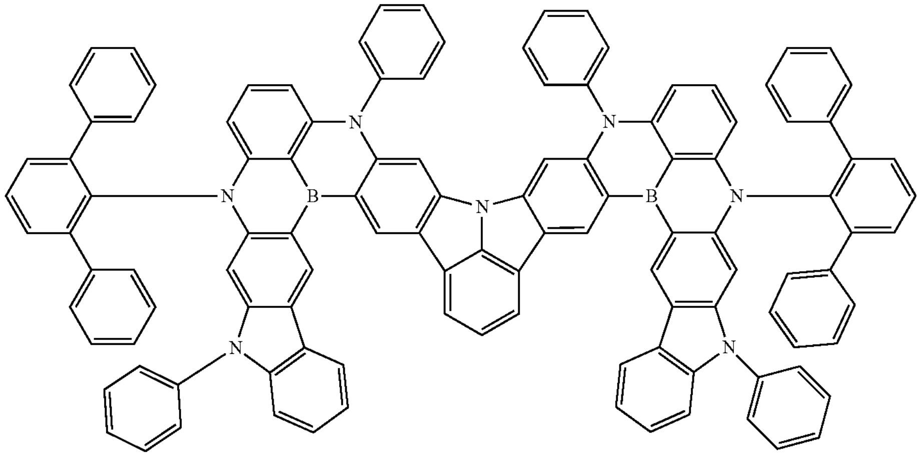
200
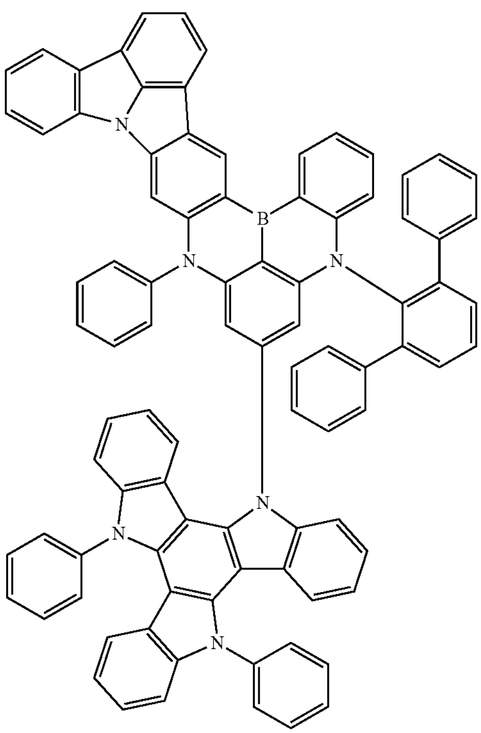
201
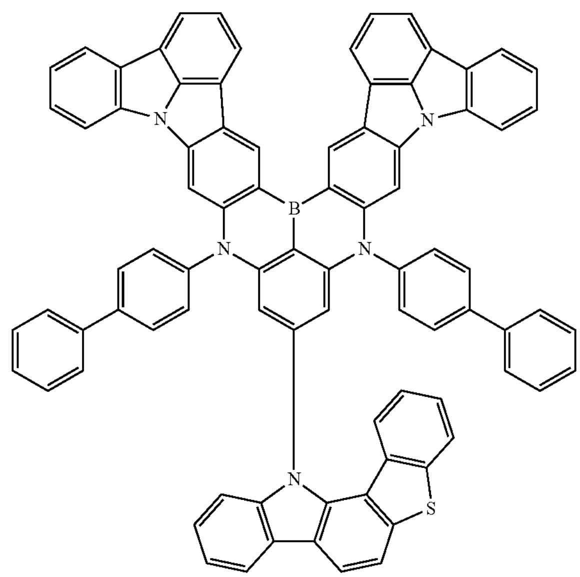

-continued
202
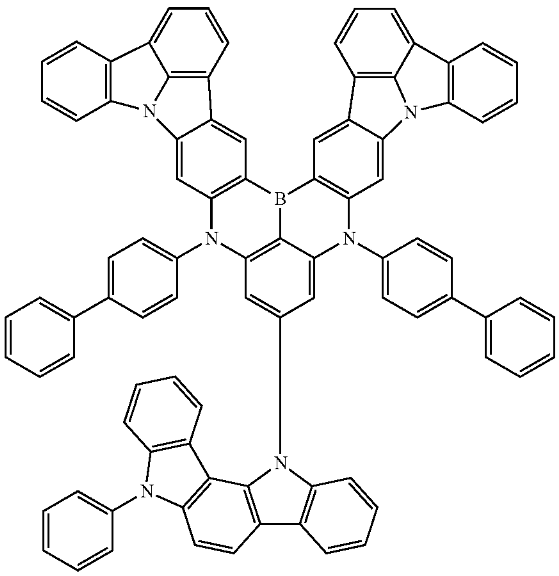
203
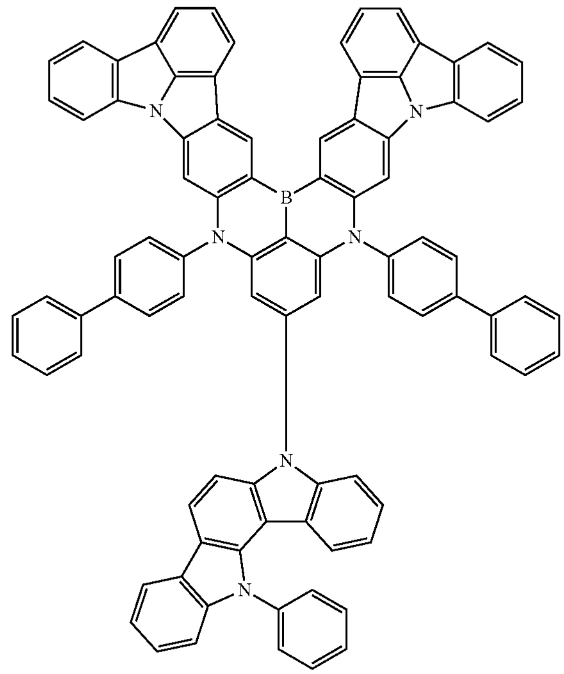
204
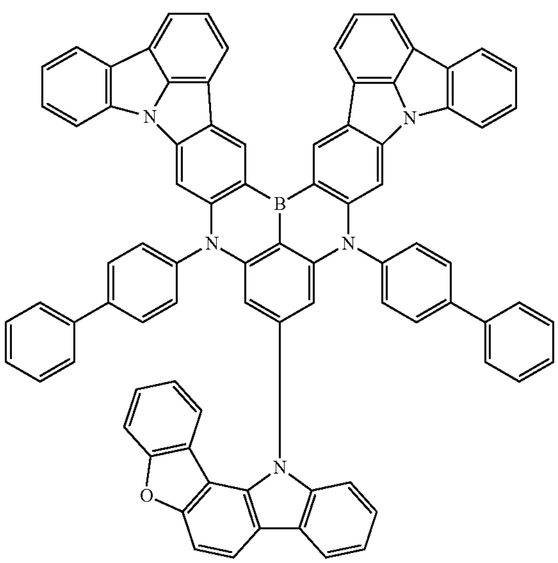
205
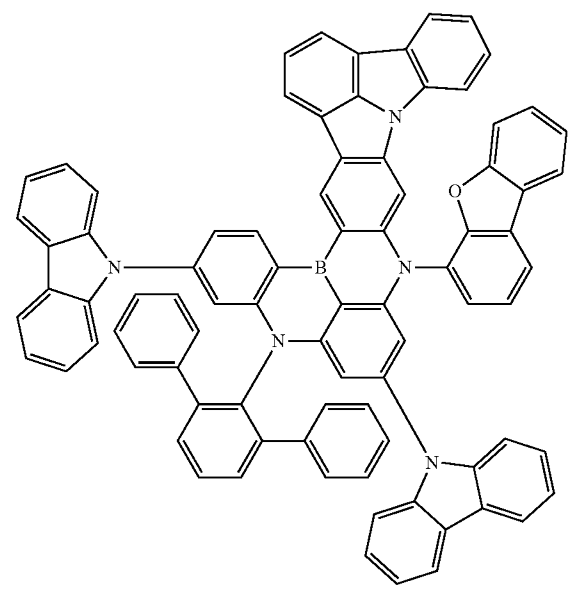
206
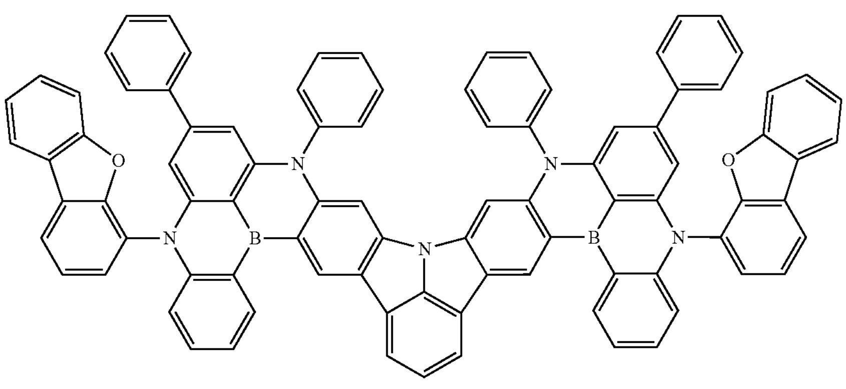

-continued
207
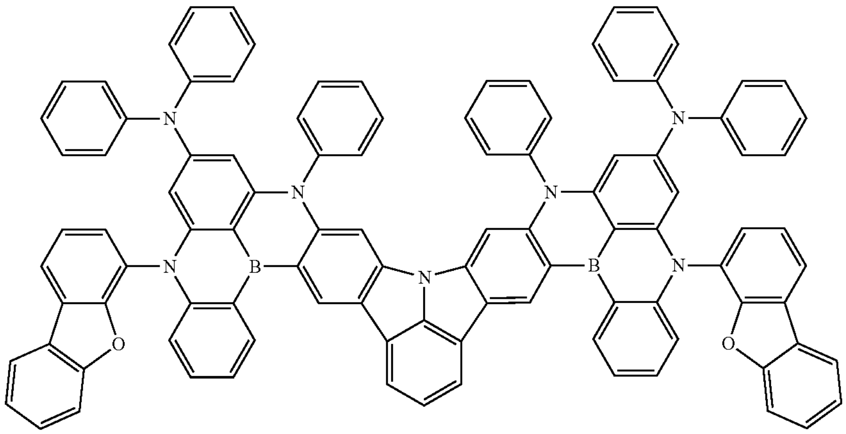
208
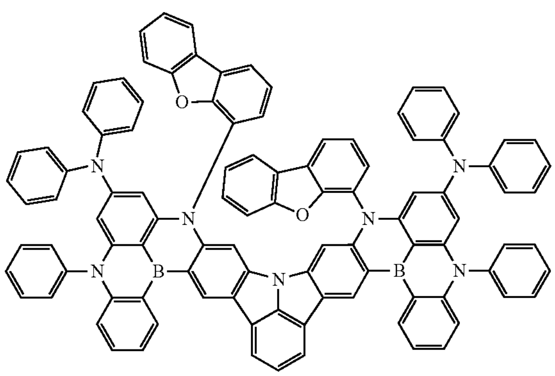
209
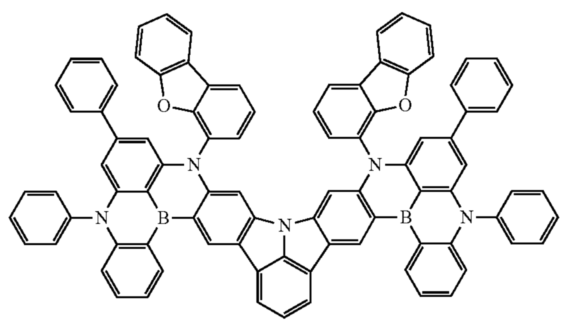
210
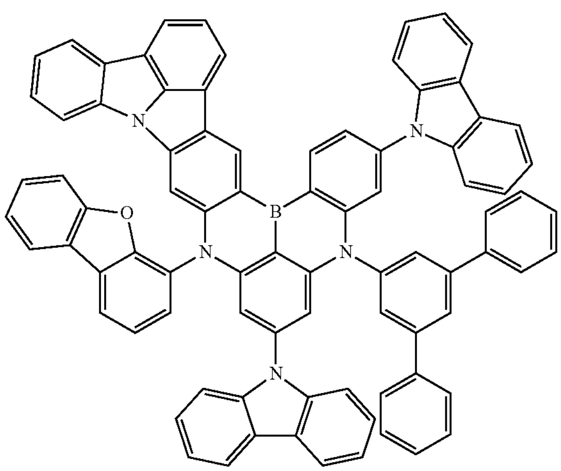
211
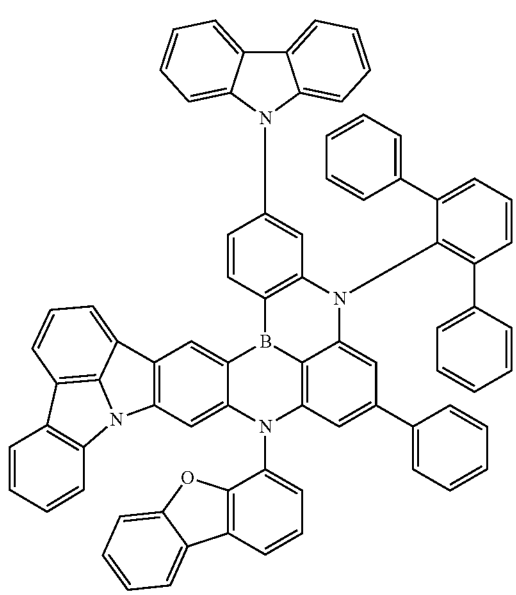

-continued
212
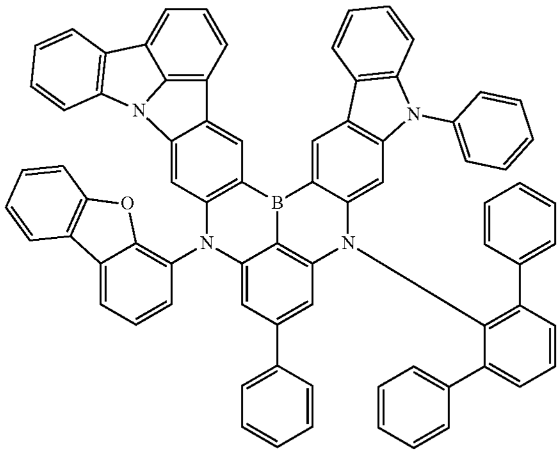
213
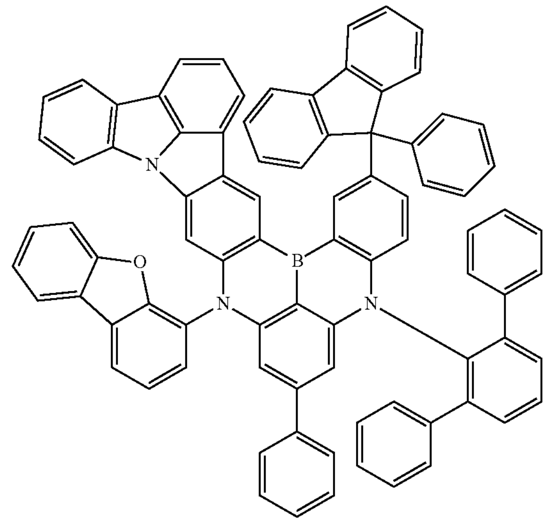
214
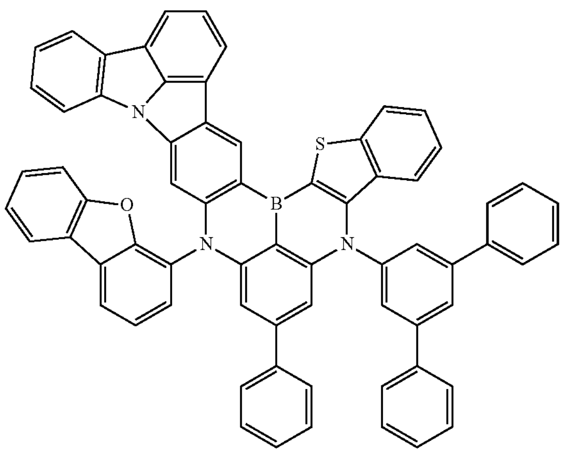
215
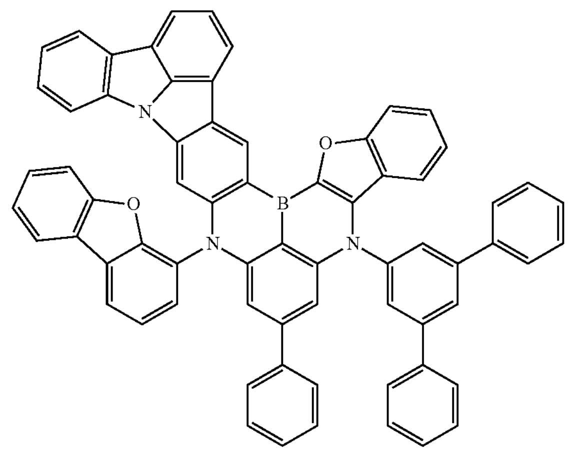
216
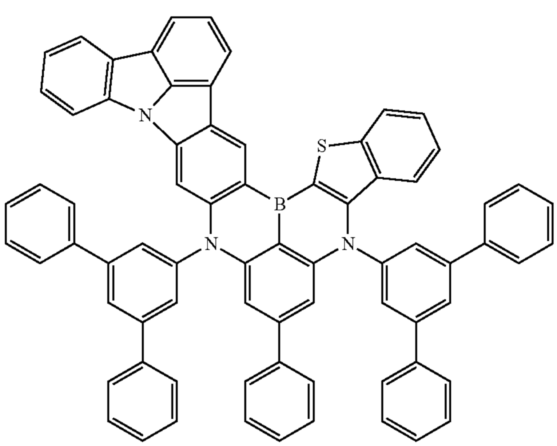
217
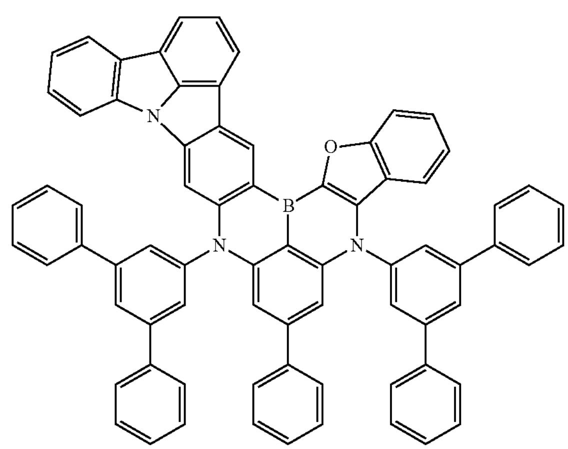
wherein in Compound Group 1,
D is a deuterium atom.
* * * * *